United States Patent [19]

Dosaka et al.

[11] Patent Number: 5,583,813

[45] Date of Patent: Dec. 10, 1996

[54] SEMICONDUCTOR MEMORY DEVICE

[75] Inventors: Katsumi Dosaka; Masaki Kumanoya; Kouji Hayano; Akira Yamazaki; Hisashi Iwamoto; Hideaki Abe; Yasuhiro Konishi; Katsumitsu Himukashi; Yasuhiro Ishizuka; Tsukasa Saiki, all of Hyogo-ken, Japan

[73] Assignees: Mitsubishi Denki Kabushiki Kaisha; Mitsubishi Electric Engineering Co., Ltd., both of Tokyo, Japan

[21] Appl. No.: 461,916

[22] Filed: Jun. 5, 1995

Related U.S. Application Data

[62] Division of Ser. No. 869,917, Apr. 15, 1992.

[30] Foreign Application Priority Data

Apr. 18, 1991 [JP] Japan ........................................ 3-85625
Aug. 23, 1991 [JP] Japan ........................................ 3-212140
Sep. 24, 1991 [JP] Japan ........................................ 3-242286
Feb. 3, 1992 [JP] Japan ........................................ 4-17809

[51] Int. Cl.$^6$ .................................................... G11C 13/00
[52] U.S. Cl. ........................................ 365/189.01; 365/233
[58] Field of Search ........................ 365/189.01, 189.09, 365/230.01, 230.02, 230.06, 233

[56] References Cited

U.S. PATENT DOCUMENTS

| | | |
|---|---|---|
| 4,660,180 | 4/1987 | Tanimura et al. . |
| 4,802,129 | 1/1989 | Hoekstra et al. . |
| 4,809,156 | 2/1989 | Taber . |
| 4,837,744 | 6/1989 | Marquot . |
| 4,912,630 | 3/1990 | Cochcroft, Jr. . |
| 4,943,960 | 7/1990 | Komatsu et al. . |
| 4,953,131 | 8/1990 | Purdham et al. . |
| 4,970,418 | 11/1990 | Masterson . |
| 4,977,538 | 12/1990 | Anami et al. . |
| 4,984,206 | 1/1991 | Komatsu et al. . |
| 5,515,325 | 5/1996 | Wada ................... 365/189.01 |

FOREIGN PATENT DOCUMENTS

| | | |
|---|---|---|
| 115187 | 8/1984 | European Pat. Off. . |
| 136819 | 4/1985 | European Pat. Off. . |
| 156316 | 10/1985 | European Pat. Off. . |
| 277763 | 8/1988 | European Pat. Off. . |

(List continued on next page.)

OTHER PUBLICATIONS

Arimoto et a 1., "A Circuit Design of Intelligent Cache DRAM With Automatic Write–Back Capability", *IEEE Journal of Solid State Circuits*, vol. 26, No. 4, Apr. 1991, pp. 560–565.

Amitai et al., "Burst Mode Memories Improve Cache Design", IRE Wescon Convention Record, Oct. 1990, pp. 29–32.

(List continued on next page.)

*Primary Examiner*—Terrell W. Fears
*Attorney, Agent, or Firm*—Lowe, Price, LeBlanc & Becker

[57] ABSTRACT

A semiconductor memory device includes a DRAM, an SRAM and a bi-direction transfer gate circuit provided between SRAM and DRAM. SRAM array includes a plurality of sets of word lines. Each set is provided in each row of SRAM array and each word line in each set is connected to a different group of memory cells of an associated row. An address signal for the SRAM and an address signal for the DRAM are separately applied to an address buffer. The semiconductor memory device further includes an additional function control circuit for realizing a burst mode and a sleep mode. A data transfer path from DRAM to the SRAM and a data transfer path from the SRAM to the DRAM are separately provided in the bi-directional transfer gate circuit. Data writing paths and data reading paths are separately provided in the DRAM array. By the above described structure, operation of the buffer circuit is stopped in the sleep mode, reducing power consumption. Since data writing path and data reading path are separately provided in the DRAM array, addresses to the DRAM array can be applied in non-multiplexed manner, so that data can be transferred at high speed from the DRAM array to the SRAM array, enabling high speed operation even at a cache miss.

2 Claims, 199 Drawing Sheets

FOREIGN PATENT DOCUMENTS

| | | |
|---|---|---|
| 326953 | 8/1989 | European Pat. Off. . |
| 344752 | 12/1989 | European Pat. Off. . |
| 420339 | 4/1991 | European Pat. Off. . |
| 2329527 | 1/1975 | Germany . |
| 60-7690 | 1/1985 | Japan . |
| 63-285795 | 11/1985 | Japan . |
| 61-196345 | 8/1986 | Japan . |
| 61-222091 | 10/1986 | Japan . |
| 62-38590 | 2/1987 | Japan . |
| 62-038590 | 2/1987 | Japan . |
| 1-128294 | 5/1989 | Japan . |
| 2-087392 | 3/1990 | Japan . |
| 2-87392 | 3/1990 | Japan . |
| 2-270194 | 11/1990 | Japan . |

OTHER PUBLICATIONS

Kung et al., "An 8KX8 Dynamic RAM with Self-Refresh", IEEE Journal Of Solid-State Circuits, vol. 17, No. 5, Oct. 1982, New York, U.S., pp. 863-871.

Yamada et al., "A 64Kbit MOS Dynamic RAM with Auto/Self Refresh Functions" Electronics And Communications In Japan, vol. 66, No. 1, Jan. 1983, Silver Spring, MD, U.S., pp. 103-110.

Hidaka et al., "The Cache DRAM Architecture: A DRAM with an On-Chip Cache Memory", IEEE Micro, vol. 10, No. 2, Apr. 1990, New York, U.S., pp. 14-25.

AUTO REFRESH

SELF REFRESH

FIG. 31

| MASKED WRITE | D/Q SEPARATION | Pin | | Pin | D/Q SEPARATION | MASKED WRITE |
|---|---|---|---|---|---|---|
| FOR DRAM → | Vcc | 1 | | 44 | REF# (REFRESH) | |
| | Aa0/Ar0 | 2 | | 43 | Aa9 | |
| | Aa1/Ar1 | 3 | | 42 | Aa8 | |
| CI# (CACHE INHIBITION) | | 4 | | 41 | K (CLOCK) | |
| W# (WRITE ENABLE) | | 5 | | 40 | G# (OUTPUT ENABLE) | |
| | Ac0 | 6 | | 39 | Ac11 | |
| | Ac1 | 7 | | 38 | Ac10 | |
| | Ac2 | 8 | | 37 | Ac9 | |
| M0 | D0 | 9 | | 36 | D3 | M3 |
| DQ0 | | 10 | 300 mil | 35 | Q3 | DQ3 |
| FOR SRAM | Vcc | 11 | TSOP | 34 | Gnd | FOR SRAM |
| | Gnd | 12 | Type 11 | 33 | Vcc | |
| DQ1 | | 13 | (18.4mm) | 32 | Q2 | DQ2 |
| M1 | D1 | 14 | | 31 | D2 | M2 |
| | Ac3 | 15 | | 30 | Ac8 | |
| | Ac4 | 16 | | 29 | Ac7 | |
| | Ac5 | 17 | | 28 | Ac6 | |
| E# (CHIP SELECT) | | 18 | | 27 | CH# (CACHE HIT) | |
| | Aa2 | 19 | | 26 | Aa7 | |
| | Aa3 | 20 | | 25 | Aa6 | |
| | Aa4 | 21 | | 24 | Aa5 | |
| | Gnd | 22 | | 23 | CR# (COMMAND REGISTER) | |

(FOR DRAM)

DRAM → SRAM TRANSFER TIMING

SRAM → DRAM TRANSFER TIMING

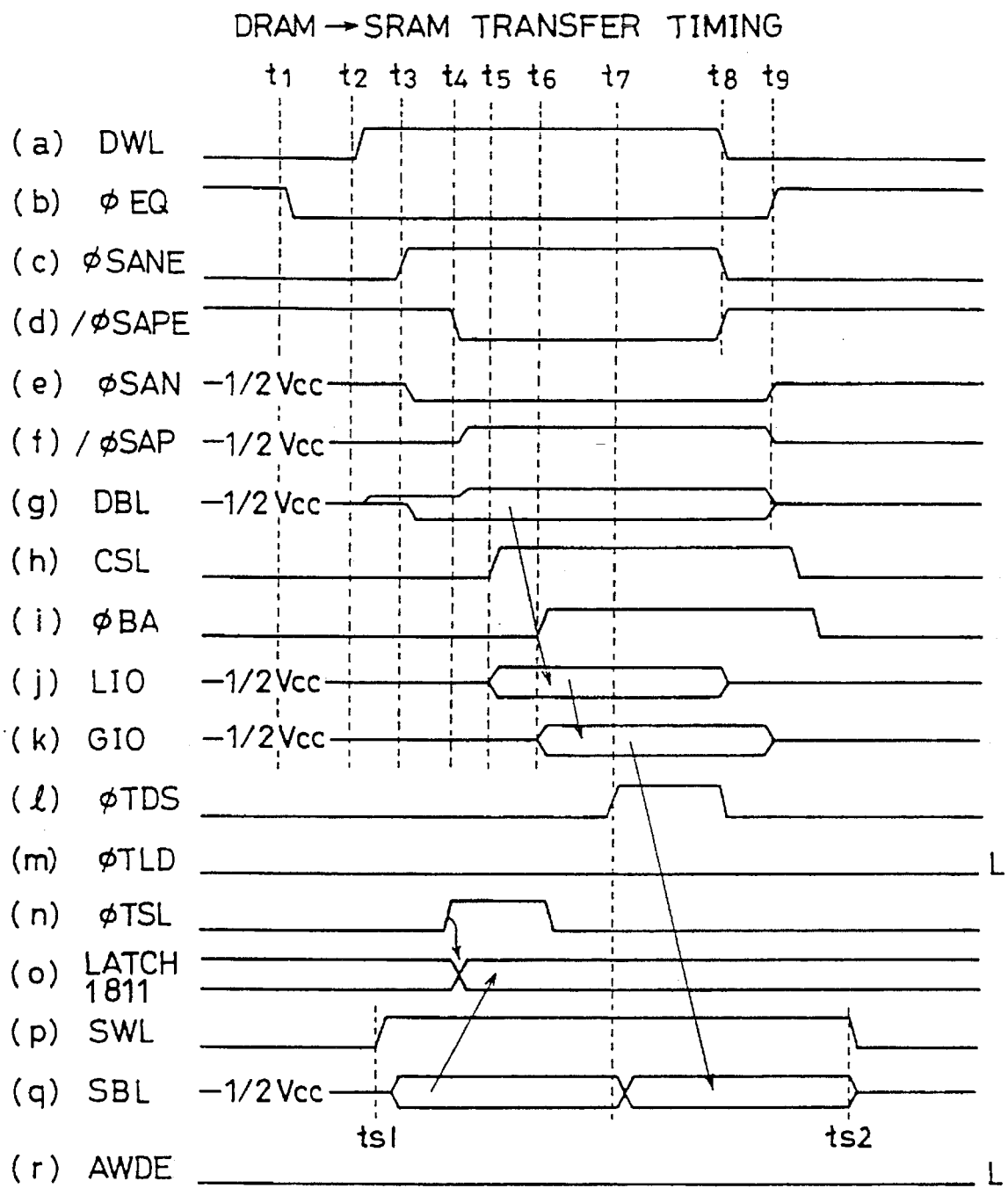

FIG. 76

| OPERATION MODE | E# | CH# | CI# | CR# | W# | REF# |
|---|---|---|---|---|---|---|
| STAND-BY | H | X | X | X | X | H |
| ARRAY REFRESH | H | X | X | X | X | L |
| CPU ← CACHE | L | L | H | H | H | H |
| CPU → CACHE | L | L | H | H | L | H |
| CPU ← CACHE & ARRAY REFRESH | L | L | H | H | H | L |
| CPU → CACHE & ARRAY REFRESH | L | L | H | H | L | L |
| CPU ← ARRAY | L | X | L | H | H | H |
| CPU → ARRAY | L | X | L | H | L | H |
| CACHE ← ARRAY | L | H | H | H | H | H |
| CACHE → ARRAY | L | H | H | H | L | H |
| CPU ↔ COMMAND REGISTER | L | H | H | L | H/L | H |
| CPU ↔ COMMAND REGISTER & ARRAY REFRESH | L | H | H | L | H/L | L |

FIG. 77

| COMMAND REGISTER | Ar0 | Ar1 | W# |
|---|---|---|---|
| RR0 | 0 | 0 | H |
| RR1 | 1 | 0 | H |
| RR2 | 0 | 1 | H |
| RR3 | 1 | 1 | H |
| WR0 | 0 | 0 | L |
| WR1 | 1 | 0 | L |
| WR2 | 0 | 1 | L |
| WR3 | 1 | 1 | L |

FIG. 83 CACHE HIT READ (LATCHED OUTPUT)

FIG. 85 COPY BACK (SRAM TO DRAM)

FIG. 86 BLOCK TRANSFER (DRAM TO SRAM)

FIG. 95 READ DATA FROM ARRAY (REGISTERED OUTPUT)

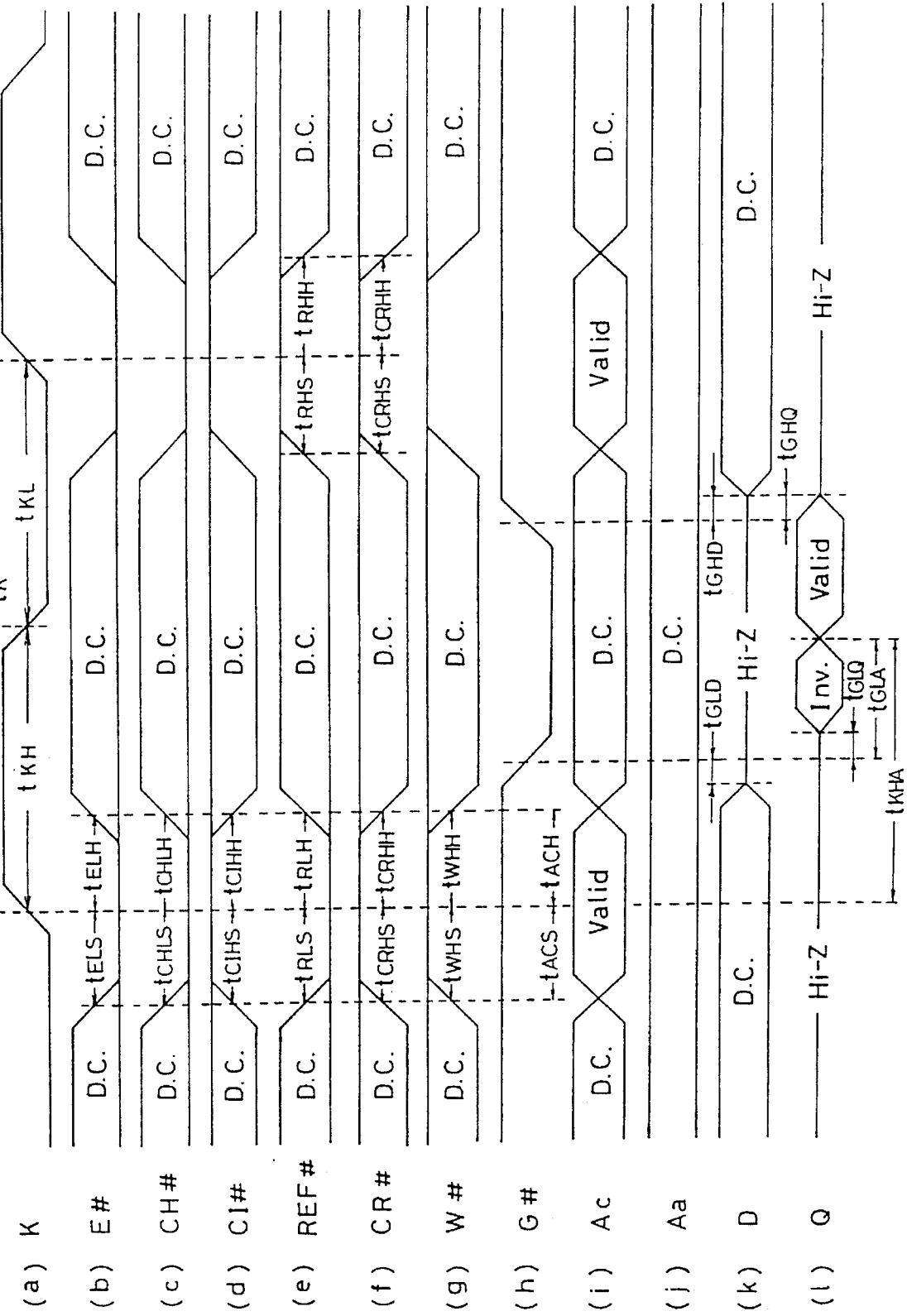

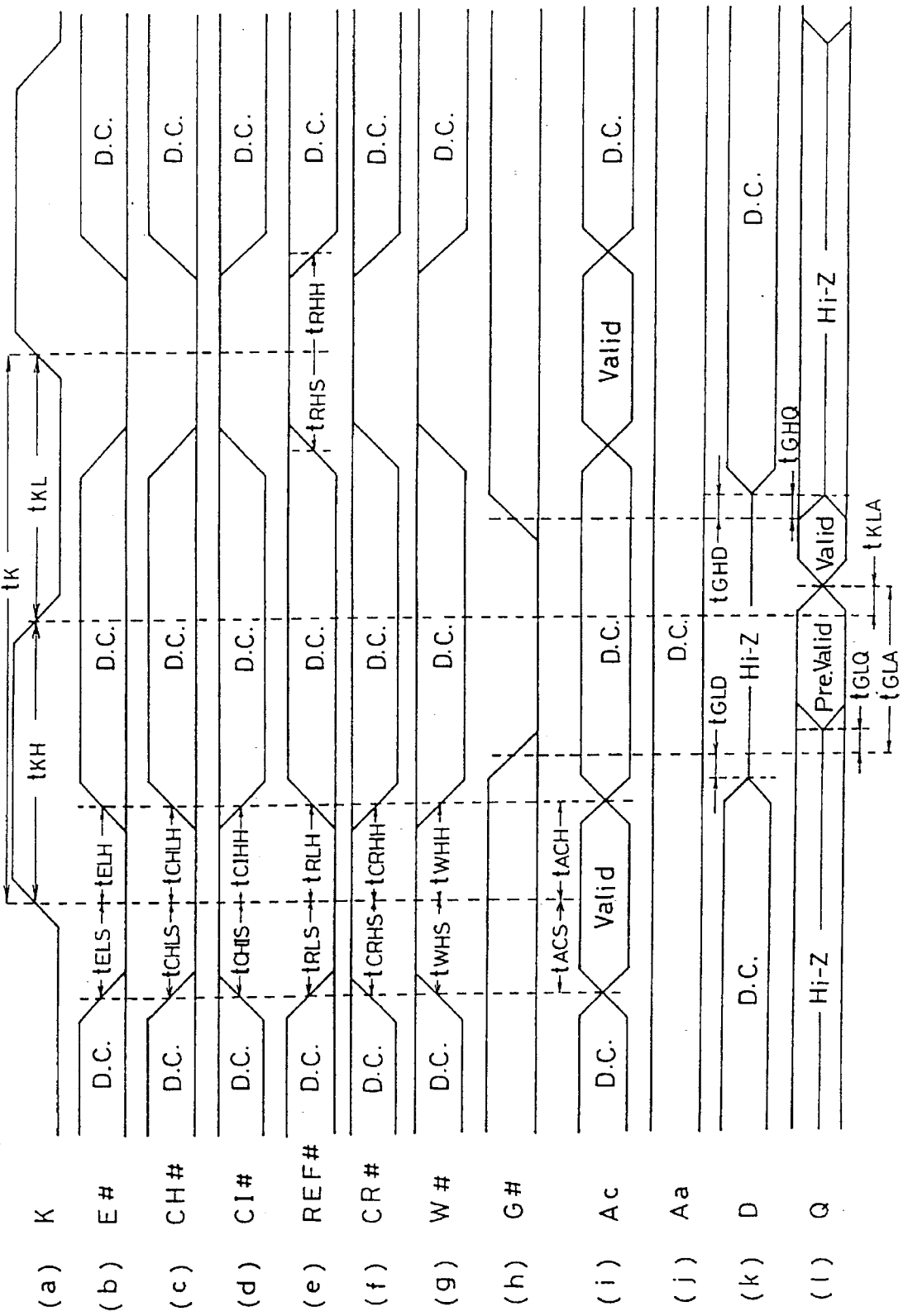
FIG. 99 REFRSH WITH CACHE HIT READ IN LATCHED OUTPUT

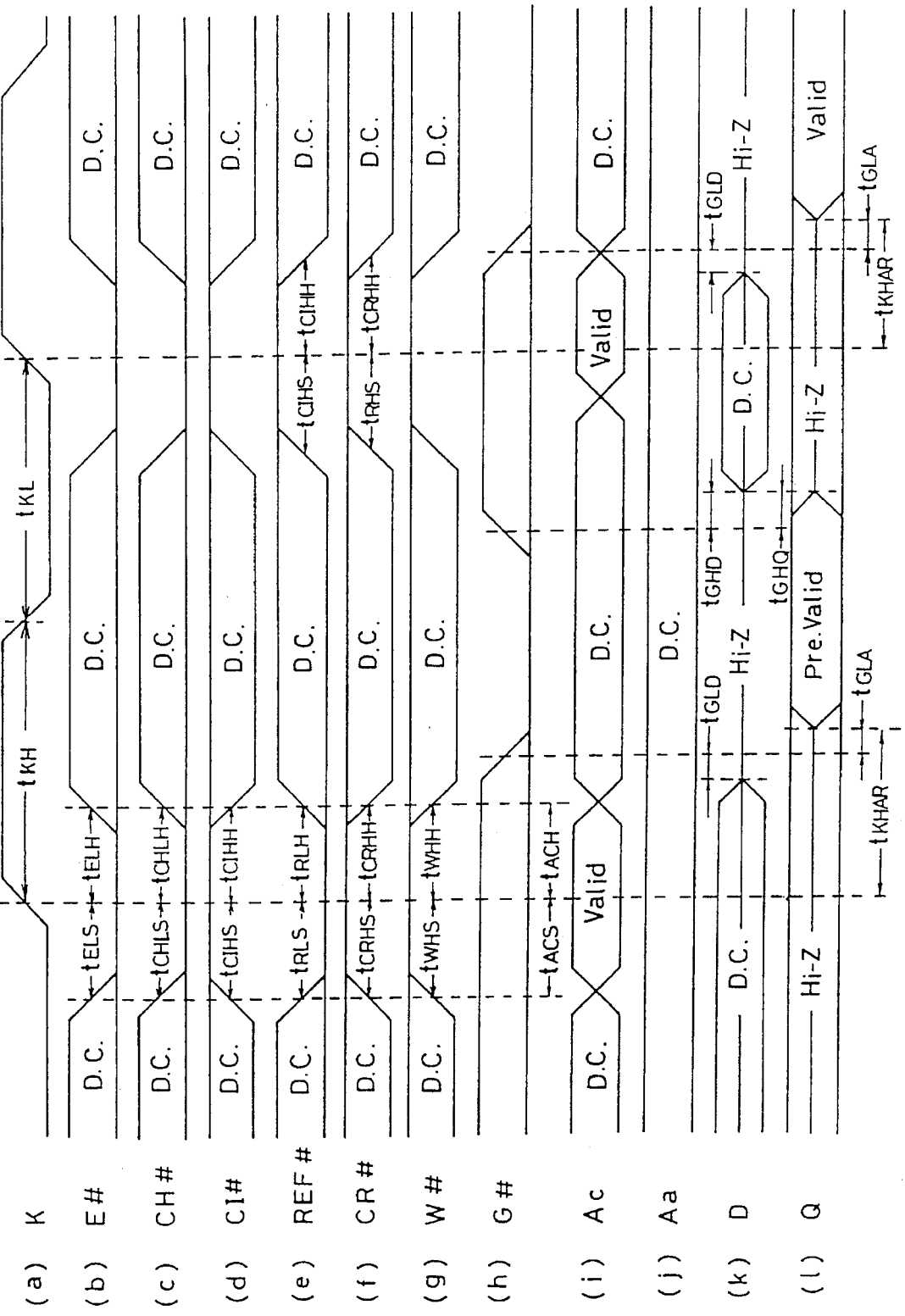
FIG.100 REFRESH WITH CACHE HIT READ IN REGISTERED OUTPUT

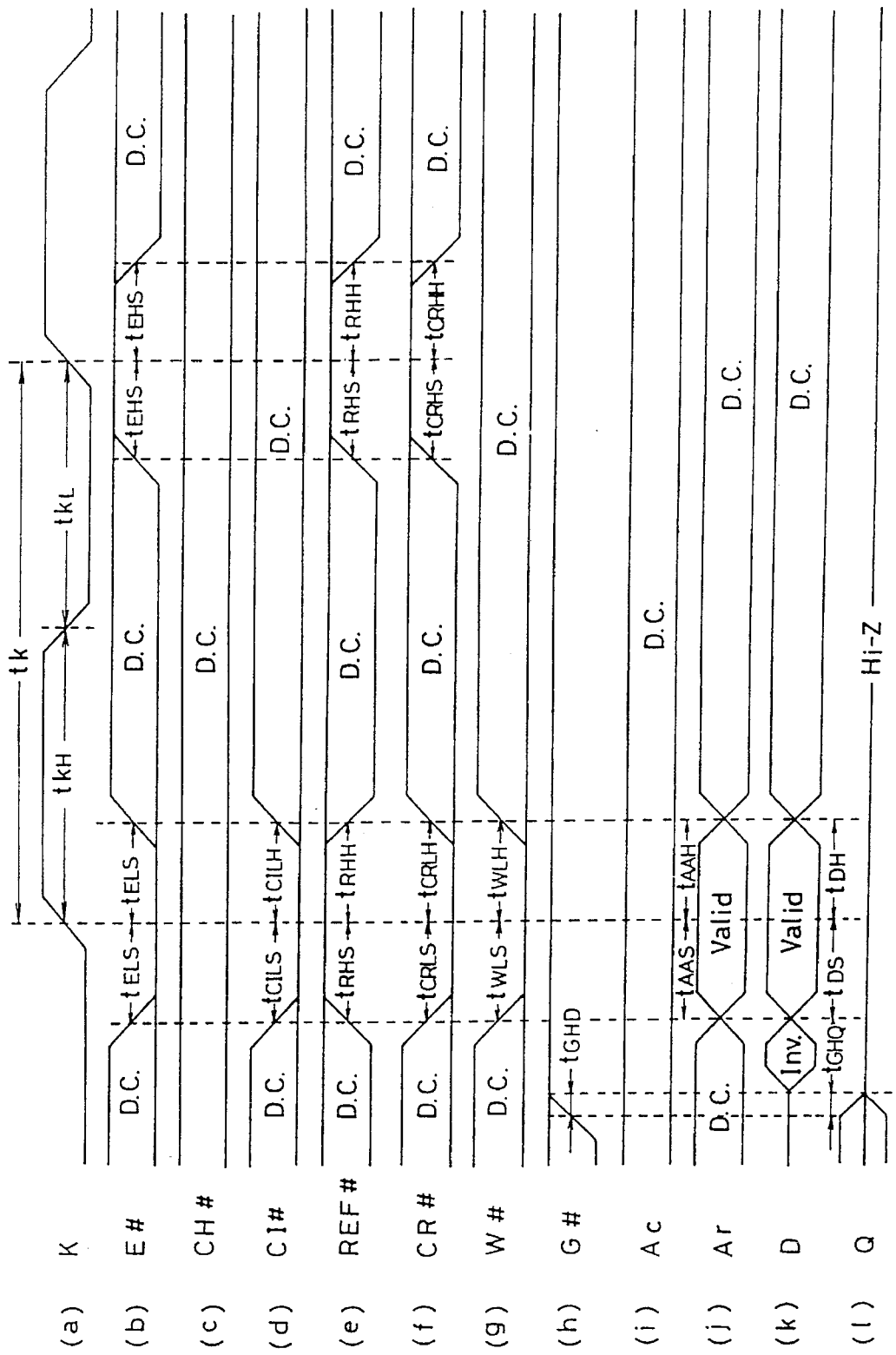

$n = (ta / tk) - 1$ $n' = (ta / 2tk) - 1$

ARRAY ACCESS

| | |
|---|---|
| (i) ARRAY WRITE : | 5 ⟶ 7 × n |
| (ii) ARRAY READ : | 6 ⟶ 7 × n' ⟶ 7 Q × ( n'+1 ) |

FIG. 119

| OPERATION | | | E# | CH# | CC1# | CC2# | W# | REF# |
|---|---|---|---|---|---|---|---|---|
| TH. (CACHE) | | | L | L | H/L | H | H/L | H |
| TG. (COMMAND REGISTER SET) | | | L | H | L | L | H/L | H/L |
| TS. (STANDBY) | | | H | × | × | × | × | H |
| TM. (CACHE MISS) | TMM. (MISS READ/WRITE) | TMMI. INITIATE | L | H | H | H | H/L | H |
| | | TMMA. ARRAY ACTIVE | H | H | H | H | H | H |
| | | TMMP. * PRECHARGE | H L | H L | H | H | H/L | H |
| | TMA. (ARRAY WRITE) | TMAL. * INITIATE | L | H L | H L | L H | H/L | H |
| | | TMAA. * ARRAY ACTIVE + PRECHARGE | H L | H L | H | H | H/L | H |
| TD. (DIRECT ARRAY ACCESS) | TDL. INITIATE | | L | H | L | H | H/L | H |
| | TDA. ARRAY ACTIVE + PRECHARGE | | H | H | H | H | H | H |
| TR. (REFRESH) | TRI. * INITIATE | | H L | H L | H | H | H/L | L |
| | TRA. * ARRAY ACTIVE + PRECHARGE | | H L | H L | H | H | H/L | H |
| TC. (COUNTER CHECK) | TCI. INITIATE | | L | H | L | H | H/L | L |
| | TCA. ARRAY ACTIVE + PRECHARGE | | H | H | H | H | H | H |

LTHR:CACHE HIT READ OPERATION (LOW POWER CONSUMPTION)
(TRANSPARENT OUTPUT)

LTHW:CACHE HIT WRITE (LOW POWER CONSUMPTION)

LTMMR: CACHE MISS READ OPERATION (LOW POWER CONSUMPTION)

LTMMW: CACHE MISS WRITE OPERATION (LOW POWER CONSUMPTION)

LTMA.:ARRAY WRITE OPERATION (LOW POWER CONSUMPTION)
(DTB → ARRAY)

LTMAR:ARRAY WRITE OPERATION WITH CACHE HIT READ (LOW POWER CONSUMPTION)

LTMAW: ARRAY WRITE OPERATION WITH CACHE HIT WRITE
(LOW POWER CONSUMPTION)

LTDR:DIRECT ARRAY READ OPERATION (LOW POWER CONSUMPTION)

LTDW:DIRECT ARRAY WRITE OPERATION (LOW POWER CONSUMPTION)

LTR:REFRESH ARRAY OPERATION (LOW POWER CONSUMPTION)

LTRW: REFRESH ARRAY OPERATION WITH CACHE HIT WRITE
(LOW POWER CONSUMPTION)

LTCR:COUNTER CHECK READ OPERATION (LOW POWER CONSUMPTION)

LTCW:COUNTER CHECK WRITE OPERATION (LOW POWER CONSUMPTION)

LTG:COMMAND REGISTER SETTING OPERATION (LOW POWER CONSUMPTION)

F I G. 1 3 8
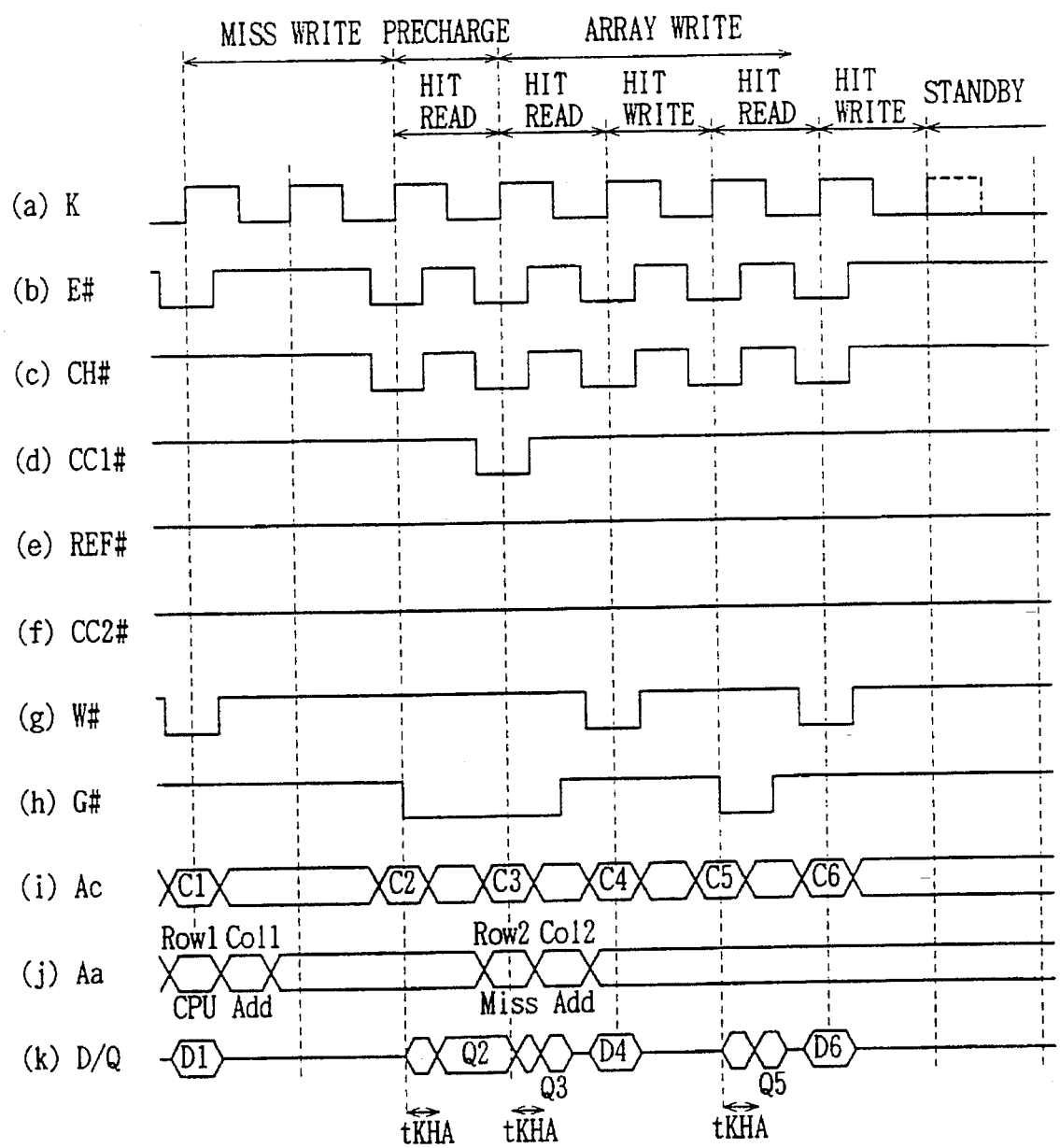

THR:CACHE HIT READ OPERATION (HIGH SPEED OPERATION)
(TRANSPARENT OUTPUT)

THRL: CACHE HIT READ OPERATION (HIGH SPEED OPERATION)
(LATCH OUTPUT)

THRR:CACHE HIT READ OPERATION (HIGH SPEED OPERATION)
(REGISTER OUTPUT)

THW:CACHE HIT WRITE OPERATION (HIGH SPEED OPERATION)

TMMR:CACHE MISS READ OPERATION (HIGH SPEED OPERATION)

TMMW:CACHE MISS WRITE OPERATION (HIGH SPEED OPERATION)

TMA:ARRAY WRITE OPERATION (HIGH SPEED OPERATION)
(DTB → ARRAY)

TMAR: ARRAY WRITE OPERATION WITH CACHE HIT READ (HIGH SPEED OPERATION)

TMARL: ARRAY WRITE OPERATION WITH CACHE HIT READ (HIGH SPEED OPERATION) (LATCH OUTPUT)

TMARR: ARRAY WRITE OPERATION WITH CACHE HIT READ (HIGH SPEED OPERATION)
(REGISTER OUTPUT)

TMAW: ARRAY WRITE OPERATION WITH CACHE HIT WRITE (HIGH SPEED OPERATION)

TDR:DIRECT ARRAY READ OPERATION (HIGH SPEED OPERATION)

TDW:DIRECT ARRAY WRITE OPERATION (HIGH SPEED OPERATION)

TR:REFRESH ARRAY OPERATION (HIGH SPEED OPERATION)

TRR:REFRESH OPERATION WITH CACHE HIT READ (HIGH SPEED OPERATION)

TRW:REFRESH ARRAY OPERATION WITH CACHE WRITE (HIGH SPEED OPERATION)

TCW: COUNTER CHECK WRITE OPERATION (HIGH SPEED OPERATION)

TG:COMMAND REGISTER SETTING OPERATION (HIGH SPEED OPERATION)

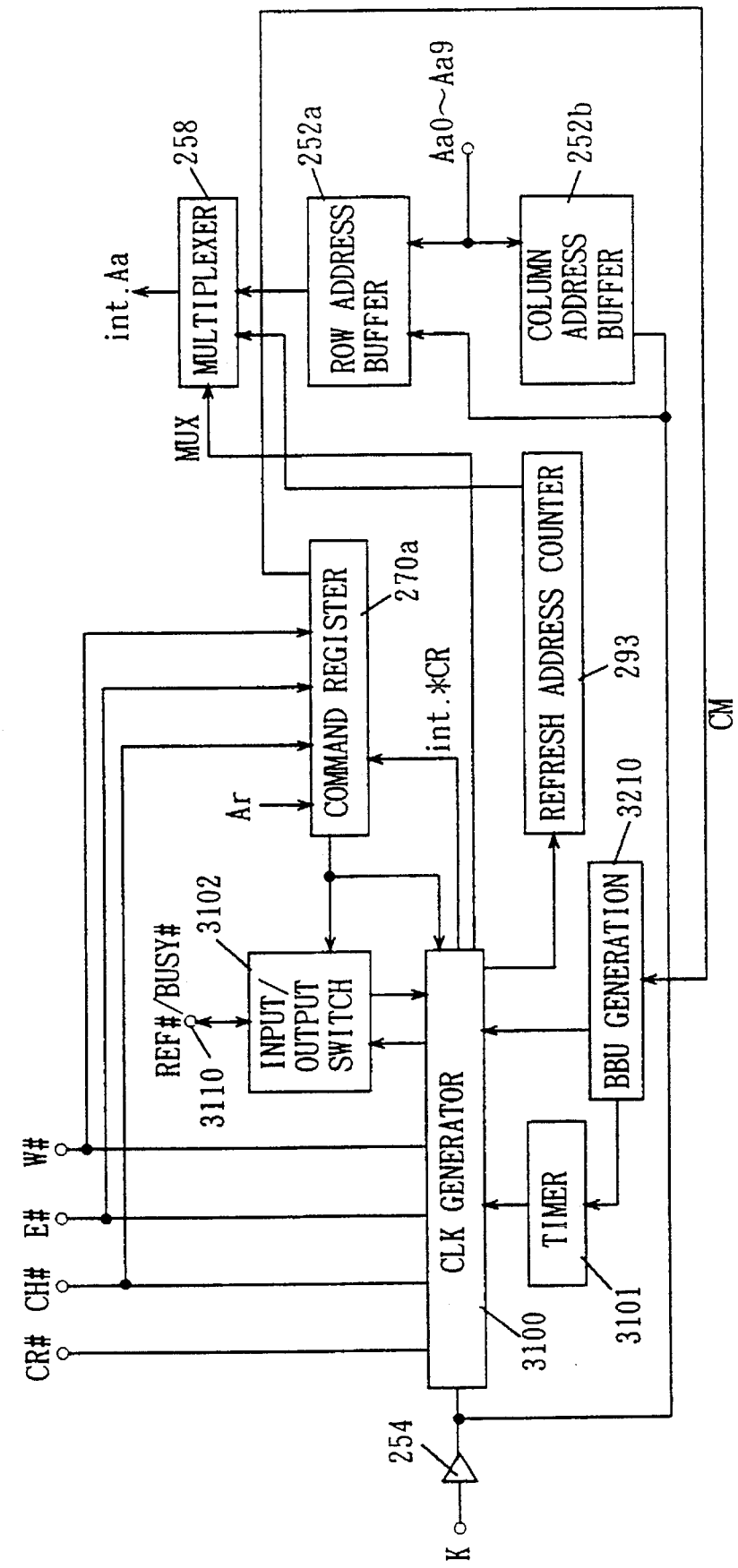
F I G. 166

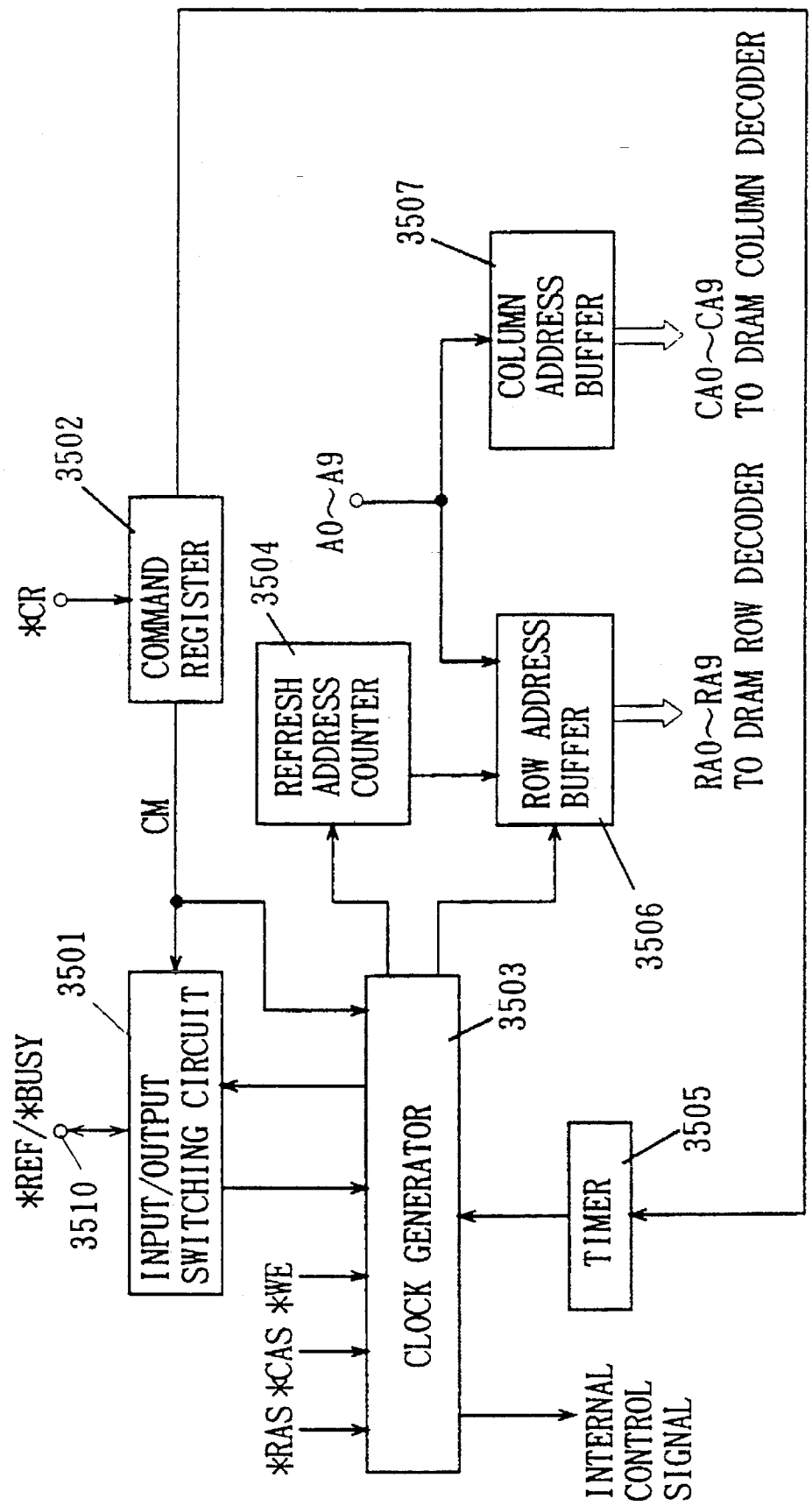
F I G. 172

DRAM → SRAM TRANSFER TIMING

FIG. 215

| | E# | CH# | CC1# (CI#) | CC2# (CR#) | W# | REF# | |
|---|---|---|---|---|---|---|---|
| STAND BY | H | X | X | X | X | H | |
| REFRESH | H | X | X | X | X | L | |
| HIT READ | L | L | H | H | H | H/L | |
| HIT WRITE | L | L | H | H | L | H/L | |
| HIT READ BURST | L | L | H | L | H | H/L | |
| HIT WRITE BURST | L | L | H | L | L | H/L | |
| HIT READ(& ARRAY WRITE) | L | L | L | H | H | H | CHCHE→CPU, LATCH→ARRAY |
| HIT WRITE(& ARRAY WRITE) | L | L | L | H | L | H | CACHE←CPU, LATCH→ARRAY |
| HIT READ BURST(·ARRAY WRITE) | L | L | L | L | H | H | |
| HIT WRITE BURST(·ARRAY WRITE) | L | L | L | L | L | H | |
| MISS READ | L | H | H | H | H | H | CACHE→LATCH, ARRAY→CACHE→CPU |
| MISS WRITE | L | H | H | H | L | H | CACHE→LATCH, ARRAY→CACHE←CPU |
| ARRAY WRITE(LATCH→ARRAY) | L | H | H | L | H | H | FOR HIGH SPEED COPY BACK |
| ARRAY WRITE(CACHE→ARRAY) | L | H | L | L | L | H | ARRAY INITIALIZATION |
| ARRAY DIRECT ACCESS | L | H | L | H | H/L | H/L | ARRAY INITIALIZATION |
| COMMAND REGISTER | L | H | L | L | H/L | H/L | |

SEMICONDUCTOR MEMORY DEVICE

This application is a division of application Ser. No. 07/869,917 filed Apr. 15, 1992.

BACKGROUND OF THE INVENTION

1. Field of the Invention

The present invention relates to semiconductor memory devices and, specifically, to a clock synchronized type semiconductor memory device which operates in synchronization with externally applied clock signals. More specifically, the present invention relates to a structure of a semiconductor memory device containing a cache, in which a dynamic random access memory (DRAM) having a large storage capacity serving as a main memory, and a static random access memory (SRAM) having small storage capacity serving as a cache memory are integrated on the same semiconductor chip.

2. Description of the Background Art

Historical Review on Memory Environment in a Conventional Data Processing System (i) Usage of standard DRAM as a main memory Operation speed of recent 16-bit or 32-bit microprocessing unit (MPU) has been so much increased as to have operation clock frequency as high as 25 MHz or higher. In a data processing system, a standard DRAM (Dynamic Random Access Memory) is often used as a main memory having large storage capacity, since cost per bit is low. Although access time in the standard DRAM has been reduced, the speed of operation of the MPU has been increased much faster than that of the standard DRAM. Consequently, in a data processing system using the standard DRAM as a main memory, increase of wait state is inevitable. The gap in speed of operation between MPU and the standard DRAM is inevitable because the standard DRAM has the following characteristics.

(1) A row address and a column address are time divisionally multiplexed and applied to the same address pin terminals. The row address is taken in the device at a falling edge of a row address strobe signal/RAS. The column address is taken in the device at a falling edge of a column address strobe signal/CAS. The row address strobe signal/RAS defines start of a memory cycle and activates row selecting circuitry. The column address strobe signal/CAS activates column selecting circuitry. Since a prescribed time period called "RAS-CAS delay time (tRCD)" is necessary from the time the signal/RAS is set to an active state to the time the signal/CAS is set to the active state, there is a limit in reducing the access time, namely, there is a limit derived from address multiplexing.

(2) When the row address strobe signal/RAS is once raised to set the DRAM to a standby state, the row address strobe signal/RAS cannot fall to "L" again until a time period called a RAS precharge time (tRP) has lapsed. The RAS precharge time is necessary for surely precharging various signal lines in the DRAM to predetermined potentials. Due to the RAS precharge time TRP, the cycle time of DRAM cannot be reduced. In addition, when the cycle time of the DRAM is reduced, the number of charging/discharging of signal lines in the DRAM is increased, which increases current consumption.

(3) The higher speed of operation of the DRAM can be realized by circuit technique such as improvement of layout, increase of degree of integration of circuits, development in process technique and by applicational improvement such as improvement in the method of driving. However, the speed of operation of the MPU is increased at much faster rate than DRAM. The speed of operation of semiconductor memories is hierarchical. For example, there are high speed bipolar RAMs using bipolar transistors such as ECLRAMs (Emitter Coupled RAM) and Static RAM, and relatively low speed DRAMs using MOS transistors (insulated gate type field effect transistors). It is very difficult to expect the operation speed (cycle time) as fast as several tens ns (nano seconds) in a standard DRAM formed of MOS transistors.

There have been various applicational improvements to stop the gap between speed of operations of the MPU and the standard DRAM. Such improvements mainly comprise the following two approaches.

(1) Use of high speed mode of the DRAM and interleave method (2) External provision of a high speed cache memory The first approach (1) includes a method of using a high speed mode such as a static column mode or a page mode, and a method of combining the high speed mode and the interleave method. In the static column mode, one word line (one row) is selected, and thereafter only the column address is changed successively, to successively access memory cells of this row. In the page mode, one word line is selected, and then column addresses are successively taken by toggling the signal/CAS to successively access memory cells connected to the selected one word line. In either of these modes, memory cells can be accessed without toggling the signal/RAS, enabling higher speed accessing than the normal access using the signals/RAS and/CAS.

In the interleave method, a plurality of memories are provided in parallel to a data bus, and by alternately or successively accessing the plurality of memories, the access time is reduced in effect. The use of high speed mode of the DRAM and combination of the high speed mode and the interleave method have been known as a method of using the standard DRAM as a high speed DRAM in a simple and relatively effective manner.

The second approach (2) has been widely used in a main frame art. A high speed cache memory is expensive. However, in the field of personal computers in which high performance as well as low cost are desired, this approach is employed in some parts of the field with a sacrifice of cost. There are three possible ways to provide the high speed cache memory. Namely, (a) the high speed cache memory is contained in the MPU itself;

(b) the high speed cache memory is provided outside the MPU; and (c) the high speed cache memory is not separately provided but the high speed mode contained in the standard DRAM is used as a cache (the high speed mode is used as a pseudo cache memory). When a cache hit occurs, the standard DRAM is accessed in the high speed mode, and at the time of a cache miss, the standard DRAM is accessed in the normal mode.

The above mentioned three ways (a) to (c) have been employed in the data processing systems in some way or other. In most MPU systems, the memories are organized in a bank structure and interleaving is carried out on bank by bank basis in order to conceal the RAS precharge time (TRP) which is inevitable in the DRAM, in view of cost. By this method, the cycle time of the DRAM can be substantially one half that of the specification value.

The method of interleave is effective only when memories are sequentially accessed. When the same memory bank is to be continuously accessed, it is ineffective. Further, substantial improvement of the access time of the DRAM itself cannot be realized. The minimum unit of the memory must be at least 2 banks.

When the high speed mode such as the page mode or the static column mode is used, the access time can be reduced effectively only when the MPU successively accesses a certain page (data of a designated one row). This method is effective to some extent when the number of banks is comparatively large, for example 2 to 4, since different rows can be accessed in different banks. When the data of the memory requested by the MPU does not exist in the given page, it is called a "miss hit" (cache miss). Normally, a group of data are stored in adjacent addresses or sequential addresses. In the high speed mode, a row address, which is one half of the addresses, has been already designated, and therefore possibility of "miss hit" is high.

When the number of banks becomes as large as 30 to 40, data of different pages can be stored in different banks, and therefore the "miss hit" rate is remarkably reduced. However, it is not practical to provide 30 to 40 banks in a data processing system. In addition, if a "miss hit" occurs, the signal/RAS is raised and the DRAM must be returned to the precharge cycle in order to reselect the row address, which sacrifices the characteristic of the bank structure.

In the above described second method (2), a high speed cache memory is provided between the MPU and the standard DRAM. In this case, the standard DRAM may have relatively low speed of operation. Standard DRAMs having storage capacities as large as 4M bits or 16M bits have come to be used. In a small system such as a personal computer, the main memory thereof can be formed by one or several chips of standard DRAMs. External provision of the high speed cache memory is not so effective in such a small system in which the main memory can be formed of one standard DRAM. If the standard DRAM is used as the main memory, the data transfer speed between the high speed cache memory and the main memory is limited by the number of data input/output terminals of the standard DRAM, which constitutes a bottleneck in increasing the speed of the system.

When the high speed mode is used as a pseudo cache memory, the speed of operation thereof is slower than the high speed cache memory, and it is difficult to realize the desired system performance.

(ii) Consideration on a conventional cache containing DRAM

Provision of the high speed cache memory (SRAM) in the DRAM is proposed as a method of forming a relatively inexpensive and small system, which can solve the problem of sacrifice of system performance when the interleave method or the high speed operation mode is used. More specifically, a single chip memory having a hierarchical structure of a DRAM serving as a main memory and a SRAM serving as a cache memory has been conceived. The one-chip memory having such a hierarchical structure is called a cache DRAM (CDRAM). The CDRAM will be described with reference to FIGS. 1 through 4.

FIG. 1 shows a structure of a main portion of a conventional standard 1 megabit DRAM. As shown in FIG. 1, the DRAM comprises a memory cell array 500 including a plurality of memory cells MC arranged in a matrix of rows and columns. A row of memory cells are connected to one word line WL. A column of memory cells MC are connected to one column line CL. Normally, the column line CL is formed by a pair of bit lines. A memory cell MC is positioned at a crossing of one of the pair of bit lines and one word line WL. In a 1M DRAM, the memory cells MC are arranged in a matrix of 1024 rows×1024 columns. Namely, the memory cell array 500 includes 1024 word lines WLs and 1024 column lines CLs (1024 pairs of bit lines).

The DRAM further comprises a row decoder 502 which decodes an externally applied row address (not shown) for selecting a corresponding row of the memory cell array 500; a sense amplifier which detects and amplifies data of the memory cell connected to the word line selected by the row decoder 502; and a column decoder which decodes an externally applied column address (not shown) for selecting a corresponding column of the memory cell array 502. In FIG. 1, the sense amplifier and the column decoder are denoted by one block 504. If the DRAM has a ×1 bit structure in which input/output of data is effected bit by bit, one column line CL (a bit line pair) is selected by the column decoder.

If the DRAM has a ×4 bit structure in which input/output of data is effected 4 bits by 4 bits, 4 column lines CL are selected by the column decoder. One sense amplifier is provided for each column line (bit line pair) CL in the block 504.

In memory access for writing data to or reading data from the memory cell MC in the DRAM, the following operation is carried out. First, a row address is applied to the row decoder 502. The row decoder 502 decodes the row address and raises the potential of one word line WL in the memory cell array 500 to "H". Data of the 1024 bits of memory cells MC connected to the selected word line WL are transmitted to corresponding column lines CL. The data on the column lines CL are amplified by sense amplifiers included in the block 504. Selection of a memory cell to which the data is written or from which the data is read out of the memory cells connected to the selected word line WL is carried out by a column selection signal from the column decoder included in the block 504. The column decoder decodes column address signals (more accurately, internal column address signals), and generates a column selecting signal for selecting the corresponding column in the memory cell array 500.

In the above described high speed mode, column addresses are successively applied to the column decoder included in the block 504. In the static column mode operation, column addresses applied at predetermined time intervals are decoded as new column addresses by the column decoder, and the corresponding memory cell out of the memory cells connected to the selected word line WL is selected by the column line CL. In the page mode, new column address is applied at every toggling of the signal CAS, and the column decoder decodes the column address to select the corresponding column line. In this manner, one row of memory cells MC connected to the selected word line WL can be accessed at high speed by setting one word line WL at a selected state and by changing the column addresses only.

FIG. 2 shows a general structure of a conventional 1M bit CDRAM. Referring to FIG. 2, the conventional CDRAM comprises, in addition to the components of the standard DRAM shown in FIG. 1, SRAM 506 and a transfer gate 508 for transferring data between one row of the memory cell array 500 of the DRAM and the SRAM 506. The SRAM includes a cache register provided corresponding to each column line CL of the memory cell array 500 so as to enable simultaneous storage of data of one row of the DRAM memory cell array 500. Therefore, 1024 cache registers are provided. The cache register is formed by a static memory cell (SRAM cell).

In the structure of the CDRAM shown in FIG. 2, when a signal representing a cache hit is externally applied, the SRAM 506 is accessed, enabling access to the memory at high speed. At the time of a cache miss (miss hit), the DRAM portion is accessed.

A CDRAM as described above having a DRAM of a large storage capacity and a high speed SRAM integrated on the same chip is disclosed in, for example, Japanese Patent Laying-Open Nos. 60-7690 and 62-38590.

In the above described conventional CDRAM structure, column lines (bit line pairs) CL of the DRAM memory cell array 500 and column lines (bit line pairs) of the SRAM (cache memory) 506 are connected in one to one correspondence through a transfer gate 508. More specifically, in the above described conventional CDRAM structure, data of the memory cells connected to one word line WL in the DRAM memory cell array 500 and the data of the same number of SRAM cells as memory cells of one row of the memory cell array 500 are transferred bi-directionally and simultaneously, through the transfer gate 508. In this structure, the SRAM 506 is used as a cache memory and the DRAM is used as a main memory.

The so called block size of the cache is considered to be the number of bits (memory cells) the contents of which are rewritten in one data transfer in SRAM 506. Therefore, the block size is the same as the number of memory cells which are physically coupled to one word line WL of DRAM memory cell array 500. As shown in FIGS. 1 and 2, when 1024 memory cells are physically connected to one word line WL, the block size is 1024.

Generally, when the block size becomes larger, the hit rate is increased. However, if the cache memory has the same size, the number of sets is reduced in inverse proportion to the block size, and therefore the hit rate is decreased. For example, when the cache size is 4K bits and the block size 1024, the number of sets is 4. However, if the block size is 32, the number of sets is 128. Therefore, in the conventional CDRAM structure, the block size is made too large, and the cache hit rate cannot be very much improved.

A structure enabling reduction in block size is disclosed in, for example, Japanese Patent Laying-Open No. 1-146187. In this prior art, column lines (bit line pairs) of the DRAM array and the SRAM array are arranged in one to one correspondence, but they are divided into a plurality of blocks in the column direction. Selection of the block is carried out by a block decoder. At the time of a cache miss (miss hit), one block is selected by the block decoder. Data are transferred only between the selected DRAM block and the associated SRAM block. By this structure, the block size of the cache memory can be reduced to an appropriate size. However, there remains the following problem unsolved.

FIG. 3 shows a standard array structure of a 1M bit DRAM array. In FIG. 3, the DRAM array is divided into 8 memory blocks DMB1 to DMB8. A row decoder 502 is commonly provided for the memory blocks DMB1 to DMB8 on one side in the longitudinal direction of the memory array. For each of the memory blocks DMB1 to DMB8, (sense amplifier +column decoder) blocks 504-1 to 504-8 are provided.

Each of the memory blocks DMB1 to DMB8 has the capacity of 128K bits. In FIG. 3, one memory block DMB is shown to have 128 rows and 1024 columns, as an example. One column line CL includes a pair of bit lines BL, /BL.

As shown in FIG. 3, when the DRAM memory cell array is divided into a plurality of blocks, one bit line BL (and/BL) becomes shorter. In data reading, charges stored in a capacitor (memory cell capacitor) in the memory cell are transmitted to a corresponding bit line BL (or/BL). At this time the amount of potential change generated on the bit line BL (or/BL) is proportional to the ratio Cs/Cb of the capacitance Cs of the memory cell capacitor to the capacitance Cb of the bit line BL (or/BL). If the bit line BL (or/BL) is made shorter, the bit line capacitance Cb can be reduced. Therefore, the amount of potential change generated on the bit line can be increased.

In operation, sensing operation in the memory block (memory block DMB2 in FIG. 3) including the word line WL selected by the row decoder 502 is carried out only, and other blocks are kept in a standby state. Consequently, power consumption associated with charging/discharging of the bit lines during sensing operation can be reduced.

When the above described partial activation type CDRAM is applied to the DRAM shown in FIG. 3, a SRAM register and a block decoder must be provided for each of the memory blocks DMB1 to DMB8, which significantly increases the chip area.

In this structure, only SRAM cache registers corresponding to the selected block operate, and therefore, efficiency in using the SRAM cache registers is low.

Further, the bit lines of the DRAM array and of the SRAM array are in one to one correspondence, as described above. When direct mapping method is employed as the method of mapping memories between the main memory and the cache memory, then the SRAM 506 is formed by 1024 cache registers arranged in one row, as shown in FIG. 2. In this case, the capacity of the SRAM cache is 1K bits.

When 4 way set associative method is employed as the mapping method, the SRAM array 506 includes 4 rows of cache registers 506a to 506d as shown in FIG. 4. One of the 4 rows of cache registers 506a to 506d is selected by the selector 510 in accordance with a way address. In this case, the capacity of the SRAM cache is 4K bits.

As described above, the method of memory cell mapping between the DRAM array and the cache memory is determined dependent on the internal structure on the chip. When the mapping method is to be changed, the cache size also must be changed.

In both of the CDRAM structures described above, the bit lines of the DRAM array and the SRAM array are in one to one correspondence. Therefore, the column address of the DRAM array is inevitably the same as the column address of the SRAM array. Therefore, full associative method in which memory cells of the DRAM array are mapped to an arbitrary position of the SRAM array is impossible in principle.

Another structure of a semiconductor memory device in which the DRAM and the SRAM are integrated on the same chip is disclosed in Japanese Patent Laying-Open No. 2-87392. In this prior art, the DRAM array and the SRAM array are connected through an internal common data bus. The internal common data bus is connected to an input/output buffer for inputting/outputting data to and from the outside of the device. Selected memory cells of the DRAM array and the SRAM array can be designated by separate addresses.

However, in this structure of the prior art, data transfer between the DRAM array and the SRAM array is carried out by an internal common data bus, and therefore the number of bits which can be transferred at one time is limited by the number of internal data bus lines, which prevents high speed rewriting of the contents of the cache memory. Therefore, as in the above described structure in which the SRAM cache is provided outside the standard DRAM, the speed of data transfer between the DRAM array and the SRAM array becomes a bottleneck, preventing provision of a high speed cache memory system.

(iii) Consideration on a general clock synchronized type semiconductor device for the problems of which the present invention includes the solution.

A semiconductor memory device of an application specific IC (ASIC) or for pipe line usage operates in synchronization with an external clock signal such as a system clock. Operation mode of a semiconductor memory device is determined dependent on states of external control signals at rising or falling edge of the external clock signal. The external clock signal is applied to the semiconductor memory device no matter whether the semiconductor memory device is being accessed or not. In this structure, in response to the external clock signal, input buffers or the like receiving the external control signals, address signals and data operate. In view of power consumption, it is preferred not to apply the external clock signal to the semiconductor memory device when the semiconductor memory device is not accessed, or to elongate period of the external clock signal.

Generally, a row address signal and the column address signal are applied multiplexed time divisionally to the DRAM. The row address signal and the column address signal are taken in the device in synchronization with the external clock signal. Therefore, when the conventional DRAM is operated in synchronization with the external clock signal, it takes long time to take the row address signal and the column address signal. Therefore, if low power consumption is given priority, the DRAM can not be operated at high speed.

If the conventional semiconductor memory device is operated in synchronization with the external clock signal, the speed of operation is determined solely by the external clock signal. If the semiconductor memory device is to be used where low power consumption is given priority over the high speed operation with the speed defined by the external clock signal, the conventional clock synchronized type semiconductor memory device can not be used for such application.

In a clock synchronized type semiconductor memory device, control signals and address signals are taken inside in synchronization with the clock signal. The control signals and address signals are taken inside by buffer circuits. Each buffer circuit is activated in synchronization with the clock signal and generates an internal signal corresponding to the applied external signal. In a standby state or the like, valid control signals and valid address signals are not applied. However, external clock signals are continuously applied, causing unnecessary operations of the buffer circuits. This prevents reduction in power consumption during standby state. If the cycle period of the external clock signal becomes shorter, the number of operations of the buffer circuits is increased, causing increase of power consumption during standby period. This is a serious problem in realizing low power consumption.

(iv) Consideration on the problems in refreshing operation in a conventional RAM If the semiconductor memory device includes dynamic memory cells (DRAM cells), the DRAM cells must be periodically refreshed. The refresh mode of a DRAM generally includes an auto refresh mode and a self refresh mode, as shown in FIGS. 5 and 6.

FIG. 5 shows waveforms in the auto refresh operation. In the auto refresh mode, a chip select signal *CE is set to "H" and an external refresh designating signal *REF is set to "L". In response to a fall of the external refresh designating signal *REF, an internal control signal int. *RAS for driving row selecting circuitry falls to "L". In response to the internal control signal int. *RAS, a word line is selected in accordance with a refresh address generated from a built-in address counter, and memory cells connected to the selected word line are refreshed. In the auto refresh mode, the timing of refreshing the semiconductor memory device is determined by the externally applied refresh designating signal *REF. Therefore, whether or not refreshing is being carried out in the semiconductor memory device can be known outside the memory device.

FIG. 6 shows waveforms in the self refresh operation. In the self refresh mode, the chip select signal *CE is set to "H" and the external refresh designating signal *REF is set to "L". When the external refresh designating signal *REF falls to "L", the external control signal int. *RAS is generated, and a word line is selected in accordance with the refresh address from the built-in address counter. Thereafter, sensing operation and rewriting of the memory cells connected to the selected word line are carried out, and the memory cells connected to the word line WL are refreshed.

The first cycle of self refreshing is the same as that of auto refreshing. When the chip select signal *CE is at "H" and the refresh designating signal *REF is kept at "L" for a predetermined time period TF or longer, a refresh request signal is generated from a built-in timer. In response, the internal control signal int. *RAS is generated, the word line is selected and the memory cells connected to the selected word line are refreshed. This operation is repeated while the refresh designating signal *REF is at "L". In the refreshing operation in the self refresh mode, the timings of refreshing are determined by a timer contained in the semiconductor memory device. Therefore, timings of refreshing can not be known from the outside. Normally, data can not be externally accessed in the self refresh mode. Therefore, in the normal mode, self refreshing is not carried out. The self refresh mode is generally carried out at a standby for retaining the data.

Different semiconductor chips have different upper limits of refresh period necessary for retaining data (see NIKKEI ELECTRONICS, Apr. 6, 1987, p. 170, for example). Generally, a guaranteed value for retaining data is measured by testing the semiconductor memory device, and period of a timer defining the self refresh cycle is programmed in accordance with the guaranteed value, for carrying out self refreshing. When auto refresh mode and self refresh mode are selectively used, the guaranteed value for retaining data must be measured in order to determine the self refresh cycle. As shown in FIG. 6, in the self refresh mode, an operation similar to that in the auto refreshing is carried out in response to the external refresh designating signal *REF, and then refreshing operation in accordance with the timer is carried out. Therefore, in an accurate sense, the self refresh cycle means a cycle carried out after a lapse of a prescribed time period TF successive to the auto refreshing. In the self refresh cycle, the refresh timing is determined by the contained timer, as described above, and the timings of refreshing can not be known from the outside. Therefore, the self refresh cycle can not be used as a method of hidden refreshing, for example, in a normal operation mode.

(v) Consideration on Array Arrangement in CDRAM and data transfer between CDRAM and MPU (burst mode)

In a semiconductor memory device containing a DRAM array and a SRAM array, it is preferred to transfer data at high speed from the DRAM array to the SRAM array, so as to enable high speed operation. When data are transferred from the DRAM array to the SRAM array, a row (word line) is selected, data of the memory cells connected to the selected word line are detected and amplified, and then a column is selected in the DRAM array.

Generally, a row address signal and a column address signal are applied multiplexed to the DRAM. Therefore, increase of the speed of data transfer from the DRAM array to the SRAM array is limited by this address multiplexing. In this case, it is possible to apply the row address and the column address simply in accordance with a non-multiplex method to the DRAM. However, in that case, the number of terminals for inputting DRAM addresses are increased significantly. When the number of terminals is increased, the chip size and the package size are increased, which is not preferable.

In addition, data transfer from the DRAM array to the SRAM array must be done after detection and amplification of the memory cell data by the sense amplifiers. Therefore, data transfer from the DRAM array to the SRAM array can not be carried out at high speed.

Further, some external operational processing units such as a CPU (Central Processing Unit) include a data transfer mode called a burst mode for carrying out data transfer at high speed. In the burst mode, a group of data blocks are transferred successively. A block of data is stored at successively adjacent address positions. Since the burst mode is a high speed data transfer mode, the data blocks are stored in the cache memory in the semiconductor memory device containing a cache. A semiconductor memory device containing a cache which can be easily connected to an operational processing unit having burst mode function has not yet been provided.

In order to implement a CDRAM, DRAM array and SRAM array are integrated on the same semiconductor chip. The semiconductor chip is housed in a package. The layout of DRAM array and SRAM array as well as the geometrical figures thereof on the chip are determined by the geometrical figure and the physical dimensions of the housing package.

DRAM array and its associated circuitry occupy a major area of a chip in CDRAM because DRAM is employed as a large storage capacity memory. Thus, the size and figure of DRAM array are substantially determined by the size and shape of the housing package.

In order to efficiently use the chip area, SRAM array should be arranged or laid out on the chip efficiently. However, no consideration has made on the configuration of SRAM array for implementing efficient chip area utilization and for housing CDRAM in a package of an arbitrary shape and size.

SUMMARY OF THE INVENTION

An object of the present invention is to provide a novel CDRAM with various operational functions and efficient chip layout.

Another object of the present invention is to provide a semiconductor memory device in which self refreshing can be carried out in the normal mode.

A further object of the present invention is to provide a semiconductor memory device allowing data transfer between DRAM array and a SRAM array at a high speed and with less power consumption.

A further another object of the present invention is to provide a clock synchronized type semiconductor memory device in which power consumption at standby mode can be significantly reduced.

A still further object of the present invention is to provide a semiconductor memory device which can be accessed at high speed even at a cache miss (miss hit).

A still further object of the present invention is to provide a semiconductor memory device containing a cache which can be easily connected to an arithmetic operation unit having burst mode function.

A still further object of the present invention is to provide a semiconductor memory device which operates at high speed even if the period of external clock signals is made longer.

A still further object of the present invention is to provide a clock synchronized type semiconductor memory device which surely operates even if the period of the external clock signal is made longer or even if the external clock signal is generated intermittently.

A still further object of the present invention is to provide a semiconductor memory device containing a cache which operates at high speed without malfunction with low power consumption.

A still further object of the present invention is to provide a semiconductor memory device containing a cache which operates in synchronization with clocks, and operates at high speed without malfunction under low power consumption.

A still further object of the present invention is to provide a semiconductor memory device which can be readily applied to use where high speed operation is given priority and to use where low power consumption is given priority.

A still further object of the present invention is to provide a semiconductor memory device containing a cache which easily realizes high speed operation and low power consumption dependent on the intended use.

A still further object of the present invention is to provide a semiconductor memory device containing a cache operating in synchronization with clocks which easily realizes both high speed operation and low power consumption dependent on intended use.

A still further another object of the present invention is to provide an array arrangement which allows effective use of chip area.

Yet another object of the present invention is to provide an SRAM array arrangement having a flexible array structure which can easily correspond to an arbitrary shape of the DRAM array.

A yet further object of the present invention is to provide a semiconductor memory device containing a cache having an array arrangement having high density and suitable for high degree of integration.

The present invention includes various aspects each of which is recited independently of others in the following.

A semiconductor memory device in accordance with a first aspect of the present invention includes a DRAM array having dynamic memory cells; means for generating a refresh address; an automatic refresh means for refreshing the DRAM array in response to an external refresh designation; timer means measuring time for outputting a refresh request every prescribed timing; refresh means for refreshing the DRAM array in response to the refresh request from the timer means; refresh mode setting means for setting the refresh mode to either the auto refresh or self refresh mode; and input/output switching means for setting one pin terminal to a refresh designating input terminal or to a self refresh execution designating output terminal, in accordance with the refresh mode set by refresh mode setting means. The timer means is activated when self refresh mode is set by the refresh mode setting means.

In accordance with a second aspect of the present invention, the semiconductor memory device comprises first and second memory cell arrays each including a plurality of memory cells arranged in rows and columns; a first row address input terminal for receiving a first row address for designating a row of the first memory cell array; a first column address input terminal for receiving a first column address for designating a column of the first memory cell array; a second row address input terminal for receiving a second row address for designating a row of the second memory cell array; and a second column address input terminal for receiving a second column address for designating a column of the second memory cell array. The first row address input terminal and the first column address input terminal include input terminals different from each other. The second row address input terminal and the second column address input terminal include input terminals which are different from each other. The first column address input terminal includes a pin arrangement which is shared with at least one of the second row address input terminal and the second column address input terminal.

In accordance with the third aspect of the present invention, the semiconductor memory device includes first and second memory cell arrays each including a plurality of memory cells arranged in rows and columns; first address means for generating a first internal row address signal and a first internal column address signal for designating a row and a column of the first memory cell array in accordance with an external address; and second address means for generating a second internal row address and a second internal column address for designating a row and a column of the second memory cell array in accordance with the external address. The first and second address means are activated in synchronization with an external clock signal, and simultaneously generates the first internal row address signal, the first internal column address signal, the second internal row address signal and the second internal column address signal in accordance with the timing determined by the clock signal.

The semiconductor memory device in accordance with the fourth aspect of the present invention includes a DRAM array including a plurality of dynamic memory cells arranged in rows and columns; an SRAM array including a plurality of static memory cells arranged in rows and columns; data transfer means provided separate from an internal data transmitting line for transferring data between the DRAM array and the SRAM array; sense amplifier means for detecting and amplifying information of the selected memory cells of the DRAM array; and control means responsive to a transfer designation from the DRAM array to the SRAM array for activating the transferring means at a timing earlier than the timing of activating the sense amplifier means. Bit line data of the DRAM array are transmitted directly to the transfer means, not through the internal data line.

The semiconductor memory device in accordance with the fifth aspect of the present invention includes a DRAM array including a plurality of dynamic memory cells arranged in rows and columns; an SRAM array including a plurality of static memory cells arranged in rows and columns; amplifying means provided for each column of the DRAM array for amplifying signals on the corresponding column; sense amplifier means for amplifying and latching signals on the corresponding column; data transfer means provided separate from an internal data transmitting line for transferring data between the DRAM array and the SRAM array; means responsive to an address signal for selectively transmitting outputs from the amplifying means to the data transferring means; and control means responsive to a data transfer designation for activating the data transferring means before the activation of the sense amplifier means.

The transfer mean includes means for forming a current mirror amplifying means by supplying current to the amplifying means.

In accordance with a sixth aspect of the present invention, the semiconductor memory device includes address input means for receiving address signals; address generating means responsive to a burst mode designation for successively generating address signals at prescribed timings; address selecting means receiving an output from address input means and an output from address generating means, responsive to the burst mode designation for selectively passing the output of the address generating means; and memory cell selecting means for selecting a corresponding memory cell out of a plurality of memory cells in accordance with the output from the address selecting means.

In accordance with a seventh aspect of the present invention, the semiconductor memory device includes address input means for receiving addresses applied from an external arithmetic processing unit; address generating means responsive to a burst mode designation from the external arithmetic processing unit for generating addresses in synchronization with external clock signals; address selecting means for selectively passing an output from address input means or an output from address generating means; and memory cell selecting means for selecting a corresponding memory cell from the memory cell array in accordance with the output from the address selecting means. The address selecting means selectively passes the output from the address generating means in response to the burst mode designation.

In accordance with the eighth aspect of the present invention, the memory device includes internal clock generating means responsive to an external clock signal for generating an internal clock signal, and setting means for setting the internal clock generating means to operation inhibited state in response to a standby state designating signal. The externally applied signal is taken in response to the internal clock signal generated from the internal clock generating means.

In accordance with a ninth aspect of the present invention, the semiconductor device includes, in addition to those provided in the eighth aspect, refreshing means responsive to the inhibition of the internal clock generation by the setting means for refreshing dynamic memory cells.

A semiconductor memory device in accordance with a tenth aspect of the present invention includes a memory cell array having a plurality of memory cells arranged in rows and columns, and internal address generating means receiving an external address signal for generating an internal address signal. The external address signal includes an external row address signal for designating a row of the memory cell array, and an external column address signal for designating a column of the memory cell array. The internal address generating means generates internal row address signal and internal column address signal corresponding to the external row address signal and the external column address signal, respectively.

The internal address generating means of the semiconductor memory device in accordance with the tenth aspect of the present invention includes first address generating means which takes one of the above mentioned external row address signal and the external column address signal at a first timing of an externally applied clock signal for generating a first internal address signal corresponding to the taken external address signal, and second address generating means which takes the other one of the external row address signal and the external column address signal at a second timing of the externally applied clock signal for generating a second internal address corresponding to the taken external address signal.

The first timing is determined by one of the rise and fall of the externally applied clock signal, and the second timing is determined by the other one of the rise and fall of the externally applied clock signal.

The semiconductor memory device in accordance with an eleventh aspect of the present invention includes a memory cell array including a plurality of memory cells, and address generating means receiving externally applied external address signal for generating an internal address signal corresponding to the received external address signal. The external address signal designates a memory cell in the memory cell array.

The semiconductor memory device in accordance with the eleventh aspect of the present invention further includes setting means responsive to an externally applied timing designating signal for taking an address for setting the timing for the address generating means to take the externally applied address signal.

The address generating means takes the applied external address signal in accordance with the timing set by the setting means and generates the internal address signal.

The semiconductor memory device in accordance with the twelfth aspect of the present invention includes a DRAM array including a plurality of dynamic memory cells arranged in rows and columns, an SRAM array including a plurality of static memory cells arranged in a matrix of rows and columns, and data transferring means provided between the DRAM array and the SRAM array for transferring data between a selected memory cell of the DRAM array and a selected memory cell in the SRAM array.

Each row of the matrix of the SRAM array includes memory cells divided into n groups. The SRAM array further includes a plurality of word lines each connected to memory cells of different group, n word lines being arranged for each row in parallel to the row direction of the matrix.

A semiconductor memory device in accordance with a thirteenth aspect of the invention includes a high speed memory array having a plurality of static type memory cells, a large storage capacity memory array having a plurality of memory cells, and data transfer means for transferring data between a selected static type memory cell and a selected dynamic type memory cell.

The semiconductor memory device of the thirteenth aspect further includes a data transfer bus for coupling the selected memory cell of the large storage capacity memory array with the data transfer means, clamping means for clamping the potential on the data transfer bus, and control means responsive to an indication of data transfer from the high speed memory array to the large storage capacity memory array for inhibiting a clamping operation of the clamping means.

A semiconductor memory device in accordance with a fourteenth aspect of the invention includes a high speed memory array having a plurality of static type memory cells arranged in rows and columns, a large storage capacity memory array having a plurality of dynamic type memory cells, and data transfer means for transfer data between a selected static type and a selected dynamic type memory cell.

The semiconductor memory device in accordance with the fourteenth aspect further includes clamping means provided for each column of the high speed memory array for clamping the potential of an associated column, and control means responsive to an indication of data transfer from the large storage capacity memory array to the high speed memory array for inhibiting a clamping operation by the clamping means.

According to the first aspect of the present invention, setting of the self refresh mode or the auto refresh mode is done by refresh mode setting means and one terminal is switched by the input/output switching means to be a refresh designating input terminal in the auto refresh mode, and the self refresh execution designating output terminal in the self refresh mode. Therefore, even in the self refresh mode, refresh timing can be known from the outside of the memory device, and self refresh mode can be utilized even in the normal mode.

In accordance with the second aspect of the present invention, since the row and column designating input terminals of the first and second memory cell array are provided separately for inputting the row address signals and the column address signals, the row address signals and the column address signals to the first and second memory cell arrays can be applied in the non-multiplexed manner. Part of the address signals to the first memory cell array and address signals to the second memory cell array is applied to the same input terminal. Therefore, address non-multiplex method can be realized without increasing the number of input terminals.

According to the third aspect of the present invention, the first and second address means generate internal address signals by simultaneously taking address signals in synchronization with the external clock signal, and therefore the clock synchronized type semiconductor memory device can be operated at high speed employing address non-multiplex method.

According to the fourth aspect of the present invention, data transfer means is activated at an earlier timing than the activation of the sense amplifier in the DRAM array, and therefore data can be transferred from the DRAM array to the SRAM array at high speed.

According to the fifth aspect of the present invention, an output from a current mirror type amplifier is transmitted through the data transfer means, and therefore the data transfer means can be activated without waiting for the activation of the latch type sense amplifier, which enables high speed data transfer from the DRAM array to the SRAM array.

According to the sixth aspect of the present invention, an internal counter is activated in response to a burst mode designation from an external arithmetic processing unit, an output from the address counter is selected by a multiplexer to be utilized as an address signal, and the multiplexer selects external address signals in a mode other than the burst mode. Therefore, a semiconductor memory device which can be easily connected to an external arithmetic processing unit having burst mode function can be provided.

According to the seventh aspect of the present invention, a counter as a built-in address generator effects counting operation in synchronization with the external clock signal, the output from the counter is used as an address in the burst mode, and external address signals are taken and utilized in synchronization with an external clock signal in operation modes other than the burst mode. Therefore, a clock synchronized type semiconductor memory device which can be easily connected to an external operational processing unit having burst mode function can be realized.

According to the eighth aspect of the present invention, when generation of the internal clock signal is stopped at the standby state of the clock synchronized type semiconductor memory device, operations of external signal input buffer and the like are stopped, so that power consumption in the standby state can be reduced.

According to the ninth aspect of the present invention, self refresh mode is activated when generation of the internal clock signal is stopped in the invention in accordance with the eighth aspect, and therefore data of the DRAM array can be surely retained in the standby state.

According to the tenth aspect of the present invention, since the external row address signals and the external column address signals are taken at timings determined by the rise and fall of the external clock signals, the external row address signal and the external column address signal can be taken by a single pulse of the external clock signal. Therefore, compared with a structure in which the external row address signal and the external column address signal are taken time divisionally at timings determined by the rise of the external clock signal, the external row address signal and the external column address signal can be taken sooner. Generally, operation of a clock synchronized type semiconductor memory device starts after the external address signals are taken. Therefore, the semiconductor memory device can be operated at higher speed.

According to the eleventh aspect of the present invention, the timing for taking the external address signals is determined by timing information set by setting means. Therefore, time required for taking the external address signals can be set to an optimal value dependent on the period of the external clock signals, and therefore higher speed of operation and lower power consumption can be flexibly realized.

In the SRAM array according to the twelfth aspect, memory cells arranged in one row is divided into a plurality of groups. Memory cells of each group is connected to a word line provided corresponding to each group. Therefore, memory cells of one row of the SRAM array are connected to a plurality of word lines. By adjusting the number n of the groups of the memory cells of one row, an SRAM array having an arbitrary shape can be provided without changing the number of memory cells connected to one word line.

In the semiconductor memory device according to the thirteenth and fourteenth aspects, the control means is operable to inhibit the clamping operation of the clamping means provided at the data receiving side. Consequently, a current flow is prevented from flowing into the data transfer means from the clamping means, resulting in reduced current consumption.

The foregoing and other objects, features, aspects and advantages of the present invention will become more apparent from the following detailed description of the present invention when taken in conjunction with the accompanying drawings.

BRIEF DESCRIPTION OF THE DRAWINGS

This application includes a large number of the drawing figures, and we first classify the figures according to the embodiments for the reader's convenience.

FIGS. 7 through 31 represent an array arrangement of CDRAM of the present invention.

FIGS. 44 through 60D represents data transfer between DRAM array and SRAM array.

FIGS. 76 to 80 represent the usage of CDRAM in a system.

FIGS. 81 through 104 represent specific operation modes of the CDRAM.

FIGS. 119 through 161 represent specific operations of another CDRAM.

FIGS. 162 through 175 represent selective usage of the auto-refreshing and self refreshing.

FIG. 215 summarizes the internal operations of another CDRAM.

Now, respective figures are described in the following.

FIG. 1 shows a structure of a memory array in a conventional dynamic semiconductor memory device.

FIG. 2 shows a structure of an array portion in a conventional semiconductor memory device containing a cache.

FIG. 3 shows, as an example, a layout of the cache and the DRAM array in the conventional semiconductor memory device containing a cache.

FIG. 4 shows a structure of a cache when 4 way set associative method is realized by the conventional semiconductor memory device containing a cache.

FIG. 5 is a diagram of signal waveforms showing the operation in the automatic refreshing in the conventional semiconductor memory device.

FIG. 6 is a diagram of signal waveforms showing self refreshing operation in the conventional semiconductor memory device.

FIG. 7 schematically shows a structure of a memory array portion of the semiconductor memory device according to an embodiment of the invention.

FIG. 8 shows detailed structure of the memory array shown in FIG. 7.

FIG. 9 shows another example of the structure of the array arrangement in the semiconductor memory device according to an embodiment of the invention.

FIG. 10 shows array arrangement of a semiconductor memory device containing a 4M bit DRAM and a 16K bit SRAM.

FIG. 11 shows layout of DRAM array signal lines in one memory block of the semiconductor memory device shown in FIG. 10.

FIG. 12 schematically shows structures of a bit line and a word line related to a memory cell of the DRAM shown in FIG. 10.

FIG. 13 schematically shows a structure of a word line in the semiconductor memory device of FIG. 10.

FIG. 14 shows layout of signal lines in the semiconductor memory device shown in FIG. 10.

FIG. 15 shows a structure of an SRAM array of the semiconductor memory device shown in FIG. 5.

FIG. 16 shows a structure of a conventional SRAM cell.

FIG. 17 is a diagram of signal waveforms showing the operation of the SRAM cell shown in FIG. 16.

FIG. 18 shows an example of a shape of a package for a semiconductor memory device containing a cache, and SRAM array and DRAM array arrangements contained therein.

FIG. 19 shows problems of the general SRAM array.

FIG. 20 is a diagram showing problems of the general SRAM array arrangement.

FIG. 21 shows a principle of the SRAM array arrangement of the present invention.

FIG. 22 shows, in comparison, the arrangement of the SRAM array of the present invention and the prior art arrangement.

FIG. 23 shows a pattern layout of the SRAM cell shown in FIG. 21.

FIG. 24 shows an SRAM array structure of the semiconductor memory device containing a cache in accordance with one embodiment of the present invention.

FIG. 25 shows an example of a transfer gate circuit structure shown in FIG. 24.

FIG. 26 shows an example of a specific structure of the selecting circuit shown in FIG. 25.

FIG. 27 shows a structure of the SRAM array arrangement and a structure of a transfer gate circuit employed for that SRAM arrangement.

FIG. 28 shows a specific structure of a transfer path from the SRAM array to the DRAM array of the transfer gate circuit shown in FIG. 27.

FIG. 29 shows a detailed structure of the data transfer path from the DRAM array to the SRAM array of the transfer gate circuit shown in FIG. 27.

FIG. 30 is a diagram of signal waveforms showing the operation of the transfer gate circuit shown in FIGS. 27 to 29.

FIG. 31 shows a pin arrangement and a package for containing the semiconductor memory device shown in FIG. 5.

FIG. 32 shows functionally the whole structure of a semiconductor memory device containing a cache in accordance with one embodiment of the present invention.

FIG. 33 shows manner of connections of the bit lines in the DRAM array and bit lines in the SRAM array with internal data line in the semiconductor memory device shown in FIG. 32.

FIG. 34 shows an example of a structure of a data input/output circuit of the semiconductor memory device shown in FIG. 32.

FIG. 35 shows another example of the data input/output circuit of the semiconductor memory device shown in FIG. 32.

FIG. 36 shows a further example of the data input/output circuit of the semiconductor memory device shown in FIG. 32.

FIG. 37 shows a circuit structure for setting data output mode of the semiconductor memory device shown in FIG. 32.

FIG. 38 shows a structure of an output circuit shown in FIG. 36.

FIG. 39 shows an example of a specific structure of a latch circuit shown in FIG. 37.

FIG. 40 is a block diagram showing a structure of an output control circuit shown in FIG. 36.

FIG. 41 shows timings of operations in latch output mode of the circuit shown in FIG. 37.

FIG. 42 shows timings of operations in register output mode of the circuit shown in FIG. 37.

FIG. 43 shows timing of operations in transparent output mode of the circuit shown in FIG. 37.

FIG. 44 shows an example of a specific structure of a data transfer circuit in the semiconductor memory device shown in FIG. 32.

FIG. 45 is a diagram of signal waveforms showing data transfer operation from the DRAM array to the SRAM array when the transfer gate circuit shown in FIG. 44 is employed.

FIG. 46 is a diagram of signal waveforms showing data transfer operation from the SRAM array to the DRAM array.

FIG. 47 is another diagram of signal waveforms showing data transfer operation from the DRY1 array to the SRAM array when the bi-directional data transfer circuit shown in FIG. 44 is employed.

FIGS. 48A through 48F show, as an example, data transfer operation at a cache miss in the semiconductor memory device shown in FIG. 32.

FIG. 49 shows another example of the structure of the bi-directional transfer gate circuit.

FIG. 50 shows specific structure of the circuit shown in FIG. 49.

FIG. 51 shows data transfer operation from the DRAM array to the SRAM array by the circuit shown in FIGS. 49 and 50.

FIG. 53 is a diagram of signal waveforms showing data transfer operation from the SRAM array to the DRAM array when the data transfer circuit shown in FIGS. 49 and 50 is employed.

FIG. 54 shows, as an example, data transfer operation shown in FIG. 53.

FIG. 55 is a diagram of signal waveforms showing data transfer operation from the DRAM array to the SRAM array at a cache miss reading, when the transfer gate circuit shown in FIGS. 49 and 50 is employed.

FIG. 57 shows another example of the structure of the bi-directional data transfer gate.

FIG. 58 shows detailed structure of the circuit shown in FIG. 57.

FIG. 59 is a diagram of signal waveforms showing data transfer operation from the DRAM array to the SRAM array when the circuit of FIG. 57 is employed.

FIGS. 60A through 60D show, as an example, data transfer operation shown in FIG. 59.

FIG. 61 shows a modified array arrangement of CDRAM with clamping circuitry.

FIG. 62 shows an equivalent arrangement to the arrangement of FIG. 61.

FIG. 63 shows a specific construction of the bidirectional transfer gate of FIG. 62.

FIG. 64 is a waveform diagram showing data transfer from DRAM to SRAM with the transfer gate of FIG. 63.

FIG. 65 is a waveform diagram showing data transfer from SRAM to DRAM with the transfer gate of FIG. 63.

FIG. 66 shows another construction of the bidirectional transfer gate of FIG. 63.

FIG. 67 shows further another construction of the bidirectional transfer gate of FIG. 62.

FIG. 68 is a waveform diagram showing data transfer from DRAM to SRAM with the transfer gate of FIG. 67.

FIG. 69 is a waveform diagram showing data transfer from the latch circuit to DRAM with the transfer gate of FIG. 67.

FIG. 70 shows another construction of the clamping circuit.

FIG. 71 shows an example of the manner of allottance of DRAM addresses and SRAM addresses in the semiconductor memory device shown in FIG. 32.

FIG. 72 shows another structure for allotting DRAM addresses and SRAM addresses in the semiconductor memory device shown in FIG. 32.

FIG. 73 shows a manner of connection between internal data lines and SRAM bit line pairs when addresses are allotted in the manner shown in FIG. 72.

FIG. 74 functionally shows the structure of the transfer gate control circuit shown in FIG. 32.

FIG. 75 shows functional structure of a DRAM driving circuit shown in FIG. 32.

FIG. 76 is a table showing combinations of control signals for effecting various operations realized by the semiconductor memory device shown in FIG. 10.

FIG. 77 shows combinations of command registers of the semiconductor memory device shown in FIG. 32 and control signals for selecting the command registers.

FIG. 78 shows, as an example, a function realized by the command register shown in FIG. 77.

FIG. 79 shows one example of a manner of connection between the semiconductor memory device shown in FIG. 10 and an external CPU.

FIG. 80 shows another example of the manner of connection between the semiconductor memory device containing a cache shown in FIG. 10 and an external CPU.

FIG. 81 shows timings of cache hit writing operation in the semiconductor memory device shown in FIG. 10.

FIG. 82 shows timings showing cache hit reading operation in transparent output mode of the semiconductor memory device shown in FIG. 10.

FIG. 83 shows timings showing cache hit reading operation in latch output mode in the semiconductor memory device shown in FIG. 10.

FIG. 84 shows timings of cache hit reading operation in a register output mode in the semiconductor memory device shown in FIG. 10.

FIG. 85 shows timings for setting a copy back operation in the semiconductor memory device shown in FIG. 5.

FIG. 86 shows timings for setting a block transfer operation in the semiconductor memory device shown in FIG. 10.

FIG. 87 shows timings for setting an array writing operation in the semiconductor memory device shown in FIG. 10.

FIG. 88 shows timings of control signals for setting an array reading operation in the semiconductor memory device shown in FIG. 10.

FIG. 89 shows timings for setting an array active cycle in the semiconductor memory device shown in FIG. 10.

FIG. 90 shows timings of control signals for setting an array active operation accompanying a transparent output mode in the semiconductor memory device shown in FIG. 10.

FIG. 91 shows timings of control signals for setting an array active cycle accompanied with a latched output mode in the semiconductor memory device shown in FIG. 10.

FIG. 92 shows timings of control signals for setting an array active operation accompanied with the registered output mode in the semiconductor memory device shown in FIG. 10.

FIG. 93 shows timings of an array read cycle in the transparent output mode in the semiconductor memory device shown in FIG. 10.

FIG. 94 shows timings of array read cycle accompanied with the latched output mode in the semiconductor memory device shown in FIG. 10.

FIG. 95 shows timings of array read cycle operation in the register output mode in the semiconductor memory device shown in FIG. 10.

FIG. 96 shows timings of control signals for setting the refreshing operation in the semiconductor memory device shown in FIG. 10.

FIG. 97 shows timings of various control signals for simultaneously carrying out the cache hit writing operation and refreshing in the semiconductor memory device shown in FIG. 10.

FIG. 98 shows timings of control signals for setting refreshing operation with cache hit reading in the transparent output mode of the semiconductor memory device shown in FIG. 10.

FIG. 99 shows timings of control signals for setting refreshing operation with cache reading in the latch output mode of the semiconductor memory device shown in FIG. 10.

FIG. 100 shows timings of control signals for setting refreshing accompanied with cache hit reading operation in the registered output mode of the semiconductor memory device shown in FIG. 10.

FIG. 101 shows timings of control signals for setting a command register setting cycle of the semiconductor memory device according to FIG. 10.

FIG. 102 illustrates state transitions showing the operation at a cache miss of the semiconductor memory device shown in FIG. 10.

FIG. 103 illustrates state transitions showing the array access operation in the semiconductor memory device shown in FIG. 10.

FIG. 104 shows state transitions during refreshing operation of the semiconductor memory device shown in FIG. 10.

Figure 105:
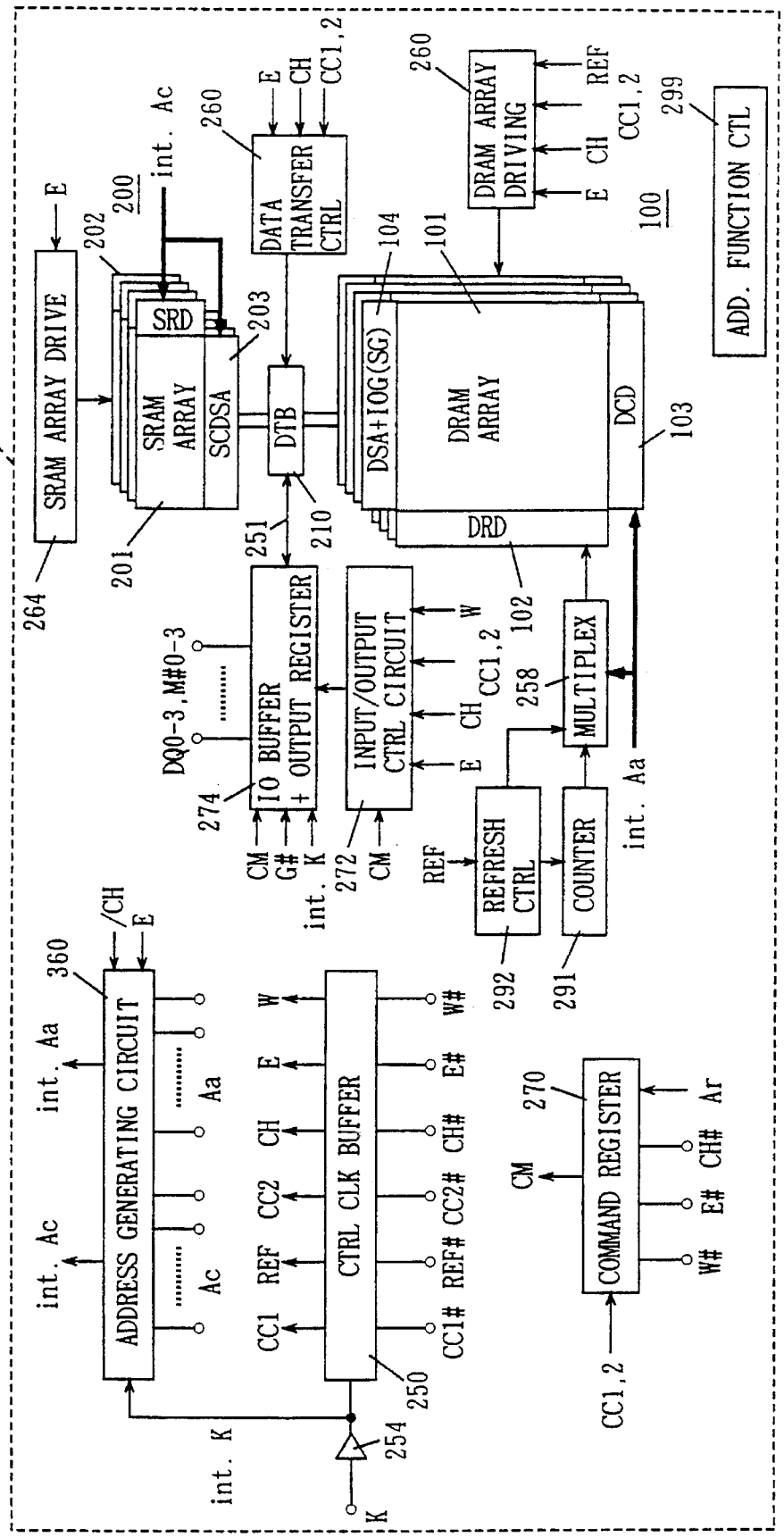
FIG. 105 shows an overall construction of another CDRAM according to the present invention.

FIG. 105 functionally shows a structure of a semiconductor memory device in accordance with a second embodiment of the present invention.

Figure 106:
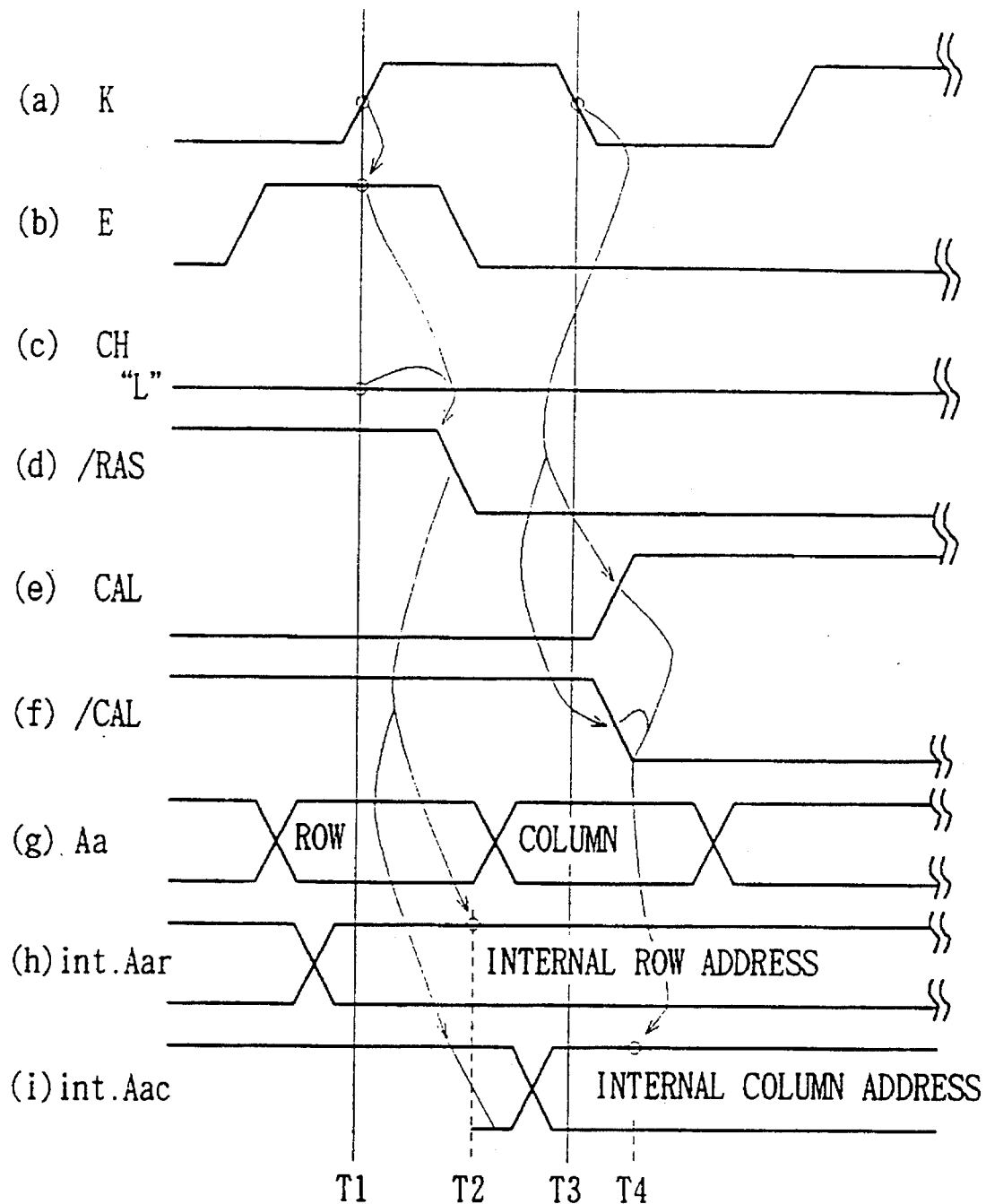
FIGS. 106 through 118 are related to high speed and low power operation modes.

FIG. 106 is a diagram of waveforms showing timings for taking DRAM addresses of the semiconductor memory device shown in FIG. 105.

Figure 107:
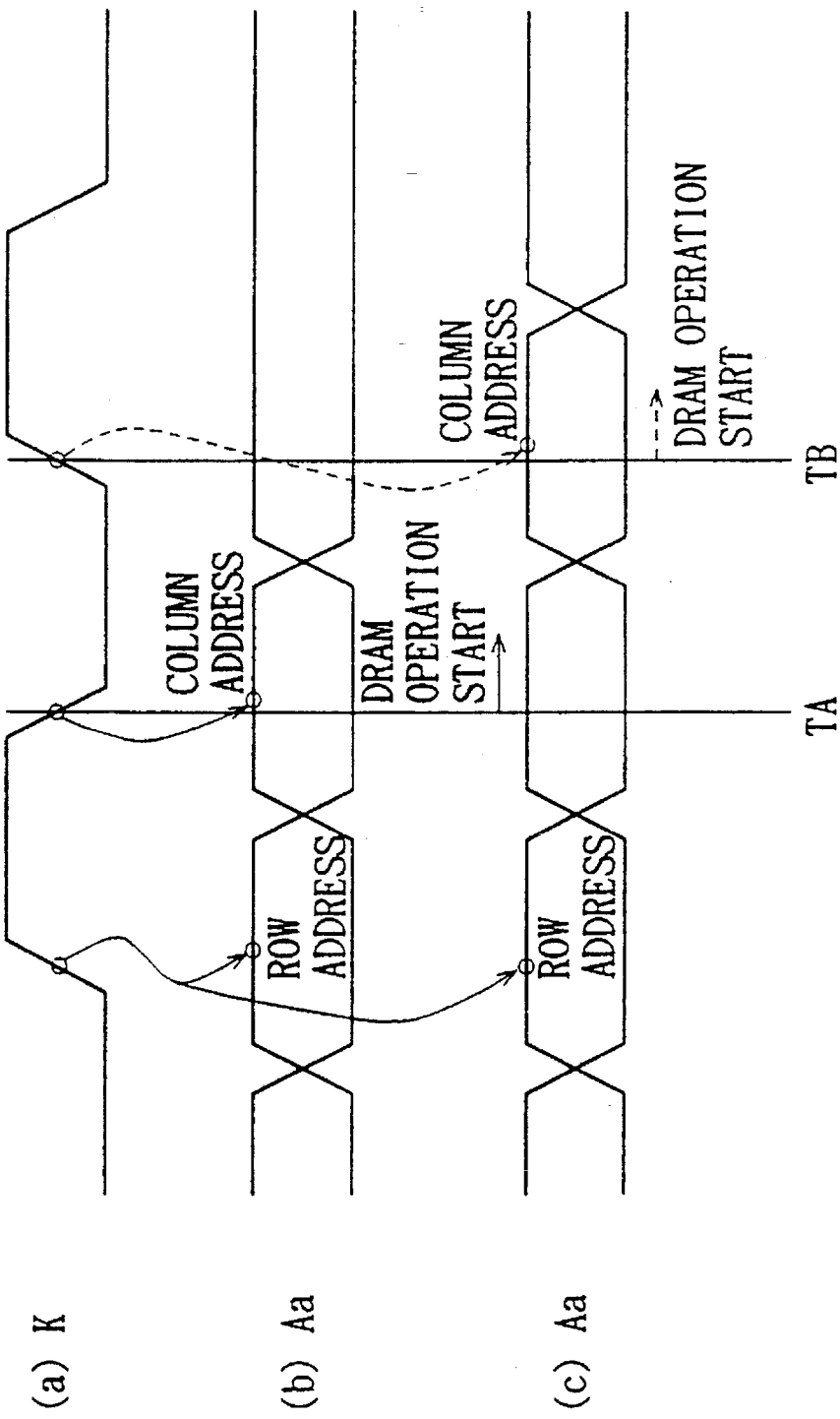

FIG. 107 shows effects provided by an address generating circuit included in the semiconductor memory device shown in FIG. 105.

Figure 108:
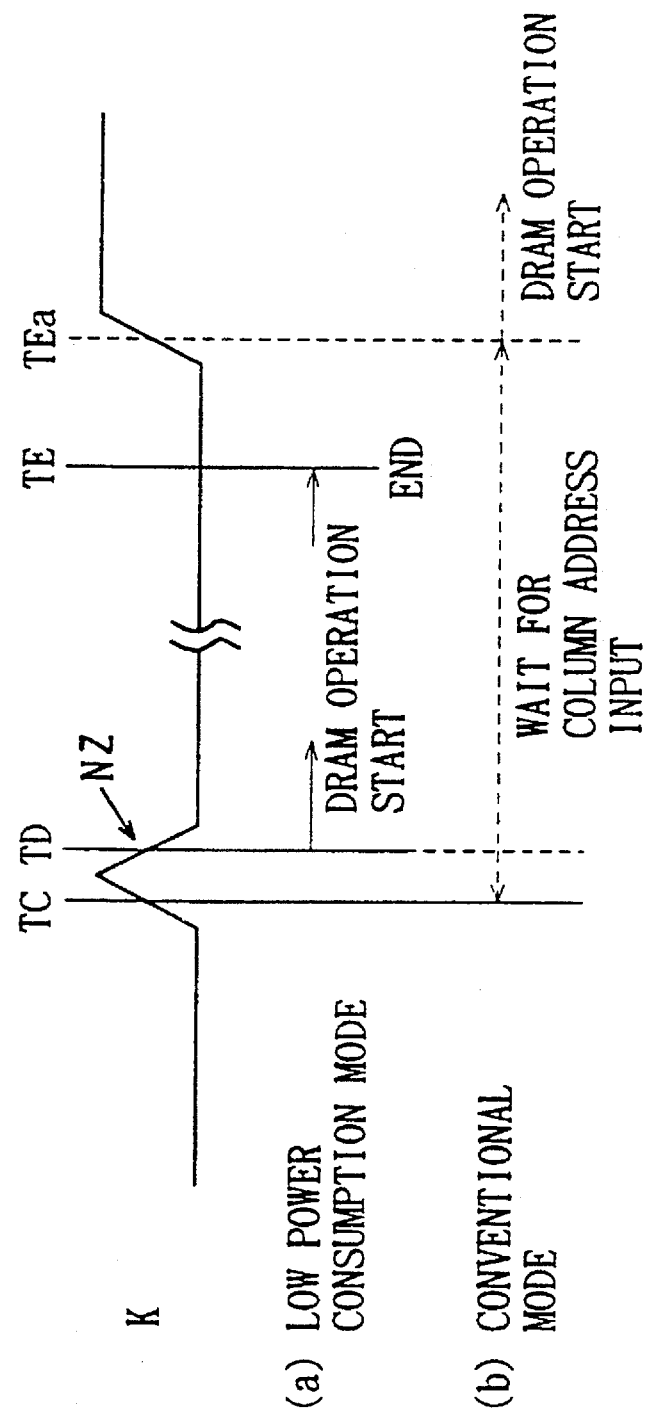

FIG. 108 shows another effect of the address generating circuit shown in FIG. 105.

Figure 109:
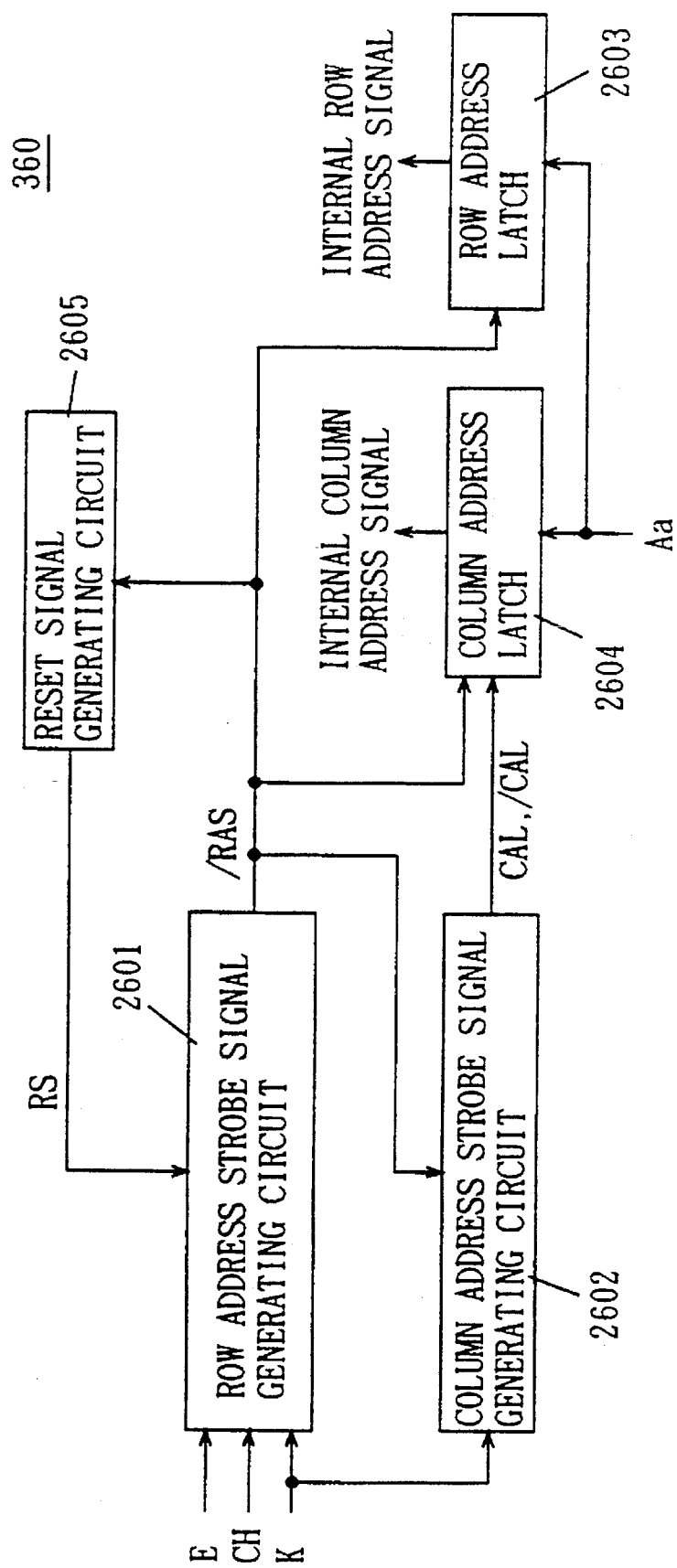

FIG. 109 shows a specific structure of the address generating circuit shown in FIG. 105.

Figure 110:
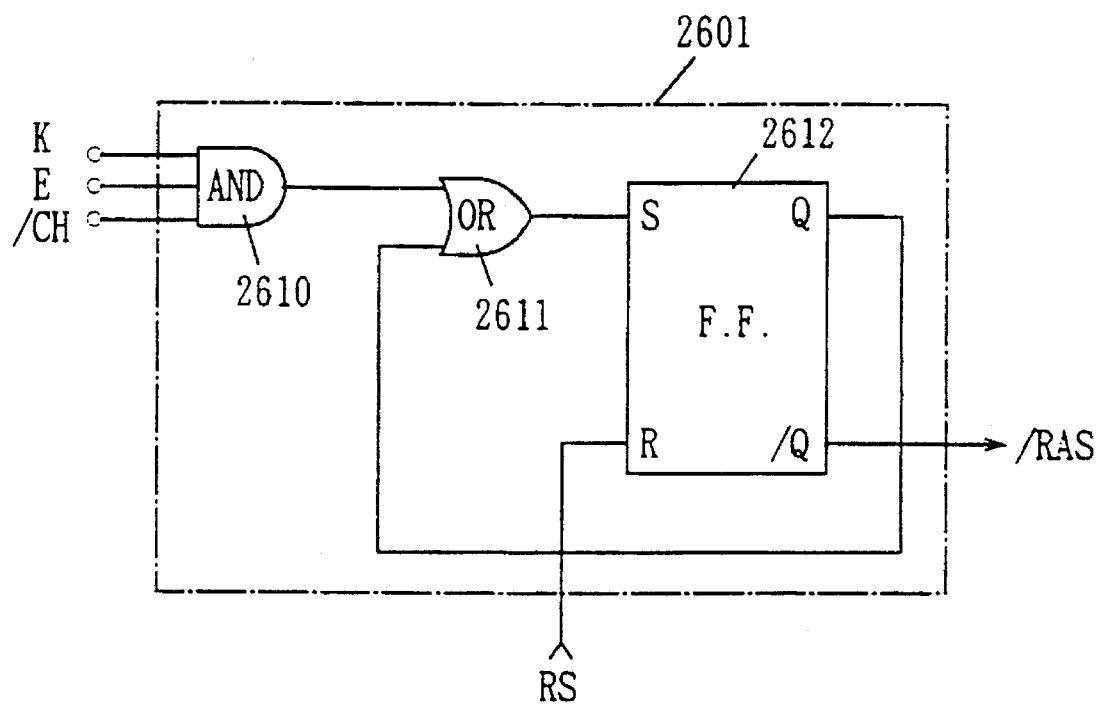

FIG. 110 shows a specific structure of a row address strobe signal generating circuit shown in FIG. 109.

Figure 111:
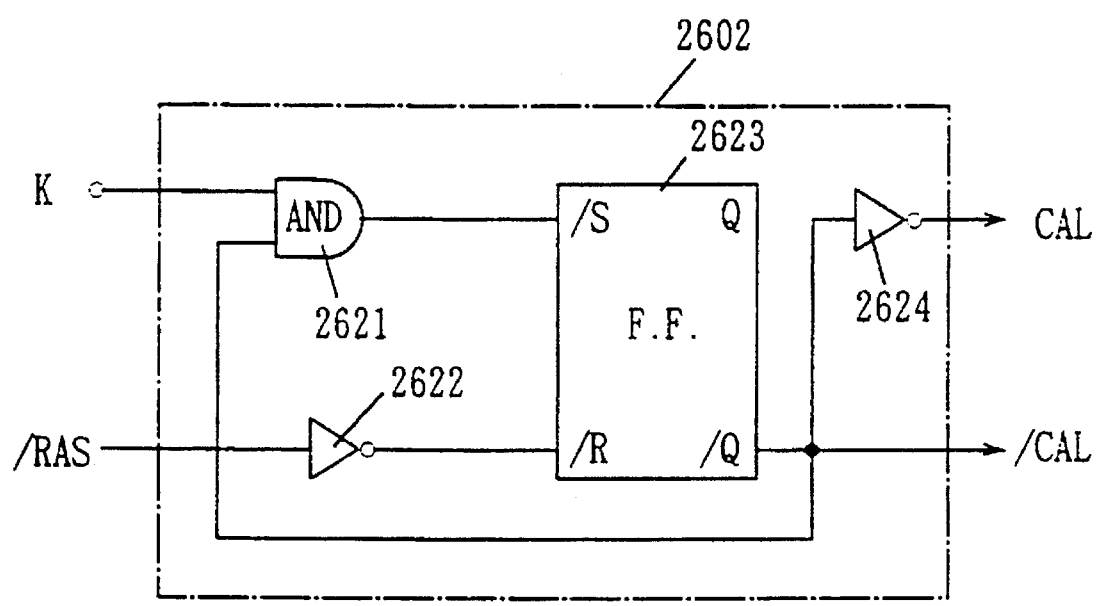

FIG. 111 shows a specific structure of a column address strobe signal generating circuit shown in FIG. 109.

Figure 112:
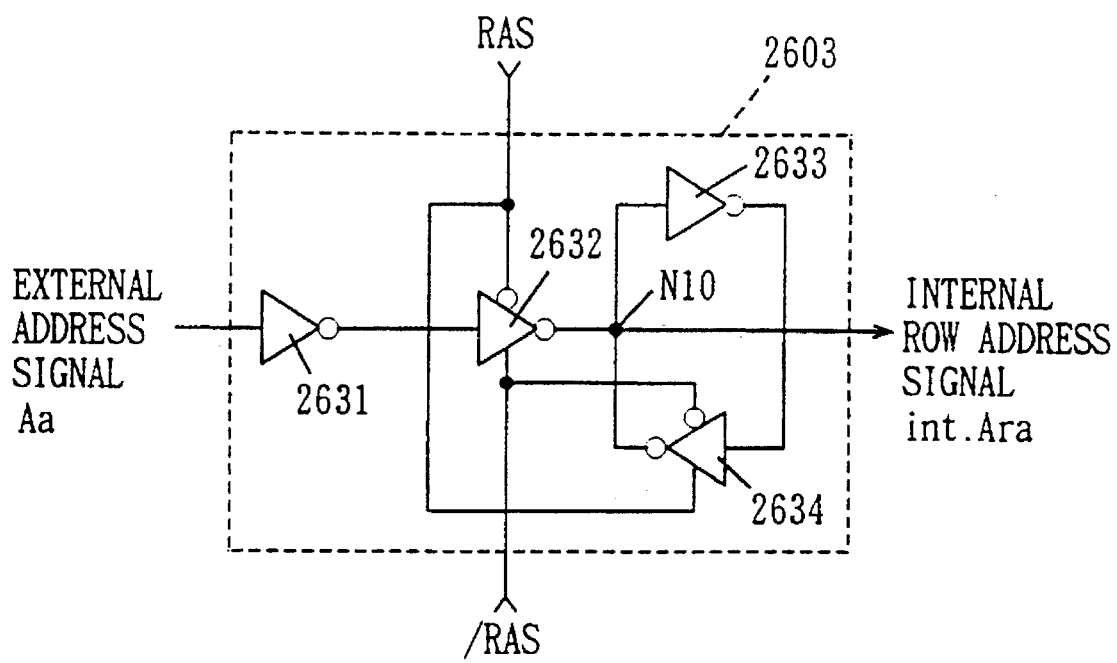

FIG. 112 shows a specific structure of a row address latch shown in FIG. 109.

Figure 113:
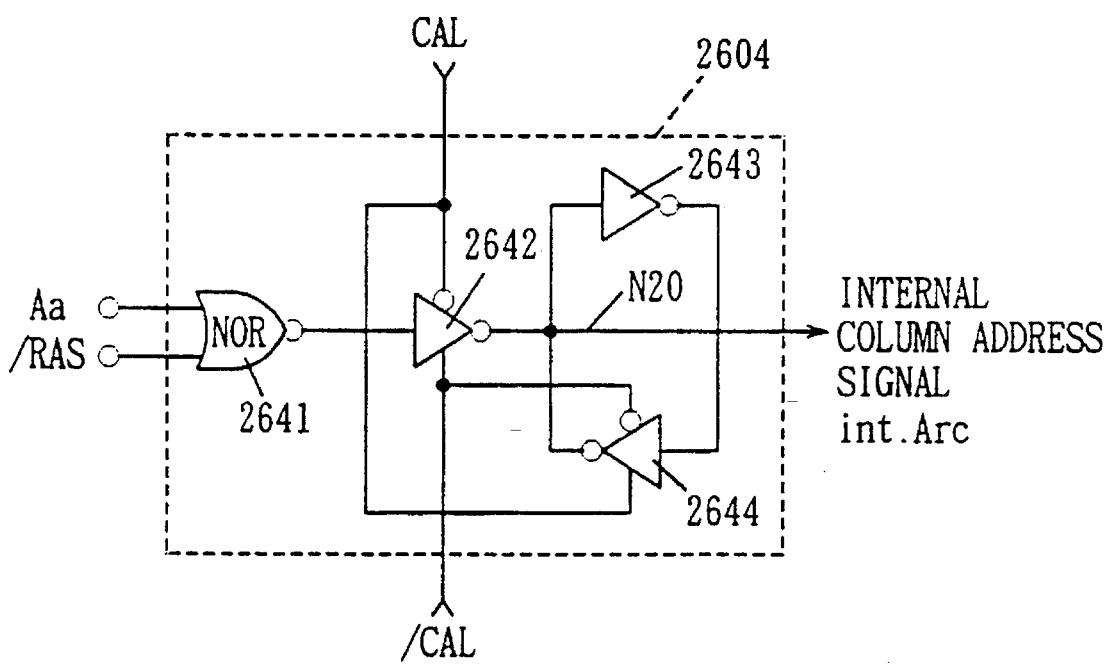

FIG. 113 shows a specific structure of a column address latch shown in FIG. 109.

Figure 114:
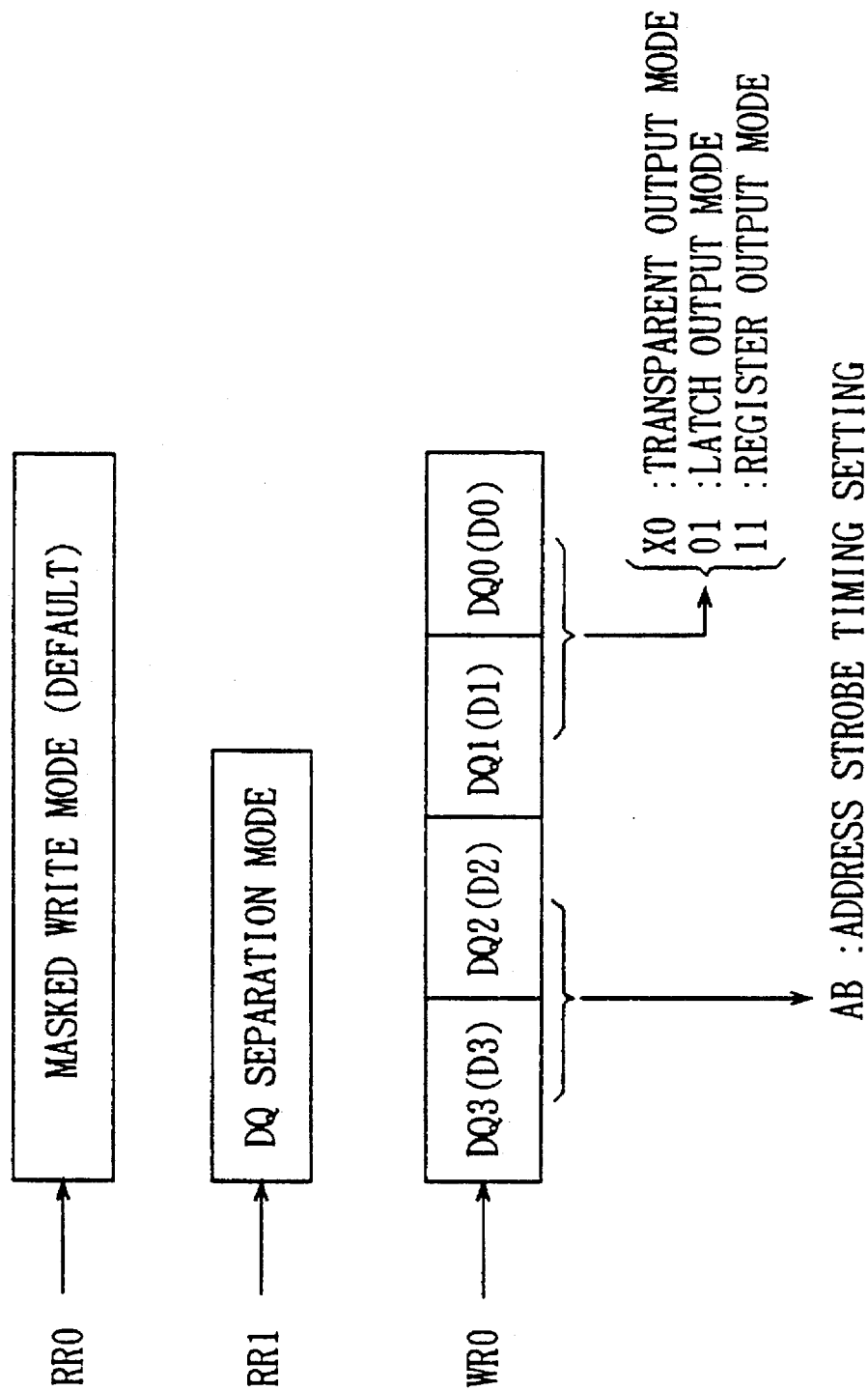

FIG. 114 shows a structure for setting timings for taking addresses of the circuit shown in FIG. 109.

Figure 115:
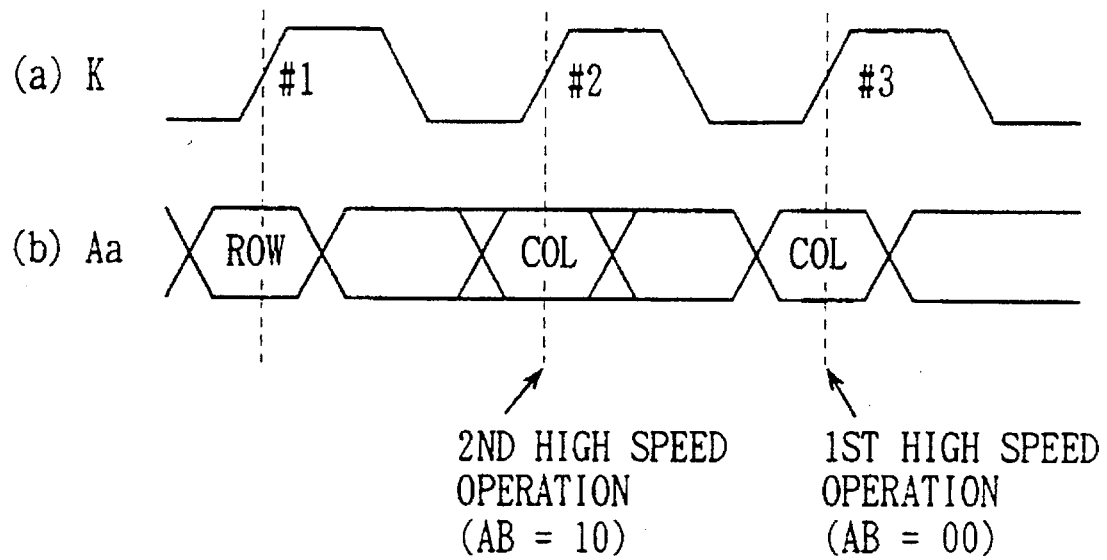

FIG. 115 illustrates high speed operation of the address generating circuit shown in FIG. 109.

Figure 116:
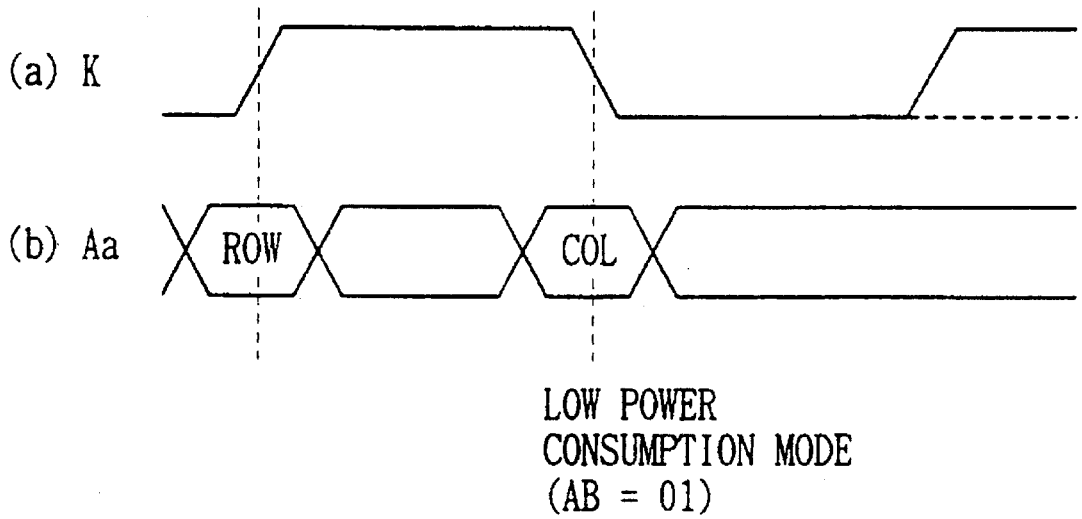

FIG. 116 illustrates an operation at a low power consumption mode of the address generating circuit shown in FIG. 109.

Figure 117:
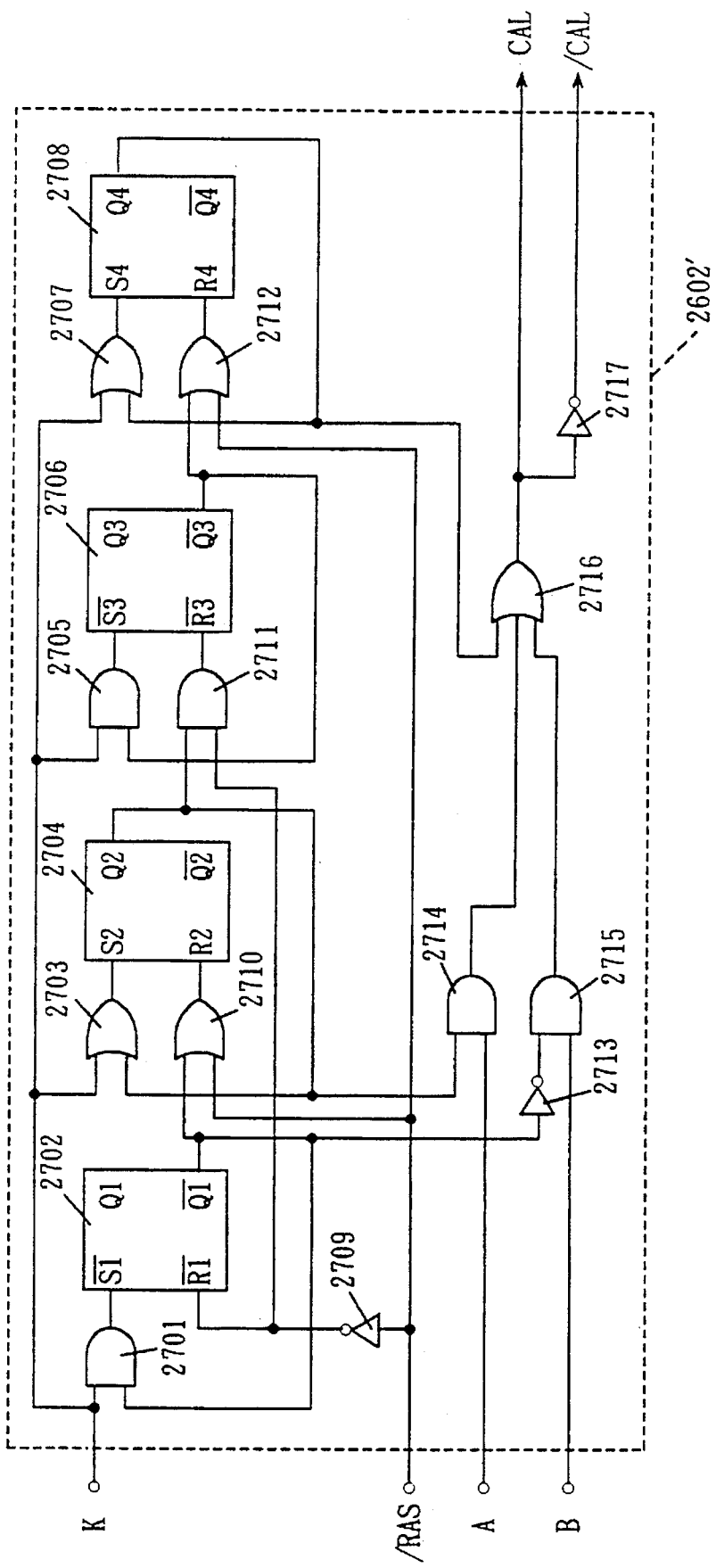

FIG. 117 shows another structure of the column address strobe signal generating circuit shown in FIG. 109.

Figure 118:
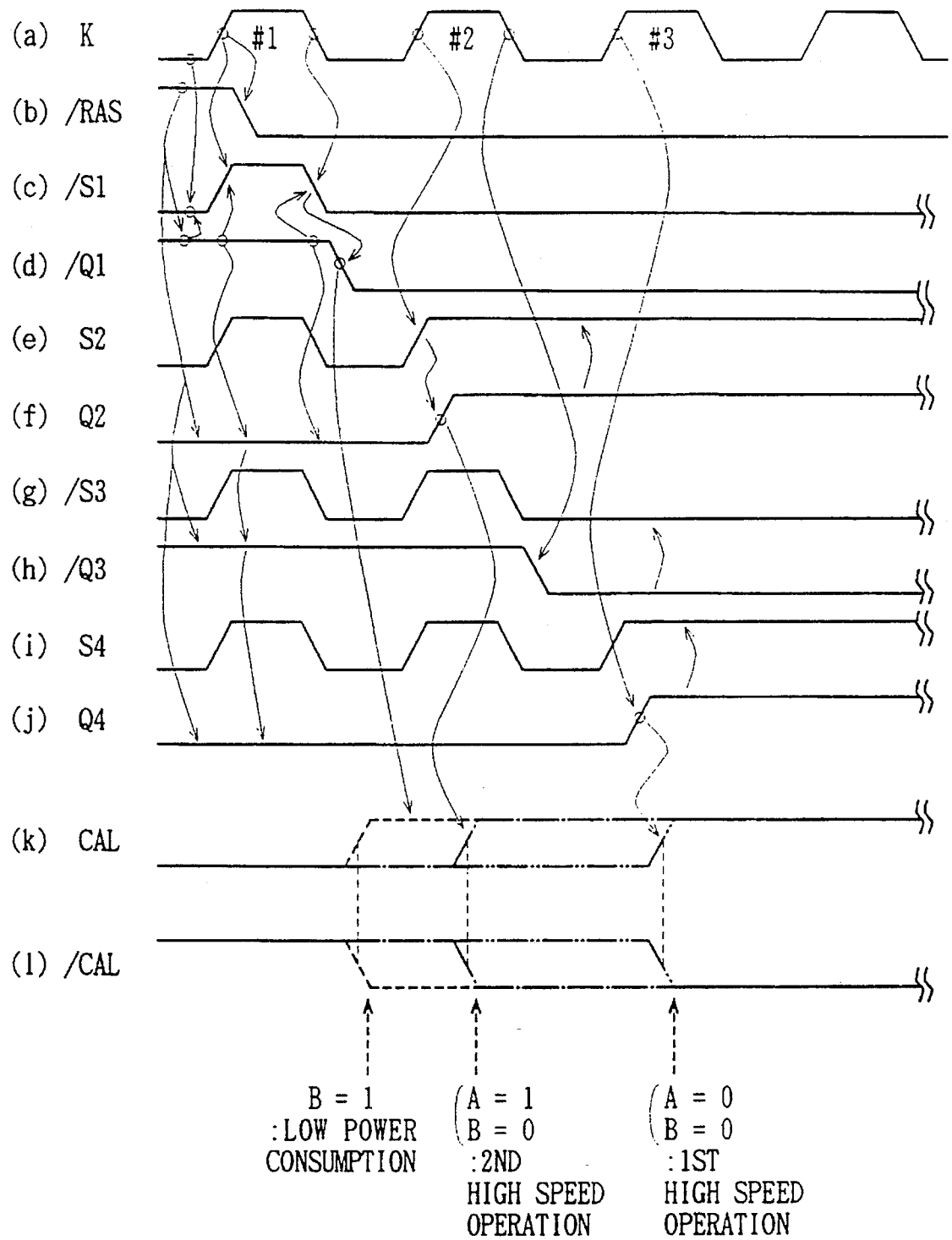

FIG. 118 is a diagram of signal waveforms showing the operation of the circuit shown in FIG. 117.

FIG. 119 is a table showing operations realized by the semiconductor memory device shown in FIG. 105 and combinations of control signal states for realizing these operations.

Figure 120:
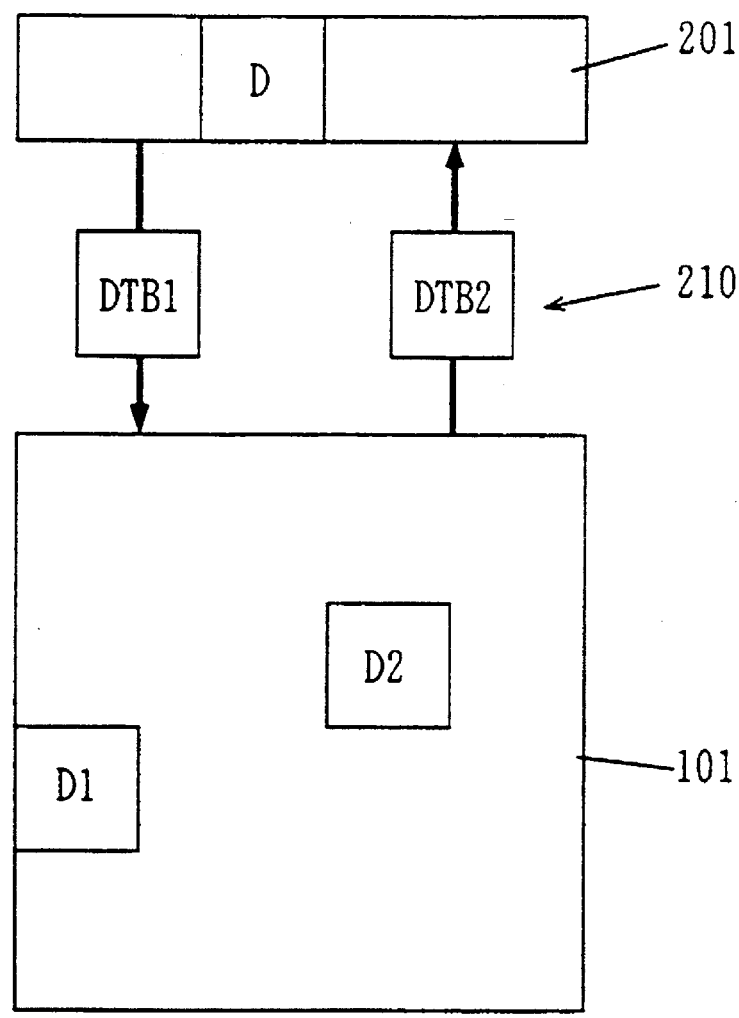

FIG. 120 shows manner of data transfer between the SRAM array and the DRAM array of the semiconductor memory device shown in FIG. 105.

Figure 121:
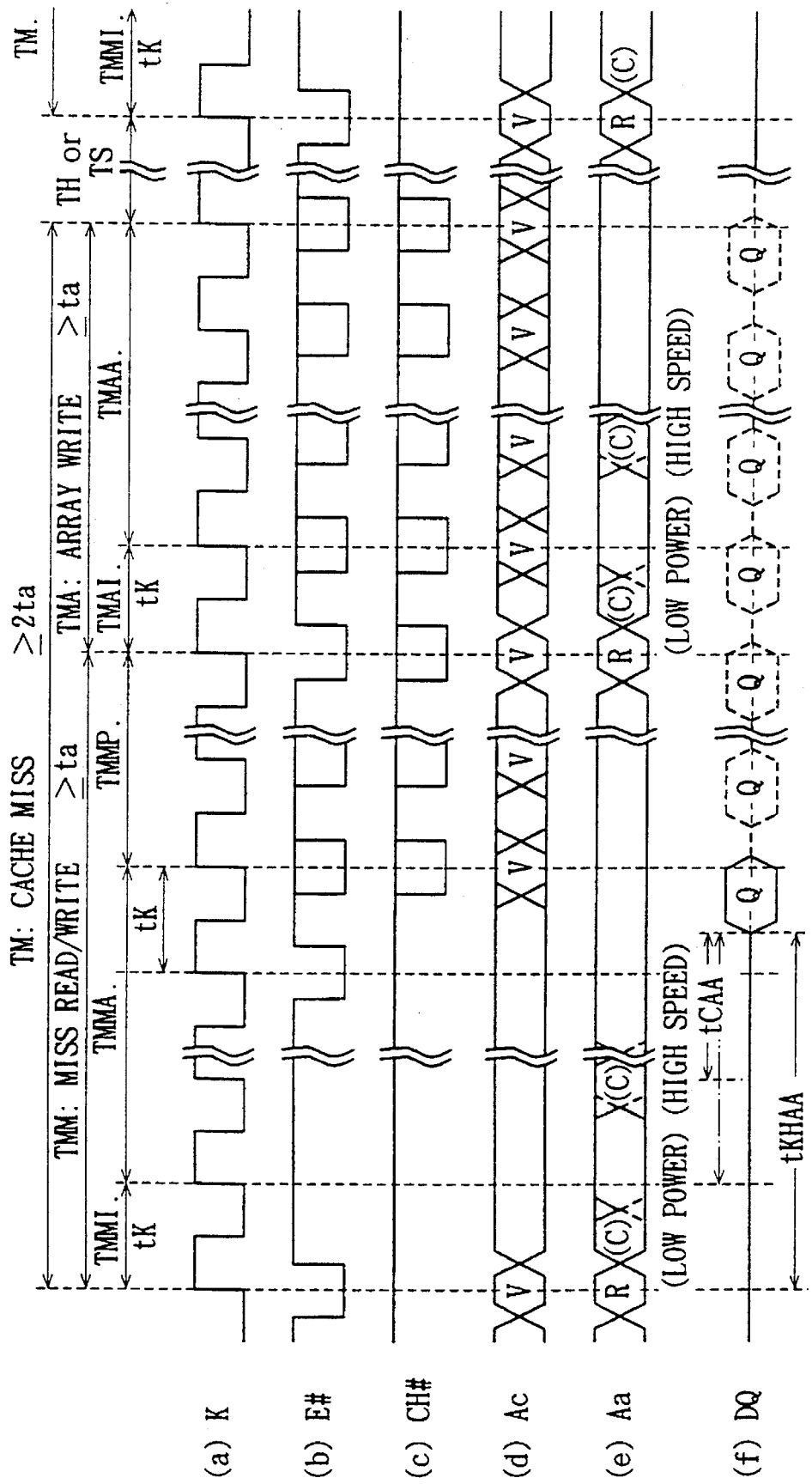

FIG. 121 is a diagram of signal waveforms showing an operation at a cache miss of the semiconductor memory device shown in FIG. 105.

Figure 122:
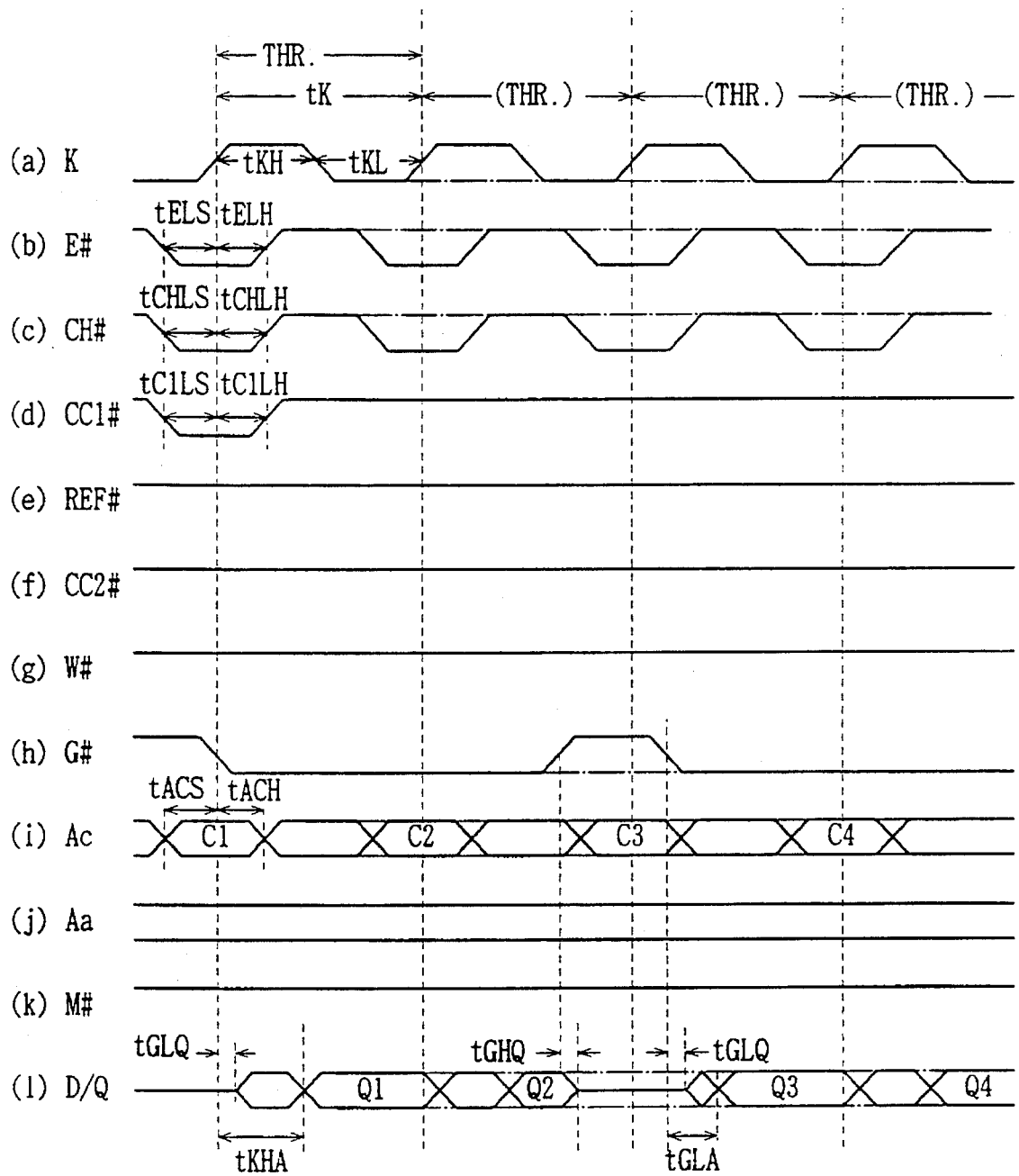

FIG. 122 shows timings at a cache hit reading operation of the semiconductor memory device shown FIG. 105.

Figure 123:
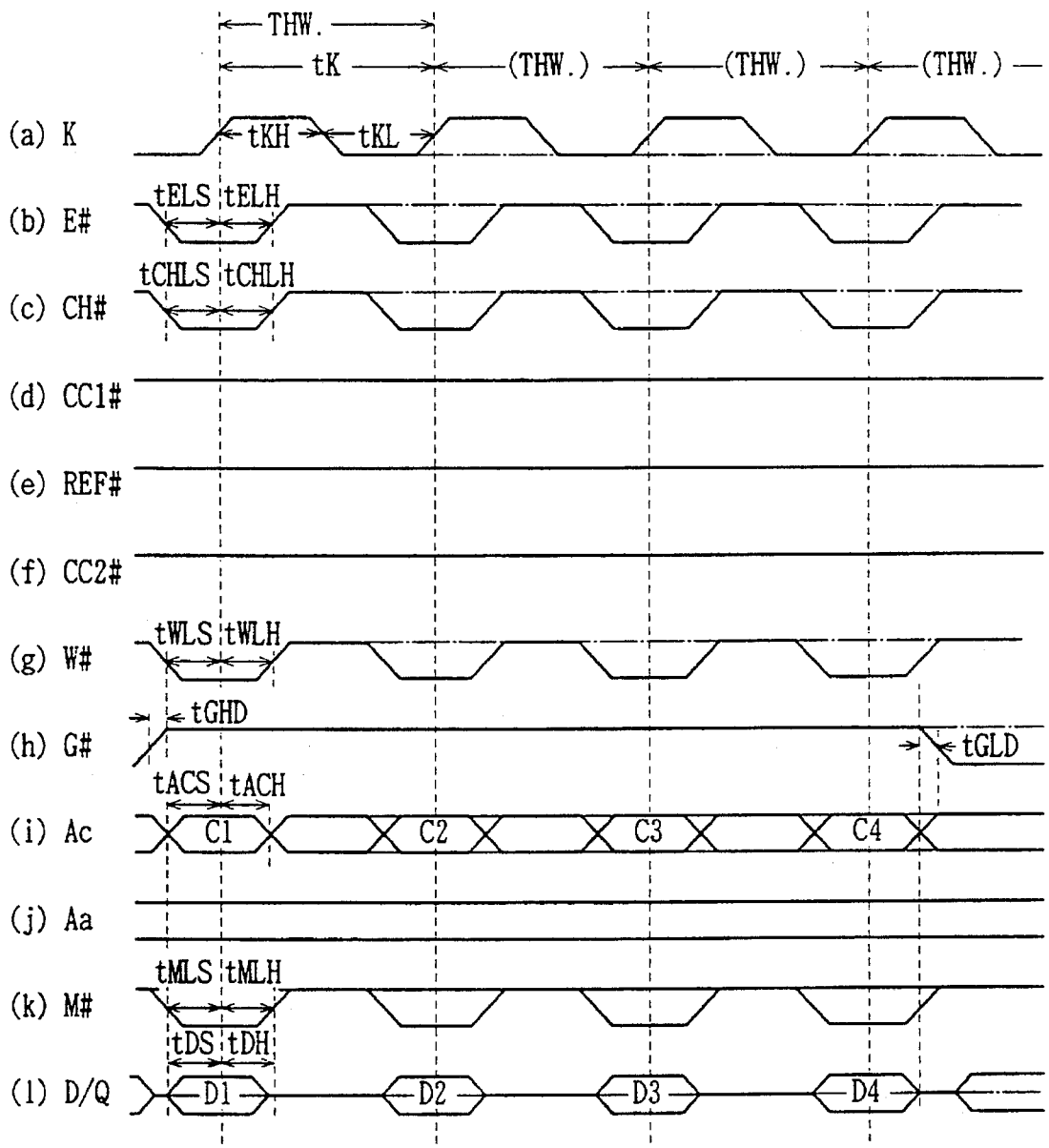

FIG. 123 is a diagram of waveforms showing a cache hit writing operation at a low power consumption mode of the semiconductor memory device shown in FIG. 105.

Figure 124:
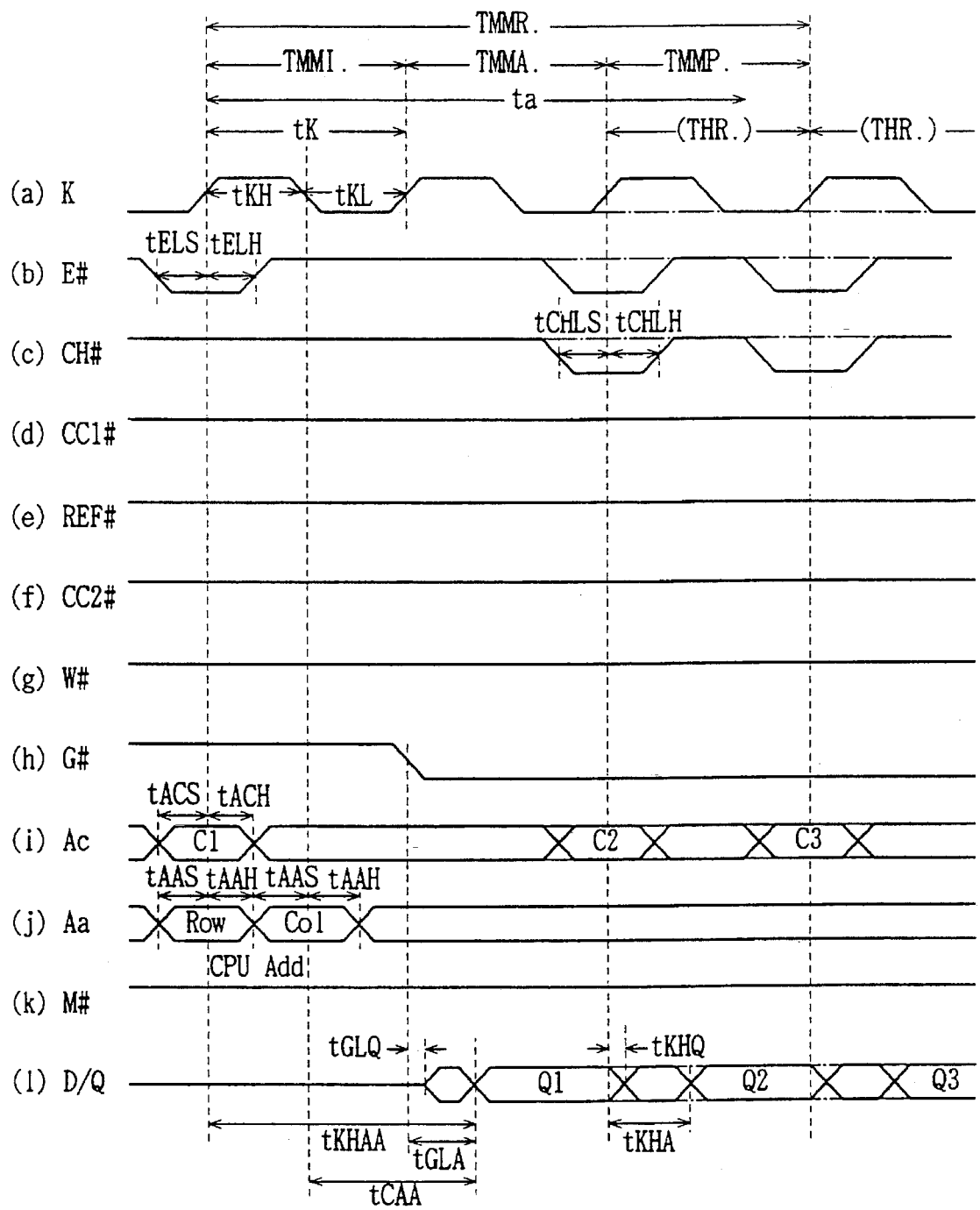

FIG. 124 is a diagram of signal waveforms showing a cache hit reading operation at a low power consumption mode of the semiconductor memory device shown in FIG. 105.

Figure 125:
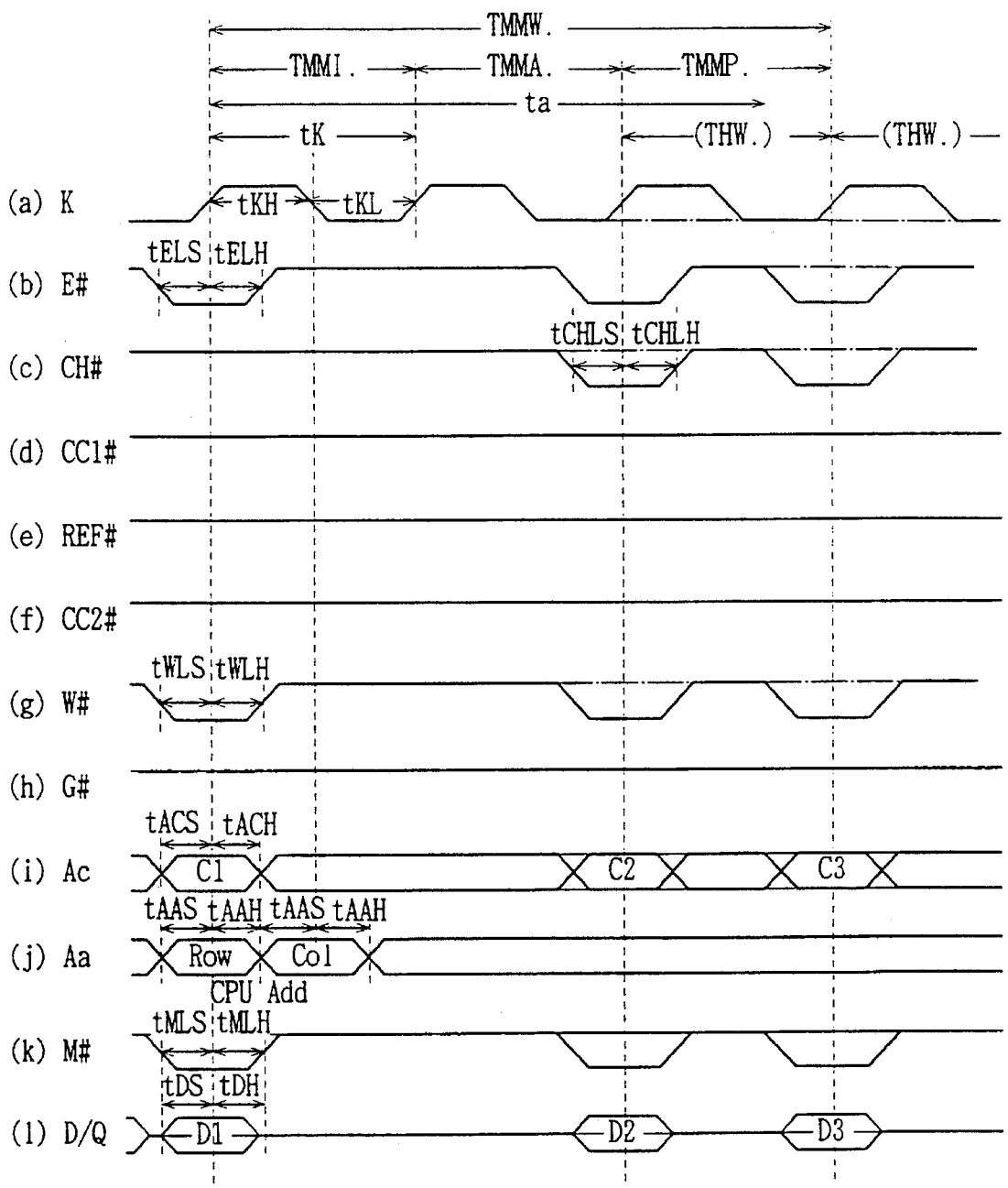

FIG. 125 is a diagram of signal waveforms showing a cache miss writing operation at a low power consumption mode of the semiconductor memory device shown in FIG. 105.

Figure 126:
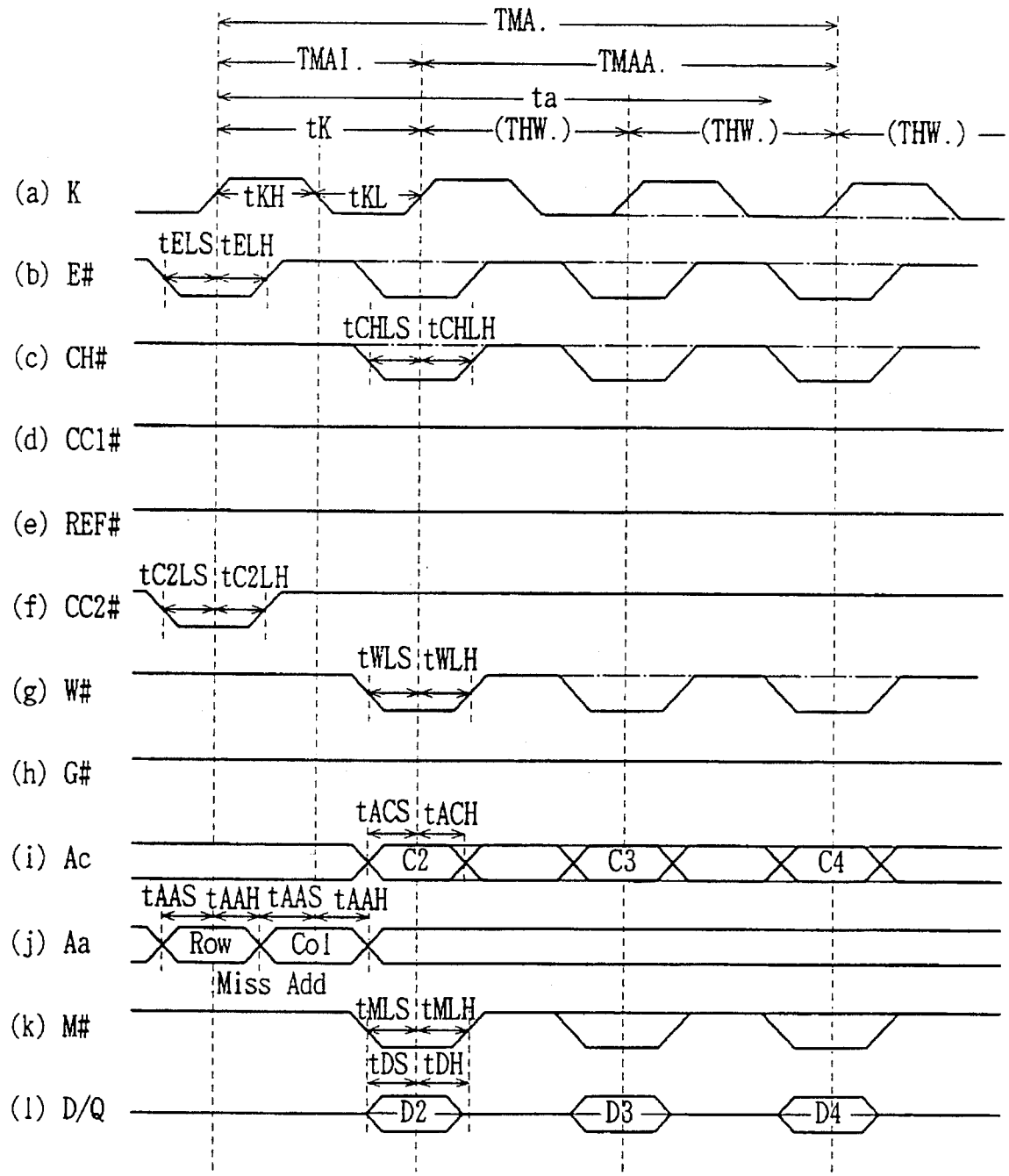

FIG. 126 is a diagram of signal waveforms showing a array writing operation at a low power consumption mode of the semiconductor memory device shown in FIG. 105.

Figure 127:
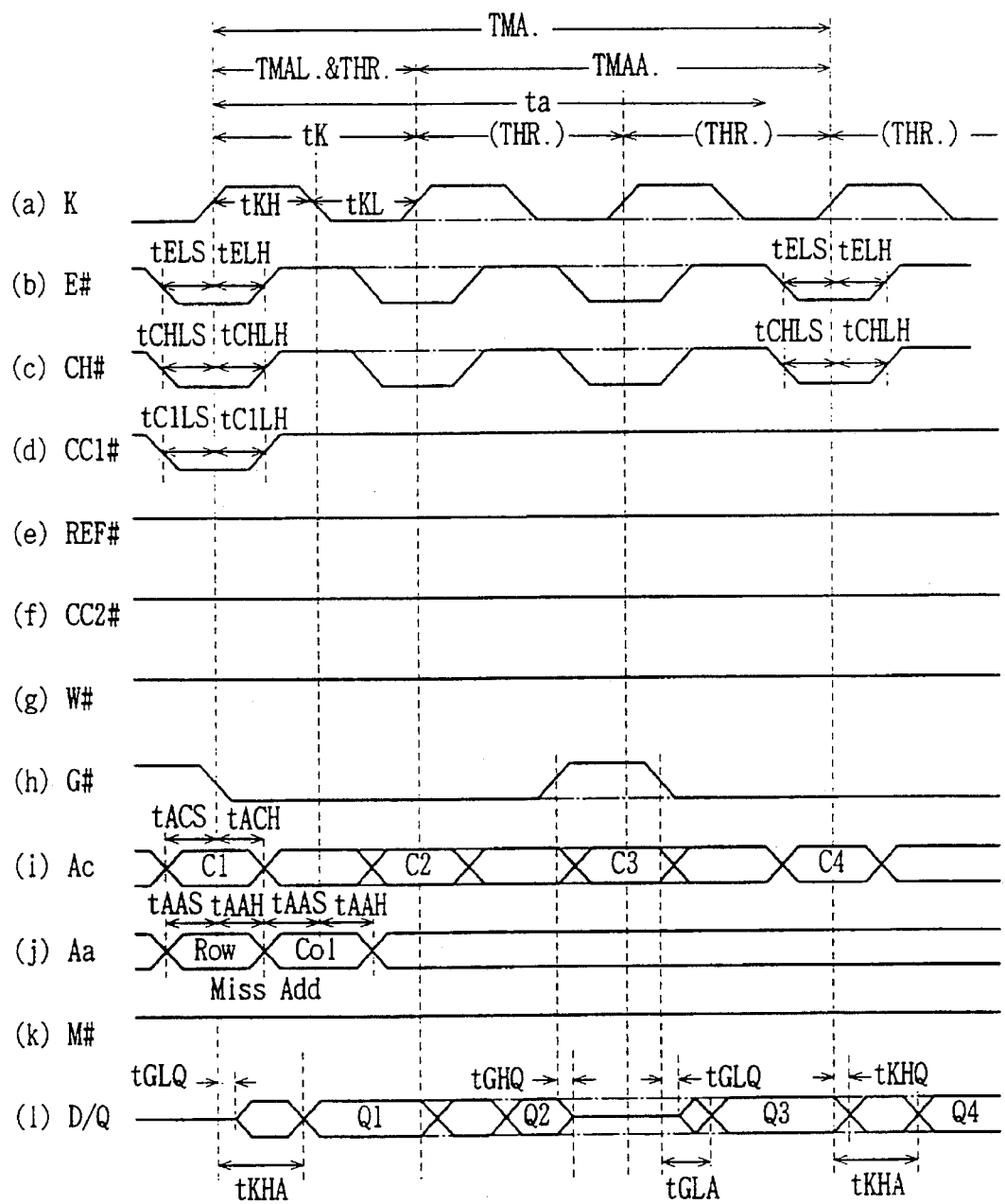

FIG. 127 is a diagram of signal waveforms showing an array writing operation accompanied with cache hit reading at a low power consumption mode of the semiconductor memory device shown in FIG. 105.

Figure 128:
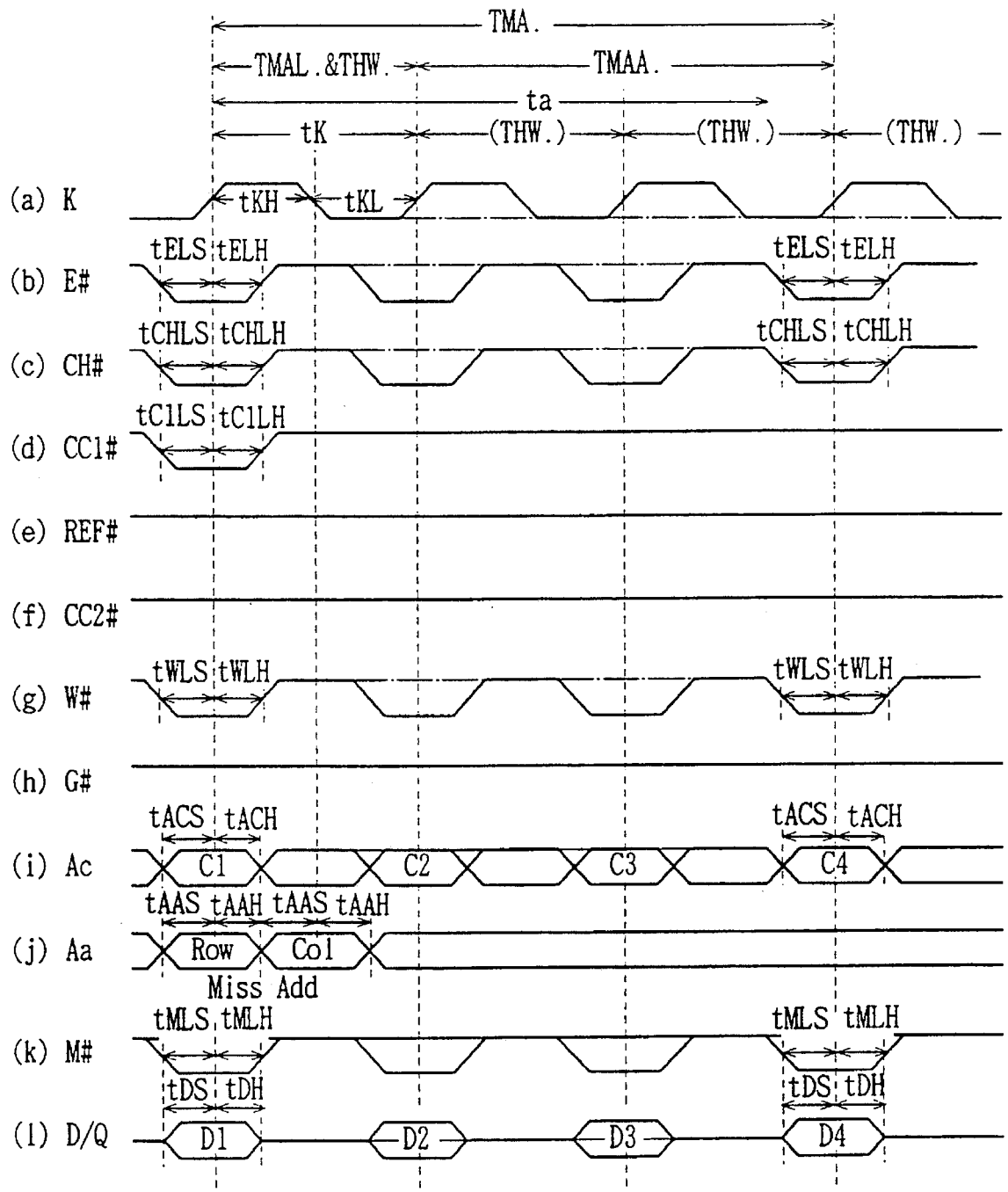

FIG. 128 is a diagram of signal waveforms showing an array writing operation accompanied with cache hit writing at a low power consumption mode of the semiconductor memory device shown in FIG. 105.

Figure 129:
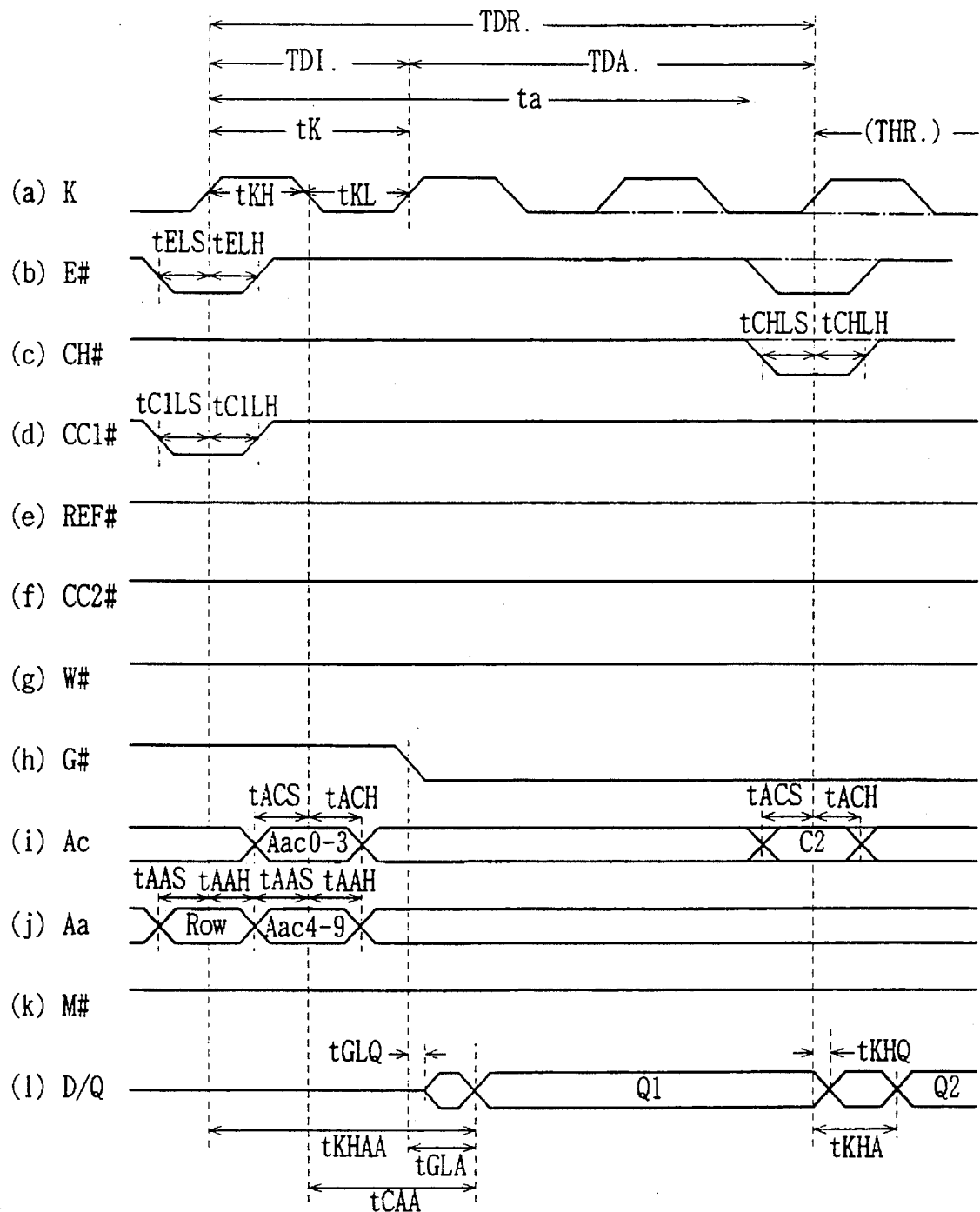

FIG. 129 is a diagram of signal waveforms showing a direct array reading operation at a low power consumption mode of the semiconductor memory device shown in FIG. 105.

Figure 130:
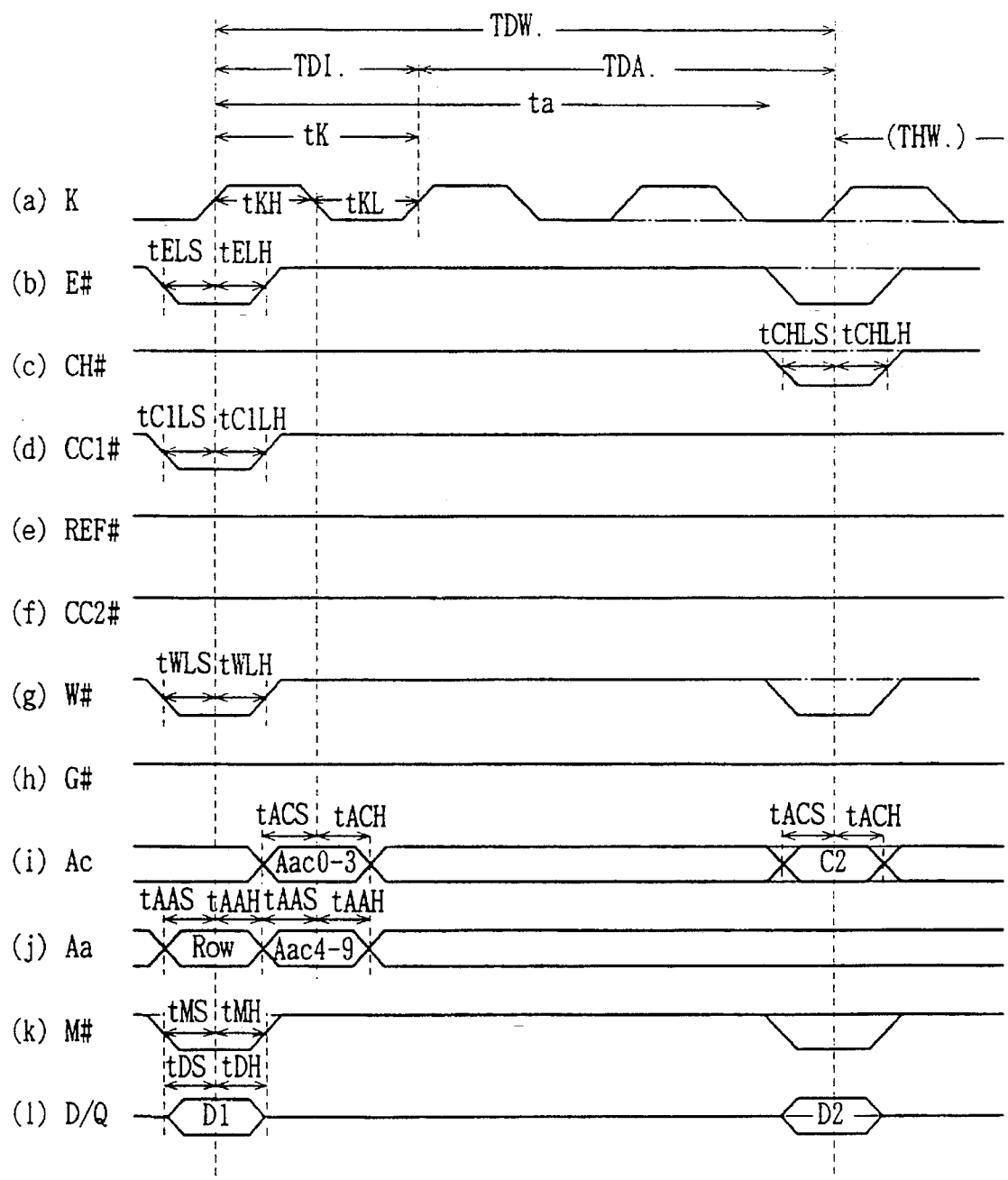

FIG. 130 is a diagram of signal waveforms showing a direct array writing operation at a low power consumption mode of the semiconductor memory device shown in FIG. 105.

Figure 131:
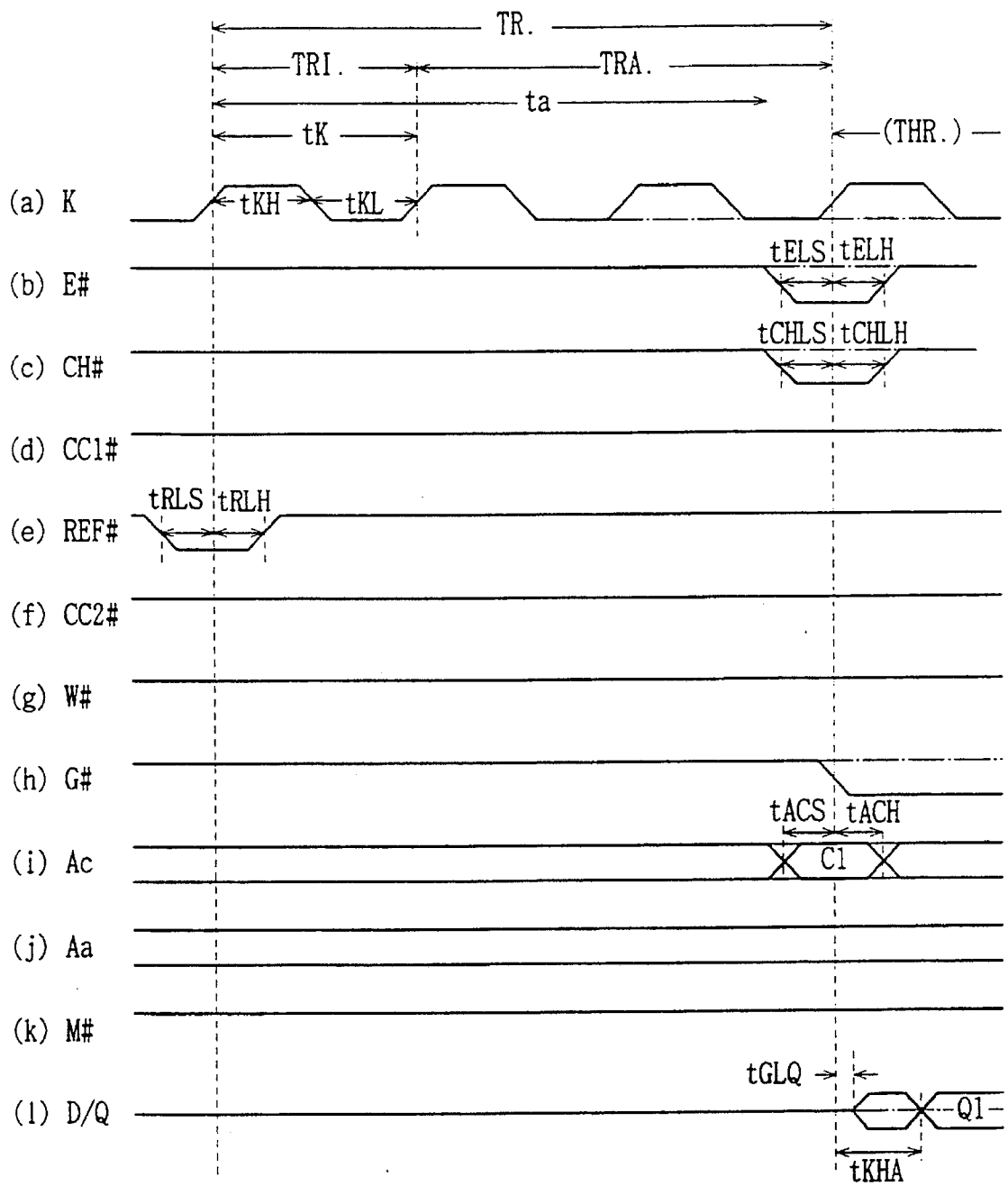

FIG. 131 is a diagram of signal waveforms showing a refresh array operation at a low power consumption mode of the semiconductor memory device shown in FIG. 105.

Figure 132:
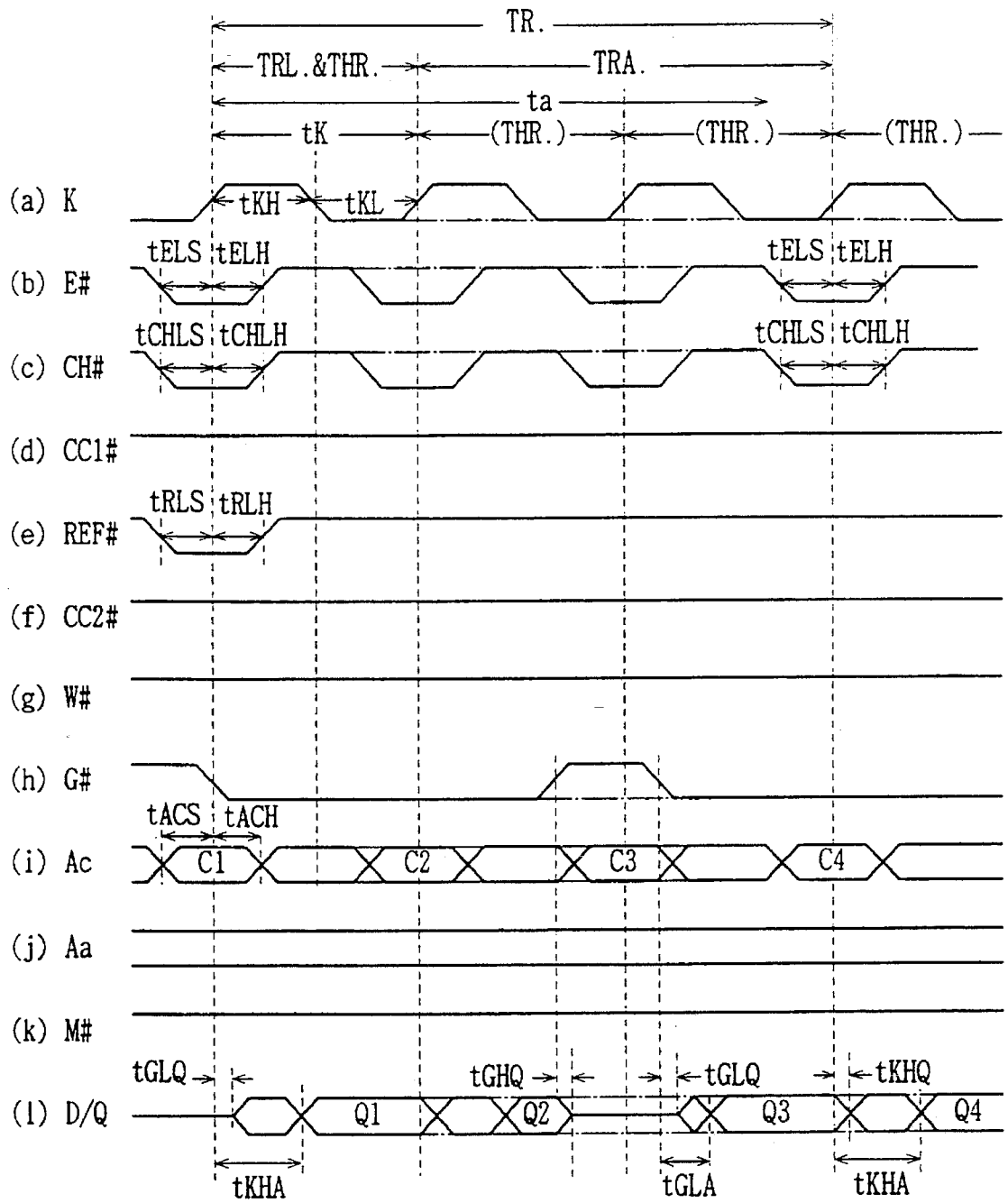

FIG. 132 is a diagram of signal waveforms showing a refresh array operation accompanied with cache hit reading at a low power consumption mode of the semiconductor memory device shown in FIG. 105.

Figure 133:
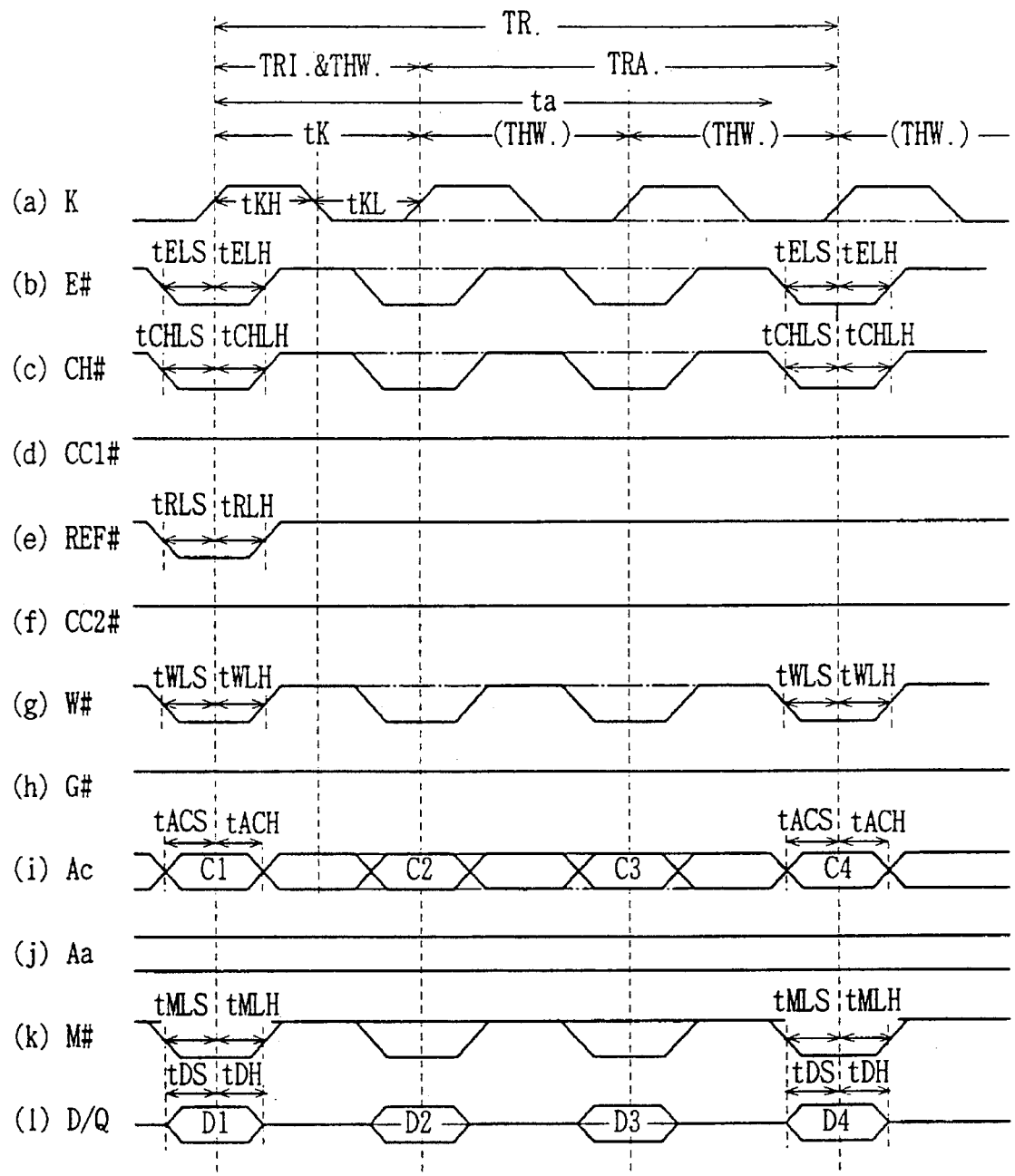

FIG. 133 is a diagram of signal waveforms showing a refresh array operation accompanied with cache hit writing at a low power consumption mode of the semiconductor memory device shown in FIG. 105.

Figure 134:
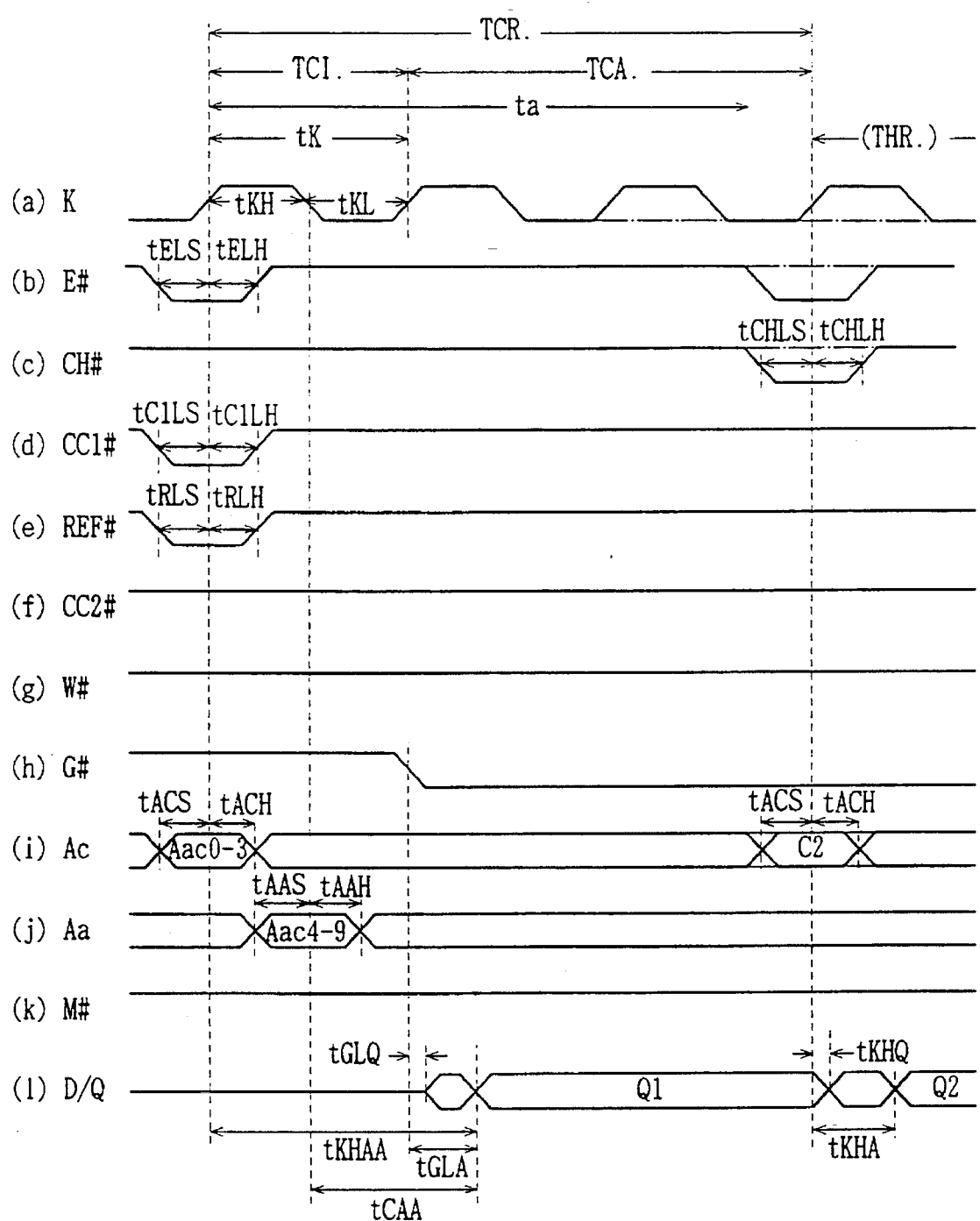

FIG. 134 is a diagram of signal waveforms showing a counter check reading operation at a low power consumption mode of the semiconductor memory device shown in FIG. 105.

Figure 135:
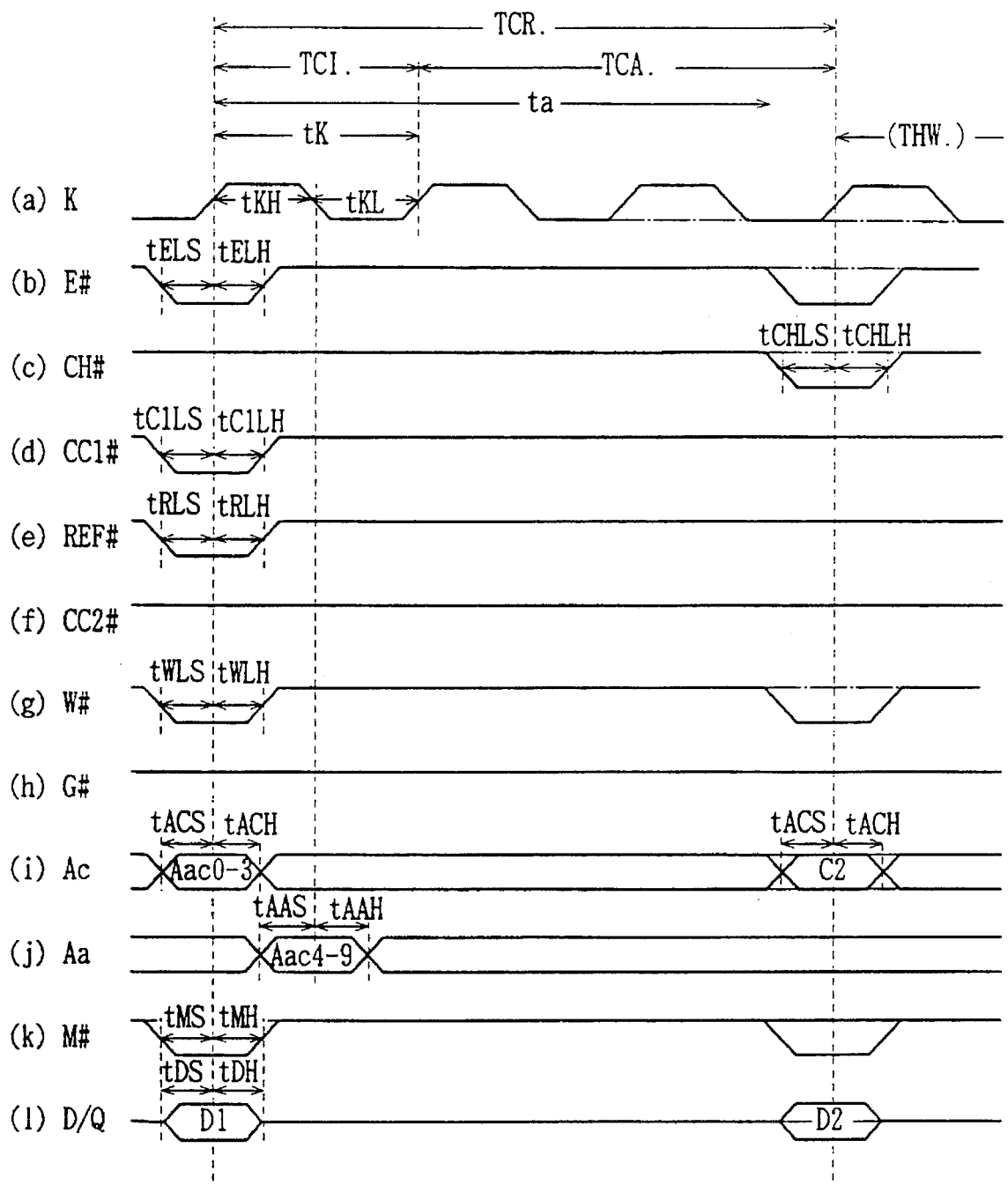

FIG. 135 is a diagram of signal waveforms showing a counter check writing operation at the low power consumption mode of the semiconductor memory device shown in FIG. 105.

Figure 136:
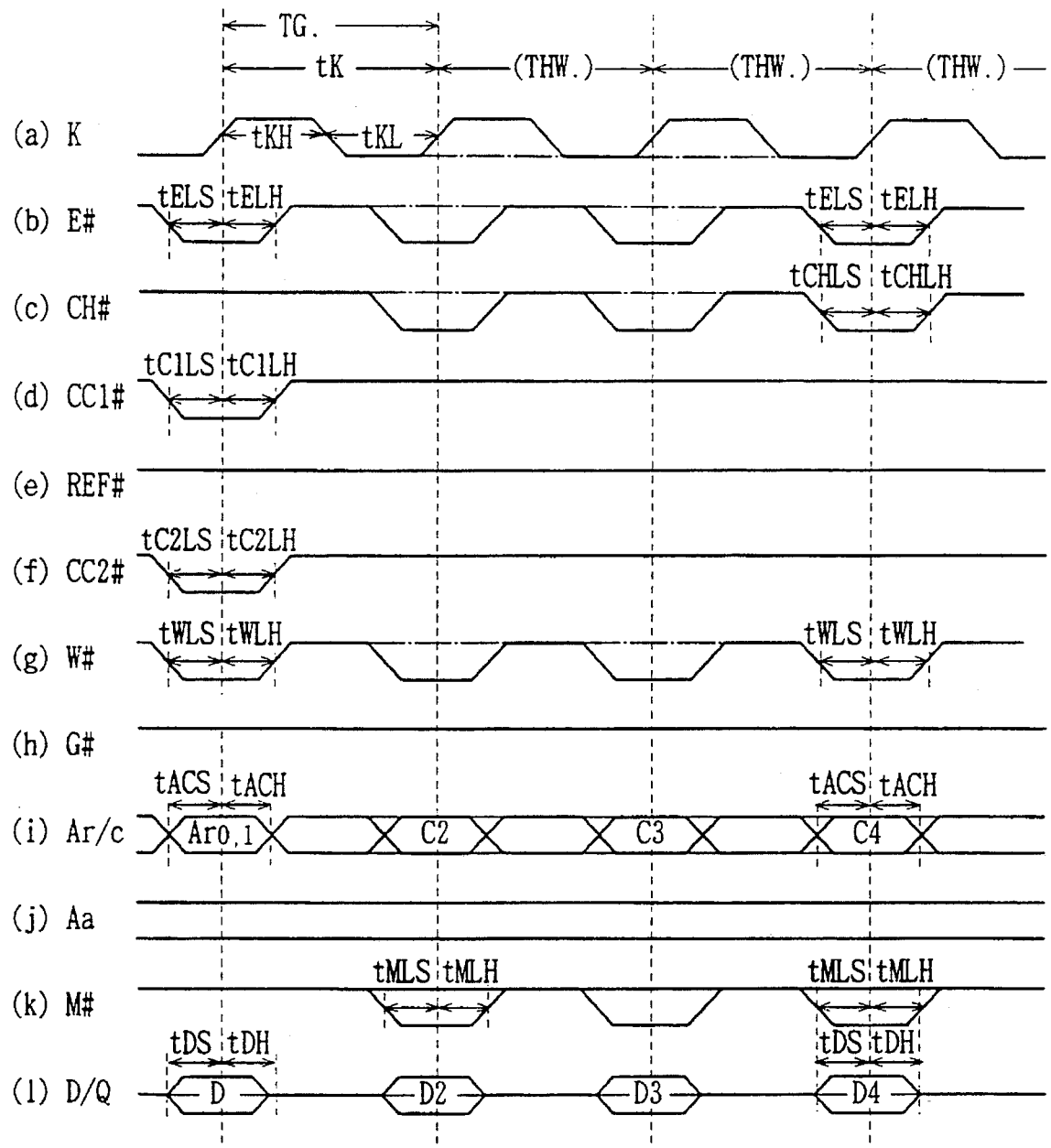

FIG. 136 is a diagram of signal waveforms showing a command register setting operation at the low power consumption mode of the semiconductor memory device shown in FIG. 105.

Figure 137:
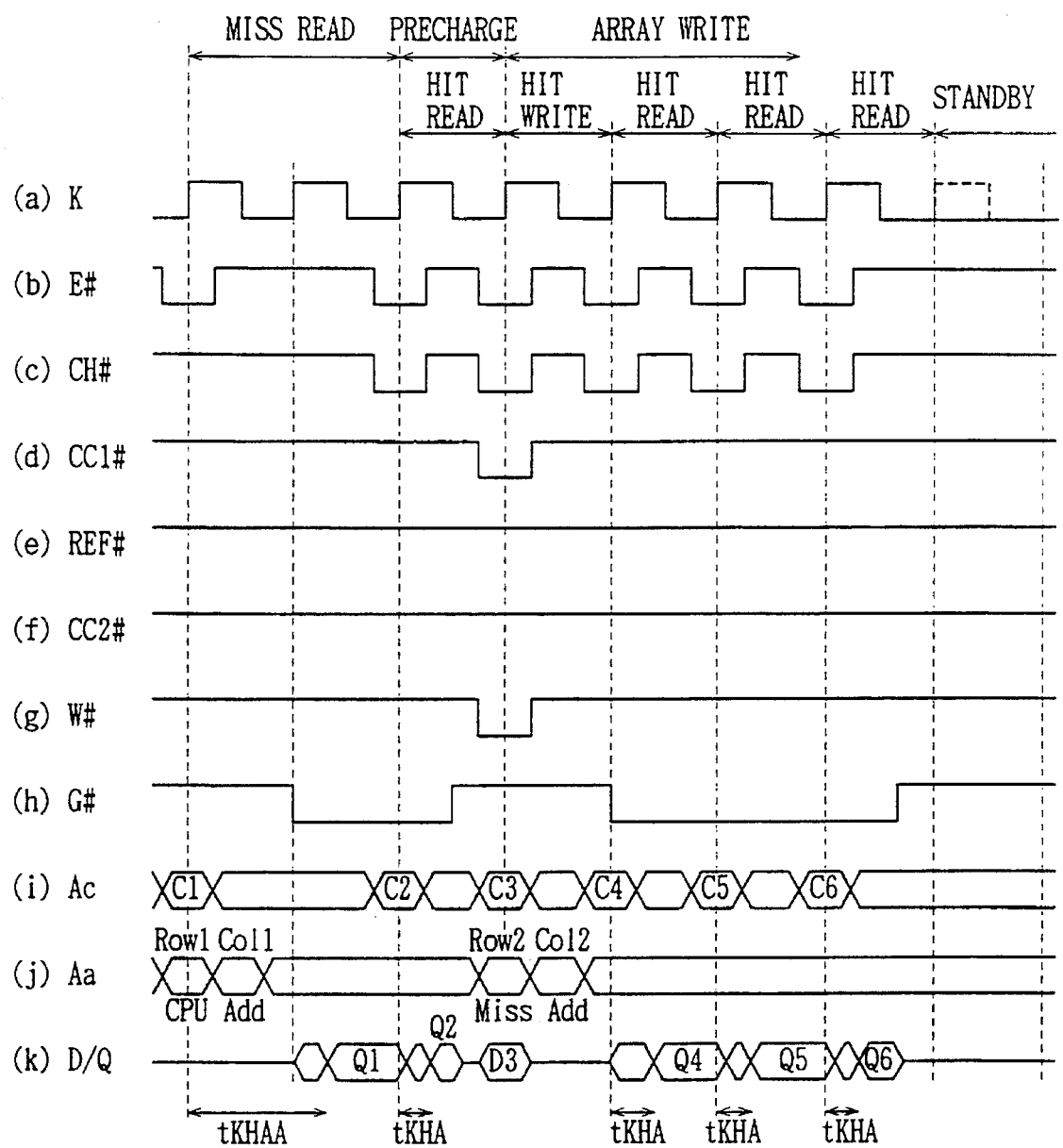

FIG. 137 shows an example of a specific operation sequence at the low power consumption mode of the semiconductor memory device shown in FIG. 105.

FIG. 138 shows another example of the specific operation sequence at the low power consumption mode of the semiconductor memory device shown in FIG. 105.

Figure 139:
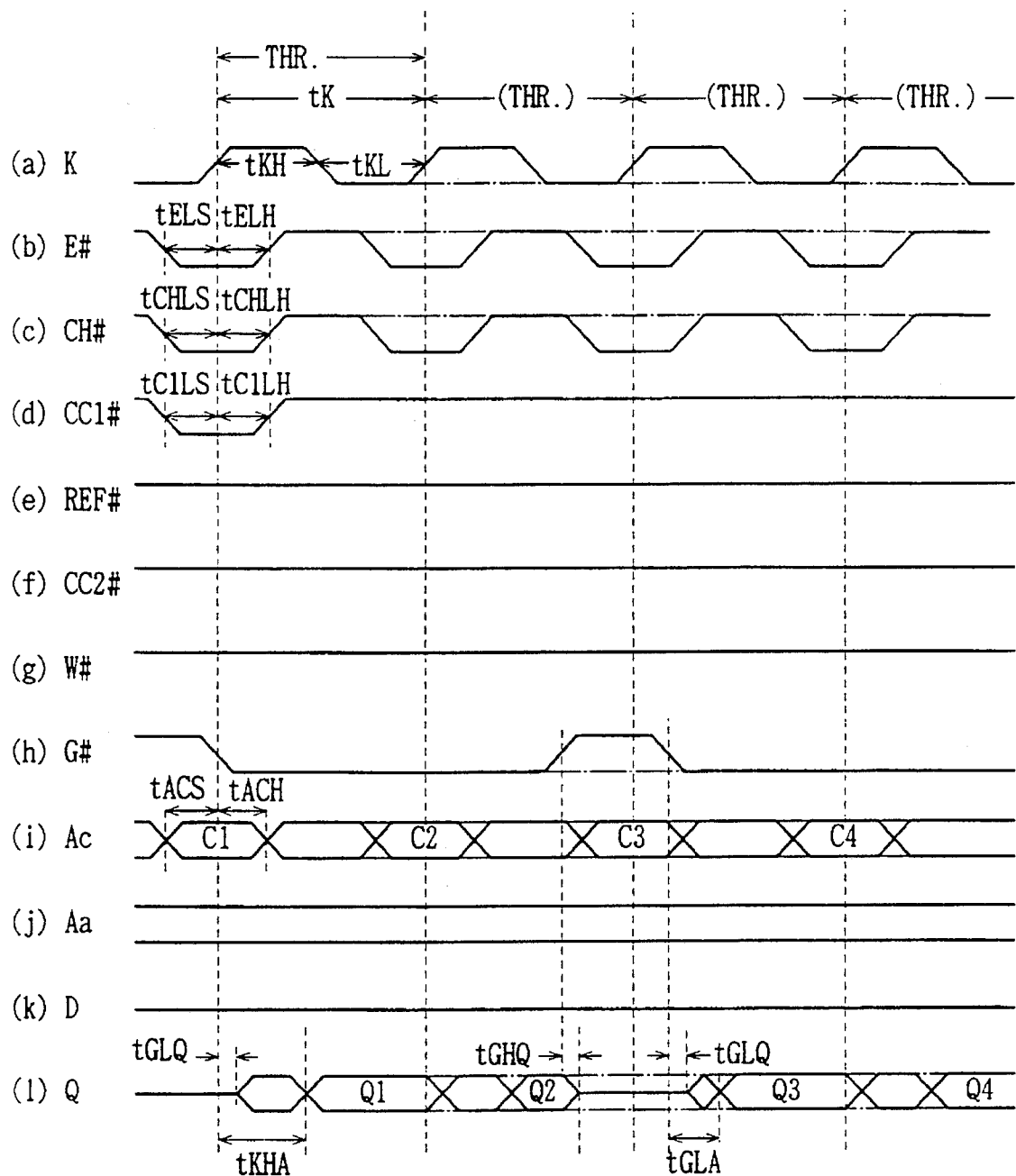

FIG. 139 is a diagram of signal waveforms showing a cache hit reading operation in the transparent output mode in high speed operation mode realized by the semiconductor memory device shown in FIG. 105.

Figure 140:
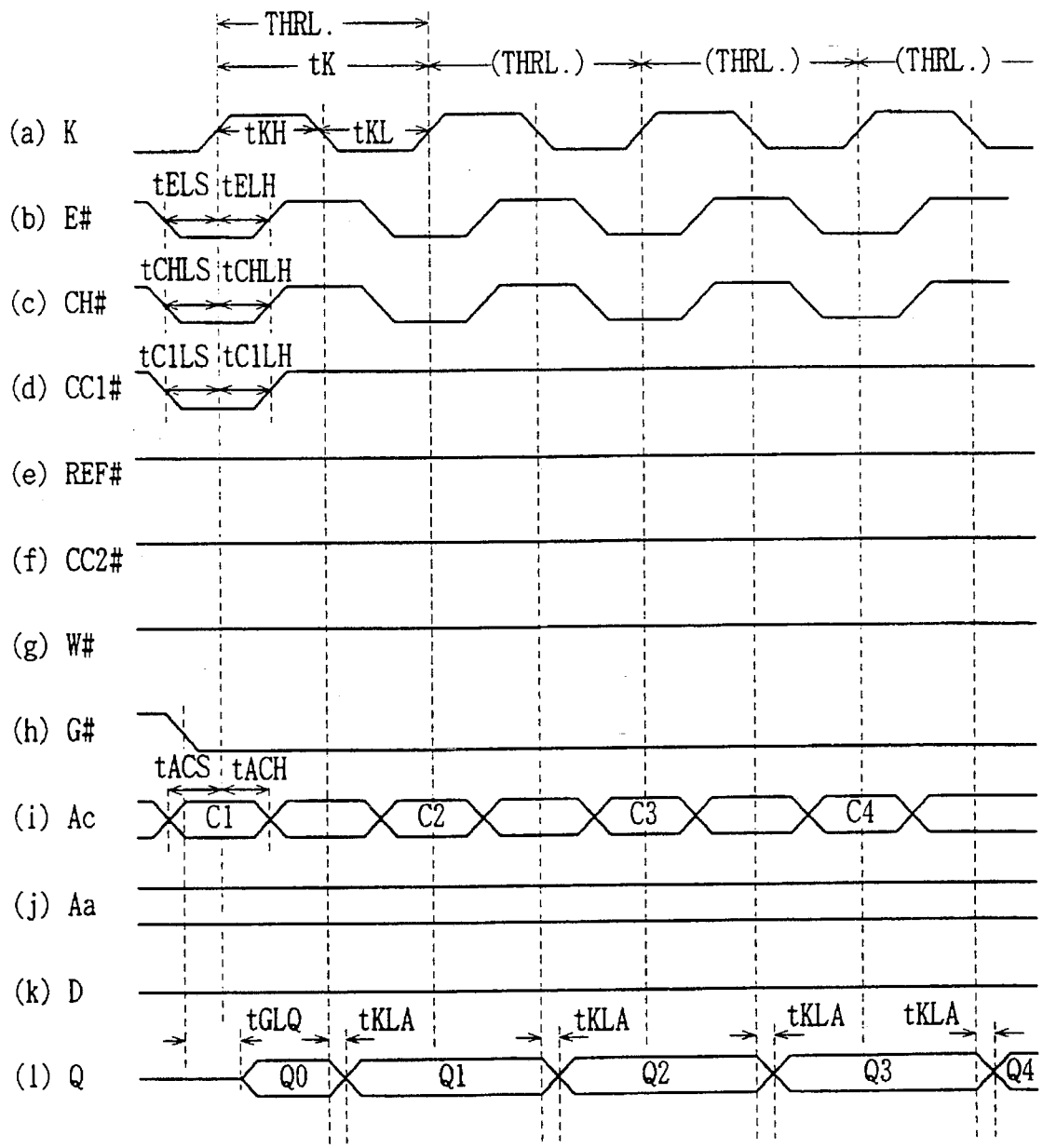

FIG. 140 is a diagram of signal waveforms showing the cache hit reading operation in the latched output mode of the high speed operation mode realized by the semiconductor memory device shown in FIG. 105.

Figure 141:
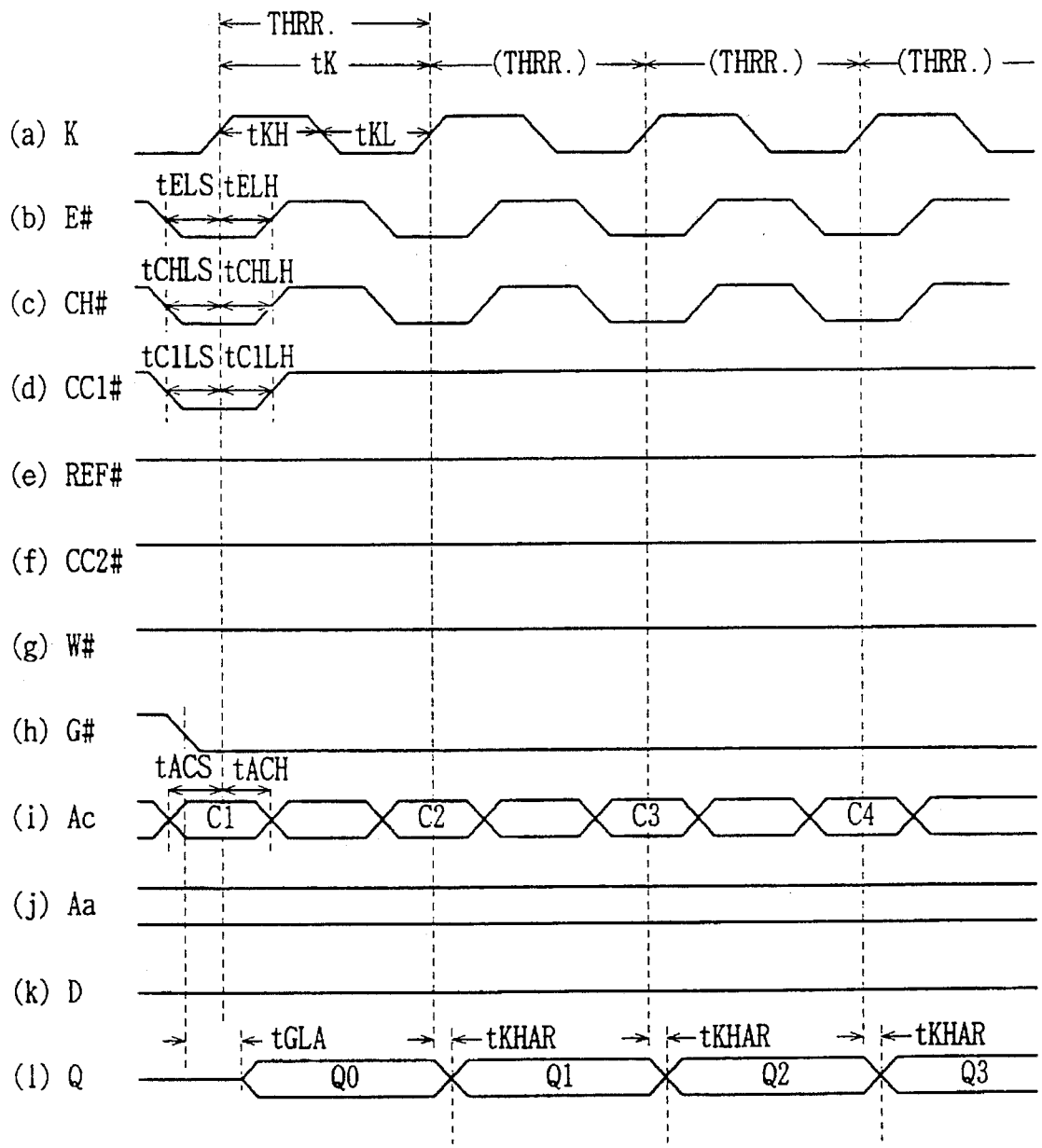

FIG. 141 is a diagram of signal waveforms showing a cache hit reading operation in the registered output mode in the high speed operation mode realized by the semiconductor memory device shown in FIG. 105.

Figure 142:
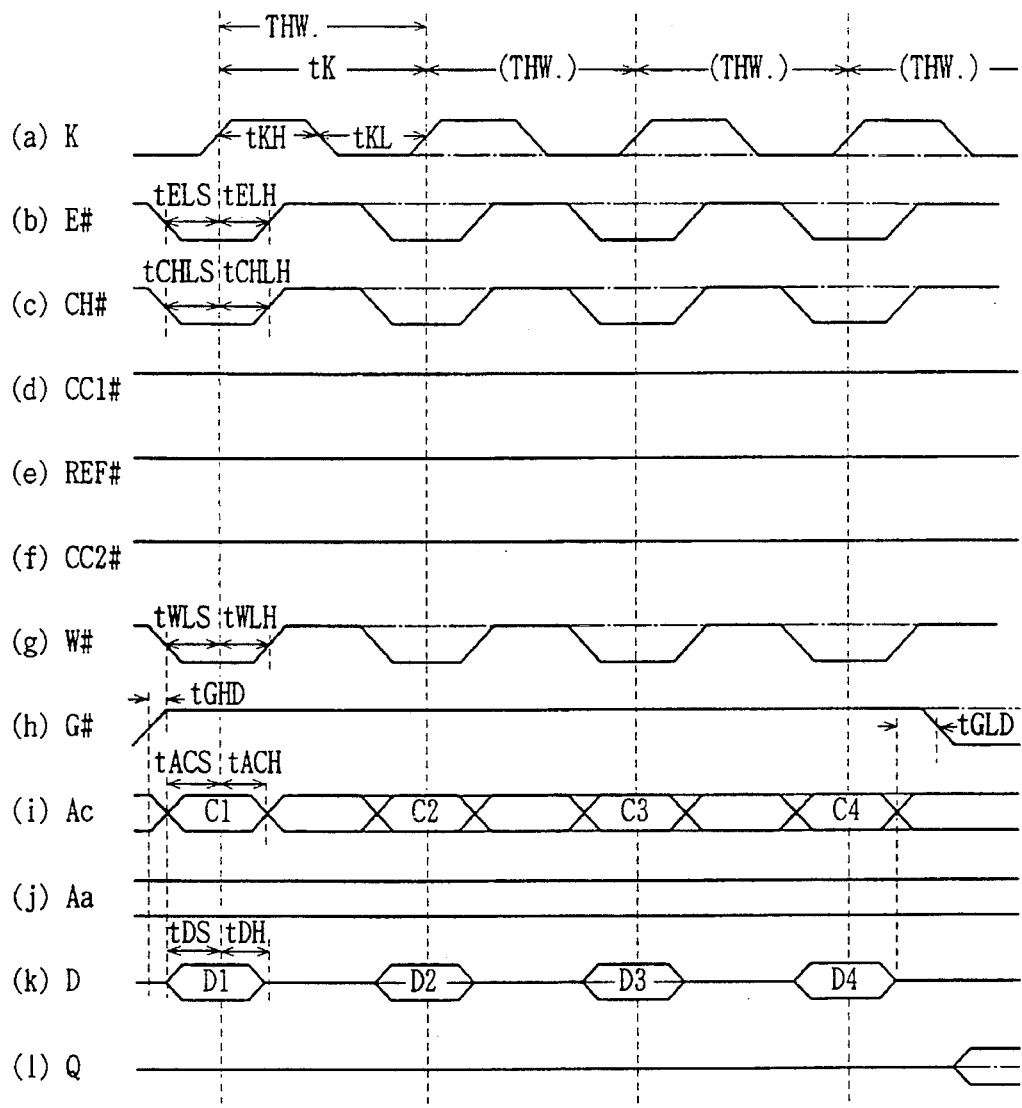

FIG. 142 is a diagram of signal waveforms showing the cache hit writing operation in the high speed operation mode realized by the semiconductor memory device shown in FIG. 105.

Figure 143:
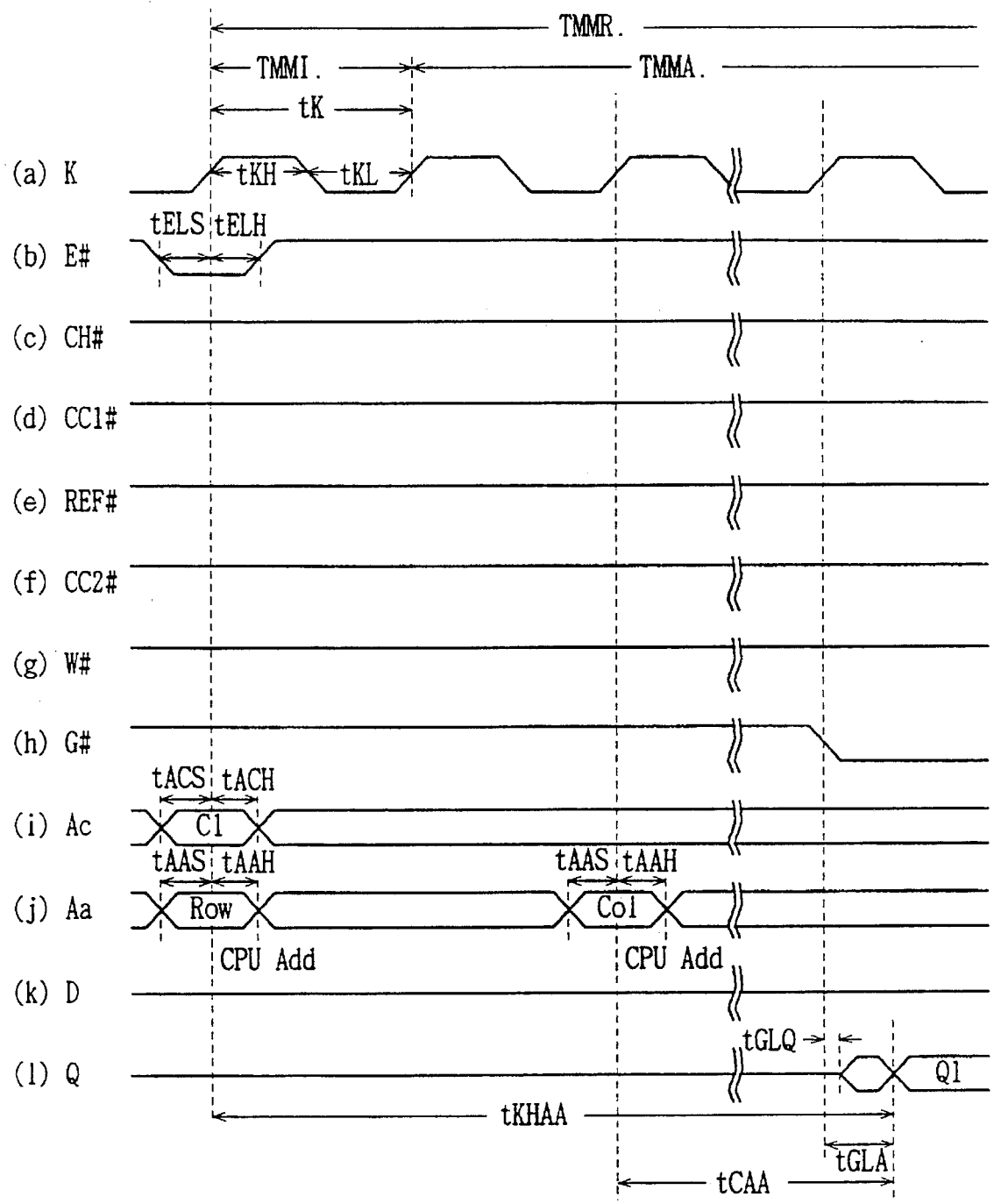

FIG. 143 is a diagram of signal waveforms showing the cache miss reading operation in the high speed operation mode realized by the semiconductor memory device shown in FIG. 105.

Figure 144:
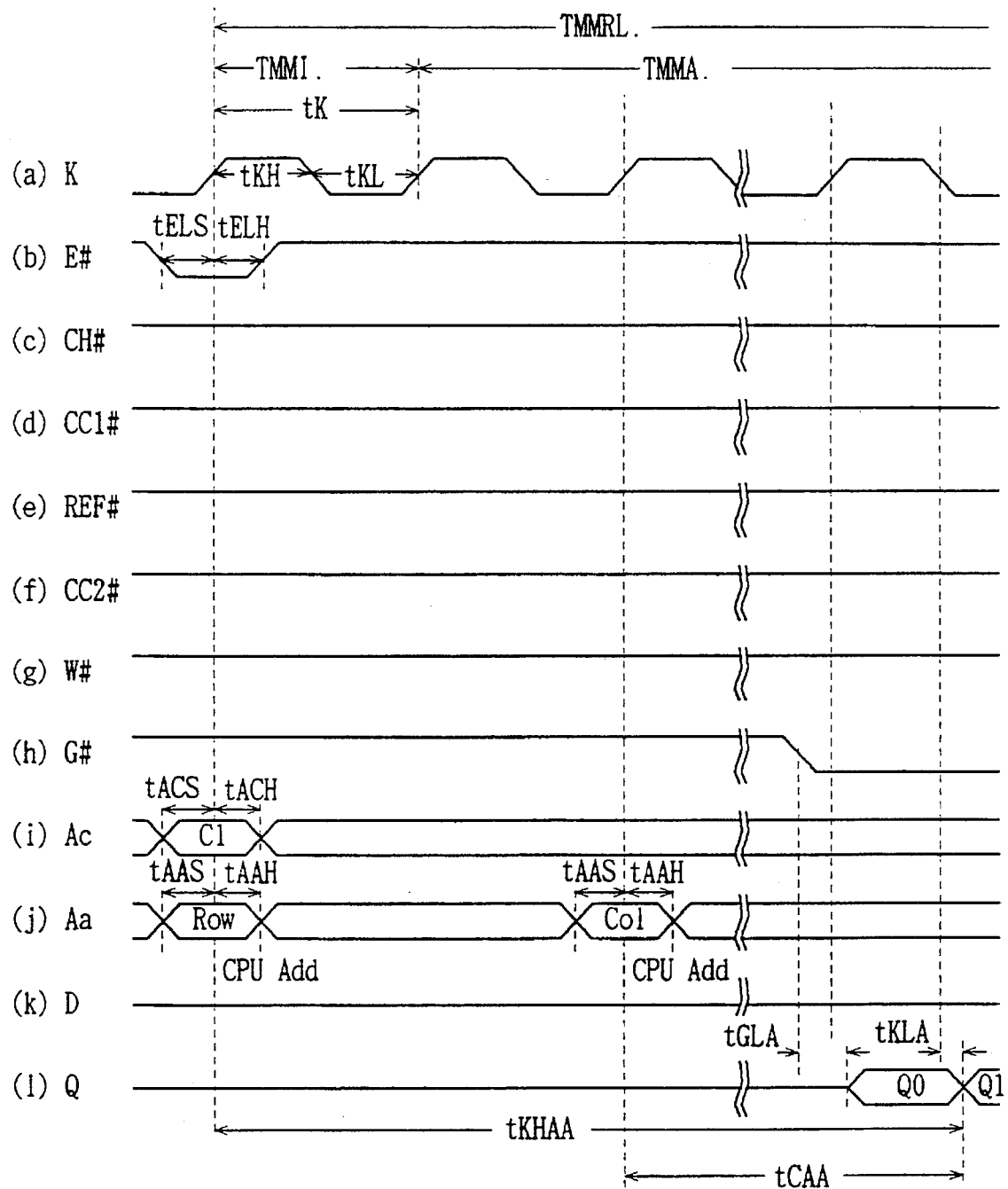

FIG. 144 is a diagram of signal waveforms showing the cache miss reading operation accompanied with the latched output mode in the high speed operation mode realized by the semiconductor memory device shown in FIG. 105.

Figure 145:
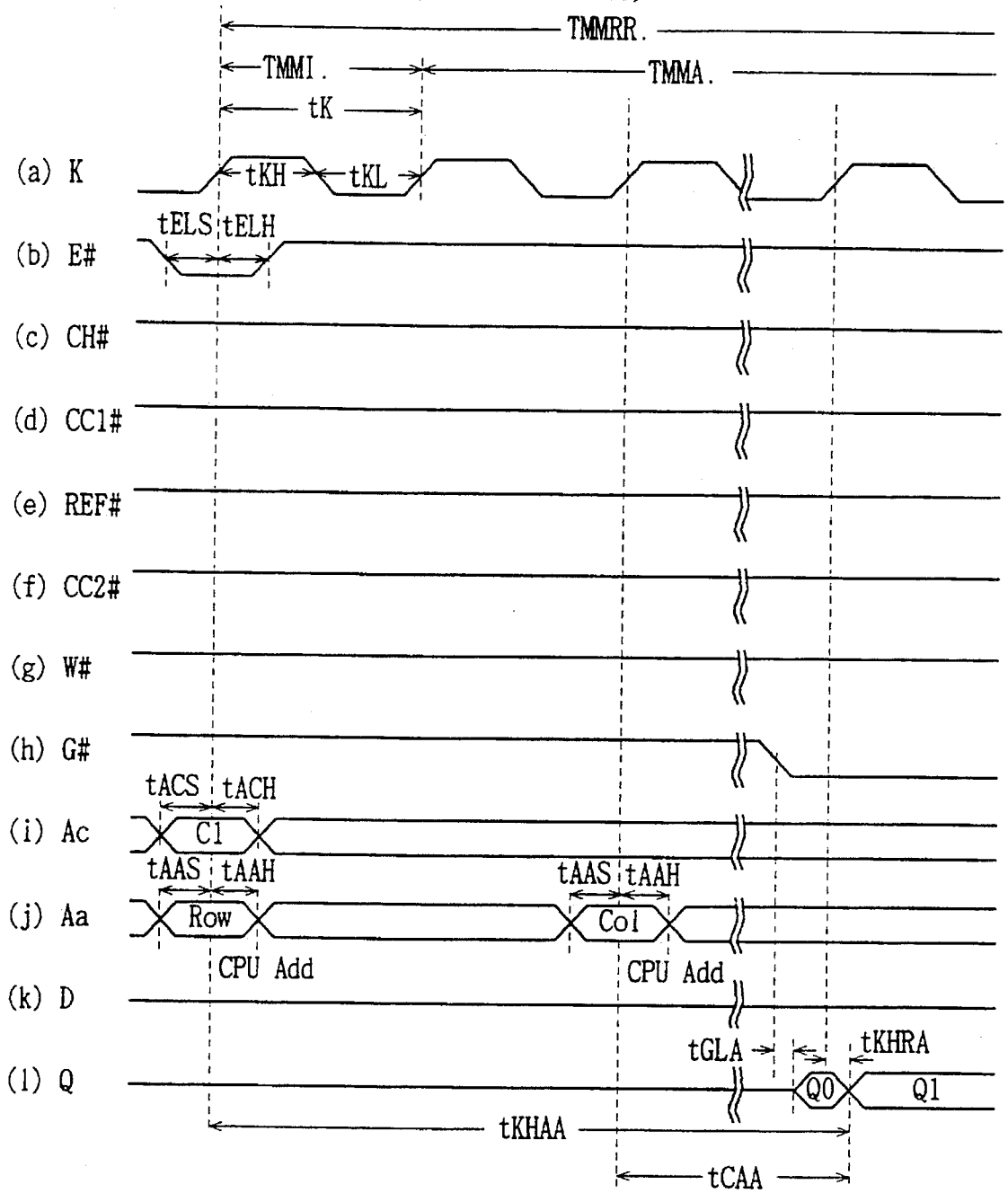

FIG. 145 is a diagram of signal waveforms showing the cache miss reading operation in the registered output mode in the high speed operation mode realized by the semiconductor memory device shown in FIG. 105.

Figure 146:
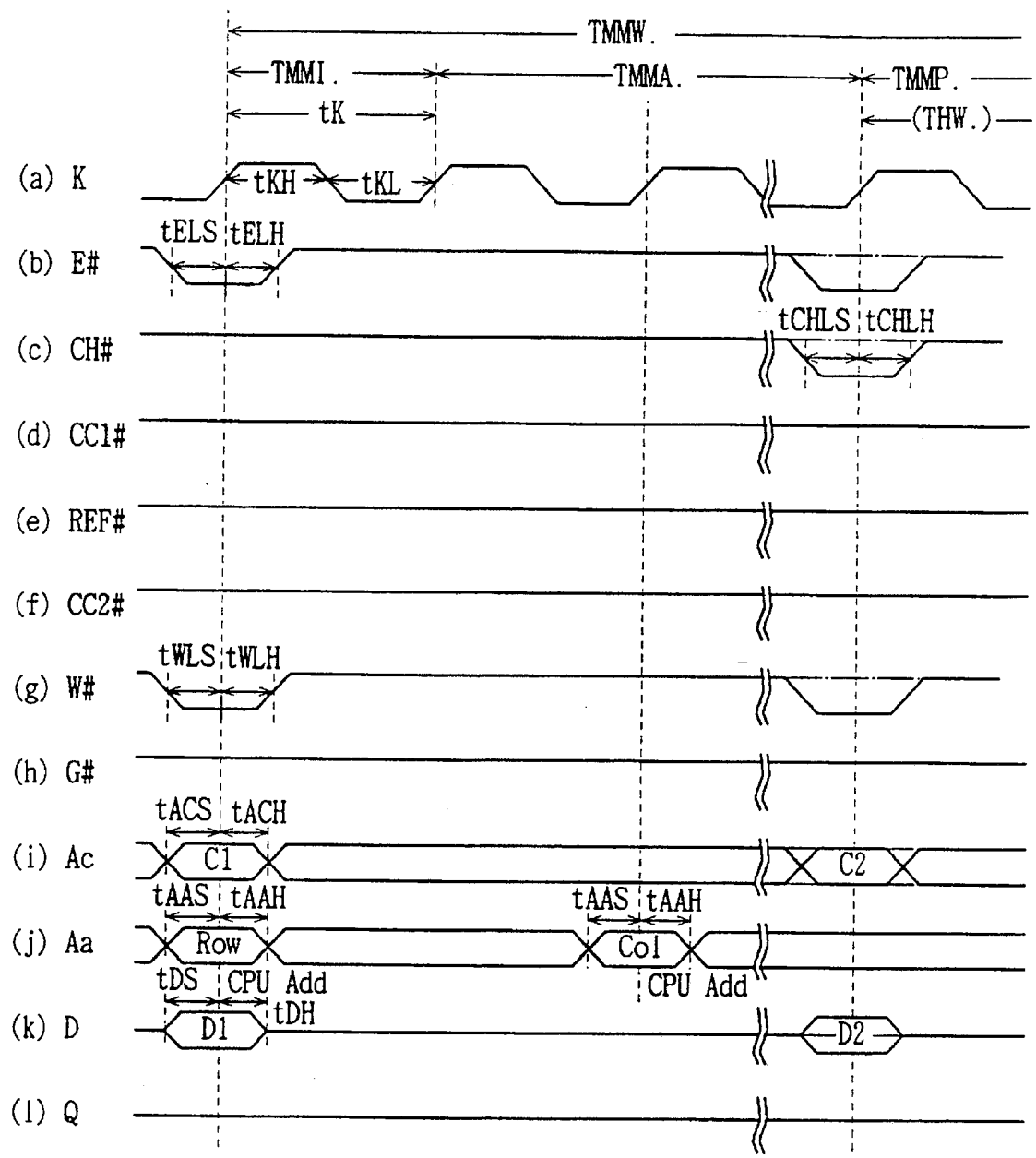

FIG. 146 is a diagram of signal waveforms showing the cache miss writing operation in the high speed operation mode realized by the semiconductor memory device shown in FIG. 105.

Figure 147:
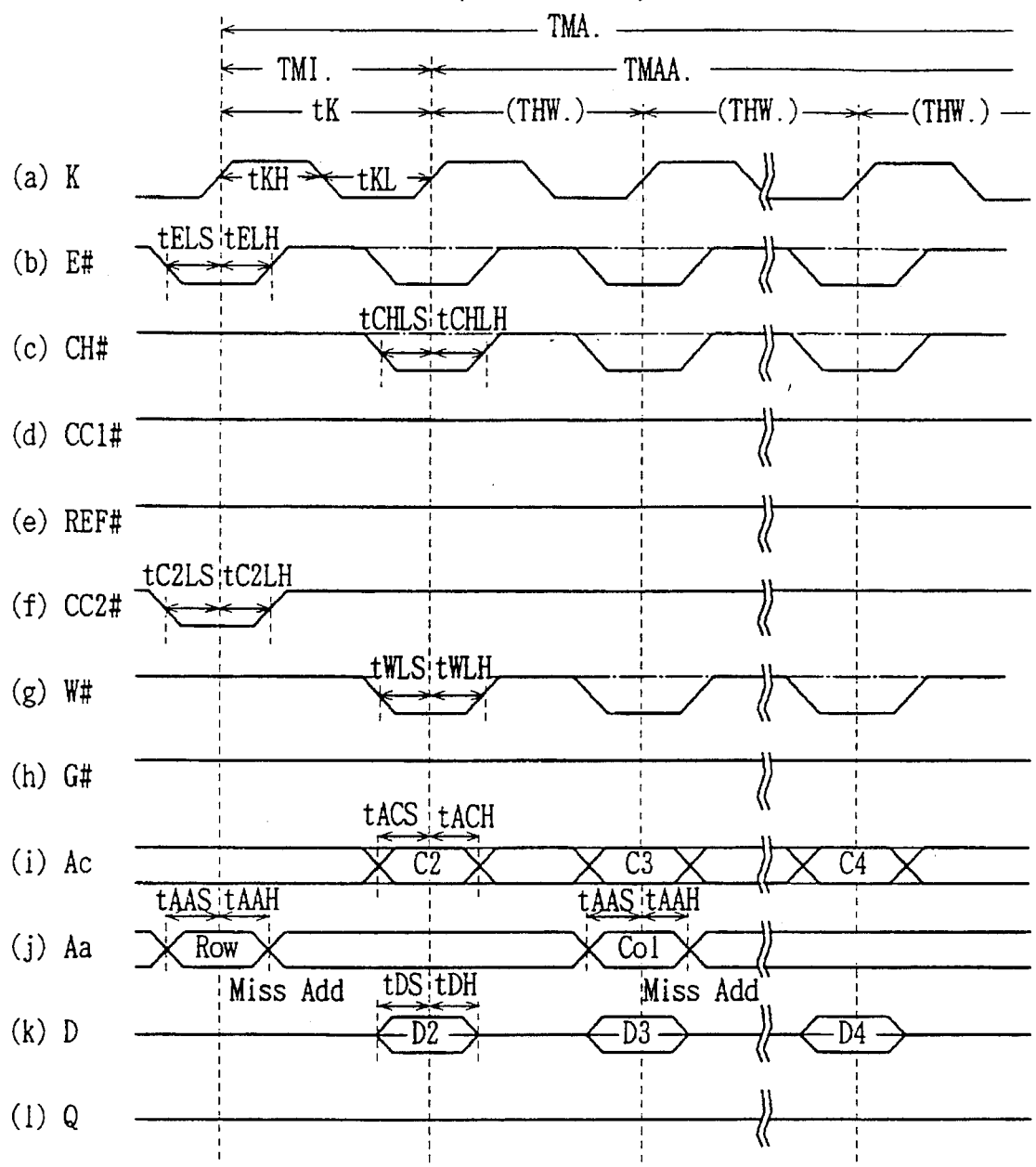

FIG. 147 is a diagram of signal waveforms showing the array writing operation in the high speed operation mode realized by the semiconductor memory device shown in FIG. 105.

Figure 148:
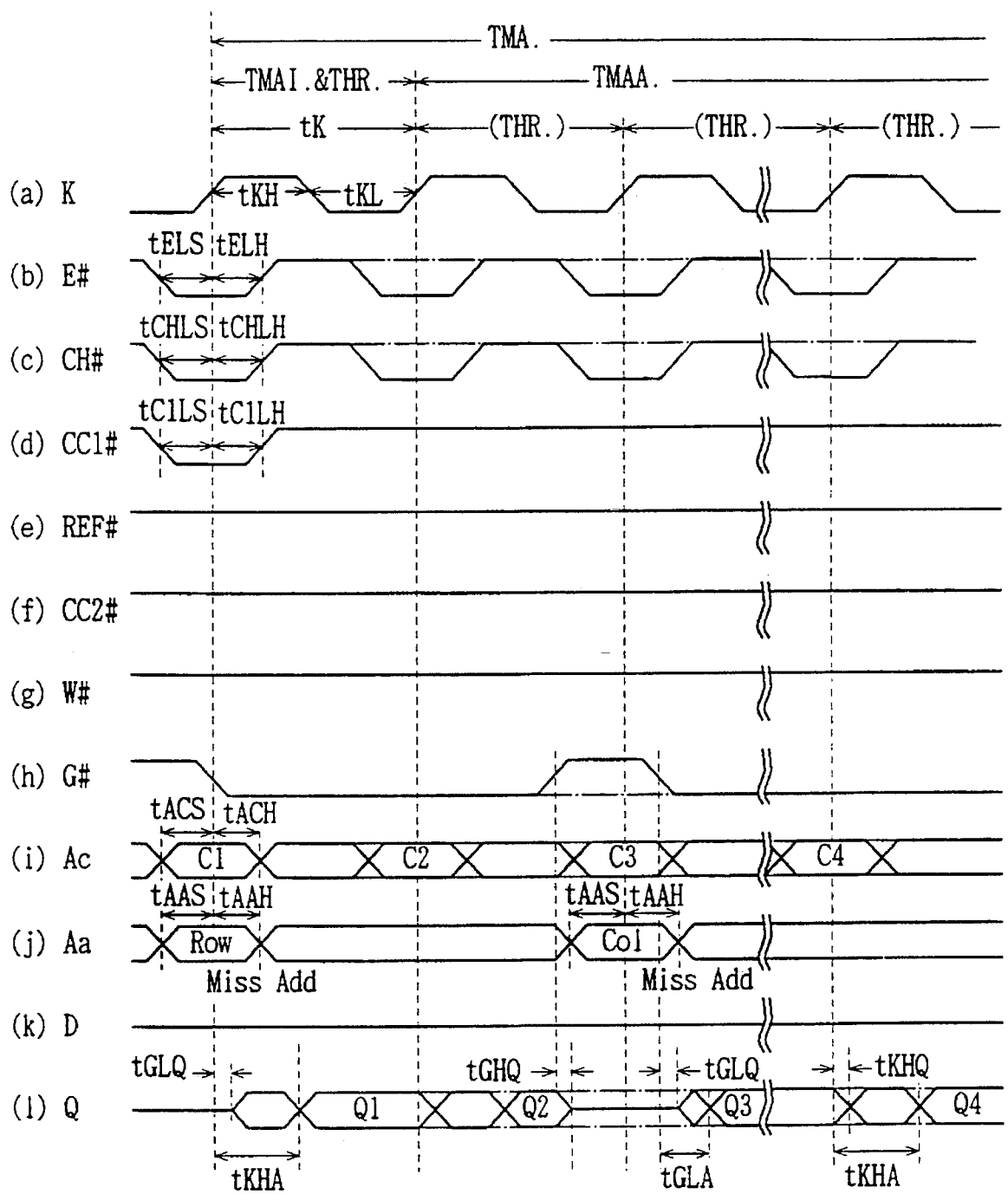

FIG. 148 is a diagram of signal waveforms showing the array writing operation accompanied with the cache hit reading in the high speed operation mode realized by the semiconductor memory device shown in FIG. 105.

Figure 149:
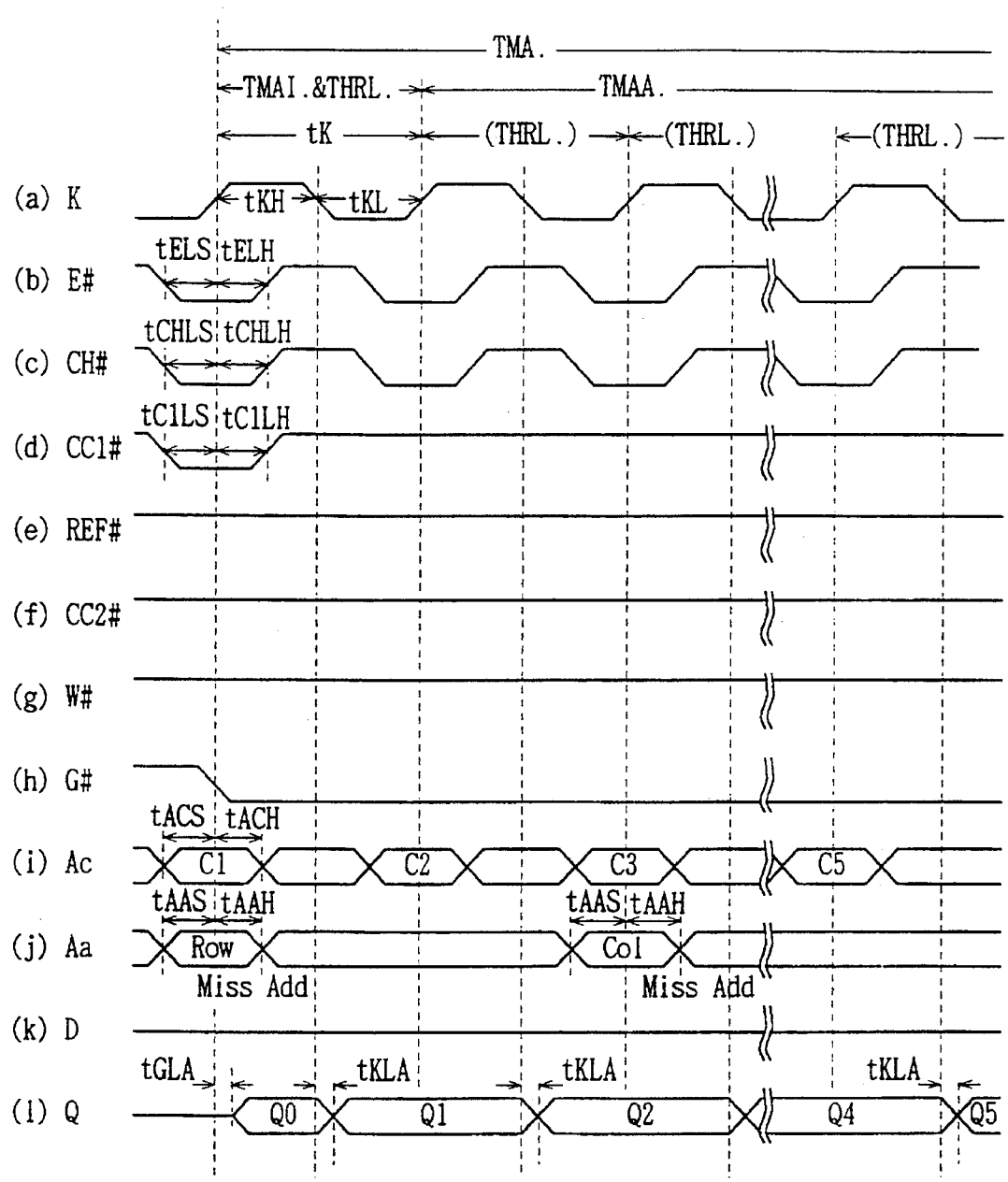

FIG. 149 is a diagram of signal waveforms showing the array writing operation accompanied with the cache hit reading in the latched output mode in the high speed operation mode realized by the semiconductor memory device shown in FIG. 105.

Figure 150:
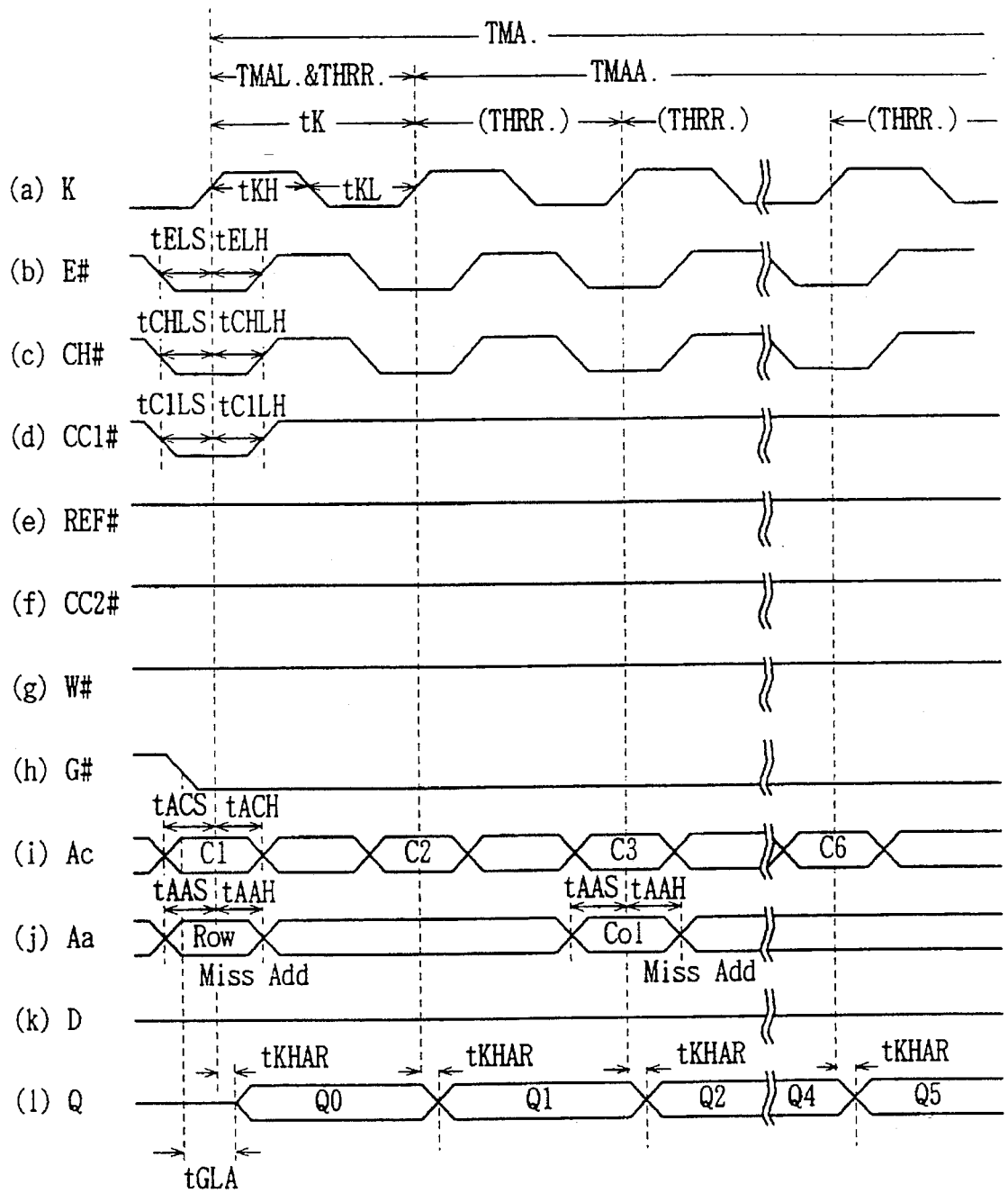

FIG. 150 is a diagram of signal waveforms showing the array writing operation accompanied with the cache hit reading in accordance with the registered output mode in the high speed operation mode realized by the semiconductor memory device shown in FIG. 105.

Figure 151:
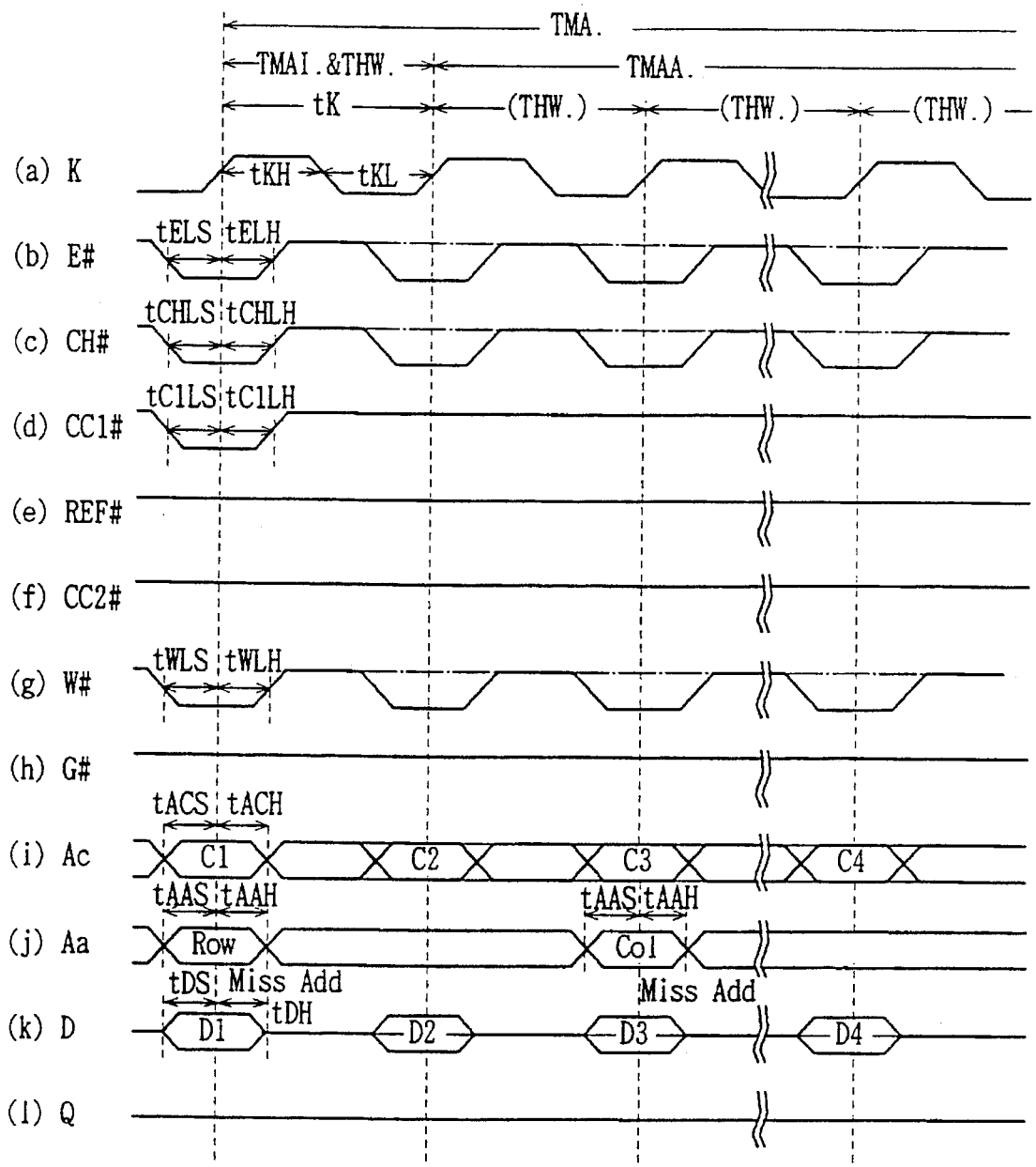

FIG. 151 is a diagram of signal waveforms showing the array writing operation accompanied with the cache hit writing in the high speed operation mode in the semiconductor memory device shown in FIG. 105.

Figure 152:
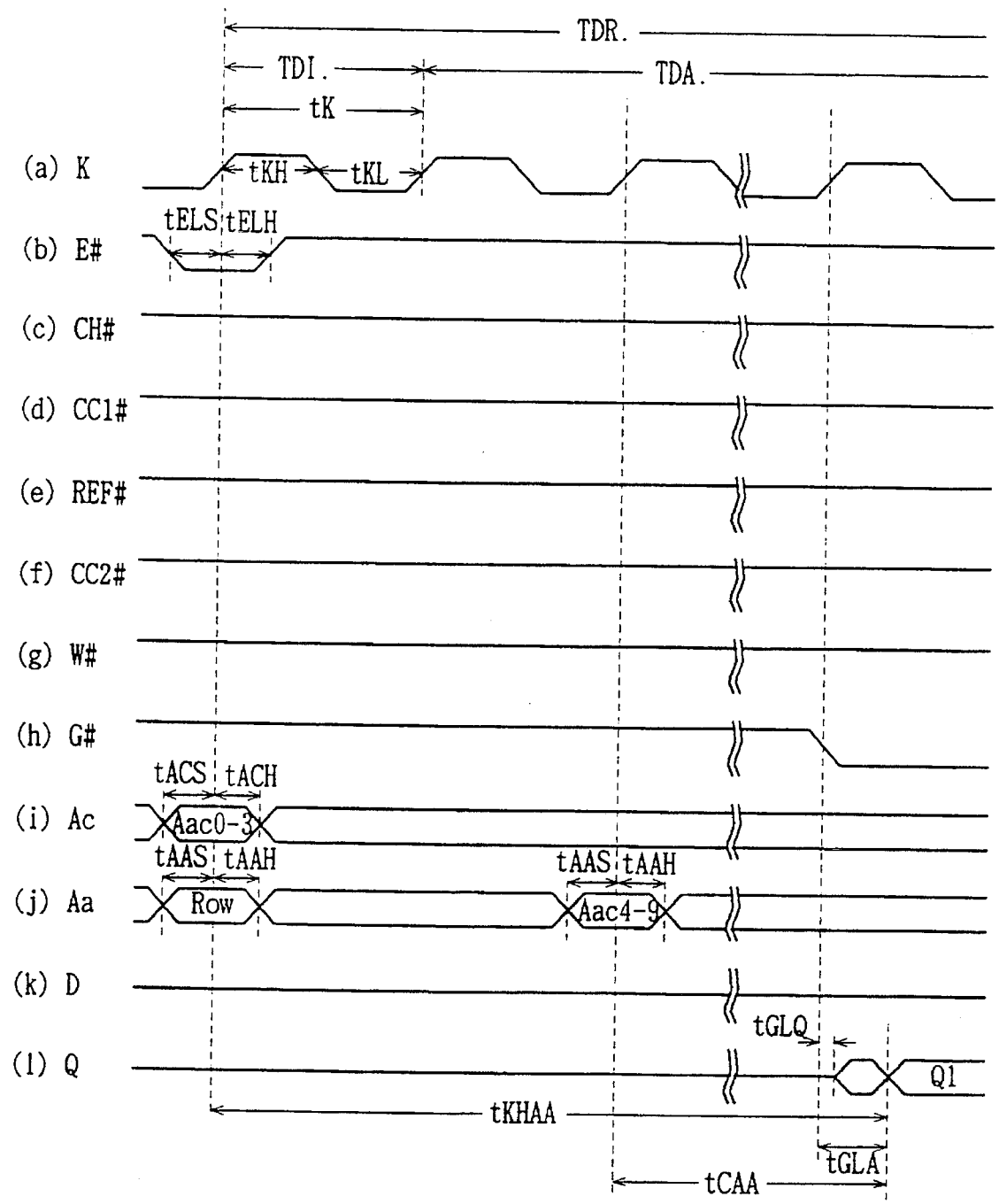

FIG. 152 is a diagram of signal waveforms showing a direct array reading operation in the high speed operation mode realized by the semiconductor memory device shown in FIG. 105.

Figure 153:
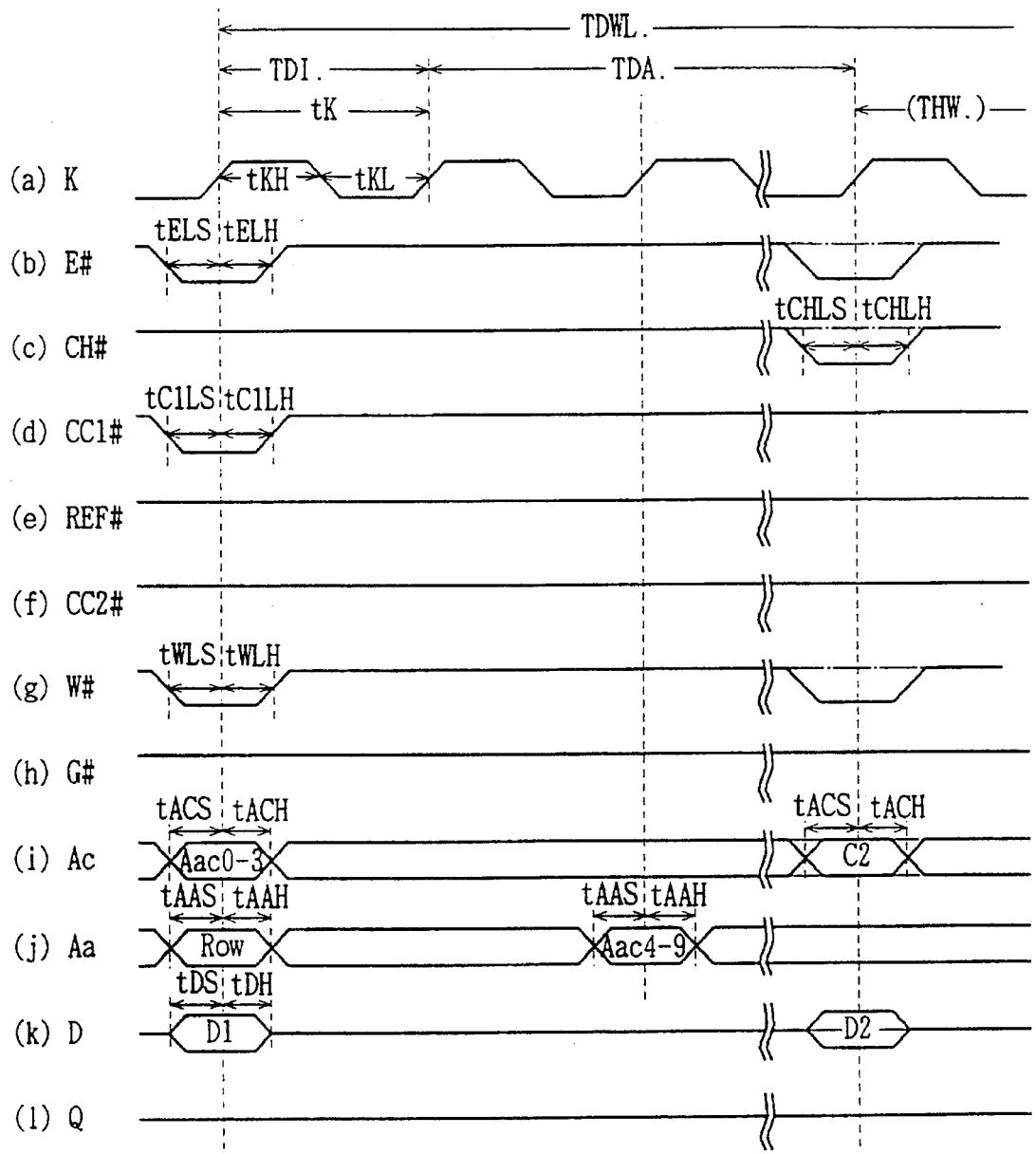

FIG. 153 is a diagram of signal waveforms showing a direct array writing operation in the high speed operation mode realized by the semiconductor memory device shown in FIG. 105.

Figure 154:
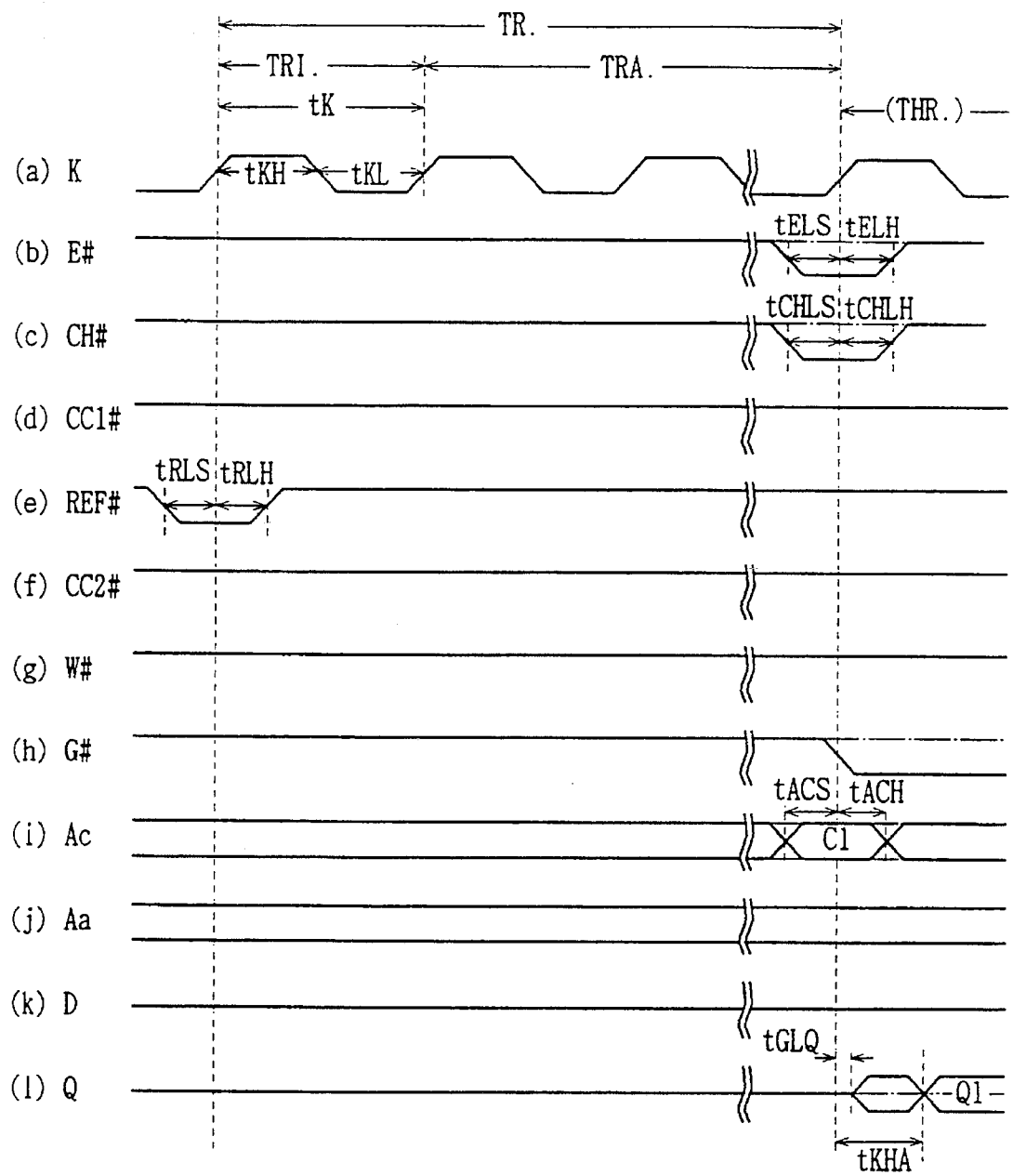

FIG. 154 is a diagram of signal waveforms showing the refresh array operation in the high speed operation mode realized by the semiconductor memory device shown in FIG. 105.

Figure 155:
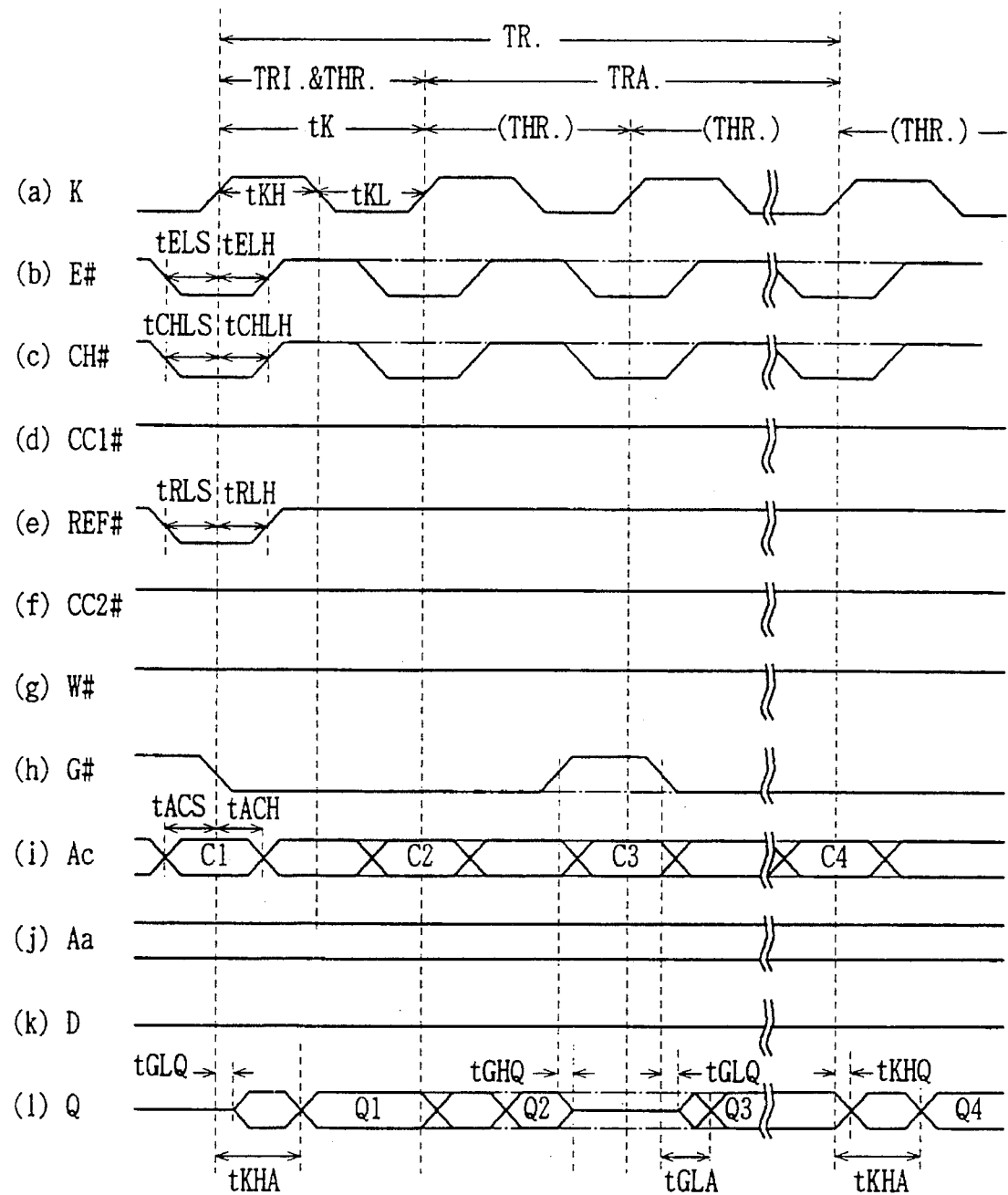

FIG. 155 is a diagram of signal waveforms showing the refreshing operation accompanied with cache hit reading in the high speed operation mode realized by the semiconductor memory device shown in FIG. 105.

Figure 156:
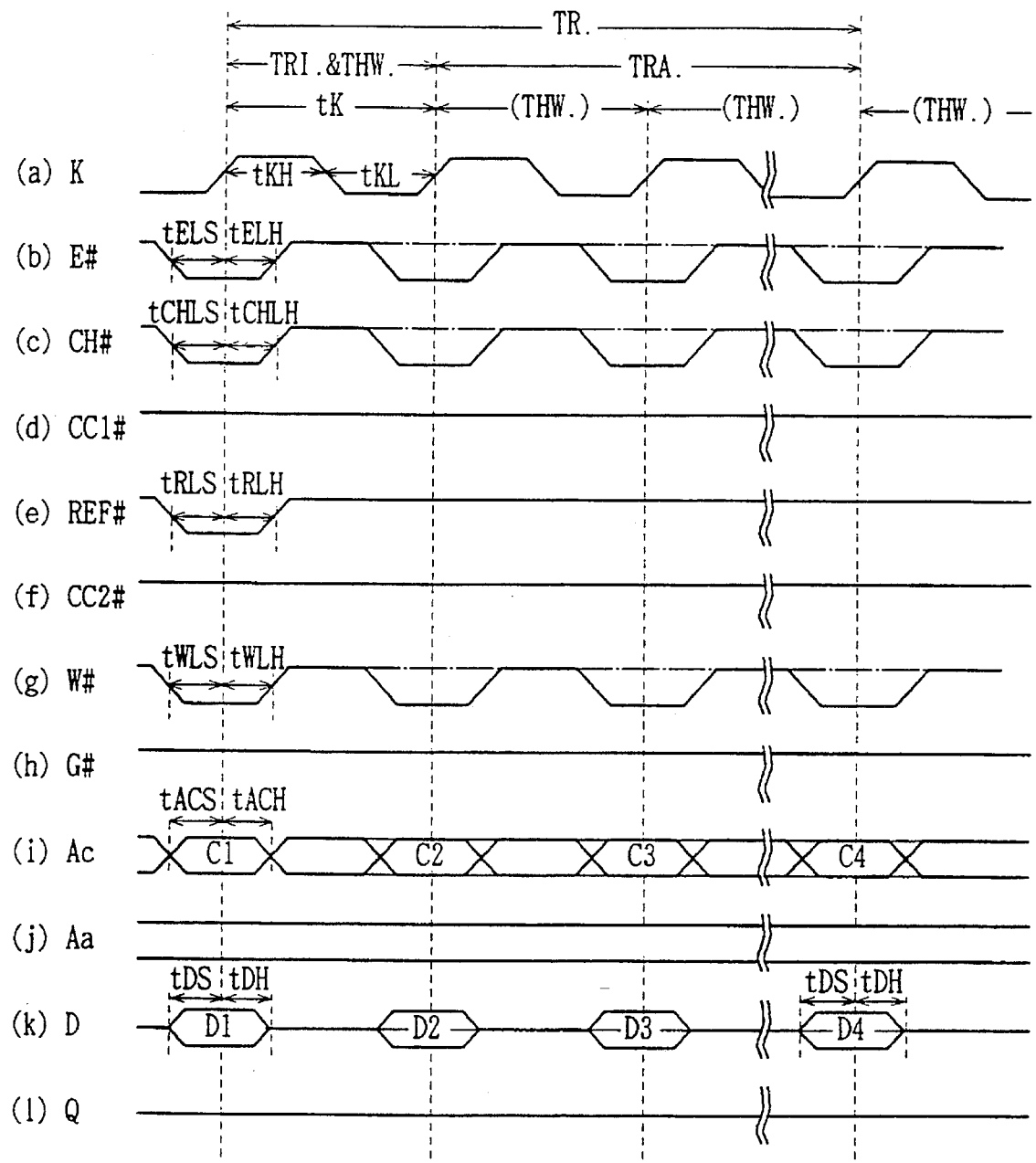

FIG. 156 is a diagram of signal waveforms showing the refresh array operation accompanied with cache hit writing in the high speed operation mode realized by the semiconductor memory device shown in FIG. 105.

Figure 157:
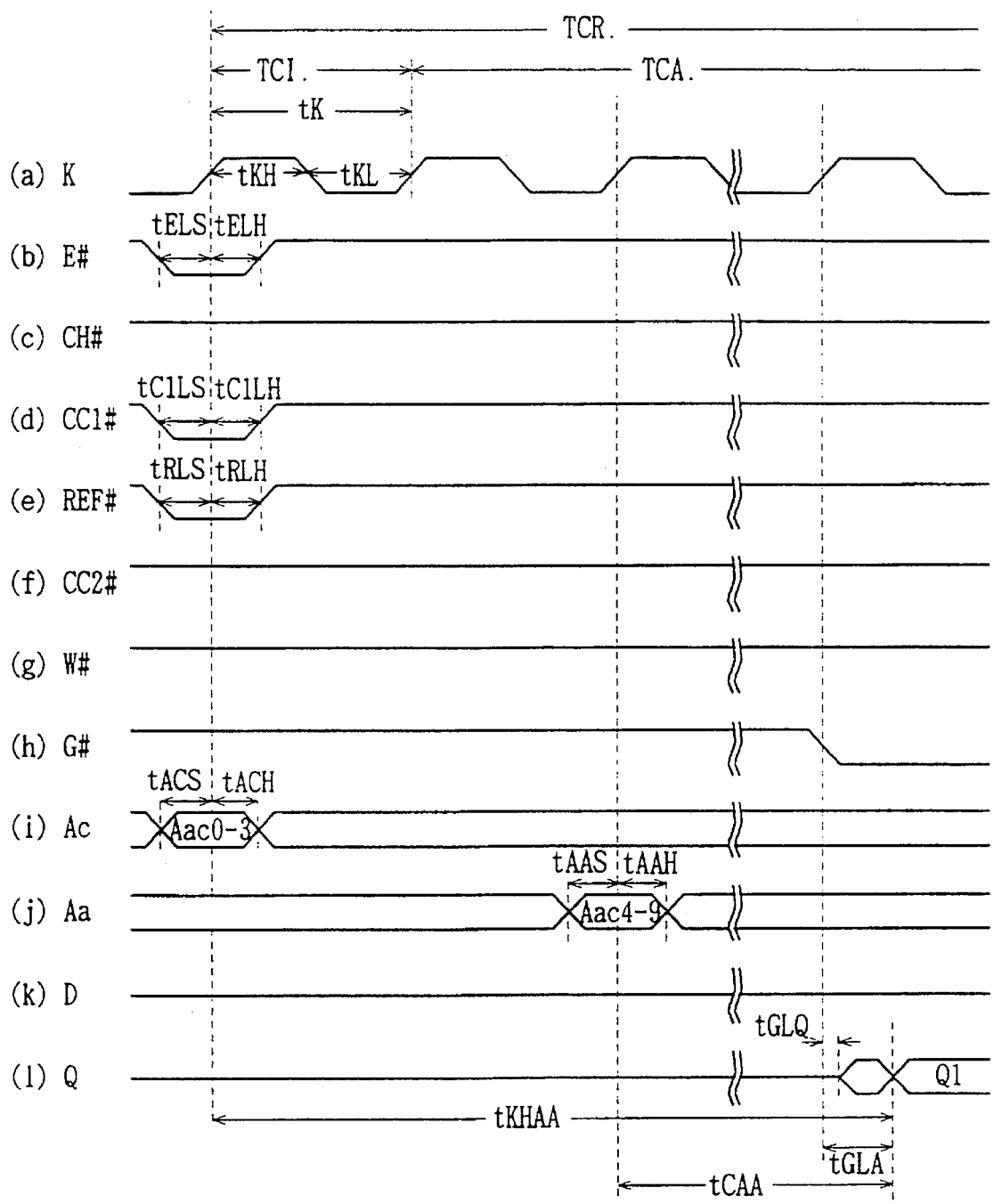

FIG. 157 is a diagram of signal waveforms showing the counter check operation in the high speed operation mode realized by the semiconductor memory device shown in FIG. 105.

Figure 158:
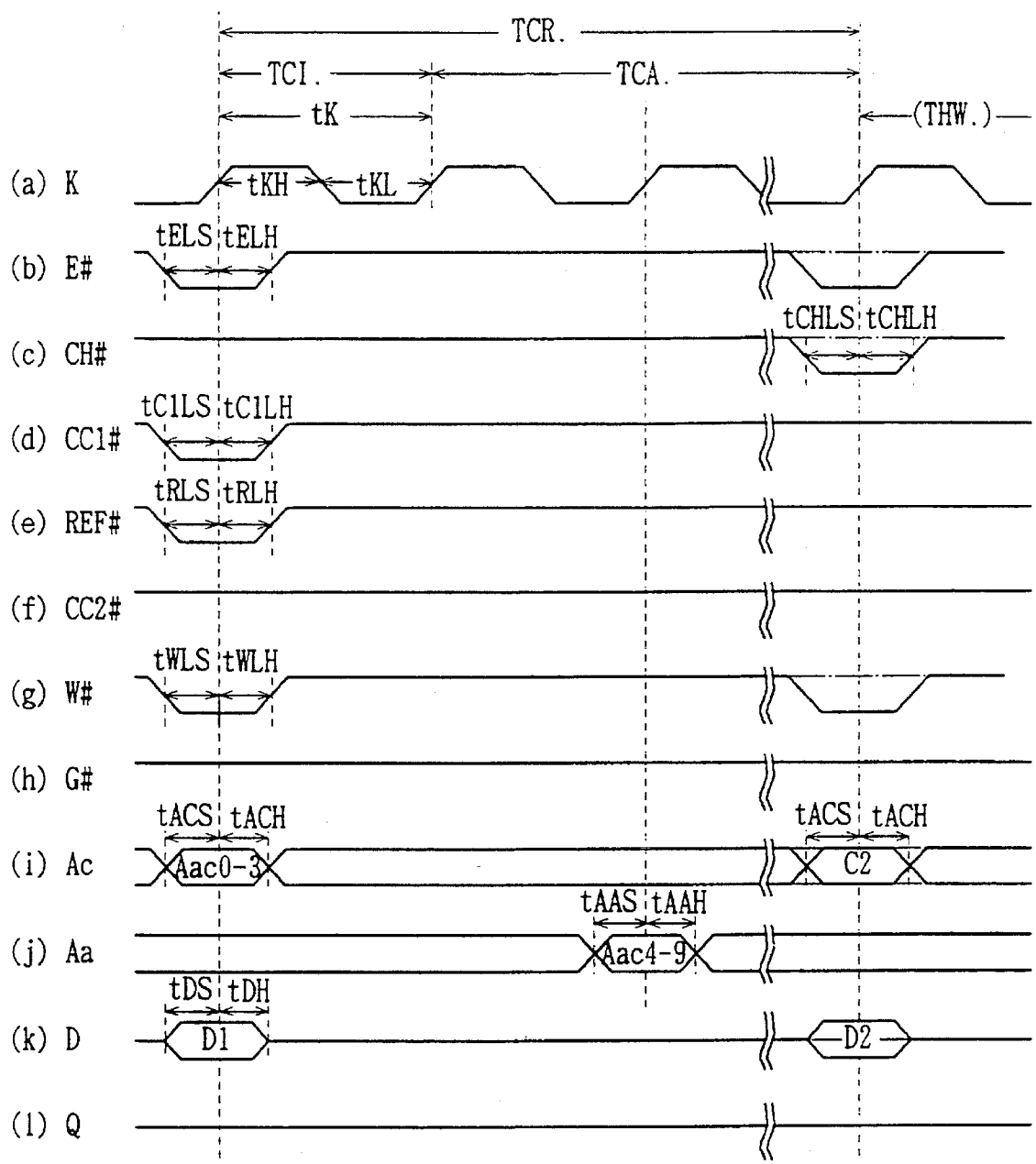

FIG. 158 is a diagram of signal waveforms showing the counter check writing operation in the high speed operation mode realized by the semiconductor memory device shown in FIG. 105.

Figure 159:
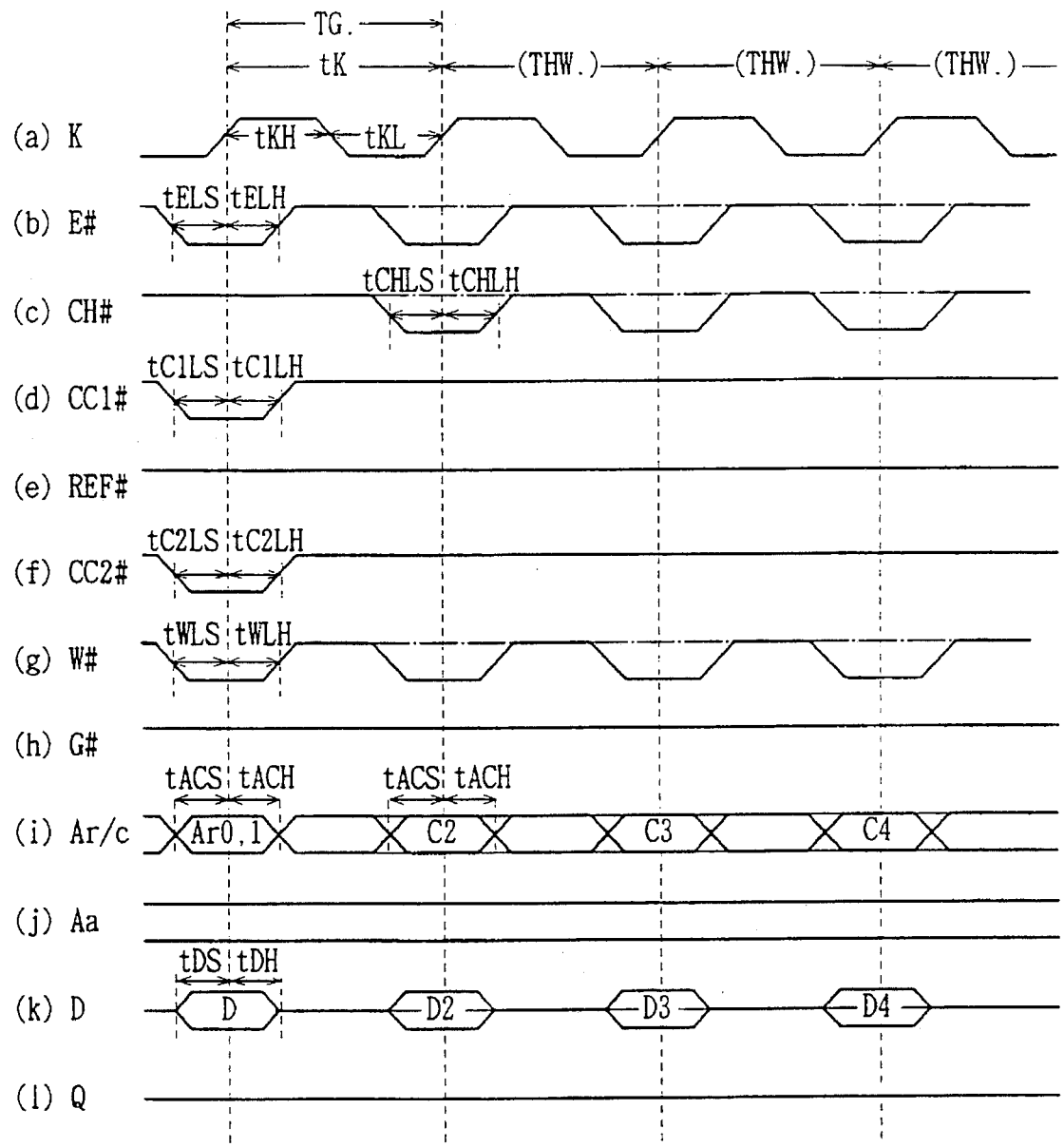

FIG. 159 is a diagram of signal waveforms showing the command register setting operation in the high speed operation mode realized by the semiconductor memory device shown in FIG. 105.

Figure 160:
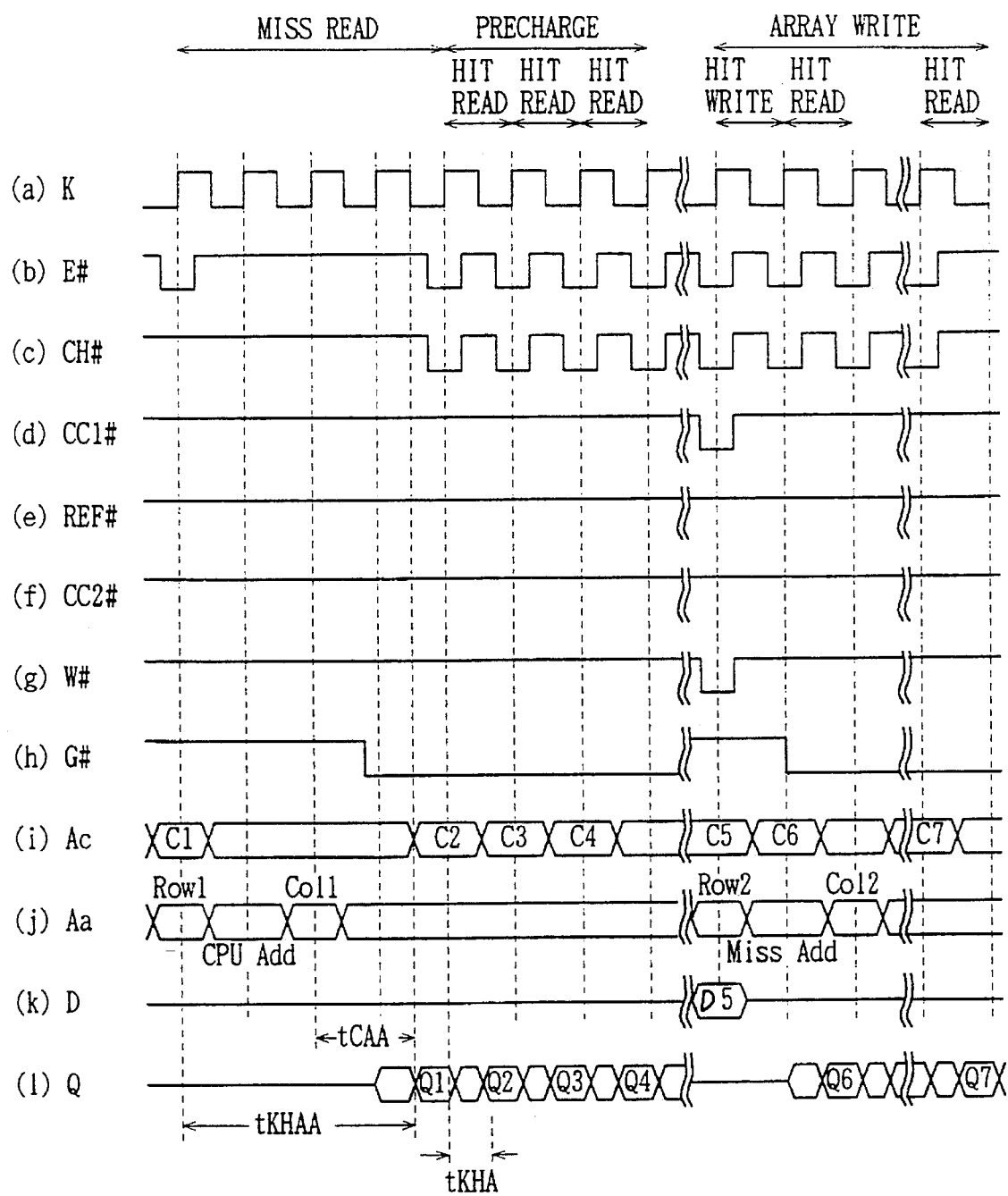

FIG. 160 is a diagram of signal waveforms showing an example of an operation sequence carried out in the high speed operation mode by the semiconductor memory device shown in FIG. 105.

Figure 161:
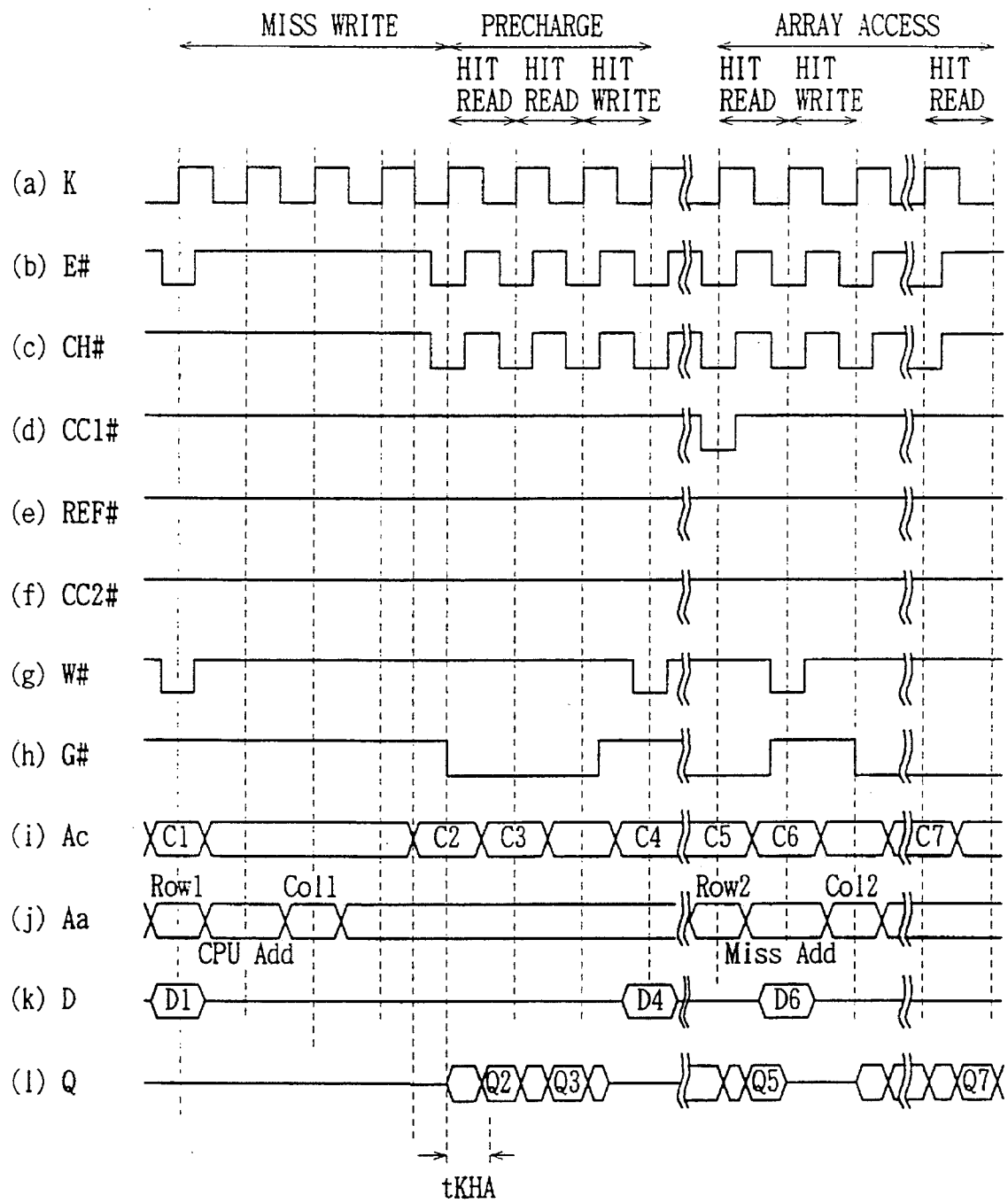

FIG. 161 shows another example of the operation sequence realized in the high speed operation mode by the semiconductor memory device shown in FIG. 105.

Figure 32:
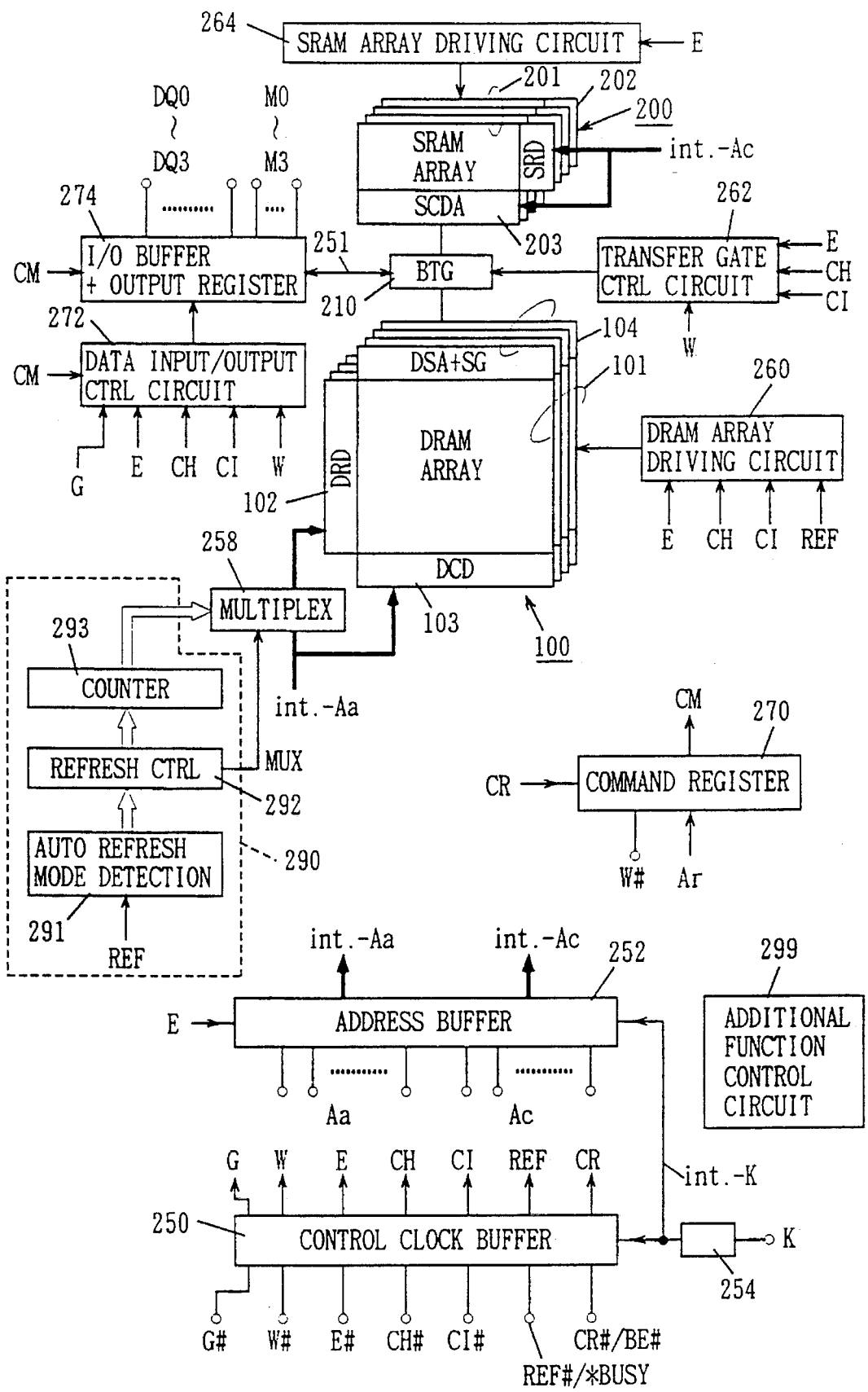
FIGS. 32 represents an overall view of a functional construction of the CDRAM.
Figure 162:
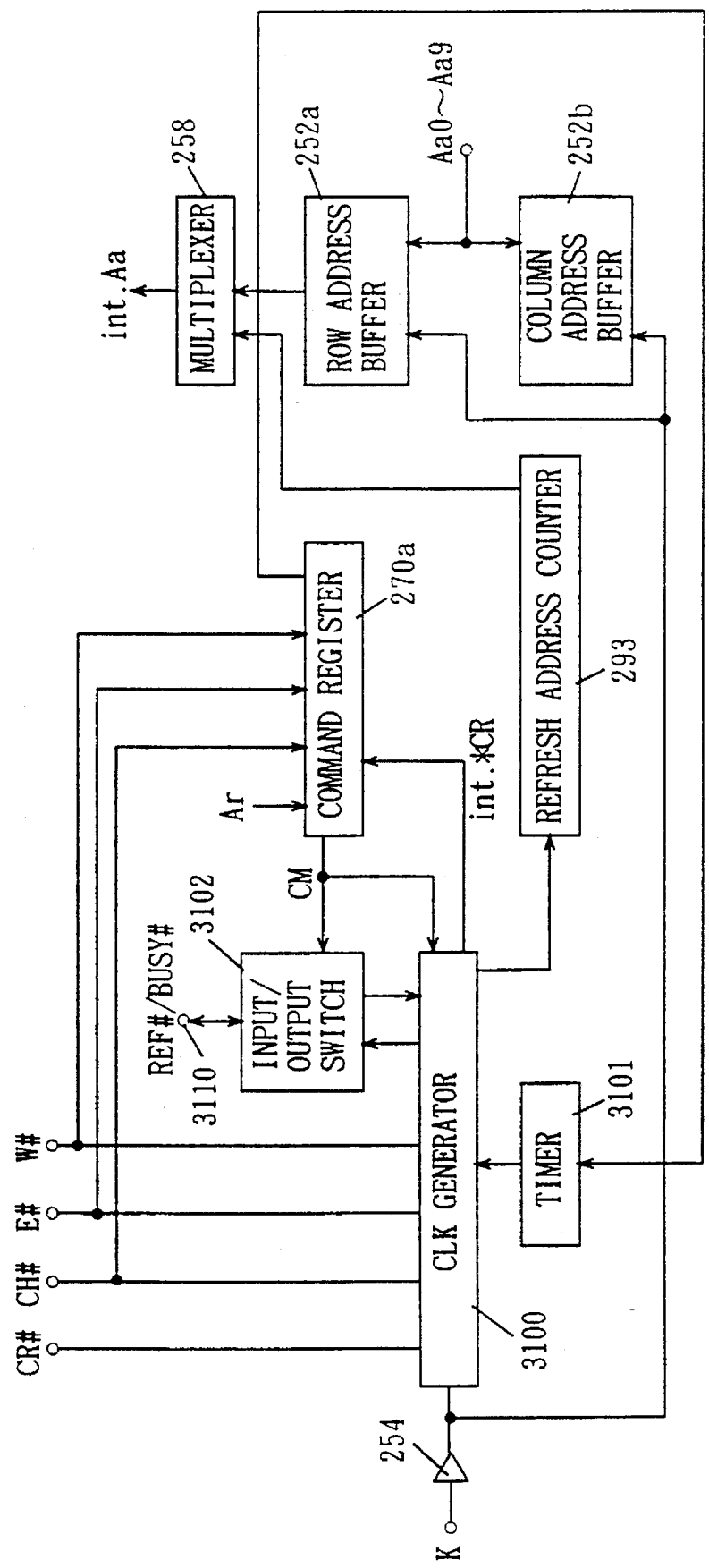

FIG. 162 shows a structure which can selectively effect self refreshing and auto-refreshing in the semiconductor memory device shown in FIG. 32 or FIG. 105.

Figure 163:
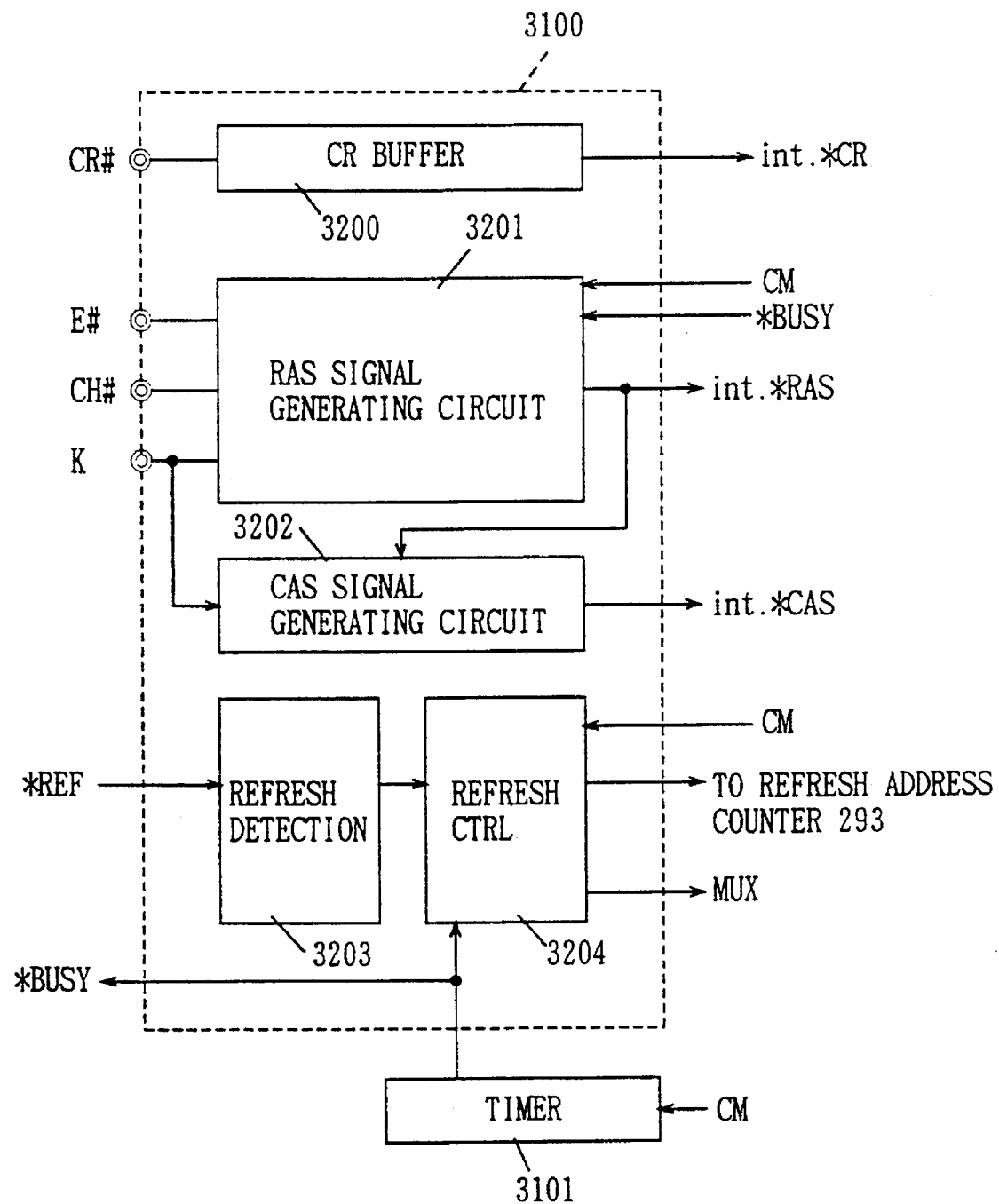

FIG. 163 is a block diagram showing a specific structure of the clock generator shown in FIG. 162.

Figure 164:
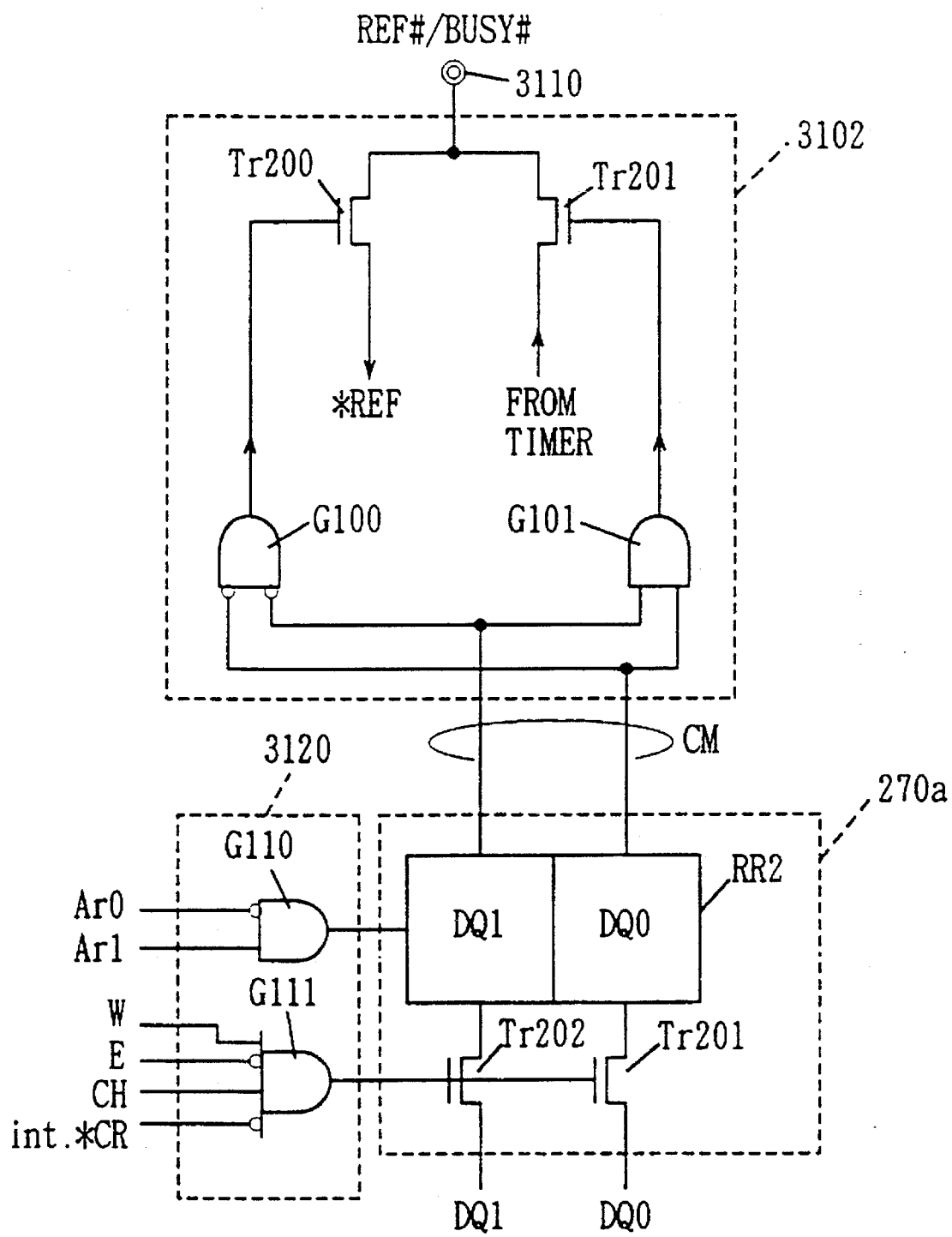

FIG. 164 shows an example of a specific structure of the input/output switching circuit and a command register shown in FIG. 162.

Figure 165:
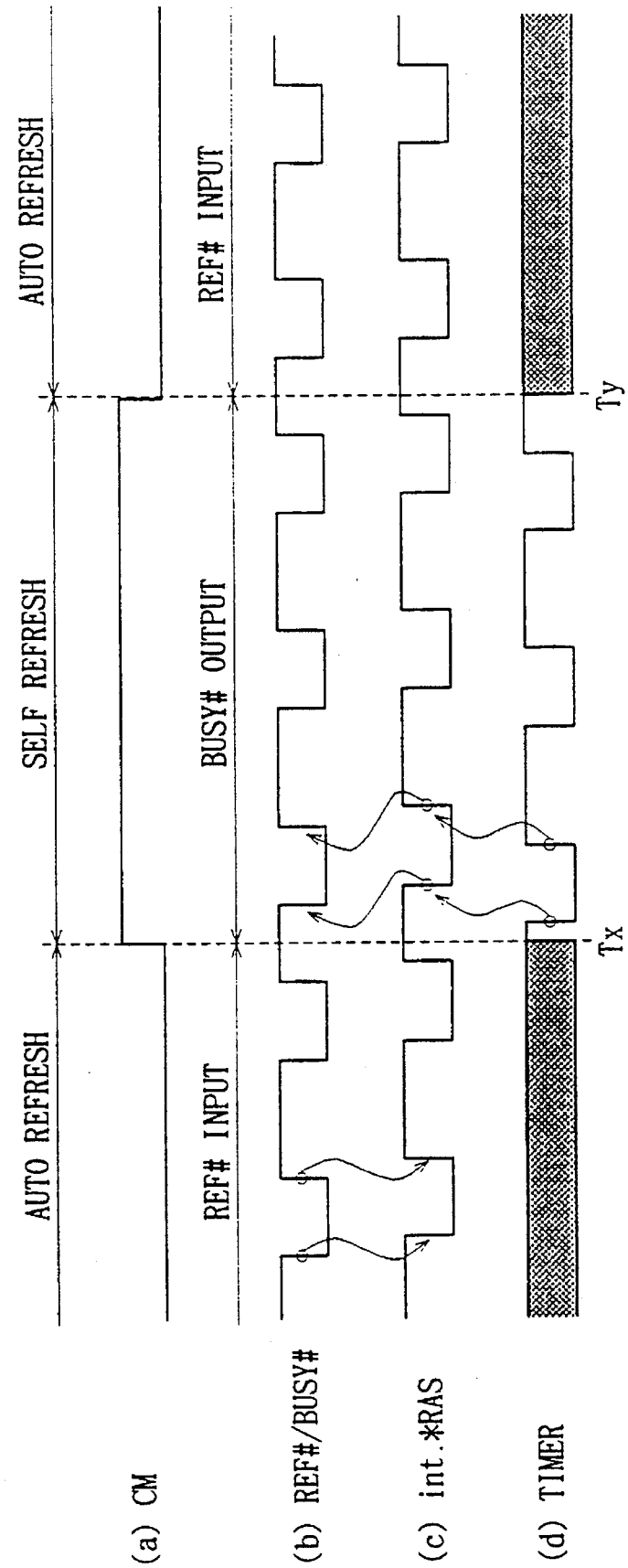

FIG. 165 is a diagram of signal waveforms showing the operation of the circuit shown in FIG. 162.

FIG. 166 shows another example of the structure of the circuit shown in FIG. 162.

Figure 167:
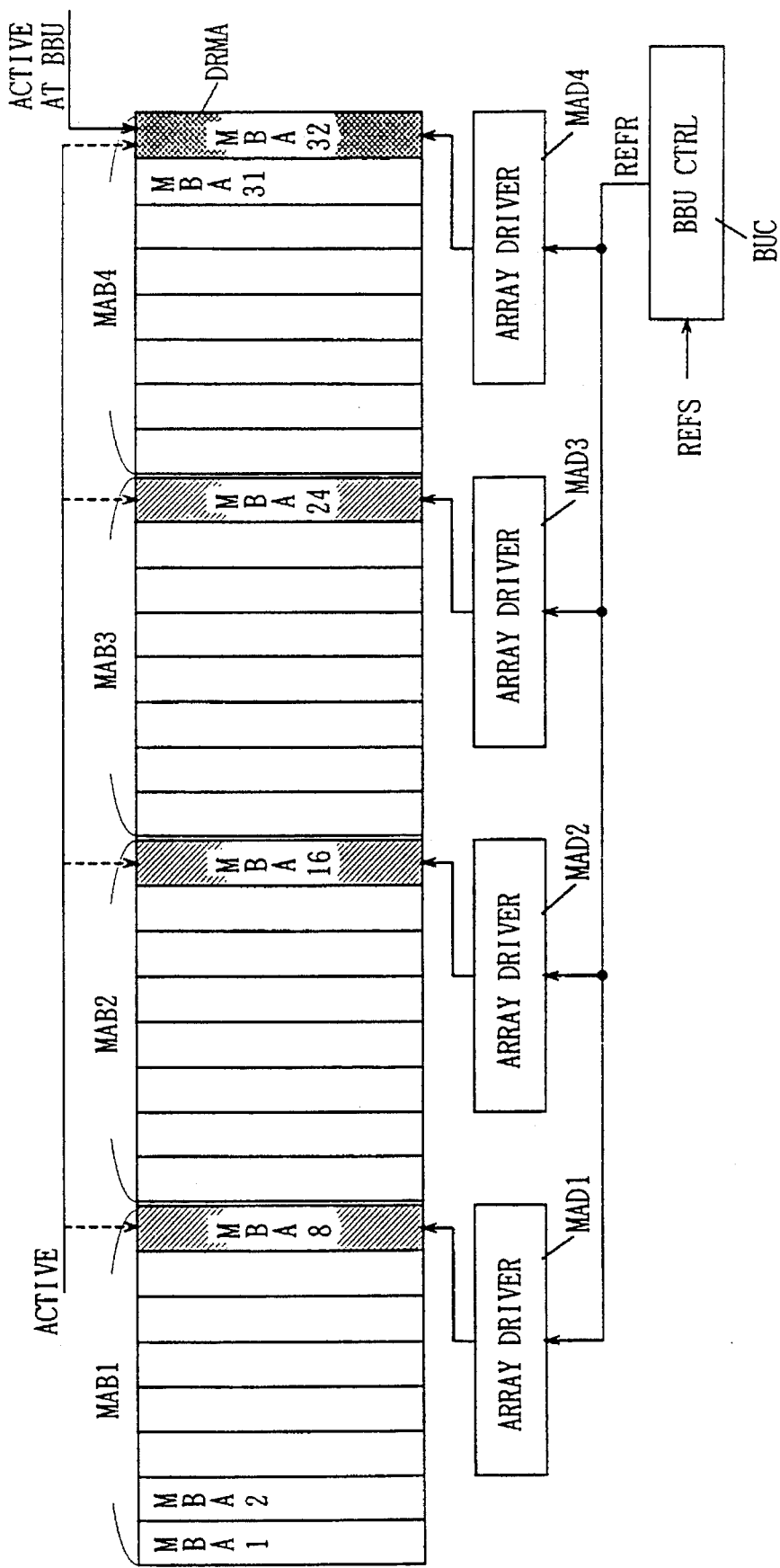

FIG. 167 illustrates battery backup mode.

Figure 168:
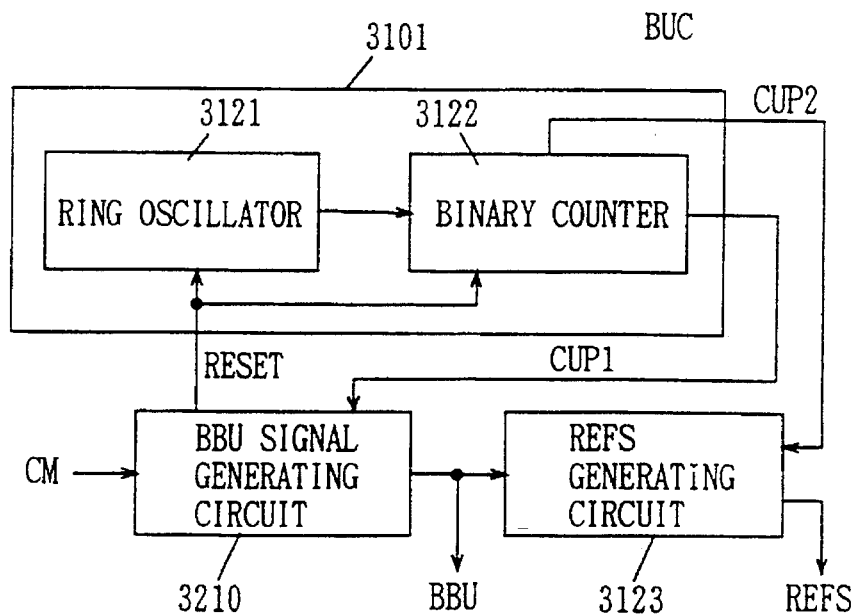

FIG. 168 is a block diagram showing a specific structure of a BBU control shown in FIG. 166.

Figure 169:
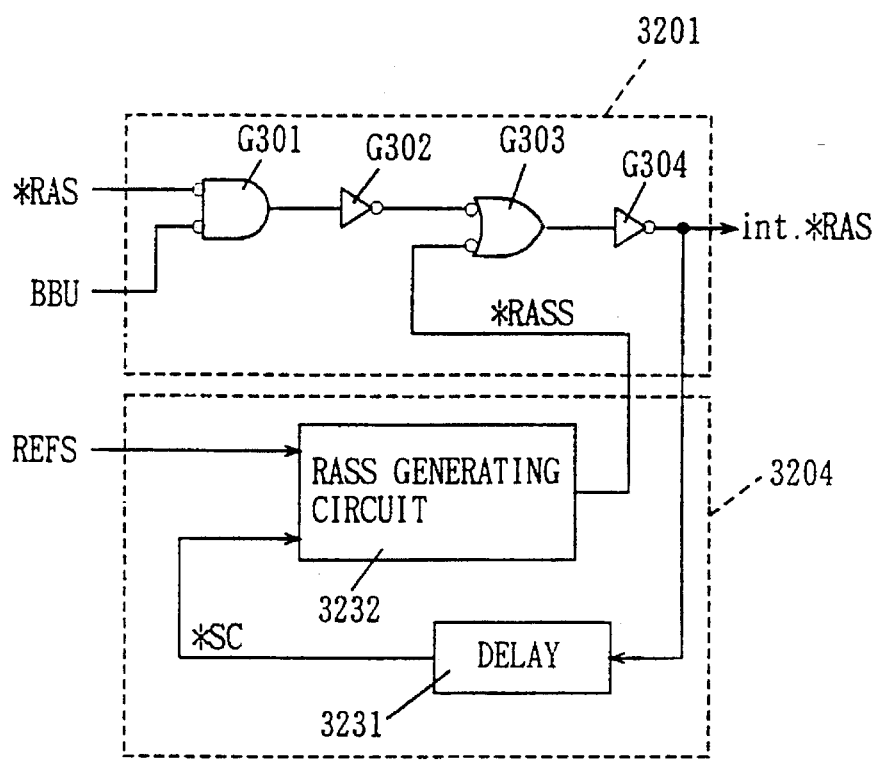

FIG. 169 shows a structure of the clock generator shown in FIG. 166 when the battery backup mode is employed.

Figure 170:
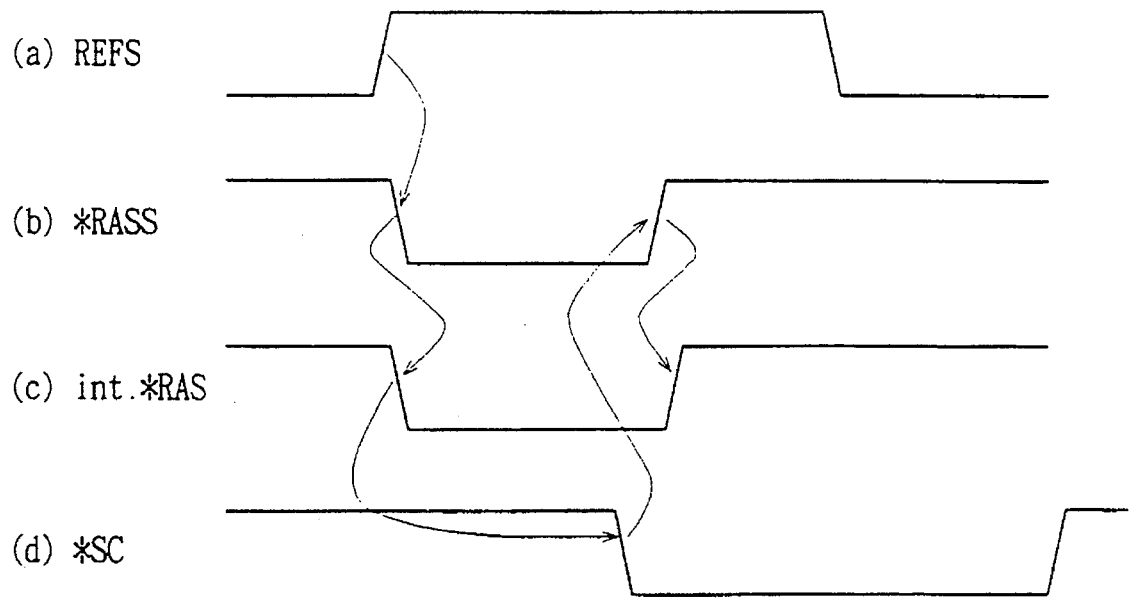

FIG. 170 is a diagram of signal waveforms showing the operation of the circuit shown in FIG. 169.

Figure 171:
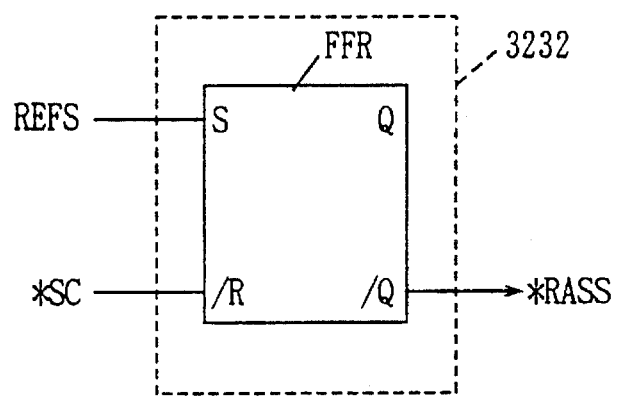

FIG. 171 shows an example of a specific structure of a RASS generating circuit shown in FIG. 169.

FIG. 172 shows a structure when the structure of FIG. 162 is applied to a general DRAM.

Figure 173:
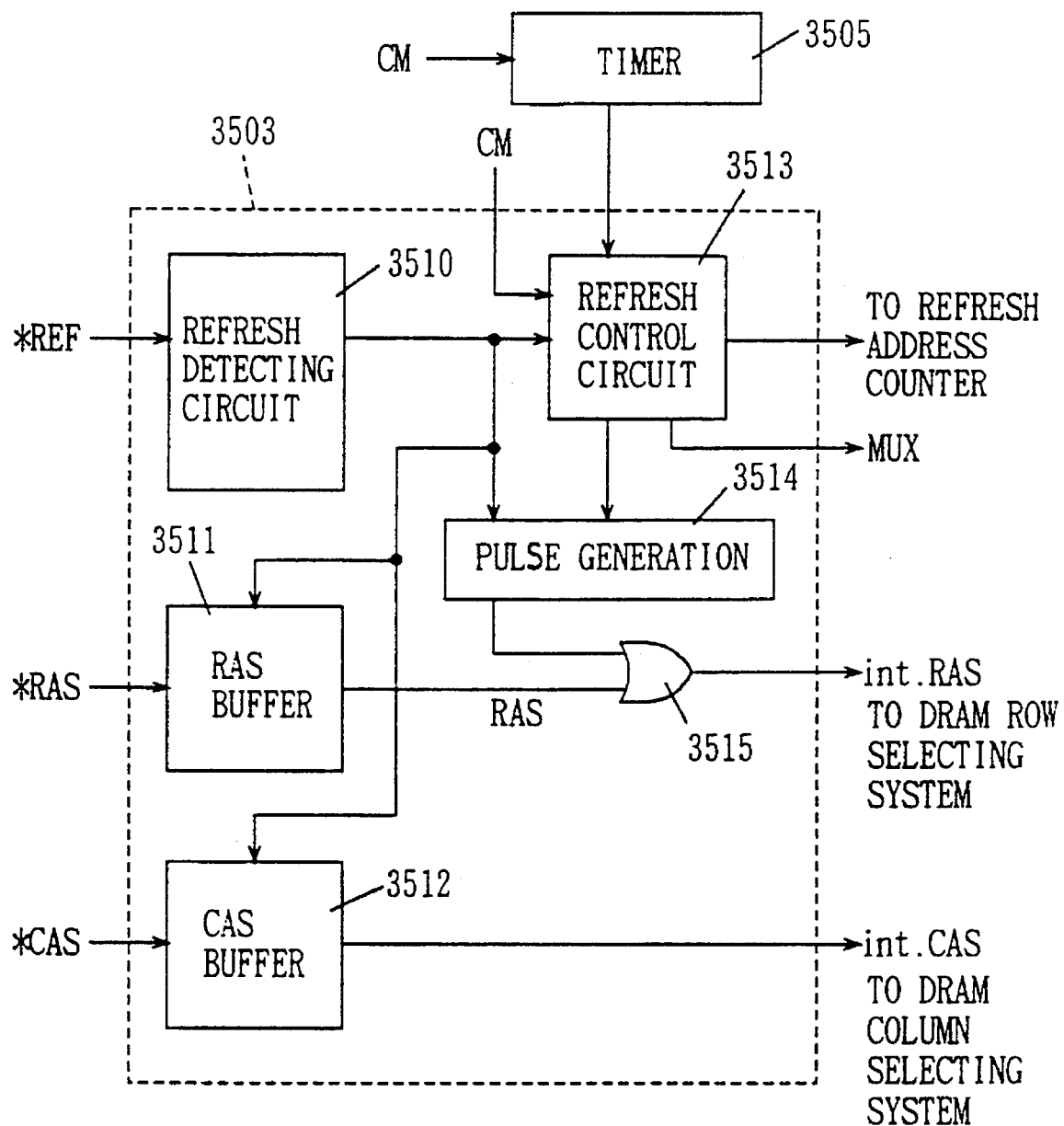

FIG. 173 shows an example of a specific structure of the clock generator shown in FIG. 172.

Figure 174:
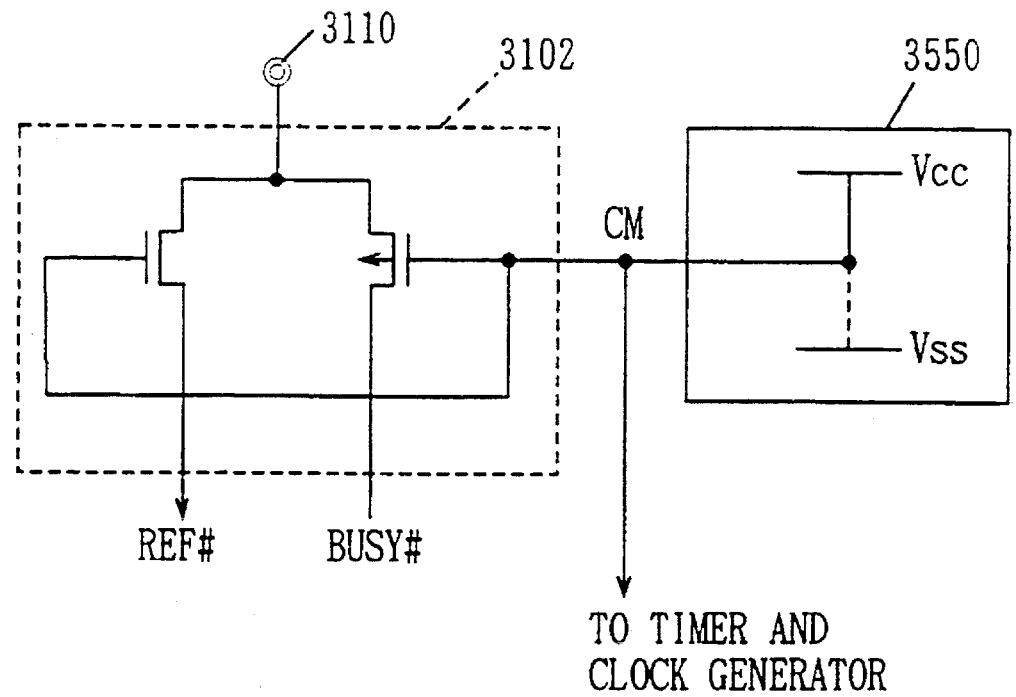

FIG. 174 shows another example of the structures of the input/output switching circuit and the command register shown in FIG. 162.

Figure 175:
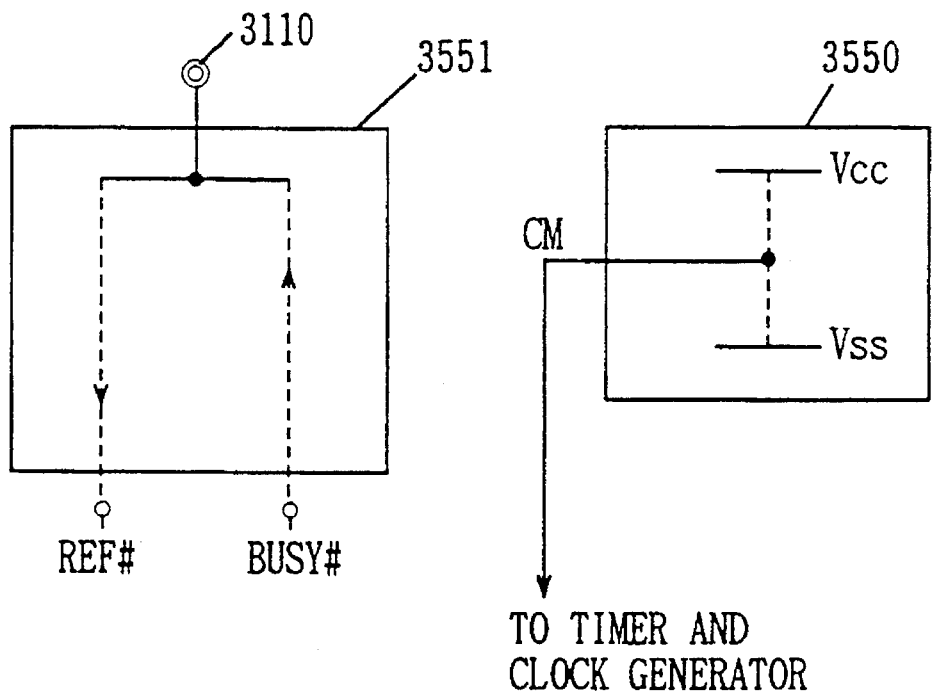

FIG. 175 shows another example of the structures of the input/output switching circuit and the command register shown in FIG. 162.

Figure 176:
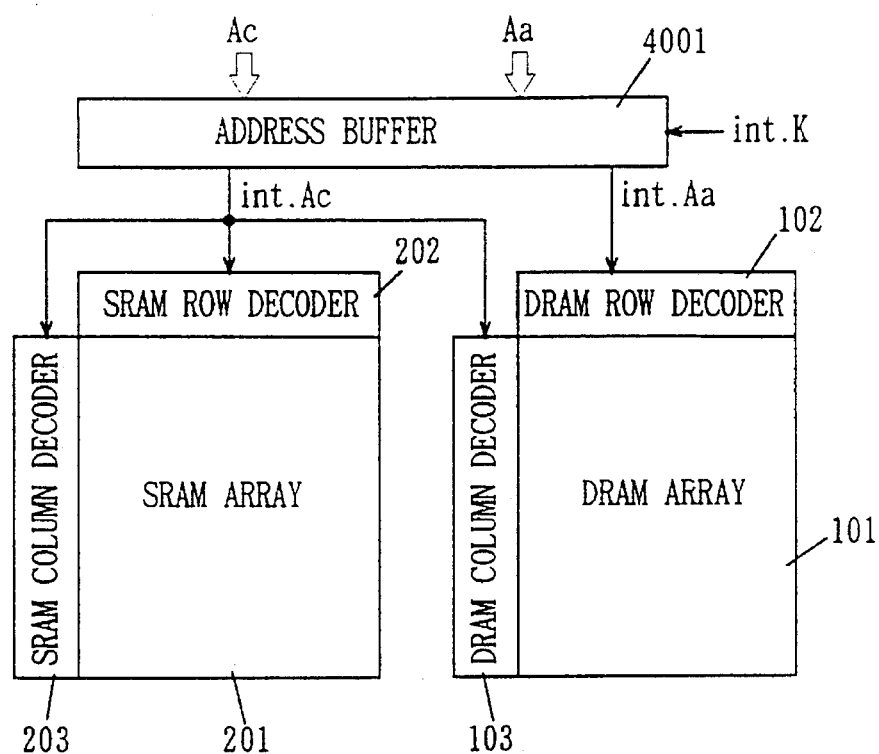
FIGS. 176 through 185 represent common usage of DRAM column address and SRAM row address.

FIG. 176 shows another example of the manner of allotting addresses in the semiconductor memory device shown in FIG. 32 or FIG. 105.

Figure 177:
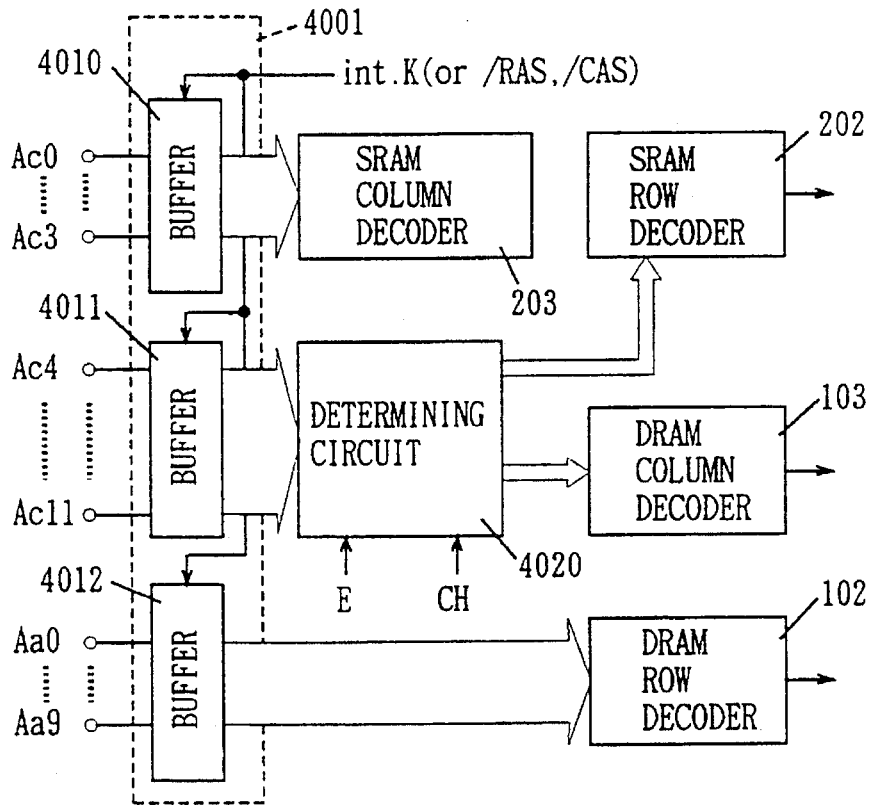

FIG. 177 shows connection between the address buffer circuit and the address decoder in accordance with the array allotting method shown in FIG. 176.

Figure 178:
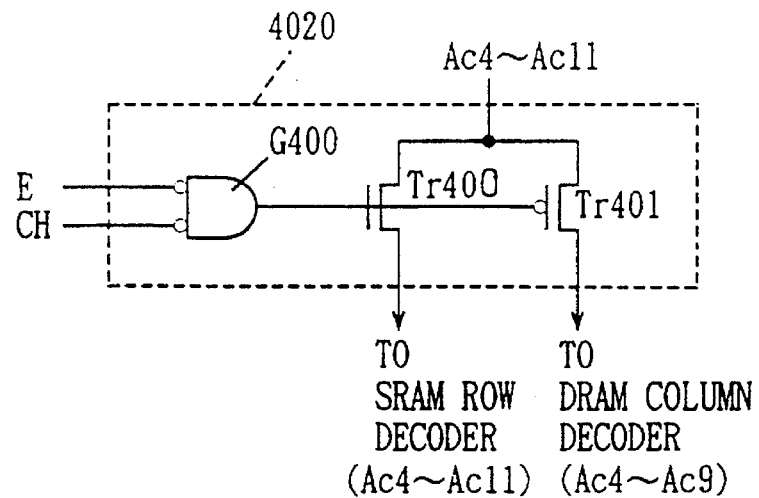

FIG. 178 shows an example of a specific structure of a determining circuit shown in FIG. 177.

Figure 179:
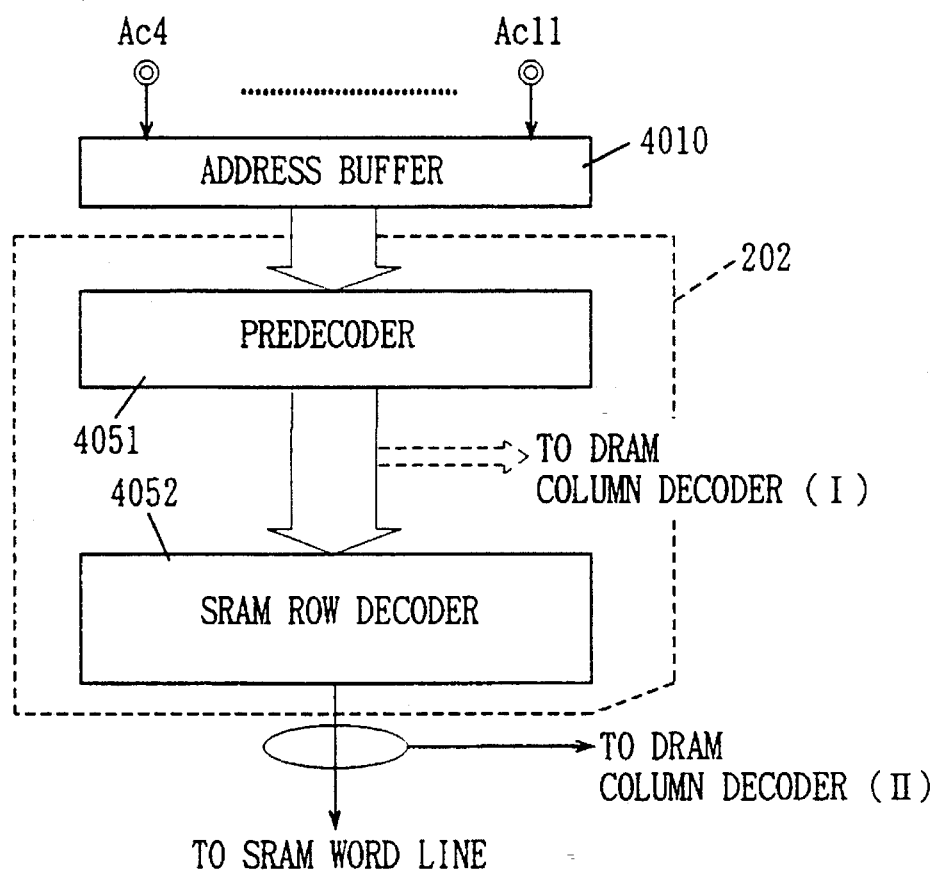

FIG. 179 shows, as an example, positions of dividing address signal lines in accordance with the address allotting method shown in FIG. 176.

Figure 180:
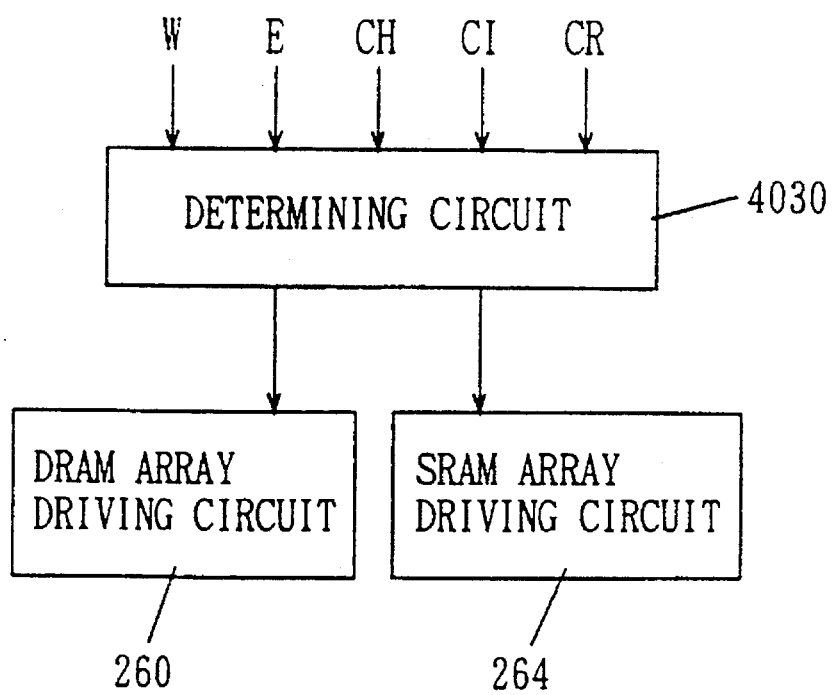

FIG. 180 shows another example of the structure for realizing the address allotting method shown in FIG. 176.

Figure 181:
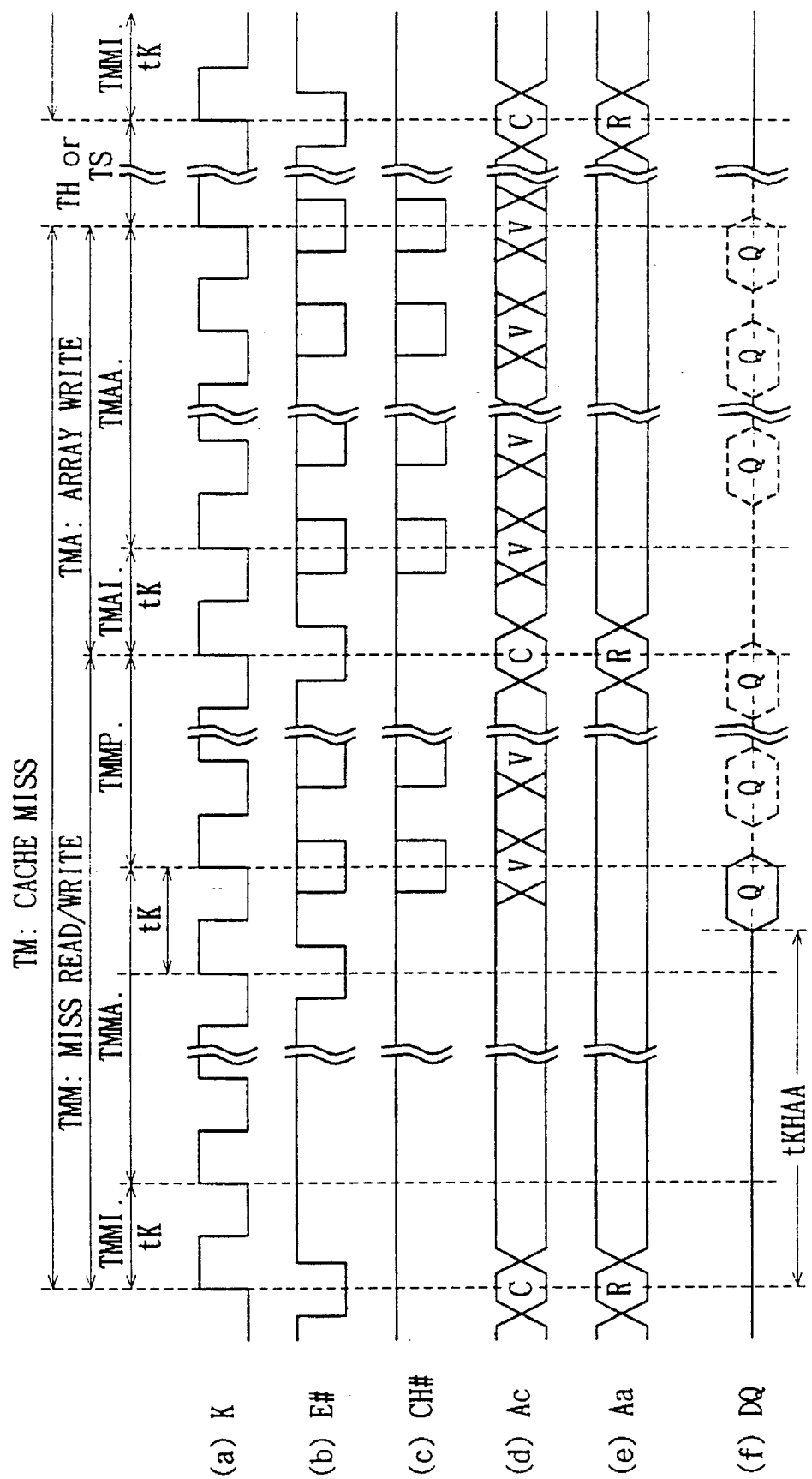

FIG. 181 is a diagram of signal waveforms showing the operation of the semiconductor memory device in accordance with the address allotting method shown in FIG. 176.

Figure 182:
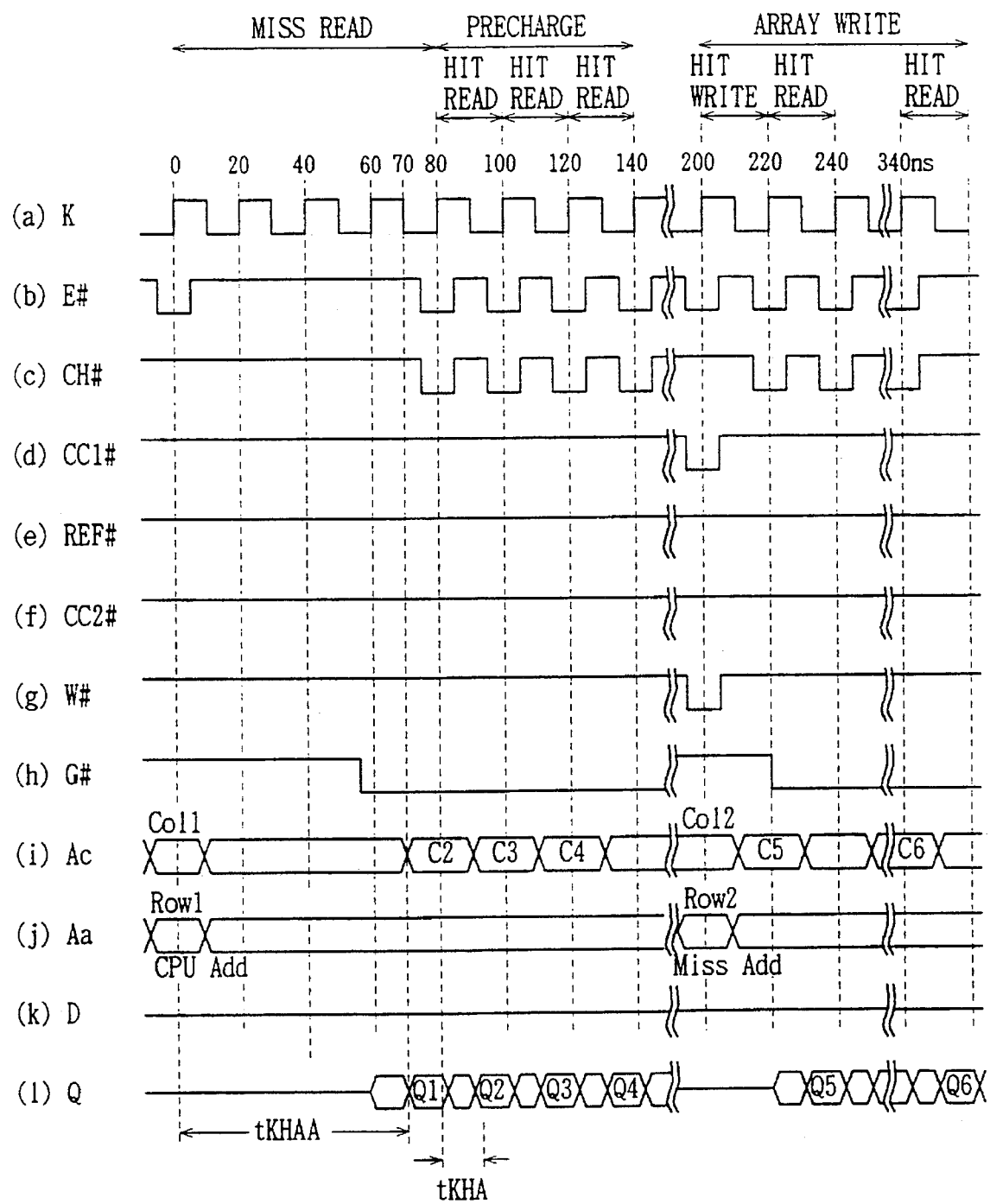

FIG. 182 shows timings of operations of the semiconductor memory device in accordance with the address allottance shown in FIG. 176.

Figure 183:
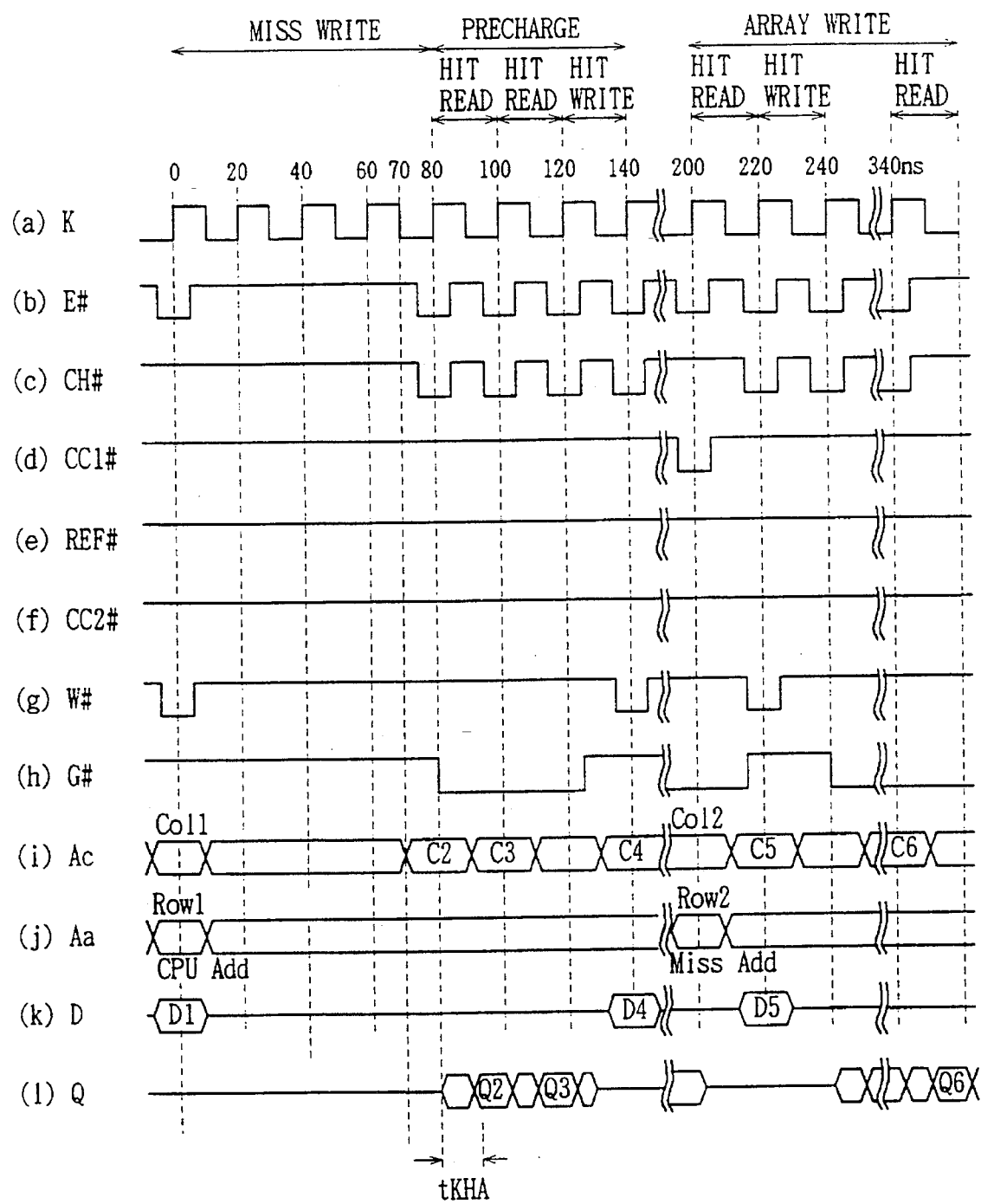

FIG. 183 shows, as an example, an operation of the semiconductor memory device in accordance with the address allotting method shown in FIG. 176.

Figure 184:
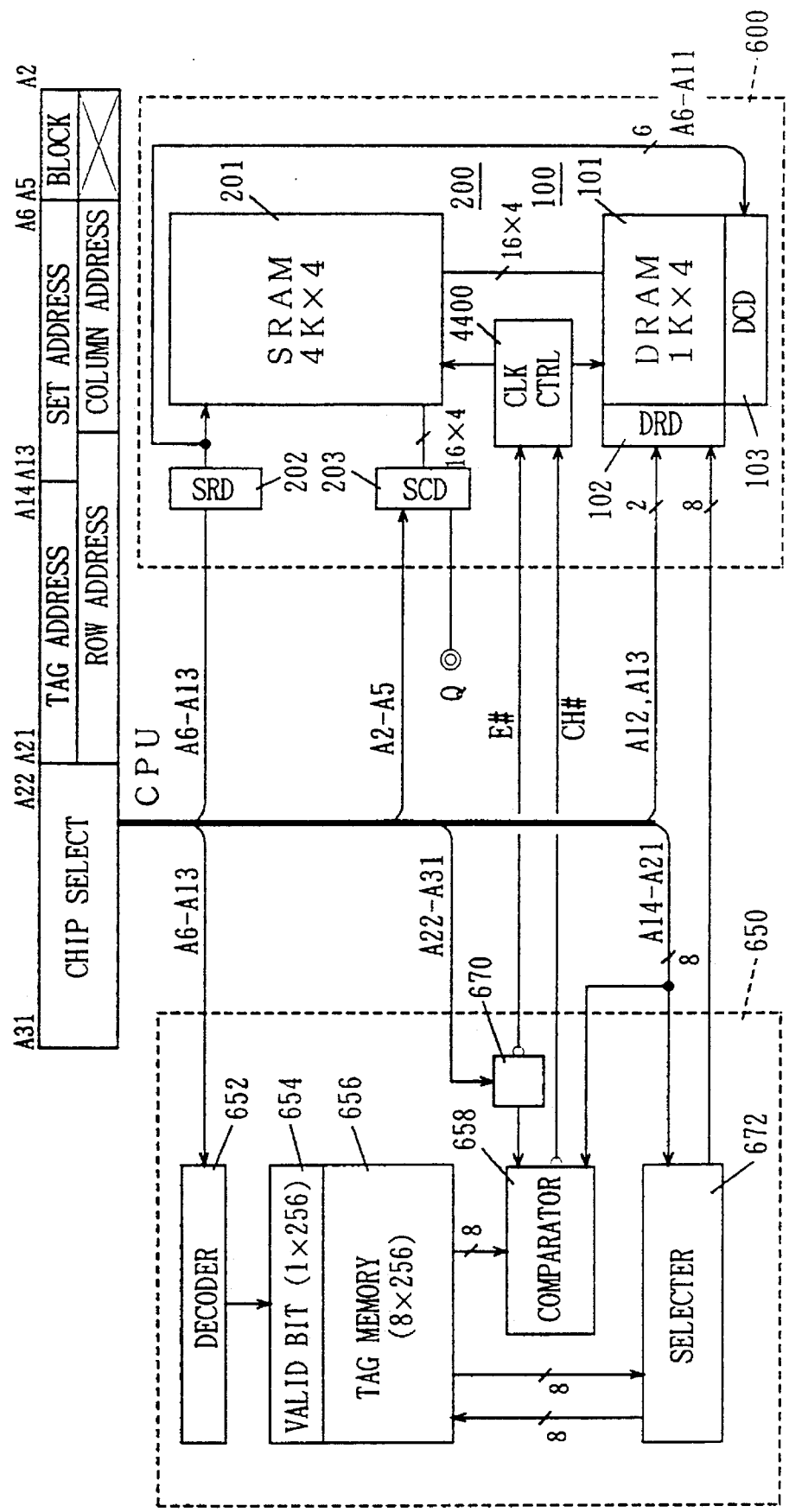

FIG. 184 shows, as an example, the manner of connection between an external CPU and the semiconductor memory device shown in FIG. 176.

Figure 185:
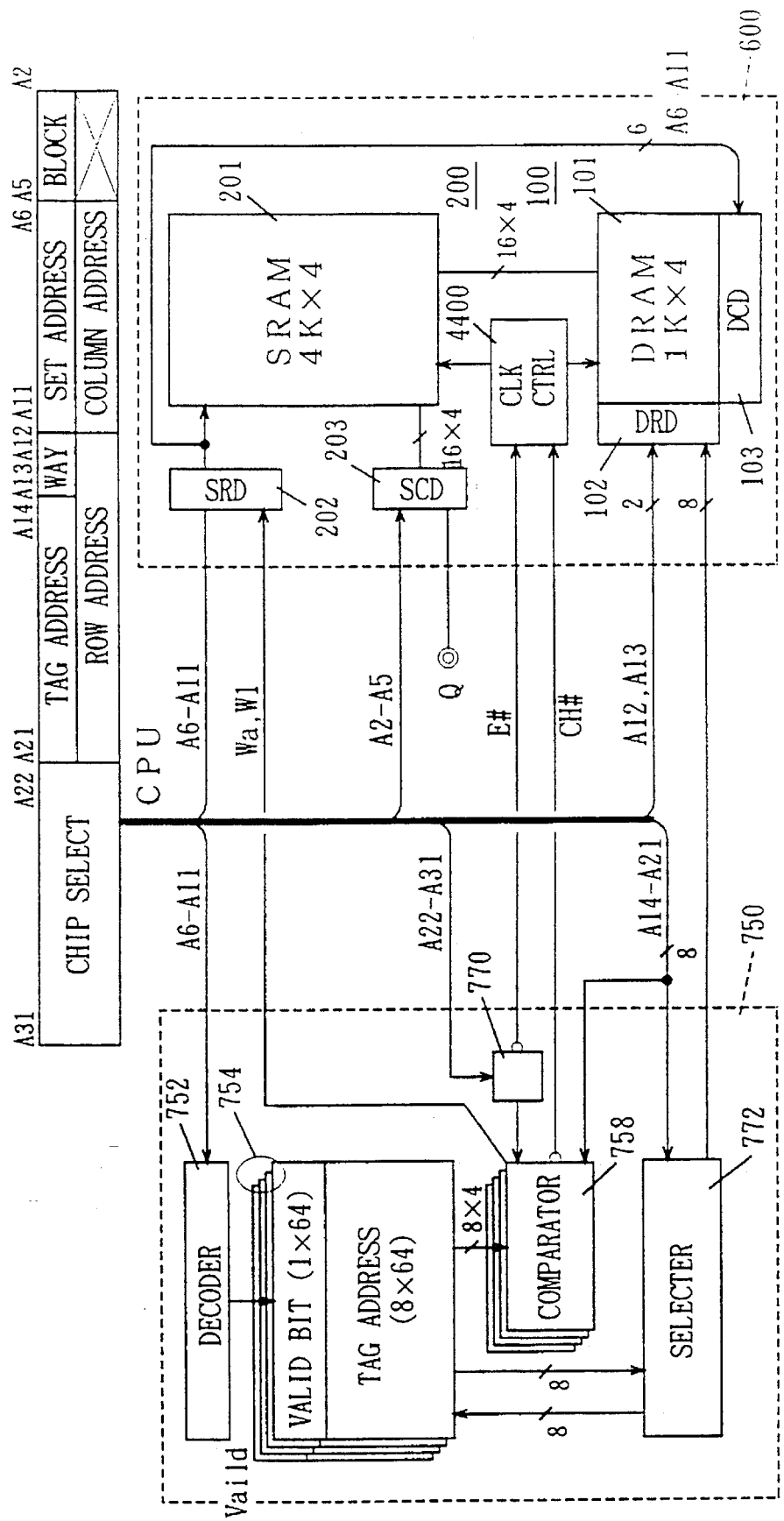

FIG. 185 shows, as an example, the manner of connection between an external CPU and the semiconductor memory device in accordance with the address allotting method shown in FIG. 176.

Figure 186:
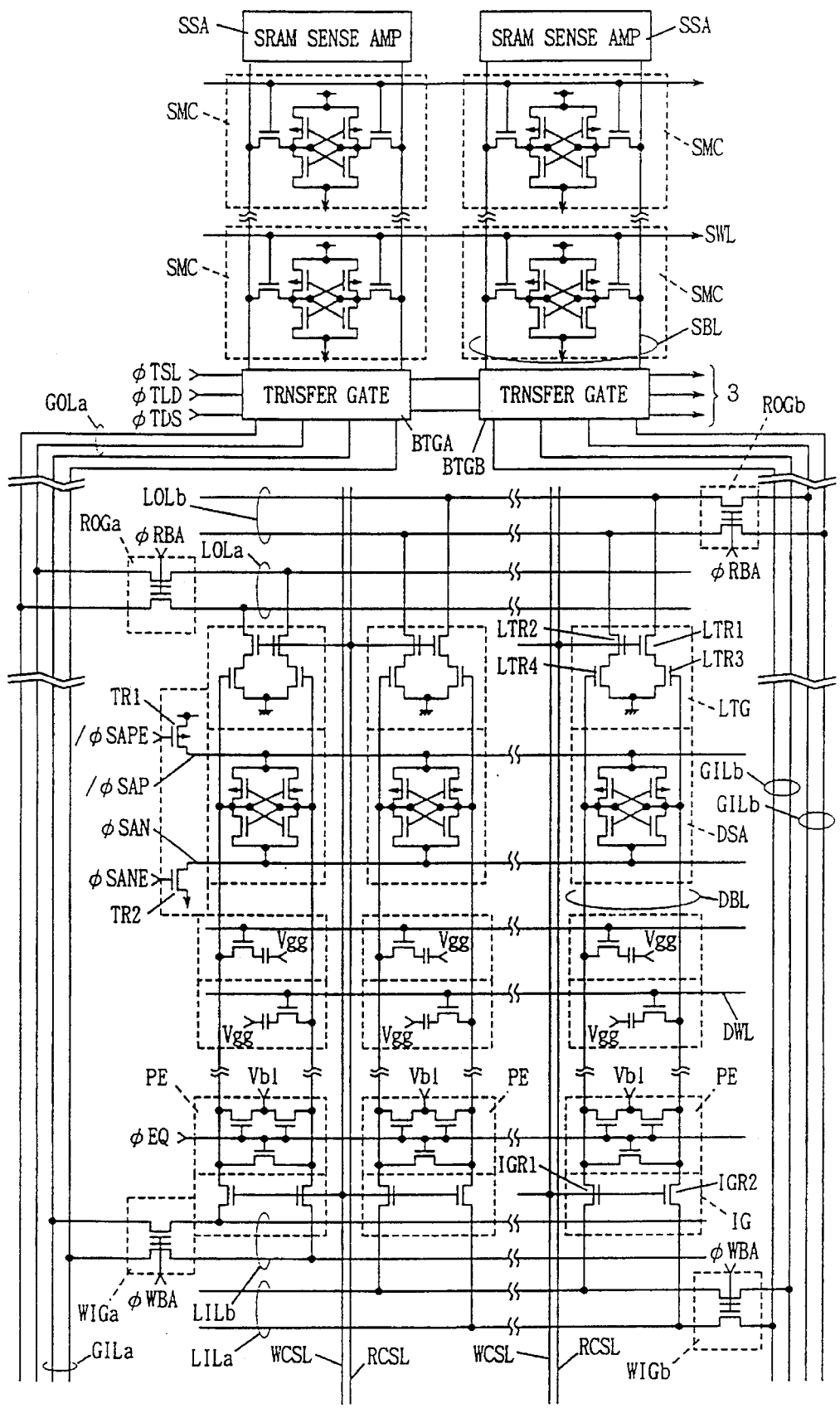
FIGS. 186 through 193 represent separated I/O structure type DRAM array of another CDRAM.

FIG. 186 shows another example of the structure of the DRAM array.

Figure 187:
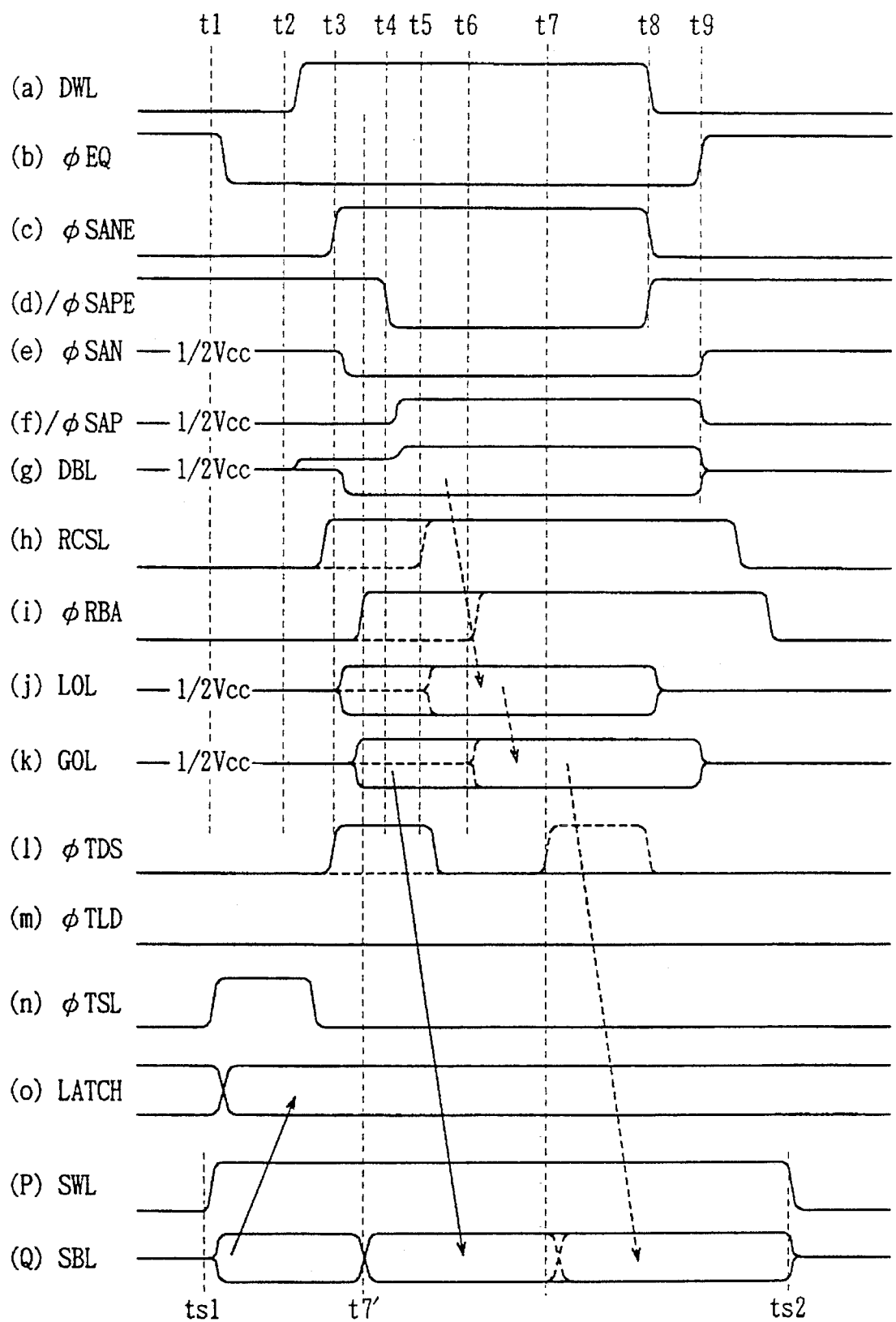

FIG. 187 is a diagram of signal waveforms showing data transfer operation from the DRAM array to the SRAM array in the memory array and transfer gate structure shown in FIG. 186.

Figure 188:
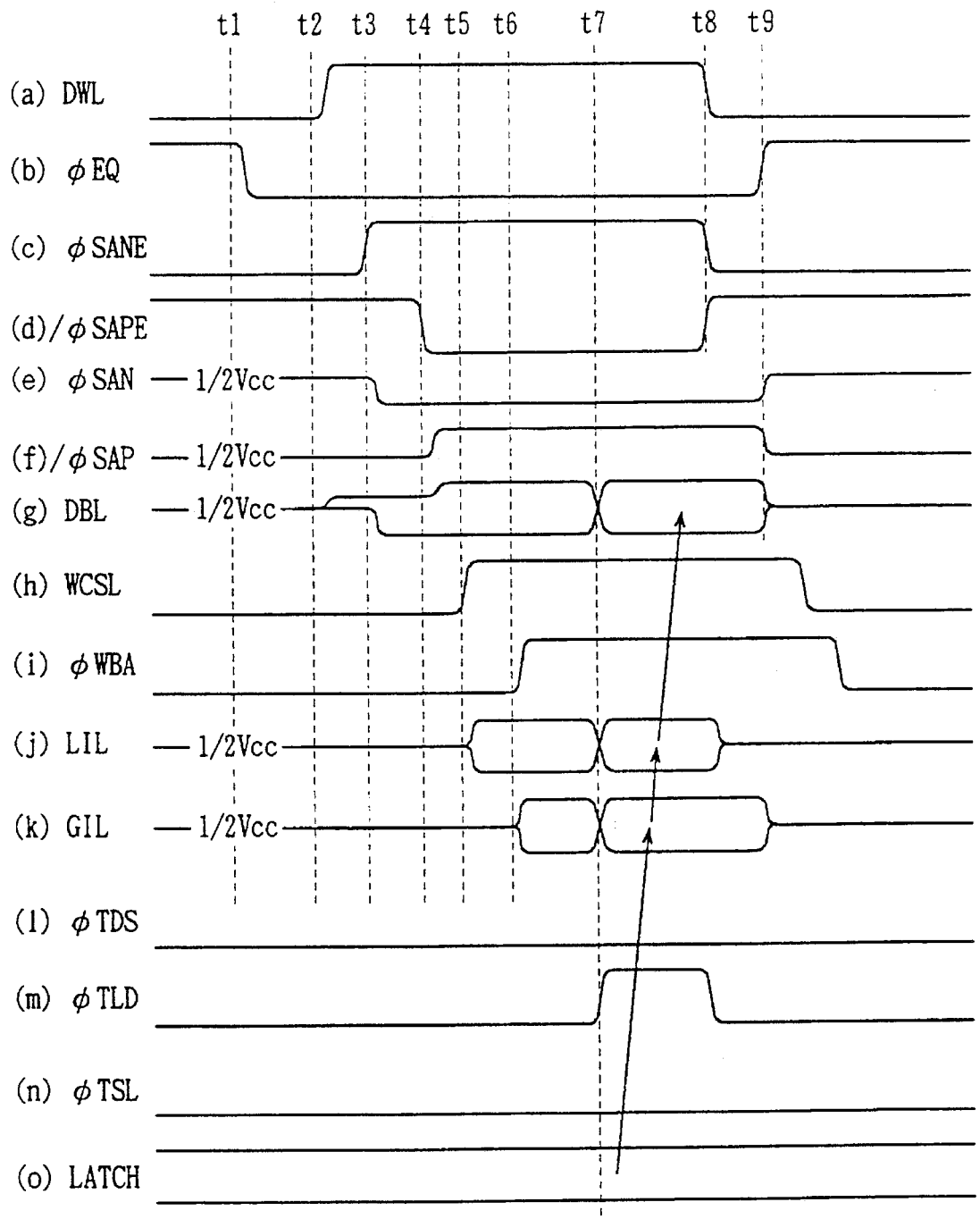

FIG. 188 is a diagram of signal waveforms showing data transfer operation from the SRAM array to the DRAM array in the structure shown in FIG. 186.

Figure 189:
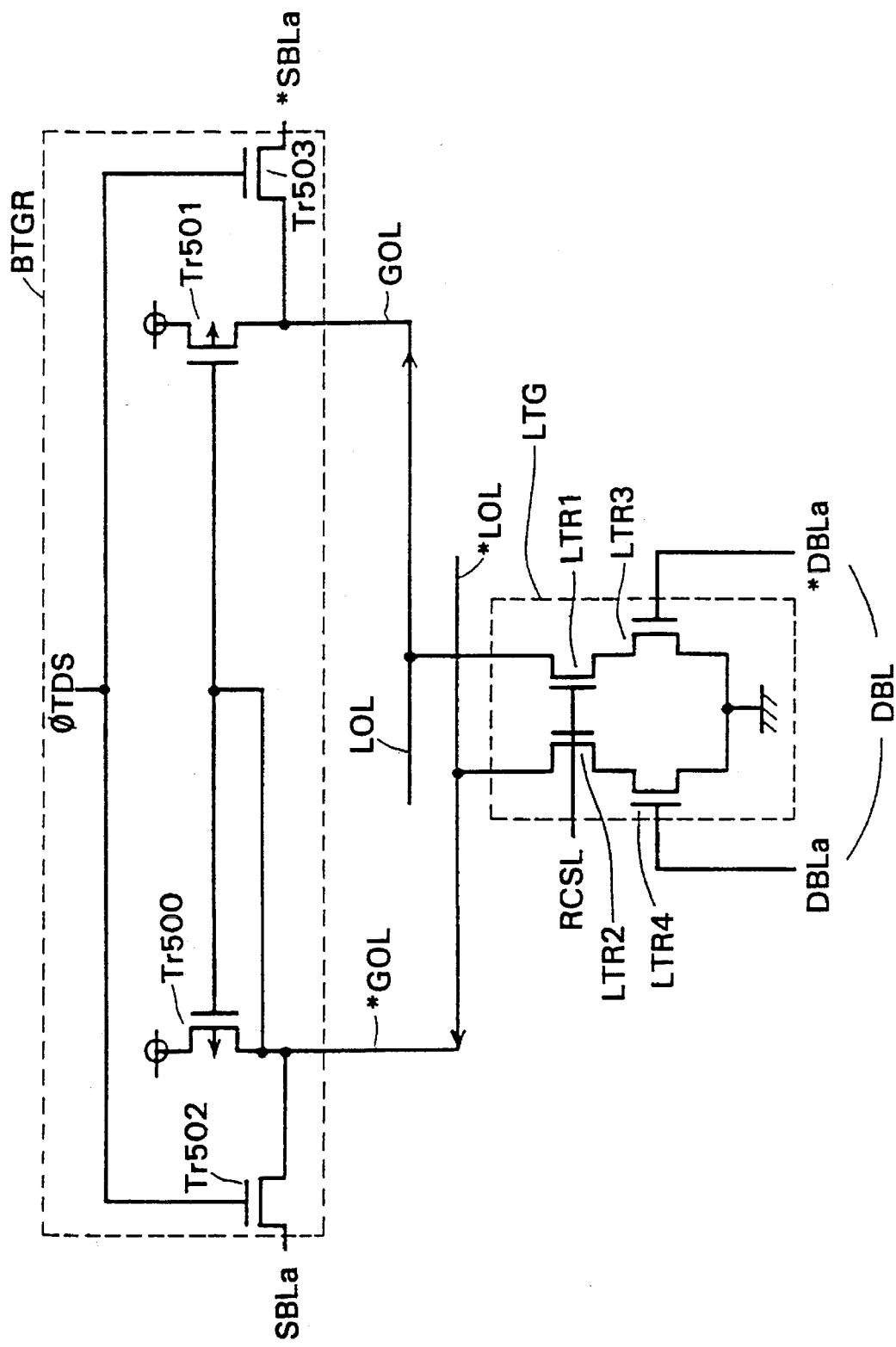

FIG. 189 shows data transferring portion from the DRAM array to the SRAM array of the transfer gate shown in FIG. 186.

Figure 190:
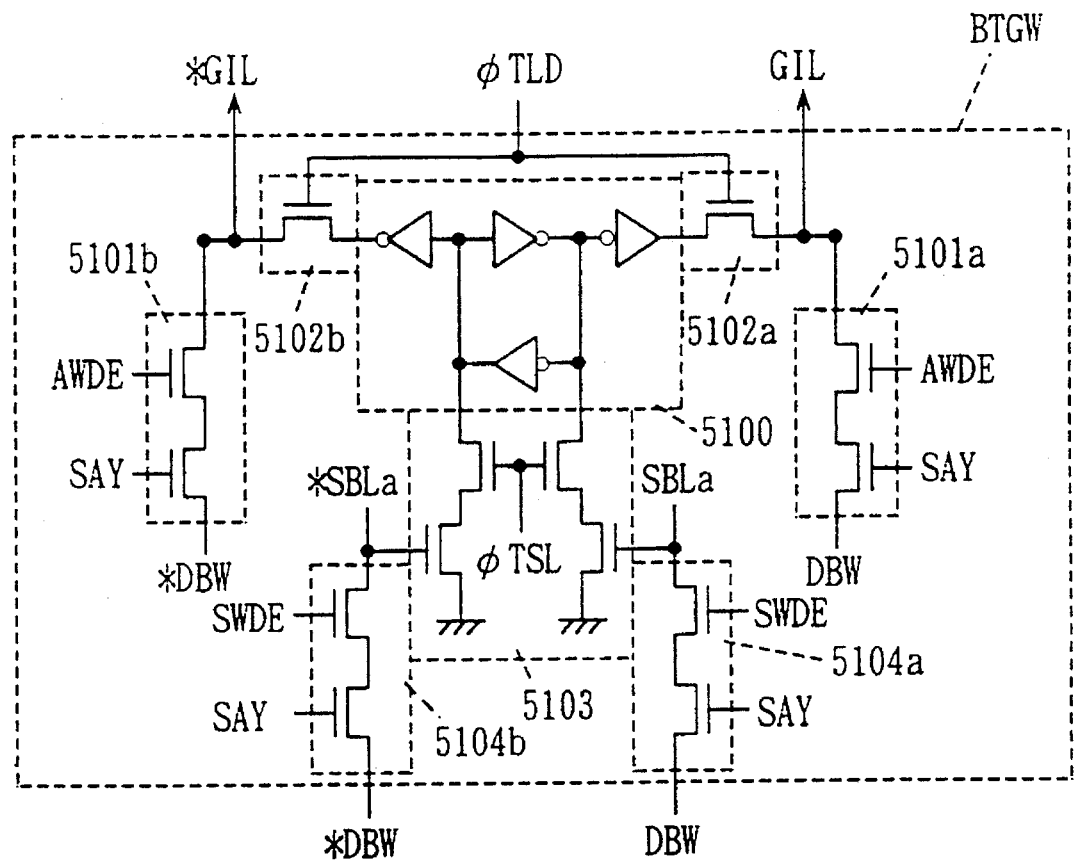

FIG. 190 shows a circuit structure for transferring data from the SRAM array to the DRAM array of the transfer gate shown in FIG. 186.

Figure 191:
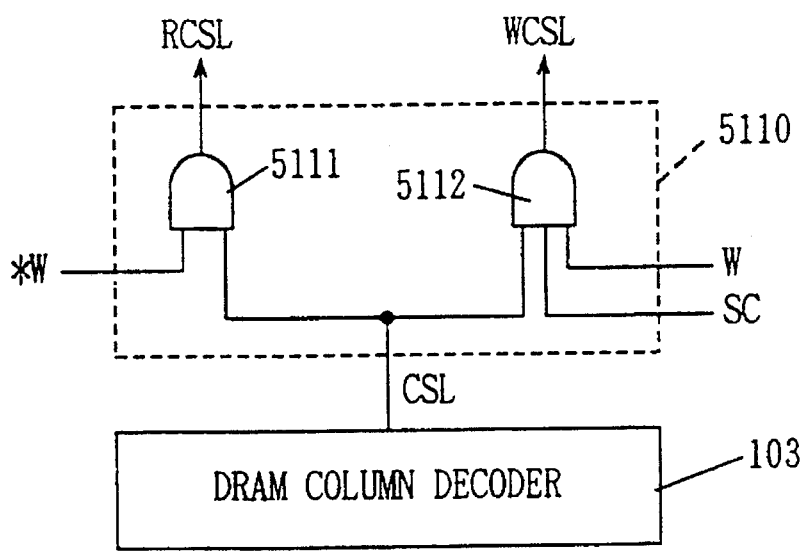

FIG. 191 shows a circuit structure for generating a signal for driving a column selecting line in FIG. 186.

Figure 192:
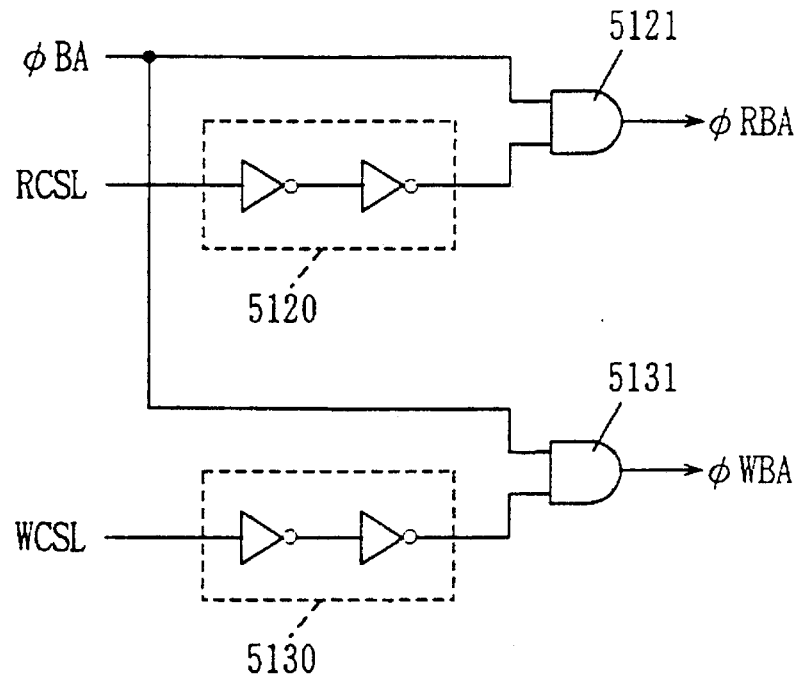

FIG. 192 shows a circuit structure for generating a block selecting signal shown in FIG. 186.

Figure 193:
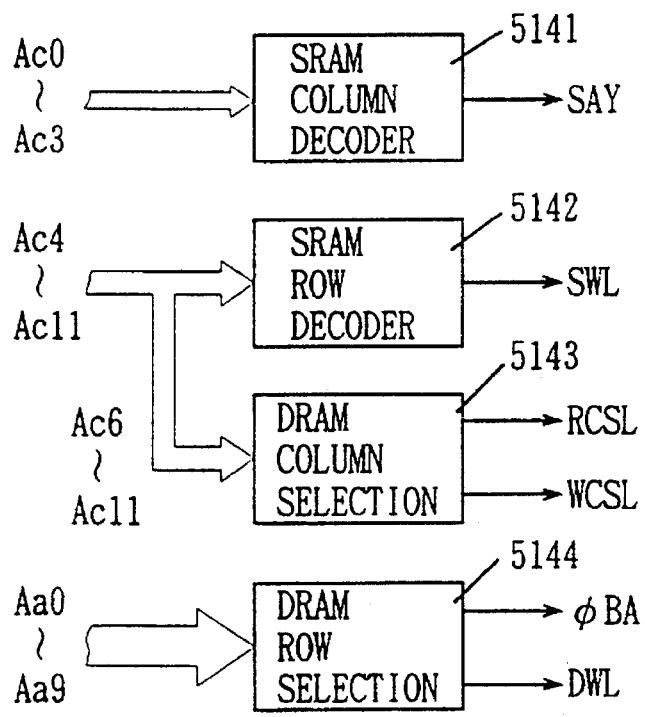

FIG. 193 shows, as an example, an array allotting method for effectively driving the array structure shown in FIG. 186.

Figure 194:
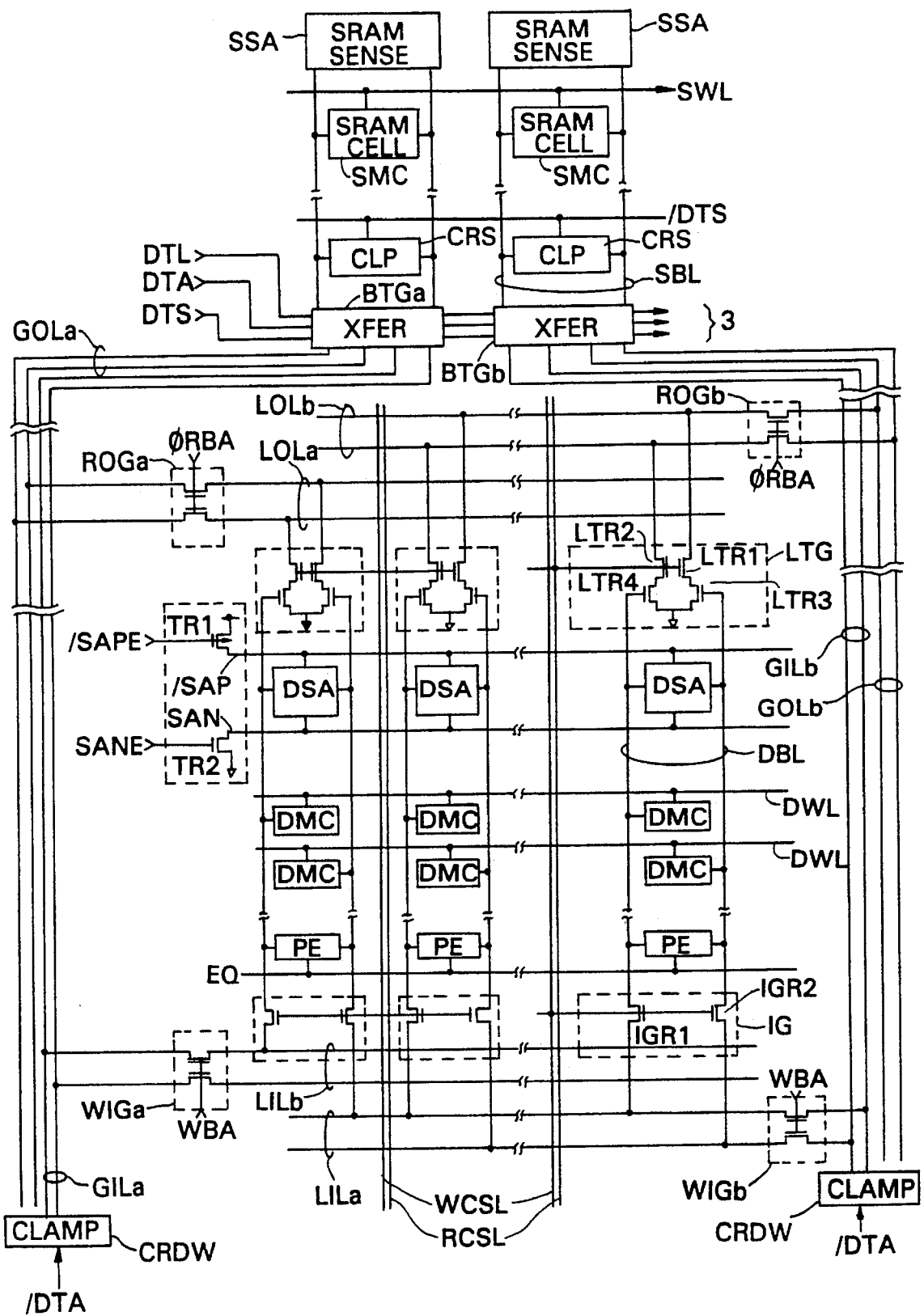
FIGS. 194 through 196 represent modified separated IO array architecture CDRAM for fast data transfer by means of clamping circuitry.

FIG. 194 shows a modified separated IO DRAM array arrangement of CDRAM with clamping circuitry.

Figure 195:
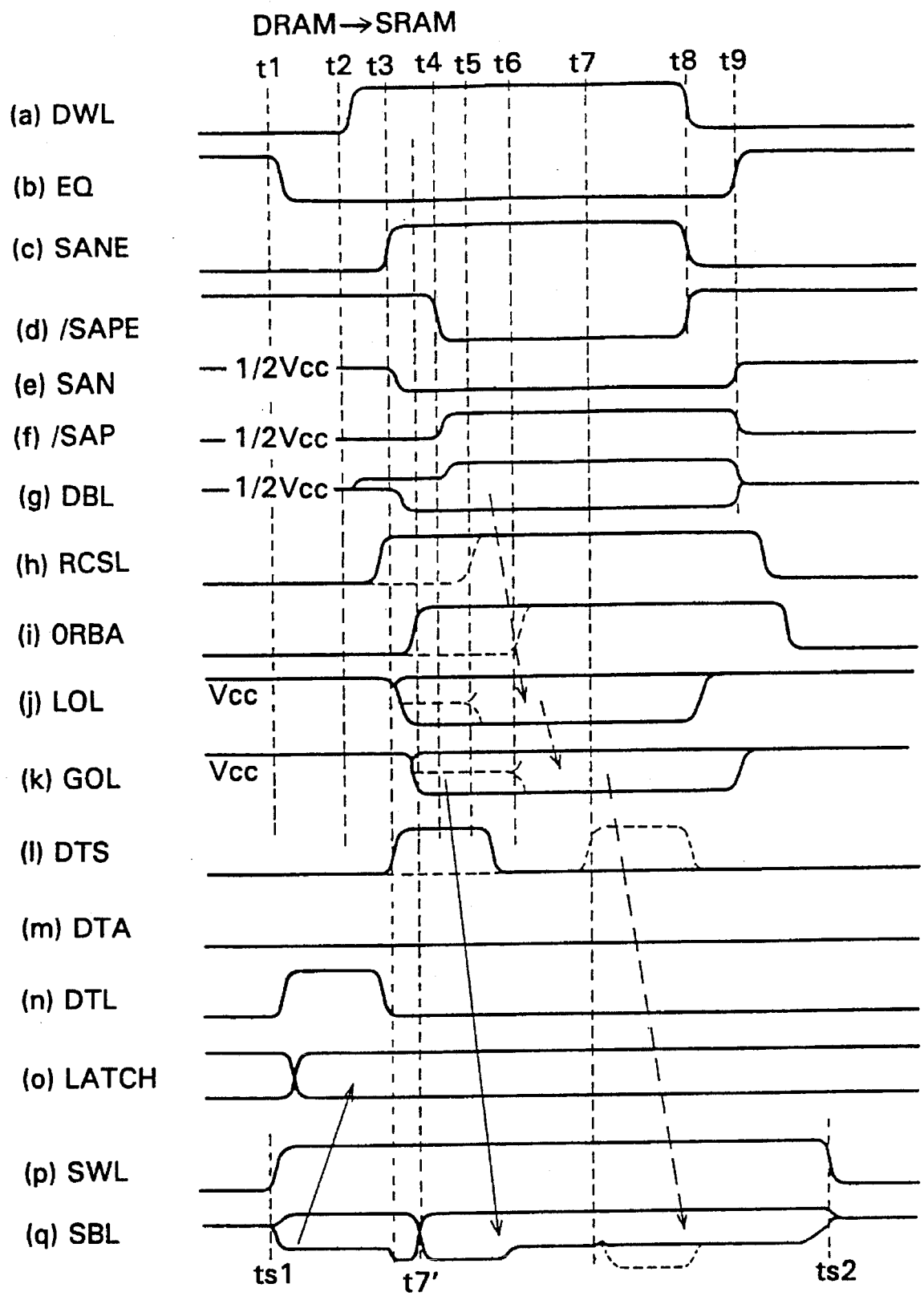

FIG. 195 is a waveform diagram showing data transfer from DRAM to SRAM in CDRAM of FIG. 194.

Figure 196:
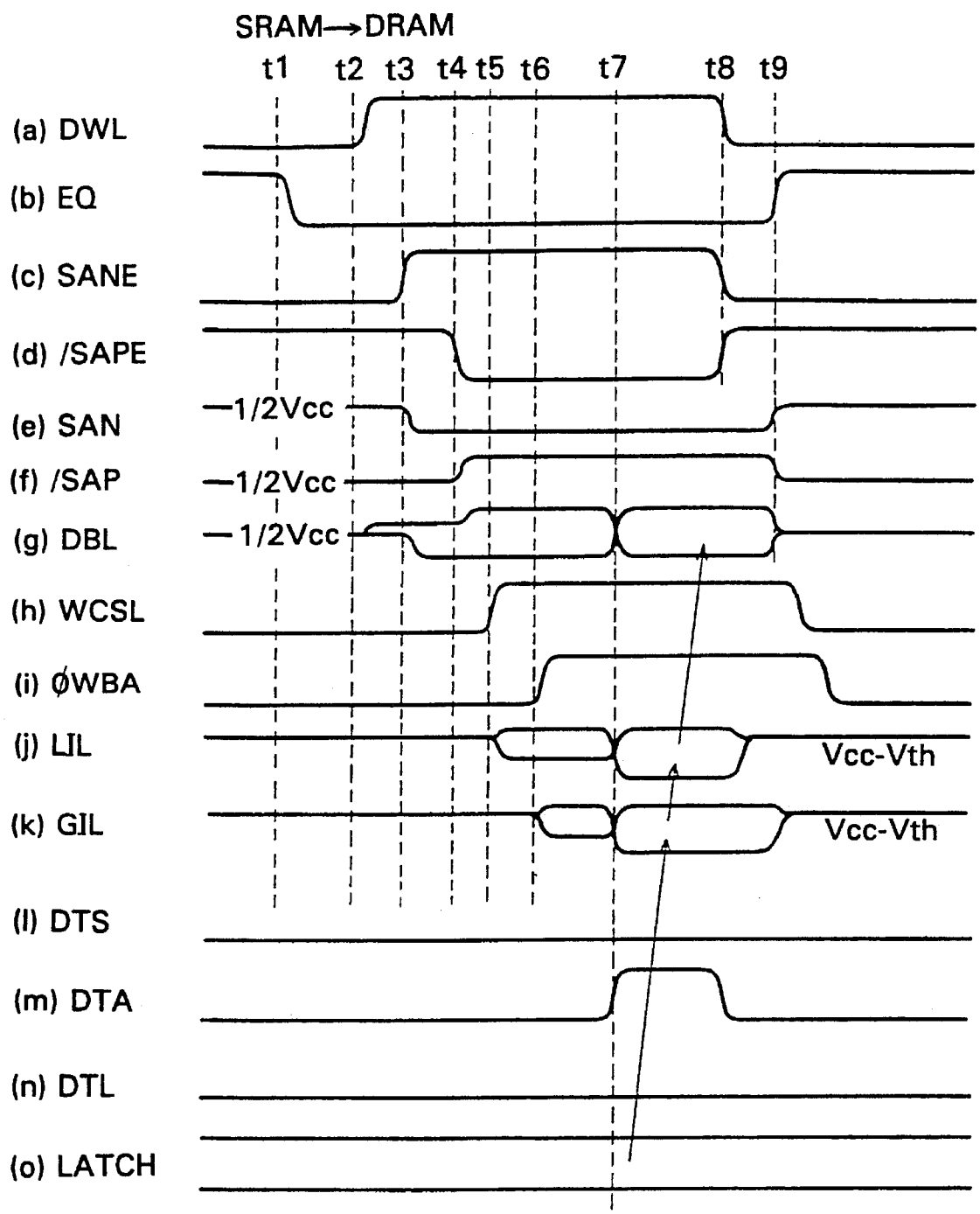

FIG. 196 is a waveform diagram showing data transfer from SRAM (or the latch) to DRAM in CDRAM of FIG. 194.

Figure 197:
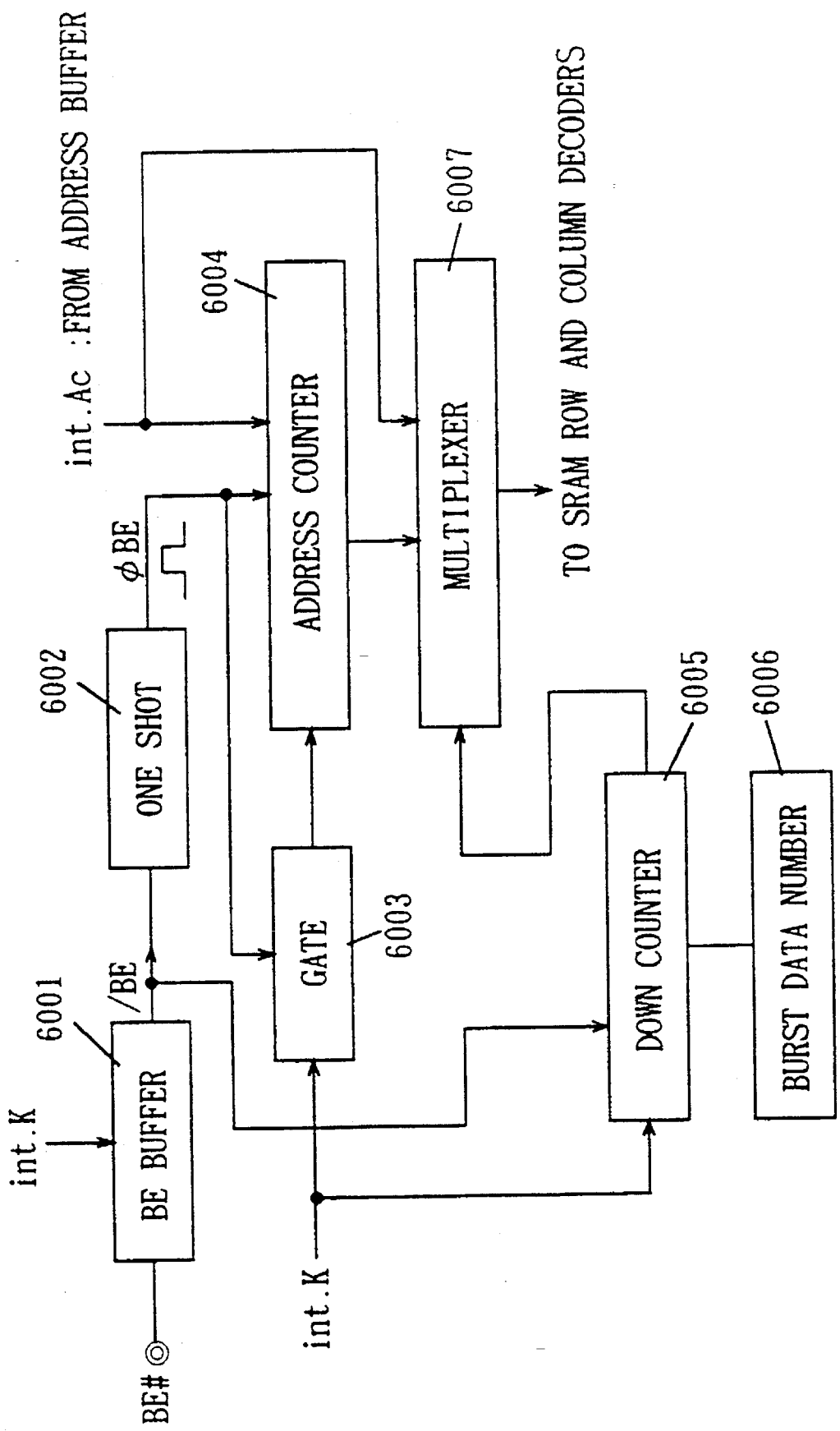
FIGS. 197 through 201 represent burst mode operation in CDRAM's of the present invention.

FIG. 197 shows a circuit structure for realizing data transfer in the burst mode.

Figure 198:
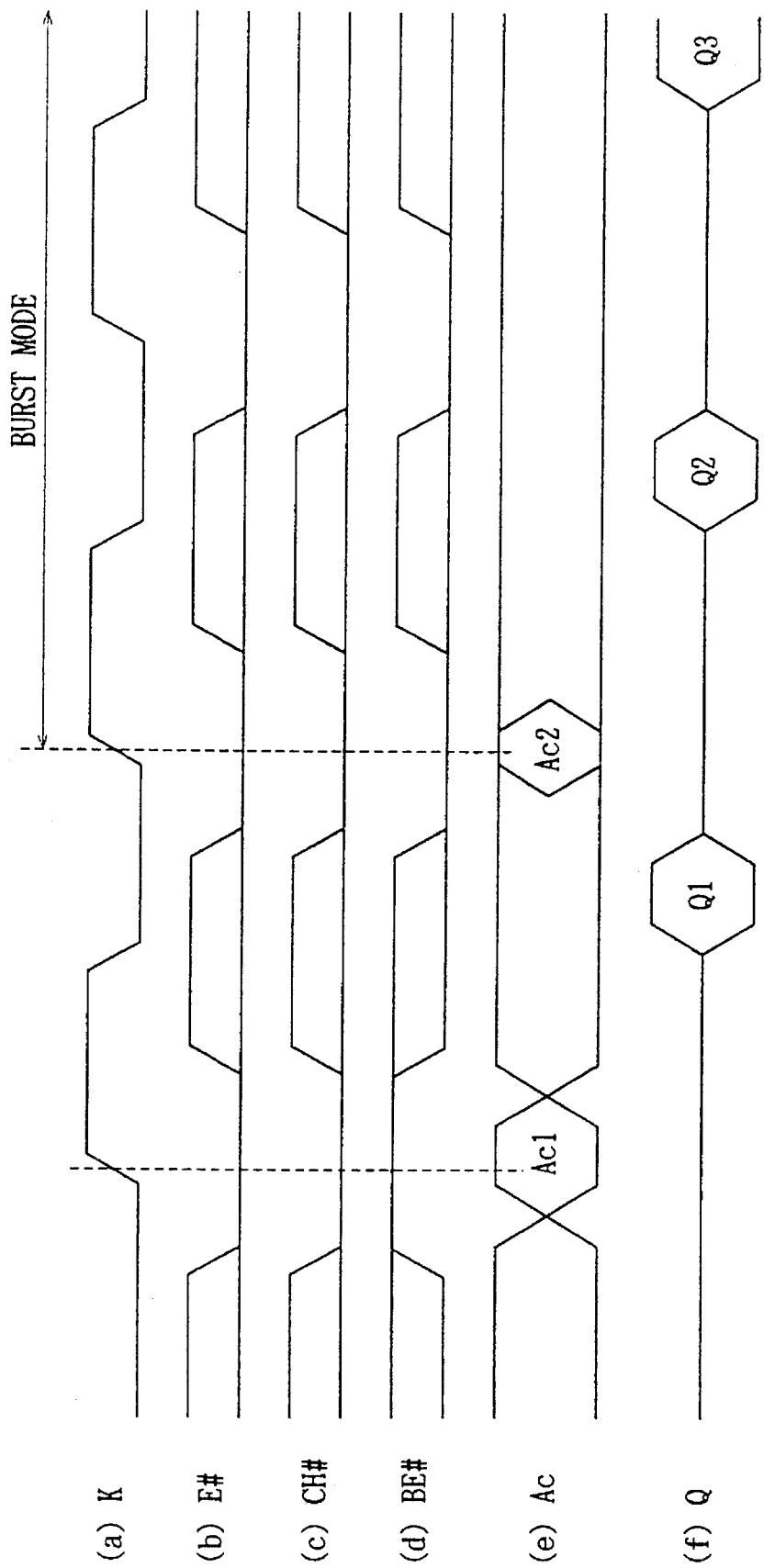

FIG. 198 is a diagram of signal waveforms showing the operation of the circuit shown in FIG. 197.

Figure 199:
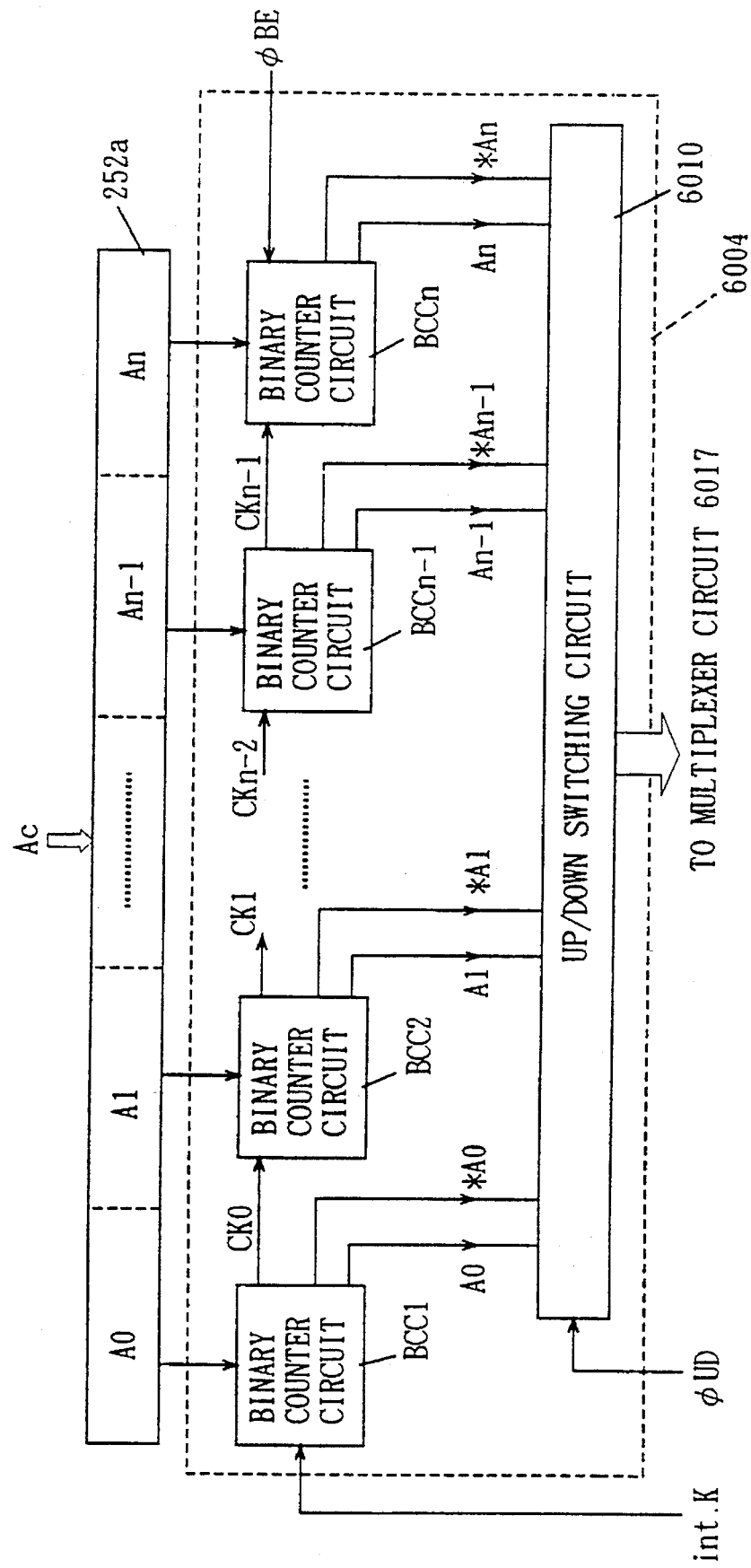

FIG. 199 shows an example of a specific structure of the address counter shown in FIG. 197.

Figure 200:
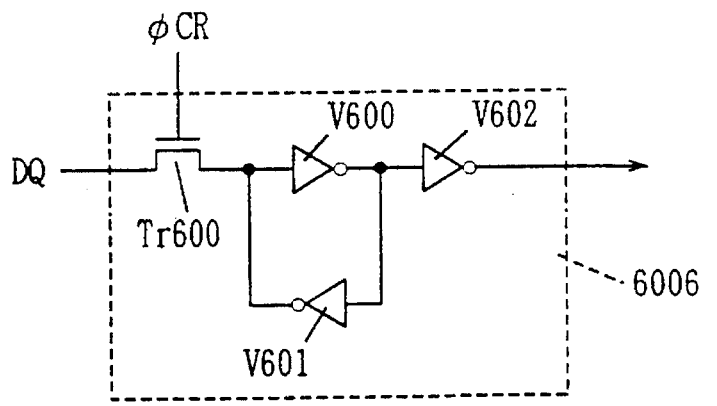

FIG. 200 shows an example of a specific structure of a burst data number storing circuit shown in FIG. 197.

Figure 201:
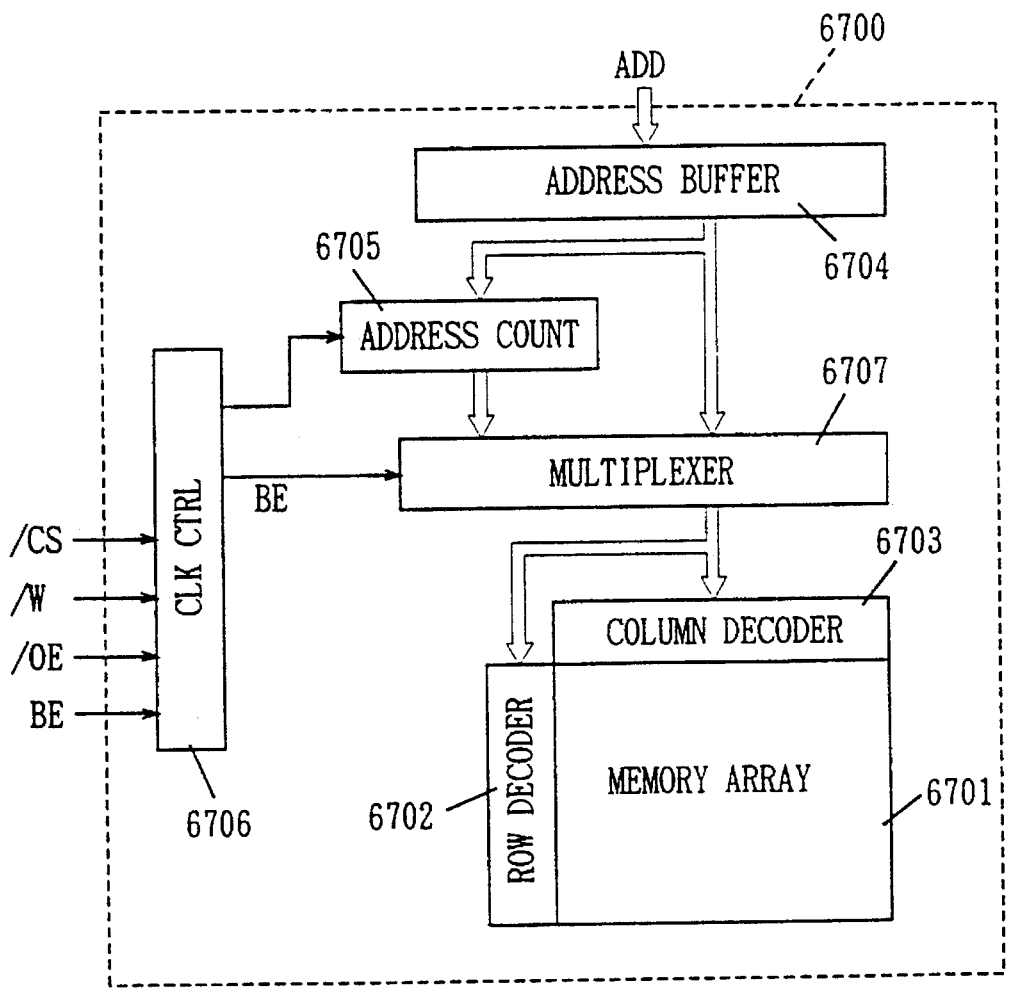

FIG. 201 shows a structure for driving a common semiconductor memory device in the burst mode.

Figure 202:
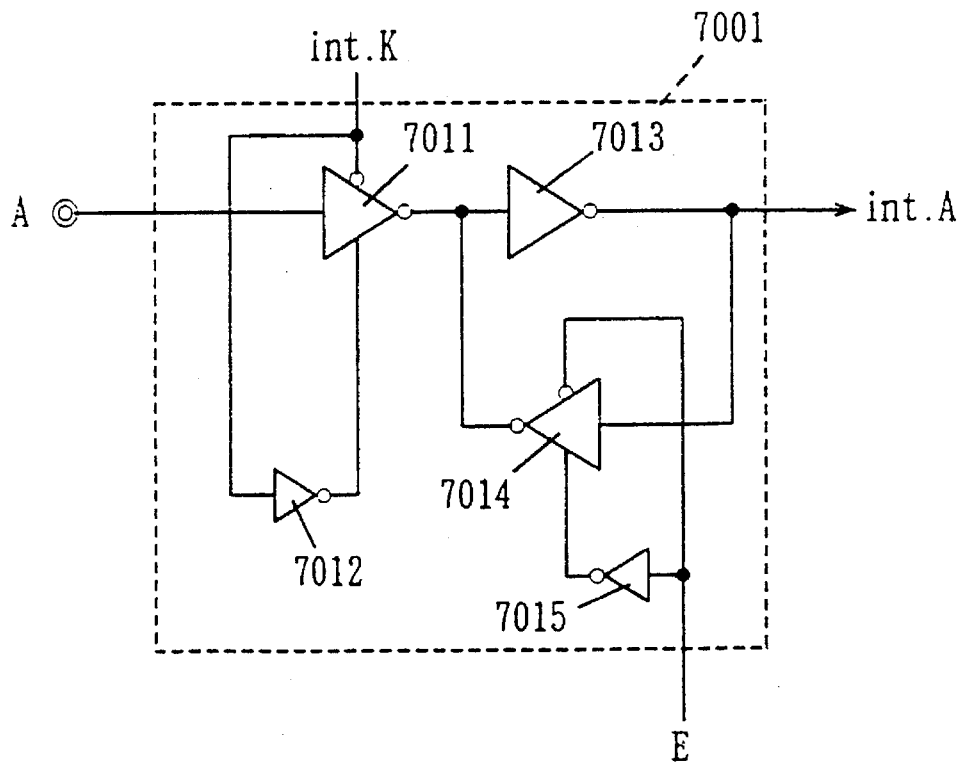
FIGS. 202 through 214 represent sleep mode operation in CDRAMs of the present invention.

FIG. 202 shows a specific structure of the address buffer of the semiconductor memory device shown in FIG. 32 or FIG. 105.

Figure 203:
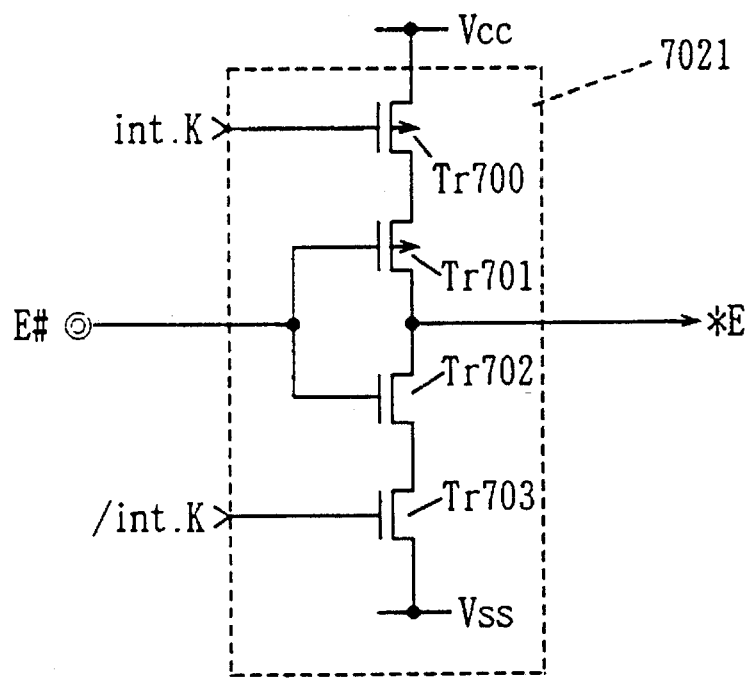

FIG. 203 shows an example of a specific structure of the control clock buffer shown in FIG. 32 or FIG. 105.

Figure 204:
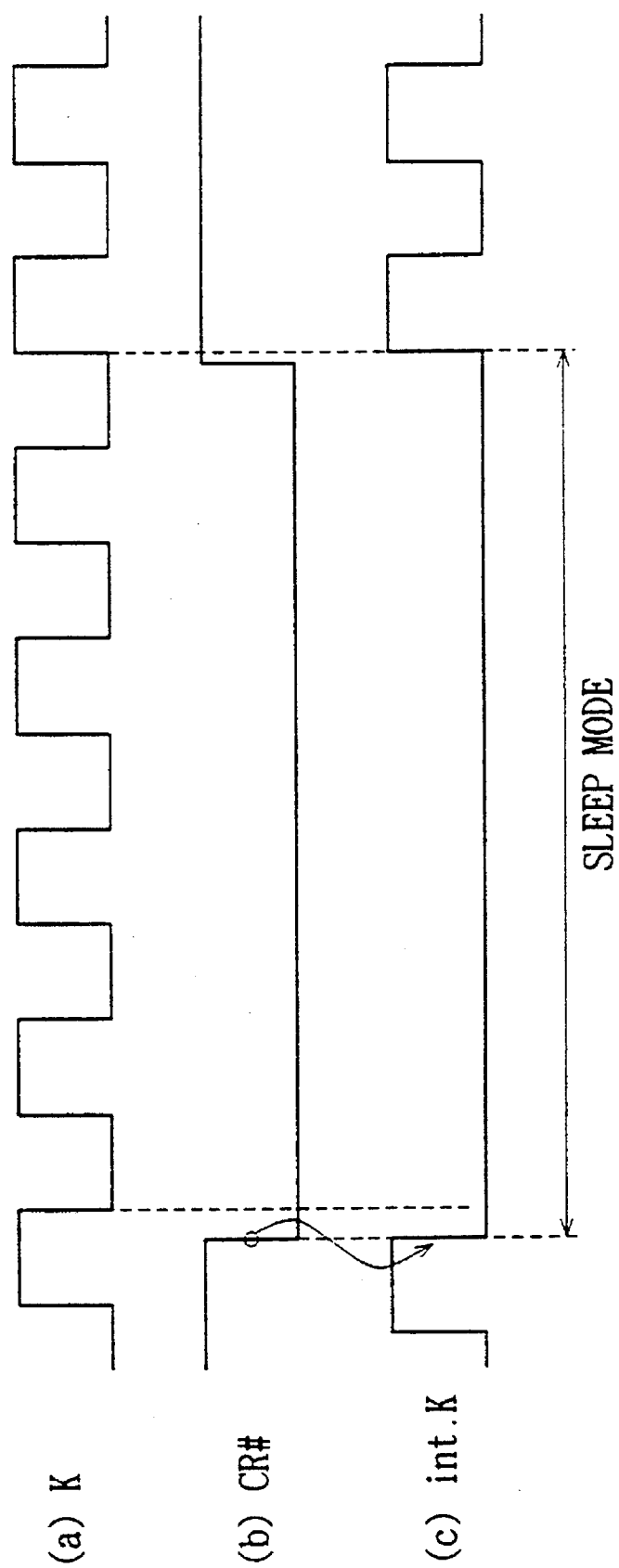

FIG. 204 is a diagram of signal waveforms showing an operation in a sleep mode.

Figure 205:
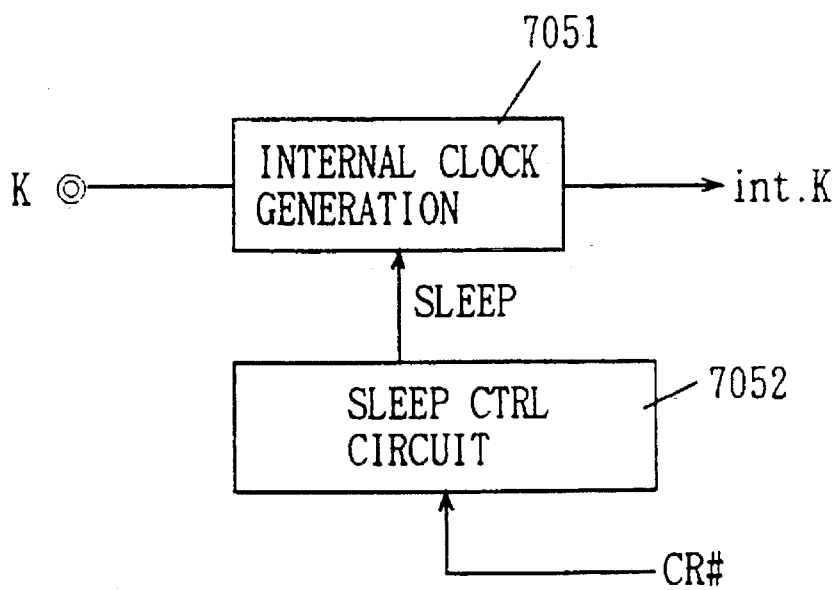

FIG. 205 is a block diagram showing a circuit structure for realizing the sleep mode.

Figure 206:
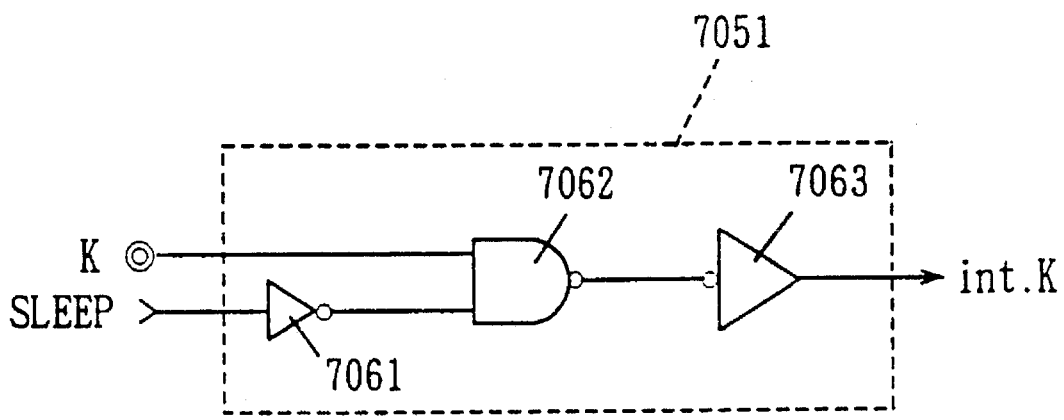

FIG. 206 shows an example of a specific structure of the internal clock generating circuit shown in FIG. 205.

Figure 207:
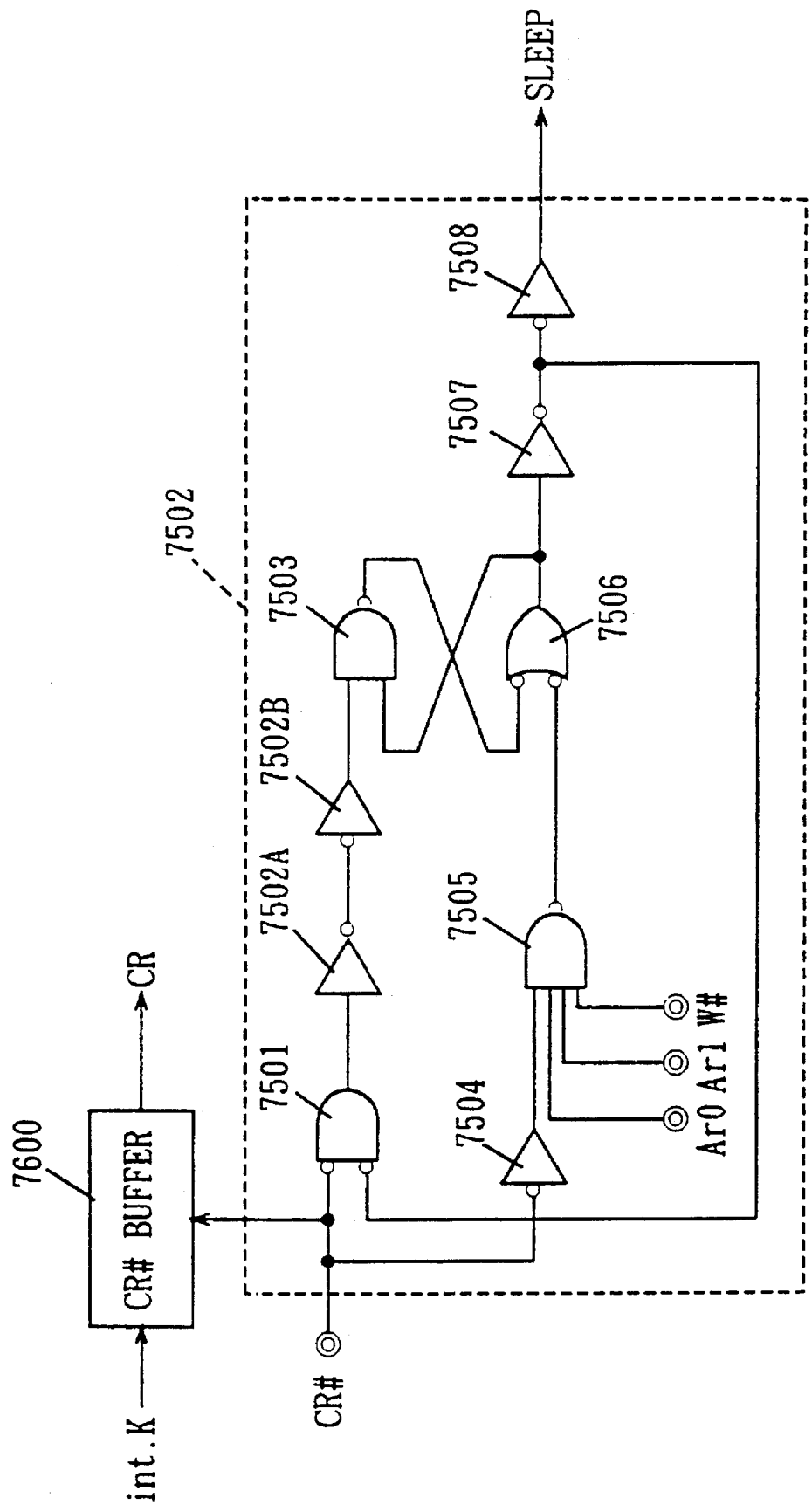

FIG. 207 shows an example of a specific structure of the sleep control circuit shown in FIG. 205.

Figure 208:
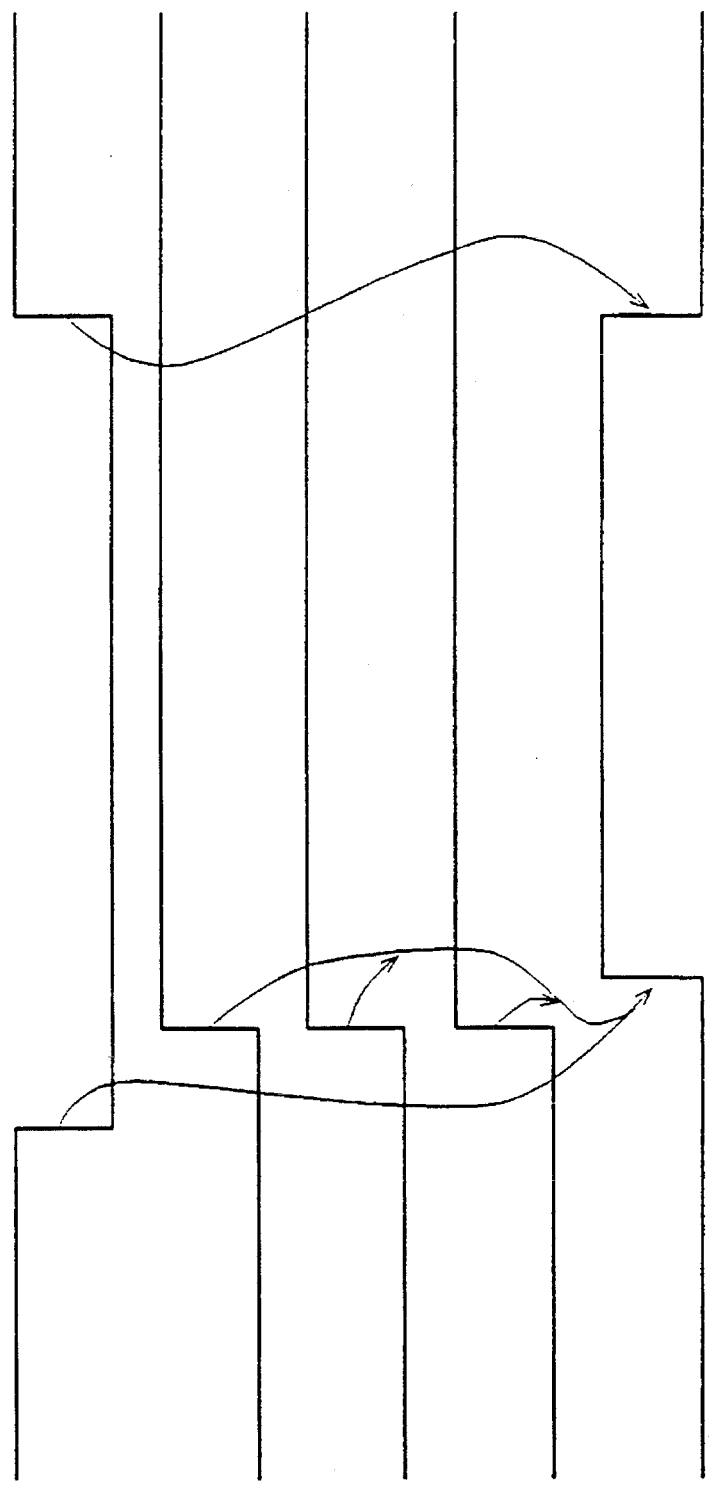

FIG. 208 is a diagram of signal waveforms showing the operation of the circuit shown in FIG. 207.

Figure 209:
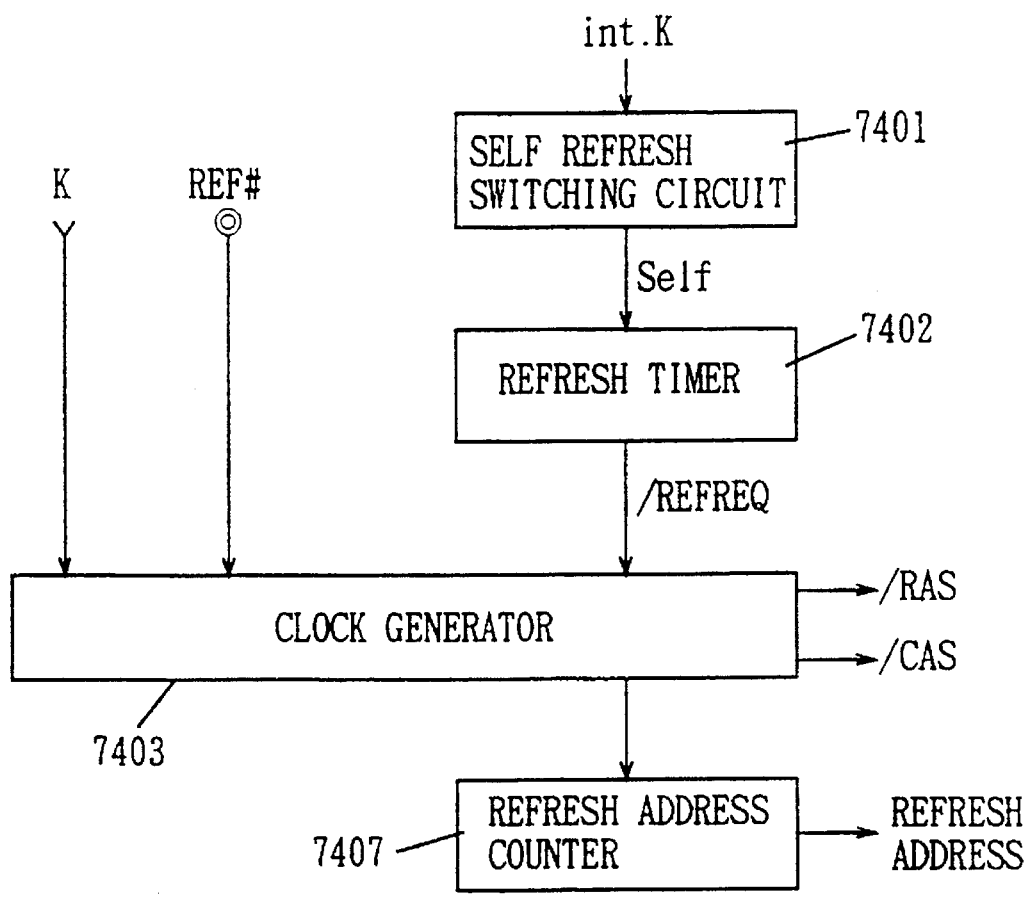

FIG. 209 shows a circuit structure for realizing self refreshing in the sleep mode.

Figure 210:
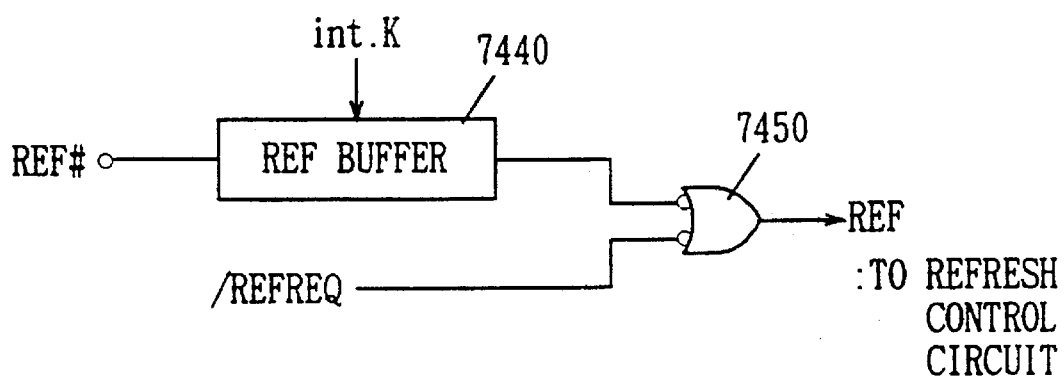

FIG. 210 shows a structure of portions related to a refresh requesting signal of the clock generator shown in FIG. 209.

Figure 211:
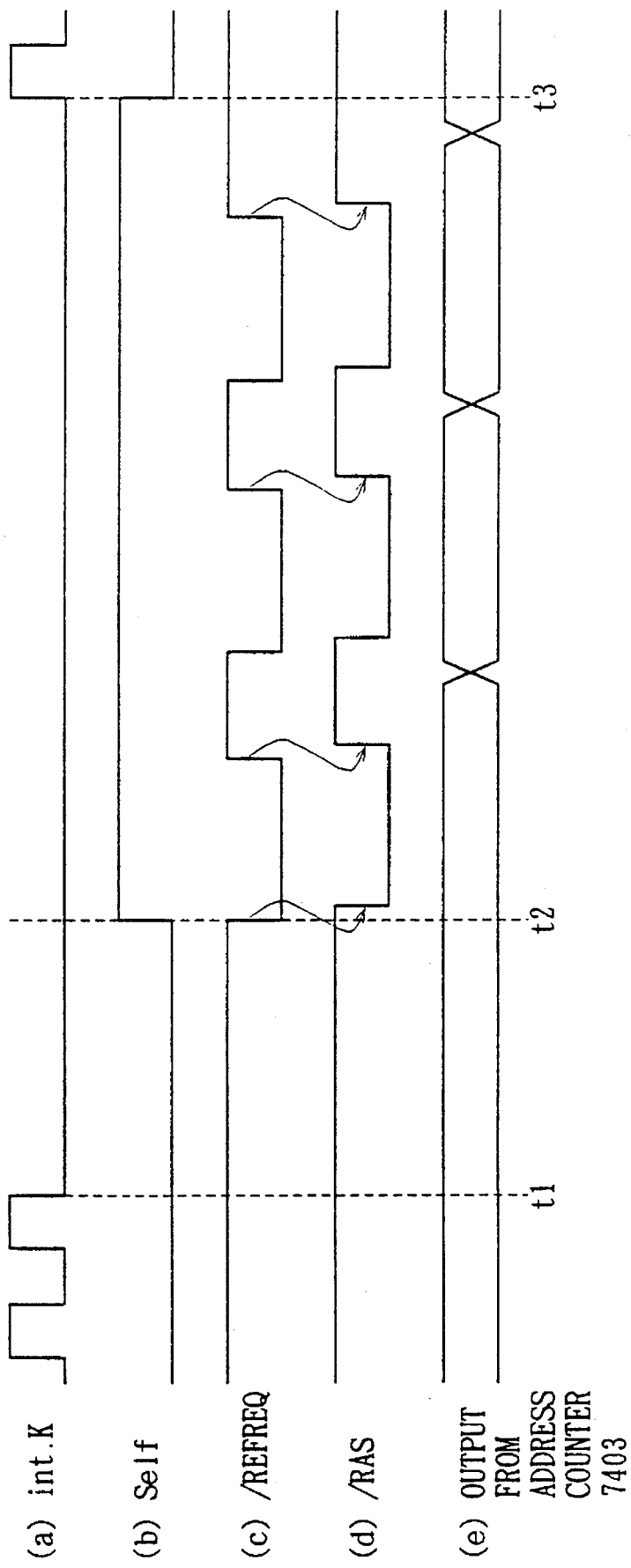

FIG. 211 is a diagram of signal waveforms showing the operation of the circuit shown in-FIG. 209.

Figure 212:
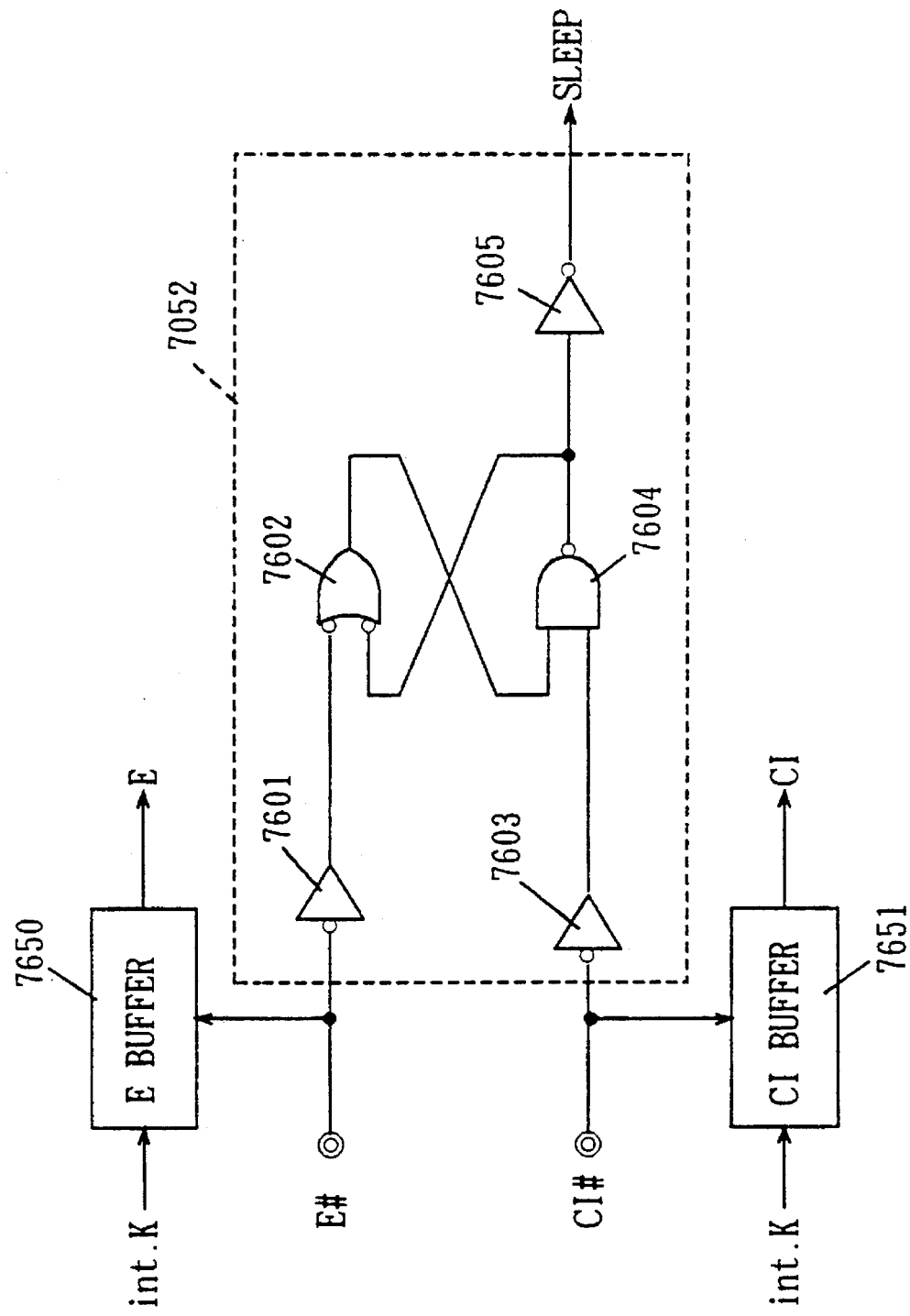

FIG. 212 shows another example of a structure of the sleep control circuit shown in FIG. 205.

Figure 213:
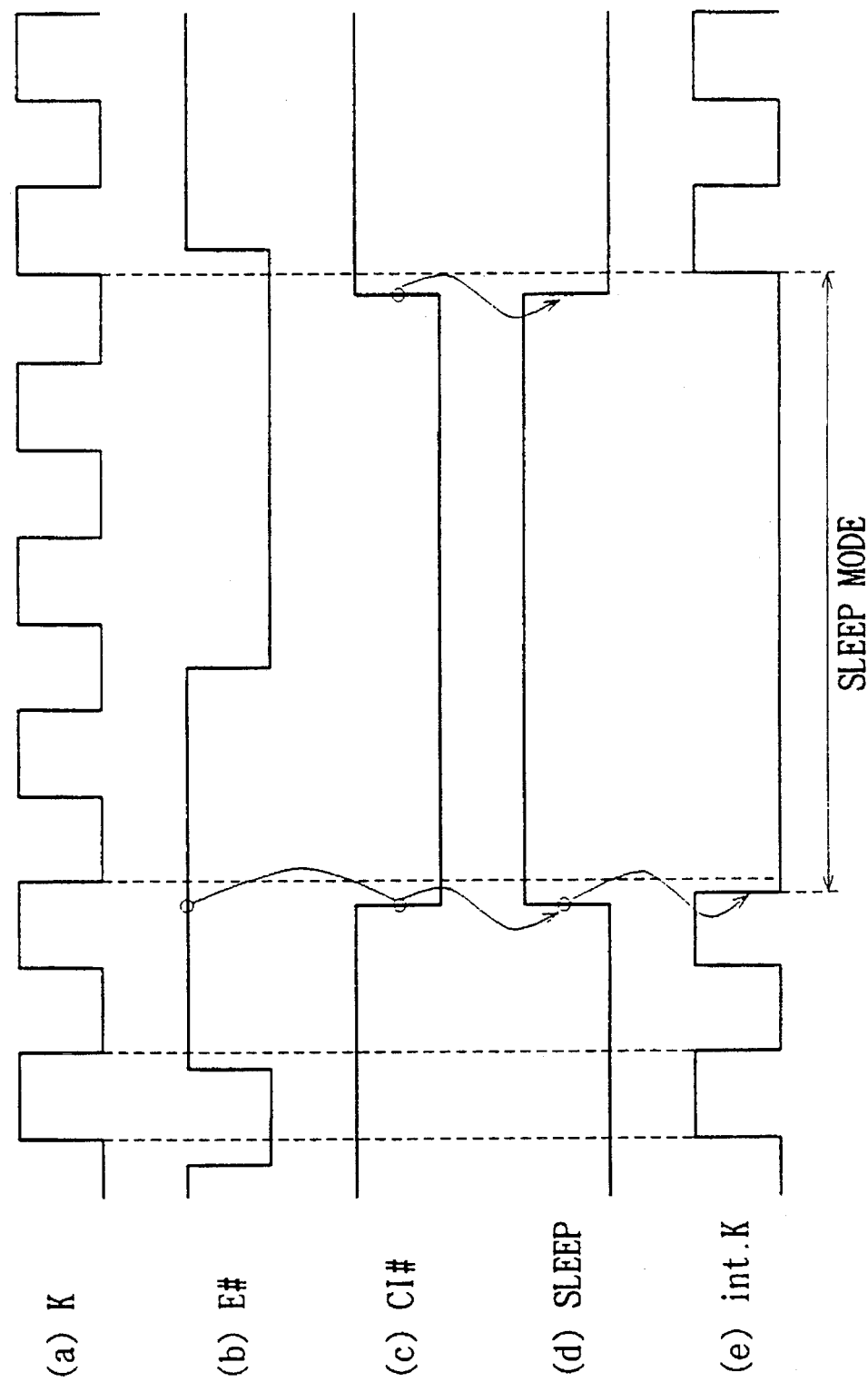

FIG. 213 is a diagram of signal waveforms showing the operation of the circuit shown in FIG. 212.

Figure 214:
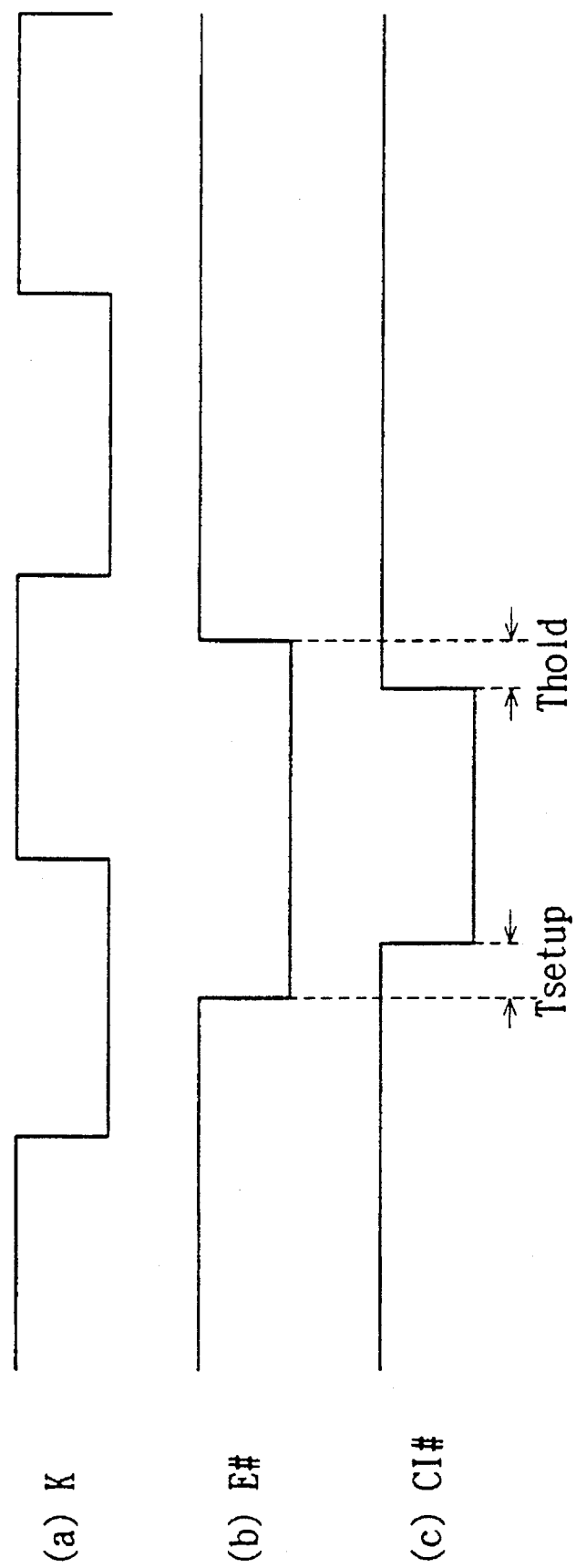

FIG. 214 shows, as an example, required conditions of the control signals E# and CI# for surely setting the sleep mode.

FIG. 215 is a table showing operations realized by the semiconductor memory device shown in FIG. 105 in combination with the states of control signals.

DESCRIPTION OF THE PREFERRED EMBODIMENTS

Array arrangement of DRAM and SRAM arrays in CDRAM are described with reference to FIGS. 7 through 23. In the arrangement, DRAM array includes a plurality of blocks to implement partial activation type operation. DRAM array includes local IO lines provided for respective blocks, and global IO lines each provided for blocks arranged in a row direction. SRAM array includes a plurality of SRAM cells arranged in a matrix. Data transfer of a plurality of bits between DRAM array and SRAM array is made through bidirectional transfer gate circuit and global IO lines. DRAM address and SRAM address can be set independently of each other. This arrangement allows first data transfer in any mapping scheme between DRAM array and SRAM array, as the blocks arranged in a column direction are simultaneously activated to communicate data with corresponding global IO lines through local IO lines. Now, detailed explanation will be made on specific DRAM and SRAM array arrangements.

[Array Arrangement 1]

Figure 7:
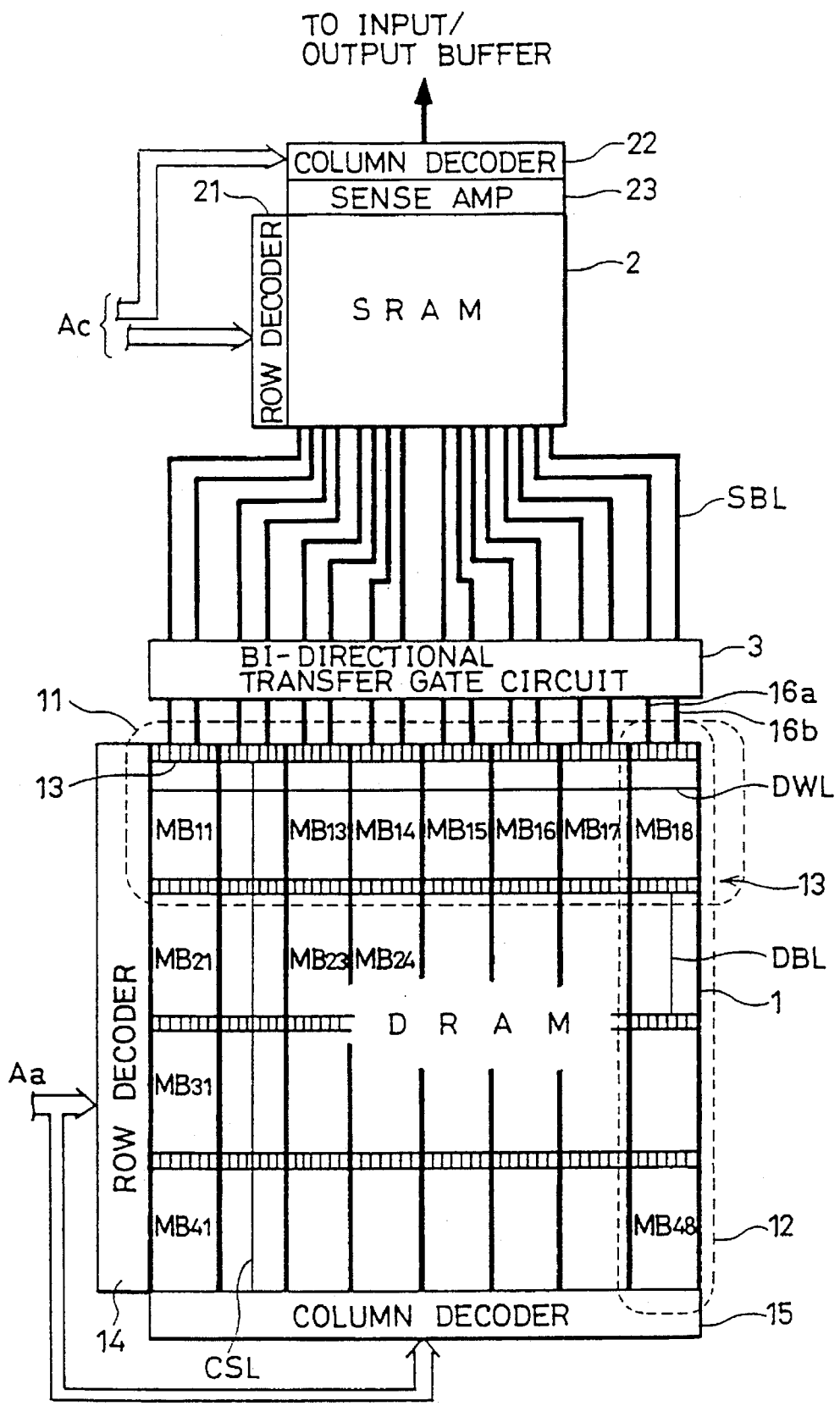

FIG. 7 schematically shows a structure of a memory array portion of the semiconductor memory device in accordance with one embodiment of the present invention. Referring to FIG. 7, the semiconductor memory device comprises a DRAM array 1 including dynamic memory cells arranged in a matrix of rows and coles, a SRAM array 2 including static memory cells arranged in a matrix of rows and columns, and a bi-directional transfer gate circuit 3 for transferring data between DRAM array 1 and SRAM array 2.

DRAM array 1 includes, assuming that it has storage capacity of 1M bit, 1024 word lines WL and 1024 pairs of bit lines BL and/BL. In FIG. 7, the DRAM bit line pair is denoted by DBL. DRAM array 1 is divided into a plurality of blocks along the row and column directions. In FIG. 7, DRAM array 1 is divided into 8 blocks MBi1 to MBi8 (i=1 to 4) along the column direction and divided into 4 blocks MB1j to MB4j (j=1 to 8) along the row direction, namely, it is divided into a total of 32 memory,blocks as an example.

8 blocks Mbi1 to Mbi8 divided in the column direction constitute a row block 11. 4 blocks MB1j MB4j divided in the row direction constitute a column block 12. The memory blocks Mbi1 to Mbi8 included in one row block 11 share the same word line WL. The memory blocks MB1j to MB4j included in the same column block 12 shares a column selecting line CSL. A sense amplifier +IO block 13 is provided for each of the memory blocks MB11 to MB18. The structure of sense amplifier +IO block 13 will be described later. Column selecting line CSL simultaneously selects two columns (two pairs of bit lines).

The semiconductor memory device further comprises a row decoder 14 responsive to an address for selecting a corresponding one row from DRAM array 1, and a column decoder 15 responsive to an applied column address for selecting one column selecting line CSL. Column blocks 12 are connected to the bi-directional transfer gate circuit 13 through two pairs of I/O lines 16a and 16b which are independent and separate from each other.

SRAM array 2 includes 16 pairs of bit lines SBL which are connected to 16 pairs of I/O lines through the bi-directional transfer gates circuit 3, respectively. If SRAM array 2 has the capacity of 4K bit, it includes 16 pairs of bit lines and 256 word lines. Namely, in SRAM array 2, one row is comprised of 16 bits. SRAM array 2 is associated with a SRAM row decoder 21 for decoding a row address applied to the SRAM for selecting one row of SRAM array 2, a SRAM column decoder 22 for decoding an applied column address and for selecting a corresponding column in SRAM array 2, and a sense amplifier circuit 23 for amplifying and outputting data of the memory cell selected by SRAM row decoder 21 and SRAM column decoder 22 in data reading.

The SRAM bit line pair SBL selected by SRAM column decoder 22 is connected to a common data bus, and input/output of data with the outside of the device is effected through an input/output buffer (not shown). Addresses applied to DRAM row decoder 14 and DRAM column decoder 15 are independent of addresses applied to SRAM row decoder 21 and SRAM column decoder 22, and are applied to mutually different address pin terminals from those for SRAM addresses. Data transfer operation of the semiconductor memory device shown in FIG. 7 will be briefly described.

The operation of the-DRAM portion will be described. First, in accordance with an externally applied row address, row decoder 14 carries out a row selecting operation and raises potential of one word line DWL to "H". Data are read to corresponding 1024 bit lines BL (or/BL) from memory cells connected to the selected one word line DWL.

Then, sense amplifiers (included in the block 13) of row block 11 including the selected word line DWL are activated at one time, and differentially amplify potential difference between each bit line pair. Only one of the four row blocks 11 is activated to reduce power consumption associated with charging/discharging of the bit lines during the sensing operation. (This operation, in which only the row block including the selected row is activated, is called partial activation method.)

In accordance with an externally applied column address, DRAM column decoder 15 carries out a column selecting operation and one column selecting line CSL is set to the selected state in each column block 12. The column selecting line CSL selects two pairs of bit lines, and the two pairs of bit lines are connected to two pairs of I/O lines 16a and 16b provided corresponding to the block. Consequently, a plurality of bits (16 bits in this embodiment) of data are read to the plurality of I/O line pairs 16a and 16b from DRAM array 1.

Operation of the SRAM portion will be described. In accordance with an externally applied row address, SRAM row decoder 21 carries out row selecting operation and selects one word line from SRAM array 2. As described above, 16 bits of memory cells are connected to one SRAM word line. Therefore, by the selection of one word line, 16 static memory cells (SRAM cells) are connected to 16 pairs of bit lines SBL.

After 16 bit data have been transmitted to I/O line pairs 16a and 16b for DRAM array 1, bi-directional transfer gate circuit 3 is turned ON, and 16 pairs of I/O lines 16a and 16b are connected to 16 pairs of bit lines SBL of the SRAM. Consequently, data which have been transmitted to 16 pairs of I/O lines 16a and 16b are written to the 16 bits of memory cells which have been selected in SRAM array 2.

A sense amplifier circuit 23 and column decoder 22 provided in the SRAM are used to transfer data between the memory cells in SRAM array 2 and an input/output buffer for inputting/outputting external data.

It is possible to set addresses for selecting SRAM cells in SRAM array 2 completely independent from addresses for selecting dynamic memory cells (DRAM cells) in DRAM array 1. Therefore, it is possible for the 16 bits of memory cells selected in DRAM array 1 to exchange data with memory cells at an arbitrary position (row) of SRAM array 2. Therefore, all of the direct mapping method, set associative method and full associative method can be realized without changing the structure, or the array arrangement.

The principle of simultaneous transfer of 16 bits of data from the DRAM to the SRAM has been described. Simultaneous transfer of 16 bits of data from SRAM array 2 to DRAM array 1 is carried out in the same manner, except that the direction of data flow through the bi-directional transfer gate circuit 3 is reversed. The structure and operation of the semiconductor memory device containing a cache in accordance with the present invention will be described in detail.

Figure 8:
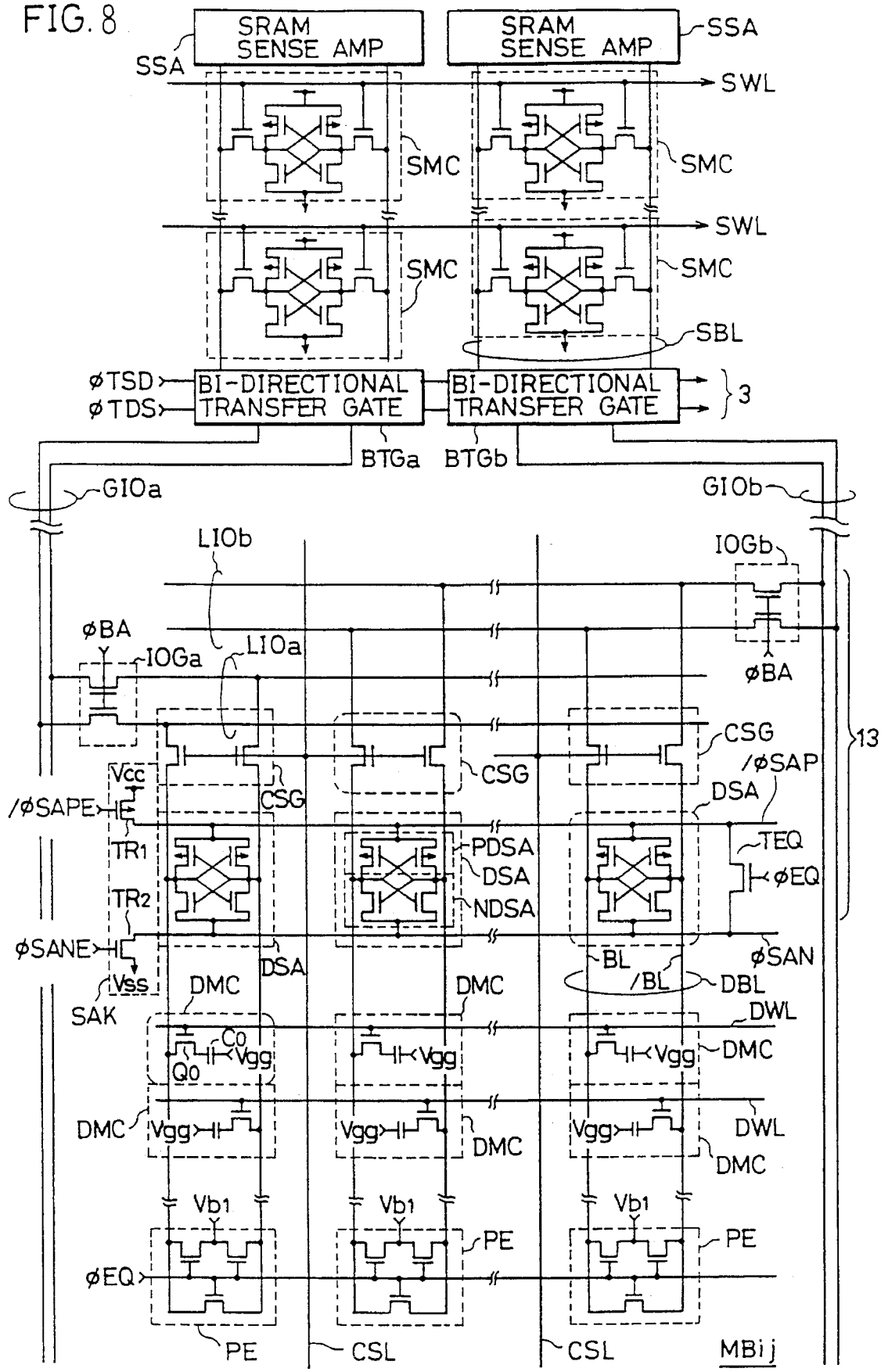

FIG. 8 shows a specific structure of a main portion of the semiconductor memory device shown in FIG. 7. FIG. 8 shows, as a representative, a portion related to data transfer of one memory block MBij of DRAM array. Referring to FIG. 8, DRAM memory block MBij includes a plurality of DRAM cells DMCs arranged in rows and columns. DRAM cell DMC includes one transistor Q0 and one capacitor C0. A constant potential Vgg is applied to one electrode (cell plate) of memory capacitor C0.

The memory block MBij further includes DRAM word lines DWL to each of which one row of DRAM cells DMCs are connected, and DRAM bit line pairs DBL to each of which a column of DRAM cells DMCs are connected. The DRAM bit line pair DBL includes two bit lines BL and/BL. Signals complementary to each other are transmitted to bit lines BL and/BL. A DRAM cell DMC is arranged at a crossing of a DRAM word line DWL and a DRAM bit line pair DBL.

A DRAM sense amplifier DSA for detecting and amplifying potential difference on a corresponding bit line pair is provided for each of the DRAM bit line pairs DBL. Operation of DRAM sense amplifier DSA is controlled by a sense amplifier activating circuit SAK which generates sense amplifier driving signals φSAN and/φSAP in response to sense amplifier activating signals φSANE and/φSAPE. DRAM sense amplifier DSA includes a first sense amplifier portion having p channel MOS transistors cross coupled for raising a bit line potential which is higher in a bit line pair to operational supply potential Vcc level in response to the signal/φSAP, and a second sense amplifier portion having n channel MOS transistors cross coupled for discharging potential of a bit line in the pair which is at lower potential to, for example, the potential Vss of the ground potential level, in response to the signal φSAN.

The sense amplifier activating circuit SAK includes a sense amplifier activating transistor TR1 which is turned on in response to sense amplifier activating signal/φSAPE for activating the first sense amplifier portion of DRAM sense amplifier DSA, and a sense amplifier activating transistor TR2 which is turned on in response to sense amplifier activating signal φSANE for activating the second sense amplifier portion of DRAM sense amplifier DSA. Transistor TR1 is formed by a P channel MOS transistor, while the transistor TR2 is formed by an n channel MOS transistor. When turned on, transistor TR1 transmits a driving signal/φSAP of the operational supply potential Vcc level to one supply node of each sense amplifier DSA. When turned on, transistor TR2 transmits a signal φSAN of the potential Vss level to the other supply node of DRAM sense amplifier DSA.

Between a signal line/φSAP and the signal line φSAN to which signals/φSAP and φSAN are output from sense amplifier activating circuit SAK, an equalize transistor TEQ is provided for equalizing both signal lines in response to an equalize designating signal φEQ. Therefore, in the standby state, sense amplifier driving signal lines/φSAP and φSAN are precharged to an intermediate potential of (Vcc+Vss)/2. Signal lines and signals transmitted thereto are represented by the same reference characters.

For each of the DRAM bit line pairs DBL, a precharge/equalize circuit PE which is activated in response to a precharge equalize signal φEQ for precharging and equalizing bit lines of the corresponding bit line pair to a predetermined precharge potential Vb1 is provided.

DRAM memory block MBij further comprises a column selecting gate CSG provided for each of the DRAM bit line pairs DBL and turned on in response to a signal potential on column selecting line CSL for connecting the corresponding DRAM bit line pair DBL to a local I/O line pair LIO. A column selecting line CSL is commonly provided for two pairs of DRAM bit lines, and therefore, two DRAM bit line pairs DBL are selected simultaneously. In order to receive data from the simultaneously selected two pairs of DRAM bit lines, two pairs of local I/O lines, that is, LIOa and LIOb are provided.

Memory block MBij further comprises IO gates IOGa and IOGb responsive to a block activating signal φBA for connecting the local I/O line pairs LIOa and LIOb to global I/O line pairs GIOa and GIOb, respectively. Column selecting line CSL extends in the row direction over one column block shown in FIG. 7, and global I/O line pair GIOa and GIOb also extend in the row direction over one column block. Local I/O line pair LIOa and LIOb extend only in the column direction in one memory block.

I/O lines 16a and 16b in FIG. 7 correspond to local I/O line pair LIOa and LIOb, IO gates IOGa and IOGb, and global I/O line pairs GIOa and GIOb, respectively.

SRAM comprises SRAM word lines SWL to each of which one row of SRAM cells SMCs are connected, SRAM bit line pairs SBL to each of which a column of SRAM cells SMCs are connected, and SRAM sense amplifiers SSA provided corresponding to the SRAM bit line pairs SBL for detecting and amplifying potential difference between the corresponding bit line pair.

Bi-directional transfer gate circuit 3 comprises bi-directional transfer gates BTGa and BTGb provided between SRAM bit line pair SBL and global I/O line pair GIO. Both of bi-directional transfer gates BTGa and BTGb transfer data between SRAM bit line pair SBL and global I/O line pairs GIOa and GIOb in response to data transfer designating signals φTSD and φTDS. Data transfer designating signal φTSD designates data transfer from SRAM portion to DRAM portion, while data transfer designating signal φTDS designates data transfer from DRAM portion to SRAM portion.

[Array Arrangement 2]

Figure 9:
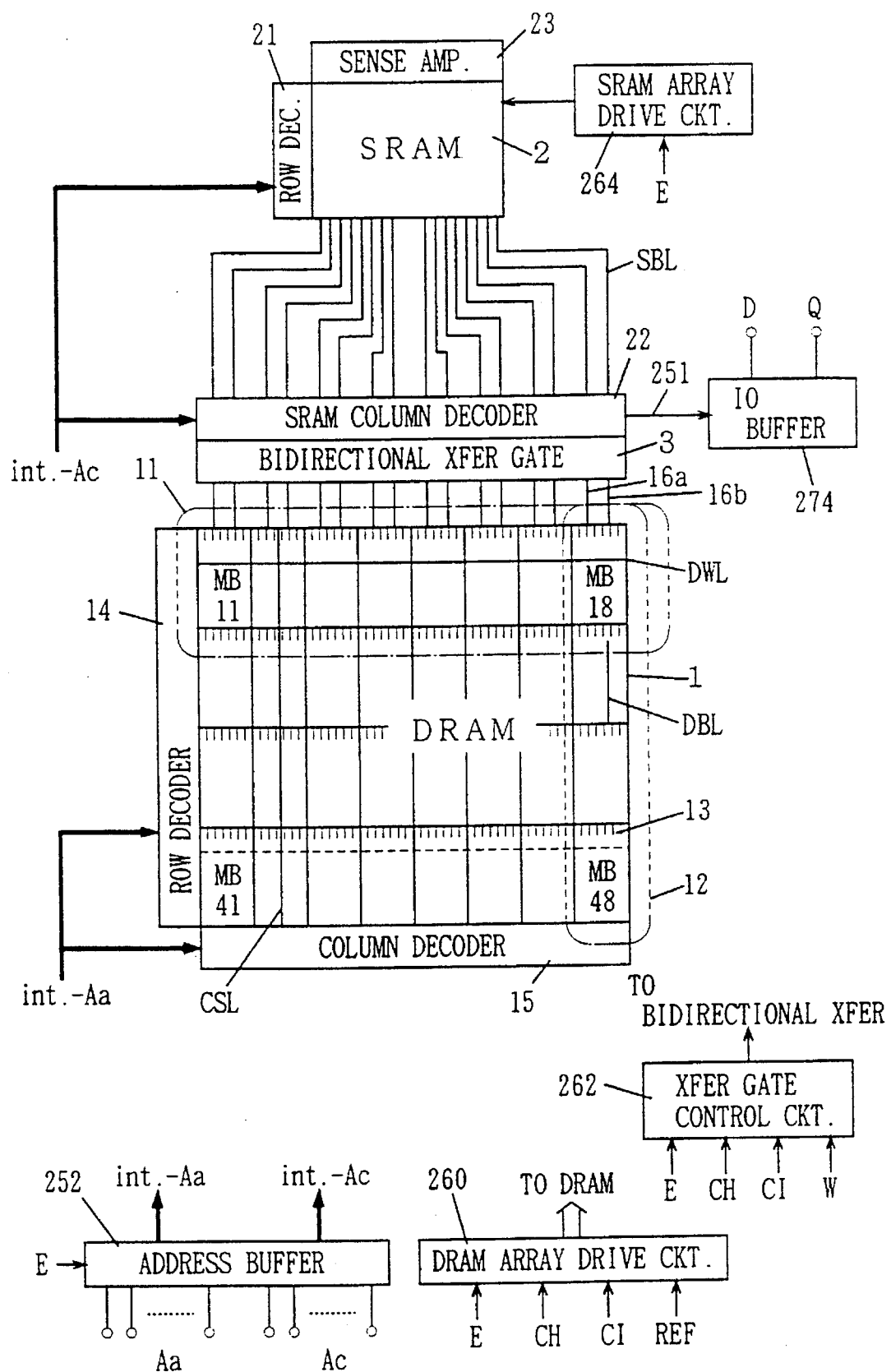

FIG. 9 shows another example of the structure of the array arrangement. In the array arrangement of FIG. 9, an SRAM column decoder 22 is provided between DRAM array 1 and SRAM array 2. An input/output buffer 274 is connected to a column selected by SRAM column decoder 22 through an internal data line 251. In the structure shown in FIG. 9, the column selected by DRAM array 1 is connected to internal data line 251 through the bi-directional transfer gate. The connection between DRAM array 1 and internal data line 251 through bi-directional transfer gate circuit 3 may be effected by the column selecting gate provided in the bi-directional transfer gate by a column selecting signal from column decoder 15 of the DRAM. The connection between DRAM array 1 and internal data line 251 and connection between SRAM array 2 and internal data line 251 will be described in detail later.

An address buffer 252 takes an address signal Aa applied externally in response to a chip enable signal E and generates an internal row-column address signal int-Aa for designating a row-column of DRAM array 1. Address buffer 252 takes an externally applied address signal Ac in response to chip enable signal E and generates an internal row.column address signal int-Ac for designating a row and a column of SRAM array 2. External address signal Aa for DRAM array and address signal Ac for SRAM array are applied to address buffer 252 through separate terminals.

In this structure shown in FIG. 9, internal address int-Ac applied to the row decoder 21 and column decoder 22 of SRAM and internal address int-Aa applied to row decoder 14 and column decoder 15 of DRAM are applied through independent paths. Therefore, by this structure, addresses of memory cells in SRAM array 2 and DRAM array 1 can be independently designated.

In the structure shown in FIG. 9, a SRAM column decoder 22 is provided between bi-directional transfer gate circuit 3 and SRAM array 2. SRAM column decoder 22 may be provided between bi-directional transfer gate circuit 3 and DRAM array 1. Alternatively, a corresponding I/O line pair of DRAM array may be selected L0 from I/O line pairs 16a, 16b of DRAM array 1 by an output from DRAM column decoder 15 to connect the same to internal common data bus 251, and SRAM bit line pair SBL may be connected to internal data transmitting line 251 by SRAM column decoder 22.

[Array Arrangement 3]

Figure 10:
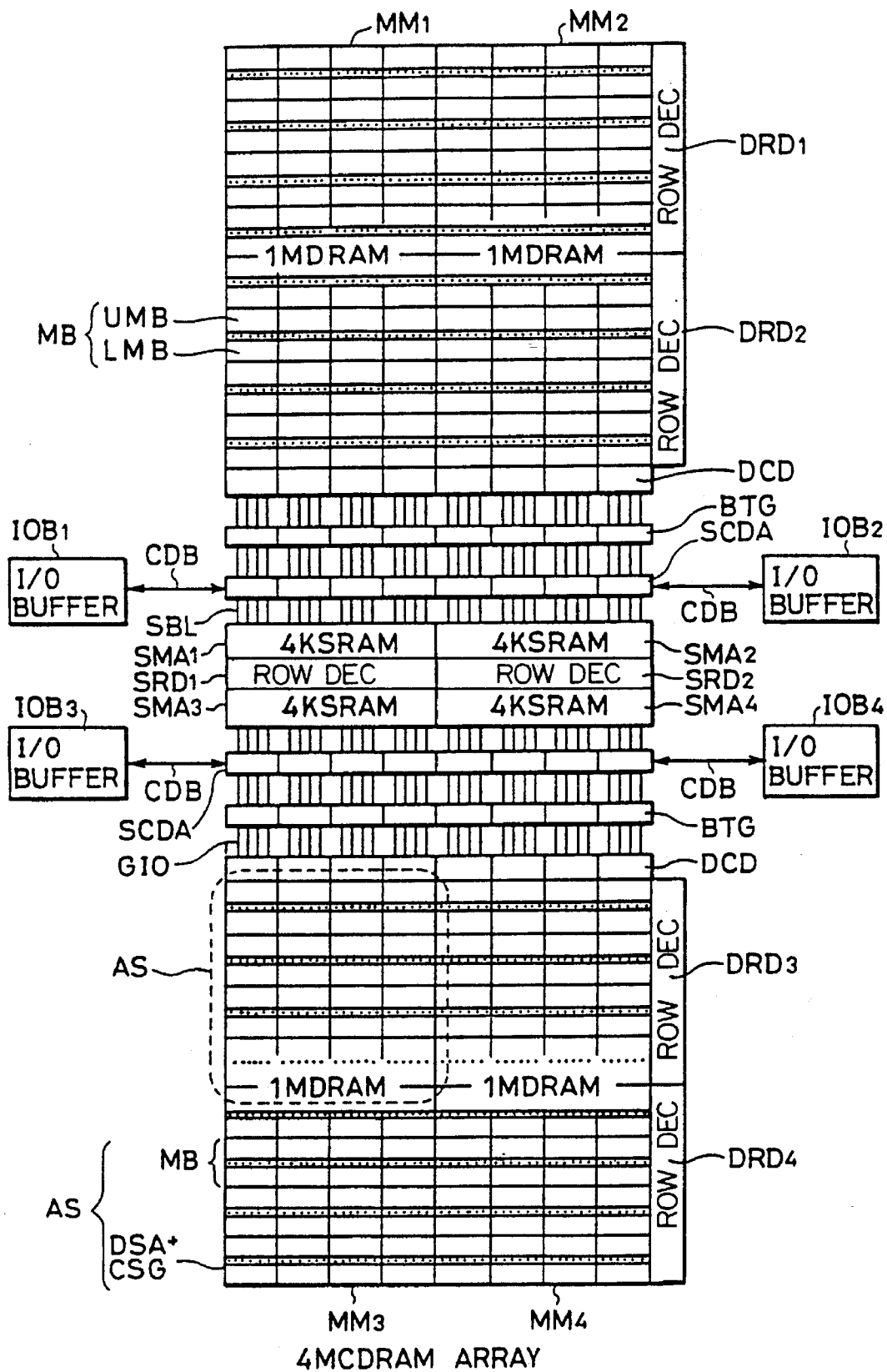

FIG. 10 shows a layout of an array in a semiconductor memory device in accordance with another embodiment of the present invention. A CDRAM shown in FIG. 10 includes a 4M bit DRAM array and a 16K bit SRAM array. More specifically, the CDRAM of FIG. 10 includes 4 CDRAMs shown in FIG. 7 or 9. Referring to FIG. 10, the CDRAM includes four memory mats MM1, MM2, MM3 and MM4 each having the storage capacity of 1M bit. Each of the DRAM memory mats MM1 to MM4 includes a memory cell arrangement of 1024 rows (word lines) by 512 columns (bit line pairs). Each of the DRAM memory mats MM1 to MM4 is divided into 32 memory blocks MBs each having a structure of 128 columns (bit line pairs)×256 rows (word lines).

One memory mat MM is divided into 4 memory blocks in the row direction, and into 8 blocks in the column direction. As shown in FIG. 10, a 1M bit memory mat is divided into 8 blocks in the column direction and 4 blocks in the row direction, different from the arrangement of the DRAM of FIG. 7, in order to house the device in a rectangular package, as will be described later.

Sense amplifiers DSA for DRAMs and column selecting gates CSG are arranged corresponding to respective bit line pairs DBL at the central portion in the column direction of the respective memory blocks MB. A memory block MB is divided into an upper memory block UMB and a lower memory block LMB with the sense amplifier DSA and column selecting gate CSG positioned at the center. In operation, either the upper memory block UMB or the lower memory block LMB is connected to the sense amplifier DSA and to the column selecting gate CSG. Whether the upper memory block UMB or lower memory block LMB is to be connected to sense amplifier DSA and column selecting gate CSG is determined by an address. Such a structure in which one memory block MB is divided into upper and lower two memory blocks UMB and LMB and one of the two blocks is connected to sense amplifier DSA and to column selecting gate CSG is commonly used in DRAMs having shared sense amplifier structure having the storage capacity equal to or larger than 4M bit.

One memory mat MM includes two activation sections AS. One word line is selected in one activation section. Different from the structure shown in FIG. 7, one word line is divided into two portions and allotted to respective activation sections in the structure of FIG. 10. Namely, selection of one word line in one memory mat MM is equivalent to selection of one word line in each activation section AS.

The semiconductor device (CDRAM) further comprises 4 DRAM row decoders DRD1, DRD2, DRD3 and DRD4 for selecting one word line from each of four DRAM memory mats MM1 to MM4. Therefore, in the CDRAM shown in FIG. 10, 4 word lines are selected at one time. DRAM row decoder DRD1 selects one row from corresponding activation sections AS of the memory mats MM1 and MM2. DRAM row decoder DRD2 selects one row from lower activation sections AS of memory mats MM1 and MM2. DRAM row decoders DRD3 and DRD4 select one row from upper activation sections AS of DRAM memory mats MM3 and MM4 and from lower activation sections AS of this memory mat, respectively.

The CDRAM further comprises DRAM column decoders DCD for selecting two columns (bit line pairs) from each of the column blocks of memory mats MM1 to MM4 of the DRAM. Column selection signal from the DARM column decoder DCD is transmitted to a column selection line CSL shown in FIG. 8. A column selection line CSL extends to be shared by the upper and lower activation sections AS. Therefore, in the structure shown in FIG. 10, 4 columns are selected from one column block (in FIG. 10, a block including 8 memory blocks MBs divided in the column direction), by the column selection signal from DRAM column decoder DCD.

Columns selected by column decoder DCD are connected to corresponding global I/O line pairs GIO. Two pairs of global I/O lines GIO extend in the column direction in each column block in one activation section. Connection between the global I/O line pair GIO and local I/O line pair LIO in each column block will be described in detail later.

CDRAM shown in FIG. 10 further includes SRAM array blocks SMA1 to SMA4 each formed of SRAM cells having the capacity of 4K bit. Row decoders SRD1 and SRD2 for SRAM are provided at a middle portion between 2 SRAM array blocks to be shared by two SRAM array blocks. SRAM row decoder SRD1 is commonly used by SRAM array blocks SMA1 and SMA3. SRAM row decoder SRD2 is commonly used by SRAM array blocks SMA2 and SMA4. Details of the structure of SRAM array block SMA will be described in detail later.

The CDRAM includes 4 input/output buffer circuits IOB1, IOB2, IOB3 and IOB4 for carrying out input/output of data 4 bits by 4 bits. Input/output buffer circuits IOB1 to IOB4 are connected to blocks SCDA of sense amplifiers and column decoders for SRAM, through common data buses (internal data buses), respectively. In the structure shown in FIG. 10, input/output of data are shown to be carried out through the sense amplifier and column decoder block SCDA for the SRAM. However, input/output of data may be carried out through the portion of bi-directional transfer gates BTG.

In operation, one word line is selected in each activation section AS. Only the row block including the selected word line is activated. Other row blocks are maintained at the precharge state. In the selected row block, only a small block UMB (or LMB) including the selected word line is connected to the sense amplifier DSA and column selecting gate CSG for DRAM, and the other small memory block LMB (or UMB) in the selected block is separated from sense amplifier DSA and column selecting gate CSG for DRAM. Therefore, as a whole, activation (charge/discharge) of ⅛ of bit lines is effected. By this partial activation, power consumption in charging/discharging of the bit lines can be reduced. In addition, by dividing one memory block MB into an upper memory block UMB and a lower memory block LMB and by arranging a sense amplifier DSA at the center therebetween, the bit line can be made shorter, the ratio Cb/Cs of bit line capacitance Cb to memory capacitor capacitance Cs can be reduced, and sufficient reading voltage can be obtained at high speed.

In each activation section AS, sensing operation in 4 small blocks UMB (or LMB) in the row direction is carried out. In each activation section AS, two pairs of bit lines are selected in one column block by a column selection signal from DRAM column decoder DCD. Global I/O line pair GIO extends in the column direction to be shared by column blocks in each activation section AS. Two pairs of bit lines are selected from each column block in each activation section AS and connected to corresponding two pairs of global I/O lines GIO. 4 pairs of global I/O lines GIO are connected to one bi-directional transfer gate BTG. 4 bi-directional transfer gates BTG are provided for one memory mat MM. Therefore, 16 pairs of global I/O lines GIO can be connected to SRAM bit line pairs SBL of the corresponding SRAM array from one memory mat MM. Layout of the global I/O lines will be described.

Figure 11:
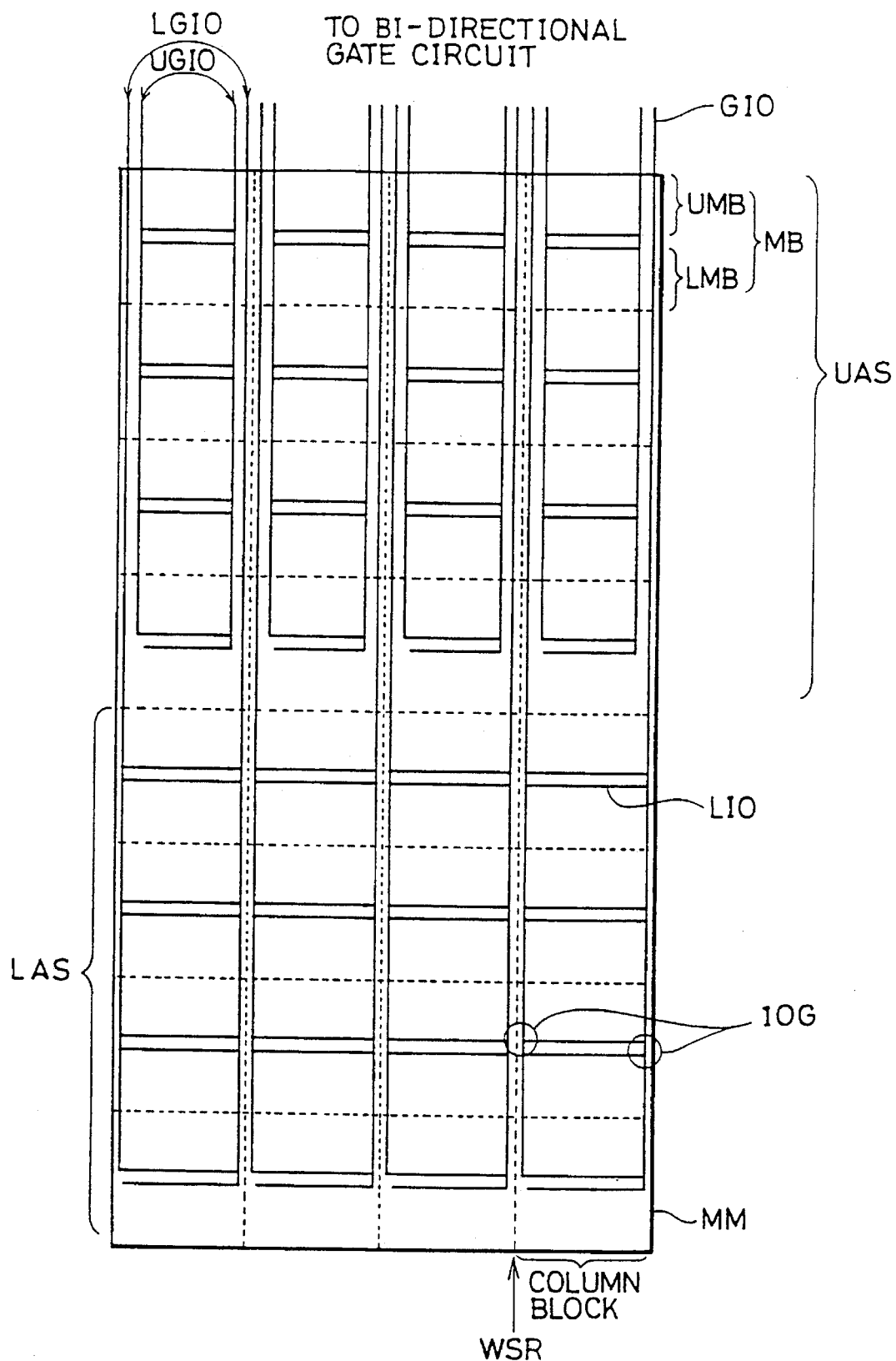

FIG. 11 shows arrangement of global I/O lines for one memory mat. Referring to FIG. 11, the global I/O line pair GIO includes an upper global I/O line pair UGI0 provided for an upper activation section UAS and a lower global I/O line pair LGIO provided for a lower activation section LAS. The upper global I/O line pair UGIO and the lower global I/O line pair LGIO are arranged in parallel. Lower global I/O line pair GIO passes through upper activation section UAS but is not connected to local I/O line pair LIO in the upper activation section UAS. Global I/O line pair GIO and local I/O line pair LIO are connected through an IO gate IOG which is a block selecting switch. Only an IO gate IOG provided in the row block including the selected word line is turned on by a block selecting signal φBA and connects the corresponding local I/O line pair LIO to the corresponding global I/O line pair GIO.

Since DRAM sense amplifier DSA and column selecting gate CSG are arranged at the central portion in the column direction of the memory block MB, local I/O line pair LIO is arranged along the row direction at the central portion in the column direction of memory block MB.

A word line shunt region WSR is provided in the column direction between adjacent column blocks. A word line shunt region WSR is used to provide a contact between a word line formed of polysilicon having relatively high resistance and an aluminum interconnection having low resistance. The word line shunt region will be described briefly.

Figure 12:
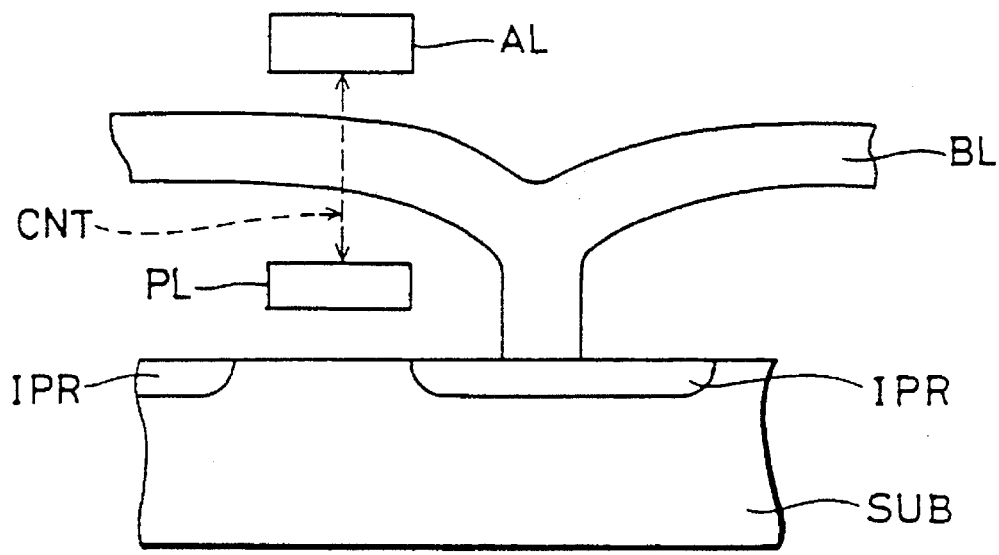

FIG. 12 schematically shows a cross sectional structure of a selecting transistor Q0 (see FIG. 11) included in a DRAM cell. Referring to FIG. 12, the selecting transistor Q0 includes impurity regions IPR formed at a surface of a semiconductor substrate SUB, a bit line BL connected to one impurity region IPR, and a polysilicon layer PL formed on the surface of the semiconductor substrate between the two impurity regions IPR. When a word line driving signal DWL (the signal line and the signal transmitted thereon are represented by the same reference character) is transmitted to the polysilicon layer PL, a channel is formed at the surface of the semiconductor substrate between the impurity regions IPR, and the selecting transistor Q0 is turned on. Polysilicon has relatively high resistance. If word line DWL has high resistance, a signal delay is generated due to the resistance of polysilicon. In order to lower the resistance of the word line DWL, an aluminum interconnection AL having low resistance is provided in parallel to the polysilicon layer PL. By periodically connecting the aluminum interconnection AL and the polysilicon layer PL at predetermined intervals, the resistance of the word line DWL can be reduced.

Aluminum interconnection AL is formed above the bit line BL. Therefore, a region for providing contact between polysilicon layer PL and aluminum interconnection AL must be provided at a region where there is no bit line BL (/BL), that is, a region where memory cell is not arranged. For this purpose, a word line shunt region is provided between column blocks. The manner of connection is shown in FIG. 13.

Figure 13:
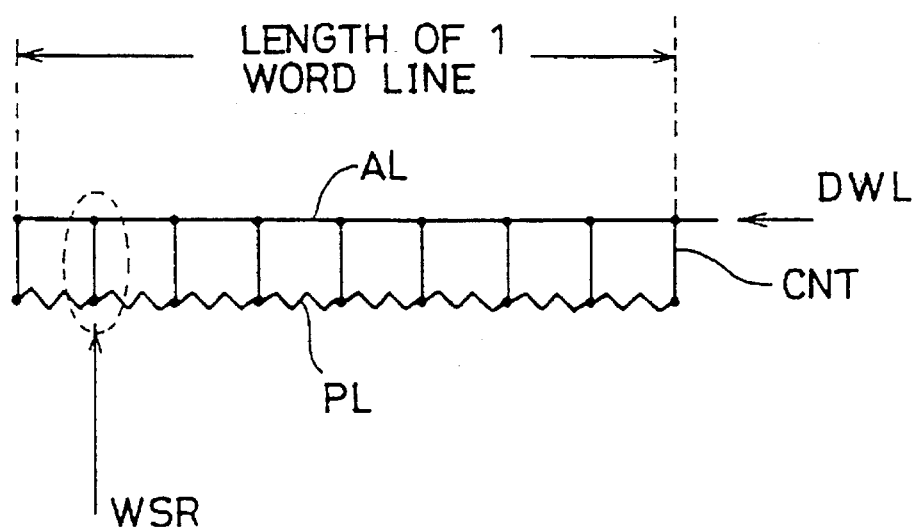

Referring to FIG. 13, aluminum interconnection AL having low resistance is provided in parallel to polysilicon layer PL having relatively high resistance serving as a word line. Word line driving signal DWL is transmitted to aluminum interconnection AL. Aluminum interconnection AL and polysilicon layer PL are periodically connected to each other by a contact layer CNT in word line shunt region WSR. By periodically providing contacts between aluminum interconnection AL and polysilicon layer PL through contact region CNT, the resistance of polysilicon layer PL can be effectively reduced. Therefore, even if a word line is very long, the word line driving signal WL can be transmitted to the terminal end of the word line at high speed.

Figure 14:
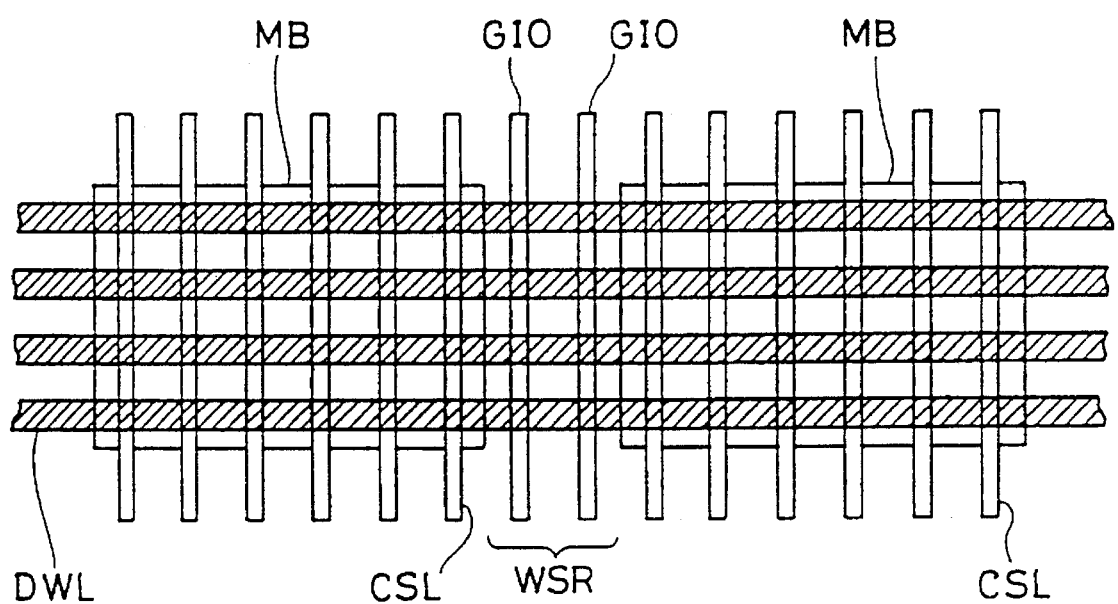

FIG. 14 schematically shows a layout of global I/O lines and column selecting lines CSL. In FIG. 14, layout of these lines for two memory blocks MB only is shown. In FIG. 14, global I/O line pair GIO is arranged in word line shunt region WSR. DRAM word lines DWL are arranged in a direction orthogonally crossing the global I/O line pair GIO. In FIG. 14, aluminum interconnection AL and polysilicon layer are arranged in parallel to each other, and in this plan view, they are overlapped with each other. Therefore, they are shown as the same word lines DWL. Column selecting lines CSL for transmitting column selection signal from DRAM column decoder are arranged in a direction orthogonally crossing DRAM word lines DWL.

Although the bit line pairs DBL of DRAM are not shown in this layout, the bit line pairs are arranged in parallel to column selecting lines CSL. Aluminum interconnection AL (see FIG. 12) for DRAM word lines DWL is formed by a first layer aluminum interconnection. Column selecting lines CSL are formed by a second layer aluminum interconnection. Global I/O lines are formed by the same aluminum interconnection as the column selecting lines CSL. By providing global I/O line pair GIO in word line shunt region WSR, chip area is not increased even if I/O lines for connecting DRAM array and bi-directional transfer gates are adapted to have hierarchical structure of local I/O lines and global I/O lines.

Figure 15:
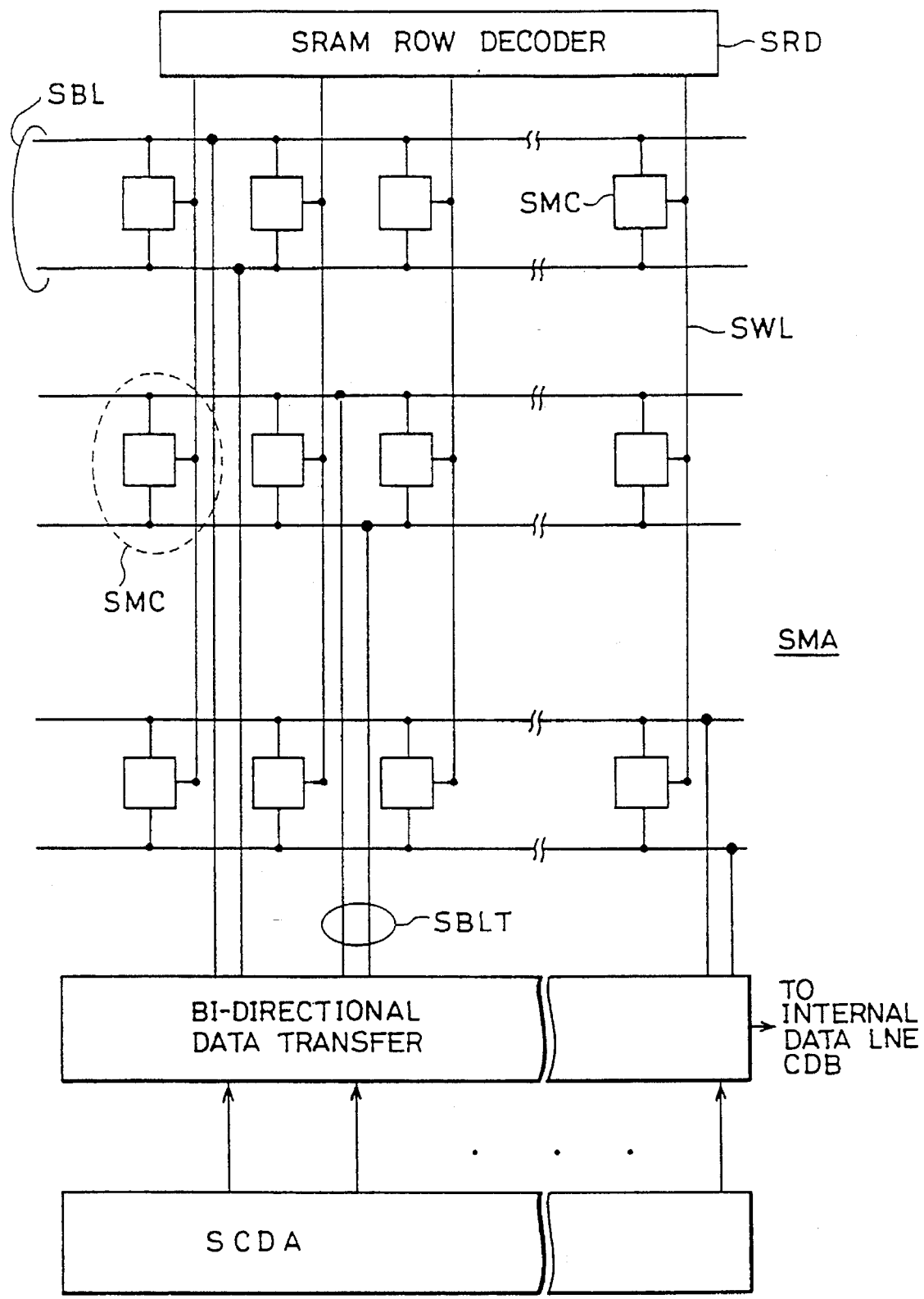

FIG. 15 schematically shows a structure of SRAM array block SMA shown in FIG. 10. Referring to FIG. 15, a SRAM array block SMA includes 16 pairs of bit lines SBL and 256 SRAM word lines SWL. SRAM cells SMC are arranged at crossings of SRAM bit line pairs SBL and SRAM word lines SWL. As shown in FIG. 10, in order to have the SRAM array block SMA accordant with a rectangular chip layout, SRAM bit line pairs SBL are arranged in the row direction of DRAM array and SRAM word lines SWL are arranged in column direction of DRAM array. SRAM word lines SWL are connected to SRAM row decoder SRD.

SRAM bit line pairs SBL must be connected to global I/O line pair GIO through bi-directional transfer gate BTG. Therefore, SRAM bit line pairs SBL must be connected to bi-directional transfer gate BTG on the lower side as viewed in FIG. 15 (or upper side of FIG. 15: determined by the arrangement of the memory array). For this purpose, in the structure shown in FIG. 15, SRAM bit line taking lines SBLT are arranged in parallel to SRAM word lines SWL.

The number of SRAM bit line taking lines SBLT is the same as the number of bit line pairs SBL of the SRAM array block SMA, and the taking lines are connected to corresponding SRAM bit line pairs SBL. If SRAM bit line taking lines SBLT are formed by the same interconnection layer as SRAM word lines SWL, SRAM bit line taking lines SBLT can be implemented easily without additionally providing interconnection layers formed by additional step of manufacturing.

The SRAM row decoder SRD decodes a row address for SRAM to select one of the 256 SRAM word lines SWL. 16 bits of SRAM cells SMC connected to the selected SRAM word line SWL are connected to corresponding SRAM bit line pair SBL and to SRAM bit line taking line SBLT. In data transfer, the bit line taking lines SBLT are connected to global I/O line pair GIO through bi-directional transfer gate BTG.

By employing such a layout as shown in FIGS. 11 and 15, a structure as shown in FIG. 10 can be realized, in which DRAM arrays are arranged divided into upper and lower portions as viewed in the figure, SRAM arrays are collectively arranged between the upper and lower DRAM array blocks, and input/output buffer circuits IOB1 to IOB4 are provided near SRAM arrays formed at the central portion of the semiconductor memory device (chip). Such structure having SRAM arrays collectively formed at the central portion of the chip and input/output of data are effected near the central portion of the chip is advantageous for CDRAM as will be described in the following.

High speed access to a cache register is the first and most important characteristic of CDRAM. Arrangement of the SRAM array serving as the cache register near the input/output buffer for inputting/outputting data to and from the outside of the device results in shorter signal lines, which enables high speed input/output of data, and thus meets the demand of high speed accessing.

By collectively arranging SRAM arrays at the central portion, address lines for selecting SRAM cells can be made shorter. If an address line is made shorter, interconnection resistance and parasitic resistance of the address line can be reduced, SRAM cells can be selected at high speed, and therefore it is suitable for high speed accessing to the cache register.

In the architecture shown in FIG. 10, interconnections connecting the DRAM array and SRAM array may be longer, lowering the speed of data transfer between the DRAM array and SRAM array. However, data transfer is carried out between DRAM array and SRAM array only when a cache miss (miss hit) occurs. In that case, access speed as low as that of the standard DRAM is sufficient, and it is not very much desired to increase this access speed. Therefore, this is not a problem in practical use. In this case also, writing/reading of data can be carried out at high speed by using the data transfer apparatus which will be described later.

[Another Arrangement of SRAM Array]

In this section, reference is made on FIGS. 16 to 30. SRAM array is arranged to implement any shape with storage capacity fixed. Each row of SRAM array has a plurality of word lines associated therewith. One of word lines is selected. One row corresponds effectively to a plurality of rows. Data transfer between DRAM array and SRAM array of multiplicate word line arrangement be also described.

Figure 16:
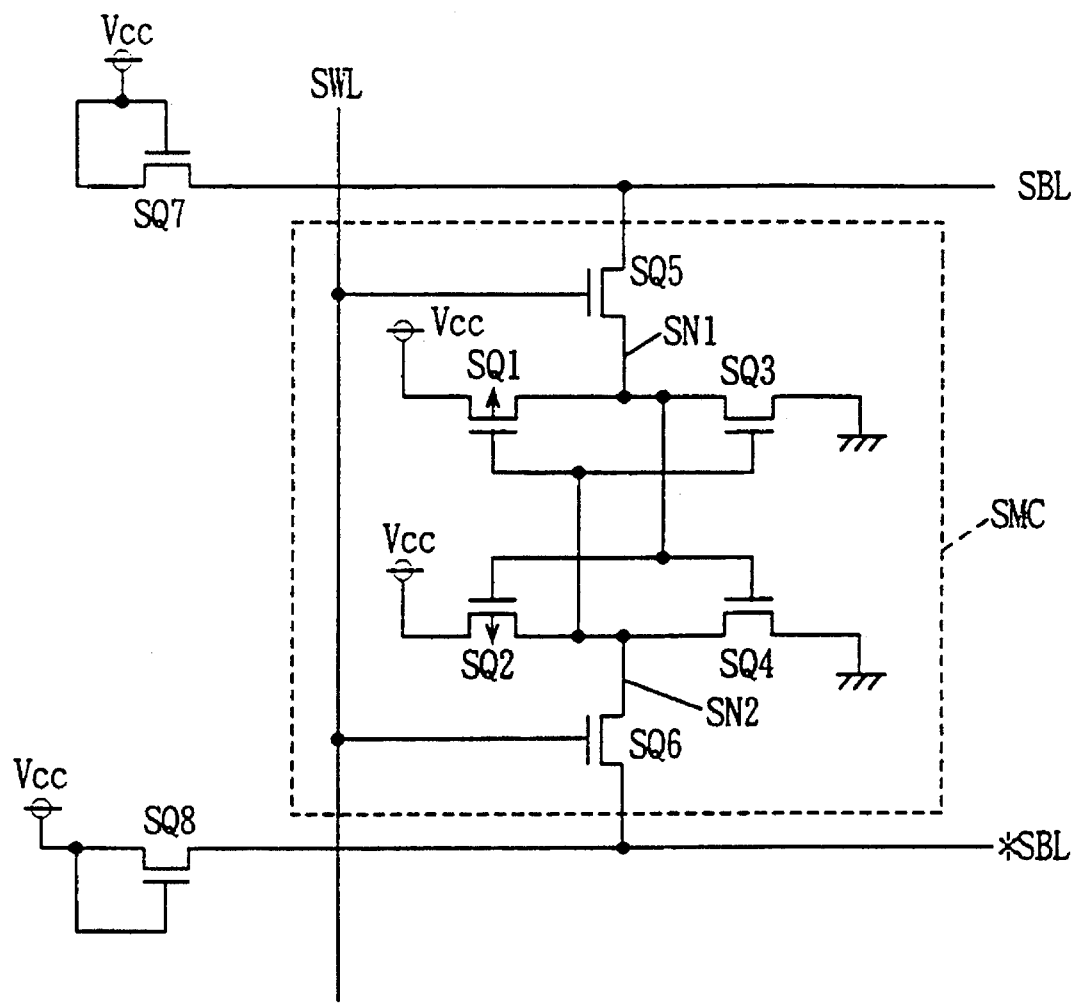

FIG. 16 shows a structure of the SRAM cell. Referring to FIG. 16, the SRAM cell SMC includes MOS (insulated gate type) transistors SQ1, SQ2, SQ3 and SQ4 constituting an inverter latch. P channel MOS transistor SQ1 and n channel MOS transistor SQ3 are complementary connected between operational supply potential Vcc and the other supply potential (ground potential), forming one inverter circuit.

P channel MOS transistor SQ2 and n channel MOS transistor SQ4 are complementary connected between the operational supply potential Vcc and the ground potential, forming the other inverter circuit. Transistors SQ1 and SQ3 have their gates connected to an node SN1, and transistors SQ2 and SQ4 have their gates connected to an node SN2. Node SN1 is an output node of one inverter circuit (transistors SQ1 and SQ3), and node SN2 is an output node of the other inverter circuit (transistors SQ2 and SQ4).

SRAM cell SMC further includes n channel MOS transistors SQ5 and SQ6 rendered conductive in response to a signal on SRAM word line SWL for connecting nodes SN1 and SN2 to bit lines SBL and *SBL. Diode connected n channel MOS transistors SQ7 and SQ8 are provided on bit lines SBL and *SBL. MOS transistors SQ7 and SQ8 clamp the potential of "H" on bit lines SBL and *SBL at a potential Vcc-Vth and "L" thereon at VL1 (described later). The character Vth represents the threshold voltage of the transistors SQ7 and SQ8.

Data writing and reading operations of the SRAM cell will be briefly described.

In data writing, data complementary to each other are transmitted to bit line SBL and complementary bit line *SBL. Assume that a potential at "H" is transmitted to bit line SBL and a potential at "L" is transmitted to complementary bit line *SBL. Potential on word line SWL is at "H" and nodes SN1 and SN2 are connected to bit lines SBL and *SBL through conductive transistors SQ5 and SQ6, respectively. The potential of node SN1 is applied to the gates of transistors SQ2 and SQ4, so that transistor SQ4 is rendered conductive and transistor SQ2 is rendered non-conductive. The potential at "L" on node SN2 is applied to the gates of transistors SQ1 and SQ3, so that transistor SQ1 is rendered conductive, and transistor SQ3 is rendered non-conductive. Consequently, the potential at node SN1 is set to "H", the potential on node SN2 is set to "L" and these potentials are latched by the inverter latch circuits formed of transistors SQ1 to SQ4. By the fall of the potential on SRAM word line SWL to "L", writing of data is completed.

In data reading, the potential of the SRAM word line SWL rises to "H" and transistors SQ5 and SQ6 are rendered conductive. The stored data (potential) which has been latched at nodes SN1 and SN2 are transmitted to bit lines SBL and *SBL, respectively. Complementary data of "H" and "L" are transmitted to bit lines SBL and *SBL. The signal potentials on bit lines SBL and *SBL are amplified by a sense amplifier, not shown, and thus data is read out.

Figure 17:
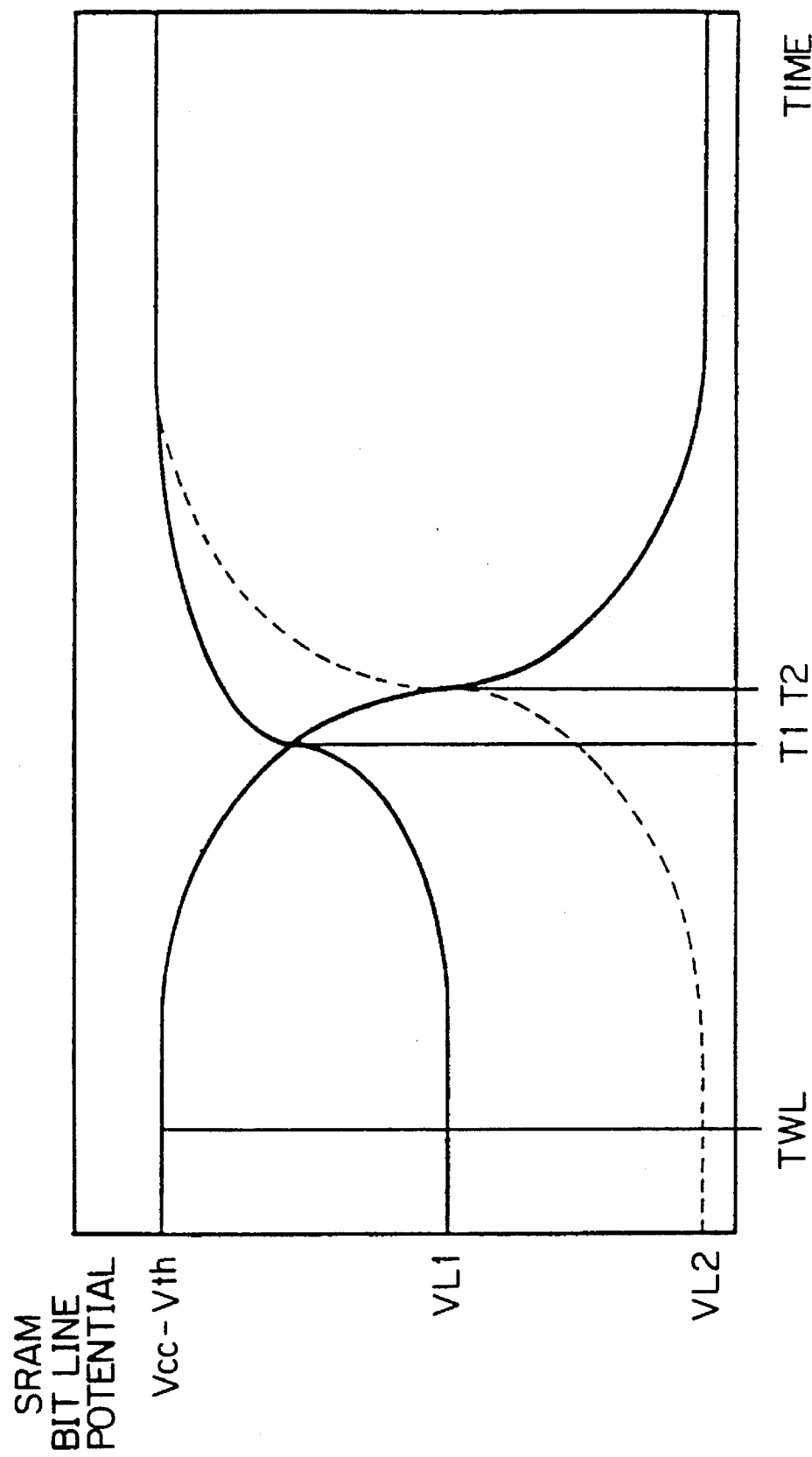

FIG. 17 is a diagram for illustrating the functions of transistors SQ7 and SQ8 shown in FIG. 16. The operation of the transistors SQ7 and SQ8 will be described with reference to FIGS. 16 and 17.

Transistors SQ7 and SQ8 are diode connected, and clamp the potentials on bit lines SBL and *SBL to Vcc-Vth. More specifically, the "H" potential level of the potential amplitude of bit lines SBL and *SBL is set to Vcc-Vth. The data of "H" latched in node SN1 has the potential at Vcc level. When the latched data of "H" is transmitted to bit line SBL, the level of this data attains Vcc-Vth, because of signal loss by transistor SQ5.

The "L" level potential VL1 of the potential amplitude of bit line SBL (or *SBL) is determined by resistive division of transistors SQ4, SQ6 and SQ8 (or SQ3, SQ5 and SQ7). The potential VL1 of "L" level of the bit line potential amplitude is higher than the ground potential Vss.

Namely, transistors SQ7 and SQ8 have also a function of raising potential of "L" of bit lines SBL and *SBL.

Assume that transistors SQ7 and SQ8 are not provided. In that case, the "L" level potential VL2 of bit lines SBL and φSBL are discharged by transistors SQ6 and SQ4 (or SQ5 and SQ3) to the ground potential Vss to be approximately at the ground potential level. The "H" level potential of bit line SBL (or *SBL) is provided as Vcc-Vth even when transistors SQ7 and SQ8 are not provided. In this case, it is assumed that the "H" level applied to word line SWL is at the level of operational supply voltage Vcc, and that there is a loss of the threshold voltage Vth of transistor SQ5 or SQ6 in transistor SQ5 (or SQ6).

Assume that the potential on SRAM word line SWL rises to "H" at time TWL in FIG. 17. When transistors SQ7 and SQ8 are provided, data stored in SRAM cell SMC is transmitted to bit lines SBL and *SBL, and potentials "H" and "L" on bit lines SBL and *SBL cross at time T1.

When transistors SQ7 and SQ8 are not provided, the potentials "H" and "L" of bit lines SBL and *SBL cross at time T2.

Data on respective bit lines SBL and *SBL are established after the time of crossing of potentials "H" and "L" on bit lines SBL and *SBL. Therefore, by the provision of transistors SQ7 and SQ8, logic amplitude of bit lines SBL and *SBL can be made smaller and the access time can be made shorter.

Different from the DRAM, the SRAM does not need RAS precharge time, and therefore it can be accessed at high speed. However, in SRAM array, one memory cell always exists at a crossing of an SRAM word line and a bit line. One memory cell is connected to bit line SBL and complementary bit line *SBL. A SRAM cell includes 6 transistors as shown in FIG. 16, and therefore compared with a DRAM cell including one transistor and one capacitor, it occupies larger area. Therefore, to provide a CDRAM which is highly integrated with high density, SRAM array should be effectively arranged in as small an area as possible.

Figure 18:
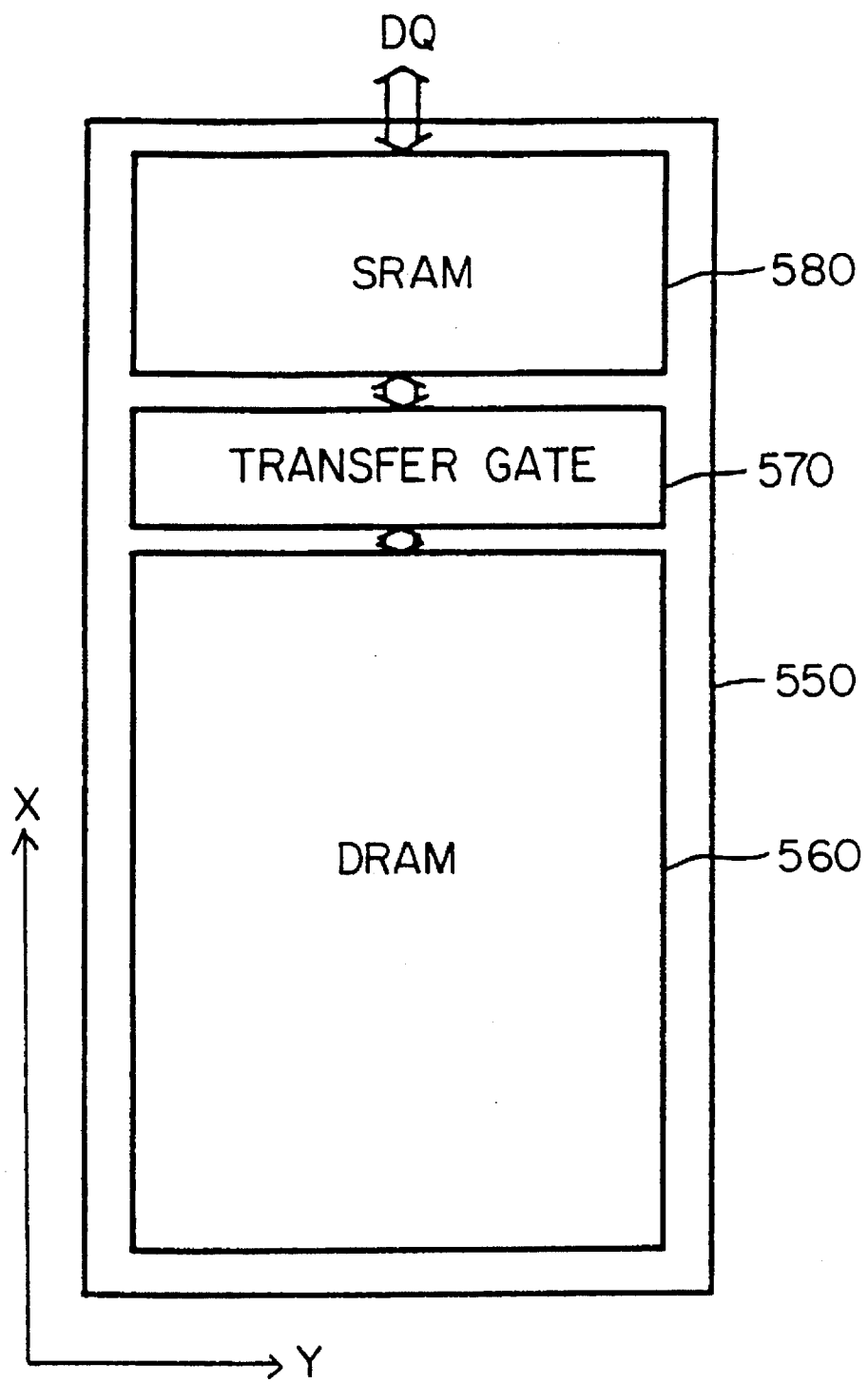

Assume that the CDRAM is to be housed in a rectangular package 550 as shown in FIG. 18. Package 550 has a longer side direction represented by X and a shorter side direction represented by Y in FIG. 18. For packaging in such a rectangular package, a DRAM array 560 having large storage capacity is arranged in a rectangular so as to match with the shape of package (or chip) 550. Here, it should be noted that the chip having DRAM array and CDRAM array integrated thereon has the same shape as the package. Data are transferred bi-directionally through transfer gate 570 between DRAM array 560 and SRAM array 580. In such arrangement, the SRAM array 580 should have the same length as the shorter side length of the DRAM array, in view of effective chip area occupation or array layout.

Figure 19:
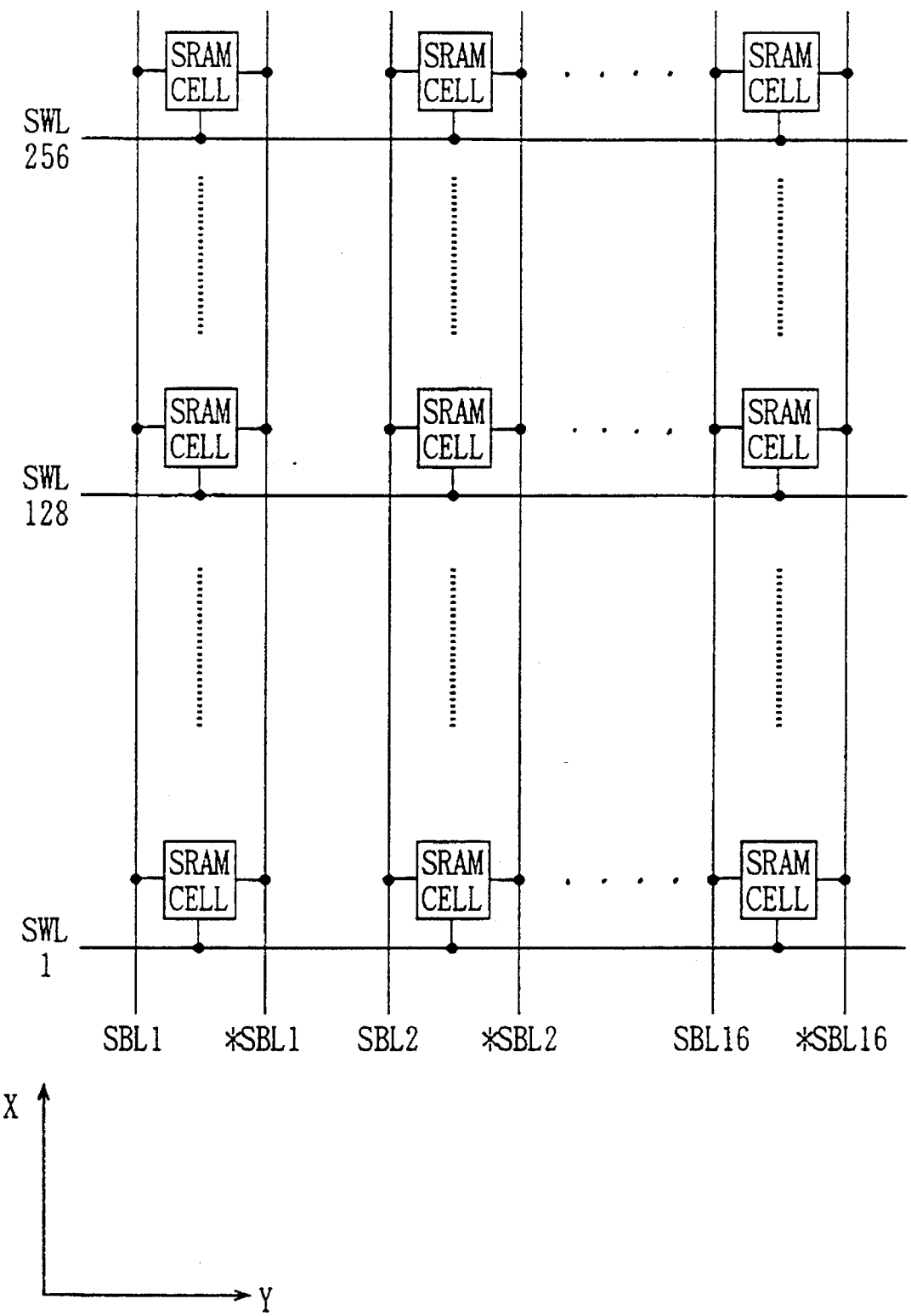

Assume that DRAM array 560 and SRAM array 580 can transfer data of 16 bits at one time, as shown in FIG. 19 and described previously. In this case, cache size is 16 bit. 16 pairs of SRAM bit lines SBL and *SBL are arranged for one SRAM word line SWL. SRAM array 580 has a structure of 256 rows×16 columns. When 256 SRAM word lines SWL1 to SWL256 are arranged along the longer side of package 550 as shown in FIG. 19, SRAM array 580 becomes long in the long side direction (X direction). If so, it can not be arranged in the area allotted to SRAM array 580 of package 550.

Figure 20:
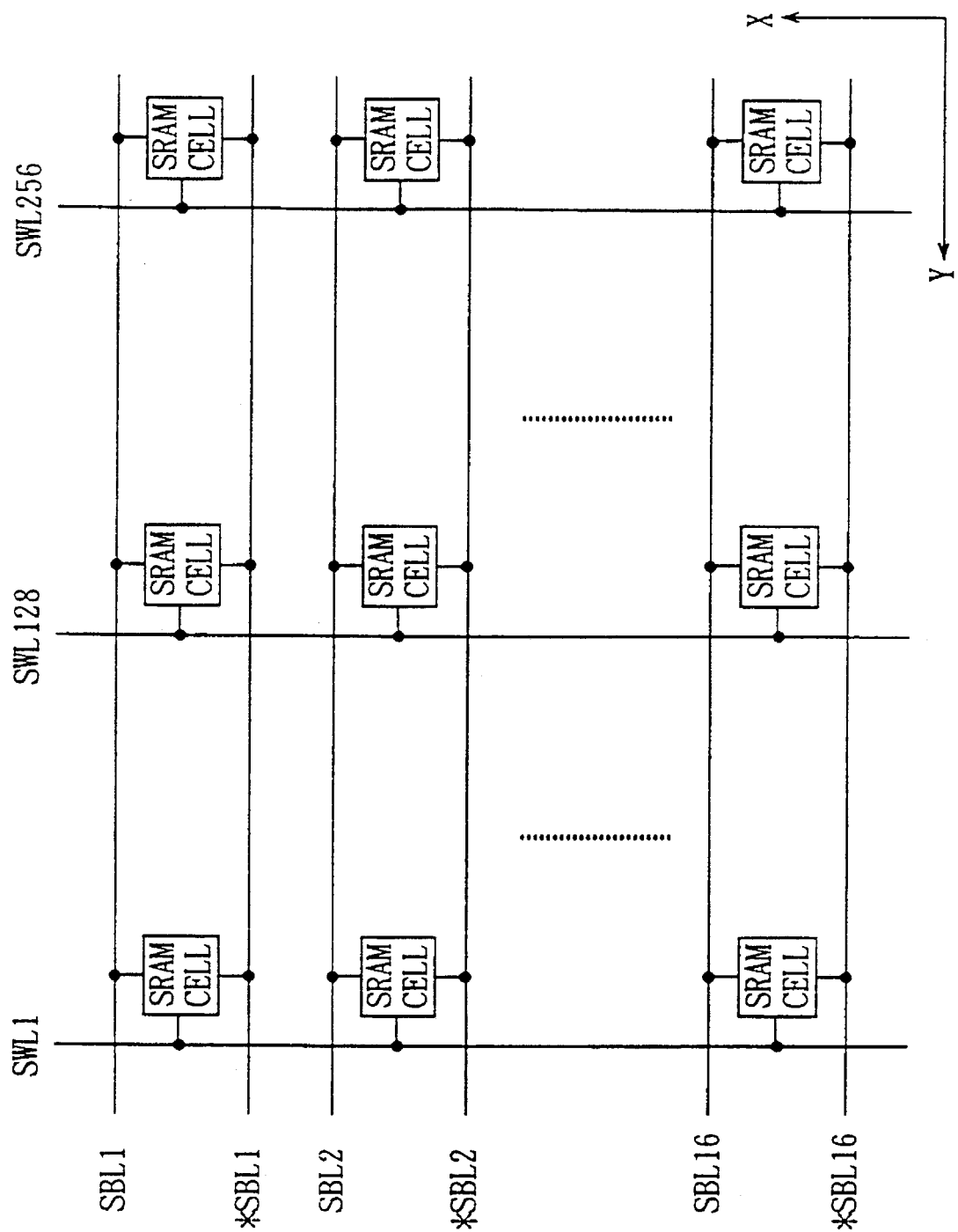

If SRAM word lines SWL1 to SWL256 are arranged in the short side direction (Y direction) of package 550 as shown in FIG. 20, the length in the long side direction (X direction) in FIG. 18 can be reduced, but it becomes longer in the short side direction (Y direction). Therefore, in this case also, it can not be arranged in the area allotted to SRAM array in package 550.

The size of SRAM array is determined uniquely when the number of bit line pairs and the number of SRAM word lines are determined. Therefore, the shape of SRAM array can not be flexibly changed.

In SRAM array, when a memory cell is selected, current always flows through the selected memory cell. Therefore, in view of current consumption, the number of memory cells connected to one word line should preferably be as small as possible. If the number of word lines are increased to reduce the number of memory cells connected to one word line, the bit line becomes longer. This in turn causes a problem that parasitic capacitance of the bit line is increased and access time is increased.

The shape of the DRAM array can be changed to be suited for the package relatively easily, by employing block divided arrangement, shared sense amplifier structure and the like. Therefore, it is preferred to provide a semiconductor memory device containing a cache occupying small area to realize an SRAM array structure whose shape can be flexibly changed corresponding to the shape of the DRAM array.

The arrangement of the DRAM array and the SRAM array in the rectangular area as described previously is required to house a 4M CDRAM in a rectangular package. The SRAM array SMA is arranged between DRAM arrays MMs as shown in FIG. 10. SRAM array SMA is arranged in a rectangular region which is short in the long side direction (X direction) of the chip and long in the short side direction (Y direction) of the chip.

SRAM array SMA has a storage capacity of 4K bits, and transfers 16 bits of data at one time to and from the corresponding DRAM array MM through a bi-directional transfer gate circuit BTG.

In this embodiment, SRAM array SMA includes 256 word lines and 16 pairs of bit lines. The SRAM array structure for effectively arranging SRAM array in the rectangular area will be described.

Figure 21:
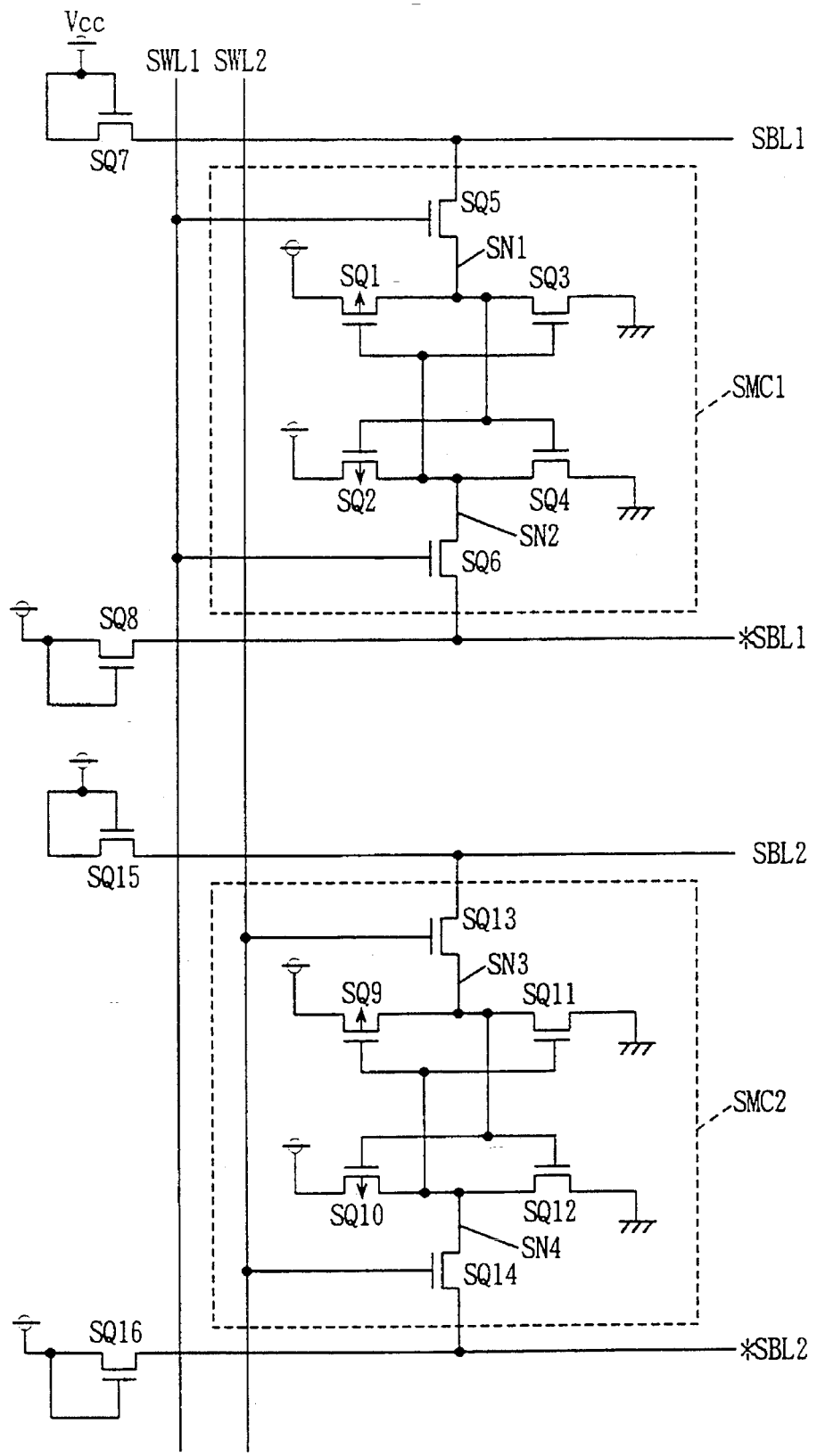

FIG. 21 shows in principle the structure of the SRAM array in accordance with an embodiment of the present invention. FIG. 21 shows two SRam word lines SWL1 and SWL2 and two pairs of bit lines SBL1, *SBL1, SBL2 and *SBL2, as representatives. SRAM cells SMC1 and SMC2 are arranged in one row. SRAM word lines SWL1 and SWL2 are commonly provided for the row in which SMC1 and SMC2 are arranged. Word line SWL1 is connected to memory cell SMC1. Word line SWL2 is connected to memory cell SMC2. SRAM memory cell SMC1 is connected to bit line pair SBL1, *SBL1. Memory cell SMC2 is connected to bit line pair SBL2, *SBL2.

Clamping transistors SQ7, SQ8, SQ15 and SQ16 are provided for clamping "H" and "L" level potential of the bit line potential for bit lines SBL1, *SBL1, SBL2 and *SBL2. Memory cells SMC1 and SMC2 have the same structure as the SRAM cell SMC shown in FIG. 16 and has a structure of a latch type storing element. SRAM cell SMC1 includes p channel MOS transistors SQ1 and SQ2 and n channel MOS transistors SQ3, SQ4, SQ5 and SQ6. Transistors SQ5 and SQ6 are rendered conductive in response to a signal potential on word line SWL1 and connect nodes SN1 and SN2 to bit lines SBL1 and *SBL1, respectively. Transistors SQ1, SQ2, SQ3 and SQ4 constitute an inverter type latch circuit.

SRAM cell SMC2 includes p channel MOS transistors SQ9 and SQ10 and n channel MOS transistors SQ11, SQ12, SQ13 and SQ14. Transistors SQ13 and SQ14 are rendered conductive in response to a signal potential on SRAM word line SWL2, and connect nodes SN3 and SN4 to bit lines SBL2 and *SBL2. Transistor SQ9, SQ10, SQ11 and SQ12 constitute an inverter type latch circuit.

In the array arrangement shown in FIG. 21, memory cells existing on even numbered columns (SMC2 and the like) of memory cells arranged in one row are connected to word line SWL2, while memory cells existing on odd numbered columns (SMC1 and the like) are connected to word line SWL1. The number of memory cells connected to word line SWL1 is the same as the number of memory cells connected to the word line SWL2. In this structure, an SRAM array having an arbitrary shape can be easily realized, as will be made clear later.

Figure 22A:
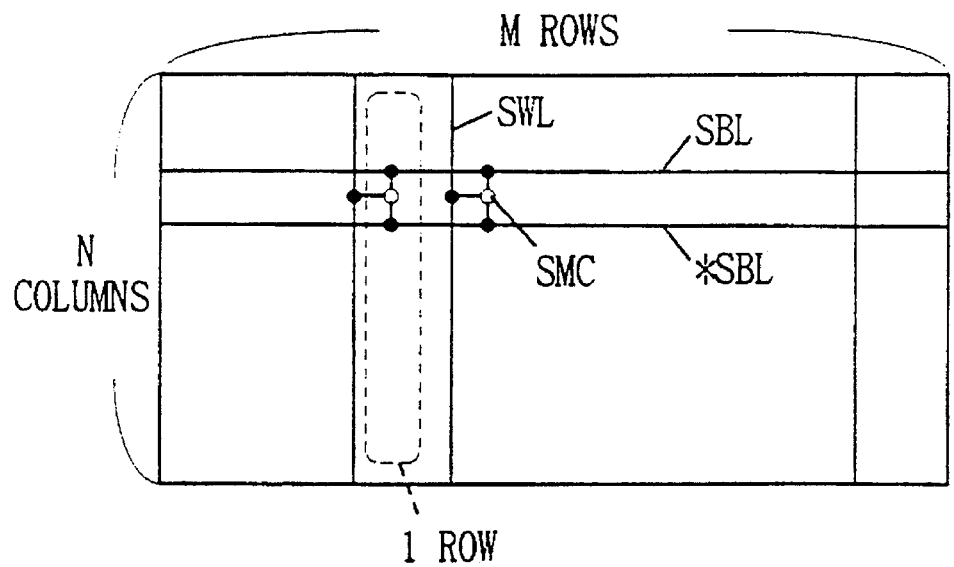
Figure 22B:
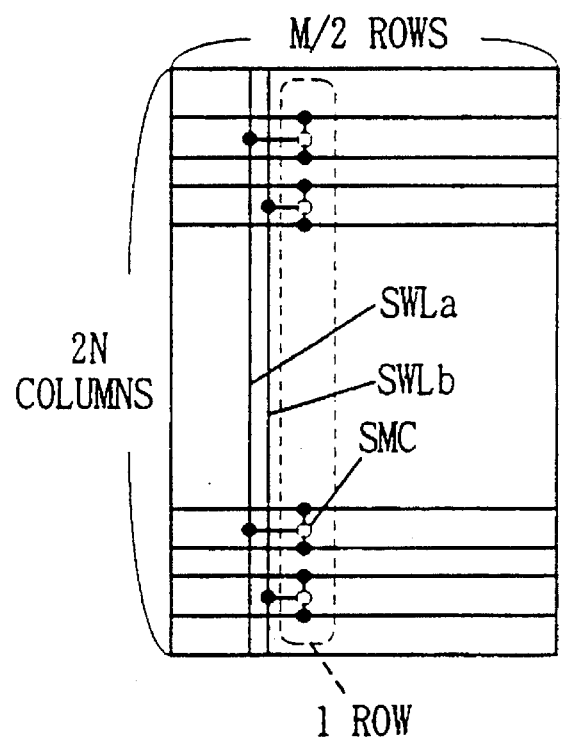

FIGS. 22A and 22B shows a comparison between the conventional SRAM array arrangement and the SRAM array arrangement of the present invention. Referring to FIG. 22A, one word line SWL is arranged for one row of memory cells. In this case, memory cells SMCs are arranged in M rows×N columns.

Meanwhile, as shown in FIG. 22B, two word lines SWLa and SWLb are provided for one row of memory cells SMC, and one row of memory cells SMCs are connected alternately to word lines SWLa and SWLb. In this case, memory cells SMCs are arranged in M/2 rows×2N columns. In both array arrangements shown in FIGS. 22A and 22B, N memory cells SMCs are connected to one word line. In the structure of FIG. 22B, when three or more word lines are arranged for one row of memory cells and memory cells are connected alternatively to respective word lines, an SRAM array having an arbitrary shape can be provided. This increases degree of freedom in designing the structure and arrangement of the SRAM array in chip lay out.

Figure 23:
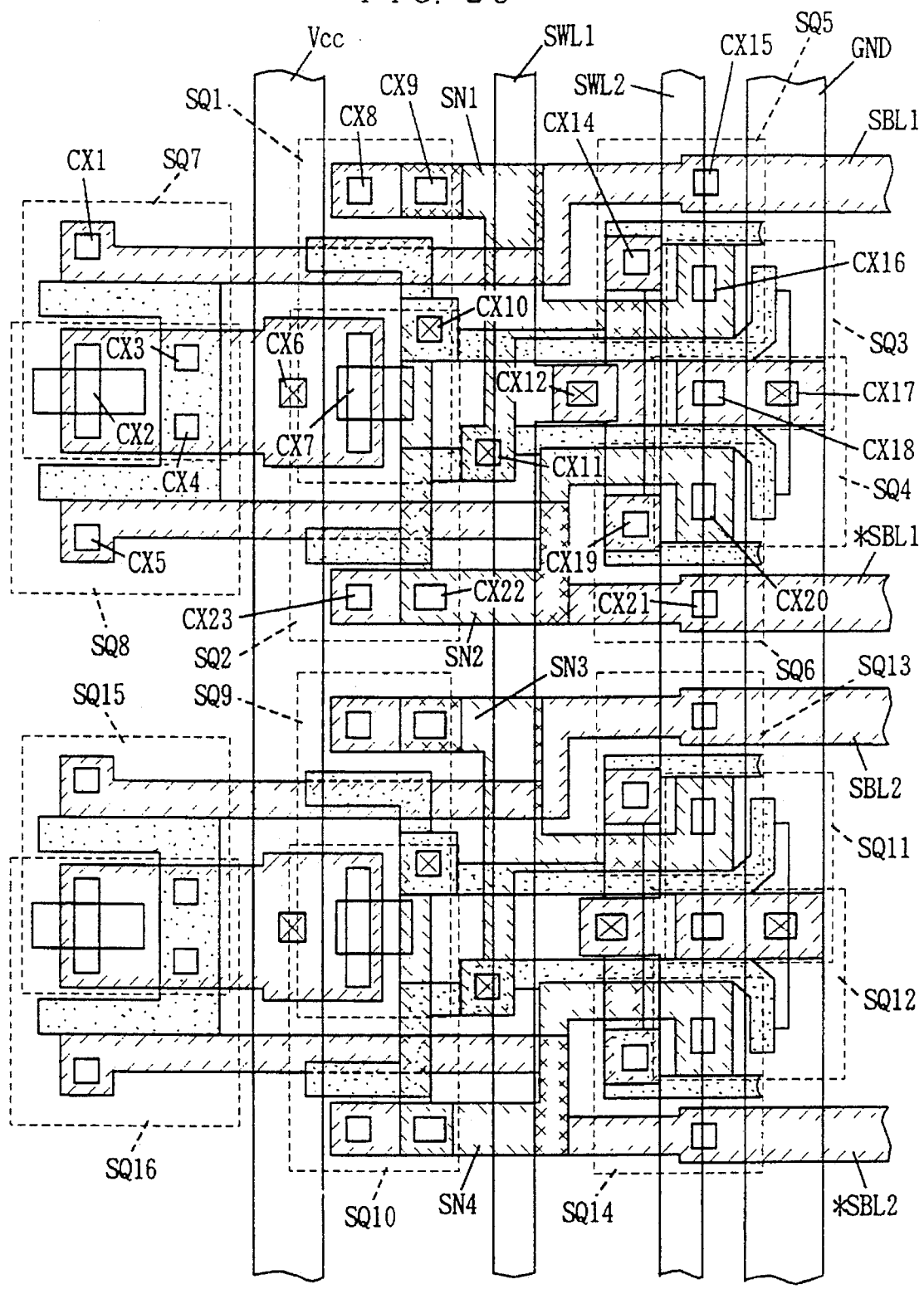

FIG. 23 shows a pattern of memory cell arrangement shown in FIG. 21. The structure of the memory cell will be described briefly with reference to FIG. 23. Supply line Vcc, SRAM word lines SWL1 and SW2 and a ground line GND are arranged in parallel and formed by a second layer aluminum interconnection (second aluminum interconnection). Bit lines SBL1, *SBL1, SBL2 and *SBL2 are formed by a first layer aluminum interconnection (first aluminum interconnection). Gates of transistors SQ1 to SQ16 are formed by a first layer polysilicon interconnection (first poly interconnection). The respective transistors are connected by a fourth layer polysilicon interconnection (fourth poly interconnection), and word lines are connected to the gates of the transistors by the first layer aluminum interconnection. Memory cells SMC1 and SMC2 have the same pattern layout. In the following, connection of memory cell SMC1 will be described.

Clamping transistor SQ7 has its drain connected to bit line SBL1 through a contact hole CX1, its gate and source connected to the first layer aluminum interconnection through contact holes CX3 and CX2, and this first aluminum interconnection is connected to supply line Vcc through a contact hole CX6. Transistor SQ8 has its drain connected to bit line *SBL1 formed of the first layer aluminum interconnection through a contact hole CX5, and its gate and source connected to the first layer aluminum interconnection layer through contact holes CX4 and CX2, and this first layer aluminum interconnection layer is connected to supply line Vcc through contact hole CX6.

Transistor SQ1 has its drain connected to the first layer aluminum interconnection through a contact hole CX8, and this first layer aluminum interconnection is connected to the fourth layer polysilicon interconnection through a contact hole CX9. This fourth layer polysilicon interconnection connected to contact hole CX9 provides node SN1. Node SN1 is connected to gate electrodes of transistors SQ2 and SQ4 through the fourth layer polysilicon interconnection and contact hole CX11. This fourth layer polysilicon interconnection of node SN1 is connected to the drain of transistor SQ3 and to one conduction terminal of transistor SQ5 through contact hole CX16.

Transistor SQ1 has its gate connected to node SN2 through contact hole CX10 and through the fourth layer polysilicon interconnection. Transistor SQ1 has its source connected to supply line Vcc through contact hole CX7, the first layer aluminum interconnection and contact hole CX6.

Transistor SQ2 has its drain connected to the first layer aluminum interconnection through a contact hole CX23, and this first layer aluminum interconnection is connected to the fourth layer polysilicon interconnection through a contact hole CX22. The fourth layer polysilicon interconnection connected to contact hole CX22 provides node SN2. Transistor SQ1 has its gate connected to the fourth layer polysilicon interconnection providing node SN1, through contact hole CX11.

Transistor SQ3 has its drain connected to the fourth layer polysilicon interconnection through contact hole CX16 and connected to node SN1. Transistor SQ3 has its gate connected to the fourth polysilicon interconnection layer through contact hole CX10 and to node SN2. Transistor SQ3 has its source connected to the first layer aluminum interconnection through contact hole CX18, and the first layer aluminum interconnection is connected to the ground line GND through contact hole CX17.

Transistor SQ4 has its source connected to ground line GND through contact hole CX18, the first layer aluminum interconnection and contact hole CX17. Transistor SQ4 has its gate connected to node SN1 through contact hole CX11 and the fourth layer polysilicon interconnection. Transistor SQ4 has its drain connected to node SN2 through contact hole CX20 and the fourth layer polysilicon interconnection.

Transistor SQ5 has its gate connected to the first layer aluminum interconnection through contact hole CX14, and this first aluminum interconnection is connected to word line SWL1 through contact hole CX12.

Transistor SQ6 has its gate connected to the first layer aluminum interconnection through contact hole CX19, and to word line SWL1 through contract hole SX12. One conduction terminal of transistor SQ6 is connected to bit line SBL1 through contact hole CX21. The other conduction terminal of transistor SQ6 is connected to node SN2 through contact hole CX20 and the fourth layer polysilicon interconnection.

As shown in FIG. 23, memory cells are arranged in one row, two word lines SWL1 and SWL2 can be arranged for the one row, and multiplicate word line arrangement in which a plurality of word lines are provided for memory cells arranged in one row can be easily realized.

Figure 24:
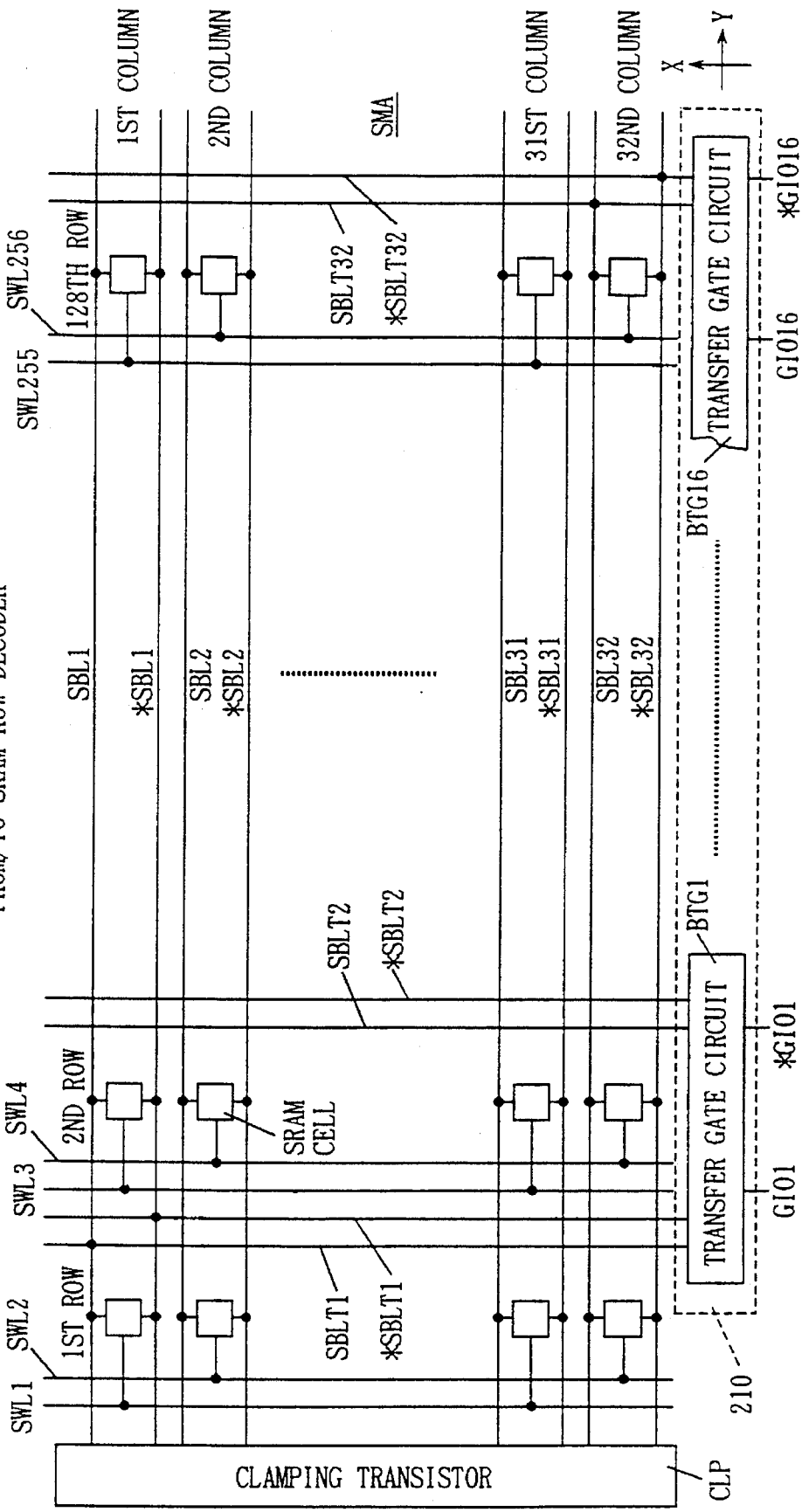

FIG. 24 shows an SRAM array arrangement in accordance with one embodiment of the present invention. The SRAM array arrangement shown in FIG. 24 is applied to the 4K bit SRAM array shown in FIG. 10. Referring to FIG. 24, the SRAM array SMA includes static memory cells (SRAM cells) arranged in 128 rows and 32 columns. Two SRAM word lines SWL are provided for SRAM cells arranged in one row. For example, two SRAM word lines SWL1 and SWL2 are provided for the first row of SRAM cells. SRAM word lines SWL3 and SWL4 are provided for the second row of memory cells.

SRAM cells of the odd numbered coles are connected to odd numbered SRAM word lines (SWL1, SWL3, . . . ) while SRAM cells of the even numbered columns are connected to even numbered SRAM word lines (SWL2, SWL4, . . . ). Every other SRAM cells of the respective rows of SRAM cells are connected to corresponding SRAM word lines SWL1 to SWL256. Namely, 16 bits of SRAM cells are connected to each of SRAM word lines SWL1 to SWL256.

In accessing SRAM cell, a column should be selected. The arrangement of FIG. 24 includes effectively 16 columns. In column selection, SRAM column address and word line group designating signal (a least significant SRAM row address bit, for example) are combined to generate a SRAM column select signal to connect a selected SRAM column to internal data bus.

As shown in FIG. 10, an SRAM row decoder for selecting the SRAM word lines is arranged in a direction orthogonally crossing the word lines SWL1 to SWL256. Data is transferred between the DRAM array and a SRAM cell through a transfer gate circuit BTG. Data must be transferred through SRAM bit lines SBL and *SBL. Therefore, as in the case of FIG. 15, bit line taking line SBLT is provided for each bit line pair SBL and *SBL. The bit line taking lines SBLT and *SBLT are formed by the second layer aluminum interconnection.

One bi-directional transfer gate circuit BTG is provided for two pairs of bit lines SBL and *SBL, that is, two pairs of SRAM bit line taking lines SBLT and *SBLT. Bi-directional transfer gate circuit BTG is connected to corresponding global I/O lines GIO and *GIO. 16 bits of data are transferred at one time between DRAM array and SRAM array through bi-directional transfer gate 210. In accordance with the structure, one transfer gate circuit can be arranged for two pairs of SRAM bit line taking lines SBLT and *SBLT in the SRAM array. Consequently, pitch condition in the Y direction for transfer gate circuit BTG can be released, and therefore even a transfer gate circuit having a complicated structure can be formed with sufficient margin.

Although memory cells are arranged in 128 rows and 32 columns in the arrangement of SRAM array shown in FIG. 24, the structure is substantially equivalent with the SRAM array of 256 rows×16 columns. In this case, the dimension in Y direction can be reduced to approximately one half of the SRAM array arrangement of 256 rows×16 columns, and therefore SRAM cells can be arranged in the rectangular SRAM array area shown in FIG. 10 or 18. In the SRAM array arrangement shown in FIG. 24, only one half of memory cells of one row of memory cells are selected, which realizes substantial block dividing operation or partial activation, and thus the SRAM can be driven with low current consumption.

Now, data transfer between DRAM array of FIG. 8 and SRAM array of FIG. 24 will be described with reference to FIGS. 25 through 30.

Figure 25:
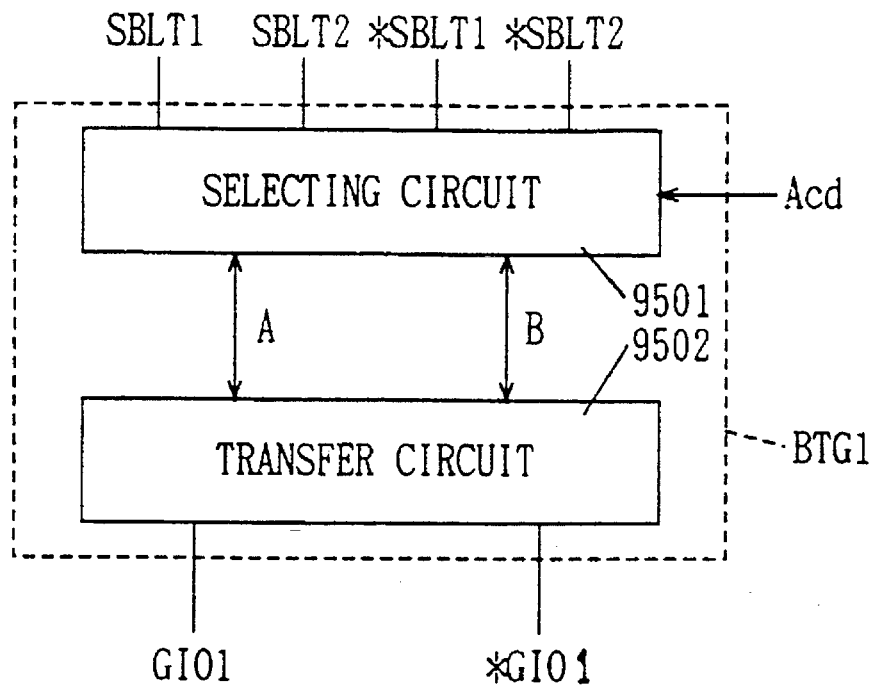

FIG. 25 shows an example of the structure of the transfer gate circuit BTG shown in FIG. 24. FIG. 25 shows, as a representative, a transfer gate circuit BTG1 provided for SRAM bit line pairs SBL1, *SBL1 and SBL2 and *SBL2, that is, for SRAM bit line taking lines SBLT1, *SBLT1, SBLT2 and *SBLT2. Transfer gate circuit BTG includes a selecting circuit 9501 for selecting a pair of bit lines out of two pairs of bit lines in response to an address signal Acd for the SRAM; and a transfer circuit 9502 for connecting global I/O lines GIO1 and *GIO1 to internal nodes A and B for transferring data between nodes A and B and global I/O lines GIO1 and *GIO1.

The least significant bit of the row address for the SRAM is used as the selection control signal applied to the selecting circuit 9501. When selected SRAM word line is an even numbered word line, selecting circuit 9501 selects SRAM bit line taking lines SBLT1 and *SBLT1 corresponding to the even numbered column, and otherwise it selects SRAM bit line taking lines SBLT2 and *SBLT2 corresponding to the odd numbered column.

The details of the structure of transfer circuit 9502 will be described later. Any circuit having the function of bi-directional data transfer may be used.

Figure 26:
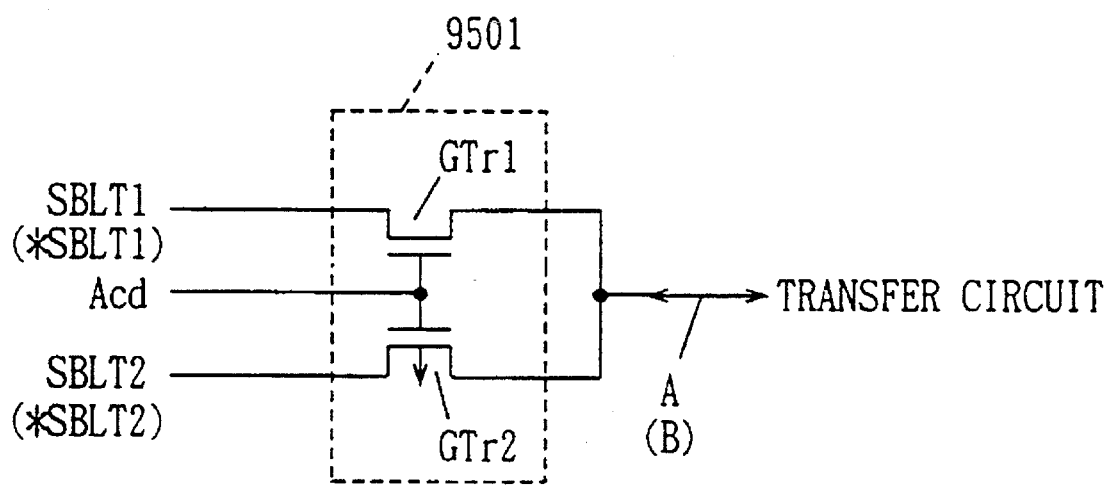

FIG. 26 shows an example of a specific structure of selecting circuit 9501 shown in FIG. 25. Referring to FIG. 26, selecting circuit 9501 includes an n channel MOS transistor GTr1 responsive to a selection control signal Acd for selecting SRAM bit line taking line SBLT1 (or *SBLT1), and a p channel MOS transistor GTr2 responsive to the selection control signal Acd for selecting SRAM bit line taking line SBLT2 (or *SBLT2). The other terminal of each of the transistors GTr1 and GTr2 is connected to node A (or B).

In the structure shown in FIG. 26, when selection control signal Acd is 1 ("H" level), transistor GTr1 is rendered conductive, and SRAM bit line taking line SBLT1 (or *SBLT1) is selected and connected to node A (or B). When selection control signal Acd is 0 ("L" level), SRAM bit line taking line SBLT2 (or *SBLT2) is selected and connected to node A (or B).

In the structure shown in FIG. 24, clamp transistors (indicated by the block CLP) for raising "L" level of potential amplitude are provided for the SRAM bit line pair SBL and *SBL. Therefore, the non-selected bit line pairs are maintained at the "H" clamp potential, and potential of each bit line changes only for the selected columns.

In the SRAM array structure shown in FIG. 24, the clamp transistor (represented by block CLP in FIG. 24) provided for each SRAM bit line pair SBL, *SBL are always kept conductive. A structure in which function of the clamp transistor is stopped during the SRAM word line selecting operation may be used.

Figure 27:
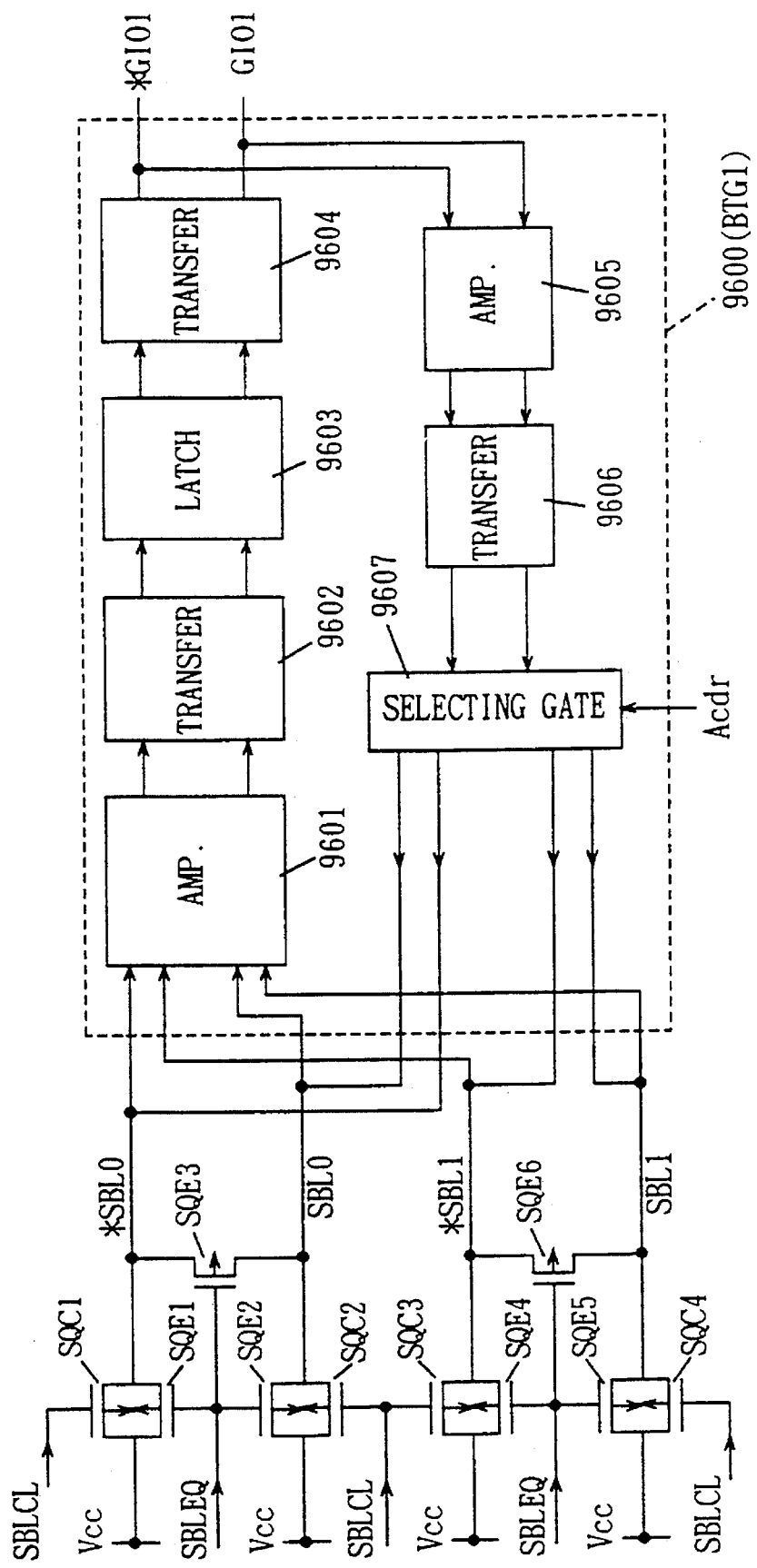

FIG. 27 shows another structure of the SRAM array and a structure of the bi-directional transfer gate circuit used associatively. FIG. 27 shows, as representatives, SRAM bit line pairs SBL0, *SBL0, SBL1 and *SBL1. The SRAM cells are omitted for simplicity of the drawing. Accurately, SRAM bit line taking lines SBLT and *SBLT are connected to the transfer gate circuit (BTG1). However, in FIG. 27, the SRAM bit lines SBL and *SBL are shown to be directly connected to the transfer gate circuit.

Referring to FIG. 27, for SRAM bit line pair SBL0 and *SBL0, p channel MOS transistors SQE1, SQE2 and SQE3 responsive to a SRAM bit line equalizing signal SBLEQ for precharging and equalizing SRAM bit lines SBL0 and *SBL0 to a predetermined potential, and p channel MOS transistors SQC1 and SQC2 responsive to a SRAM bit line clamping signal SBLCL for clamping potentials on SRAM bit lines *SBL0 and SBL0 are provided. Transistors SQE1 and SQE2 precharge SRAM bit lines *SBL0 and SBL0 to a predetermined potential (Vcc) in response to SRAM bit line equalizing signal SBLEQ. Transistor SQE3 equalizes potential on SRAM bit lines SBL0 and *SBL0 in response to SRAM bit line equalizing signal SBLEQ.

Transistors SQC1 and SQC2 clamp potentials on SRAM bit lines *SBL0 and SBL0 in response to SRAM bit line clamping signal SBLCL. Transistors SQC1 and SQC2 also function as load transistors. SRAM bit line equalizing signal SBLEQ is generated at a standby of the SRAM, and SRAM bit line clamping signal SBLCL is set to the inactive state of "H" when a word line is selected in the SRAM array.

For SRAM bit lines *SBL1 and SBL1, p channel MOS transistors SQE4, SQE5 and SQE6 which are rendered conductive in response to SRAM bit line equalizing signal SBLEQ, and p channel MOS transistors SQC3 and SQC4 which are rendered conductive in response to SRAM bit line clamping signal SBLCL are provided. Transistors SQE4 and SQE5 precharge SRAM bit lines *SBL1 and SBL1 at the time of standby. Transistor SQE6 equalizes potentials on bit lines *SBL1 and SBL1 at the standby of the SRAM. Transistors SQC3 and SQC4 clamp potentials on SRAM bit lines *SBL1 and SBL1.

In the SRAM array arrangement shown in FIG. 27, each of the bit lines SBL and *SBL is precharged to the "H" level at the standby of the SRAM, the clamping transistor is rendered non-conductive only when the word line is being selected, and SRAM bit lines are set to the floating state. In this state, when SRAM bit lines SBL0 and *SBL0 are selected, potential change corresponding to the data stored in the selected memory cell appears on the bit lines. Meanwhile, non-selected bit line pair SBL1 and *SBL1 is maintained at "H" level of the potential having been clamped by the clamping transistors SQC3 and SQC4. In such a structure in which potentials of one pair of bit lines out of two pairs of bit lines connected to one transfer gate circuit is at the clamp potential and potential change corresponding to the stored data of the memory cell (SRAM cell) appears only on the other bit line pair, selecting circuit for selecting an SRAM bit line pair is not necessary when data is transferred from the SRAM array to the DRAM array.

The structure shown in FIG. 27 utilizes the fact that the potential of one bit line pair is clamped at "H". Referring to FIG. 27, the transfer gate circuit 9600 (BTG1) includes an amplifier 9601 receiving signal potentials on SRAM bit line pairs SBL0, *SBL0 and SBL1, *SBL1 for amplifying potential of the SRAM bit lines on which potential change is generated; a first transfer circuit 9602 for transferring a signal from amplifier 9601; a latch circuit 9603 for latching signal data transferred from first transfer circuit 9602; and a second transfer circuit 9604 for transferring data latched in latch circuit 9603 to DRAM array (global IO line). Amplifier 9601, first transfer circuit 9602, latch 9603 and second transfer circuit 9604 are used for data transfer from SRAM array to DRAM array.

Bi-directional transfer gate circuit 9600 further includes an amplifier 9605 for amplifying data from global IO lines GIO1 and *GIO1 from the DRAM array; a third transfer circuit 9606 for transferring data amplified by amplifier 9605; and selecting gate 9607 for transmitting data from transfer circuit 9606 by selecting corresponding SRAM bit line pair in accordance with the least significant bit Acdr of the SRAM row address. Amplifier 9605, third transfer circuit 9606 and selecting gate 9607 are used for data transfer from the DRAM array to the SRAM array.

Figure 28:
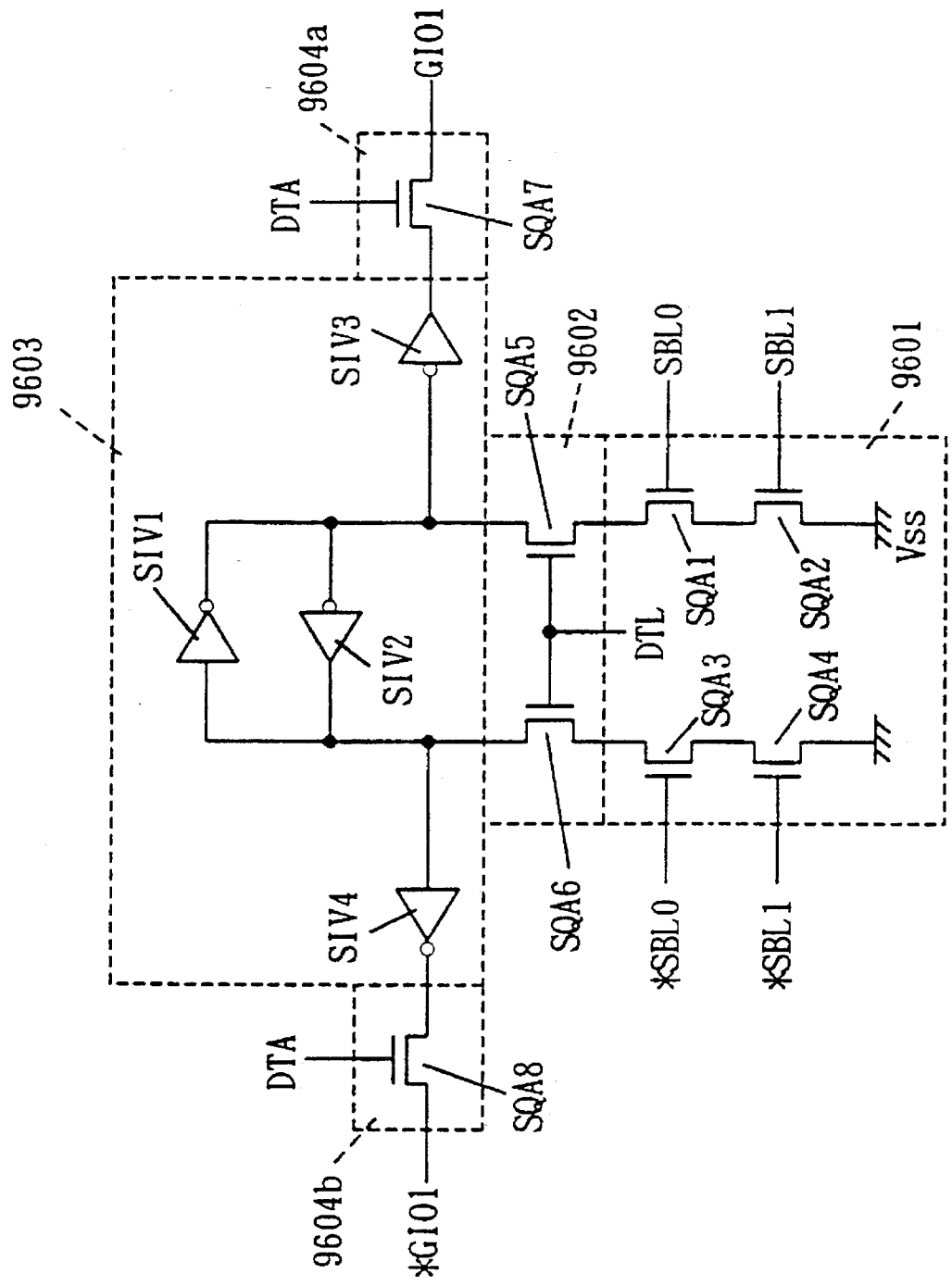

FIG. 28 shows a specific structure of the data transfer path from the SRAM array to the DRAM array. Referring to FIG. 28, amplifier circuit 9601 includes n channel MOS transistors SQA1 and SQA2 having their gates connected to SRAM bit lines SBL0 and SBL1, respectively; and n channel MOS transistors SQA3 and SQA4 having their gate connected to respective complementary SRAM bit lines *SBL0 and *SBL1. Transistors SQA1 and SQA2 are connected in series, and the other conduction terminal of transistor SQA2 is connected to ground potential Vss. Transistors SQA3 and SQA4 are connected in series, and the other conduction terminal of transistor SQA4 is connected to ground potential Vss.

First transfer circuit 9602 includes n channel MOS transistors SQA5 and SQA6 which are rendered conductive in response to data transfer designating signal DTL. Transistor SQA5 is connected in series with transistor SQA1, and transistor SQA6 is connected in series with transistor SQA3.

Latch circuit 9603 includes inverter circuits SIV1 and SIV2 connected in anti-parallel, and inverter circuits SIV3 and SIV4 for inverting data transferred from transfer circuit 9602.

Second data transfer circuit 9604 includes a transfer gate 9604a for transmitting an output from latch circuit 9603 to global I/O line GIO1, and a transfer gate 9604b for transferring data latched in latch circuit 9603 to global I/O line *GIO1. Transfer gates 9604a and 9604b includes n channel MOS transistors SQA7 and SQA8 which are rendered conductive in response to data transfer designating signal DTA, respectively.

Figure 29:
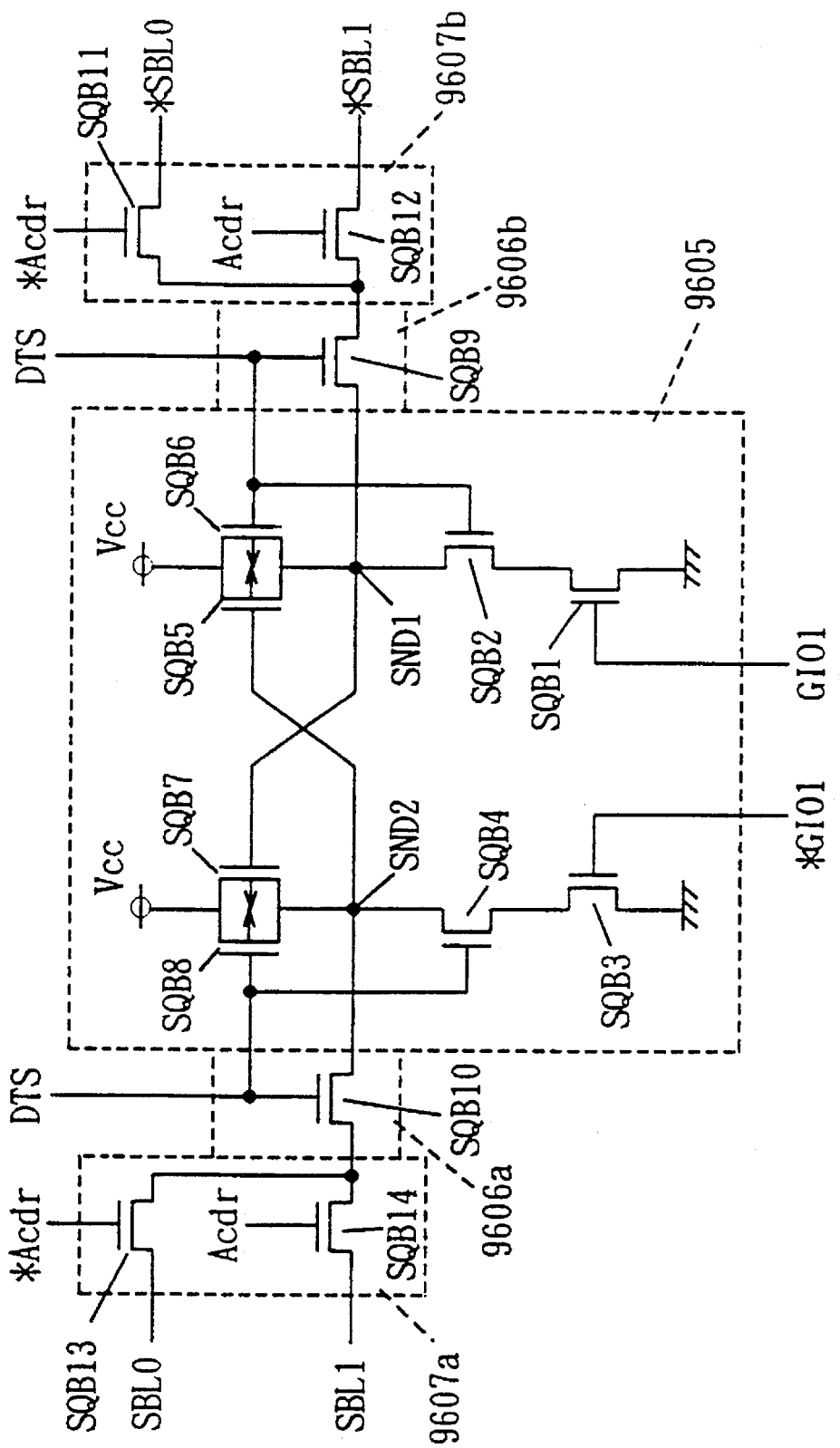

FIG. 29 shows an example of the specific structures of the amplifier, the third transfer circuit and the selecting gate shown in FIG. 27. Referring to FIG. 29, amplifying circuit 9605 includes an n channel MOS transistor SQB1 having its gate connected to the global I/O line GIO1, an n channel MOS transistor SQB3 having its gate connected to the complementary global I/O line *GIO1, n channel MOS transistors SQB2 and SQB4 which are rendered conductive in response to data transfer designating signal DTS for transmitting signal potential amplified by transistors SQB1 and SQB3, and p channel MOS transistors SQB5, SQB6, SQB7 and SQB8 for amplifying and maintaining the signal potential transmitted from the transistors SQB2 and SQB4. Transistors SQB5 and SQB6 are connected in parallel between supply potential Vcc and node SND1. Data transfer designating signal DTS is applied to the gate of transistor SQB6. The transistor SQB5 has its gate connected to node SND2. Transistors SQB7 and SQB8 are connected in parallel between supply potential Vcc and node SND2. Transistor SQB7 has its gate connected to node SND1. Data transfer designating signal DTS is applied to the gate of transistor SQBS.

Third transfer circuit 9606 includes two transfer gates 9606b and 9606a. Transfer gate 9606a includes an n channel MOS transistor SQB10 which is rendered conductive in response to data transfer designating signal DTS for transmitting data amplified by amplifier circuit 9605. Transfer gate 9606 includes an n channel MOS transistor SQB9 which is rendered conductive in response to data transfer designating signal DTS for transmitting signal potential at node SND1 of amplifier circuit 9605.

Selecting gate 9607 includes two selecting gates 9607a and 9607b. Selecting gate 9607a includes an n channel MOS transistor SQB14 which is rendered conductive in response to SRAM address Acdr, and an n channel MOS transistor SQB13 which is rendered conductive in response to SRAM address *Acdr. The least significant bit (Ac4) of the row address of the SRAM array is used to generate the SRAM addresses Acdr and *Acdr.

Selecting gate 9607b includes an n channel MOS transistor SQB12 which is rendered conductive in response to address signal Acdr for transmitting data from transfer gate 9606, and an n channel MOS transistor SQB11 which is rendered conductive in response to complementary address signal *Acdr for transmitting data from transfer gate transistor SQB9. When address signal Acdr is at "H", transistors SQB12 and SQB14 are rendered conductive and bit line pair SBL1 and *SBL1 is selected. When address signal Acdr is at "L", transistors SQB11 and SQB13 are rendered conductive and bit line pair SBL0 and *SBL0 is selected.

Prior to the data transfer operation, the operation of the amplifier circuit 9605 will be briefly described. Assume that global I/O line GIO1 is at "H" and global I/O line *GIO1 is at "L". In this case, if the signal DTS is at "H", transistor SQB1 is conductive and transistor SQB3 is rendered non-conductive. Potential at node SND1 is discharged to ground potential Vss, while there is no discharging path for the potential at node SND2. In this case, transistor SQB7 is rendered conductive, and potential of node SND2 is charged by transistor SQB7. Therefore, the potential at node SND2 is set to "H" and potential at node SND1 is set to "L". When data transfer is to be designated, data transfer designating signal DTS rises to "H". Therefore, in data transfer, transistors SQB6 and SQB8 are rendered non-conductive, and potentials at nodes SND1 and SND2 are rapidly set at potentials corresponding to the data which is to be transferred. Normally, the signal DTS is at "L", and nodes SND1 and SND2 are maintained at "H" level by transistors SQB6 and SQB8. The data transfer operation of the transfer circuit shown in FIG. 27 will be described with reference to FIG. 30, which is a diagram of signal waveforms.

In data transfer operation of transfer circuit 9600 shown in FIG. 27, data is transferred from the SRAM array to latch circuit 9603, while data is transferred from the DRAM array to the SRAM array. Thereafter, data which has been latched in latch circuit 9603 is transferred to DRAM array. The data transfer operation of transfer circuit will be described in detail later.

When SRAM bit line equalizing signal SBLEQ rises to "H", SRAM enters the memory cycle. In response, precharge and equalizing transistors SQE1 to SQE6 provided for each bit line pair SBL, *SBL are rendered non-conductive. At this time, SRAM bit line clamping signal SBLCL is still at "L", and each bit line SBL, *SBL is maintained at "H" level through the clamping transistors (SQC1, SQC2, SQC3 and SQC4).

Thereafter, word line selecting operation is executed in the SRAM array, and the SRAM word line rises. Approximately at the same time, the SRAM bit line clamping signal SBLCL rises to "H". Timing of rising of clamping signal SBLCL may be set earlier than the word line selecting timing in the SRAM array. Consequently, data of half of the memory cells of one row are read. Assume that word line SWL1 is selected. In this case, referring to FIG. 27, SRAM bit line pair SBL0 and *SBL0 maintain "H" level as in the standby state. Meanwhile, potentials of SRAM bit line pair SBL1 and *SBL attain the levels corresponding to the data stored in the memory cells connected thereto. In this case, referring to FIG. 28, transistors SQA1 and SQA3 are rendered conductive. Conduction/non conduction of transistors SQA2 and SQA4 is determined dependent on the data of the selected memory cell at that time.

Responsive to the rise of data transfer designating signal DTL to "H", signal potentials on SRAM bit lines SBL1 and *SBL1 are latched by latch circuit 9603.

In parallel to the latching operation, data transfer from the DRAM array to the SRAM array is executed. In the SRAM array, the word line is kept at the selected state. When signal potentials on global I/O lines GIO1 and *GIO1 are established, conduction/non conduction of transistors SQB1 and SQB3 is determined (see FIG. 29). Thereafter, when data transfer designating signal DTS is generated, transistors SQB2 and SQB4 are rendered conductive, data on global I/O lines GIO1 and *GIO1 are inverted and amplified to be maintained at nodes SND1 and SND2.

Figure 30:
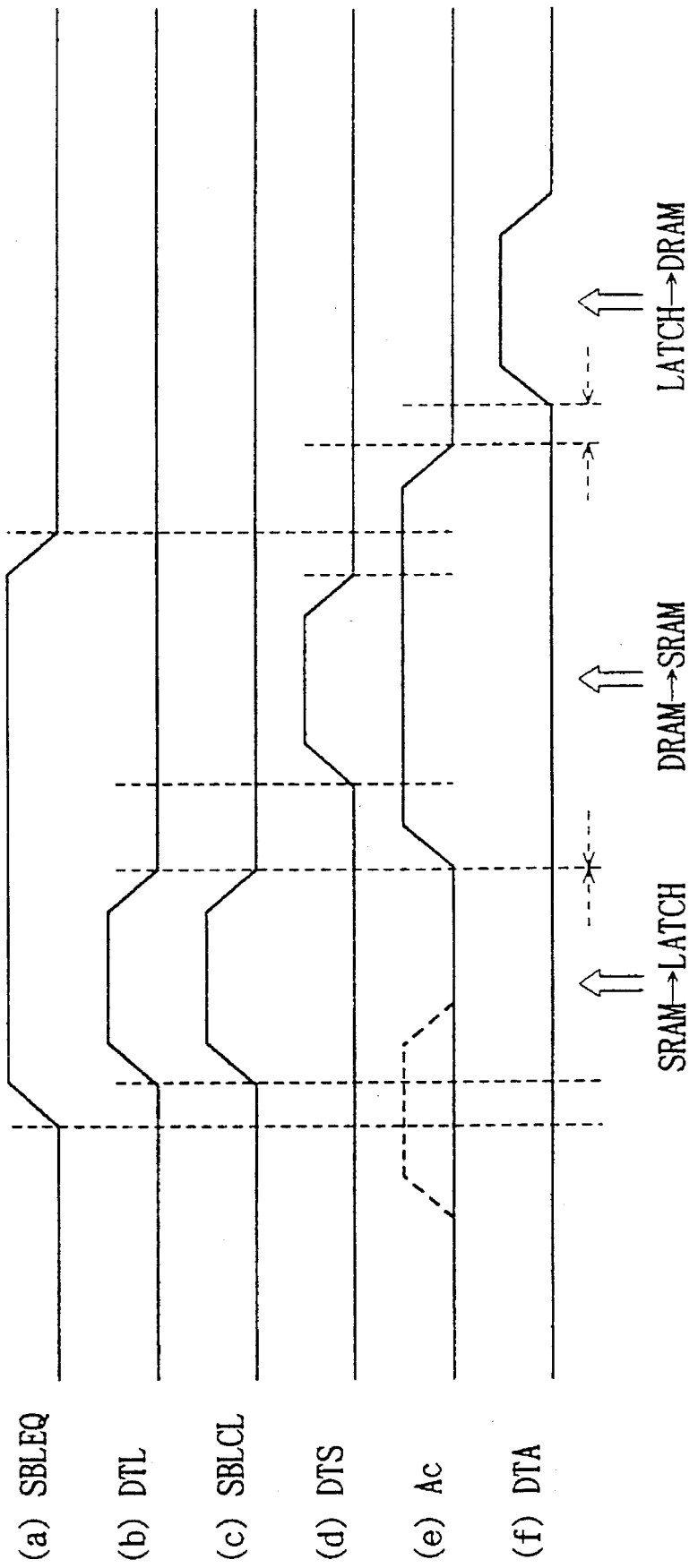

The data at nodes SND1 and SND2 are transmitted to selecting gates 9607b and 9607a through transfer gates SQB9 and SQB10 which are already conductive in response to the signal DTS. Now, since word line SWL1 is selected and address signal Acdr is at "H", transistors SQB14 and SQB12 are rendered conductive, and data on transfer gates 9606b and 9606a are transmitted to SRAM bit line pair *SBL1 and SBL1. Consequently, data are transferred to the corresponding SRAM memory cells. In FIG. 30, the reference character Ac represents the SRAM address in data transfer from the DRAM array to the SRAM array.

Then, after the data transfer from the DRAM array to the SRAM array, the DRAM is once returned to the standby state. When the DRAM array is rendered active, the data which has been latched in latch circuit 9603 is transmitted to the DRAM array (global I/O lines GIO1 and *GIO1). In this case, data transfer designating signal DTA attains "H", transfer gates 9604a and 9604b are rendered conductive, and data which has been latched in latch circuit 9603 is transmitted to global IO lines GIO1 and *GIO1. During data transfer from the latch circuit 9603 to the DRAM array, the SRAM array can be independently accessed.

When the SRAM word line is selected, the SRAM bit line clamping signal SBLCL is set to "H" in order to surely set the amplifying transistor included in the amplifier circuit 9601 to conductive/non-conductive state during data transfer. In this case, a structure may be used in which clamping function is set to non-operative state only during data transfer, and the clamp signal SBLCL is always kept active when the SRAM array is accessed with data transfer not being carried out. A structure for block division or partial activation in which SRAM bit line pair is selected dependent on the even/odd row address may be used for writing/reading of data of the SRAM array.

Data transfer operation between DRAM array and SRAM array will be discussed in more detail later.

As described above, since one row of SRAM cells are divided into a plurality of groups and a plurality of word lines are arranged corresponding to respective groups for each row, an SRAM array which can have an arbitrary shape without changing memory structure of rows and columns can be provided.

Since the shape of the SRAM array can be arbitrary selected, the degree of freedom in designing the SRAM array arrangement is improved. Therefore, an SRAM array having optimal shape for the DRAM array can be arranged, and therefore a semiconductor memory device containing a cache having high density and high degree of integration effectively utilizing chip area can be provided.

Since the shape of the SRAM array can be changed without changing the memory structure, a semiconductor memory device which can be contained easily in a package having an arbitrary shape can be provided.

[Pin Arrangement]

FIG. 31 shows an example of a pin arrangement of a package housing the CDRAM having the array arrangement [Array Arrangement 3] shown in FIG. 10. As shown in FIG. 10, the CDRAM contained in the package of FIG. 31 includes a 4M bit DRAM and a 16K bit SRAM integrated on one chip. The CDRAM is housed in a 300 mil TSOP (Thin Small Outline Package) of type II with lead pitch of 0.8 mm, chip length of 18.4 mm and 44 pins.

The CDRAM has two data input/output modes, that is, D/Q separation and masked write. D/Q separation is a mode of inputting/outputting write data D and output data Q through separate pins. Masked writing is an operation mode in which write data D and read data Q are output through the same pin terminal, and writing of external data can be masked.

In order to effectively supply the supply voltage to CDRAM and to facilitate layout of power supply interconnection, three pins are provided for each of the supply potential Vcc and Gnd. More specifically, external supply potential Vcc is supplied to pins of the pin numbers 1, 11 and 33. The supply potential Vcc supplied to the pins 1, 11 and 33 may have the same voltage values as the operational supply potential vcc. Alternatively, the external supply potential Vcc supplied to the pins 1, 11 and 33 may be lowered in the device to supply the operational supply potential. The ground potential GND is supplied to the pins of the numbers 12, 22 and 34. Pins of the numbers 11, 12, 33 and 34 at the center provide operational power supply for SRAM, while pins of the numbers 1 and 22 provide power supply for DRAM.

A cache inhibiting signal CI# indicating cache access inhibition is applied to a pin terminal of the number 4. When the cache inhibition signal CI# is set to "L", access to the SRAM array is inhibited, and direct access (array access) to the DRAM array is allowed.

A write enable signal W# indicating data writing mode is applied to the pin of the number 5. A chip select signal E# indicating that this chip is selected, is applied to a pin of the number 18.

A command register designating signal CR# for designating the special mode is applied to a pin of the pin number 23. When the command register designating signal CR# is "L", command addresses At0 and Ar1 applied to the pins of the numbers 2 and 3 are rendered valid, enabling setting of the special mode (selection of a register).

A cache hit signal CH# indicating a cache hit is applied to a pin of the pin number 27. If the cache hit signal CH# is "L", access to the cache (SRAM) is possible. An output enable signal G# indicating an output mode is applied to a pin of the number 40. A clock signal K is applied to the pin of the number 41.

A refresh designating signal REF# designating refreshing of the DRAM array is applied to a pin of the number 44. When the refresh designating signal REF# attains to "L", automatic refreshing of the DRAM array inside is carried out in the cycle.

When self refreshing is designated, the pin terminal of the pin number 44 is switched to an output terminal. When self refreshing is effected, a signal BUSY# indicating execution of self refreshing is output from the pin terminal of the pin number 44. It becomes possible to know the timing of the self refreshing outside the CDRAM by this signal BUSY#, and therefore self refreshing can be utilized in a normal cycle.

Different data are applied to the pins of the numbers 9, 10, 13, 14, 31, 32, 35 and 36 dependent on the two different operation modes, that is, D/Q separation and masked write. The operation modes of D/Q separation and masked write are set by a command register (which will be described later).

In masked write mode, pins of the numbers 10, 13, 32 and 35 are used as common data input and output terminals for commonly carrying out data input/output. Pins of the numbers 9, 14, 31, 35 and 36 receive masked write designating data M0, M1, M2 and M3 for indicating which data applied to which input/output pins should be masked, respectively.

In D/Q separation mode, pins of the numbers 9, 14, 31 and 36 are used as pins for inputting write data D0, D1, D2 and D3. Pins of the numbers 10, 13, 32 and 35 are used as data output pins for outputting read data Q0, Q1, Q2 and Q3.

SRAM addresses Ac0 to Ac11 and DRAM addresses (array addresses) Aa0 to Aa9 are applied through separate pin terminals and independent from each other. In the pin arrangement shown in FIG. 31, external operation control signals generally used in a standard DRAM, that is, row address strobe signal/RAS and column address strobe signal/ CAS are not used. In the CDRAM contained in the package of FIG. 31 (see FIG. 10), data and control signals are input in response to a rising edge of an external clock signal K.

[Internal Function]

In this section, internal functions of CDRAM are briefly described.

(i) FIG. 32 is a block diagram showing internal structure of the CDRAM chip housed in a package of FIG. 31. The block arrangement shown in FIG. 31 is for the purpose of functionally showing the internal structure of the CDRAM, and it should be noted that the structure shown in this figure is not the same as the actual layout.

Referring to FIG. 32, a CDRAM includes a DRAM 100 and a SRAM 200. DRAM 100 comprises a 4M bit DRAM array 101; a DRAM row decoder block 102 for decoding an applied internal row address for the DRAM and for selecting 4 rows from DRAM array 101; a DRAM column decoder block 103 for decoding applied internal column address for DRAM and for selecting one column from each of the selected 4 rows in a normal operation mode (array access); and a block 104 including DRAM sense amplifiers DSA for detecting and amplifying data of the memory cells connected to the selected rows, and selecting gates SG responsive to a column selecting signal from block 103 for selecting 16 bits of DRAM array 101 in a data transfer mode and for selecting 4 bits of memory cells in an array access mode.

SRAM 200 comprises an SRAM array 201 having the capacity of 16K bits; a SRAM row decoder block 202 for decoding an internal row address for the SRAM and for selecting 4 rows from SRAM array 201; and a column decoder sense amplifier block 203 including SRAM column decoders and SRAM sense amplifiers for decoding the internal column address for the SRAM, selecting 1 bit from each of the selected 4 rows and connect the same to an internal data bus 251, and for detecting and amplifying information of the selected SRAM cells in data reading. A bi-directional transfer gate circuit 210 is provided between DRAM 100 and SRAM 200. Referring to FIG. 32, the gate circuit 210 may be connected to an output (input) of the column decoder/sense amplifier block 203, as in the arrangement of FIG. 10. However, in FIG. 32, data input/output to and from DRAM 100 are carried out through the common data bus 251 in the array access mode, and therefore the common data bus 251 is shown as coupled to bi-directional transfer gate circuit 210.

The CDRAM in accordance with the present invention further comprises a control clock buffer 250 receiving externally applied control signals G#, W#, E#, CH#, CI#, REF# and CR# to generate internal control signals G, W, E, CH, CI, REF and CR; an address buffer 252 for generating an internal address int-Aa for the DRAM and an internal address int-Ac for the SRAM; and a clock buffer 254 for buffering an externally applied clock signal K. Control clock buffer 250 takes an applied control signal and generates an internal control signal in response to a rise of an internal clock from clock buffer 254. An output from clock buffer 254 is also applied to address buffer 252. Address buffer 252 takes an externally applied addresses Aa and Ac which are applied when the internal chip enable signal E is active at a rising edge of the clock K from the clock buffer 254 and generates internal addresses int-Aa and int-Ac.

The CDRAM includes a refresh circuit 290 for refreshing memory cells in DRAM array 100. Refresh circuit 290 includes a counter circuit 293 which is activated in response to internal refresh designating signal REF for generating a refresh address of the DRAM array; and an address multiplex circuit 258 for applying either a refresh address from counter circuit 256 or an internal row address from address buffer 252 to DRAM row decoder block 102 in response to a switching signal MUX from a refresh control circuit 292. Refresh control circuit 292 is driven in response to a refresh request from an automatic refresh mode detecting circuit 291. The refresh operation will be described later.

The CDRAM further comprises a DRAM array driving circuit 260 responsive to the internal control signals E, CH, CI and REF for generating various control signals for driving DRAM 100; a transfer gate controlling circuit 262 responsive to the internal control signals E, CH and CI for generating signals for controlling transfer operation of bi-directional transfer gate 210; and a SRAM array driving circuit 264 responsive to internal chip select signal E for generating various control signals for driving SRAM 200.

The CDRAM in accordance with the present invention further comprises a command register 270 which is activated in response to an internal control signal CR for generating a command CM for designating operation mode of the CDRAM in response to external write enable signal W# and to command addresses Ar (Am0 and Ar1); a data input/ output control circuit 272 for controlling data input/output in accordance with the internal control signals G, E, CH, CI and W and to the special mode command CM; an input/ output circuit 274 formed of an input/output buffer and an output register for inputting/outputting data between common data bus 251 and the outside of the device. An output register is provided in the input/output circuit 274 for realizing a latched output mode and a registered output mode, which are the special modes of the CDRAM. Data input/output control circuit 272 sets input/output timing of data in accordance with the mode designated by the special mode command CM as well as the manner of input/output of data. In FIG. 32, manners of data input/output pins in masked write mode is shown as an example.

The CDRAM further includes an additional function control circuit 299 for realizing various functions. Functions realized by additional function control circuit 299 will be described in detail later. The function includes prohibition of generation of internal clocks at the time of standby, switching between autorefresh/self refresh, switching of address generating source in burst mode, and the like. Structures of various circuits will be described in the following.

[Input/Output Circuit]

(Connection Between DRAM Array, SRAM Array and Internal Data Line)

Figure 33:
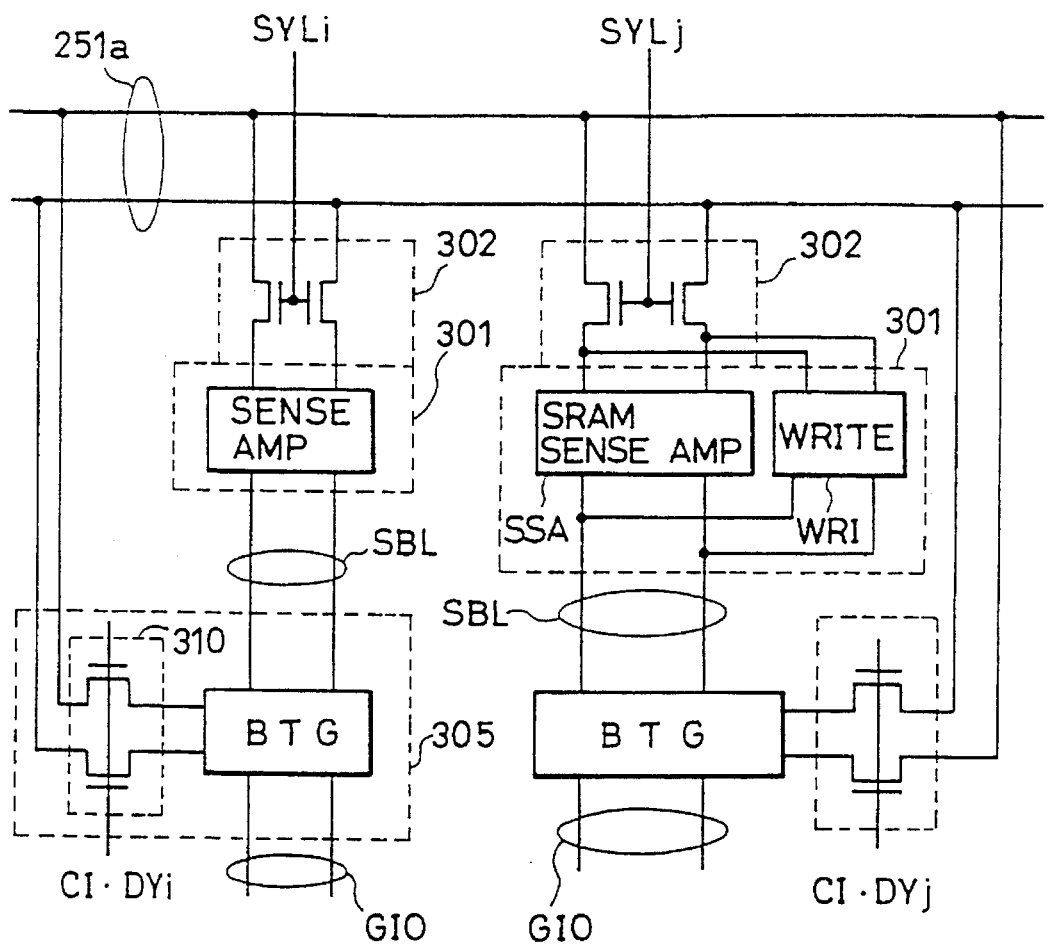
FIGS. 33 through 43B represent data outputting operation of the CDRAM.

FIG. 33 shows one example of manner of connection of bi-directional transfer gate circuit (BTG) and internal common data line 251 shown in FIG. 32. Referring to FIG. 33, a SRAM input/output gate 301 comprises SRAM sense amplifier SSA and write circuit WRI which is activated in data writing to SRAM array for transmitting data on internal data line 251a to a corresponding SRAM bit line pair SBL. SRAM bit line pair SBL is connected through SRAM sense amplifier SSA and SRAM column selecting gate 302 to internal data line 251a. A SRAM column selecting signal SYL from SRAM column decoder block 203 is applied to SRAM selecting gate 302. Consequently, a pair of SRAM column bit line pair SBL only is connected to internal data line 251a. Internal data line 251 shown in FIG. 32 transfers 4 bits of data, and only an internal data line corresponding to 1 bit is shown in FIG. 33.

Referring to FIG. 33, the CDRAM further comprises an access switching circuit 310 responsive to a logical product signal on cache inhibiting signal CI and DRAM column selecting signal DY for connecting global I/O line pair GIO to internal data line 251a for enabling array access. Access switching circuit 310 and bi-directional transfer gate BTG are included in transfer gate circuit block 305.

The column selecting signal DYi of DRAM is generated by decoding, for example, lower 4 bits of a column address. More specifically, 16 pairs of global I/O lines GIO are provided for one DRAM memory mat (having the capacity of 1M bits). For array accessing, only one pair must be selected therefrom. Therefore, column selecting signal DYi is generated by decoding lower 4 bits of column address for DRAM.

The access switching circuit 310 simply connects global I/O line pair GIO to internal data line 251a, and connection to corresponding signal lines are carried out in bi-directional transfer gate BTG. A structure in which global I/O line pair GIO is connected to internal data line 251a through SRAM sense amplifier SSA may be used to realize array accessing, without providing such an access switching circuit 310. At this time, column selecting signal applied to SRAM selecting gate 302 is a selecting signal based on column address to the DRAM. This is realized by a circuit multiplexing the column selecting signal by the signal CI. Such a multiplex circuit applies column selecting signal for DRAM to SRAM selecting gate, when the signal CI is active.

In the SRAM, a SRAM sense amplifier SSA is provided for each SRAM bit line pair SBL. However, one SRAM sense amplifier may be provided for the SRAM bit line pairs of 1 block, as in a normal SRAM. However, when the SRAM sense amplifier is provided for each SRAM bit line SBL, output of data can be more surely carried out at high speed. If the SRAM sense amplifier SSA has the same structure as the DRAM sense amplifier, it is not necessary to provide writing circuit WRI.

Figure 34:
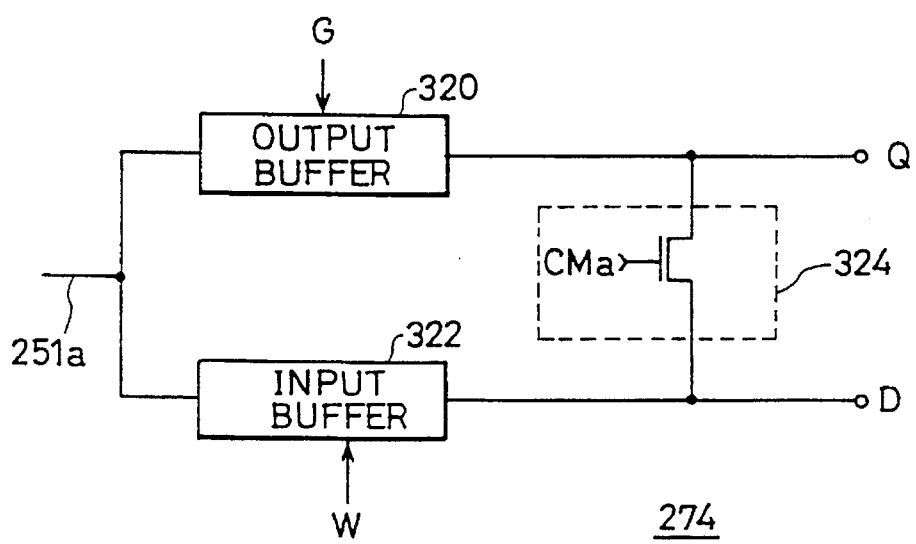
Figure 35:
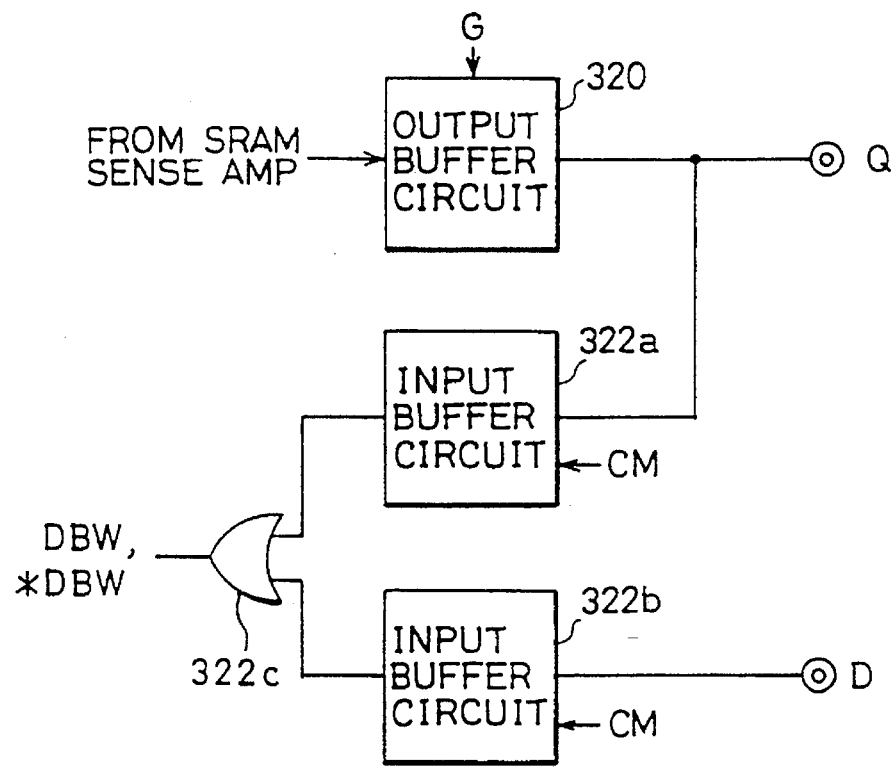
Figure 36:
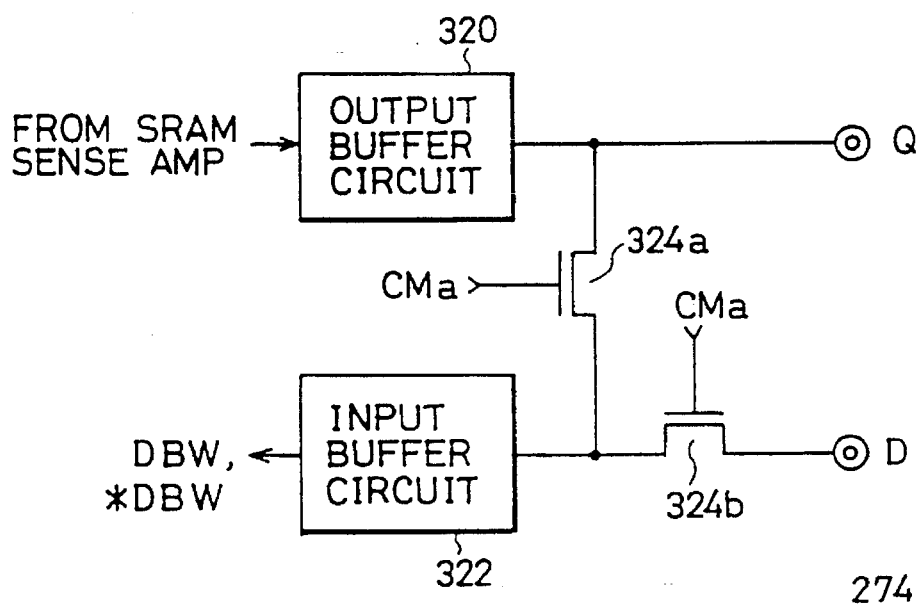

[Data Input/Output Circuitry with Reference to FIGS. 34 to 36: Separated DQ and D/Q common structure]

FIG. 34 shows a structure for realizing D/Q separation in input/output circuit 274. Referring to FIG. 34, input/output circuit 274 comprises an output buffer 320 which is activated in response to an internal output enable signal G for generating output data Q from data on internal data line 251a; an input buffer 322 which is activated in response to an internal write designating signal W for generating internal write data from external write data D and transmitting the same to internal data line 251; and a switch circuit 324 responsive to a D/Q separation designating bit CMa from command register 270 (see FIG. 32) for short-circuiting an output from output buffer 320 and an input of input buffer 322. D/Q separation designating bit CMa is included in a special mode designating command CM generated from command register 270. If the switch circuit 324 is rendered conductive, input/output of data are carried out through the same pin. If the switch circuit 324 is off, input/output of data are carried out through separate pins. Structure related to data input/output of 1 bit only is shown in FIG. 34 as a representative.

FIG. 35 shows connection between data input/output circuit and other portions. Referring to FIG. 35, output buffer circuit 320 receives data from selected memory cell data of DRAM array or SRAM sense amplifier to transmit the same to an external output pin Q. A first input buffer circuit 322a is connected to external pin terminal Q, and a second input buffer circuit 320b is connected to an external data input pin terminal D. Outputs of the first and second input buffer circuits 322a and 322b are transmitted through an OR circuit 322c to internal data buses DBW, *DBW (251a). Enabling/disabling of the first and second input buffer circuits 322a and 322b are carried out in response to designation bit CM from command register (see FIG. 32). If the command register designates D/Q separation mode, the first input buffer circuit 322a is disabled, and input buffer circuit 322b is enabled. If the designation bit CM designates masked write mode common to D/Q, the first input buffer circuit 322a is enabled and the second input buffer circuit 322b is disabled.

In the structure shown in FIG. 35, data from SRAM sense amplifier are transmitted to output buffer circuit 320, since this figure shows a case in which data of selected memory cells of the DRAM array are transmitted to internal data bus through column lines (bit lines) of SRAM array and through sense amplifiers of the SRAM. More specifically, this figure shows an example of the structure of FIG. 33 without the gate 310, in which column selecting signals SYLi and SYLj applied to gate 302 are commonly used as the DRAM column decoder outputs DYi and DYj. This structure will be described later.

FIG. 36 shows a further structure of the input/output circuit. Referring to FIG. 36, a transistor 324a which is turned on in response to the designation bit CMa is provided between output buffer circuit 320 and input buffer circuit 322. A transistor gate 324b which is turned on in response to a complementary designation bit/CMa is provided between input buffer circuit 322 and a data input pin terminal D. In this structure, when designation bit CMa designates D/Q separation mode, the transistor gate 324a is turned off, and the transistor gate 324b is turned on. Conversely, if the designation bit CMa designates masked write mode with common D/Q pin, the transistor gate 324a is turned on and the transistor gate 324b is turned off.

By this structure, input buffer circuit 322 can be selectively connected to data output pin terminal Q or to data input pin terminal D, whereby D/Q separation mode and D/Q common mode can be selectively set.

[Data output modes of transparent, latched and registered modes with reference to FIGS. 37 through 43B]

A circuit structure for setting a data output mode of the input/output circuit will be described. The data output mode is set by a command register.

The data output mode is set to transparent mode, latch mode or register mode in accordance with the set data set in the command register.

Figure 37:
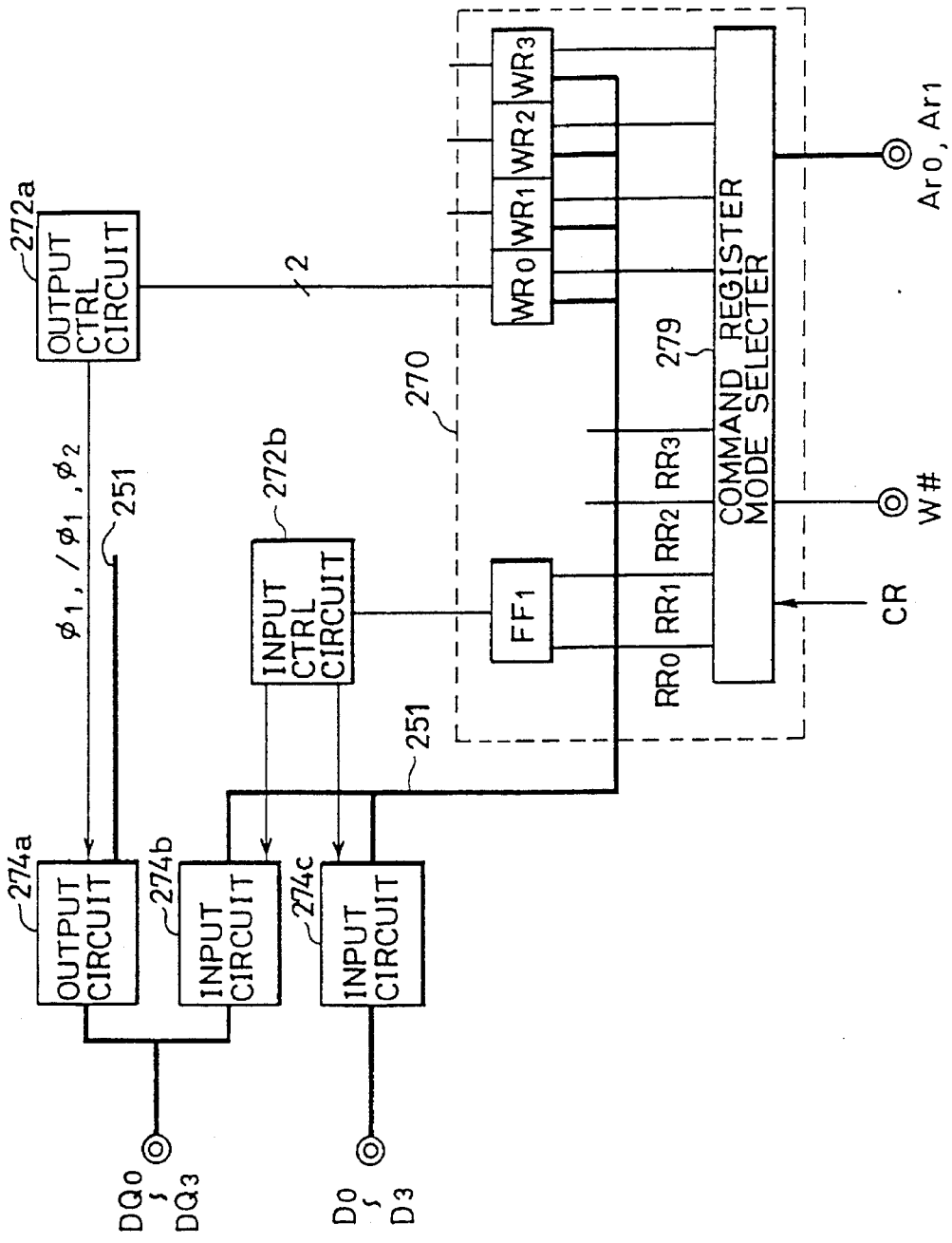

FIG. 37 shows a circuit structure related to setting of data output mode. Referring to FIG. 37, command register 270 includes a command register mode selector 279 responsive to a command register mode detecting signal (internal command register signal) CR for decoding write enable signal W# and command data At0 and Ar1, registers WR0–WR3, and a flipflop FF1. Command register includes 8 registers RR0–RR3 and WR0–WR3, as will be described later. However, in FIG. 37, registers RR2 and RR3 are not shown. Each of the registers WR0–WR3 is a 4-bit register. Registers RR0 and RR1 share one flipflop FF1. When register RR0 is selected, flipflop FF1 is set to masked write mode. When register RR1 is selected, flipflop FF1 is set to D/Q separation mode in which D pins and Q pins are separated. An input control circuit 272b selects either an input circuit 274b or 274c dependent on the data set in the flipflop FF1.

By decoding command data Ar0 and Ar1, it is determined to which register WR0–WR3 the data is to be set. When write enable signal W# is active, 4 bits of data D0–D3 (or DQ0–DQ3) are set to a corresponding register, through the input circuit 274b or 274c selected by input control circuit 272b. Since register WR0 is related to data output mode, setting of data output mode will be described. Output control circuit 272a is set in a transparent, latched or registered output mode in accordance with lower 2 bits of data of the register WR0, and it outputs control signals $\phi1$, $/\phi1$ and $\phi2$ for selectively activating output circuit 274a, dependent on the set output mode.

Figure 38:
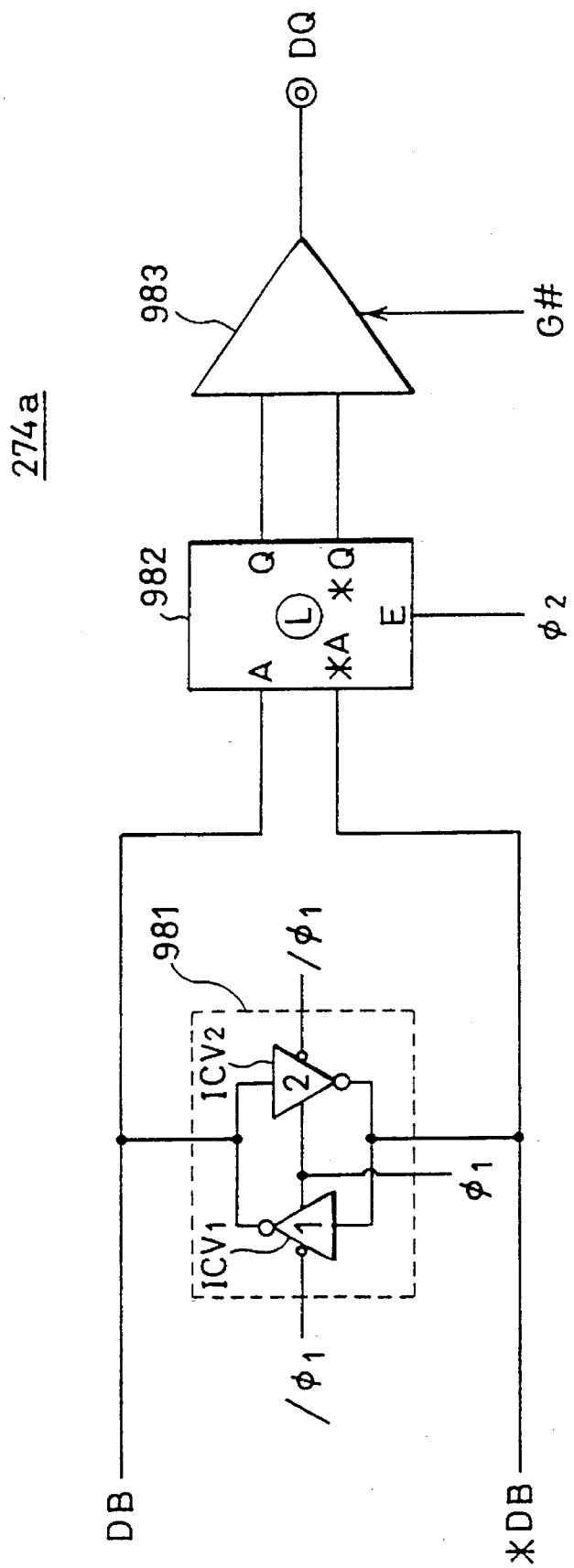

FIG. 38 shows an example of a specific structure of the output circuit 274a. Referring to FIG. 38, output circuit 274a includes a first output latch 981 responsive to control signals $\phi1$ and $/\phi1$ for latching data on read data buses DB and *DB, a second output latch 982 responsive to a clock signal $\phi2$ for passing data latched in output latch 1 or data on data buses DB and *DB, and an output buffer 983 receiving data from output latch 982 for transmitting the same as output data to an external pin terminal DQ in response to control signal G#.

First output latch 981 includes clocked inverters ICV1 and ICV2 which are activated in response to clock signals $\phi1$ and $/\phi1$. An input and an output of clocked inverter ICV1 are connected to an output and an input of clocked inverter ICV2, respectively. Output latch 981 is set to a latched state when clock signal $\phi1$ is "H". Namely, clocked inverters ICV1 and ICV2 are activated when clock signal $\phi1$ is "H" and serve as an inverter. When clock signal $\phi1$ is "L", clocked inverters ICV1 and ICV2 are disabled, and latch 981 does not carry out latching operation.

Second output latch 982 latches data applied to inputs A and *A and outputs the data from outputs Q and *Q, when clock signal $\phi2$ is at "L". Output latch 982 outputs data latched when clock signal $\phi2$ is at "L" from outputs Q and *Q regardless of the signal state at inputs A and *A, when clock signal $\phi2$ is "H". Clock signals $\phi1$, $/\phi1$ and $\phi2$ controlling the latching operation are synchronous with external clock K, and timings of generation thereof are made different from each other by output control circuit 272a.

Output buffer 983 is activated when output enable signal G# is made active, and transmits output data from output latch 982 to a terminal DQ.

Figure 39:
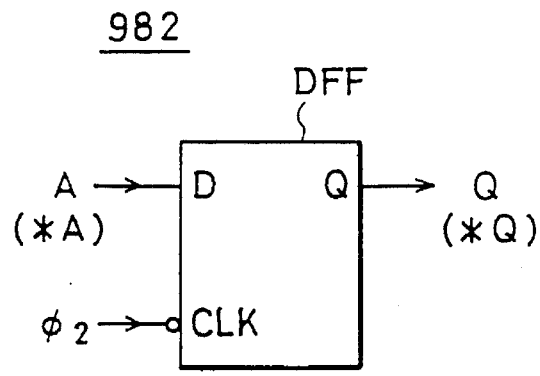

FIG. 39 shows an example of a specific structure of second output latch 982. Referring to FIG. 39, second output latch 982 includes a D flipflop DFF receiving an input A (*A) at a D input thereof and receiving clock signal $\phi2$ at its clock input CLK. An output Q (*Q) of output latch 982 is provided from output Q of the flipflop DFF. The D flipflop DFF is of a down edge trigger type. It takes an input A at a timing of a fall of the clock signal $\phi2$ to L, and outputs input A as received while clock signal $\phi2$ is "L". When clock signal $\phi2$ is at "H", it outputs previously latched data, regardless of the state of the input A applied to input terminal D. Thus, an output latch 982 realizing desired function is provided. D type flipflop DFF is provided for each of the inputs A and *A. The output latch 982 may have other structure. Any circuit structure capable of realizing latched state and through state in response to clock signal $\phi2$ may be used.

Figure 40:
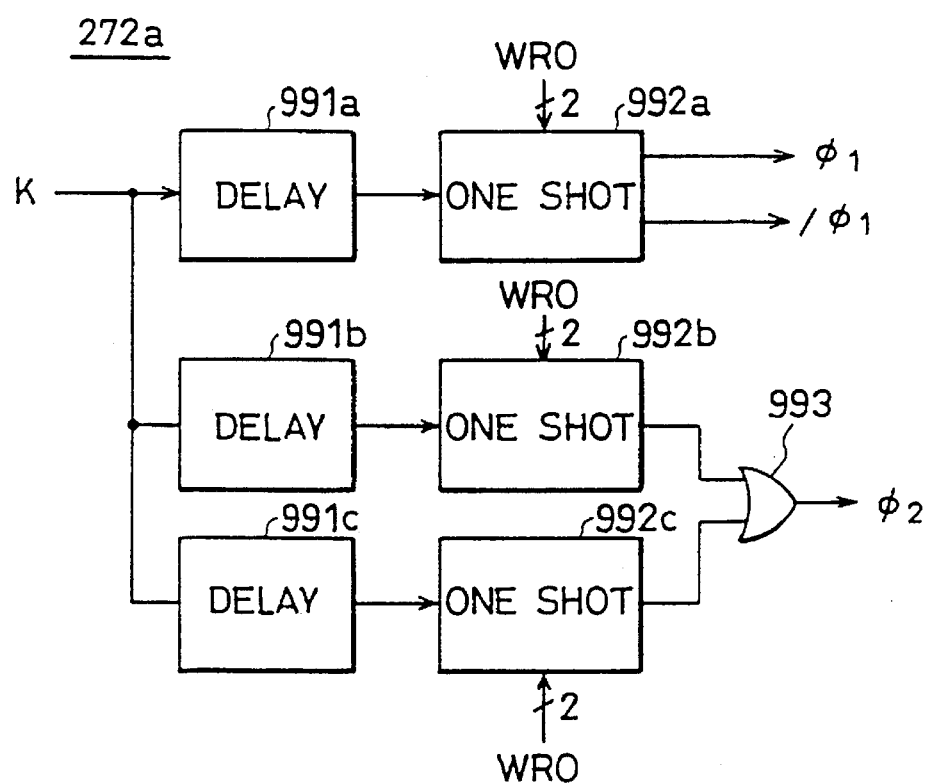

FIG. 40 shows an example of a specific structure of the output control circuit 271a. Output control circuit 272a includes delay circuits 981a, 981b and 981c for providing a predetermined time delay to the external clock; a one shot pulse generating circuit 992a for generating a one shot pulse signal having a predetermined pulse width in response to an output from delay circuit 991a; a one shot pulse generating circuit 992b for generating a one shot pulse signal having a predetermined pulse width in response to an output from delay circuit 991b; and a one shot pulse generating circuit 992c for generating a one shot pulse signal having a predetermined pulse width in response to an output from delay circuit 991c. Clock signals $\phi1$ and $/\phi1$ are generated from one shot pulse generating circuit 992a.

Outputs from one shot pulse generating circuits 992b and 992c are applied to an OR circuit 993. Clock signal $\phi2$ is generated from OR circuit 993. Delay time provided by the delay circuit 991b is shorter than the delay time provided by the delay circuit 991c. Enable/disable of one shot pulse generating circuits 992a to 992c is set by 2 bits of command data WR0. When 2 bits of command data WR0 represents latch mode, one shot pulse generating circuits 992a and 992c are enabled, and one shot pulse generating circuit 992b is disabled. Operation of the command register and the data output circuit shown in FIGS. 37 to 40 will be described.

Figure 41:
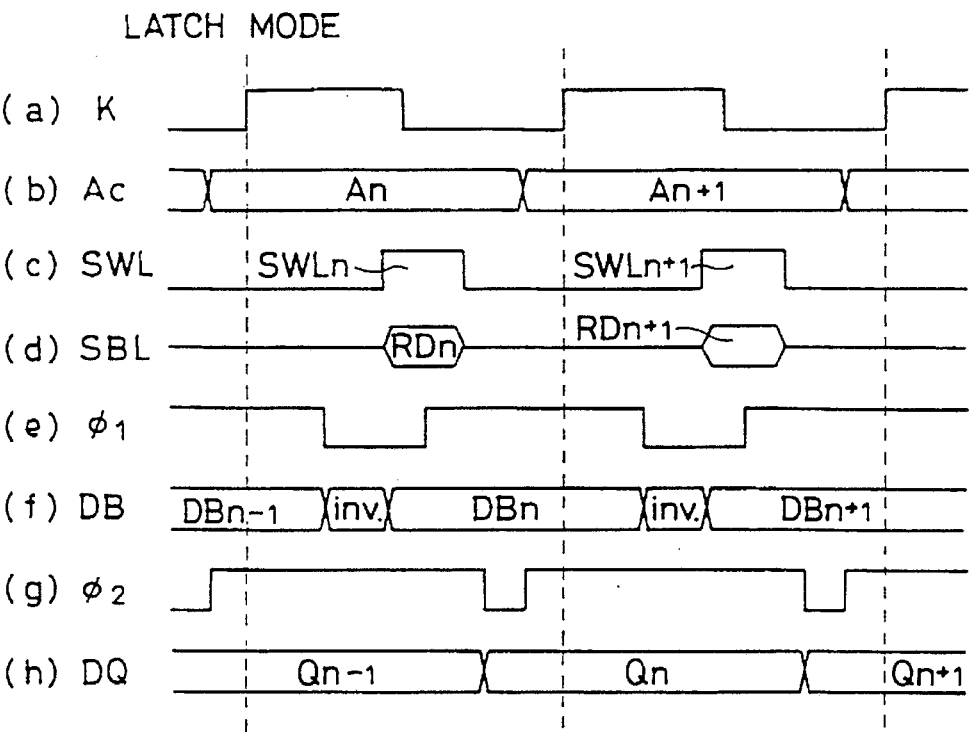

First, latch operation will be described with reference to FIG. 41, which is a diagram of signal waveforms. Latched output mode as the data output mode is set by setting lower 2 bits of command data register WR0 to (01). At this time, one shot pulse generating circuits 992a and 992c are enabled. Let us assume that output enable signal G# is at an active state of "L", indicating data output. At this time, an external address An is taken into an address buffer at a rising edge of the clock K, a corresponding SRAM word line SWLn is selected, and data RDn appears on the SRAM bit line SBL. At this time, one shot pulse generating circuit 992a generates a one shot pulse at a predetermined timing in response to the rise of external clock K, and is kept at "L" for a predetermined time period. When the clock signal $\phi1$ falls to "L", latch operation of output latch 981 is prohibited. At this time, clock signal $\phi2$ is at "H" maintaining the latch state, latches and outputs data Qn−1 which has been read in the previous cycle. 4 bits of data selected in accordance with an external address out of 64 bits of data RDn on the SRAM bit line pair SBL which has been selected by the external address are transmitted to internal output data buses DB and *DB. With the data DBn on data buses DB and *DB being established, the clock signal $\phi1$ rises to "H". Consequently, output latch 981 carries out latching operation to latch the established data DBn.

Thereafter, a one shot pulse is generated from one shot pulse generating circuit 992c and signal $\phi2$ falls to "L". Consequently, output latch 982 newly takes the latched data DBn and transmits the same to output terminal DQ through an output buffer 983. The clock signal $\phi2$ is generated in synchronization with a fall of the clock K, and in response to a fall of the external clock K, data DBn selected in this cycle is output as output data Qn. Clock signal $\phi2$ rises to "H" by the time the external clock K rises again. Consequently, output latch 982 continuously output established data DBn regardless of the data on internal output data buses DB and *DB.

Thereafter, clock signal $\phi1$ is set to "L" and latch state of output latch 981 is released, so as to be ready for the next cycle, that is, latching operation of the next established data. Consequently, in response to a rise of the external clock K, data read in the previous cycle are output successively as established data.

Figure 42:
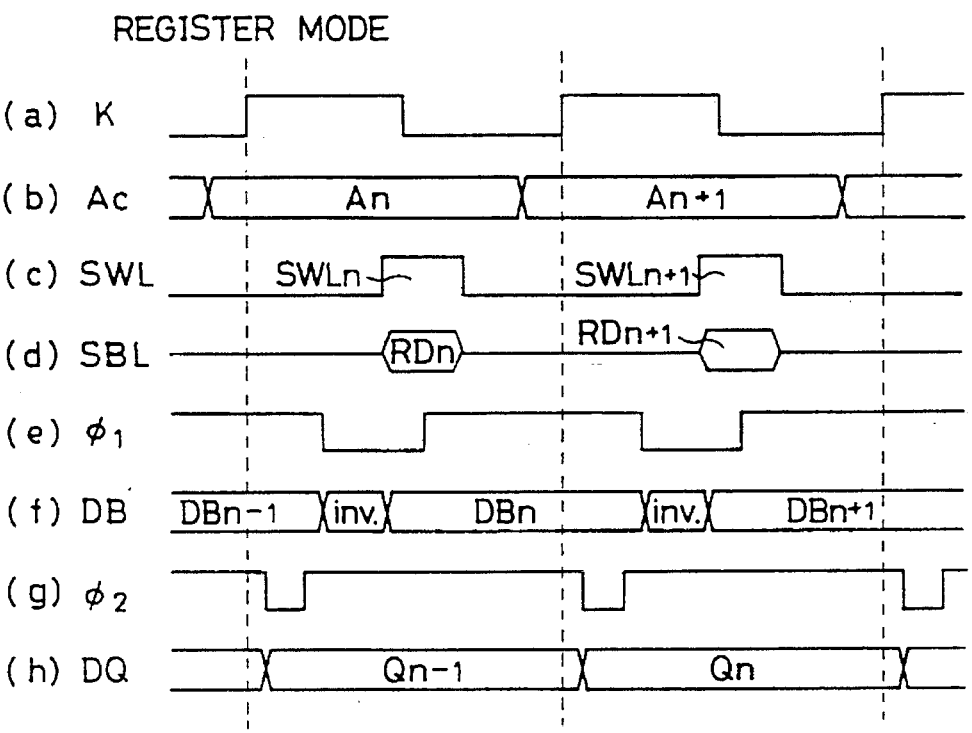

Register mode will be described with reference to FIG. 42. Setting of the register mode is done by setting lower 2 bits of command data WR0 to (11). In registered output mode, one shot pulse generating circuit 992b is enabled, and one shot pulse generating circuit 992c is disabled. At this time, in response to a rise of the external clock K, a one shot pulse which falls to "L" is generated from one shot pulse generating circuit 992b. Since clock signal $\phi1$ is at "H" at this time, data DBn−1 which has been read in the previous cycle is latched by output latch 982.

In registered output mode, timing of falling of clock signal $\phi2$ to "L" is determined in response to a rise of external clock K. In this case, in response to (n+1) th cycle of the external clock K, data DBn read in nth clock cycle is output as output data Qn at output pin terminal DQ. Namely, only the timing of generation of the clock signal $\phi 2$, that is, timing of falling thereof to "L" is different between latched output mode and registered output mode. Consequently, latched output mode in which data of previous cycle is output and data read in the present cycle is output continuously, and registered output mode in which data read in nth cycle is output at (n+1) th cycle are realized.

Figure 43A:
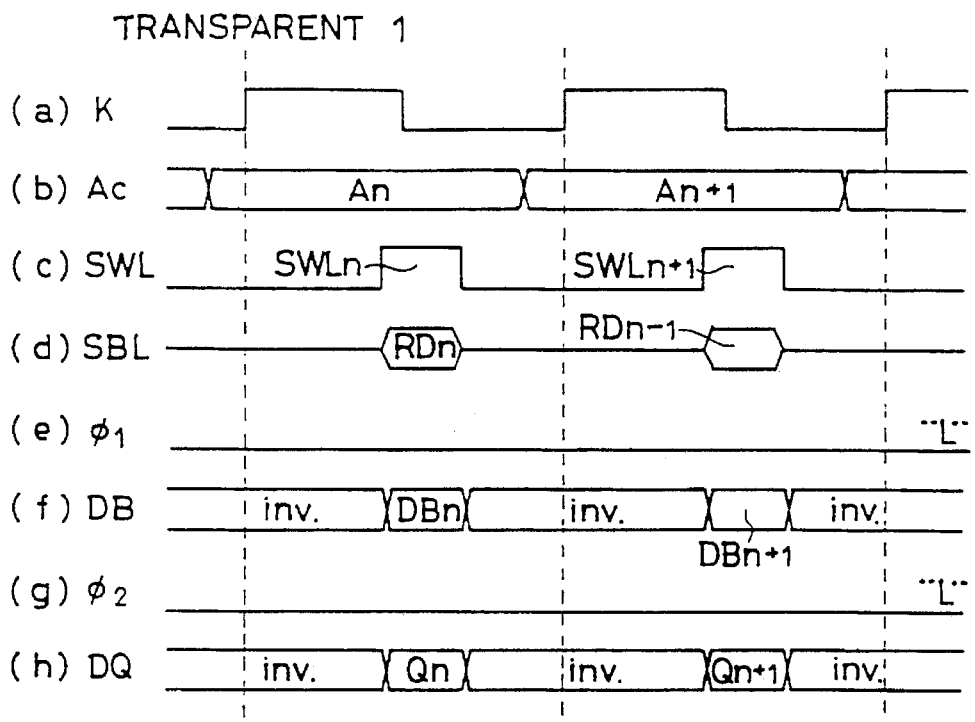
Figure 43B:
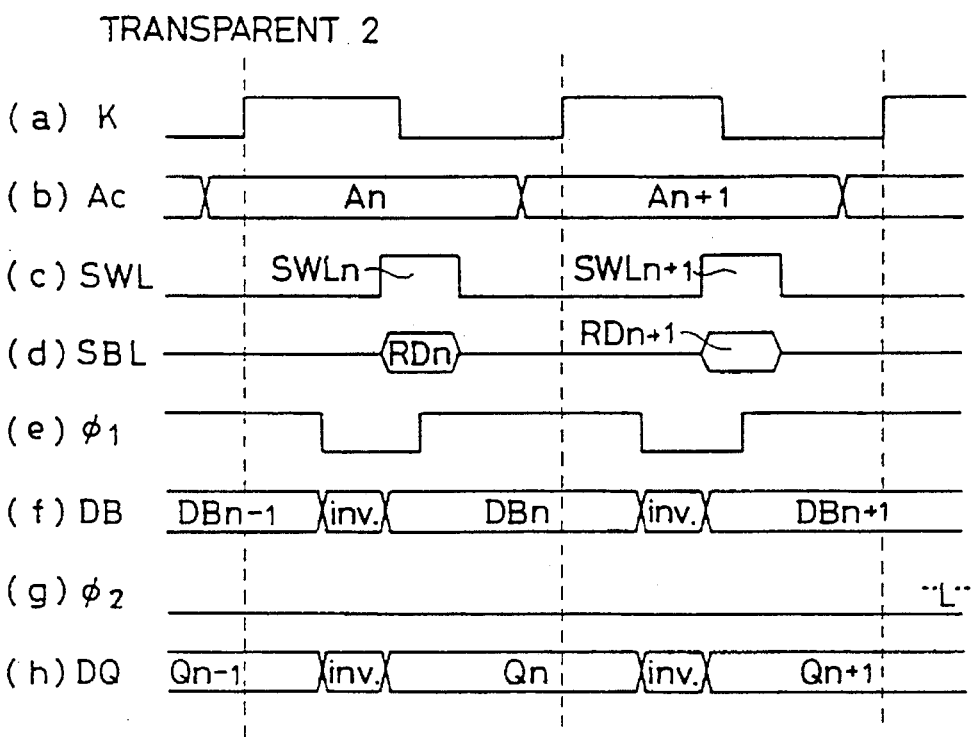

Transparent mode will be described with reference to FIGS. 43A and 43B. A first transparent output mode will be described with reference to FIG. 43. As described above, transparent output mode is realized by setting lower 2 bits of the register WR0 to (X0). The first transparent output mode or a second transparent output mode is selected by setting the bit value of X to 0 or 1. Either first transparent output mode or second transparent output mode may be selected arbitrarily corresponding to either of the values of X. In first transparent output mode, clock signals $\phi 1$ and $\phi 2$ are both maintained at "L". At this time, latch operation in output latch 981 is released, and output latch 982 is in a through state. Therefore, in this case, data DBn transmitted to internal data buses DB, *DB are directly output as output data Qn. If data on the SRAM bit line pair SBL or global I/O line pair GIO is invalid data (INVALID DATA), invalid data INV appears on output pin DQ in response.

In second transparent output mode shown in FIG. 43, clock signal $\phi 1$ is generated. First output latch 981 carries out latching operation while clock signal $\phi 1$ is at "H". Therefore, even if data RDn on SRAM bit line pair SBL is set to an invalid state, data on data buses DB and *DB are latched as valid data by latch circuit 891 and output for a predetermined time period (while the clock signal $\phi 1$ is at "H"). Therefore, a period in which invalid data INV is output can be made shorter. In second transparent output mode, clock signal $\phi 2$ is also kept at "L".

Although a D flipflop of a down edge trigger type has been used as second output latch 982 in the above described structure, an up edge trigger type latch circuit may be used to provide the same effect, by changing polarity of the clock signal $\phi 2$. The structure of output latch 981 can also be implemented by other latch circuits.

The characteristics of the output modes set by the common register are as follows.

(1) Transparent output mode: In this mode, data on internal data buses DB, *DB are directly transmitted to an output buffer. In this mode, valid data as output data DQ (Q) appears after a time lapse of tKHA (array access time) from a rising edge of external clock K or after a lapse of a time period tGLA (access time from the signal G# has reached "L" to an output of a valid data) from a falling edge of output enable signal G#, which is later. If output enable signal G# falls before the time tKHA, invalid data (INV) is kept continuously output to tKHA, since valid data has not yet appeared on internal data buses DB and *DB, if output enable signal G# falls at an earlier timing. Therefore, in this mode, a period in which output data is valid is limited to a period in which valid data is appearing on the internal bus.

(2) Latched output mode: In this mode, an output latch circuit is provided between the internal data buses DB and *DB and the output buffer. In the latched output mode, data is latched by an output latch circuit while external clock K is at "H". Therefore, when output enable signal G# falls before the time tKHA, data read in the previous cycle is output. Therefore, even if invalid data has appeared on internal data buses DB and *DB, invalid data is not output externally. Namely, this mode provides an advantage that sufficient time period for the CPU to take output data in can be provided.

(3) Registered output mode: In this mode, an output register is provided between the internal data bus and the output buffer. In the registered output mode, valid data of the previous cycle is output as output data after a lapse of tKHAR from a rising edge of external clock K or after a lapse of tGLA from a falling edge of output enable signal G#, which is later. From the same reason as in the latch mode, invalid data is not output in register mode. When data are to be output continuously in register mode, it seems that data are output at very high speed in view of the rise of the external clock K. Such operation is generally called a pipeline operation, in which an apparent access time can be further reduced from the cycle time.

Since the above described output modes can be set by command registers, a user can select an output mode suitable for a system.

[Data Transfer Between DRAM and SRAM]

Now, the data transfer between DRAM array and SRAM will be described in detail with reference to FIGS. 44 through 60D. Transfer mode includes (a) block transfer mode from DRAM to SRAM, (b) copy back mode from SRAM to DRAM and (c) fast copy back mode with block transfer and copy back modes in parallel. In the following description, no multiple word line scheme in SRAM array is assumed. However, the data transfer method in the following is also applicable to multiple SRAM word line structure.

Figure 44:
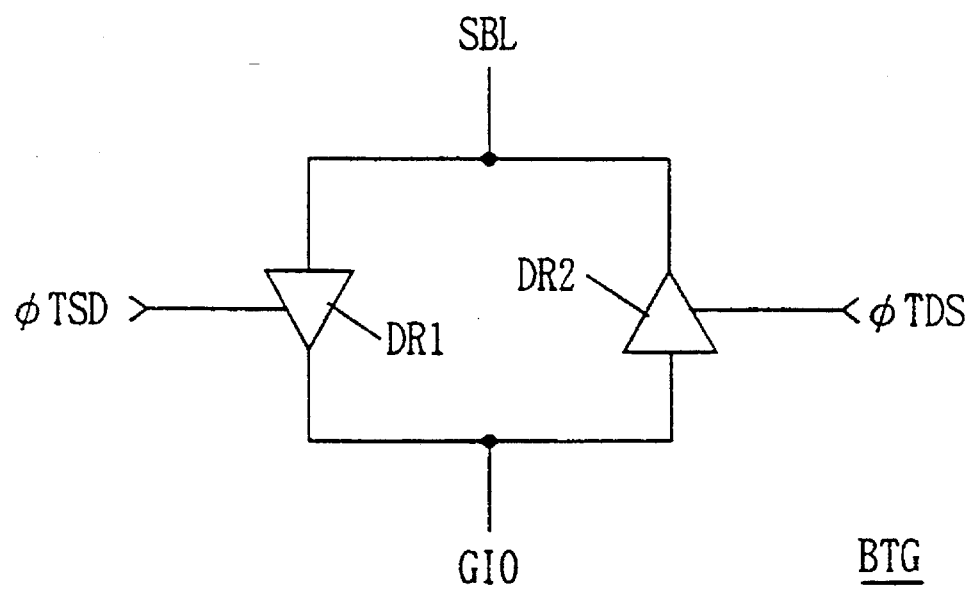

FIG. 44 shows one example of a structure of bi-directional transfer gate BTG. Referring to FIG. 44, bi-directional transfer gate BTG (BTGa or BTGb) comprises a drive circuit DR1 which is activated in response to data transfer designating signal $\phi$TSD for transmitting data on SRAM bit line pair SBL to global I/O line pair GIO, and a drive circuit DR2 which is activated in response to data transfer designating signal $\phi$TDS for transmitting data on global I/O line pair GIO to SRAM bit line pair SBL. Drive circuits DR1 and DR2 are set to an output high impedance state when data transfer designating signals $\phi$TSD and $\phi$TDS are inactive.

Figure 45:
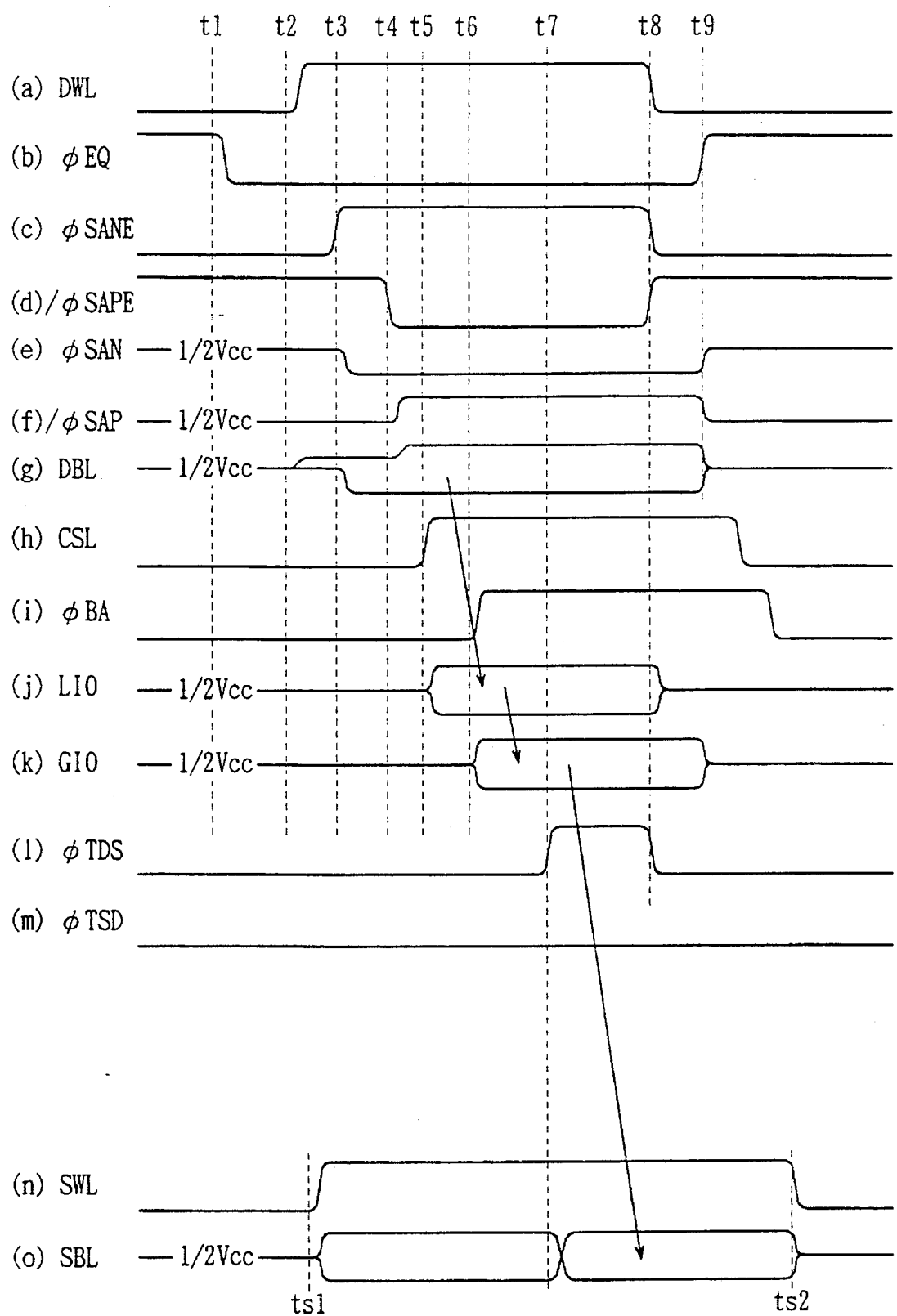

(a) FIG. 45 is a diagram of signal waveforms showing operation when data are transferred from DRAM array to SRAM array. Data transfer operation from DRAM array to SRAM array will be described with reference to FIGS. 78 and 44.

While precharge designating signal $\phi$EQ is at an active state "H" before time t1, sense amplifier driving signal lines $\phi$SAN, /$\phi$SAP, local I/O line pair LIO and global I/O line pair GIO are maintained at a precharge potential of Vcc/2. At this time, precharge equalize circuit PE is activated to precharge DRAM bit line pair DBL to the precharge potential of Vcc/2 (=Vb1) and equalizes potentials of the bit lines BL,/BL.

When precharge designating signal $\phi$EQ falls at t1, precharge equalize circuit PE and equalize transistor TEQ are rendered inactive. Consequently, equalizing operation of the sense amplifier driving signal lines $\phi$SAN and/$\phi$SAP is completed, equalize/precharge operation of DRAM bit line pair DBL is stopped, and DRAM bit line pair DBL and sense amplifier driving signal lines $\phi$SAN and/$\phi$SAP are set to a floating state at the intermediate potential vcc/2 (where Vss=0 V).

Thereafter, in accordance with an externally applied address, row selecting operation is effected by row decoder 14 (see FIG. 7), one word line DWL is selected in DRAM array 1 (see FIG. 7) at t2, and potential of the selected word line DWL rises to "H". One row of memory cells connected to the selected word line DWL are connected to corresponding DRAM bit line pair DBL (DRAM bit line BL or/BL), and potential of respective DRAM bit lines changes dependent on data of the memory cell connected thereto. FIG. 45 shows potential change of a DRAM bit line pair DBL when a memory cell storing the potential "H" is selected.

At time t3, sense amplifier activating signal φSANE rises from ground potential Vss to the operational supply potential Vcc level, and transistor TR2 in sense amplifier activating circuit SAK is turned on. Consequently, the second sense amplifier portion in DRAM sense amplifier DSA is activated, and a bit line of lower potential in the DRAM bit line pair DBL is discharged to the level of the ground potential GND.

At time t4, sense amplifier activating signal/φSAPE falls from the potential Vcc to the ground potential GND level, and transistor TR1 in sense amplifier activating circuit SAK is turned on. Consequently, the first sense amplifier portion of DRAM sense amplifier DSA is activated, and the bit line of higher potential in the DRAM bit line pair DBL is charged to the level of the operational supply potential Vcc.

At time t5, in accordance with a column selecting signal from DRAM column decoder 15 (see FIG. 7), one column selecting line CSL is selected, and potential of the selected column selecting line CSL rises to "H". Consequently, two pairs of DRAM bit line pairs DBL are connected to local I/O line pairs (LIOa and LIOb) through the column selecting gate CSG. Consequently, potential on the selected DRAM bit line pair DBL is transmitted to local I/O line pair LIO, and potential of local I/O line pair changes from the precharge potential Vcc/2.

At time t6, block activating signal φBA rises to "H" only for the selected row block, and I/O gate IOG is turned on. Consequently, signal potential on local I/O line pair LIO is transmitted to global I/O line pair GIO. "Selected row block" means a row block including the selected word line DWL. Designation of the selected row block is effected by decoding, for example, upper 2 bits of the row address used for selecting the DRAM word line. By such block dividing operation, current consumption can be reduced.

In SRAM, row selecting operation is done by SRAM row decoder 21 (see FIG. 7) at time ts1, one SRAM word line SWL is selected in SRAM array, and potential of the selected SRAM word line SWL rises to "H". Row selecting operation in DRAM and row selecting operation in SRAM are carried out in an asynchronous manner. Data of SRAM cells connected to the SRAM word line SWL are transmitted to corresponding SRAM bit line pair SBL. Consequently, potential of SRAM bit line pair SBL changes from the precharge potential Vcc/2 to potential corresponding to the information stored in the corresponding SRAM cell.

At time t7, data transfer designating signal φTDS attains to and is maintained at "H" for a predetermined time period. Before t7, data of DRAM cell has been already transmitted to the global I/O line pair GIO, and SRAM cells have been connected to SRAM bit line pair SBL. In response to data transfer designating signal φTDS, bi-directional transfer gate BTG is activated and it transmits signal potential on global I/O line pair GIO to the corresponding SRAM bit line pair SBL. Consequently, data are transmitted from DRAM cells to SRAM cells.

Time relation between ts1, t1 and t6 is arbitrary, provided that the time t7 at which data transfer designating signal φTDS is activated is after t6 at which block activating signal φBA rises and after ts1 at which SRAM word line SWL is selected. In this cycle, data transfer designating signal φTSD designating transfer from SRAM to DRAM is kept at inactive state, that is, "L".

At time t8, potential of the selected DRAM word line DWL falls to "L", at time ts2, potential of the selected SRAM word line SWL falls to "L", and various signals are returned to the initial state. Thus, the data transfer cycle from DRAM to SRAM is completed.

As described above, DRAM column decoder 15 (see FIG. 7) selects one column selecting line CSL in each column block 12. One column selecting line CSL selects two pairs of DRAM bit lines DBL. Data transfer from DRAM to SRAM is carried out column block by column block in parallel. Therefore, in the embodiment shown in the figure, 16 bits of data are transferred simultaneously. This relation is realized in a structure having 8 column blocks and in which two pairs of DRAM bit lines are selected in each column block. The number of bits of the data transferred at one time changes dependent on the number of DRAM bit line pairs selected at one time or dependent on the number of column blocks. Therefore, appropriate block size can be set.

(a) Another transfer timing from DRAM to SRAM

Figure 46:
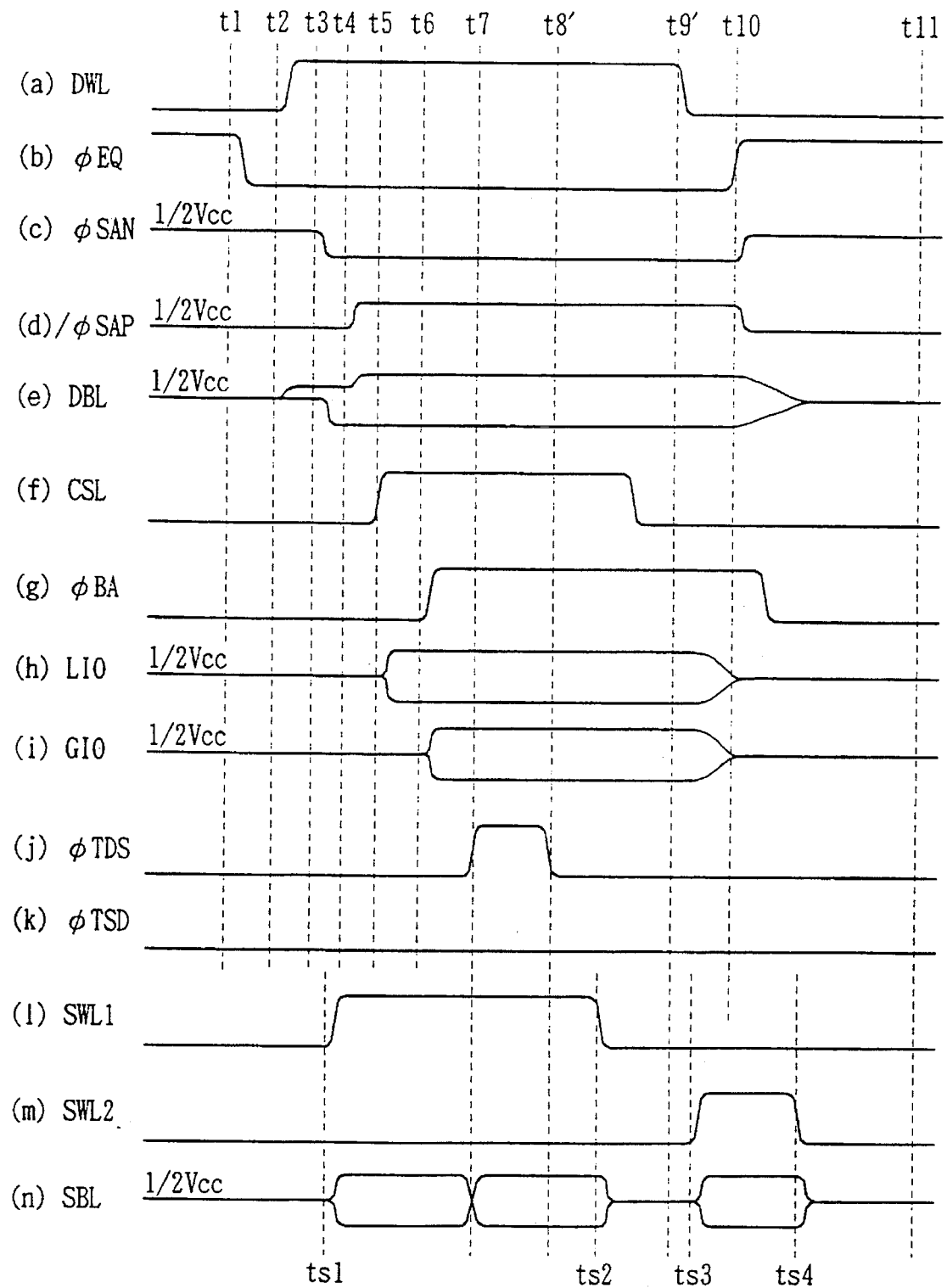

As shown in FIG. 45, when DRAM word line driving signal DWL falls to "L" of the inactive state approximately at the time t8, data transfer designating signal φTDS falls to "L" in response. At this time t8, local I/O line pair LIO is disconnected from SRAM bit line pair SBL, and DRAM array and SRAM are electrically separated. After the time t8, DRAM portion and SRAM portion can operate independent from each other. Therefore, as shown in FIG. 46, when data transfer designating signal φTDS is made inactive at time t8', the word line driving signal DWL in DRAM array is still maintained at the active state, that is, "H". At this time, the DRAM cannot be newly accessed externally, but SRAM array portion can be externally accessed.

More specifically, as shown in FIG. 46, when data transfer designating signal φTDS falls to "L" at time t8' and even if DRAM array is active at that time, SRAM array can be newly accessed after the lapse of a predetermined time period from time ts2 at which it is set to the standby state. Therefore, after the time t8', SRAM portion can be accessed regardless of the state of DRAM. For example, at time t8', data at a cache miss can be read from SRAM array.

Further, before the DRAM is returned to the standby state, SRAM can be accessed by newly setting an external address. The reason for this is that RAS precharging operation necessary for a DRAM is not necessary for the SRAM and the SRAM can be accessed at high speed after the return to the standby state.

Referring to FIG. 46, DRAM word line driving signal DWL falls to "L" at time t9'. When equalize signal φEQ is activated at time t10, equalize and precharge operations of DRAM bit line pair DBL is started. At this time, equalizing operation of sense amplifier driving signal lines φSAN and/φSAP is also carried out. DRAM together with peripheral circuits thereof are returned to the standby state at a time t11 after several tens nsec from time t9'. The DRAM array cannot be accessed until a predetermined RAS precharge time period has lapsed. However, in SRAM array, at time ts3 after several nsec from time ts2 at which the SRAM word line SWL1 is set to the non-selected state, it is possible to select a different SRAM word line SWL2 in accordance with an external address and to access (read data from or write data to) memory cells connected to the selected SRAM word line SWL2.

Time interval between ts2 at which data transfer designating signal φTDS falls to the inactive state "L" and ts3 at which SRAM word line SWL2 can be activated is set at an appropriate value by external specification. Since access to the SRAM is made possible before DRAM is returned to the standby state, a semiconductor memory device especially a semiconductor memory device containing a cache which operates at high speed, can be provided.

Since it is not necessary in SRAM to carry out column selecting operation after the sensing and latch operation of the sense amplifier as in the DRAM, a very short time period is enough for the selecting period of the word line SWL2 in SRAM. At time ts4, access to the SRAM is completed. In a normal SRAM, the time period from ts3 to ts4 is about 10 nsec at the most. Access to the SRAM is completed during the standby state of the DRAM. The structure enabling access to the SRAM before the DRAM array is returned to the standby state is realized by the semiconductor memory device of the present invention in which SRAM and DRAM can be accessed by designating addresses, which addresses are independent from each other.

(b) data transfer from SRAM to DRAM

Figure 47:
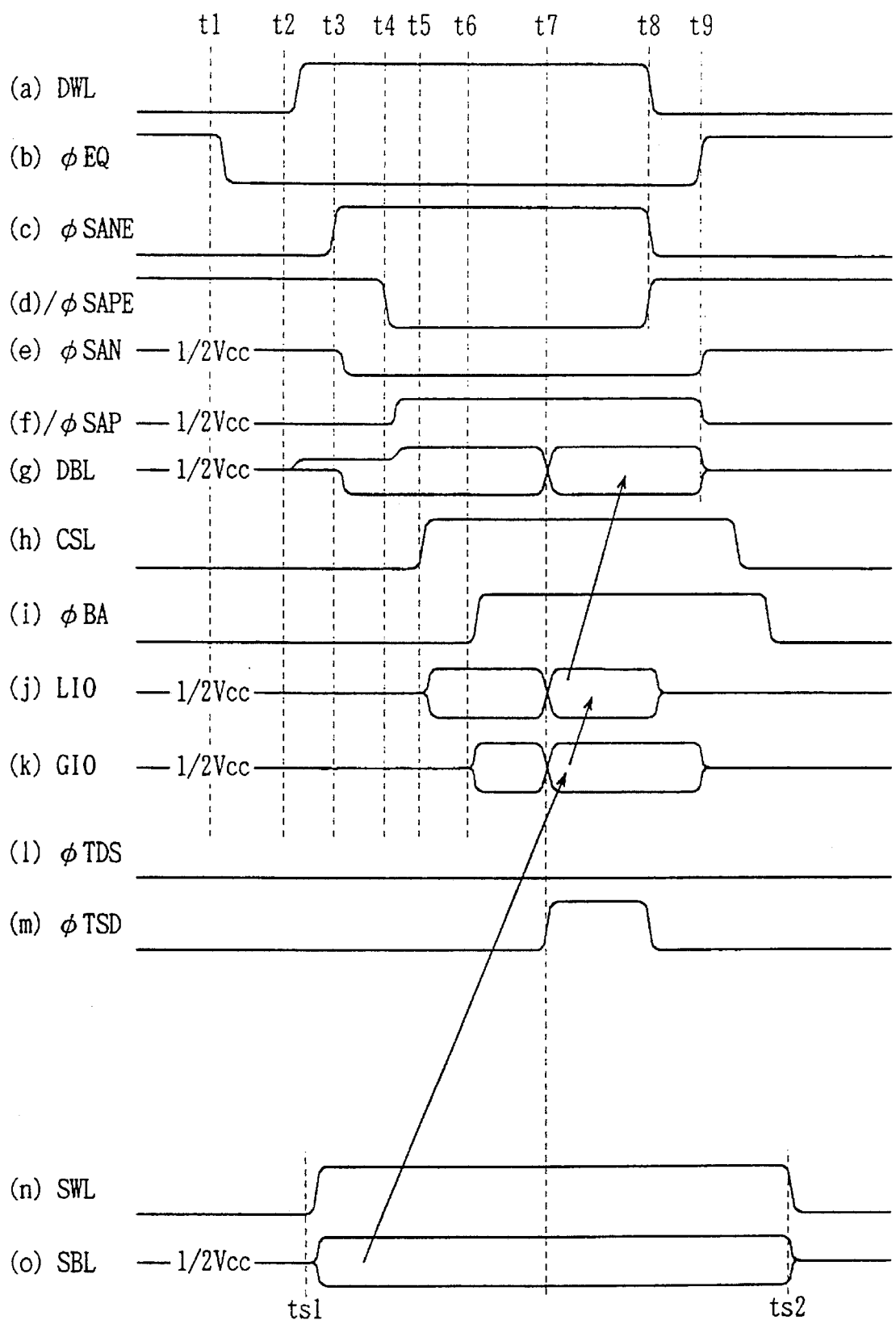

FIG. 47 is a diagram of signal waveforms showing operations in data transfer from SRAM to DRAM. The data transfer operation from SRAM to DRAM will be described with reference to FIGS. 7, 8 and 47. The operation in the DRAM portion from t1 to t6 is the same as that in data transfer from the DRAM to SRAM shown in FIG. 45. As to the operation of the SRAM portion, potential of SRAM word line SWL rises to "H" at time ts1, as in the signal waveform of FIG. 45.

After the time ts1 and t6, that is, after DRAM bit line pair DBL is connected to global I/O line pair GIO and SRAM cells (SMCs) are connected to SRAM bit line pair SBL, data transfer designating signal φTSD is activated and rises to "H" for a predetermined time period after t7. In response, bi-directional transfer gate BTG is activated and transmits signals on SRAM bit line pair SBL to DRAM bit line pair DBL through global I/O line pair GIO (GIOa, GIOb) and through local I/O line pair LIO (LIOa, LIOb). Consequently, data of the DRAM cells connected to the selected DRAM bit line pair DBL are rewritten. Namely, data in the SRAM cells are transferred to the DRAM cells. In the data transfer cycle from SRAM array to DRAM array, data transfer designating signal φTDS is maintained at inactive state, that is, "L".

The data transfer operation shown in FIGS. 45 to 47 is effected when a cache miss occurs with the SRAM array used as a cache. More specifically, when data to which access is requested by a CPU, which is an external processing unit, is not stored in the SRAM array, necessary data is transferred from DRAM array to SRAM array. At a cache miss, a copy back operation for transferring data from SRAM array to DRAM array as well as block transfer for transferring desired data from DRAM array to SRAM array are carried out. Copy back operation and block transfer operation will be described in the following.

Referring to FIG. 48A, let us assume that data D2 to which access is requested by the CPU is not stored at a corresponding position of the SRAM. Data D1' is stored at the corresponding position of the SRAM, that is, the cache. When the cache miss of the SRAM occurs, the DRAM is still at a precharge state.

Referring to FIG. 48B, in response to a cache miss designating signal, a word line (shown by hatched portion) including the region to which data D1' is to be stored is selected in the DRAM. This is an array active state. In the SRAM, the region of the data D1' has been selected.

Figure 48:
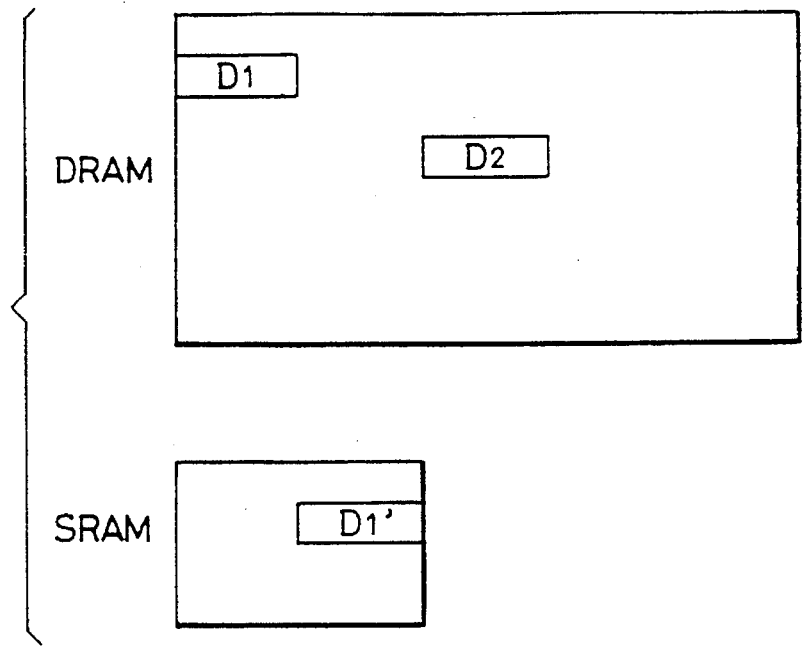
Figure 48:
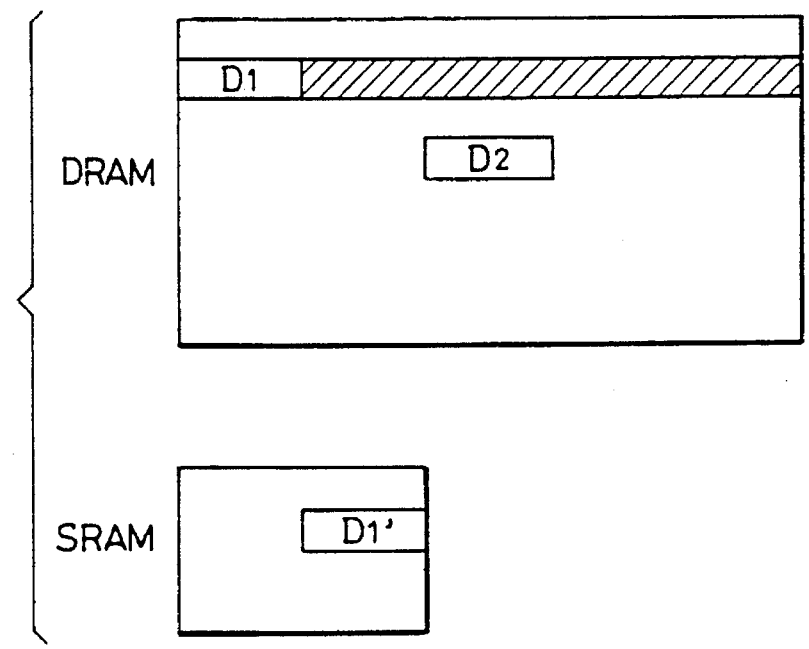
Figure 48C:
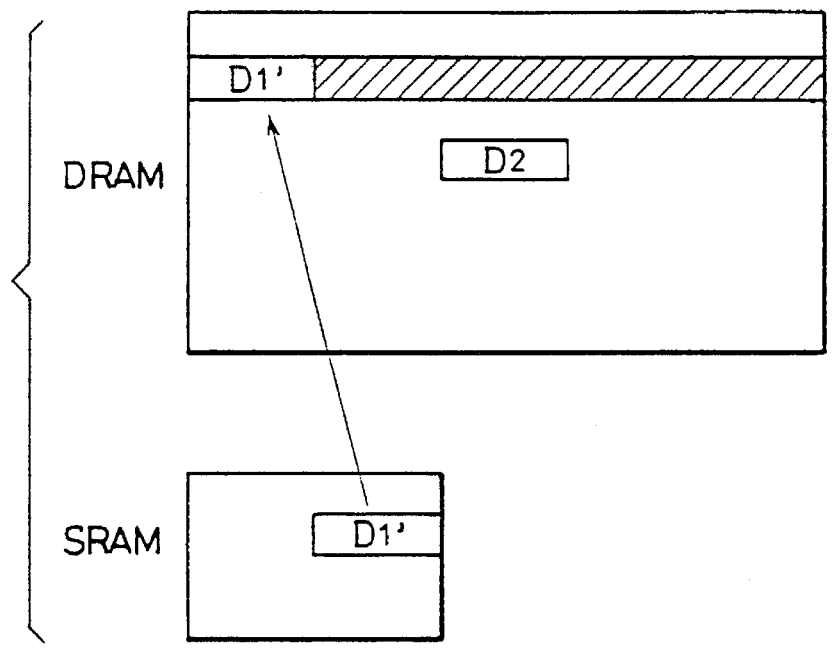

Referring to FIG. 48C, transfer designating signal φTSD is generated, and data D1' of the SRAM is transmitted to the corresponding region of the selected word line of the DRAM. Consequently, data D1' is stored in the data region D1 of the DRAM.

Figure 48D:
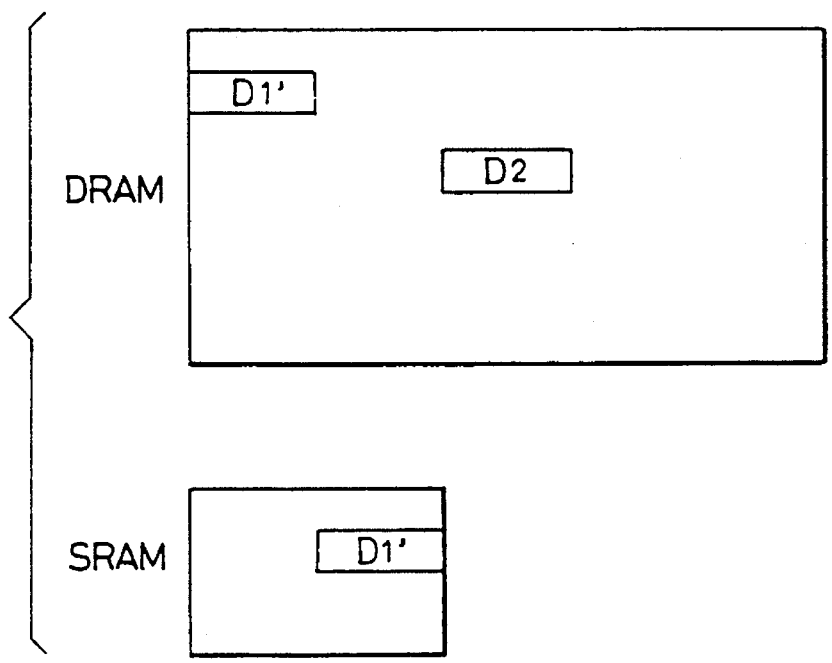

Referring to FIG. 48D, after the completion of transfer of data D' to the data region D1 of the DRAM, the DRAM array is returned to the precharge state.

Figure 48E:
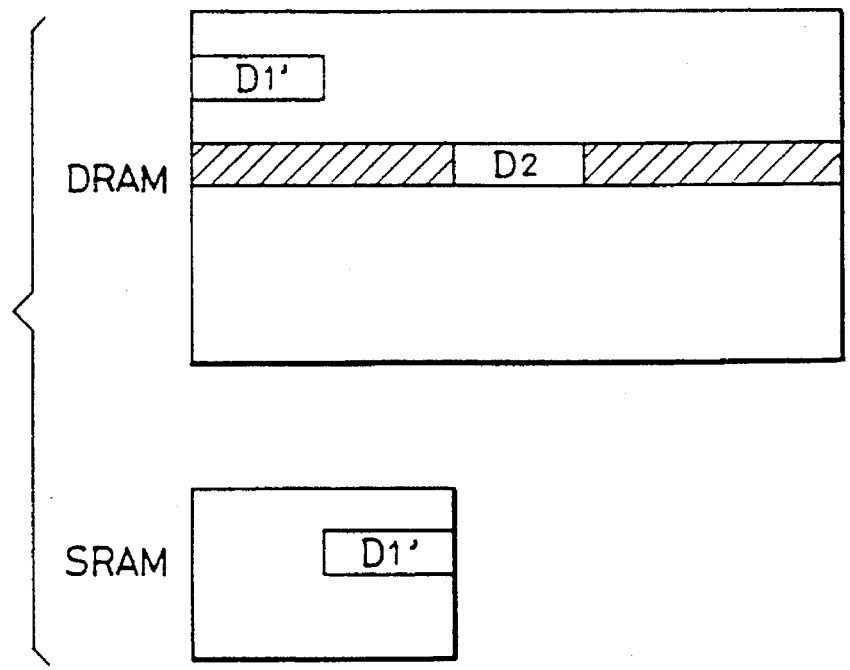

Referring to FIG. 48E, a word line (shown by a hatching) including data D2 to which access is requested by CPU is selected in the DRAM.

Figure 48F:
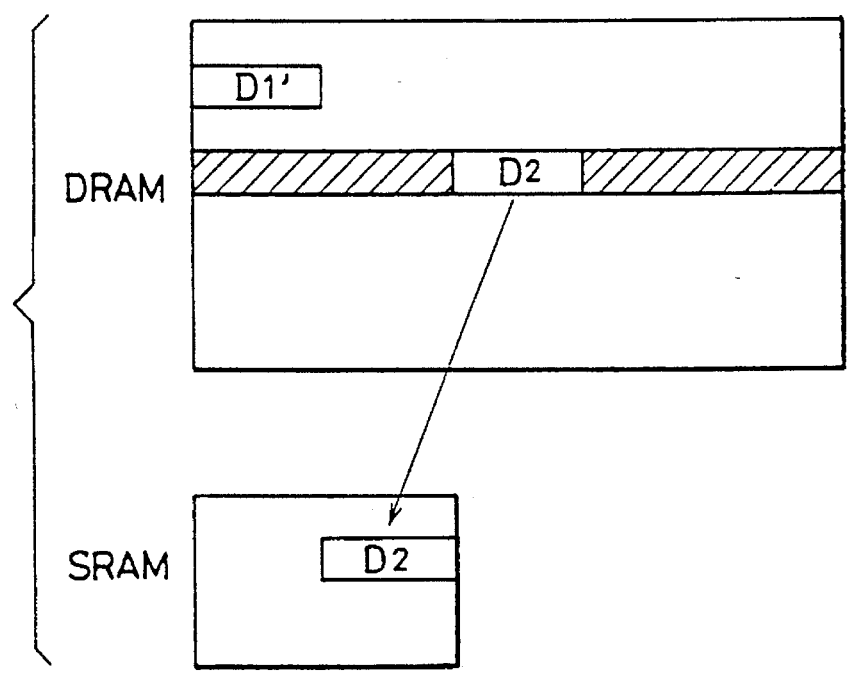

Referring to FIG. 48F, data D2 included in the selected word line is transmitted to the corresponding region of the SRAM array in response to data transfer designating signal φTDS. Consequently, data D1 of the SRAM array is rewritten by data D2. The copy back operation corresponds to the FIGS. 48A to 48D, and the block transfer mode corresponds to FIG. 48D to FIG. 48F. The step shown in FIG. 48D is included in both cycles, since the precharge period of the DRAM is considered to be included in both cycles, when these two operations are carried out successively.

(c) fast copy back mode operation

In this above method of data transfer, a precharging period of the DRAM array is interposed, and direction of data transfer is always one way. Therefore, data transfer between SRAM array and DRAM array can not be carried out at high speed. Data transfer operation carried out at a higher speed by overlapping data transfer to and from DRAM array and SRAM array will be described in the following.

Figure 49:
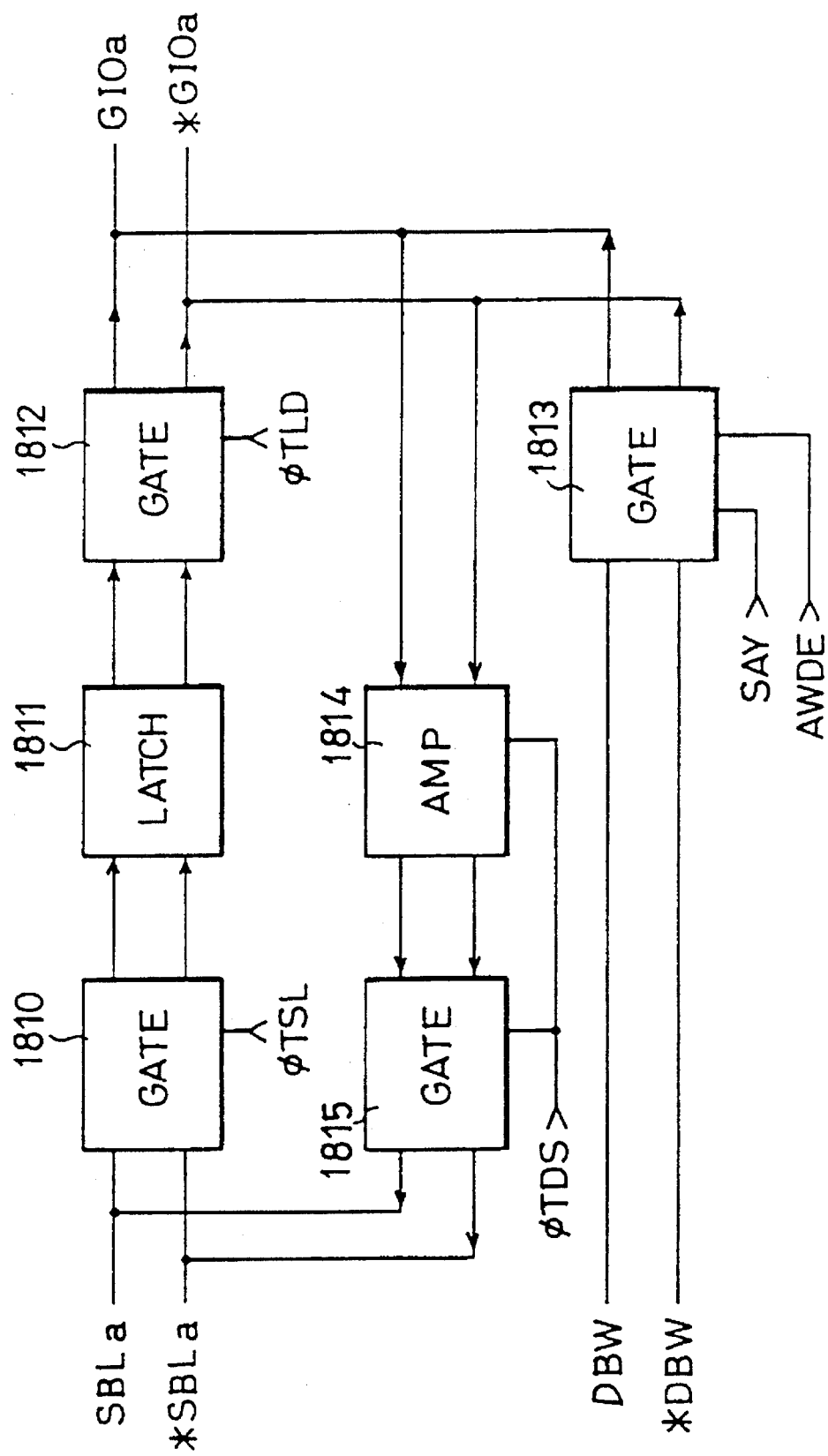

FIG. 49 is a block diagram schematically showing another structure of a data transfer device. A circuit portion for transferring data of 1 bit between SRAM array and DRAM array in the data transfer device is shown in FIG. 49. The data transfer device includes 16×4 of the bi-directional transfer gate circuits shown in FIG. 49. In the following, the data transfer device shown in FIG. 49 is referred to as a bi-directional transfer gate circuit for transferring data of 1 bit.

Referring to FIG. 49, the bi-directional transfer gate circuit includes a gate circuit 1810 responsive to transfer control signal φTSL for connecting SRAM bit line pair SBLa and *SBLa to a latch circuit 1811; a gate circuit 1812 responsive to transfer control signal φTLD for transmitting data latched in latch circuit 1811 to global I/O lines GIOa and *GIOa; and a gate circuit 1813 responsive to DRAM write enable signal AWDE and to SRAM column decoder output SAY for transferring data on write data bus lines DBW and *DBW to global I/O lines GIOa and *GIOa. An output SAY of SRAM column decoder selects 1 bit out of 16 bits which has been simultaneously selected in DRAM array block. Therefore, a structure in which lower 4 bits of a column address signal for DRAM array are applied to SRAM column decoder is shown as an example.

The bi-directional transfer gate circuit further includes an amplifier circuit 1814 which is activated in response to transfer control signal φTDS for activating data on global I/O lines GIOa and *GIOa; and a gate circuit 1815 responsive to transfer control signal φTDS for transferring data amplified by the amplifier circuit 1814 to SRAM bit line pair SBLa and *SBLa.

Gate circuit 1810 and latch circuit 1811 constitute first transfer means, gate circuit 1815 and amplifier circuit 1814 constitute second transfer means, and gate circuit 1812 and gate circuit 1813 constitute a third transfer means.

SRAM write enable signal AWDE is generated upon occurrence of a cache miss in an array access cycle when CPU requests data writing. More specifically, it is generated from a transfer gate control circuit 262, which will be described later, when a chip select signal E# attains "L", cache hit signal CH# is "H" and write enable signal W# is "L" at a rising edge of a clock signal K.

When data is to be written to DRAM array by gate circuit 1813, write data can be directly transmitted to global I/O lines GIOa and *GIOa, not through SRAM bit line pair SBLa and *SBLa. Consequently, data can be written at a higher speed. Gate circuit 1812 is used for adjusting timing, when 64 bits (in the case of 4 MCDRAM) of data are to be simultaneously transferred from SRAM array to DRAM array in response to transfer control signal φTLD. Similarly, gate circuit 1815 is used for adjusting timing when 64 bits of data are to be simultaneously transferred from DRAM array to SRAM array.

Figure 50:
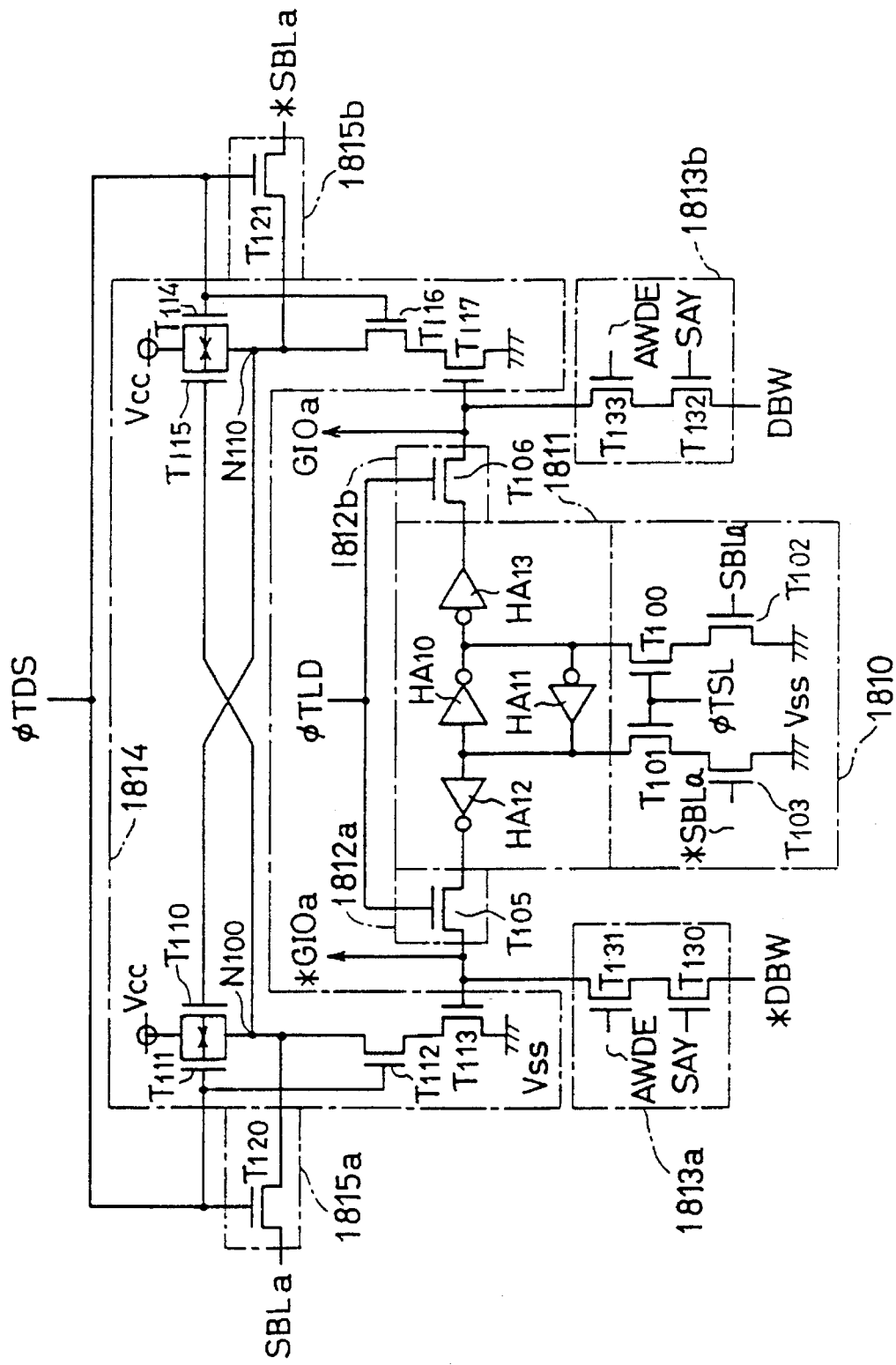

FIG. 50 shows an example of a specific structure of the bi-directional transfer gate circuit shown in FIG. 49.

Gate circuit 1810 includes n channel MOS transistors T102 and T103 for amplifying signal potential on SRAM bit line pair SBLa and *SBLa, and n channel MOS transistors T100 and T101 which are rendered conductive in response to transfer control signal φTSL for transmitting data amplified by transistors T102 and T103 to a latch circuit 1811. Transistor T102 has its gate connected to SRAM bit line SBLa, one conduction terminal connected to the ground potential Vss and the other conduction terminal connected to one conduction terminal of transistor T100. Transistor T103 has its gate connected to SRAM bit line *SBLa, one conduction terminal connected to the ground potential Vss and the other conduction terminal connected to one conduction terminal of transistor T101.

Latch circuit 1811 includes inverter circuits HA10 and HA11 having their inputs connected to the outputs of each other. Inverter circuits HA10 and HA11 constitute an inverter latch. Latch circuit 1811 further includes inverter circuits HA12 and HA13 for inverting latched data of the inverter latch (inverter circuits HA10 and HA11).

Gate circuit 1812 includes a gate circuit 1812*b* for transmitting data to global I/O line GIOa, and a gate circuit 1812*a* for transmitting data to global I/O line *GIOa. Gate circuit 1812*a* is formed by an n channel MOS transistor T105 and gate circuit 1812*b* is formed by an n channel MOS transistor T106. Transfer control signal φTLD is applied to the gates of the transistors T105 and T106.

Amplifier circuit 1816 includes an n channel MOS transistor T113 for amplifying potential on global I/O line *GIOa, an n channel MOS transistor T112 which is turned on in response to transfer control signal φTDS for transmitting data amplified by transistor T113 to node N100, a p channel MOS transistor T111 responsive to transfer control signal TDS for precharging node N110 to a supply potential Vcc, and a p channel MOS transistor T110 which is connected in parallel to transistor T211 between power supply Vcc and a node N100.

Amplifier circuit 1814 further includes an n channel MOS transistor T117 for amplifying signal potential on global I/O line GIOa, an n channel MOS transistor T116 which is turned on in response to transfer control signal φTDS for transmitting signal potential on global I/O line GIOa amplified by transistor T117 to node N110, a p channel MOS transistor T114 responsive to transfer control signal φTDS for precharging node N110 to supply potential Vcc, and a p channel MOS transistor T115 which is connected in parallel to transistor T214 between power supply Vcc and node N110.

Transistor T110 has its gate connected to node N110, and transistor T115 has its gate connected to node N100. Transistors T110 and T115 constitute a differential amplifying circuit.

Gate circuit 1815 includes a gate circuit 1815*a* for transferring data to SRAM bit line SBLa, and a gate circuit 1815*b* for transferring data to SRAM bit line *SBLa. Gate circuit 1815*a* includes an n channel MOS transistor T120 which is turned on in response to transfer control signal φTDS for transmitting signal potential on node N100 to SRAM bit line SBLa. Gate circuit 1815*b* includes an n channel MOS transistor T111 which is turned on in response to a transfer control signal φTDS for transmitting signal potential on node N110 to SRAM bit line *SBLa.

Gate circuit 1813 includes a gate circuit 1813*a* for transmitting signal potential on internal data bus line *DBW to global I/O line *GIOa and a gate circuit 1813*b* for transmitting signal potential on internal data bus line DBW to global I/O line GIOa. Gate circuit 1813*a* includes an n channel MOS transistor T130 which is turned on in response to an output SAY from SRAM column decoder, and an n channel MOS transistor T131 which is turned on in response to DRAM write enable signal AWDE. Transistors T131 and T130 are connected in series between internal write data bus line *DBW and global I/O line *GIOa.

Gate circuit 1813*b* includes an n channel MOS transistor T132 which is turned on in response to output SAY of SRAM column decoder, and an n channel MOS transistor T133 which is turned on in response to SRAM write enable signal AWDE. Transistors T132 and T133 are connected in series between internal data bus line DBW and global I/O line GIOa. The operation of the bi-directional transfer gate circuit will be described in the following.

Figure 51:
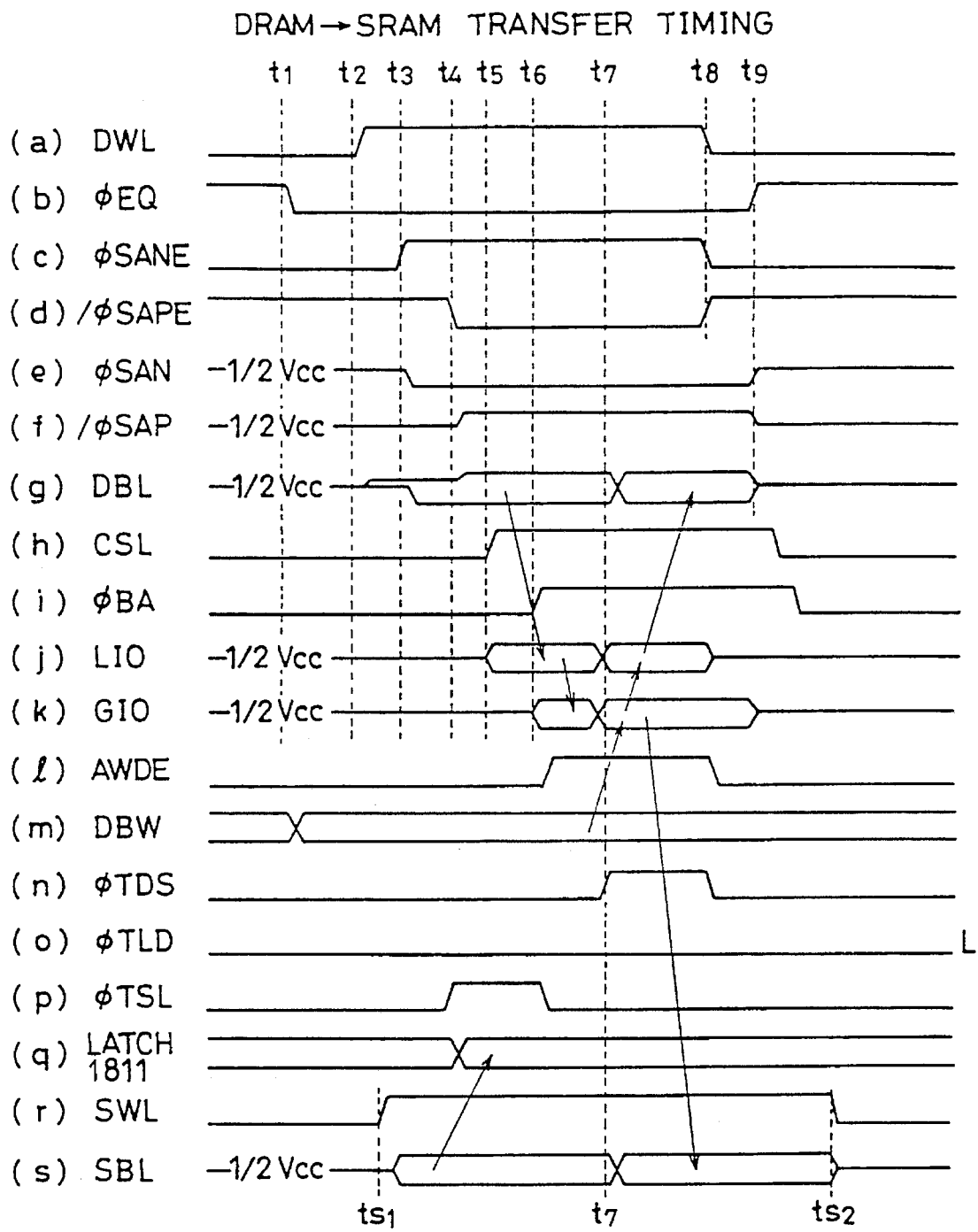

Referring to FIG. 51, data transfer operation in a cache miss writing operation will be described. In a cache miss writing, chip select signal E# and write enable signal W# both attain to "L" and cache hit signal CH# attains to "H" at a rising edge of clock signal K (as will be described in detail later). In response, DRAM and SRAM are both activated. An address applied to SRAM and DRAM at this time is applied from CPU.

At time t1, precharge cycle is completed in DRAM, and a memory cycle is started. In response, equalize signal φEQ rises to an inactive state "L". By the time a DRAM word line DWL is set to a selected state in DRAM, signal potential on internal data bus line DBW has been established to a value corresponding to write data. When a DRAM word line DWL is selected and signal potential on DRAM bit line pair DBL is changed at time t2, sense amplifier activating signals φSAN and/φSAP are activated at times t3 and t4, and signal potential on each DRAM bit line pair attains to a value corresponding to the read memory cell data.

In SRAM, a SRAM word line SWL is selected at time ts1. Data of memory cells connected to the selected word line SWL are transmitted to a corresponding SRAM bit line SBLa (*SBLa). When signal potential on SRAM bit line SBLa (*SBLa) is established, transfer control signal φTSL rises to "H", gate circuit 1810 is opened, and signal potential on SRAM bit lines SBLa and *SBLa are transmitted to latch circuit 1811. More specifically, in the circuit structure shown in FIG. 50, transistors T100 and T101 are turned on, one of transistors T102 and T103 is turned on and the other thereof is turned off, and the potential "L" is transmitted through the transistor (T102 or T103) which is on to latch circuit 1811. Latch circuit 1811 latches the applied signal potential "L" at a corresponding node.

In DRAM, in parallel to the data latch operation of the latch circuit 1811, column selecting line CSL is selected (time t5), and in response, potential on local I/O line pair LIO is established. Then, by the block selecting signal φBA, potential on local I/O line pair LIO is transmitted to global I/O line pair GIO (t6).

When signal potential on global I/O line pair GIO is established, DRAM write enable signal AWDE rises to "H". At this time, output signal SAY from SRAM column decoder is set to an active state, and gate circuit 1813 provided for one global I/O line out of 16 bits is opened. Consequently, write data appeared on data bus lines DBW and *DBW are transmitted to global I/O lines GIOa and *GIOa through gate circuits 1813b and 1813a.

When signal potential on global I/O line pair GIO has reached a value corresponding to write data at time t7, transfer control signal φTDS rises to "H" at time t7'. In response, transistors T111 and T114 are turned off, precharging of nodes N100 and N110 is stopped, and transistors T110 and T115 differentially amplify signal potential on global I/O lines GIOa and *GIOa which have been transmitted through transistors T112 and T116. Consequently, signal potential on nodes N100 and N110 attains to the potential which is the inversion of the signal potential on global I/O lines *GIOa and GIOa.

For example, let us assume that signal potential on global I/O line GIOa is "H" and that the signal potential on global I/O line *GIOa is "L". At this time, transistor T117 is turned on, and transistor T113 is turned off, potential at node N110 attains to "L" and potential at node N100 attains to "H". The potential "L" at node N110 turns transistor T110 on, and potential "H" at node N100 turns transistor T115 off. By the transistors T110 and T115, signal potentials on nodes N100 and N110 are differentially amplified and latched.

In parallel to the amplifying operation in amplifying circuit 1814, gate circuits 1815a and 1815b are rendered conductive in response to a rise to "H" of transfer control signal φTDS, signal potential on node N100 is transmitted to SRAM bit line SBLa, and signal potential on node N110 is transmitted to SRAM bit line *SBLa. At this time, since transfer control signal φTLD is fixed at "L", gate circuits 1812a and 1812b are closed, and data latched in latch circuit 1811 is not transmitted to global I/O lines GIOa and *GIOa.

In DRAM array, write data transmitted to global I/O line pair GIO is transmitted to DRAM bit line pair DBL through local I/O line pair LIO.

At time t8, memory cycle of DRAM is completed, and precharge period is started. At time t9, a standby state for waiting the next cycle is started.

In SRAM, potential on SRAM word line SWL falls to "L" at time ts2, and thus one cycle is finished.

As described above, in a cache miss writing operation, by writing write data to a corresponding memory cell of the DRAM array and by transmitting the data changed by the external write data to the SRAM array, writing of data to the memory cell in SRAM is completed when one data transfer cycle is completed, and therefore even at a cache miss, data can be written at a high speed.

The above described data transfer operation (hereinafter referred to as a high speed copy back mode) is schematically shown in FIGS. 52A through 52D. Data transfer operation in high speed copy back mode at a cache miss writing operation will be described with reference to FIGS. 52A through 52D.

Figure 52A:
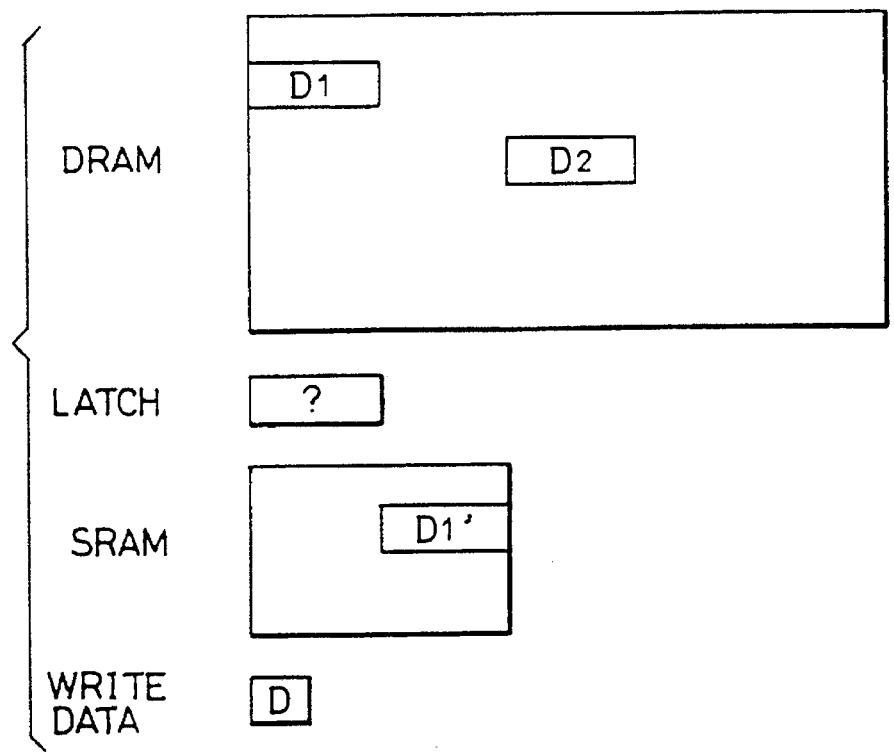
FIGS. 52A through 52D show, as an example, data transfer operation shown in FIG. 51.

Let us assume that CPU generates a request for rewriting data D2 by D. At this time, at that region of the SRAM to which access is requested by the CPU, data D1' has been stored, and data D2 is stored in DRAM array (FIG. 52A).

Figure 52B:
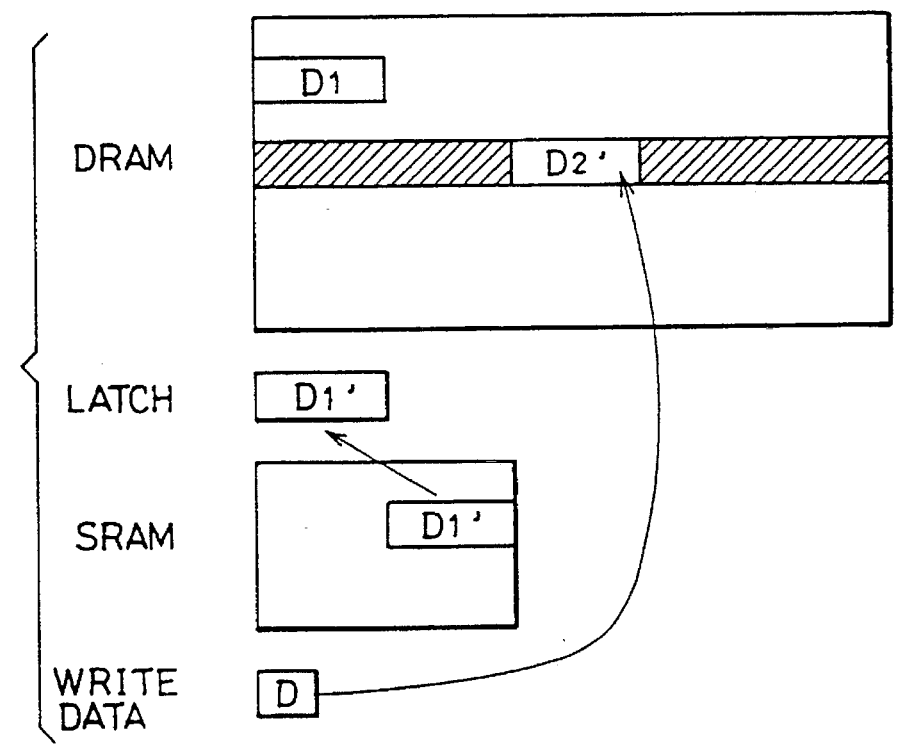

When such a cache miss writing occurs, first, in SRAM, data D1' is transferred to a latch (latch circuit 1811). In parallel to this transferring operation, in DRAM, a word line (hatched portion) including data D2 is selected in accordance with an access from CPU, and write data D is transmitted to the region storing data D2 connected to the selected word line (FIG. 52B). Consequently, data D2 in DRAM is replaced by D2'.

Figure 52C:
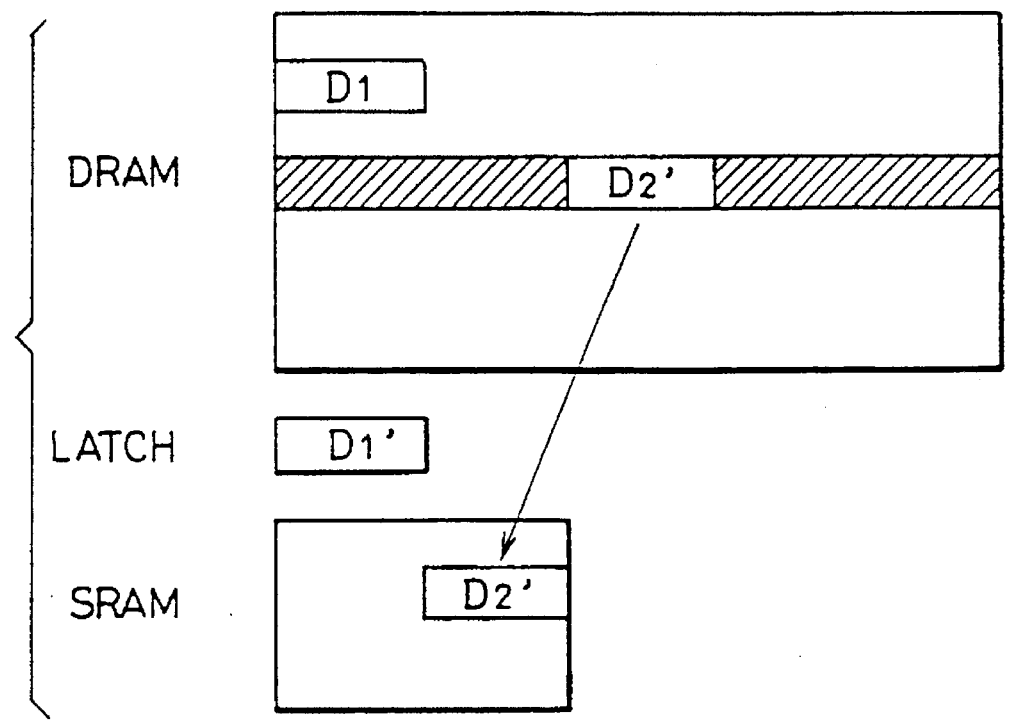
Figure 52D:
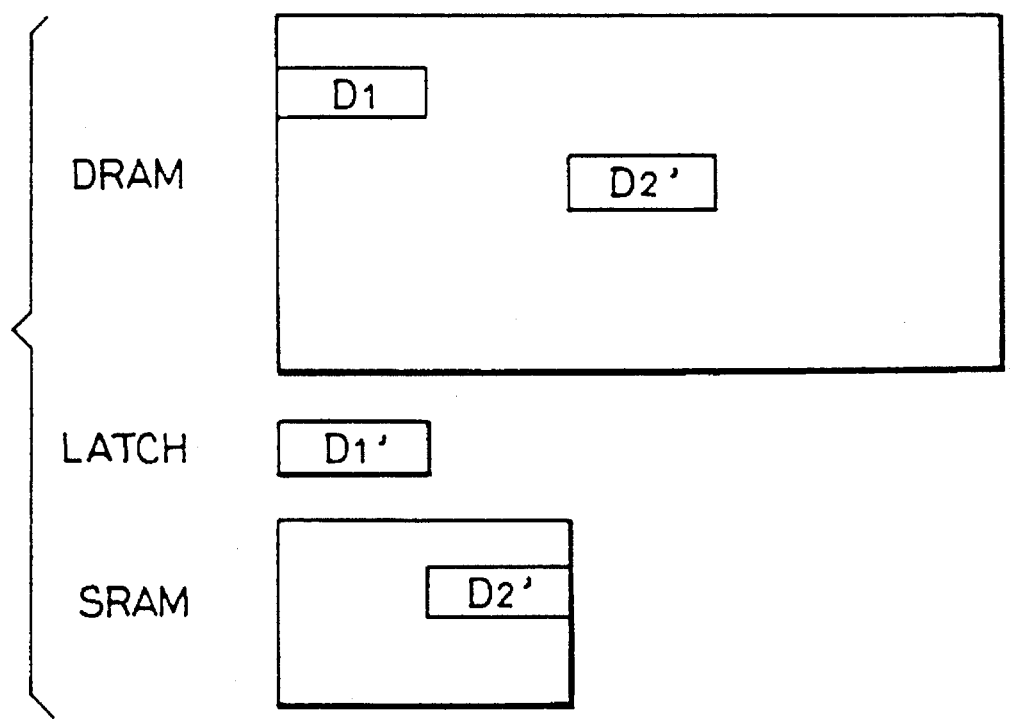

Thereafter, data D2' rewritten by the external write data D is transferred to that region of the SRAM to which access is requested by the CPU. Therefore, the region of the SRAM which has stored data D1' is rewritten by data D2' (FIG. 52C). Therefore, data rewritten by data D2 is stored in that region of the SRAM to which access is requested by the CPU. After the completion of this transfer, DRAM is set to the precharge state. At this state, SRAM can be accessed (see FIG. 52D).

Thereafter, transfer of data D1 stored in the latch to region D1 of DRAM is carried out. Transfer operation of the data D1' latched in latch 1811 to DRAM array will be described.

Figure 53:
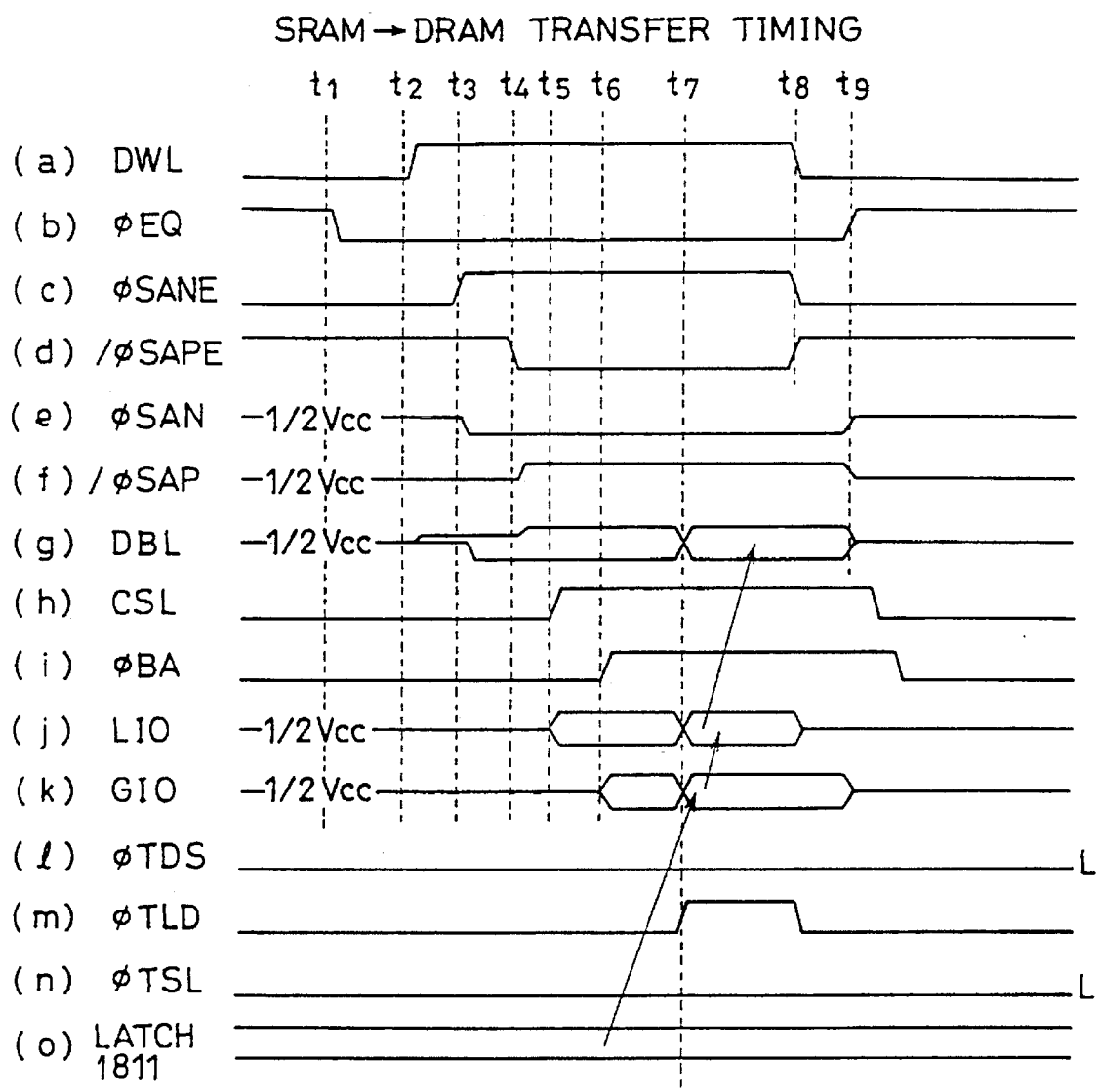

FIG. 53 is a diagram of signal waveforms showing data transfer operation from SRAM to DRAM. Referring to FIG. 53, at time t1, an array access request is made, and an address for designating a region in which data D1' is to be stored is applied (for example, output from a tag memory). From t1 to t6, selection of a DRAM word line DWL, detection and amplification of memory cell data connected to the selected word line are carried out in the same manner as shown in FIG. 51, and data on local I/O lines and on global I/O lines are established.

At time t7, transfer control signal φTLD is generated, and gate circuit 1812 shown in FIG. 49 is opened. Namely, referring to FIG. 50, transistors T105 and T106 are turned on, and data latched in latch circuit 1811 is transmitted to global I/O line GIOa and *GIOa. Data transmitted to global I/O line GIOa (*GIOa) is transmitted to DRAM bit line DBL (*DBL) selected by a column selecting line CSL through a local I/O line LIOa (*LIOa). The transfer operation of data D1 from SRAM to DRAM is completed.

During transfer operation of data latched in latch circuit 1811 to DRAM (copy back operation), SRAM can be arbitrarily accessed. More specifically, the address applied to DRAM at this time is independent from the address applied to SRAM. (Since simultaneous transfer of 16 bits×4 bits of data is carried out in DRAM at the copy back transfer), selecting operation can be done by SRAM column decoder in accordance with a SRAM address signal Ac. At this time, since transfer control signal φTDS is at "L" and transfer control signal φTSL is also at "L", gate circuits 1815 and 1810 are both closed, and therefore, DRAM array is separated from SRAM array. SRAM array can be independently accessed without any influence of data transfer operation to the DRAM array.

Figure 54A:
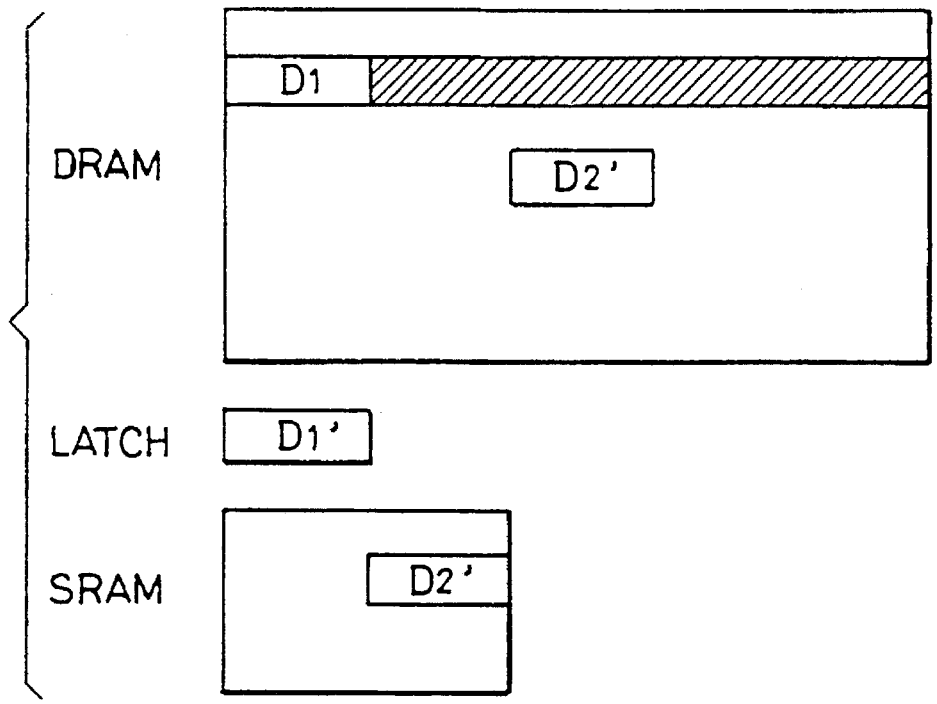

FIG. 54 schematically shows data transfer operation from latch circuit to DRAM. Referring to FIG. 54A, data D1' is stored in the latch. In the DRAM, a word line (hatched portion) including a region for storing data D1 is selected in accordance with an external address (applied from a tag memory or the like).

Figure 54B:
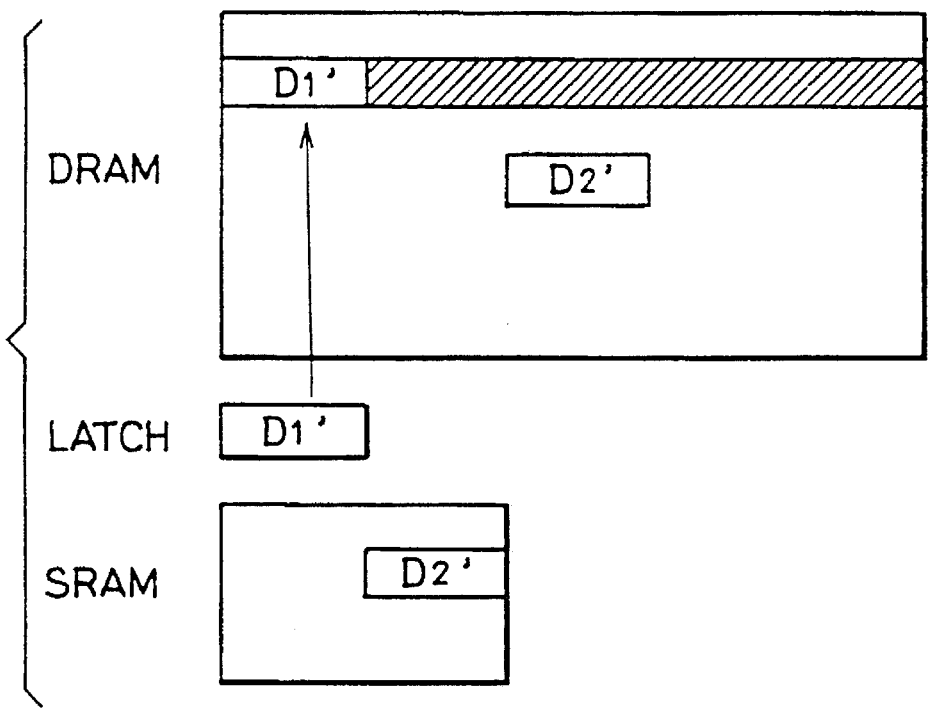

Thereafter, data D1' latched in the latch is transferred to the region D1 included in the selected word line, and data in this region is changed to D1' (FIG. 54B). Consequently, data transfer from the latch to the DRAM is completed.

The operation at a cache miss reading will be described. The operation in the cache miss reading is the same as the operation of the cache miss writing described above, except that the DRAM write enable signal AWDE is at "L" and the gate circuit 1813 is closed. In this operation, as shown in the diagram of waveforms of FIG. 55, word lines SWL and DWL are selected in the SRAM array and the DRAM array. Data of the SRAM array is latched by latch circuit 1811, and data from the DRAM array is transmitted to SRAM bit line SBLa (*SBLa) at time t7. After the data transfer to SRAM at t7, precharging operation is not necessary in SRAM. Therefore, the transferred data can be immediately read.

Namely, at a time of a cache miss, data writing operation and data reading operation can be executed in the same cycle time. Data transfer operation from latch circuit 1811 to DRAM is the same as the operation at the time of cache miss writing described above (see FIGS. 53 and 54).

Figure 56A:
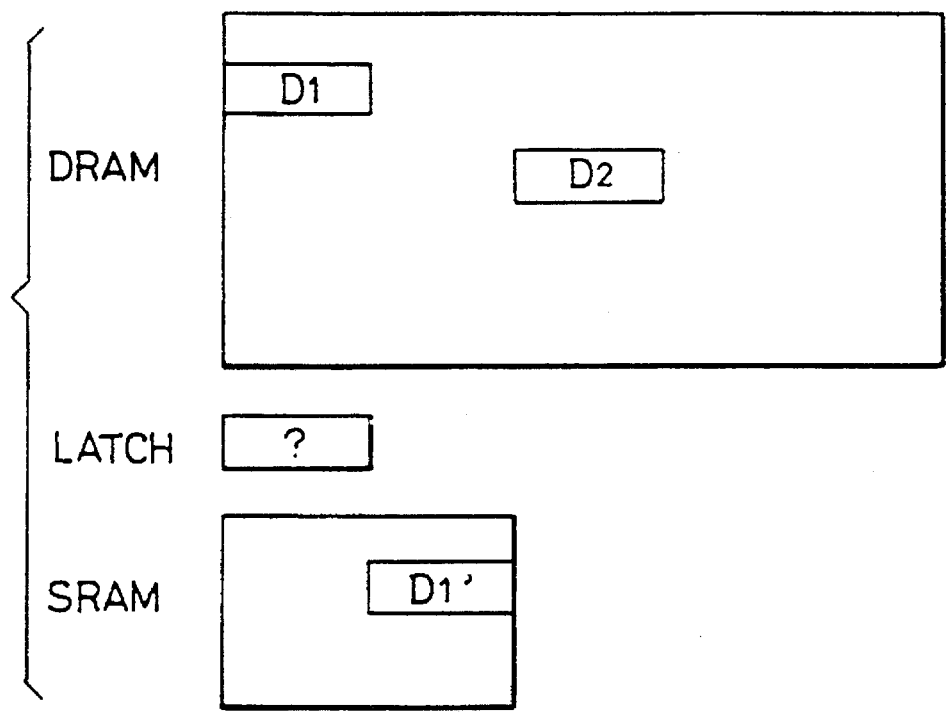
FIGS. 56A through 56F show, as an example, data transfer operation shown in FIG. 55.

Let us assume that data D1' is stored in that region of the SRAM array which is designated by an address from the CPU, and that CPU requests data D2. At this time, DRAM and SRAM are at the standby state (FIG. 56A).

Figure 56B:
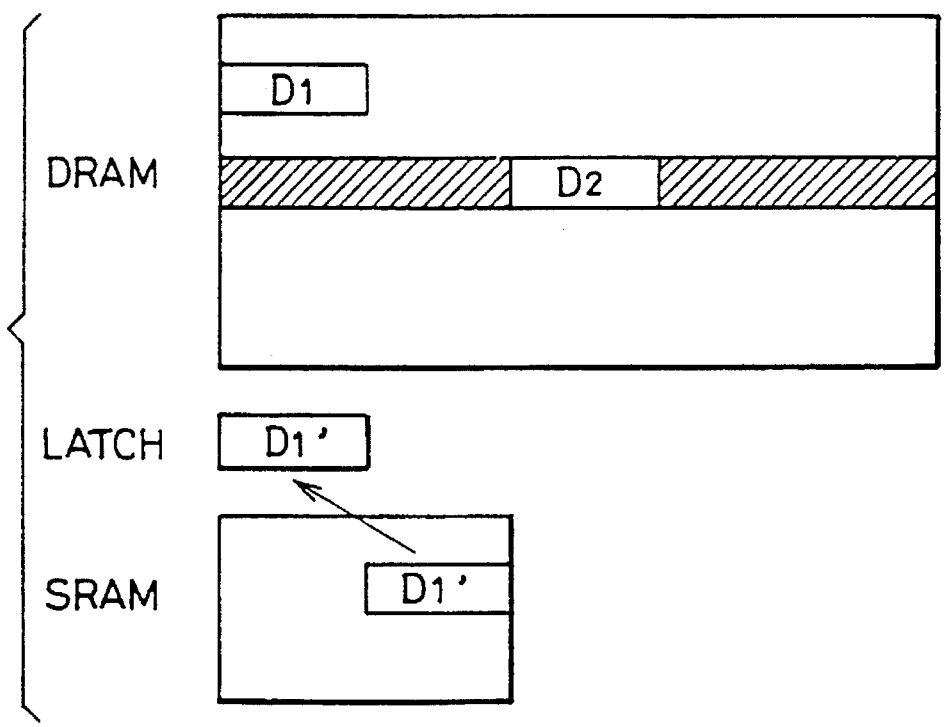

If such a cache miss occurs, first a SRAM word line is selected in SRAM, and data D1' is transferred to the latch (latch circuit 1811). In parallel to the latching operation, a word line (hatched portion) including data D2 is selected in the DRAM in accordance with an address from the CPU (FIG. 56B).

Figure 56C:
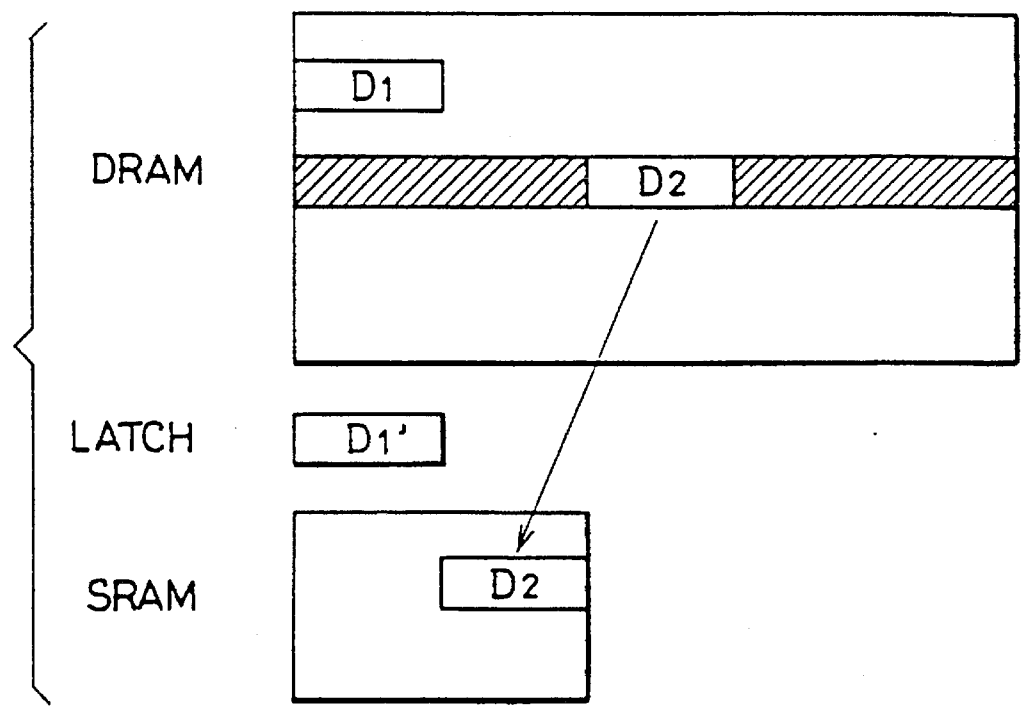

Thereafter, data D2 included in the selected word line of the DRAM is transferred to the region of the SRAM in which the data D1' has been stored, through amplifier circuit 1814 and gate circuit 1815. The latch circuit 1811 keeps the data D1' latched. In the SRAM, data D2 which has been transferred from DRAM can be immediately read (FIG. 56C).

Figure 56D:
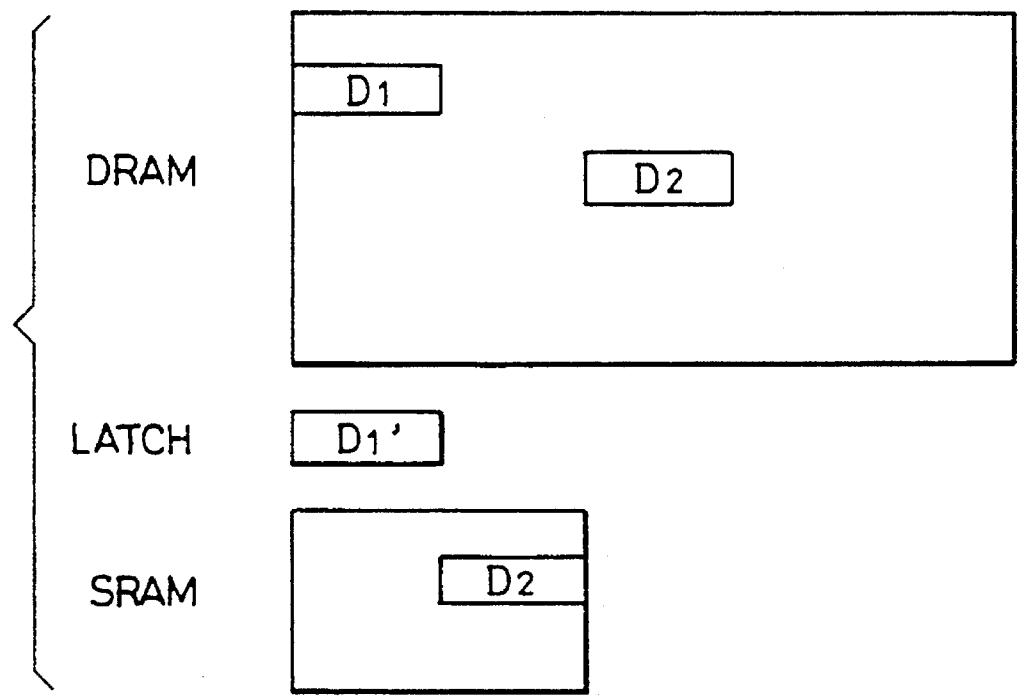

After the data transfer from DRAM to SRAM, the DRAM is temporarily set to a precharge state, so as to replace data D1 by data D1'. The region storing the data D1 is that region in which the data D1' which has been stored in the SRAM is to be stored (FIG. 56D).

Figure 56E:
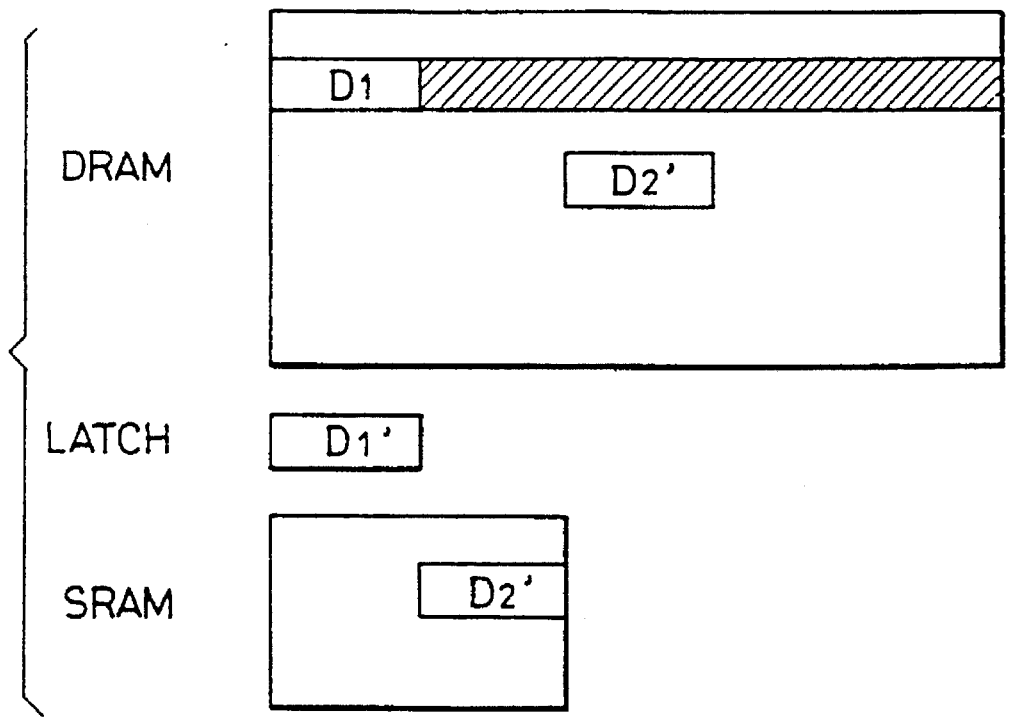

After the completion of precharging in the DRAM, a word line (hatched portion) including data D1 is selected (FIG. 56E). In the word line selecting cycle (array active cycle), the SRAM can be externally accessed.

Figure 56F:
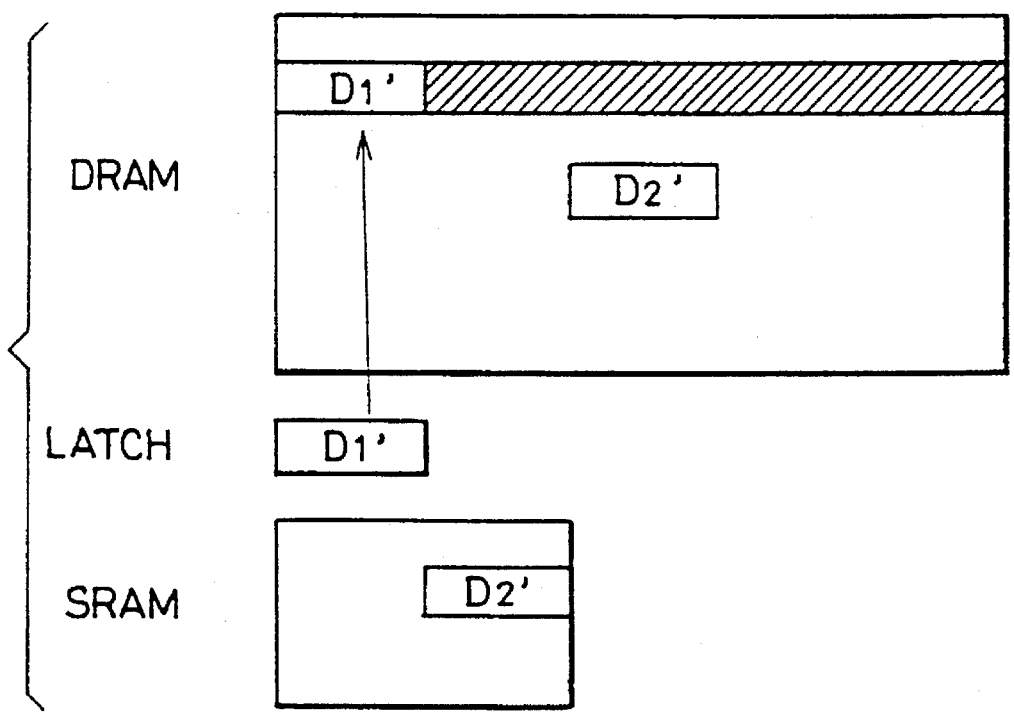

To the region storing data D1 included in the selected word line of the DRAM, the data D1' which has been latched in the latch (latch circuit 1811) is transferred. Consequently, data D1 in the DRAM is rewritten by the data D1' which has been stored in the SRAM (FIG. 56F).

The externally applied address means, in the DRAM, an address from the CPU when a word line is selected in data transfer to SRAM. It means an address from, for example, an external tag memory, when a word line is selected for receiving data from the latch circuit.

Figure 57:
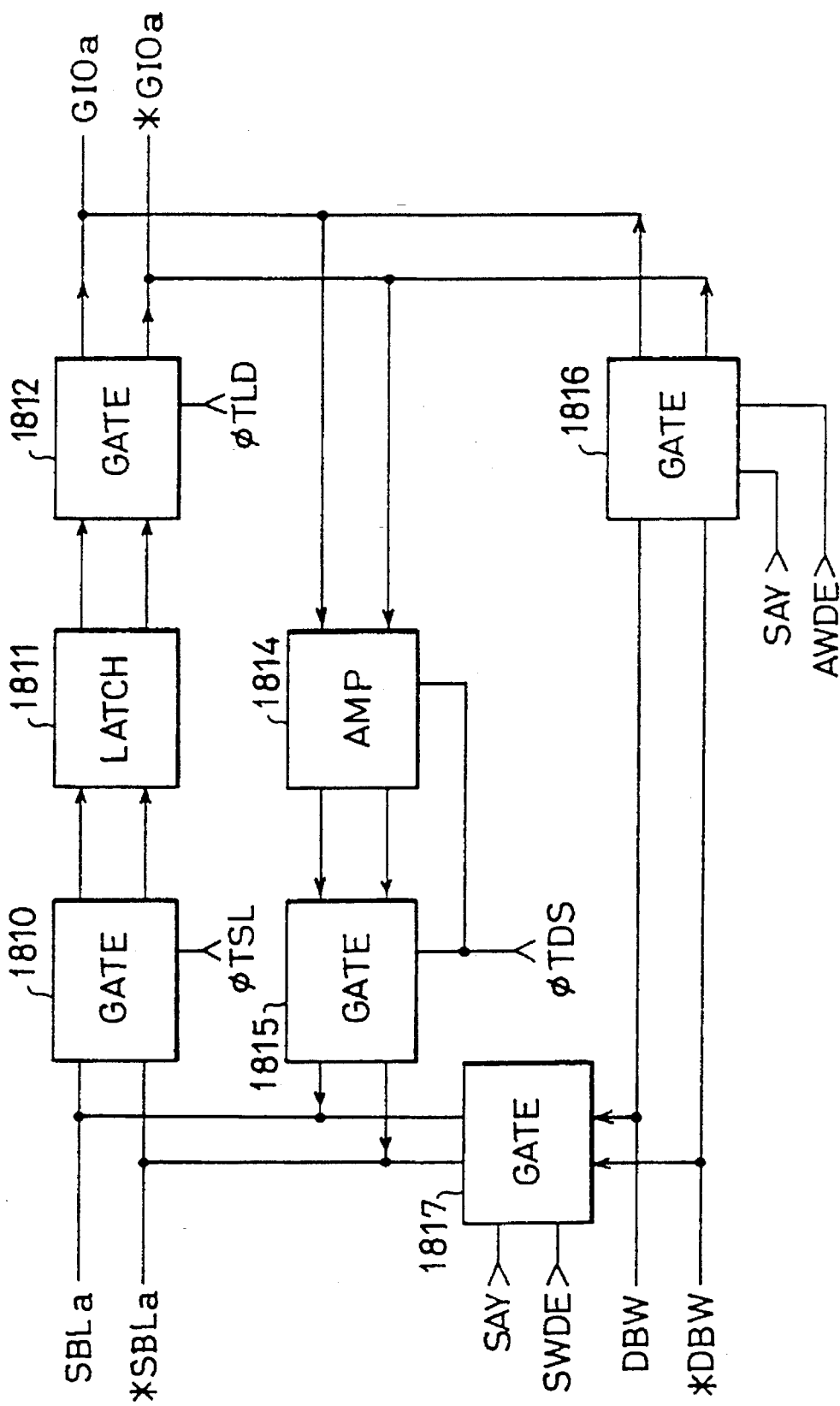

FIG. 57 schematically shows a further structure of a bi-directional data transfer device. FIG. 57 shows a bi-directional transfer gate circuit related to transfer of 1 bit of data in the bi-directional data transfer device, as does FIG. 49. In FIG. 57, the same or corresponding portions are denoted by the same reference numerals as in FIG. 49.

Referring to FIG. 57, the bi-directional transfer gate circuit includes, in addition to the structure of the bi-directional data transfer circuit shown in FIG. 49, a gate circuit 1817 which is provided between SRAM bit line pair SBLa, *SBLa and internal write data transmitting lines DBW, *DBW. Gate circuit 1817 is opened in response to an output SAY of SRAM column decoder and to SRAM write enable signal SWDE. SRAM write enable signal SWDE is generated at data writing to SRAM, and it is generated when the write enable signal W# is at an active state, that is, "L", either at a cache hit or at a cache miss.

Figure 58:
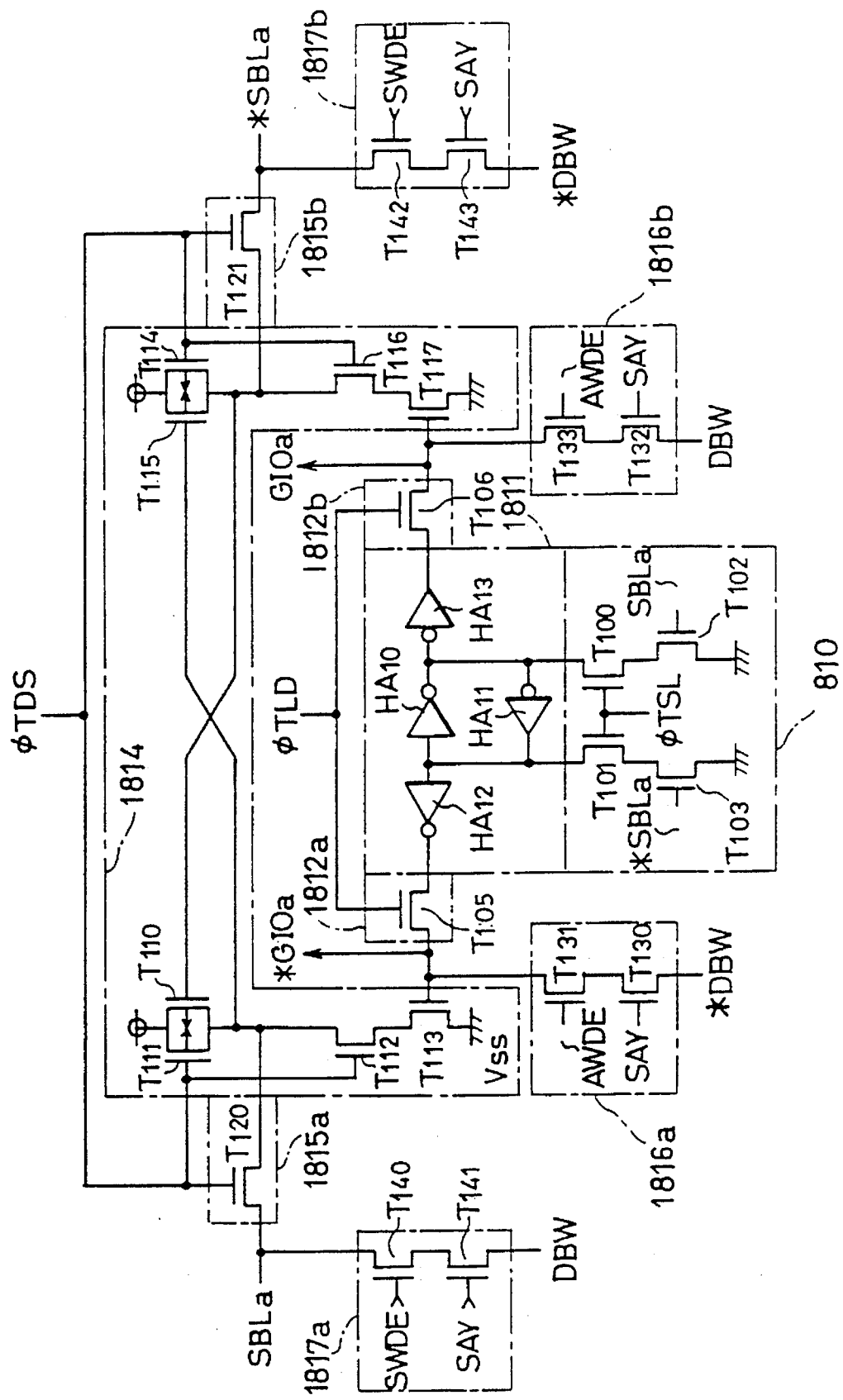
Figure 59:
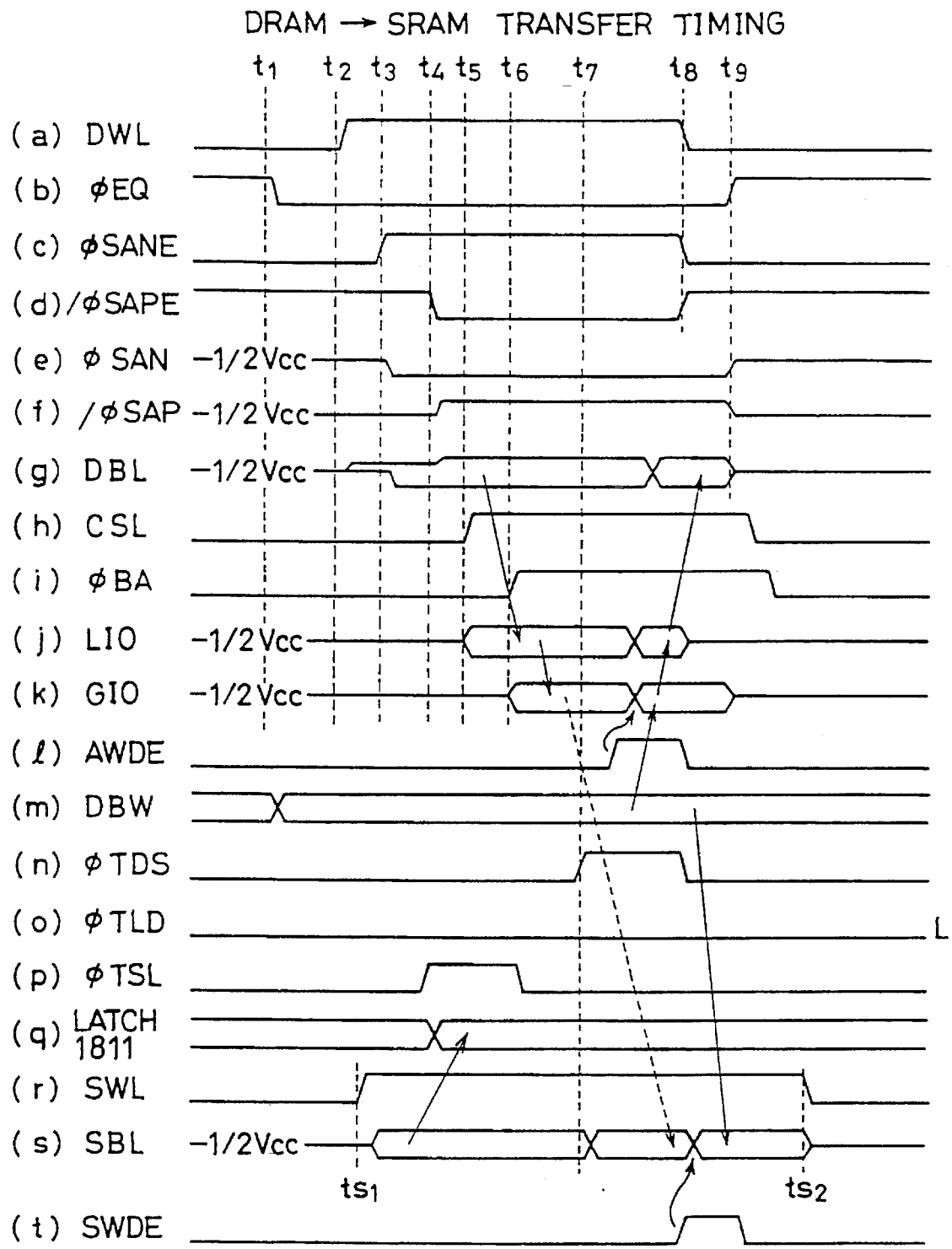

FIG. 58 shows an example of a specific structure of the bi-directional transfer gate circuit shown in FIG. 57. Referring to FIG. 58, gate circuit 1817 includes a gate circuit 1817a for transmitting write data on internal write data bus line DBW to SRAM bit line SBLa, and a gate circuit 1817b for transmitting write data on write data bus line *DBW to SRAM bit line *SBLa. Gate circuit 1817a includes an n channel MOS transistor T141 which is turned on in response to the output SAY from SRAM column decoder, and an n channel MOS transistor T140 which is turned on in response to SRAM write enable signal SWDE.

Gate circuit 1817b includes an n channel MOS transistor T143 which is turned on in response to the output SAY of SRAM column decoder, and an n channel MOS transistor T142 which is turned on in response to SRAM write enable signal SWDE. Both of the gate circuits 1817a and 1817b transmit data on internal data bus lines DBW and *DBW to SRAM bit lines SBLa and *SBLa when the SRAM column decoder output SAY and SRAM write enable signal SWDE are at the active state, that is, "H". Other structures are the same as those shown in FIG. 50. Data transfer from DRAM to SRAM in cache miss writing will be described with reference to FIG. 59, which is a diagram of signal waveforms.

The operation up to the time t7 is the same as that of the bi-directional transfer gate circuit shown in FIGS. 49 and 50. Data from the SRAM has been latched in the latch circuit 1811, and memory cell data from the DRAM array has been transmitted to global I/O line GIOa (*GIOa).

When transfer control signal φTDS rises to "H" at time t7, amplifier circuit 1814 and gate circuit 1815 operate to amplify signal potentials on the global I/O lines GIOa and *GIOa and transmit the same to SRAM bit line pair SBLa and *SBLa. In parallel to this transfer operation, DRAM write enable signal AWDE rises to "H", gate circuit 1816 is opened, and write data on write data lines DBW and *DBW are transmitted to global I/O lines GIOa and *GIOa. Consequently, write data is written to the memory cell selected in the DRAM array.

In parallel to the data transfer operation from the DRAM to the SRAM in response to transfer control signal φTDS, SRAM write enable signal SWDE rises to "H", gate circuit 1817 (1817a, 1817b) is opened, and write data on the write data bus lines DBW and *DBW are transmitted to SRAM bit lines SBLa and *SBLa. Consequently, signal potentials on the SRAM bit lines SBLa and *SBLa are established at signal potentials corresponding to the value of the write data.

The DRAM write enable signal AWDE and SRAM write enable signal SWDE may be generated at any time after the generation of transfer control signal φTDS and after the start of data transfer operation from DRAM to SRAM.

In the structure of the bi-directional transfer gate circuit shown in FIGS. 57 and 58, write data on the internal write data bus line is directly transmitted to SRAM bit lines SBLa and *SBLa through the gate circuit 1817. Therefore, when writing to data in the SRAM is effected by transferring write data from internal data bus lines DBW and *DBW to DRAM, and then transmitting write data from DRAM to the SRAM, and if the access time of DRAM is relatively short, there is a possibility that data rewritten by the write data cannot be surely transmitted to the SRAM, since there is not always sufficient time for transmitting write data through such path. In that case, a structure in which data is directly transmitted from internal write data bus lines DBW and *DBW to the SRAM bit lines SBLa and *SBLa through gate circuit 1817 enables transmission of data which is surely rewritten by the write data to the SRAM.

FIGS. 60A through 60D schematically show data transfer operation from the DRAM to the SRAM by the bi-directional transfer gate circuit shown in FIGS. 57 and 58. The data transfer operation will be briefly described with reference to FIGS. 60A through 60D.

Figure 60A:
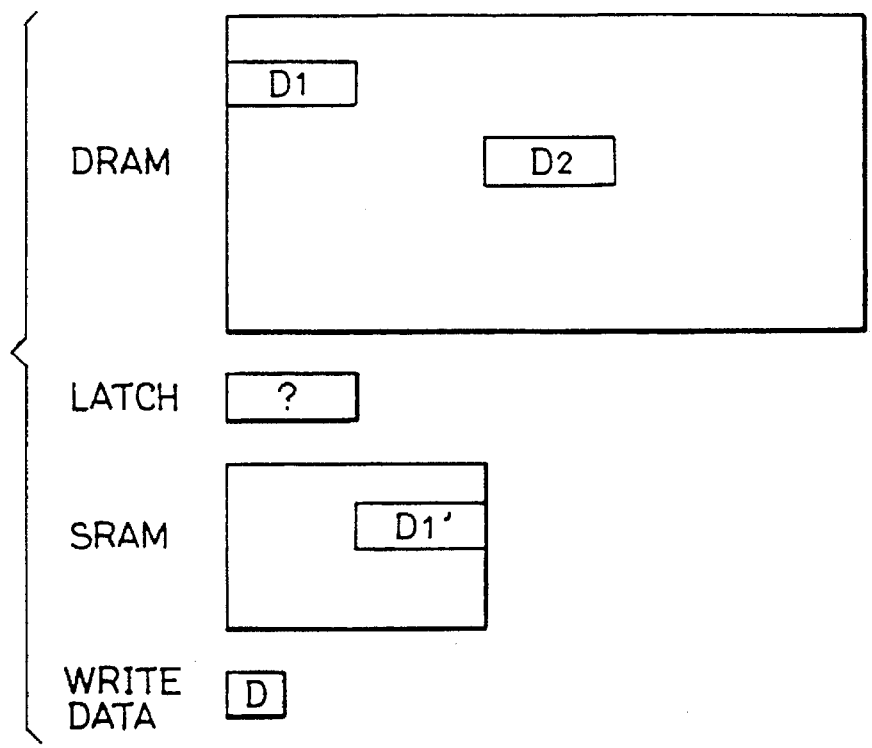

As in FIG. 60A, let us assume that CPU requests rewriting of data D2. DRAM and SRAM are both at the precharge state (FIG. 60A).

Figure 60B:
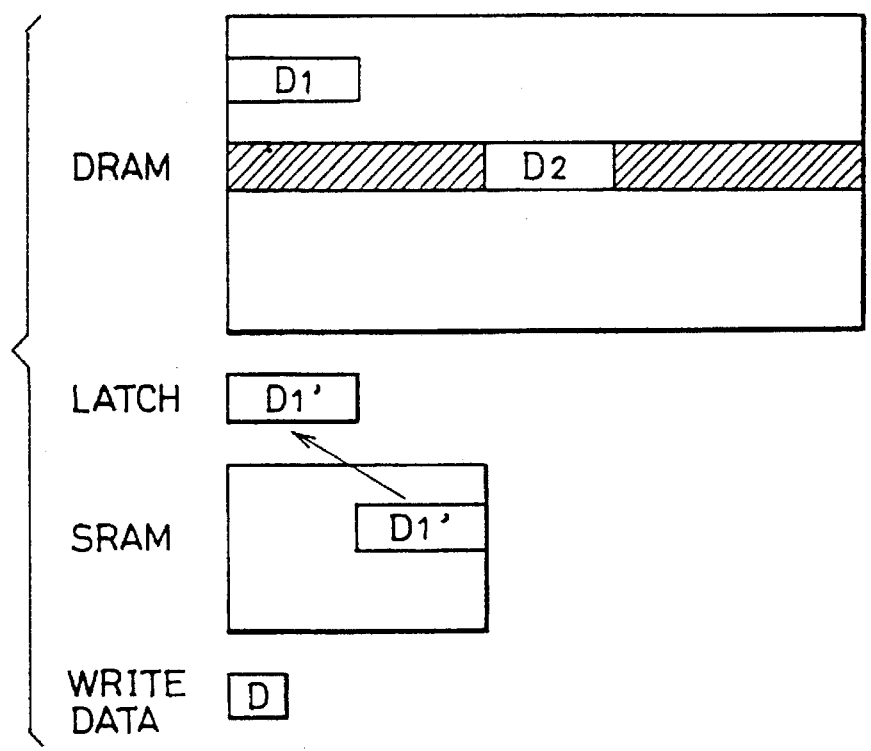

Referring to FIG. 60B, a word line (hatched portion) including data D2 is selected in the DRAM, while in the SRAM, data of the region including data D1' are transmitted to the latch. The data D1' is not to be rewritten but it should be transferred to that region of the DRAM in which the data D1 is to be stored.

Figure 60C:
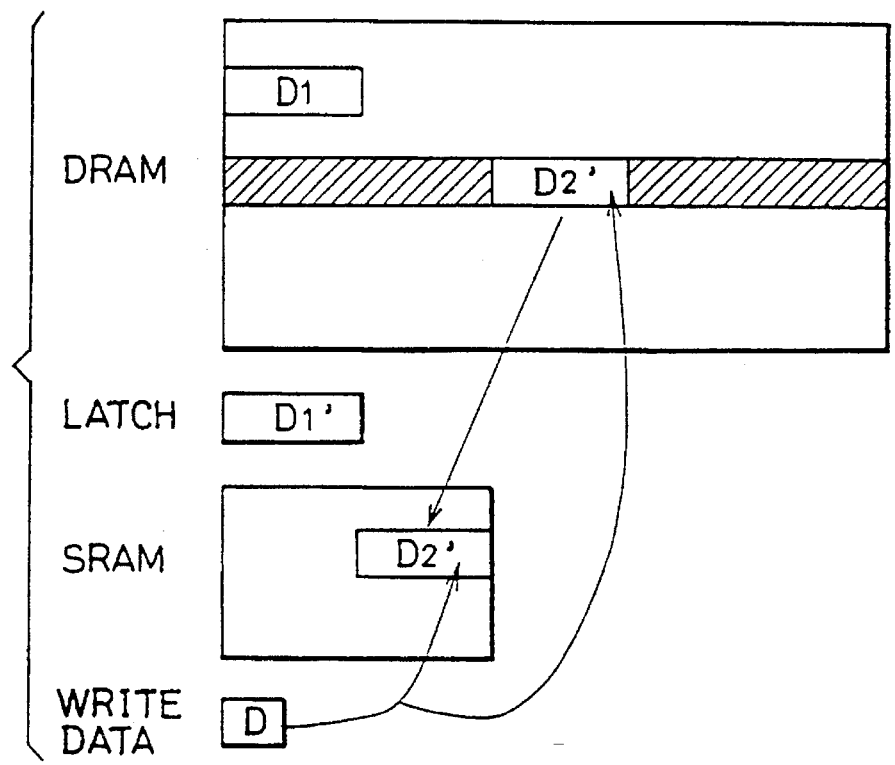

Referring to FIG. 60C, while data D2 of the DRAM is being transferred to a corresponding memory cell of the SRAM, write data D is transferred to the region of the DRAM to which data D2 is to be stored, and also to that region of the SRAM to which data D1 is to be stored. Consequently, data D2 in the DRAM and in the SRAM are changed to data D2' which has been rewritten by the write data D. Namely, in parallel to data transfer from the DRAM to SRAM, write data D is written to SRAM, and data writing is carried out in DRAM.

Figure 60D:
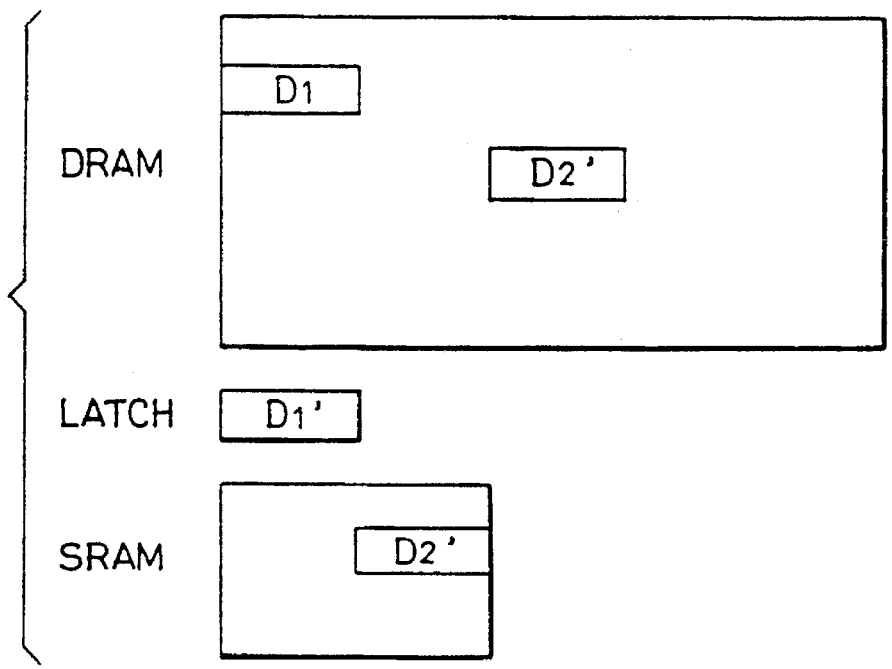

Referring to FIG. 60D, the DRAM is returned to a precharge state, so as to transfer the latched data D1' to the region for storing the data D1 in the DRAM. In this state, CPU can access SRAM.

Transfer operation of the data D1' latched in the latch (latch circuit 1811) to data D1 storing region of the DRAM is the same as that described with reference to FIG. 54. Therefore, it is not repeated.

In the bi-directional data transfer circuit shown in FIGS. 57 and 58, gate circuits 1816 and 1817 are both opened in cache miss writing. Therefore, the same operation as the data transfer operation described with reference to the bi-directional transfer gate circuit shown in FIGS. 49 and 50 is carried out, namely, only the data transfer operation schematically shown in FIGS. 56A to 56F is carried out. Therefore, the description thereof is not repeated.

By providing such a gate circuit 1817 as described above, even if there is not a sufficient time for rewriting data in the DRAM by write data D and then transmitting the rewritten data to the SRAM, data in the SRAM can be surely rewritten by the write data D.

A so-called "write through mode" is available in the above described bi-directional data transfer device. In the "write through mode", data written to the SRAM is also written to the corresponding memory cell of the DRAM at that time during cache access. Namely, if the above described cache miss writing operation is executed at a cache hit when data exists in the SRAM, the write through is enabled. In cache miss writing operation when data does not exist in the cache, the above described cache miss writing operation may be done without modification for directly writing data to the DRAM array.

When the DRAM is to be directly accessed, data can be directly written to the DRAM by activating only the DRAM write enable signal AWDE. When data is to be written only to the SRAM at a time of a cache hit and it is not necessary to execute the write through mode operation, only the SRAM write enable signal SWDE is set to the active state.

When data transfer is carried out by using the data transfer device shown in FIGS. 49 and 50 or FIGS. 57 and 58, only one precharge period is necessary in the DRAM for receiving the latched data, and therefore data transfer can be carried out at a high speed between the SRAM and the DRAM. In the conventional copy back and block transfer mode cycles, the SRAM cannot be accessed before the completion of block transfer. However, by using the high speed copy back mode, data transfer from the DRAM to the SRAM is carried out in the first data transfer cycle, namely, the conventional block transfer is carried out at first, so that after the data transfer to the SRAM, the SRAM can be directly accessed. Therefore, a semiconductor memory device containing a cache having higher speed of operation can be realized.

In the bi-directional data transfer device, rewriting of data to SRAM is carried out in parallel to data transfer. Therefore, operations in cache miss reading and cache miss writing can be executed in the same cycle time.

In the foregoing, the high speed copy back mode is applied to data transfer between SRAM array and DRAM array at a cache miss in a semiconductor memory device containing a cache, as an example. However, high speed exchange of data is also made possible when data are transferred between two memory cells such as a normal SRAM array and a DRAM array, and efficiency in data transfer can be significantly improved. Namely, the bi-directional data transfer device can be applied not only to a semiconductor memory device containing a cache such as shown in FIG. 32 but also to a semiconductor memory device having a general high speed memory and a memory of large capacity, as a data transfer device between the high speed memory and large capacity memory.

(c) Data transfer between DRAM array and SRAM array with reduced current consumption.

(i) In the arrangement with clamping transistors as shown in FIGS. 24 and 30, data can be transferred between DRAM array and SRAM array because of the reduced logical swing of the potentials of SRAM bit lines. This clamping transistor arrangement can be expanded more generally to achieve high speed data transfer operation with less current consumption. Now, data transfer operation with modified clamping transistor arrangement will be described with reference to FIGS. 61 through 70.

Figure 61:
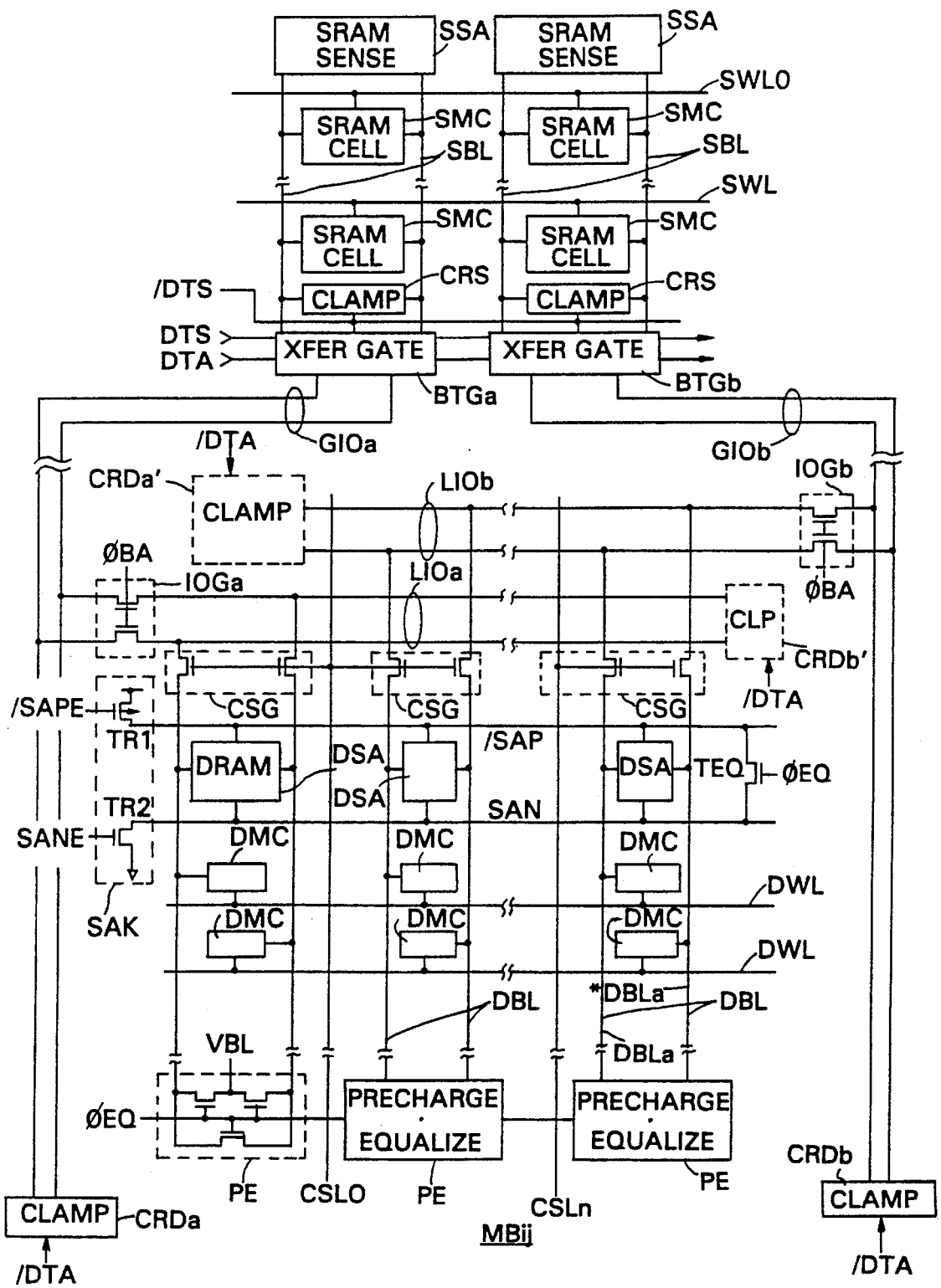
FIGS. 61 through 70 represent modified data transfer arrangement with clamping circuitry.

FIG. 61 shows an array structure for fast data transfer with reduced current consumption. The arrangement of FIG. 61 is the same as that of FIG. 8 except that clamping circuits CRS are provided for respective SRAM bit line pairs SBL, and clamping circuits CRD for clamping DRAM IO lines are provided. The SRAM clamping circuit has the same construction as that of FIG. 21, that is, diode-connected transistors provided for each SRAM bit line.

DRAM clamping circuits CRD includes a clamp circuit CRDa provided for the global IO line pair GIOa and a clamping circuit CRDb provided for the global IO line pair GIOb. Clamping circuits may be provided for the local IO line pairs LIOa and LIOb. The clamping circuits may be provided both for the global IO line pairs GIOa and GIOb and for the local IO line pairs LIOa and LIOb.

The SRAM array of FIG. 61 is shown having one word line per one row of SRAM cells, but it may have the multiplicate word line arrangement of a plurality of word lines per one row of SRAM cells as shown in FIG. 24.

The bi-directional data transfer gate circuit 3 includes bi-directional transfer gates BIGa and BIGb provided between SRAM bit line pairs SBL and the global IO line pairs GIOa and GIOb. The bi-directional transfer gates BIGa and BIGb carry out data transfer between SRAM bit line pairs and the global IO lines GIOa and GIOb in response to data transfer instructing signals DIS and DIA. The signal DIS instructs data transfer from DRAM array to SRAM array. The signal DIA instructs data transfer from SRAM array to DRAM array.

SRAM clamping circuit CRS is enabled and disabled in response to a signal/DTS which is an inversion signal of the signal DTS. DRAM clamping circuits CRD is enabled and disabled in response to a signal/DTA which is an inversion signal of the signal DTA.

In data transfer from DRAM array to SRAM array, the transfer instructing signal DTS is activated to be "M" to disable the SRAM clamping circuit CRS to inhibit the bit line clamping in SRAM array. In data transfer from SRAM array to DRAM array, the transfer instructing signal DTA is activated to be "H" to disable the clamping circuits CRDa and CRDb (and/or CRDa' and CRDb').

Figure 62:
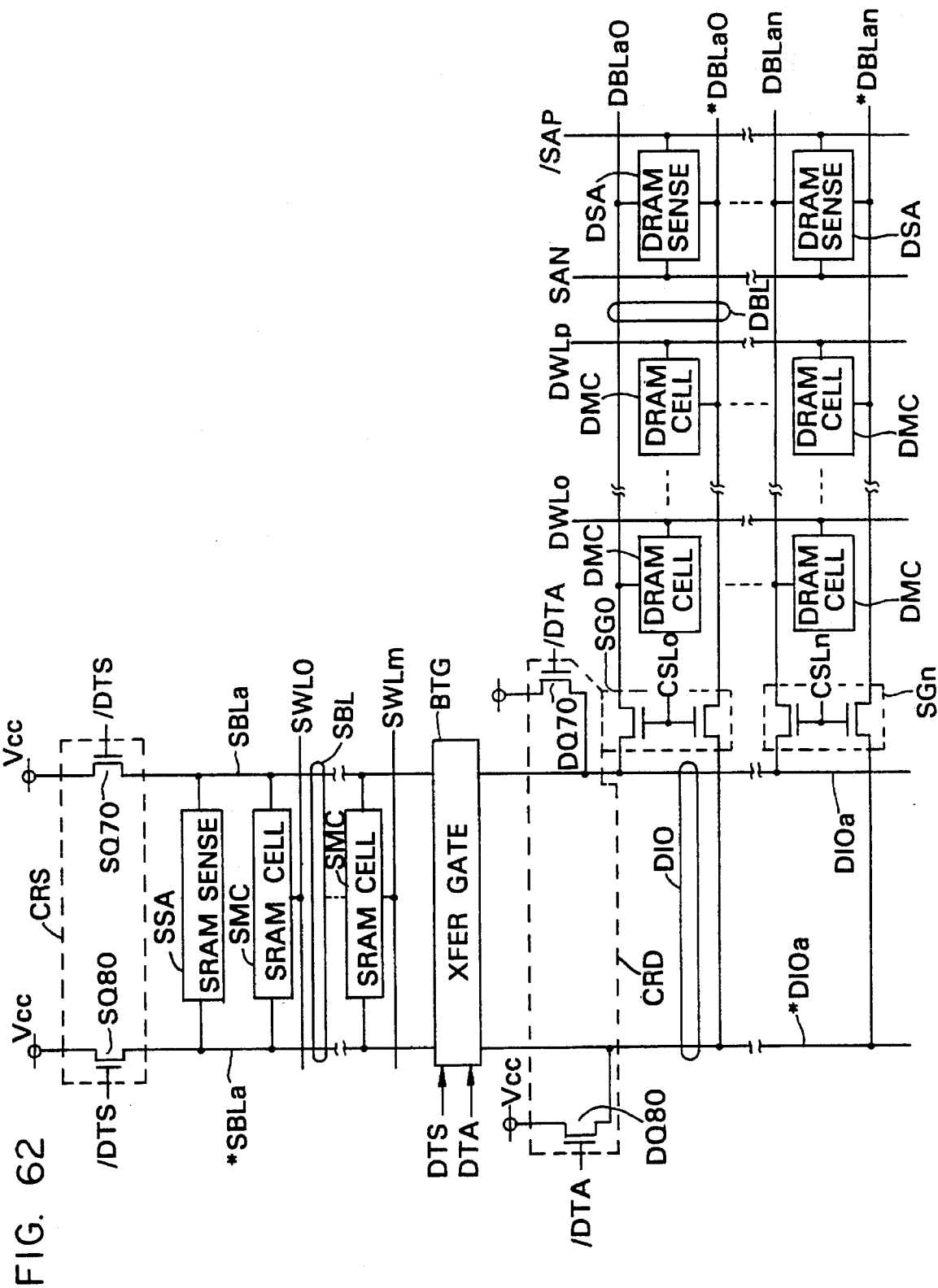

FIG. 62 shows a construction related to a data transfer gate of FIG. 61. In FIG. 62, the global IO line pair LIO and the global IO line pair GIO are shown combinedly as DRAMIO line pair DIO. The global IO line pair is provided only for one memory block while the global IO line pair is provided commonly for the memory blocks in a column block (see FIGS. 7 and 8). Therefore, the clamping circuit CRD is preferably provided at least for the global IO line pair GIO. The arrangement of FIG. 60 includes the block selection gates IOGa and IOGb. However, the global IO line pair GIO and the local IO line pair LIO are combinedly shown as DRAMIO line pair DIO. Accordingly, block selection gate IOG and column selection gate CSG of FIG. 60 is combinedly shown as a selection gate SG.

Only the DRAMIO line pair DIO connected to one bi-directional transfer gate BIG is shown in FIG. 62, and therefore the column selection signal CSL transferred on the column selecting line CSL is shown selecting one selection gate SG in FIG. 62.

DRAM bit line pair DBL includes bit lines DBL and *DBLa, and SRAM bit line pair SBL includes bit lines SBLa and *SBLa. DRAM bit lines DBLa and *DBLa representatively show pairs of bit lines DBLaO, *DBLaO through DBLan, *DBLan. SRAM array also includes word lines SWLo through SWLn, and DRAM array includes word lines DWLo through DWLp.

SRAM clamping circuit CRS includes n channel MOS transistor SQ70 for the SRAM bit line SBLa and n channel MOS transistor SQ80 for the SRAM bit line *SBLa. The transistors SQ70 and SQ80 receive the inversion signal/DIS at their gates.

DRAM clamping circuit CRD includes n channel MOS transistor DQ70 for DRAMIO line DIOa and n channel MOS transistor SQ80 for DRAMIO line *DIOa. The inversion signal/DTA is applied to the gates of the transistors DQ70 and DQ80.

Figure 63:
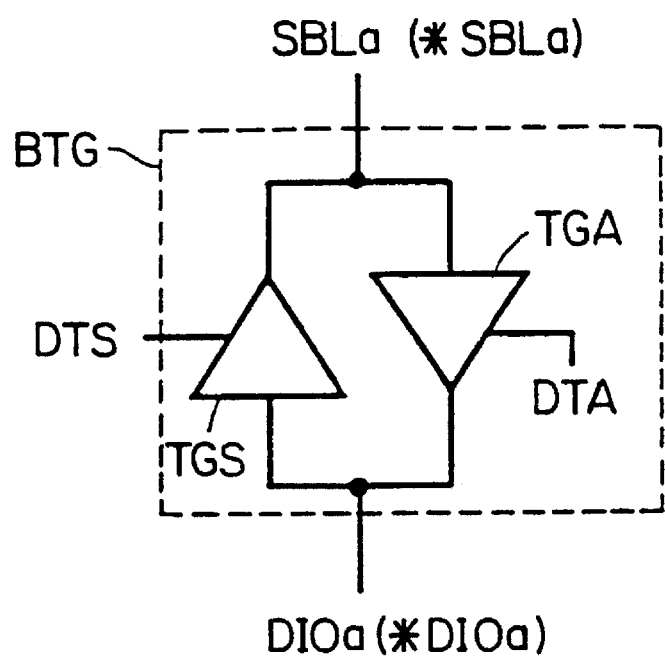

(ii) Various constructions can be applied for the data transfer gate. First, the bi-directional transfer gate as shown in FIG. 63 is considered. The gate of FIG. 63 is the same as the gate of FIG. 44 except for the naming of the components and the signal. Therefore, no detailed explanation is described of the gate of FIG. 63. Now, an operation in transferring data from DRAM array to SRAM array with reference to FIG. 63 showing the operating waveform diagram therefor. Data transfer from DRAM array to SRAM array is effected in the cache miss where the signal CI is active at "H".

Before time t1, the precharge instructing signal φEQ is active at "H", and therefore, the equalizing transistors TEQ equalize the sense amplifier driving signal lines SAN and/SAP to the precharge potential of Vcc/2. The DRAM bit line pair DBL (bit lines DBLa, *DBLa) are precharged to the intermediate potential of Vcc/2 by the precharge/equalize circuit DE.

DRAMIO lines DIOa and *DIOa are precharged to "H" at the potential level of Vcc-Vth by the clamping circuit CRD. SRAM bit liens SBLa and *SBLa are precharged to "H" at the potential level of Vcc-Vth by the clamping circuit CRS.

At time t1, the precharge instructing signal φEQ falls to "L" to disable the equalizing transistors TEQ and precharge/equalize circuit DE, which completes the precharging of the sense amplifier driving signal lines SAN and/SAP, and the DRAM bit lines DBLa and *DBLa. DRAM bit lines DBLa and *DBLa, and the sense amplifier driving signal lines SAN and/SAP are brought into a floating state at the intermediate potential Vcc/2.

Then, row decoder 14 (see FIG. 9) carries out a row selection operation in accordance with an externally applied address.

After a certain time has elapsed from the time t1, one word line DWL is selected in DRAM array, and the potential of the selected word line DWL (one of the word lines DWLo to DWLp) rises to "H". DRAM memory cells DMC connected to the selected word line DWL are connected to associated DRAM bit lines DBLa (or *DBLa) whose potentials are changed in accordance with data of the associated memory cells.

Figure 64:
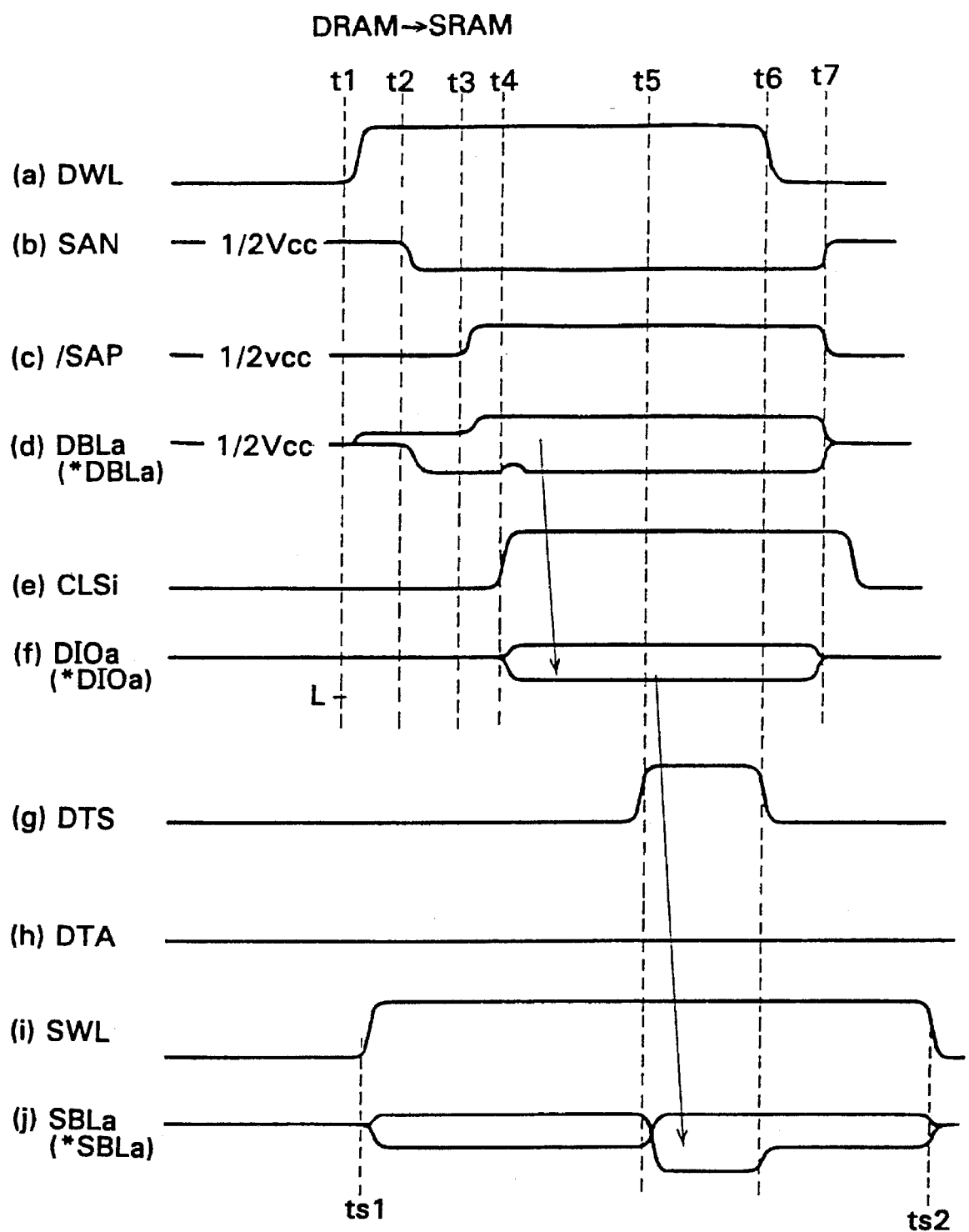

FIG. 64 shows the DRAM bit line potential change when a memory cell storing "H" data is selected.

At time t2, a sense amplifier activating signal SANE rises from the ground potential to the operating power supply Vcc, to turn on the transistor TR2 in the sense amplifier activating circuit SAK. Consequently, the sense amplifier driving signal SAN falls from the intermediate potential level Vcc/2 to the ground potential, to activate the N sense amplifier part in the DRAM sense amplifier DS. Potential of the bit line of a lower potential in a DRAM bit line pair is discharged to the ground potential level Vss.

At time t3, the sense amplifier activating signal/SAPE falls from the Vcc level to Vss level, to turn the transistor TR1 in the sense amplifier activating circuit SAK. Responsively, the sense amplifier driving signal/SAP rises from the intermediate potential Vcc/2 to the supply potential Vcc. Then, D sense amplifier part in DRAM sense amplifier DSA is activated to boost the potential of a bit line of a higher potential in the pair to the supply potential level Vcc.

At time t4, the column selection signal CSL is generated by the decoding in the column decoder 15 (see FIG. 9). Then, a selected gate SGi is make conductive to connect and associated DRAM bit line pair (DBLia, *DBLia) to DRAMIO line pair DIO (DIOa, *DIOa). DRAM sense amplifier DSA has a larger driving ability than the current supplying ability of the clamping circuit CRD. Consequently, the potentials of DRAMIO line pair correspond to the potential levels of "H" and "L" amplified by the sense amplifier DSA.

In this operation, "L" level of DRAMIO line pair DIO is slightly higher than the ground potential because the clamping circuit CRD supplies current flow to implement the pull-up function. The "L" level potential is determined by the current driving abilities of the clamping transistors SQ70 and SQ80, the transistor of the selection gate SGi and the discharging transistors (n channel MOS transistors; see FIG. 8) in DRAM sense amplifier DSA. The selection gate SGi has a relatively high resistance, and the logical swing of the DRAMIO line DIOa (*DIOa) is determined by the ratio of on resistances of the clamping transistor DQ70 (or DQ80) and the transistor of the selection gate SGi. DRAM bit line has substantially a full logical swing of Vcc level by DRAM sense amplifier DSA.

DRAMIO line DIOa (or DIOa) has a greater capacitance than DRAM bit line DBLa (or *DBLa). Thus, although "L" level potential of DRAM bit line DBLa (or *DBLa) rises slightly when the column selection signal CSLi rises, DRAM bit line is ensurely discharged to the ground level by DRAM sense amplifier DSA driving the small capacitance of DRAM bit line. This situation is analogous to the data reading out operation in an ordinary DRAM in which internal data transmitting lines are precharged to "H" level. Therefore, even if the clamping transistors DQ70 and DQ80 are in an on-state, the current flow from the clamping transistors DQ70 and DQ80 cannot destruct data in a DRAM memory cell.

In SRAM array, SRAM row decoder 21 (see FIG. 9) carries out row selection operation at time ts1 to select a SRAM word line SWL (one of SRAM word lines SWL0 to SWLm), and raises the potential of the selected SRAM word line SWL.

Row selection in DRAM and row selection in SRAM are carried out asynchronously with each other. Data of SRAM cells connected to the selected SRAM word line SWL are transferred to associated SRAm bit line pair SBL. Consequently, the potentials of SRAM bit lines SBLa and *SBLa change from the clamping potential of Vcc-Vth to the potentials corresponding to the transferred data.

At time t5, the data transfer instructing signal DTS instructing data transfer from DRAM array to SRAM array rises to "H". Before the time t5, data of selected DRAM cell has been transferred onto DRAMIO lines DIOa and *DIOa, and SRAM cell has been connected to SRAM bit line pair SBL. Then, the transfer circuit TGS shown in FIG. 63 is activated to transfer data on DRAMIO lines DIOa and *DIOa to SRAM bit lines SBLa and *SBLa in response to the signal DIS.

In this operation, the clamping transistors SQ70 and SQ80 are made being turned off. Thus, "H" and "L" levels of SRAM bit lines SBLa and *SBLa correspond to the potential levels supplied by the transfer gate TGS.

The relationship between the time ts1 and the times t1 through t5 is arbitrary as far as the time t5 at which the signal DIS is activated is alter than both the time when the column selection signal CSLi is generated and the potentials of DRAMIO line pair DIO are asserted and the time ts1 when selection of SRAM word line SWL is carried out. The signal DIA instructing data transfer from SRAM array to DRAM array is maintained at "L" during this data transfer operation.

At time t6, the selected DRAM word line DWL has its potential fallen to "L", and the transfer instructing signal DIS falls to "L". Responsively, the clamping circuit CRS, for SRAM bit line pair SBL is activated again to raise the "L" potential level of SRAM bit line SBLa (or *SBLa).

At time t7, the sense amplifier driving signals SAN and/SAP both return to the intermediate potential level Vcc to release the latching by DRAM sense amplifier DSA. Then, DRAMIO lines DIOa and *DIOa have the potential returned to "H" of Vcc-Vth by means of DRAM clamping circuit CRD for DRAMI0 line pair DIO. Thereafter, the column selection signal CSLi falls to "L" to isolate DRAM bit line pair from DRAMIO line pair.

In SRAM, the potential of SRAM word line SWL falls to "L" at the time ts2, to complete the data transfer cycle for transferring data from DRAM array to SRAM array.

Clamping circuits CRD and *CRS operate to reduce the logical swing of associated signal lines to establish the signal potentials thereon at high speed, resulting in fast data transfer.

If clamping circuits CRS and CRD are maintained active during the data transfer operation, a current flow flows from the clamping transistor SQ70 (or SQ80) for SRAM bit line through an output driving transistor included in the transfer circuit TGS into the ground level, resulting in increased current consumption. Data transfer is made on a unit of plural bits such as 16 bits in the CDRAM of the invention, and therefore the penetrating current flow from the clamping transistors provides a significant value to degrade the low current consumption performance. Inhibition of the clamping by the clamping circuit CRS for SRAM bit line pair receiving the transferred data reduces significantly the penetrating current flow.

In DRAM transferring data, clamping circuit CRD is maintained operating. The clamping circuit CRD implements pull-up function. The current supply abilities of the clamping transistors DQ70 and DQ80 is small. The on-resistance of the selection gate SGi is relatively large. The current flow from the clamping transistor DQ70 or DQ80 is discharged by DRAM sense amplifier DSA. DRAM bit line potentials are made at Vcc and Vss levels by DRAM sense amplifier DSA while "L" level of DRAMIO line DIOa or *DIOa is slightly raised to a level determined by the ration of on-resistance of the clamping transistor DQ70 (or DQ80) to on-resistance of the selection gate SGi and the discharging transistor in DRAM sense amplifier DSA.

Bidirectional transfer gate BTG has sufficiently larger current driving ability than the discharging ability (or latching ability) of the transistor in SRAm memory cell. Therefore, when the bi-directional transfer gate BTG operates, large current flow is caused from the clamping transistor SQ70 or SQ80 into a driving transistor in the transfer gate BTG. The current flow becomes large when a block of data is transferred simultaneously. This large current flow is saved by deactivation of SRAM clamping circuit CRS.

In the data transfer from DRAM to SRAM as described above, the clamping circuit CRS for SRAM bit line pair SBL is inhibited from clamping the potential in synchronization with the data transfer instructing signal DTS. However, there is a possibility that a column current which flows from the clamping transistor SQ70 or SQ80 into SRAM memory cell transistor may be caused when SRAM word line SWL has the potential risen to "H" and SRAM bit lines are subjected to the potential clamping. In order to reduce this column current, the clamping operation of the SRAM clamping circuit CRS is inhibited in synchronization with the selection of an SRAM word line. This construction can be implemented by applying a logical product signal of the data transfer instructing signal for data transfer from DRAM to SRAM and an SRAM word line driving signal SWL. Data transfer from DRAM to SRAM is carried out in a cache miss, and the data transfer instructing signal DTS can be asserted prior to the selection of an SRAM word line.

Figure 65:
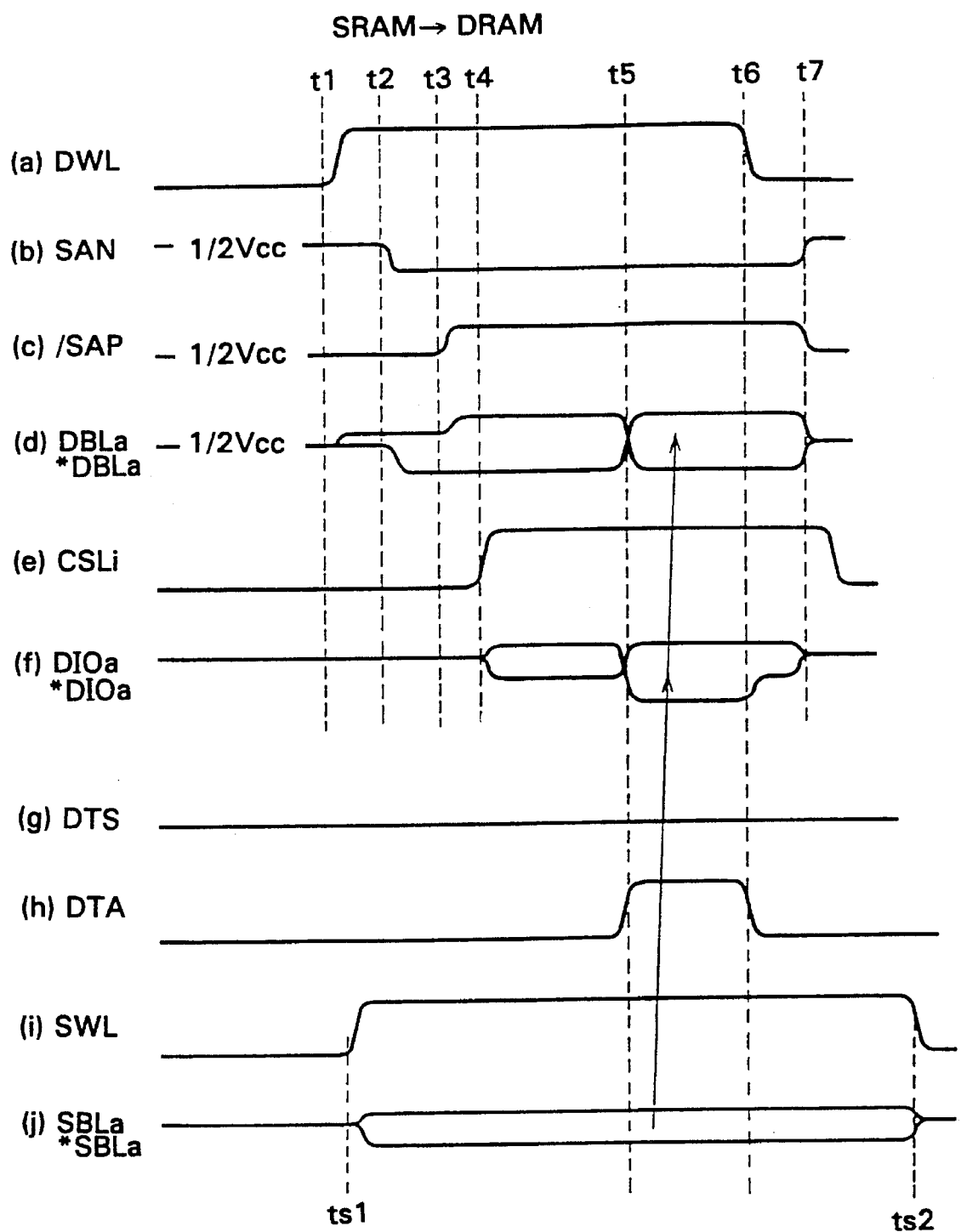

Now, data transfer from SRAM to DRAM will be described with reference to FIG. 65 showing operation waveforms therefor.

In DRAM, the same operation as that of DRAM to SRAM data transfer described with reference to FIG. 64 is carried out from the time t1 till the time t4. In SRAM, similarly, SRAM word line SWL is selected to have the potential risen at the time ts1.

After the times t4 and ts1, the transfer instructing signal DTA allowing data transfer from SRAM to DRAM is activated for a predetermined period from the time t5. The transfer circuit TG as shown in FIG. 63 is activated to transfer the signal potentials appearing on SRAM bit lines SBLa and *SBLa to DRAMIO lines DIOa and *DIOa in response to the transfer instructing signal DTA. DRAMIO lines DIOa and *DIOa have the potentials of "H" at Vcc level and "L" at Vss (ground) level by the large driving ability of the transfer circuit TGA. The signal potentials on DRAMIO lines DIOa and *DIOa are transferred onto the selected DRAM bit lines DBLa and *DBLa through the selected selection gate SGi. The transfer circuit TGA has a driving ability much larger than the latching ability of DRAM sense amplifier DSA, and therefore DRAM bit lines DRAM bit lines DBLa and *DBLa have the signal potentials corresponding to the data transferred from the selected SRAM memory cell.

DRAM clamping circuit CRD has its clamping operation inhibited at the time t5 in response to the signal DTA, and the transistors DQ70 and DQ80 are turned off. Consequently, no current flows from the clamping transistors DQ70 and DQ80 into a driving transistor in the transfer circuit TGA, reducing the current consumption.

At the time t6, the data transfer instructing signal DTA falls to "L", and at substantially the same timing, DRAM word line DWL has the potential fallen to "L". The falling of DRAM word line potential completes the data writing for a selected DRAM cell.

The clamping circuit CRD is activated again to raise the low level potential of DRAMIO line DIOa or *DI0a by the clamping operation. The active DRAM sense amplifier DSA maintains "H" and "L" levels of DRAM bit lines DBLa and *DBLa.

At time t7, the sense amplifier driving signals SAN and/SAP are deactivated, and the column selection signal CSLi rises, and DRAM returns to the precharge state.

In SRAM, SRAM word line SWL has the potential fallen to "L" at the time ts2 to isolate SRAM memory cell from SRAM bit line pair.

The SRAM bit lines SBLa and *SBLa have the "H" potential level determined by the clamping transistors SQ70 and SQ80.

As described above, inhibition of the clamping operation of DRAM clamping circuit CRD during data transfer from SRAM to DRAM prevents the generation of discharging current flow (penetrating current flow) through the driving transistor included in the transfer circuit TGA having a large driving ability, resulting in reduced current consumption.

(iii) Second data transfer arrangement with reduced current consumption at a high speed.

Figure 66:
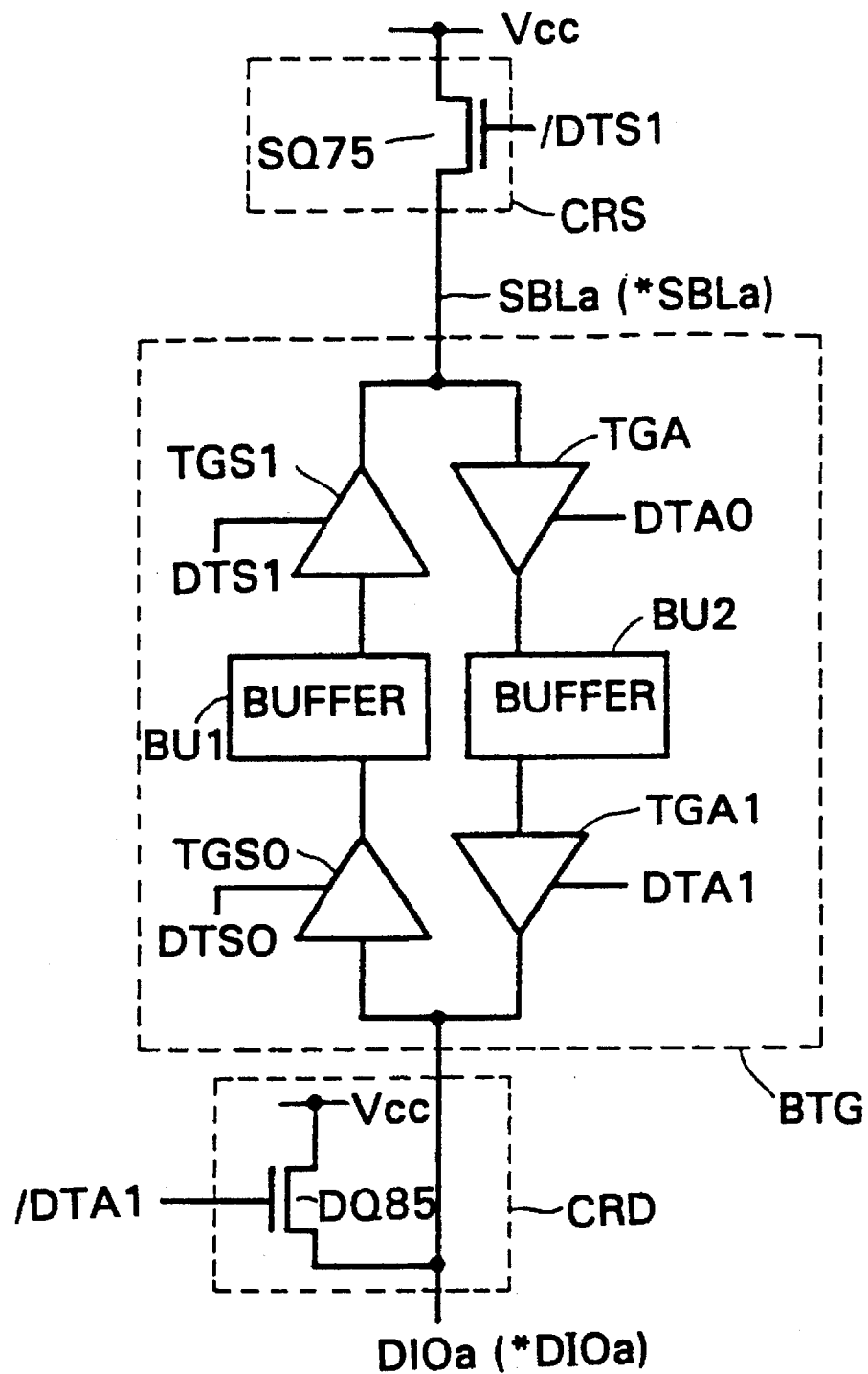

FIG. 66 shows another construction of the bi-directional transfer gate circuit BTG. By use of the construction of FIG. 66, data transfer from SRAM to DRAM can be carried out in parallel with the data transfer from DRAM to SRAM.

In FIG. 66, the bi-directional transfer gate BTG includes a drive circuit TGAO for transferring data on SRAM bit line SBLa (or *SBLa) in response to a data transfer allowing signal DTAO, a buffer BU2 for buffering an output of the drive circuit TGAO, and a drive circuit TGA1 for transferring are output of the buffer BU2 onto DRAMIO line DIOa (or *DIOa) in response to a data transfer allowing signal DTAI.

The data transfer allowing signals DTAO and DTAI are generated at different timings from each other.

The transfer gate BTG further includes a drive circuit TGSO responsive to a data transfer allowing signal DISO for transferring data on the DRAMIO line DIOa (or *DIOa), a buffer BU1 for buffering an output of the drive circuit TGSO, and a drive circuit TGSI for transferring an output of the buffer BU1 onto the SRAM bit line SBLa (or *SBLa) in response to a data transfer allowing signal DTSI. Transfer allowing signals DTAO and DTSO are generated at substantially the same timing and the transfer allowing signals DTAI and DTSI are generated at substantially the same timing, if data transfer from SRAM to DRAM as well as data transfer from DRAM to DRAM are carried out.

In the construction of FIG. 66, the transfer allowing signals DTAO and DISO are first generated. Prior to the generation of these signals DTAO and DISO, the name operation as shown in FIGS. 64 and 65 is carried out. When the transfer allowing signals DISO and DTAO are generated, data of a selected SRAM memory cell is transferred to the buffer Bu2 to be buffered therein. Data of a selected DRAM memory cell is transferred to the buffer BU1 to be buffered thereat. After the outputs of the buffers BU1 and BU2 are settled, the data transfer allowing signals DTAI and DISI are made active. Responsively, the output data of the buffer BU1 is transferred to SRAM bit line SBLa (or *SBLa) through the drive circuit TGSI.

The output data of the buffer BU2 is transferred to dram bit line DBLa (or *DBLa) through the drive circuit TGAI and DRAMIO line DIOa (or *DIOa). The transfer allowing signals DTAO and DTAI, and DISO and DISI can be considered as two shot pulsed signals DIA, and DIS respectively, in FIGS. 64 and 65. According to this construction, data transfer from SRAM to DRAM and data transfer from DRAM to SRAM can be carried out in parallel with each other, resulting in efficient data transfer.

The timings for generating the signals DTAO, DTAI, DISO and DISI may be determined such that data transfer from SRAM to DRAM and data transfer from DRAM to SRAM are carried out in a partially overlapped manner.

SRAM bit line SBLa (or *SBLa) is provided with a clamping transistor SQ75 and DRAMIO line DIOa (or *DIOa) is provided with a clamping transistor DQ85 in order to implement fast data transfer with less current consumption. The transistor SQ75 provides the SRAM clamping circuit CRS, and the clamping transistor DQ75 provides the DRAM clamping circuit CRD.

In this construction, the clamping circuit CRS has the clamping operation inhibited by a signal/DTSI of an inversion of the signal DTSI in order to prevent current from flowing into a driving transistor in the drive circuit TGSI from the clamping transistor SQ75 when SRAM bit line SBLa (or *SBLa) receives data transferred from DRAM. The transistor SQ75 receives the signal/DTSI at the gate. Likewisely, DRAM clamping circuit CRD has the clamping operation inhibited by the signal/DTAI of an inversion of the signal DTAI. The transistor DQ85 receives the signal/DTAI at the gate.

(iii) Third embodiment for first data with less current consumption.

Figure 67A:
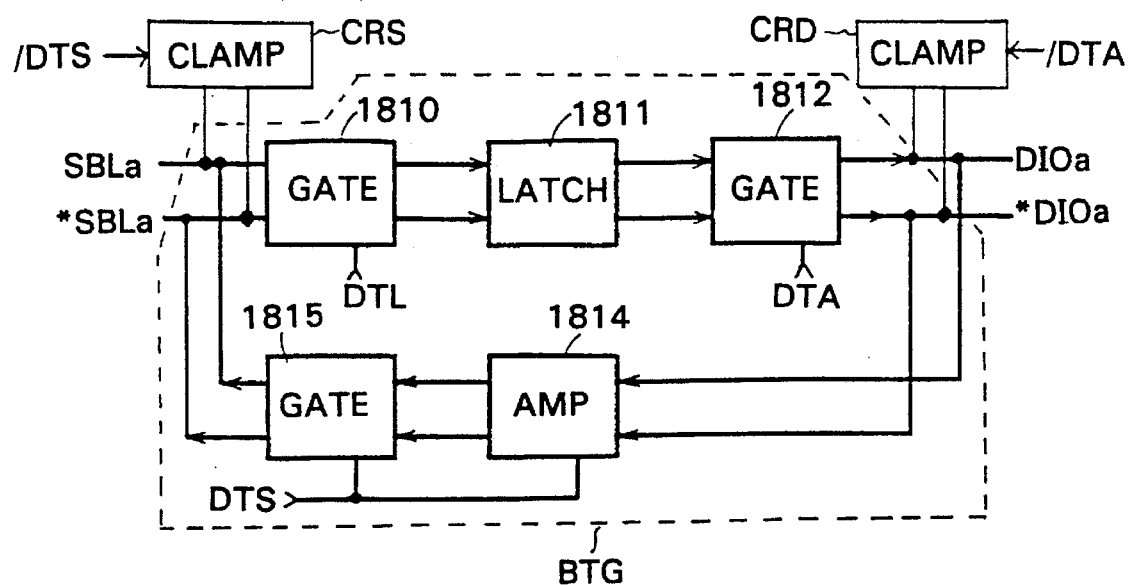
Figure 67B:
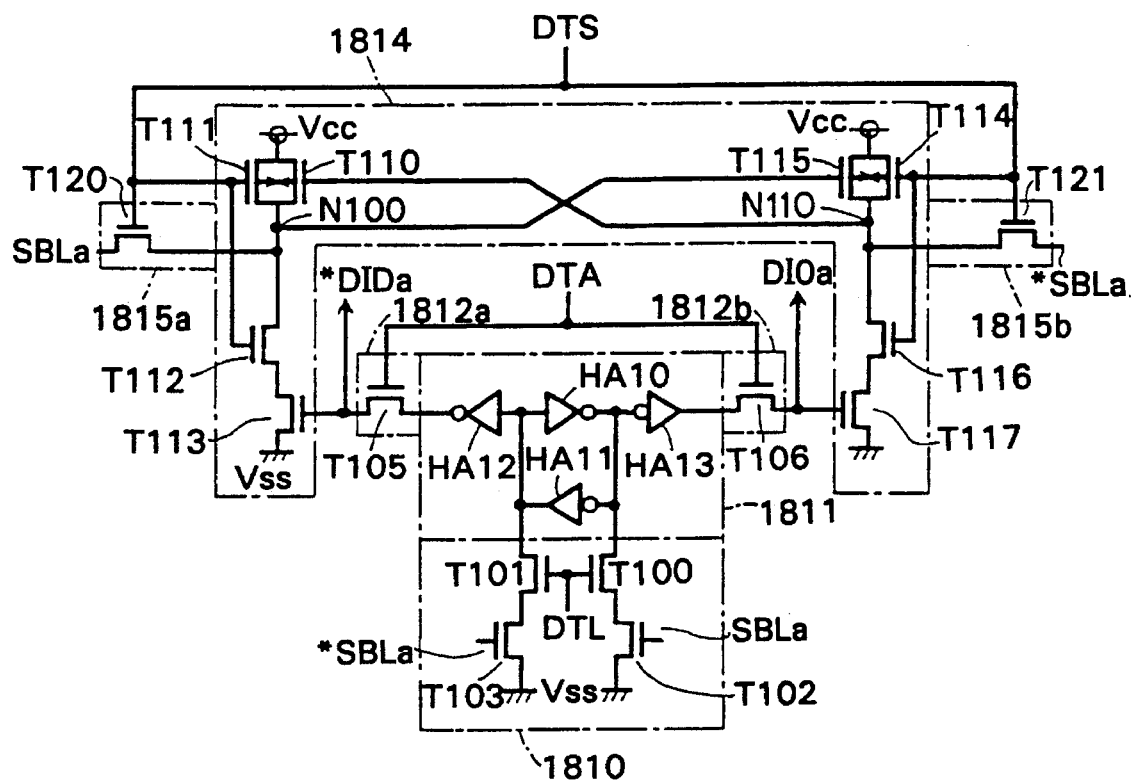

FIG. 67A shows a further another construction of the bi-directional data transfer gate, and FIG. 67B shows a detailed construction of the transfer gate of FIG. 67A. The construction of the bi-directional data transfer gate is the same as that shown in FIGS. 49 and 50. In Figs. 67A and 67B, like components have like reference numerals allotted thereto, and detailed explanation on the construction of FIGS. 67A and 67B is omitted.

The signal DTS corresponds to the signal φTDS, and the signal DTA corresponds to the signal φTLD, and the signal DTL corresponds to the signal φTSL.

Figure 68:
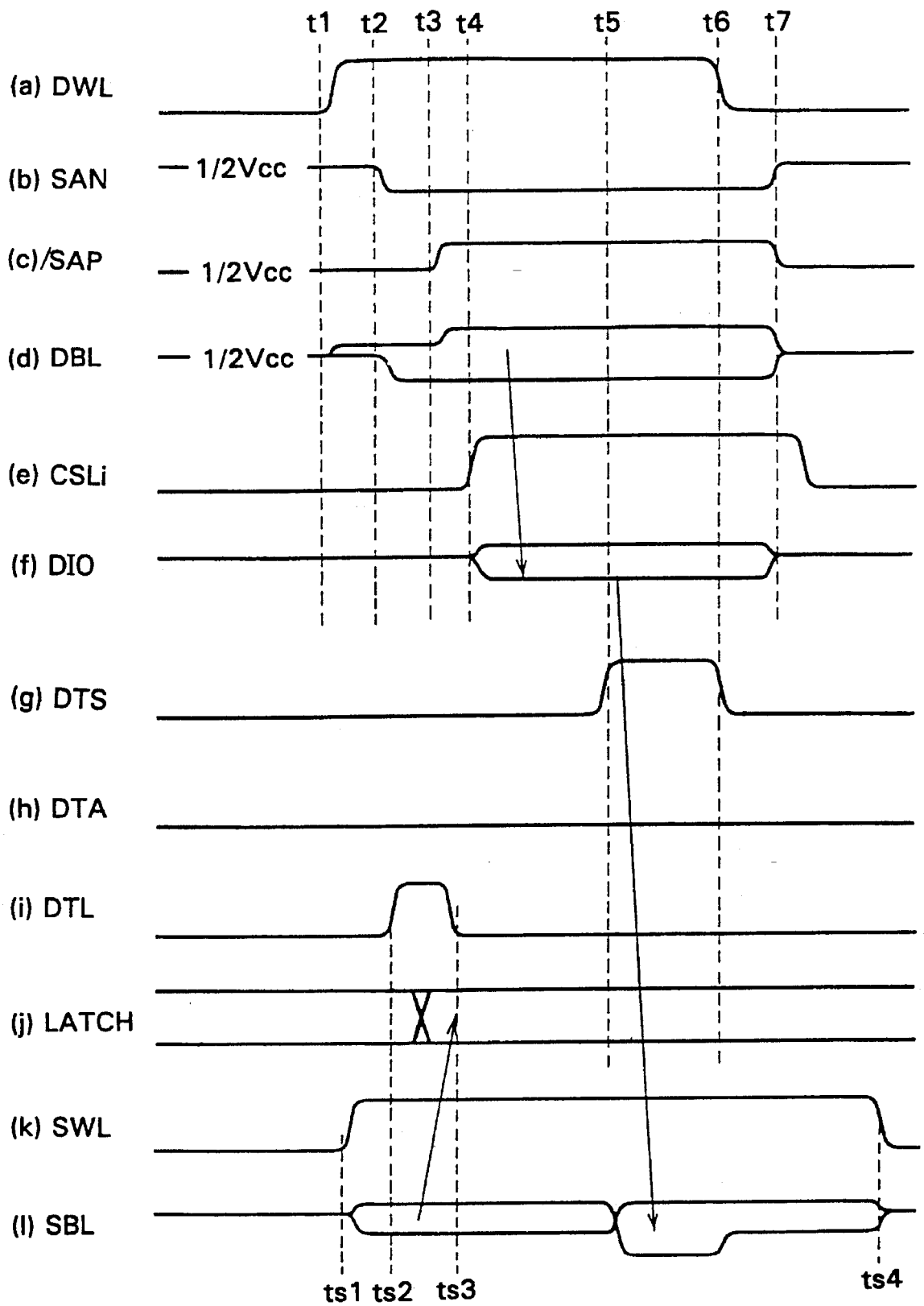
Figure 69:
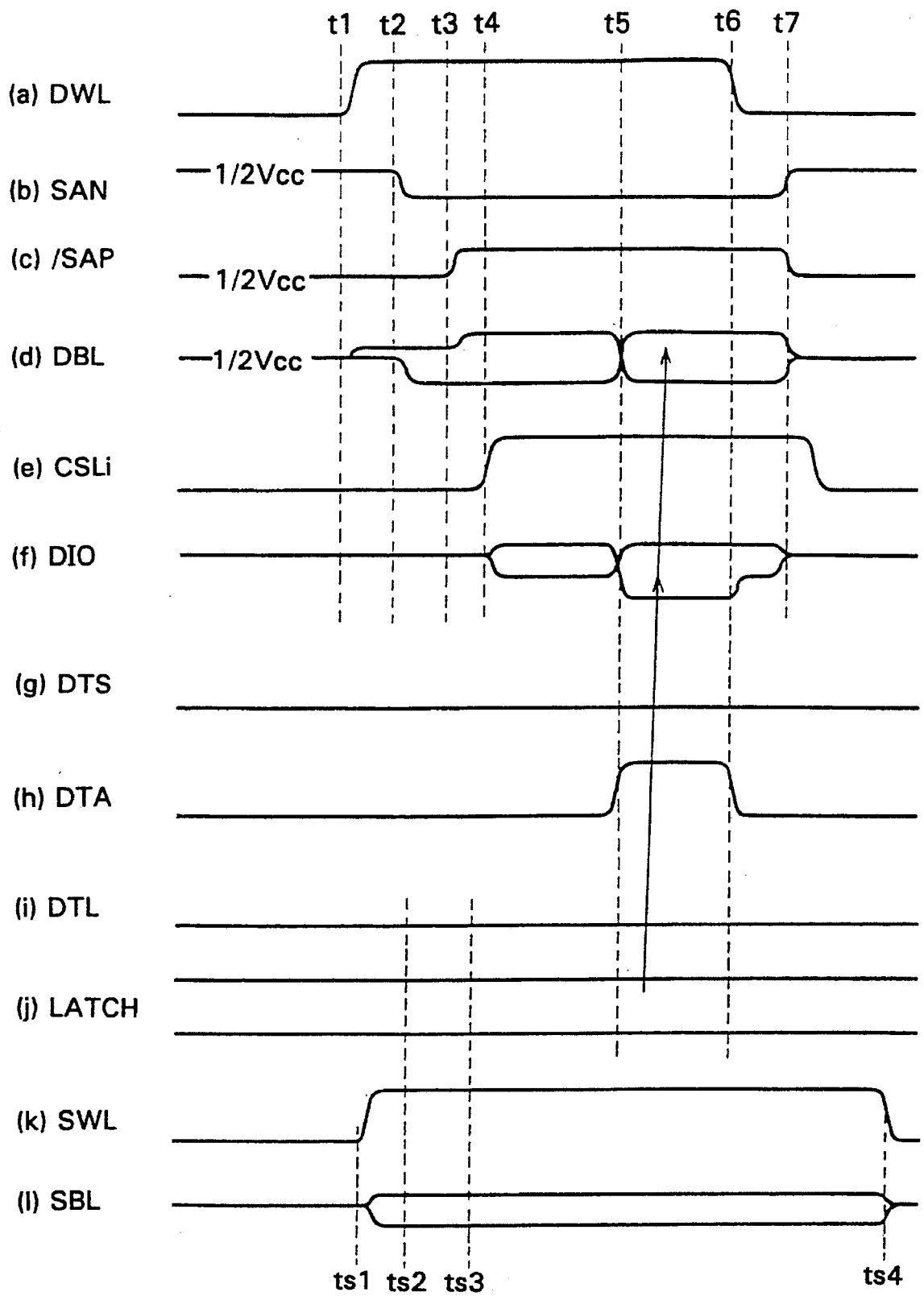

SRAM bit line pair SBL is provided with the SRAM clamping circuit CRS operable in response to the signal DTS, and DRAMIO line pair DIO is provided with the DRAM clamping circuit CRD operable in response to the signal DTA. Now, the operation of the gate of FIGS. 67A and 67B will be described with reference to FIGS. 68 and 69 showing the operating waveforms thereof.

First, data transfer from DRAM array to SRAM array will be described with reference to FIG. 68. In this data transfer operation, substantially the same operation as that shown in FIG. 55 except for the control of the clamping circuits CRD and CRS. Thus, only the control on the clamping circuits CRD and CRS will be described.

At time t5, the data transfer control signal DIS rises to "H" to inhibit the clamping operation of the clamping circuit CRS. The SRAM bit lines SBLa and *SBLa are released from the clamping by the clamping circuit CRS, and have the potentials corresponding to the potential levels supplied from the amplifier circuit 1814. Due to the deactivation of the clamping circuit CRS, a current flowing path from the clamping circuit CRS through the transistors T120, T112 and T113 or through the transistors T121, T116 and T117 of FIG. 67B is cut off.

At time t6, DRAM word line DWL has the potential fallen to "L", and the transfer control signal DIS falls to "L" substantially at the same timing. Responsively, SRAM clamping circuit CRS is activated to clamp the potentials of SRAM bit lines SBLa and *SBLa or to raise "L" level potential of SRAM bit line pair SBL. In this state, the transistors T120 and T121 of the gate 1815 are turned off in response to the falling of the signal DTS, and current from the clamping circuit CRS does not flow into the bi-directional gate circuit BTG to the ground.

After the time t6 at which the transfer control signal DIS falls to "L", DRAM array and SRAM array are isolated from each other, and SRAM array can be accessed externally so that data transferred from DRAM array can be read out at a high speed.

Now, the operation of data transfer from the latch circuit 1811 to DRAM array will be described with reference to FIG. 70. Data transfer operation per se is the same as that shown in FIG. 53. Thus, the operation of the clamping circuit CRD will be described.

At the time t5, the transfer control signal DTA rises to "H". In this data transfer cycle, the signals DTS and DTL both are maintained at "L". In response to the transfer control signal DTA, the gate circuit 1812 of FIG. 67A or the transistors T105 and T106 turn on to transfer the data latched in the latch circuit 1811 to DRAMIO line pair DIO. DRAM clamping circuit CRD is deactivated to have its clamping operation inhibited. DRAMIO lines DIOa and *DIOa have the potentials of "H" and "L" corresponding to the data latched in the latch circuit 1811.

Because of the transfer control signal DTA at "H", the clamping transistors DQ70 and DQ80 (see FIG. 62) are turned off, to cut off the clamping current flowing path through DRAMIO line DI0a, the transistor T106 and the inverter circuit HA13 or through DRAMIO line *DIOa, the transistor T105 and the inverter circuit HA12.

At the time t6, DRAM word line DWL has the potential fallen, and the transfer control signal DTA falls to "L" substantially at the same timing. DRAM clamping circuit CRD is activated again to raise "L" level potential of DRAMIO line pair DIO.

At the time t7, the memory cycle of DRAM is completed, and successively the column selection signal CSLi falls to "L". DRAMIO line pair DIO has the potential levels determined by the DRAM clamping circuit CRD.

In this data transfer cycle, the transfer control signals DIS and DIL both are maintained at "L". DRAM array is isolated from SRAM array. DRAM address and SRAM address can be designated independently of each other. Thus, in the data transfer to DRAM array from the latch circuit 1811 SRAM can be accessed externally to have an SRAM memory selected independently of the data transfer operation. More specifically, in SRAM, a word line SWL is selected according to an external access at the time t1. SRAM bit line pair SBL has the potential levels changed from the "H" potential levels clamped by SRAM clamping to the levels corresponding to data of a selected SRAM cell, and an access to the selected SRAM cell is carried out.

At the time ts4, SRAM word line SWL has the potential fallen to "L", and SRAM bit lines SBLa and *SBLa have the potentials clamped by SRAM clamping circuit CRS.

As described above, inhibition of clamping operation of DRAM clamping circuit CRD in the data transfer to DRAM array to the latch circuit 1811 prevents the clamping current of the clamping circuit CRD from flowing into a drive transistor (discharging transistors of the inverter circuits HA12 and HA13 of FIG. 67B) to reduce current consumption in data transfer operation.

(iv) Modification of clamping circuit

Figure 70:
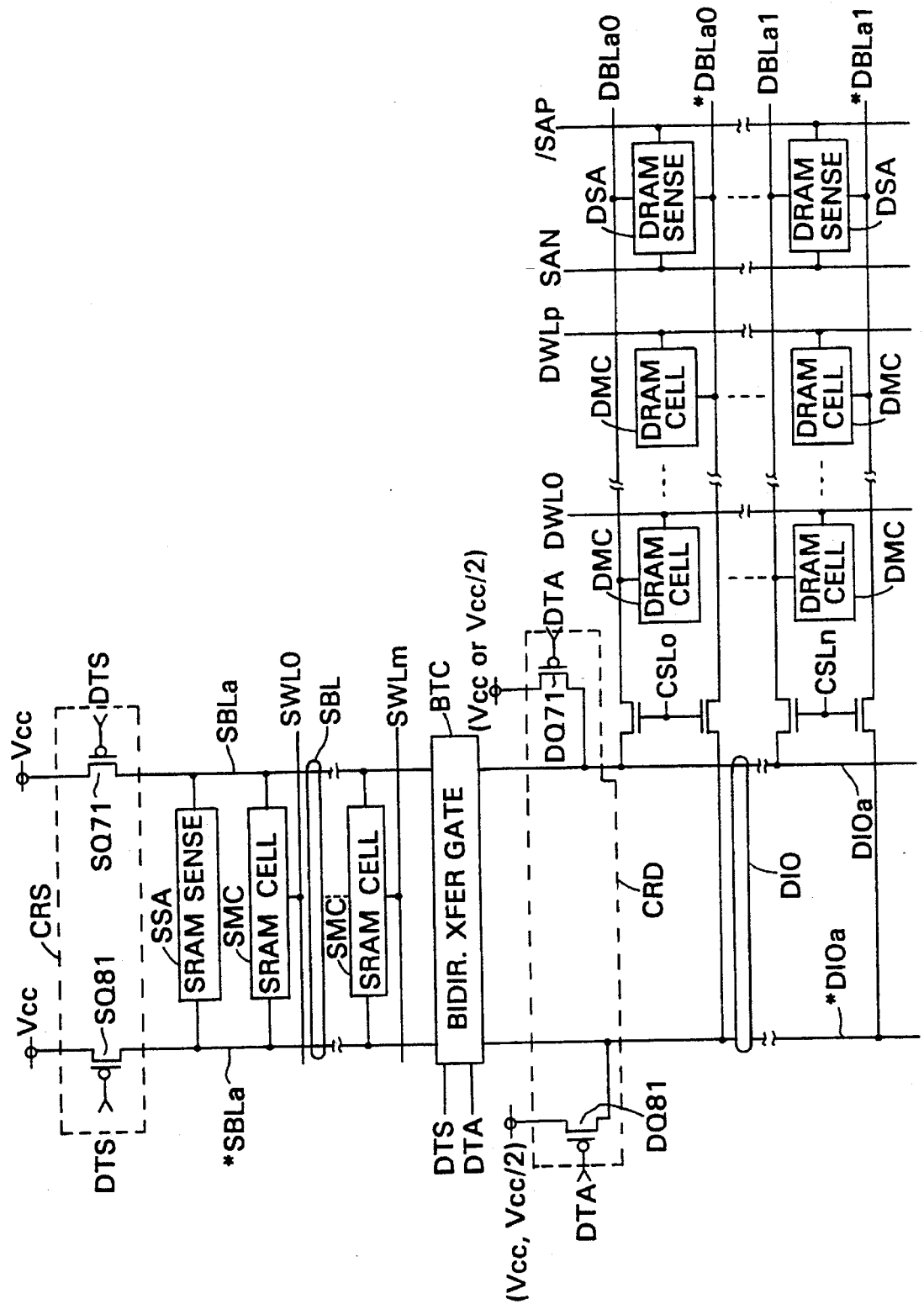

FIG. 70 shows a modification of the clamping circuit. In FIG. 70, SRAM clamping circuit CRS includes p channel MOS transistor SQ71 having a gate receiving the transfer control signal DIS for clamping the potential of SRAM bit line SBLa, and p channel MOS transistor SQ81 having a gate receiving the signal DTS for clamping the potential of SRAM bit line *SBLa.

DRAM clamping circuit CRD includes p channel MOS transistor DQ71 having a gate receiving the transfer control signal DTA for clamping the potential of DRAMIO line DIOa, and p channel MOS transistor DQ81 having a gate receiving the signal DTA for clamping the potential of DRAM IO line *DIOa. The transistors DQ71 and DQ81 may have their one conduction terminals coupled to receive Vcc potential level or Vcc/2 potential level.

The operation of the clamping circuits of FIG. 70 is the same as that of the clamping circuit of FIG. 62. The clamping circuits of p channel MOS transistors provides the same effect as that of the clamping circuits of n channel MOS transistors.

[Address Allottance]

In the CDRAM, DRAM address and SRAM address are set independently of each other. DRAM column decoder selects 16 column select lines in DRAM array, while SRAM column decoder selects 1 column out of 16 columns. SRAM column decoder eventually selects a DRAM column in array access. Address allottance is described with reference to FIGS. 61 to 63.

Figure 71:
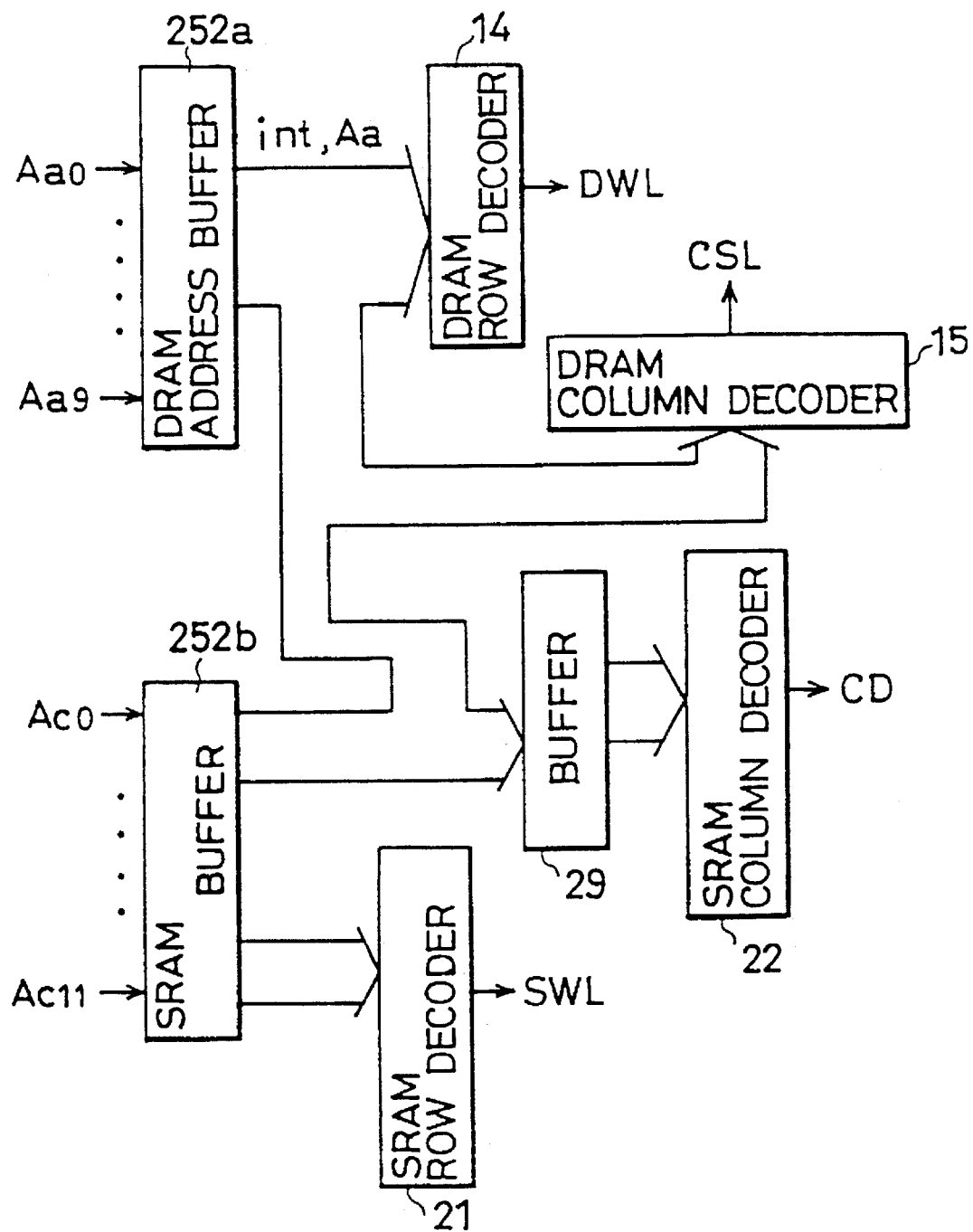
FIGS. 71 through 75 represent peripheral circuitry of the CDRAM.

FIG. 71 shows one example of connection of addresses to DRAM and SRAM. In the structure shown in FIG. 71, access to the DRAM array is carried out through bi-directional transfer gate circuit or SRAM bit line pairs SBL of the SRAM array. In this structure, column selection signal CD from SRAM column decoder 22 is commonly used as a column selecting signal for the DRAM array and the column selecting signal for the SRAM array.

In FIG. 71, DRAM address buffer 252a receives external DRAM addresses Aa0 to Aa9 and generates internal address int.Aa. DRAM row decoder 14 decodes internal row address from internal address int.Aa, and generates a word line driving signal DWL for selecting a word line from DRAM array. DRAM column decoder 15 receives a portion of internal column address from DRAM address buffer 252a, and generates a signal CSL for selecting a column selecting line from DRAM array. The remaining internal column address from DRAM address buffer 252a is applied to a buffer 29. Buffer 29 receives internal column address from SRAM buffer 252b and transmits the same to SRAM column decoder 22. When DRAM array is accessed, internal column address is not generated from SRAM buffer 252b, as will be described in detail later. At that time, the buffer 29 receives internal column address from DRAM address buffer 252a and transmits the same to SRAM column decoder 22.

SRAM row decoder 21 receives internal row address from SRAM buffer 252b, and generates a SRAM word line driving signal SWL for selecting one row from SRAM array. In accordance with the structure shown in FIG. 71, in the data input/output structure of FIG. 33, the column selecting signals DYi and DYj are equivalent to SRAM column selecting signals SYLi and SYLj.

Figure 72:
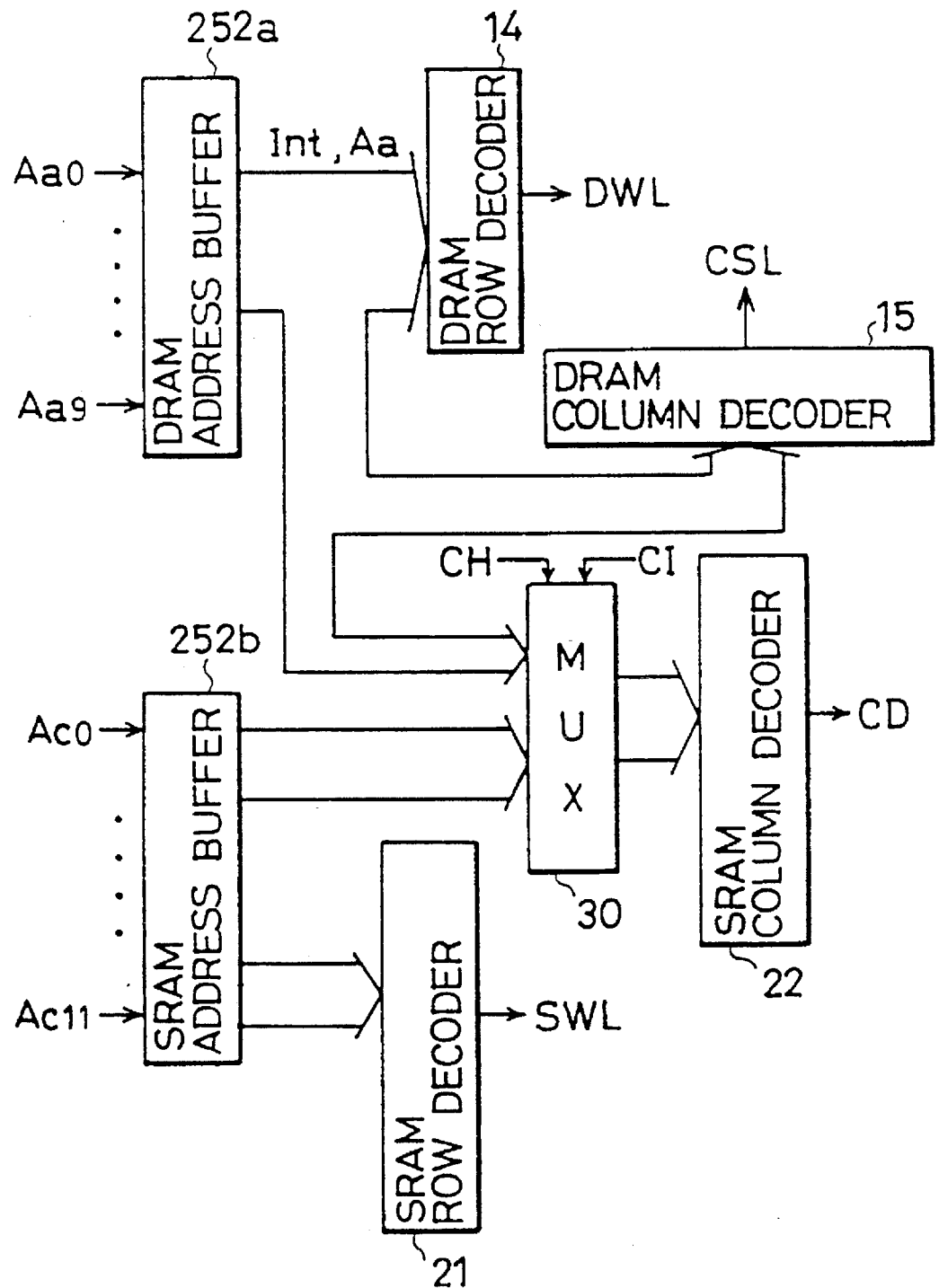

FIG. 72 shows another example of a structure of address input/output portion. In the structure shown in FIG. 72, instead of the buffer 29, a multiplexer 30 responsive to a cache hit designating signal CH and to a DRAM access designating signal CI for passing either an internal column address from DRAM address buffer 252a or an internal column address from SRAM address buffer 252b is provided. The cache signal CH and the DRAM array access designating signal CI will be described in detail later. Only an outline will be described. When a cache hit designating signal CH is generated, access to SRAM array is permitted, and writing/reading of data by accessing to DRAM is inhibited. When DRAM array access designating signal (cache access inhibiting signal) CI is generated, writing/reading of data by access to memory cells in DRAM array is permitted.

Therefore, when the signal CH is generated, multiplexer 30 selects the internal column address from SRAM address buffer 252b and transmits the same to SRAM column decoder 22. When DRAM array access designating signal CI is generated, multiplexer 30 selects the internal column address from DRAM address buffer 252a to transmit the same to SRAM column decoder 22. In the structure shown in FIG. 72 also, SRAM column decoder 22 is used for both column selections on DRAM array and on SRAM array.

The structure for allotting addresses shown in FIGS. 71 and 72 are mere examples. Structures for independently decoding internal column address for DRAM array and decoding internal column address for SRAM array may be employed.

Figure 73:
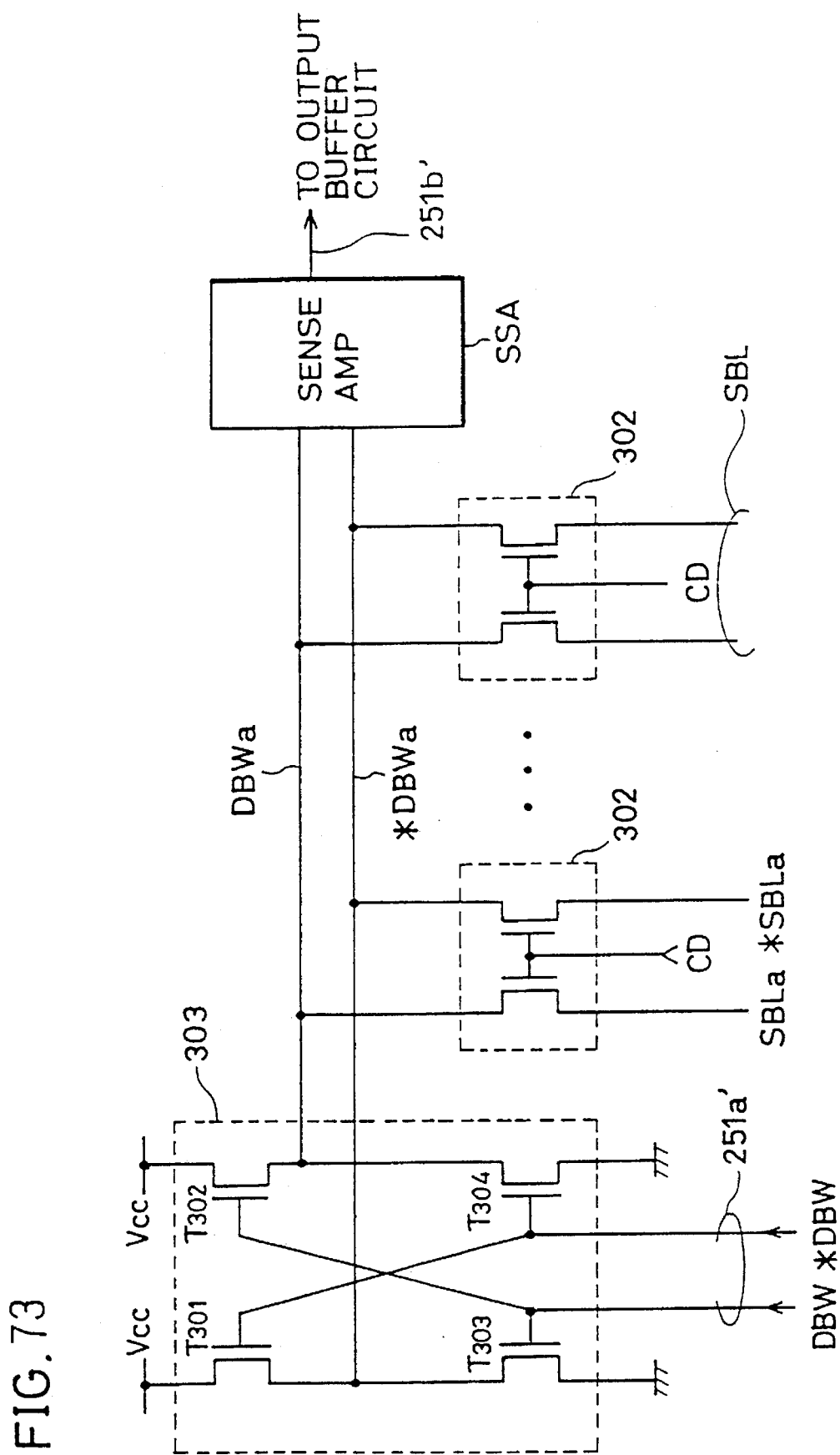

FIG. 73 shows a further example of the connection between SRAM array and internal data transmitting line pair. In the structure shown in FIG. 33, a SRAM sense amplifier SSA is provided for each SRAM bit line pair SBL. In the structure shown in FIG. 73, one SRAM sense amplifier SSA is provided for a plurality of SRAM bit line pairs SBL. A selecting gate circuit 302 is provided for each SRAM bit line pair SBLa, *SBLa. A column selecting signal CD is supplied to selecting gate circuit 302. The column selecting signal CD is generated from SRAM column decoder shown in FIGS. 71 and 72. Internal data line pair includes an internal write data line 251a' for transmitting write data, and a read data transmitting line 251b' for transmitting read data to an output buffer circuit. The internal write data transmitting line 251a' includes a complementary data line pair DBW, *DBW. Complementary data from an input buffer circuit are transmitted to internal data lines DBW and *DBW. The internal write data line 251a' is connected to a write circuit 303.

The write circuit 303 includes cross coupled n channel MOS transistors T301, T302, T303 and T304. Gates of transistors T302 and T303 are connected to the internal data line DBW. Gates of transistors T301 and T304 are connected to internal data line *DBW. Complementary write data from write circuit 303 are transmitted to respective transmitting gate circuits 302 through data lines DBWa, *DBWa. Transistors T301 and T302 transmit a supply potential Vcc when they are on. Transistors T303 and T304 transmit ground potential Vss when they are on.

For example, let us assume that data "H" are transmitted to internal data line DBW. At this time, "L" data are transmitted to internal data line *DBW. At this time, the transistors T302 and T303 are turned on. Consequently, "H" data are transmitted to internal data line DBWa through transistor T302 from writing circuit 303, and "L" data are transmitted to the other internal data line *DBWa through transistor T303.

In data reading, "L" data are transmitted to both of the internal write data lines DBW and *DBW from the input buffer circuit, and accordingly, an output from the write circuit 303 is set to a high impedance state. At this time, sense amplifier SSA is activated, and data transmitted to internal data lines DBWa and *DBWa through a selected selecting gate circuit 302 are amplified by the sense amplifier SSA and transmitted to an output buffer circuit through internal read data transmitting line 251b'.

As shown in FIG. 73, by separately providing write data transmitting line 251a' and read data transmitting line 251b' as the internal data line 251, design of input/output circuit layout is made easier than a structure in which writing/reading of data are carried out through a common internal data bus.

[Refreshing Operation]

The DRAM array includes dynamic memory cells as components. Therefore, data stored therein must be refreshed periodically, or in a predetermined time period. Refreshing operation of the semiconductor memory device containing a cache will be described in the following.

Returning to FIG. 32, an external refresh designating signal REF# is supplied. Automatic refreshing (Auto-refreshing) is carried out in the semiconductor memory device when the external refresh designating signal REF# is set to an active state of "L" at a rise of an internal clock K.

Referring to FIG. 32, circuit structure for refreshing includes an auto refresh mode detecting circuit 291 responsive to an internal refresh designating signal REF from a control clock buffer 250 detecting designation of auto-refresh; and a refresh control circuit 292 responsive to a refresh request from auto refresh mode detecting circuit 291 for generating various control signals and applying these signals to a counter 293 and to a multiplexer circuit 258. Counter circuit 293 applies a count value stored therein to multiplexer circuit 258 as a refresh row address indicating a row to be refreshed, in response to refresh designating signal from refresh control circuit 292.

Multiplexer circuit 258 selects the refresh row address from counter circuit 293 and applies the same to DRAM row decoder 102, in response to a switch control signal MUX from refresh control circuit 292. The internal refresh designating signal REF is also applied to a DRAM array driving circuit 260. DRAM array driving circuit 260 is rendered active when internal refresh designating signal REF is applied and carries out operations related to row selection in DRAM array 101.

Refresh control circuit 292 increments by one the count value in counter circuit 293 at the completion of refreshing, every time refresh designating signal REF is applied. Refresh control circuit 292 sets switch control signal MUX to inactive state at the completion of refreshing, and in response, multiplexer circuit 258 selects an internal address int-Aa for internal DRAM from address buffer circuit 252 and transmits the same to DRAM row decoder 102.

Figure 74:
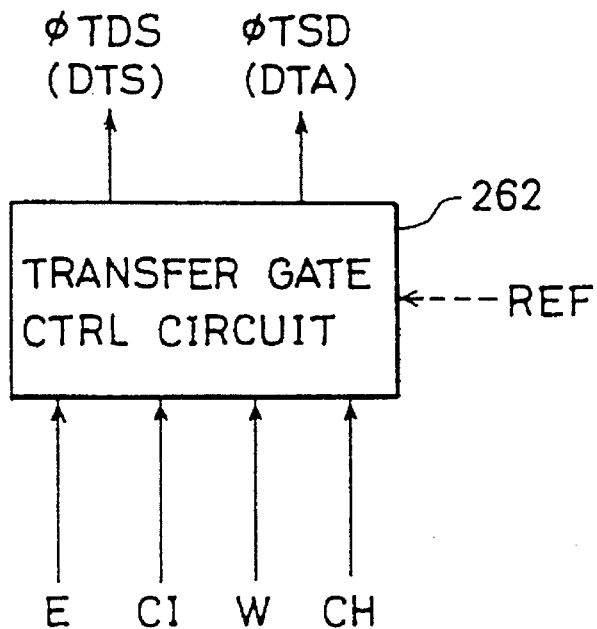

FIG. 74 functionally shows a transfer gate controlling circuit 262. The transfer gate controlling circuit 262 generates the signals φTDS and φTSD for controlling transfer operation of the bi-directional transfer gate circuit 210 (3, BTG), in response to internal control signals E, CI, W and CH. When cache hit signal CH is active, the transfer gate controlling circuit 62 does not generate the transfer control signals φTDS and φTSD. However, if array access designation (cache inhibition) signal CI is set to an active state, it successively generates control signals φTDS and φTSD in accordance with the state of the write enable signal W at that time.

Transfer gate controlling circuit 262 also receives an internal refresh designating signal REF. The transfer gate controlling circuit 262 may be adapted to be set to the inactive state when internal refresh designating signal REF is applied. However, since a refresh designating signal REF# is applied externally, it is not necessary for transfer gate controlling circuit 262 to receive especially refresh designating signal REF, when generation of the array access designating signal CI is prevented by an external specification. When refreshing is being carried out in the DRAM, SRAM array must be surely separated electrically from the DRAM array. If a structure is provided in which the transfer gate controlling circuit 262 is disabled in response to internal refresh designating signal REF, the SRAM array can be surely separated electrically from the DRAM array during refreshing operation, and external access to SRAM array is made possible.

Transfer gate controlling circuit 262 may have a structure in which transfer gate control circuit 262 is disabled when either cache hit signal CH or refresh signal REF is made active. More preferably, a gate circuit which sets the transfer gate control circuit 262 to a disabled state when either cache hit signal CH or refresh designating signal RF is active should be provided. Except that time, transfer control signals $\phi$TDS and $\phi$TSD are generated at predetermined timings in accordance with the control signals CI and W.

Figure 75:
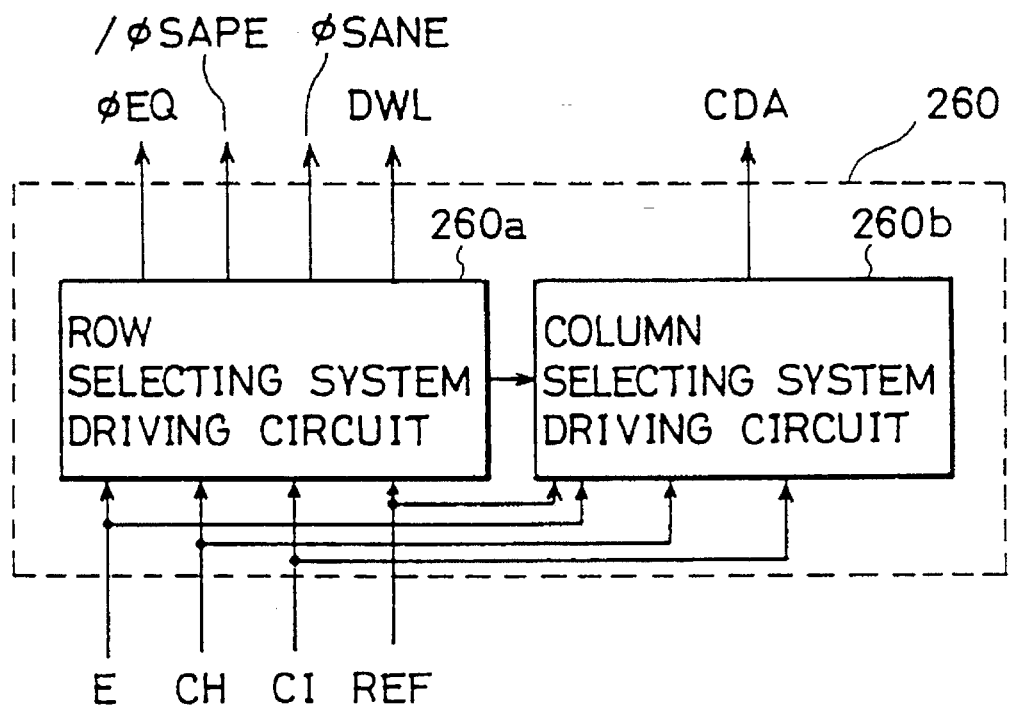

FIG. 75 shows functional structure of DRAM array driving circuit 260 shown in FIG. 32. DRAM array driving circuit 260 includes a row selecting circuitry driving circuit 260a for driving circuits related to row selection of DRAM array, and a column selecting circuitry driving circuit 260b for driving circuits related to column selection in DRAM array 1. Row selection circuitry driving circuit 260b generates various control signals $\phi$EQ./$\phi$SAPE, $\phi$SANE and DWL at predetermined timings, respectively, in response to internal control signals E, CH, CI and REF. Column selecting circuitry driving circuit 260b generates a signal CDA (which corresponds to internal control signal int. *CAS) for driving DRAM column decoder 15 at a predetermined timing in response to control signals E, CH, CI and REF.

Column selecting circuitry driving circuit 260b generates a column decoder activating signal CDA at a predetermined timing when refresh designating signal REF is inactive and the row selecting circuitry driving circuit 260a is made active. When refresh designating signal REF is made active, column selecting circuitry driving circuit 260b is disabled. Consequently, column selecting operation in the DRAM is prohibited.

By this structure, when refresh designating signal REF is made active, refreshing operation in the DRAM array can be carried out independent from the operation of the SRAM array.

Auto refresh mode detecting circuit 291, refresh control circuit 292 and counter circuit 293 shown in FIG. 32 operate in response to refresh designating signal REF, and their operations are set independent from the operation of a command register 270. Therefore, refreshing of DRAM array 101 can be carried out in parallel to command mode setting of the command register 270. More specifically, command register 270 simply generates a command data CM and applies the data to a data input/output control circuit 272 and to an input/output buffer+output register block 274. Data maintained therein has no influence to memory cell selecting operation in the DRAM array 101.

Setting of data in command register 270 is completed in 1 cycle of external clock signal K, as will be described in detail later with reference to a timing diagram. Refreshing operation in DRAM array needs n cycles. This is because the speed of operation of the DRAM 100 is lower than that of the clock K. Therefore, in this case, in short, 1 clock cycle is saved in effect. However, if the period of external clock K is made slower in accordance with the operation mode and the period is similar to 1 memory cycle of the DRAM 100, setting of data to the command register 270 can be carried out in parallel to the refreshing operation of the DRAM array 101. The change of the period of the external clock K enables reduction in current consumption corresponding to lowering of the speed of operation of CDRAM. More specifically, when the DRAM is in the standby state or when low power consumption is desired more rather than higher speed of operation of the memory device, the speed of operation of the semiconductor memory device is lowered and the power consumption is reduced by elongating the period of the clock. The period of the external clock K may be made longer only when access to the DRAM only is being carried out.

By the above described structure, a CDRAM having the following characteristics can be provided.

(1) The CDRAM in accordance with the present invention has a DRAM memory array serving as a main memory and an SRAM array serving as a cache memory integrated on one chip, and these memories are coupled to each other by an internal bus used only for data transfer, which is different from an internal common data bus. Consequently, block transfer between the DRAM array and the SRAM array (cache) can be completed in 1 clock cycle. In the following description, the term "array" refers to the DRAM array. Compared with a conventional cache memory system employing a standard DRAM and a standard SRAM, system performance can be significantly improved.

(2) The DRAM memory array and the SRAM array can be accessed by separate and independent addresses. Therefore, various mapping methods, for example direct mapping method, set associative method and full associative method can be implemented.

(3) The CDRAM operates in synchronization with an external clock K. Compared with a method in which internal clock signals are generated by using an address change detecting circuit, delay of a cycle time derived from address skew or the like can be prevented, realizing accurate control.

(4) Externally applied signals (or data) such as array addresses (addresses for the DRAM) Aa0 to Aa9, cache addresses (addresses for SRAM) Ac0 to Ac11, data input/output D0 to D3 or DQ0 to DQ3, a write enable signal W#, a cache hit signal CH#, a chip select signal E#, a refresh signal REF#, a cache inhibition signal CI# and a command register signal CR# are all taken at a rising edge of the external clock K.

(5) Since array addresses are taken in accordance with a multiplexing method, the number of pins for array addresses can be reduced, increasing packaging density of the CDRAM.

(6) Addresses of the array and of the cache are independent from each other. At a time of a cache hit, access to the cache only is carried out, enabling high speed cache hit accessing.

(7) Data can be read at an arbitrary timing by an output enable signal G# regardless of the timing of the external clock K, so that asynchronous bus control can be done in the system.

(8) By using the command register 270, output specification (transparent, latch, register) and I/O structure (input/output pin separation, masked write) can be arbitrarily designated by a user. When a registered output method is used, output data of an address designated in the previous cycle appears at a rising edge of the external clock K. Such data output mode is suitable for pipeline application.

In a latched output method, output data of an address designated in the previous cycle is continuously output at the timing at which invalid data were to be output otherwise. Therefore, invalid data is not output at all, and valid output data only is provided. By this latched output mode, sufficient period of time for the CPU to take output data can be provided.

(9) Data writing operation is started at a rising edge of the external clock K. However, writing is automatically terminated by an internal timer or the like. Therefore, it is not necessary to set completion of writing operation by, for example, an external write enable signal W#, and therefore setting of timings in the system is facilitated.

(10) A refresh designating signal REF# for designating auto-refreshing can be externally applied. Therefore, the DRAM array can be automatically refreshed easily at a desired timing.

(11) As described above, the CDRAM of the present invention can be housed in 300 mil, TSOP package, type II having 44 pins. The TSOP package type II is a very thin rectangular package, which realizes a system having high packaging density.

(12) SRAM array has a multiplicate word line arrangement in which a plurality of word lines are provided for one row of SRAM memory cells. Thus, SRAM array with high density and desired physical dimensions corresponding to the shape of DRAM array is easily obtained to provide efficient layout of SRAM array and DRAM array on a chip, resulting in CDRAM with high density and high integration.

(13) Clamping circuits are provided for SRAM bit line pair and DRAMIO line pair.

In data transfer, the clamping circuit at a data receiving side has the clamping operation inhibited. This arhitecture provide fast data transfer between SRAM and DRAM with less current consumption.

FIG. 76 shows, in a table, operation modes of the CDRAM of the present invention and states of control signals for designating respective operation modes. An operation mode of CDRAM is set by a combination of the states of external control signals E#, CH#, CI#, CR#, W# and REF#. Referring to FIG. 76, "H" represents a high level signal potential, "L" represents a low level signal potential, and "X" represents an arbitrary state (don't care D.C). As shown in FIG. 76, operation modes of the CDRAM includes a standby mode in which the CDRAM is set in a standby state; an array refresh for automatically refreshing the DRAM array, data transfer between a CPU (Central Processing Unit) and a cache (SRAM); data transfer between CPU and array; data block transfer between a cache and an array; and setting of special mode in the command register. Timings and combinations of the states of the signals for setting respective operation modes will be described in detail later with reference to a diagram of signal waveforms. In FIG. 76, write enable signal W# is indicated as "H/L" at data transfer between the CPU and the command register. It means that write enable signal W# is set to "H" or "L" in this operation mode, and either "H" or "L" state is used for designating a certain special mode.

[Command Register]

Various operation modes can be set internally by the command register.

Figure 78:
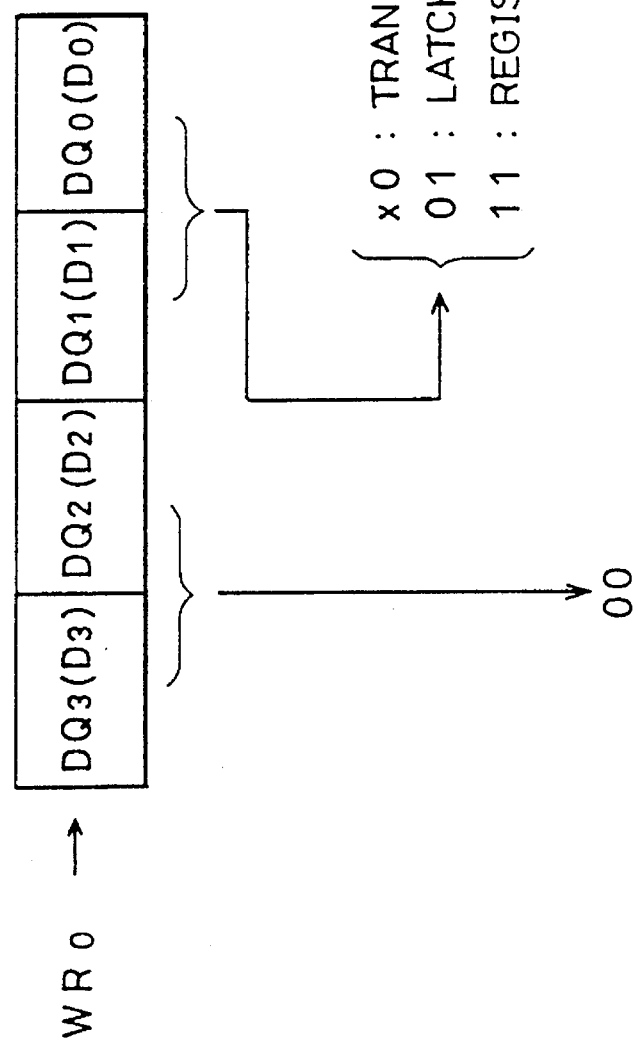

FIGS. 77 and 78 shows the contents in the command register 270 shown in FIG. 32 and a method of selecting the contents. Command register 270 includes 8 registers RR0–RR3 and WR0–WR3. Combination of write enable signal W# and 2 bits of command addresses AR0 and AR1 is used for selecting a register. By setting the external write enable signal W# to "H" at a rising edge of external clock K, one of the registers RR0–RR3 is selected. Register RR0 is selected by setting command addresses At0 and Ar1 to "0". Register RR1 is selected by setting command address bit At0 to "1" and command address bit Ar1 to "0". Selection of register RR0 means setting of a masked write mode (this masked write mode is also a default). Selection of the register RR1 means setting of D/Q separation mode.

When write enable signal W# is set to "L" at a rising edge of external clock K and setting command addresses At0 and Ar1 both to "0", then register WR0 is selected. As shown in FIG. 37 or 78 this register WR0 sets the output mode to transparent, latch or register mode, dependent on the combination of data at data input terminals DQ0 (D0) to DQ3 (D3) at that time. Details of the respective output modes has been described previously. When register WR0 is selected, input data D2 and D3 (DQ2 and DQ3) are both set to "0". When input data D0 is set to "0" and input data D1 is set to an arbitrary value in this state, transparent output mode is set. When input data D0 is set to "1" and input data D1 is set to "0", latched output mode is selected. When input data D0 and D1 are both set to "1", registered output mode is selected. Other registers are used for arbitrary extended functions.

[Connection between CPU & DRAM]

CDR3LM is employed with CPU in a data processing system. The CDRAM provides various mapping scheme. System structure such as bus connection is varied depending on the mapping scheme of CDRAM. Specific system implementation using CDRAM is described with reference FIGS. 79 and 80.

Figure 79:
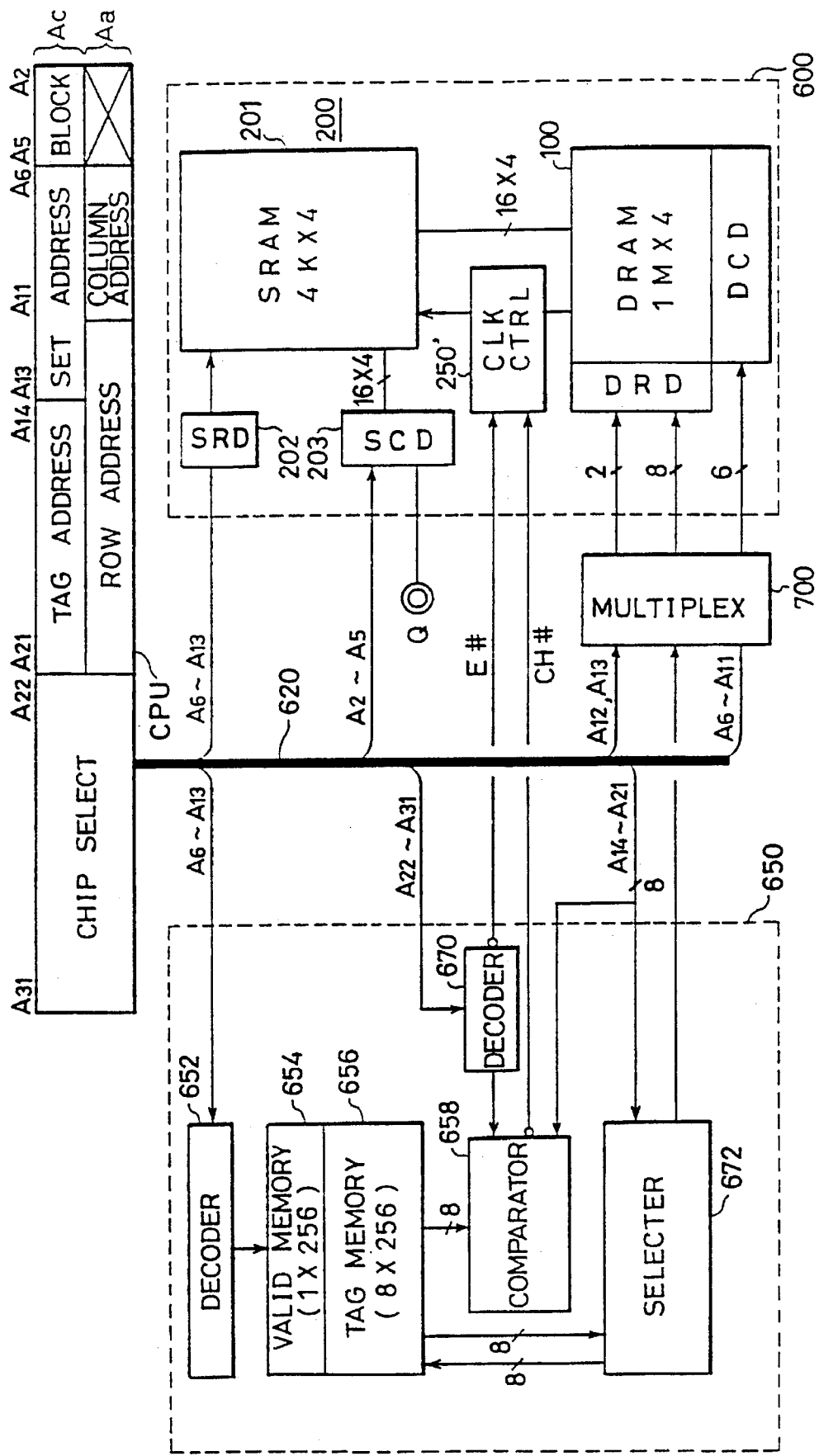

FIG. 79 is a block diagram showing a structure of a system when a cache system is formed by a direct mapping method using the CDRAM 600 in accordance with the present invention. Referring to FIG. 79, the cache system comprises, in addition to CDRAM 600, a controller 650 for controlling access to the CDRAM 600, and a CPU for carrying desired data processing by inputting/outputting data to and from the CDRAM 600. FIG. 79 shows only an address structure output from the CPU when cache access is required. The CPU is assumed to have 32 bits. The cache system further includes an address multiplex circuit 700 for multiplexing and applying row and column addresses to the CDRAM 600. Portions only related to cache access to the CDRAM 600 are shown as representatives.

Controller 650 includes a decoder 652 for decoding set addresses A6 to A13 from the CPU, valid bit memory 654 indicating which set is valid in response to an output from decoder 652, and a tag memory 656 for storing tag addresses of data stored in SRAM 200. SRAM 200 has a structure of 4K×4 bits, and there are 256 tags. Therefore, tag memory 656 includes 8 bits×256 structure. Valid bit memory 654 has a structure of 1 bit×256 for indicating which of the 256 sets is valid. Decoder 652 decodes set addresses A6 to A13 and makes valid one of the valid bit memory 654.

Controller 650 further includes a decoder 670 receiving addresses A22 to A31 from the CPU as a chip selecting signal for determining whether or not a corresponding CDRAM 600 is designated, a comparator 658 which is activated in response to an output from decoder 670, comparing a tag address from tag memory 656 with tag addresses A14 to A21 from CPU for determining a cache hit or miss, and a selector 672 in response to a cache hit/miss for selecting either the tag address from tag memory 656 or tag addresses A14 to A21 from CPU for applying thus selected one to the multiplex circuit 700. At a time of a cache miss, selector 672 stores tag address applied from the CPU to a corresponding position of the tag memory 656.

The operation will be briefly described in the following. When access to the CDRAM 600 is requested by the CPU, addresses A2 to A31 are generated on the data bus 620. Addresses A20 to A31 out of 30 bits of addresses on common data bus 620 are used as a chip select signal and applied to decoder 670 in controller 650. Decoder 670 decodes addresses A22 to A31 as the chip select signal, and determines whether or not an access to the corresponding CDRAM is requested. If it is determined that an access to the CDRAM 600 is requested, chip select signal E# is generated from decoder 670 and applied to CDRAM 600. A comparator 658 is activated by the chip select signal from decoder 670.

Decoder 652 included in controller 650 takes and decodes addresses A6 to A13 out of addresses transmitted from CPU to address bus 620 as the set address. Decoder 652, which has decoded 8 bits of the set address, sets corresponding bits of the valid bit memory 654 for selecting one set out of 256 sets. An address of 8 bits indicating a tag corresponding to the valid bit of the valid bit memory 654 is read from tag memory 656 and applied to comparator 658. Comparator 658 compares tag address from tag memory 656 with the tag address of A14 to A21 output from CPU. When they match with each other, comparator 658 makes cache hit signal CH# fall to "L" and applies the same to CDRAM 600 so as to indicate a cache hit. If they do not match with each other, comparator 658 generates a cache hit signal CH# of "H" to indicate a cache miss (miss hit).

At a time of a cache hit, the following operation is carried out in the CDRAM 600. The control of operation at this time is carried out by control signals from a control clock buffer 250 and by SRAM array driving circuit 264 (see FIG. 32). SRAM row decoder 202 selects one of 256 sets in response to the set address of A6 to A13 from the CPU. Namely, one row (one in each SRAM array block, 4 rows in total) is selected. Consequently, 16 bits of SRAM cells are selected in each SRAM array block of the SRAM 200. SRAM column decoder SCD 203 decodes the block address of A2 to A5 from CPU, selects 1 bit out of 16 bits of memory cells, and connects the selected one to data input/output terminal. FIG. 79 shows an output data Q at the time of a hit reading.

Operation at a miss hit will be described. At this time, data to which access is requested by the CPU is not stored in the SRAM 200. In controller 650, selector 672 applies a corresponding tag address stored in tag memory 656 to multiplex circuit 700 in response to a miss hit designating signal from comparator 658. At this time, selector 672 has the 8 bits of tag address A14 to A21 applied from CPU as a new tag address stored at corresponding positions in tag memory 656.

In CDRAM 600, a copy back, that is, simultaneous transfer of 16 bits from SRAM 200 to DRAM 100 is carried out in this cycle. Data of 16 bits×4 selected by SRAM row decoder SRD 202 in accordance with the set address of A6 to A13 from the CPU in SRAM 200 are stored at corresponding positions of DRAM cells of 16 bits×4 which have been selected by row and column selecting operation in the DRAM 100 in accordance with 8 bits of tag address output from selector 672 and in accordance with the address A6 to A13 output from the CPU.

In the next operation cycle, CDRAM 600 selects 16 bits×4 DRAM cells in DRAM 100 in accordance with the address A6 to A21 output from the CPU, and writes the data of 16 bits×4 to corresponding 16 bits×4 memory cells of SRAM 200 which have been selected by SRAM row decoder SRD in accordance with address A6 to A13 from CPU. This data transfer may be carried out in accordance with the high speed transfer mode.

As described above, for the SRAM, address bits A2 to A5 are used as a block address, address bits A6 to A13 are used as a set address, address bits A14 to A21 are used as a tag address. For the DRAM, address bits A6 to A11 are used as a column address, and address bits A12 to A21 are used as a row address. Consequently, a direct mapping method can be realized between DRAM 100 and SRAM 200.

Figure 80:
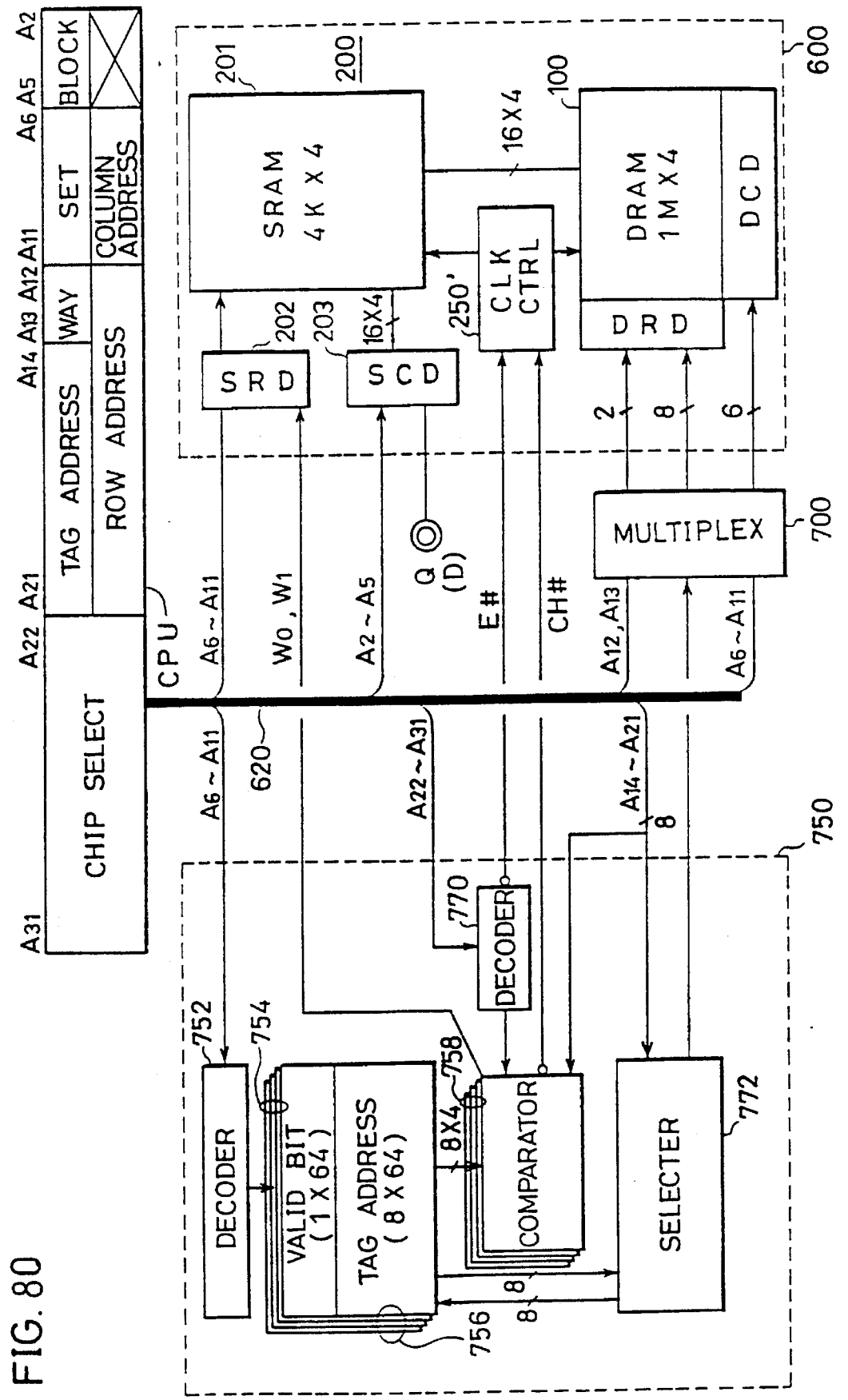

FIG. 80 is a block diagram showing a system structure of 4 way set associative method using the CDRAM of the present invention. CDRAM 600 has the same structure as that shown in FIG. 79, which includes SRAM 200, DRAM 100 and a clock control circuit 256'. Clock control circuit 256' includes control clock buffer 250, SRAM array driving circuit 264 and DRAM array driving circuit 260 shown in FIG. 32. For simplicity, circuit structures for controlling data input/output are omitted.

Controller 750 includes a decoder 752, a valid bit memory 754, a tag address memory 756, a comparator 758, a decoder 770 and a selector 772. For correspondence to 4 ways, valid bit memory 754 includes 4 memory frames each having 1 bit×64 structure. Tag address memory 756 also has 4 memory frames each having 8 bits×64 structure. Similarly, 4 comparators 758 are provided for selecting one of 4 ways, that is, one comparator is provided for each memory frame of the tag address memory 756. In 4 way set associative method, 256 rows of SRAM 200 are divided into 4 ways, and therefore the number of sets is 64.

Addresses having the following structures are transmitted from CPU to address bus 620. Address of A22 to A31 is an address for selecting a chip, address of A14 to A21 is a tag address, address of A12 and A13 is a way address, address of A6 to A11 is a set address, and address of A2 to A5 is a block address. Address of A6 to A11 and address A12 to A21 are used as a column address and a row address for the DRAM 100, respectively. Multiplex circuit 700 is provided for DRAM 100 of CDRAM 600 for multiplexing the row and column addresses. The operation will be described.

Address A6 to A11 from CPU is applied as a set address to decoder 752. Address of A22 to A31 is applied as a chip select address to decoder 770. Decoder 752 decodes the set address of A6 to A11 and sets the valid bit related to a corresponding set to valid state, in valid bit memory 754. Consequently, 1 set (4 ways) is selected. Decoder 770 decodes chip select address of A22 to A31 to determine whether or not there is an access request to CDRAM 600. If an access to CDRAM 600 is requested, decoder 770 sets chip select signal E# to an active state, that is, "L", and activates comparator 758. Comparator 758 reads corresponding 4 way tag addresses from tag address memory 756 referring to valid bits in valid bit memory. 754, and compares the read tag addresses with the address of A14 to A21 from the CPU. If a matching is found, comparator 758 outputs a way address of W0 and W1 indicating the way in which the matching is found, and makes cache hit signal CH# fall to "L" so as to indicate a cache hit. If there is not a match in comparator 758, cache hit signal CH# is set to "H" to indicate a miss hit.

When a cache hit occurs, way address of W0 and W1 from controller 750 and address of A6 to A11 from the CPU are applied as a row address to SRAM row decoder 202, and 16 bits×4 SRAM cells are selected in SRAM array 201. Block address A2 to A5 as a column address are decoded by SRAM column decoder 203. Out of selected 26 bits×4 SRAM cells, 1 bit×4 are selected to be connected to data output terminals Q (or data input terminals D).

In case of a miss hit, selector 772 selects one of the 4 way tag address to select a region in which tag address is to be rewritten in accordance with LRU (Least-Recently Used) logic. The tag address selected by selector 772 is applied as an array address to DRAM row decoder DRD in DRAM 100 through multiplex circuit 700. Selector 772 replaces the tag address which is to be rewritten by address of A14 to A21 applied from the CPU.

In CDRAM 600, the first cycle is a copy back mode. In copy back mode, way address of W0 and W1 indicating the way to be rewritten, is output under the control of selector 772. In SRAM 200, address of A6 to A11 from CPU and way address of W0 and W1 from controller 750 are decoded, and 16 bits×4 SRAM cells are selected. In DRAM 100, 16 bits×4 DRAM cells are selected in accordance with 8 bits of tag address output from selector 772 and to address A6 to A13 output from the CPU. Thereafter, data are transferred from selected 16 bits×4 SRAM cells to selected 16 bits×4 DRAM cells.

In the next operation cycle, 16 bits×4 DRAM cells are selected in DRAM 100 in accordance with address A6 to A21 from the CPU. Data of the newly selected 16 bits×4 DRAM cells are simultaneously transferred to 16 bits×4 SRAM cells which have been selected in accordance with address A6 to A11 and way address W0 and W1. The data transfer may be carried out in accordance with the high speed transfer mode.

By the above described structure, either direct mapping method or set associative method can be realized without changing internal structure of CDRAM 600. Although not shown, full associative mapping method is also possible. In that case, in controller 750, a tag address memory for storing SRAM cache address and a corresponding address of the DRAM 100 is necessary. Relation between signal timings in various operation cycles and state transitions in CDRAM will be described.

CDRAM operates synchronized with a clock K, to latch external control signal, write in data and address signal. Operation cycle of CDRAM is determined by combined states of external control signals at the rising edge of the clock. However, internal operation of CDRAM is advanced asynchronously with the clock K. Specific operation cycles are described with reference to FIGS. 81 to 104B.

As described above, control signals except output enable signal G# and addresses Aa and Ac are latched at a rising edge of external clock signal K. The states of respective signals are arbitrarily (D.C) except that set up time and hold time are necessary before and after a rising edge of the external clock K. In accordance with the external clock synchronizing method, it is not necessary to take cycle time margin derived from skew of address signals and the like into consideration, and the cycle time can be reduced. Thus, a CDRAM operating at high speed can be provided.

Output enable signal G# controls the states of outputs from output buffer and output register included in input/output circuit 274 shown in FIG. 37. When output enable signal G# is at "H", output data is in a high impedance state (Hi-Z). When output enable signal G# attains to active state, that is, "L", data is output.

[Specific Operation Cycles & Timings]

The operation modes of CDRAM are as shown in a table of FIG. 76. The respective operation modes together with the timings thereof will be described, referring to FIGS. 81 to 104B.

In the standby state, chip select signal E# and refresh designating signal REF# are both set to "H" at a rising edge of external clock signal K, and remaining control signals CH#, CI#, CR# and W# are at arbitrary states. In the standby state, memory. operation is not carried out at all in CDRAM.

No. 1: cache hit write cycle

Figure 81:
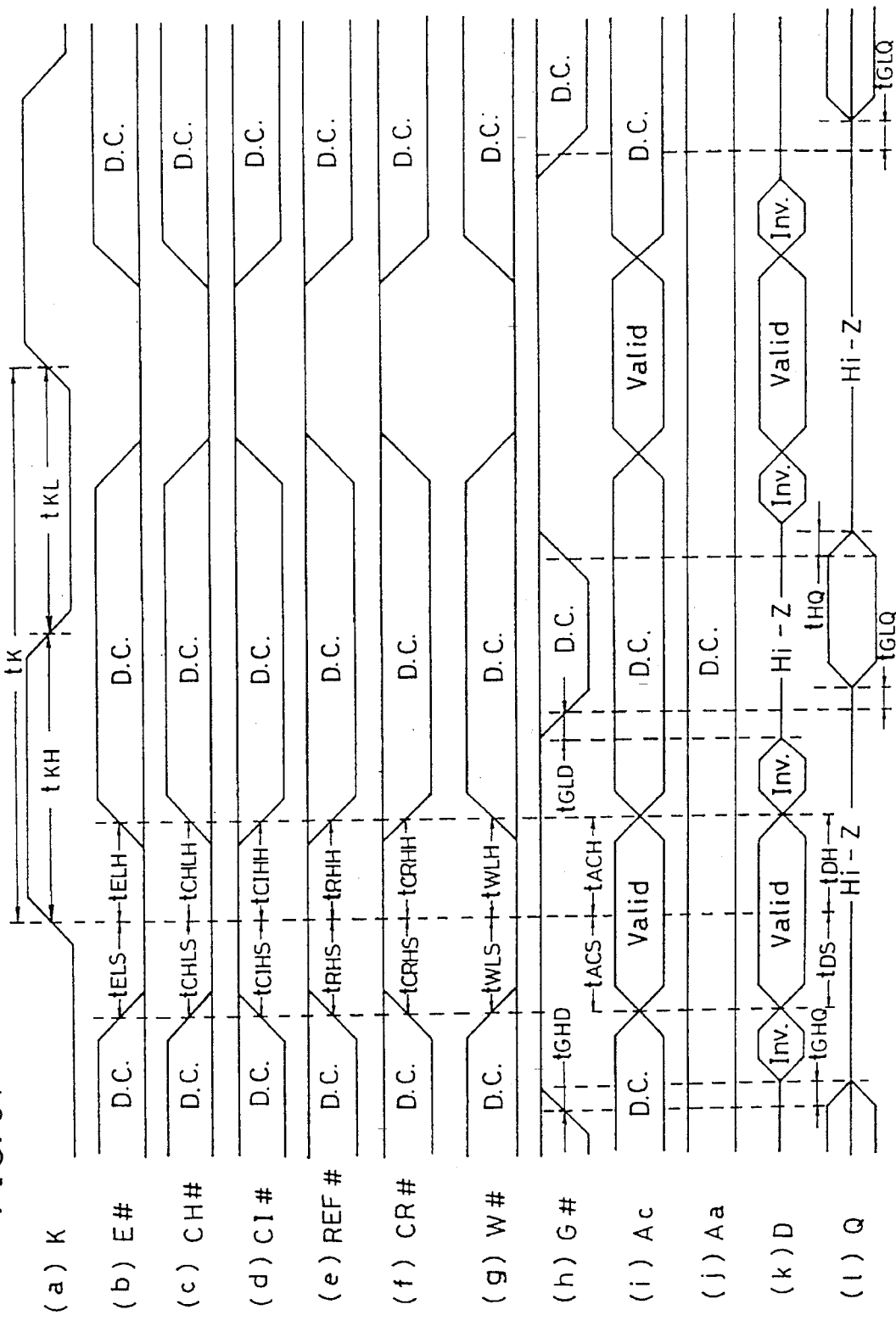

FIG. 81 shows timings of various signals in cache hit write cycle. External clock signal K has a cycle time tk. Cycle time tk includes an H pulse width tKH at which external clock signal K is at "H", and a L pulse width tKL at which external clock signal K is at "L". A cache hit write cycle is a cycle for writing data to SRAM cache. When this state is selected, chip select signal E# is set to "L", cache hit signal CH# is set to "L", cache hit inhibition signal CI# is set to "H", command register signal CR# is set to "H", write enable signal W# is set to "L" and output enable signal G# is set to "H" at a rising edge of external clock signal K.

At this state, an address for SRAM 200 is latched as valid, and access to SRAM is carried out in accordance with the address Ac for the SRAM. At this time, an address Aa for the DRAM is arbitrary (D.C). At a rising edge of the external clock signal K, input data D is assumed valid, and valid write data is written to SRAM cell selected by the SRAM address Ac. Since access to the cache memory SRAM is at high speed, writing is completed in 1 clock cycle of external clock signal K as shown in FIG. 81. Namely, the time required for a cache hit writing is the clock cycle time tK.

Although output data Q changes in response to an arbitrary state (D.C.) of output enable signal G# in FIG. 81, this means that output data appears corresponding to the "H" and "L" levels of the output enable signal G#. FIG. 81 shows set up times and hold times of respective control signals and address signals. The set up time is necessary for setting surely the control signal or addresses at an established state by the time of the rising edge of external clock signal K. The hold time is necessary for ensuring operation by holding the signal for a constant time period from a rising edge of the external clock signal K. The set up time and the hold time will be described briefly.

Chip select signal E# includes a set up time tELS which is necessary when it is set to "L", a set up time tEHS which is necessary when it is set to "H", a hold time tELH necessary when it changes to "L", and a hold time tEHH which is necessary when it changes to "H".

To the cache hit signal CH#, a set up time tCHLS which is necessary when it change to "L", a set up time tCHS which is necessary when it is changed to "H", a hold time tCHLH which is necessary when it is changed to "L" and a hold time tCHHH which is necessary when it is changed to "H" are set.

Cache inhibition signal CI# includes set up times tCILS and tCIHS which are necessary when it is changed to "L" and to "H", respectively, and hold times tCILH and tCIHH which are necessary when it is changed to "L" and to "H", respectively.

The command register signal CR# includes set up times tCRLS and tCRHS which are necessary when it is changed to "L" and to "H", respectively, and hold times tCRLH and tCRHH which are necessary when it is changed to "L" and "H", respectively.

Refresh signal RE# includes set up times tRLS and tRHS which are necessary when it is changed to "L" and to "H", respectively, and hold times tRLH and tRHH which are necessary when it is changed to "L" and to "H", respectively.

Write enable signal W# includes set up times tWLS and tWHS which are necessary when it is changed to "L" and "H", respectively, and hold times tWLH and tWHH which are necessary when it is changed to "L" and "H", respectively. The address Ac for SRAM includes a set up time tACS which is necessary for determining the state thereof as valid, and a hold time tACH which is necessary when it is valid.

The address Aa for DRAM includes a set up time tAAS which is necessary to a rising edge of external clock signal K at which it is determined valid, and a hold time tAAH which is necessary after it is determined to be valid.

As to write data D, a set up time tDS required for valid data, and a hold time tDH required for valid data are necessary.

As to output enable signal G#, time tGHD necessary from the time at which output is disabled to the time when data input pin is activated, a delay time tGLD which is necessary from the time at which data input pin is set to the high impedance state to the time when signal G# is changed to "L", time tGLQ which is necessary from the time when it is changed to "L" to the time when the output pin is activated, and time tGHQ which is necessary from the time when it is changed to "H" to the time when the output pin is set to the high impedance state are set.

As to access time, an access time tGLA from the time when output enable signal G# attains to "L" to an output of valid data, access time tKLA from the time when external clock signal K attains to "L" to an output of valid data, an access time tKHA from the time when external clock signal K attains to "H" to the output of valid data, an access time tKHAR from the time when external clock signal K attains to "H" in registered output mode to the output of valid data, and an array access time tKHAA necessary from the time when external clock signal K attains to "H" to the time when TRAM is accessed and valid data are output are set.

Referring to FIG. 81, after a lapse of tGHD from a rising edge of output enable signal G#, the write data D is regarded as invalid.

The cycle time of the CDRAM of the present invention is set to 10 nS to 20 nS, as an example. Array access time tKHAA is set to 70 to 80 ns. Various set up times and hold times are set to several nano seconds.

No. 2T: Cache hit read cycle (transparent output mode)

Figure 82:
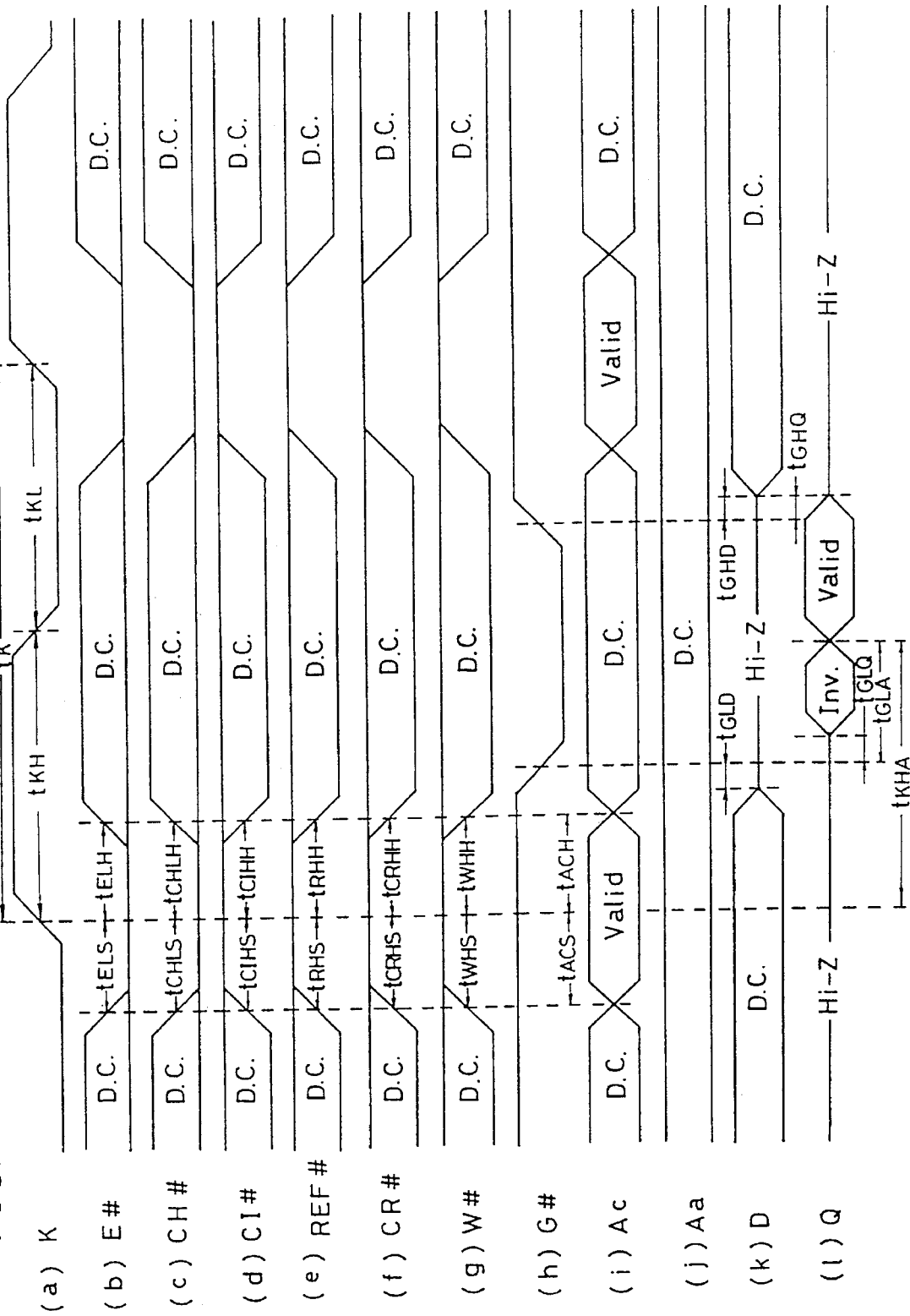

FIG. 82 shows timings of cache hit read cycle in the transparent output mode. As described above, the output mode includes transparent output mode, latched output mode and registered output mode. Designation of the output mode is carried out by the command register. Referring to FIG. 82, when a cache hit read cycle is set, chip select signal E# and cache designating signal CH# are both set to "L" at a rising edge of the external clock signal K, and cache hit inhibition signal CI#, refresh designating signal REF#, command register signal CR# and write enable signal W# are set to "H".

In this state, an address Ac for the SRAM is made valid at the rising edge of the external clock signal k, and a SRAM cell is selected in accordance with this valid address Ac. In transparent output mode, data of the SRAM cell designated by the valid address Ac is output in this clock cycle. In transparent output mode, valid output data Q is output after a lapse of tKHA from the rising edge of the external clock K or after a lapse of time tGLA from a falling edge of output enable signal G#, which ever is later.

When output enable signal G# falls to "L" before the time tKHA, invalid data is continuously output until the time tKHA has lapsed. In the cache hit read cycle, write data is set to high impedance state (Hi-Z), and the address Aa from the DRAM may be set to any state, since it is not used.

No. 2L: Cache hit read cycle (latch output mode)

Figure 83:
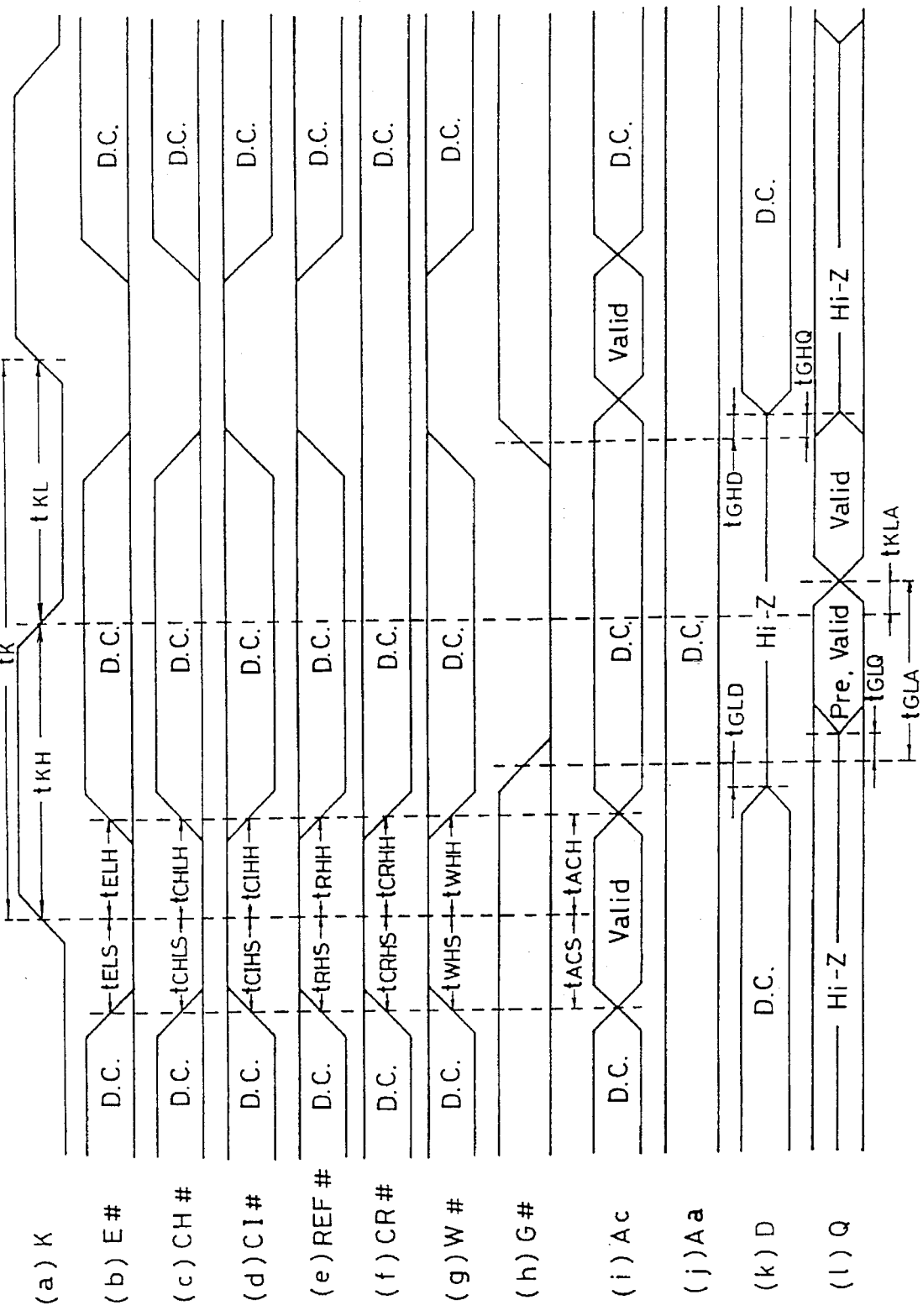

FIG. 83 shows timings in cache hit read cycle of latched output mode. The difference between latched output mode and transparent output mode is that when output enable signal G# falls to "L" before the access time tKHA, data of the SRAM cell which has been selected in the previous cycle (Pre.Valid) is output at first. Other signal timings are the same as those in transparent output mode shown in FIG. 82. In the latch output mode, invalid data (INV) is not output. Valid data only are output.

No. 2R: Cache hit read cycle (register output mode)

Figure 84:
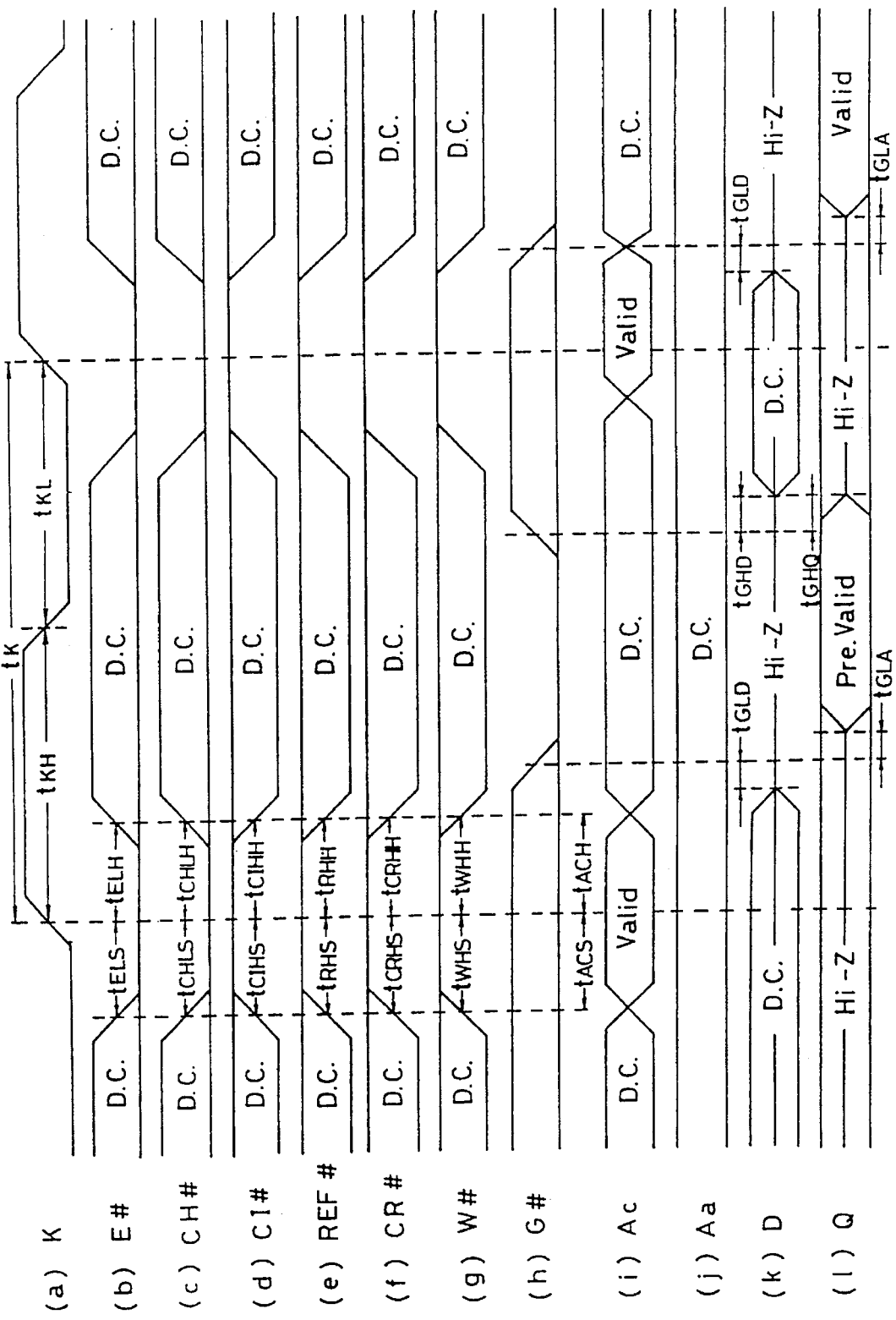

FIG. 84 is a timing diagram of the cache hit read cycle in registered output mode. Timings of external control signals in the cache hit read cycle of the registered output mode are the same as those in the transparent output mode and in the latched output mode shown in FIGS. 82 and 83. In the registered output mode, valid data of the previous cycle (Pre.Valid) is output after the lapse of tKHAR from the rising edge of external clock signal K or after a lapse of time tGLA from a falling edge of output enable signal G#, which is later. In registered output mode, invalid data is not output. Register output mode is suitable for pipeline operation.

Switching of the above described output modes is realized by controlling the operation of an output register included in input/output circuit 274 shown in FIGS. 32 and 37 (particularly see FIG. 37).

No. 3: Copy back cycle

Figure 85:
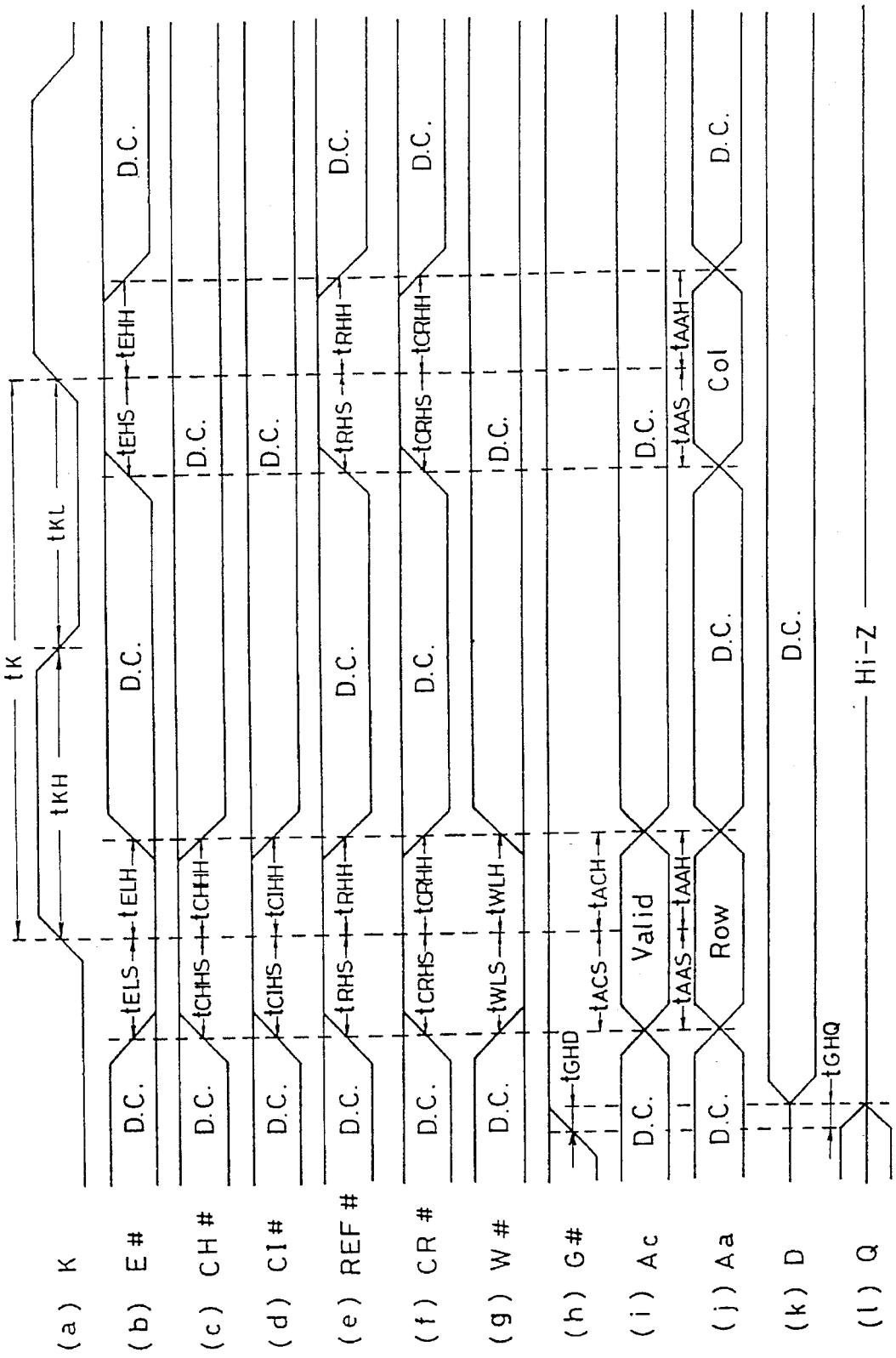

FIG. 85 shows timings of various signals in copy back cycle. The copy back cycle is a cycle for transferring data from cache (SRAM) to array (DRAM), and it is carried out as a first cycle at a time of a miss hit. In the copy back cycle, chip select signal E# and write enable signal W# are both set to "L", and cache hit signal CH#, cache inhibition signal CI#, refresh designating signal REF#, command register signal CR# and output enable signal G# are set to "H" at a rising edge of external clock signal K. In the copy back cycle, an array address Aa must be input to DRAM for selecting the memory cells. A row address (Row) and the column address (Col) are multiplexed and applied as the array address Aa. An array row address is latched at a first rising edge of external clock signal K, and an array column address is latched at a second rising edge of external clock signal K. At the second rising edge of external clock signal K, cache hit designating signal CH#, cache inhibition signal CI#, write enable signal W# and cache address (address to SRAM) Ac may be at arbitrary states.

Write enable signal W# has been set to "L" at the first rising edge of external clock signal K, and external input data D changes from high impedance state to an arbitrary state. External output data Q is set to high impedance state, since output enable signal G# is at "H".

No. 4: Block transfer cycle

Figure 86:
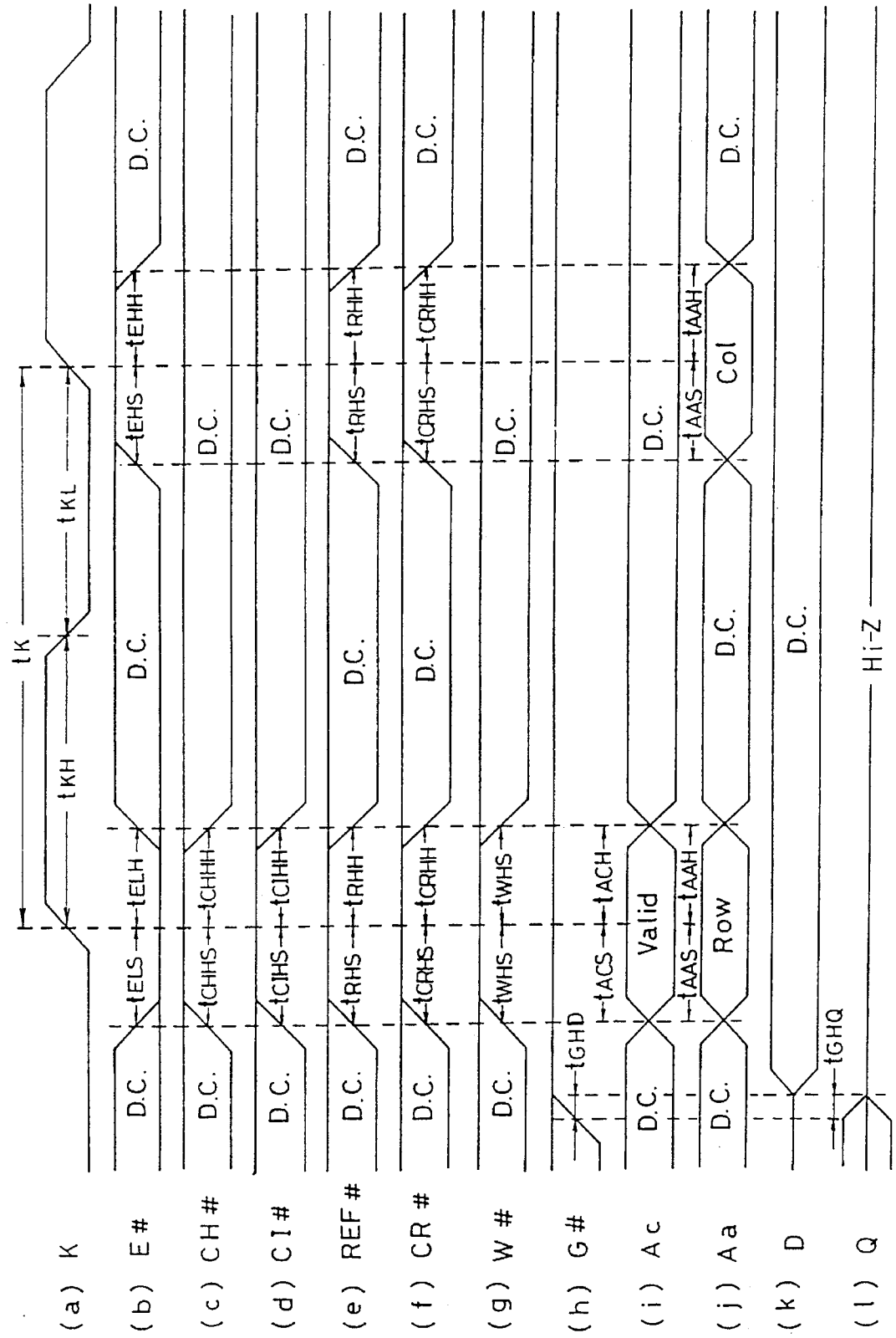

In block transfer cycle shown in FIG. 86, a data block is transferred at one time from the array to the cache (SRAM) before, after or simultaneously with a copy back operation. Timing conditions which are the same as in the copy back cycle shown in FIG. 85 are satisfied in the block transfer cycle, except that write enable signal w# is set to "H" at a first rising edge of the external clock signal K.

More specifically, when write enable signal W# is set to "L" at the first rising edge of external clock signal K at a cache miss (miss hit), the copy cycle is started. If write enable signal W# is set to "H", block transfer cycle from the array to the cache is set.

Whether a high speed copy back is to be carried out or normal copy back and block transfer is to be carried out, or whether write through operation is to be carried out is determined by setting of command data to the command registers.

No. 5: Array write cycle

Figure 87:
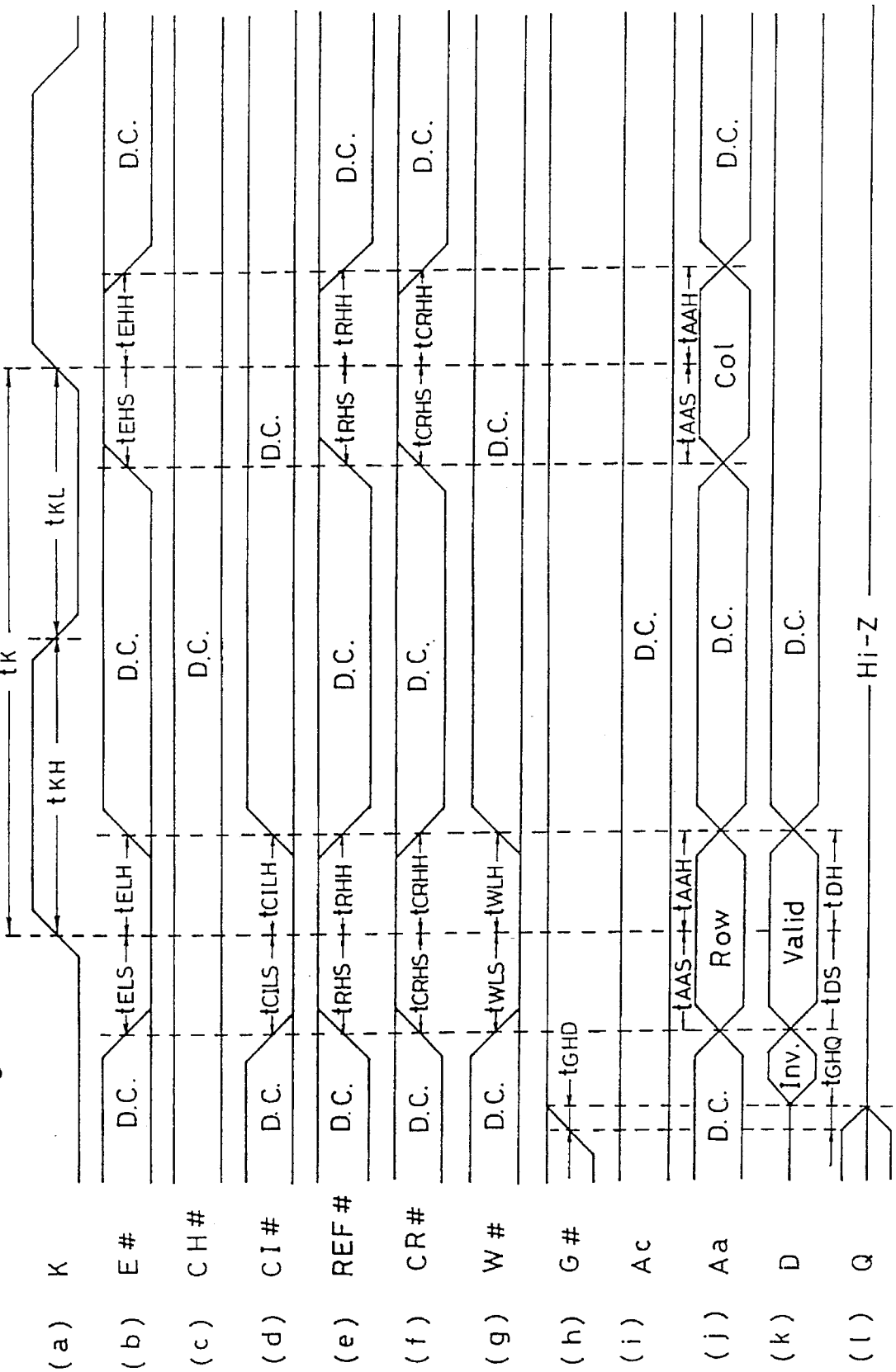

The array write cycle shown in FIG. 87 is a cycle for setting a mode in which CPU directly accesses to the array for writing data. A DR3LM cell in the array is selected by array address Aa. At this time, data may be written through access switching circuit 310 of bi-directional transfer gate circuit 305 as shown in FIG. 33. Alternatively, data may be written through SRAM bit line pair SBL, the bi-directional transfer gate BTG and global I/O line pair GIO as shown in FIGS. 49 and 57, without providing access switching circuit 310. If the structure is adapted to write data through SRAM bit line pair SBL in SRAM array, lower bits of array address Aa may be applied to column decoder SCD of SRAM as a block address. A column selecting signal may be applied from DRAM column decoder to SRAM selecting gate.

Array write cycle is designated by setting chip select signal E#, cache inhibition signal CI# and write enable signal W# to "L" and by setting refresh designating signal REF# and output enable signal G# to "H" at the first rising edge of external clock signal K, as shown in FIG. 87. Cache designating signal CH# may be at an arbitrary state. In array write cycle, array address Aa is latched as a row address (row) at the first rising edge of external clock signal K, and array address Aa is latched as a column address (Col) at the second rising edge of external clock signal K. Since the cache is not accessed at this time, address Ac for the cache may be at an arbitrary state. External write data D is latched at the first rising edge of external clock signal K. External output data Q is set to high impedance state.

In the cache system shown in FIGS. 79 and 80, only 16 bits of an address are applied to DRAM 100, and column selecting operation in blocks is carried out in accordance with the block address in SRAM. FIGS. 79 and 80 show a structure for a cache system and those figures do not show the structure of the array access. However, the structure may use 4 bits of a block address as column selecting address for DRAM 100, when cache inhibition signal CI# attains to "L" at array accessing.

No. 6: Array read cycle

Figure 88:
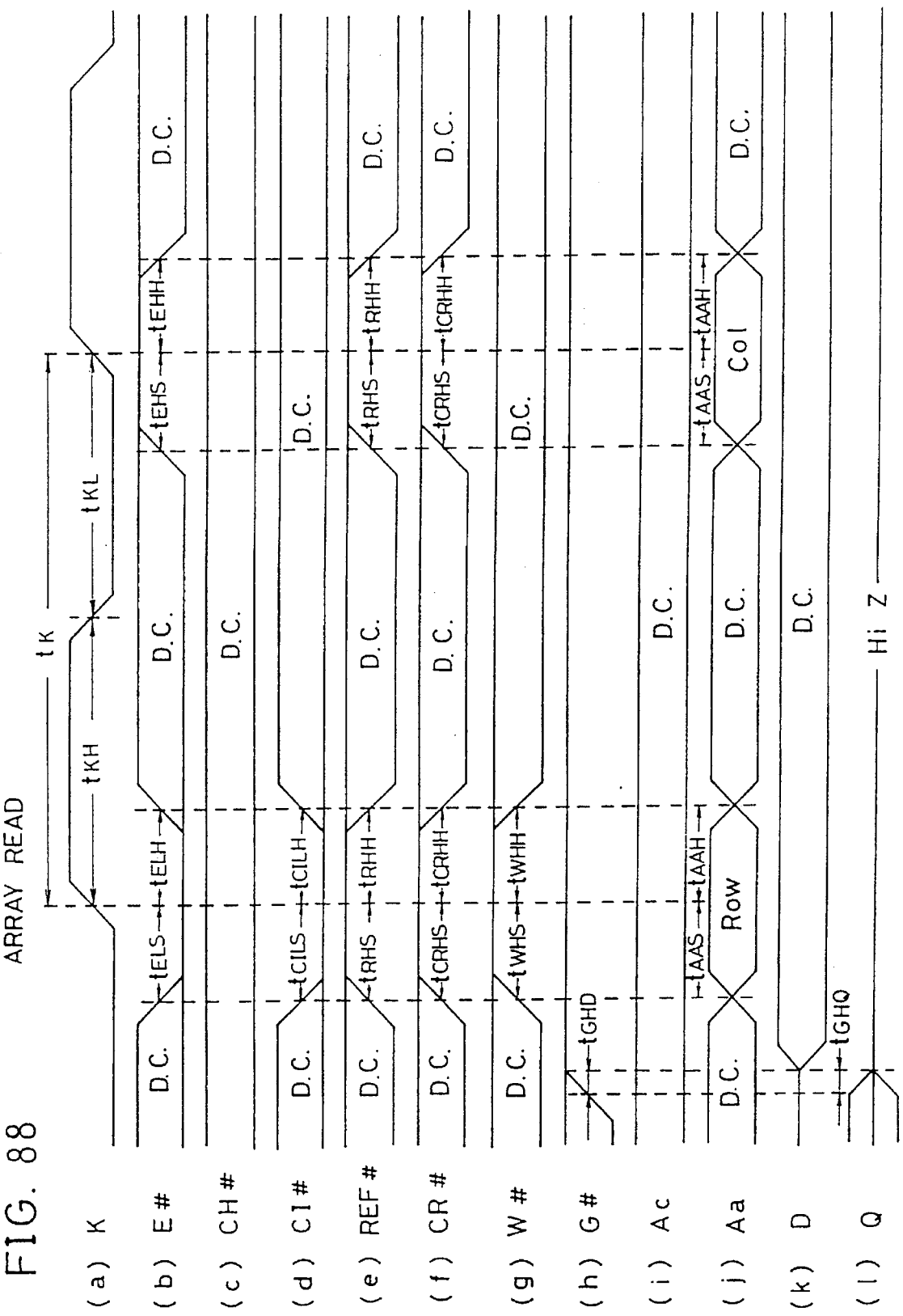

Array read cycle shown in FIG. 88 is a cycle for setting a mode in which CPU directly accesses to array for reading data. Array read cycle is designated by setting chip select signal E# and cache inhibition signal CI# to "L" and by setting refresh designating signal REF#, command register signal CR#, write enable signal W# and output enable signal G# to "H" at the first rising edge of external clock signal K. At the second rising edge of external clock signal K, chip select signal E#, refresh designating signal REF# and command register signal CR# are set to "H", and cache inhibition signal CI# and write enable signal W# may be at an arbitrary state. The cache hit designating signal CH# may be at an arbitrary state in array read cycle. Output enable signal G# is maintained at "H". Array address Aa is latched as a row address at the first rising edge of external clock signal K, and array address Aa is latched as a column address at the second rising edge of the external clock signal K. External input data D may be at an arbitrary state, and external output data Q is set to high impedance state.

Array access cycles (array write cycle and array read cycle) are set by setting cache signal CI# to "L" at the first rising edge of the external clock signal K. The array access cycles are cycles for setting modes in which CPU directly accesses the array. Data reading/writing are not actually carried out in the array write cycle and array read cycle.

In operations such as copy back operation, block transfer operation and array access operation which require reading/writing of data in the array, selection of a word line in the DRAM array, detection and amplification of data in the selected cells by sense amplifiers, restore operation of data, and RAS precharge are necessary. Therefore, these operations requiring reading/writing of data in the array takes several clock cycles. When we represent the cycle time of the DRAM by tA and the cycle time of the external clock signal K as tK, external clock cycles of m=tA/tK is necessary for the array access. m cycles correspond to a wait time for the CPU. Timings when the CPU is kept in a waiting state in reading/writing data while memory cells are selected in the array will be described.

No. 7: Array active cycle

Figure 89:
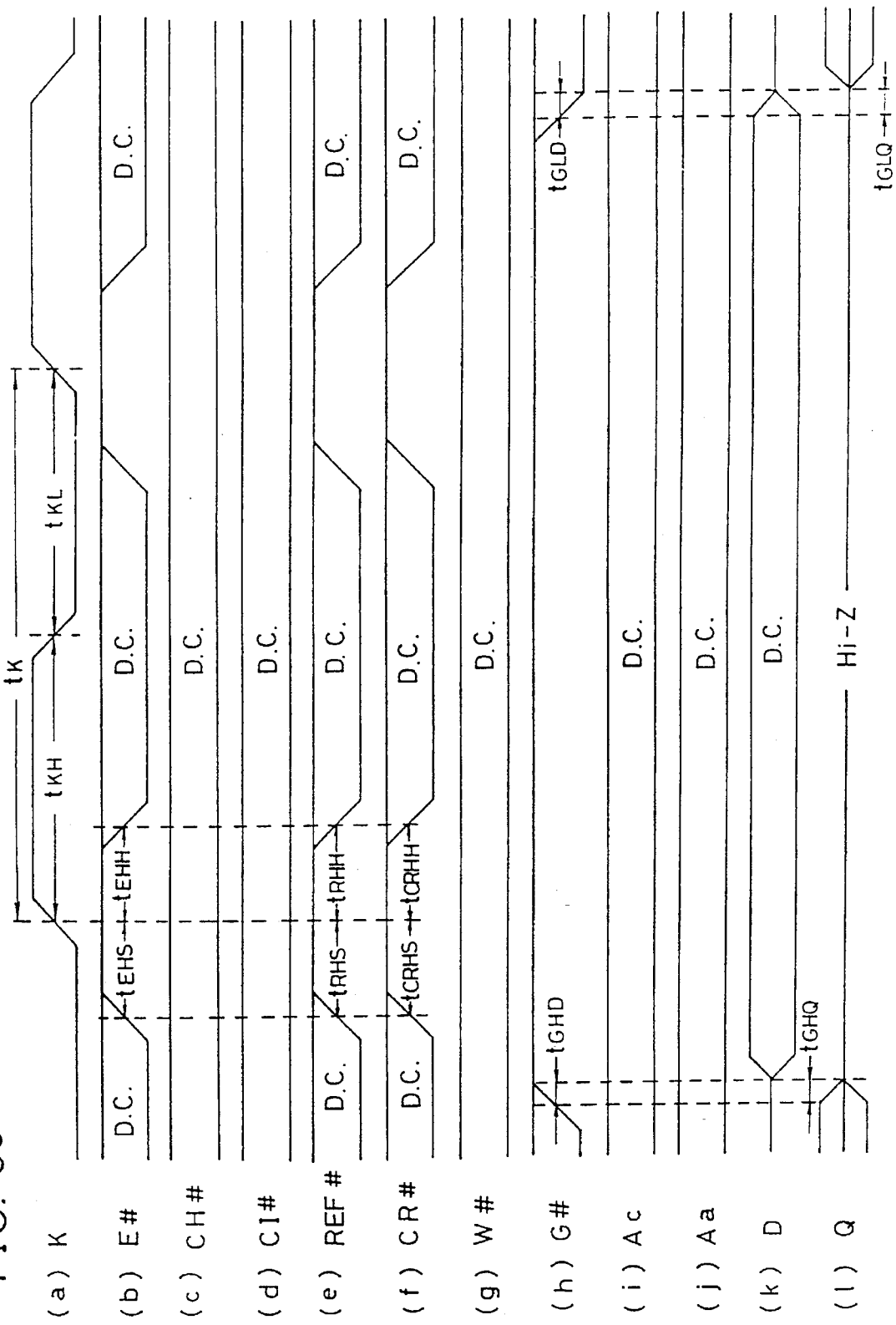

In array active cycle shown in FIG. 89, row selecting operation, column selecting operation and data writing/reading are carried out in accordance with the applied array address Aa. In array active cycle, chip select signal E#, refresh designating signal REF# and command register signal CR# are set to "H" at a rising edge of external clocks signal K, and output enable signal G# is fixed at "H" for this cycle. Cache hit signal CH#, cache inhibition signal CI# and write enable signal W# may be at an arbitrary state. External input data D may be at an arbitrary state and external output data Q is set at high impedance state in the array active cycle.

No. 7QT: Array active cycle accompanied with transparent output mode

Figure 90:
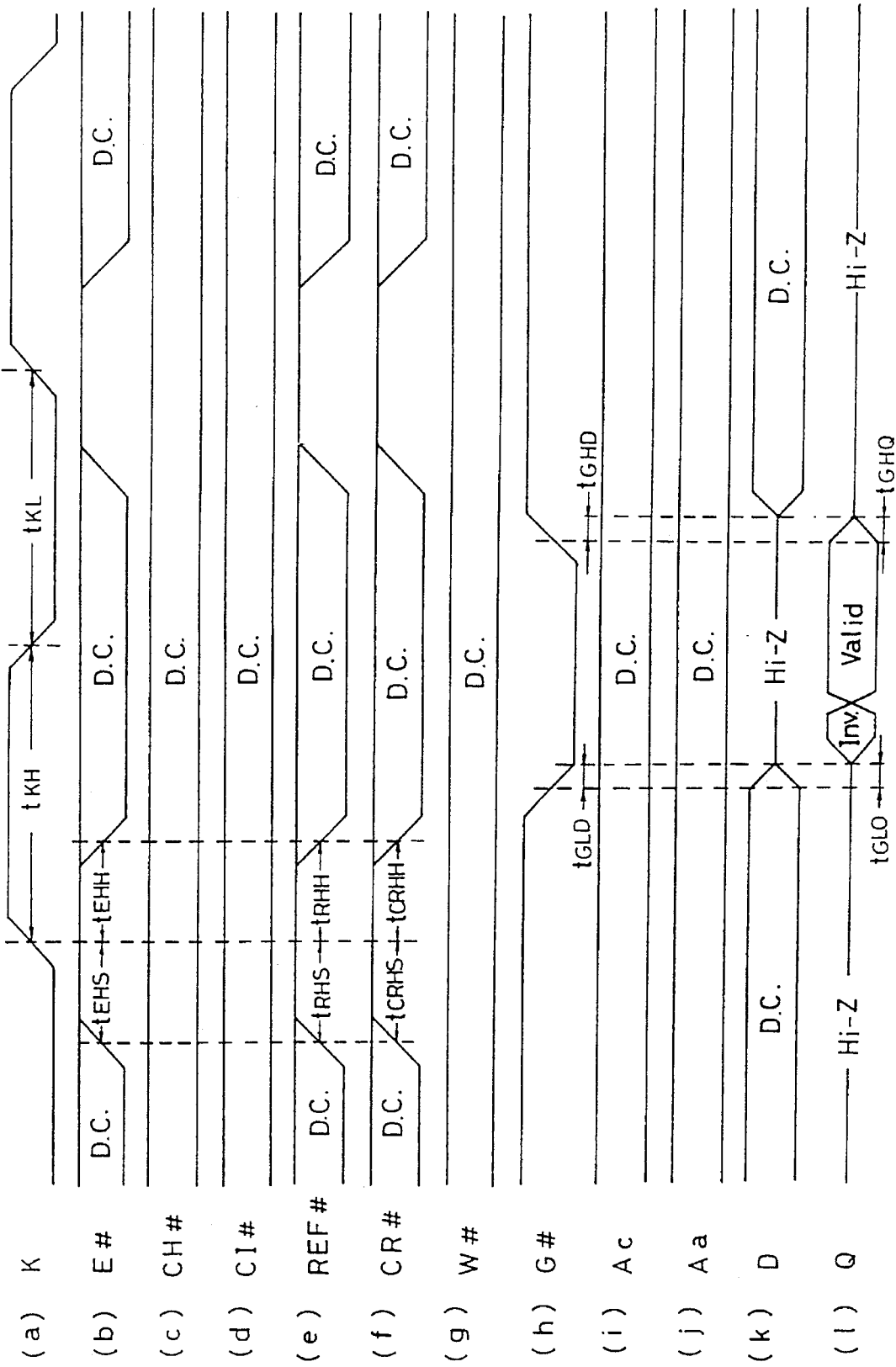

Control signals E#, CH#, CI#, REF#, CR# and W# are set in the same manner as in the array active cycle shown in FIG. 89 for designating the array active cycle in the transparent output mode shown in FIG. 90. In the array active cycle in transparent output mode, when the output enable signal G# is set to "L", an output buffer is activated and valid data are output. In array active cycle of the transparent output mode, data of the DRAM cells corresponding to the array address Aa set in array read cycle shown in FIG. 88 are output.

No. 7QL: Array active cycle in latched output mode

Figure 91:
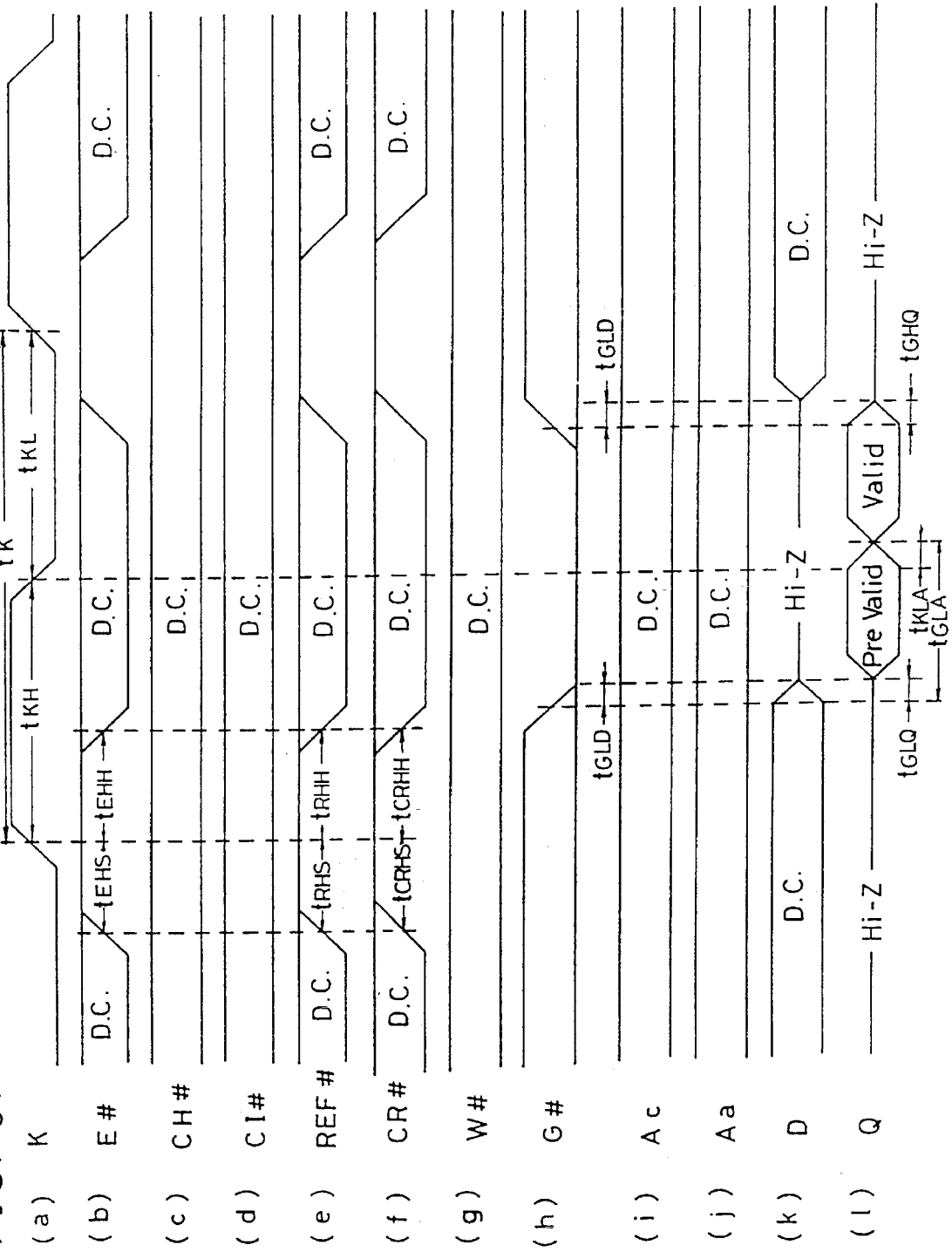

Timings of control signals in array active cycle of the latched output mode shown in FIG. 91 are the same as those shown in FIG. 89. Data (latched in an output register) read in the previous access cycle (either a cache access cycle or array access cycle) is output at first, then data read in the current array access cycle is output.

No. 7QR: Array active cycle in registered output mode

Figure 92:
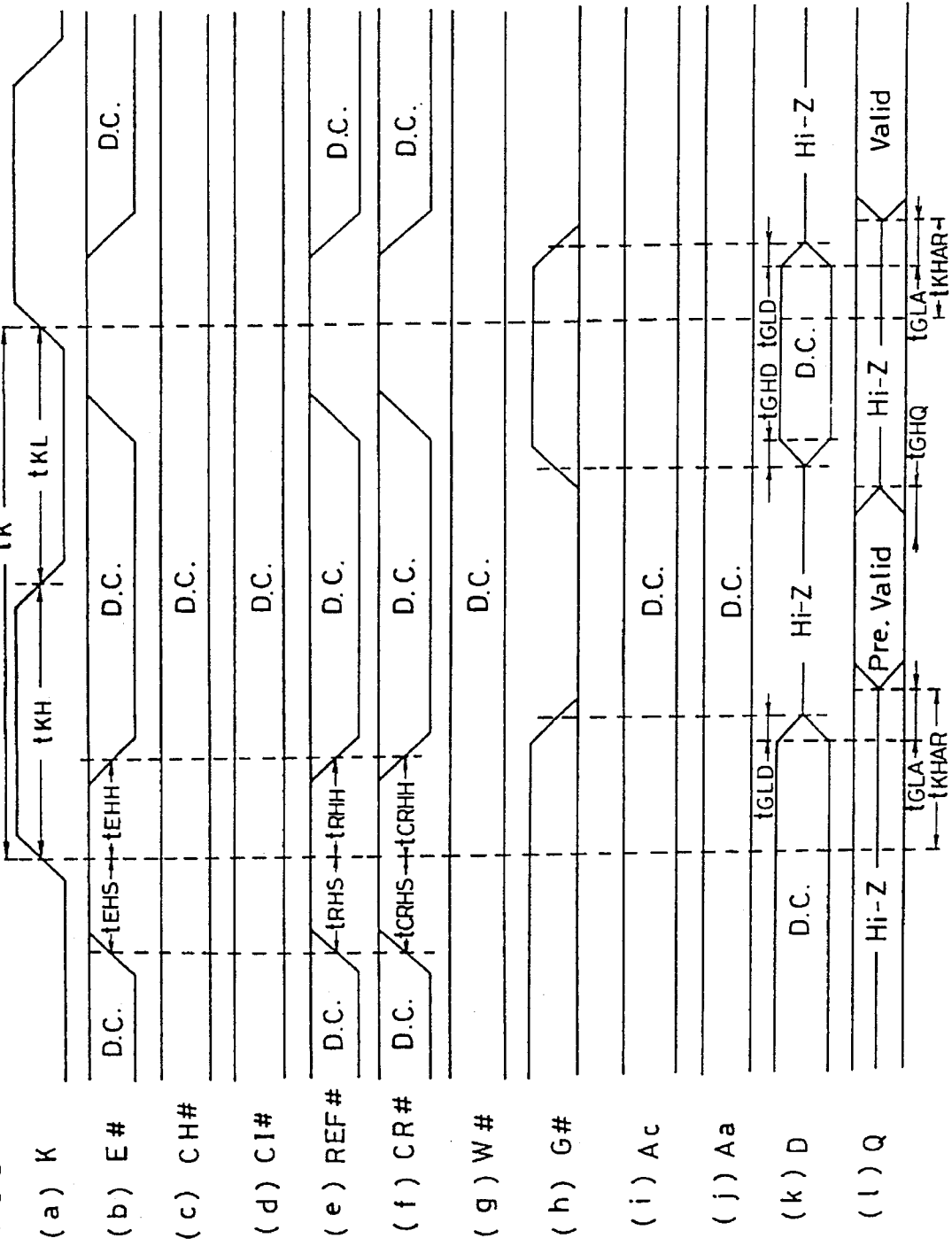

States of control signals in the array active cycle in registered output mode shown in FIG. 92 are the same as those shown in FIGS. 90 and 91. In the array active cycle of the registered output mode, when output enable signal G# which has been maintained at "H" is set to "L", external write data D is set to the high impedance state, and data read in the previous access cycle is output in the current cycle. In the registered output mode array access cycle, when output enable signal G# falls from "H" to "L" at the next clock cycle, data read in the current array access cycle is output.

By combining cycles shown in FIGS. 88 to 92, output data Q in accordance with an external address can be provided from the array.

Figure 93:
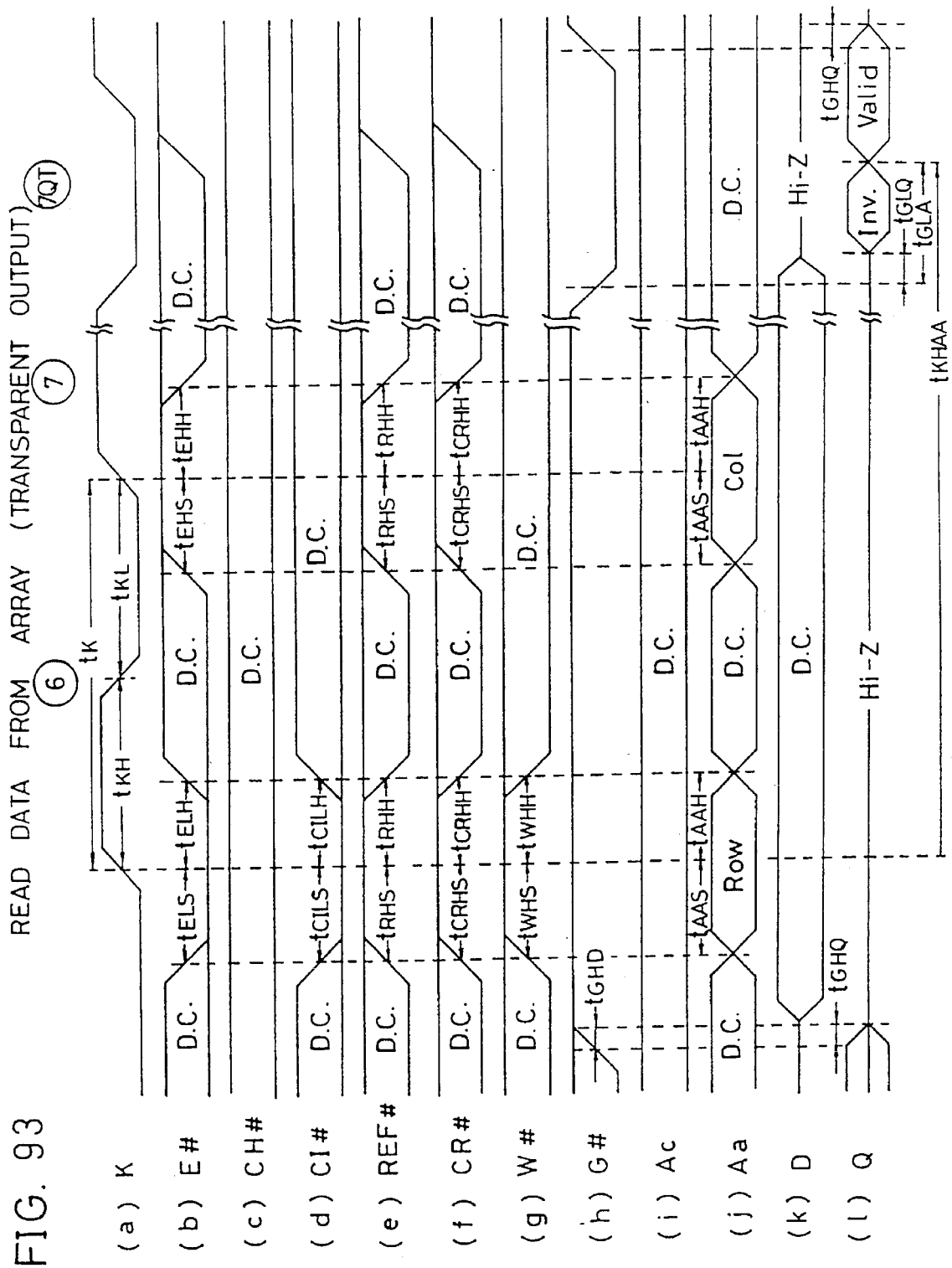

FIG. 93 shows the cycles executed when data are read from the array in transparent output mode. In FIG. 93, numerals in circles at the upper portion of the timing diagram correspond to numbers allotted to the above description of respective cycles.

In array reading operation in the transparent output mode, the array read cycle (No. 6) shown in FIG. 88 is executed. In this cycle No. 6, the array address Aa is successively taken as the row address and the column address at the rising edges of the external clock signal K. Thereafter, the array active cycle shown in FIG. 89 is carried out for a prescribed number of times, for selecting rows and columns in the DRAM array. Finally, the cycle No. 7 shown in FIG. 90 is executed, and by making output enable signal G# fall to "L", invalid data is output, and then valid data is output. In this case, access time tKHAA is approximately the same as the access time in a normal DRAM.

Figure 94:
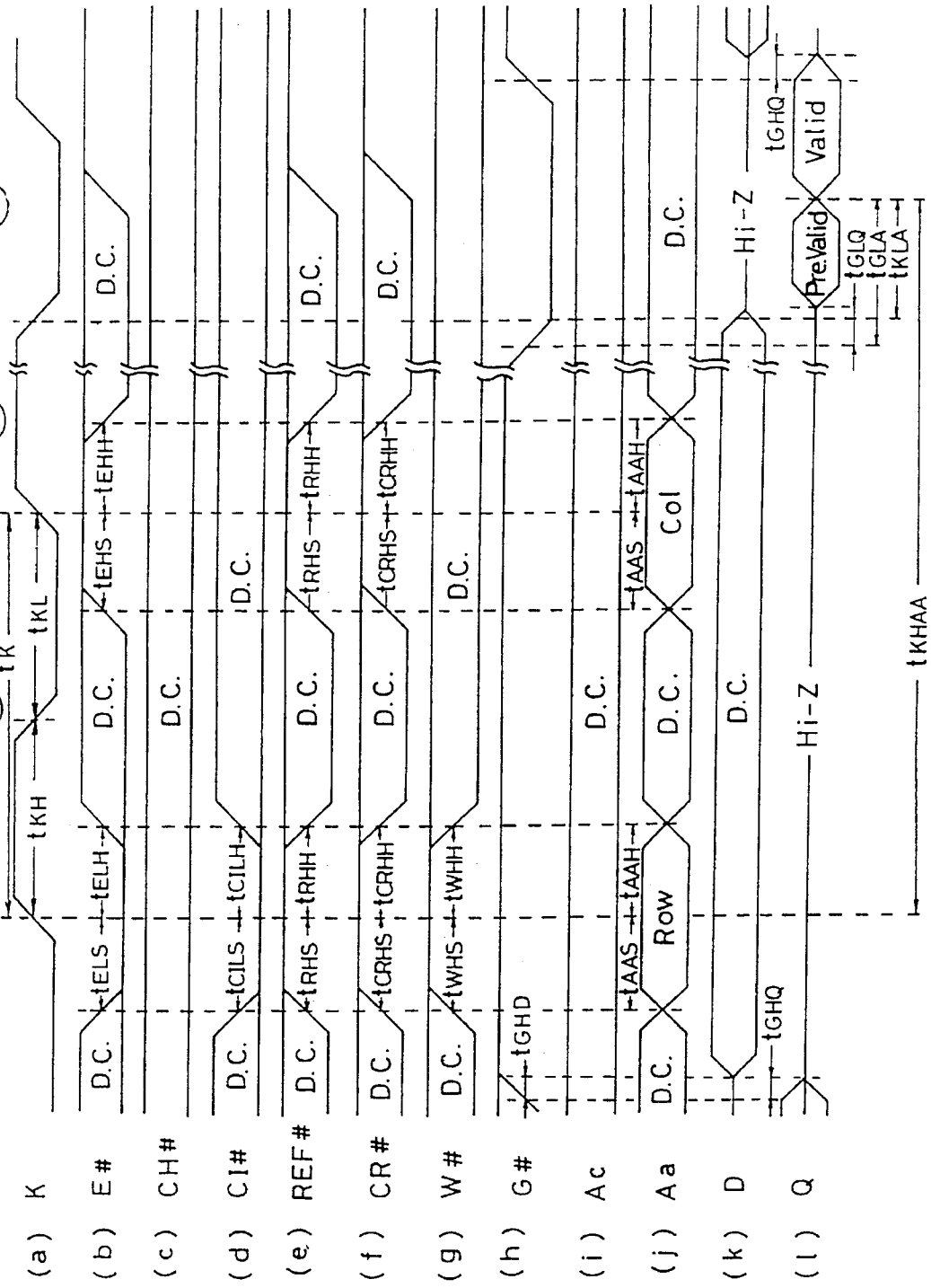

FIG. 94 shows the cycles carried out when data are read from the array in the latched output mode. In the array reading operation in the latched output mode also, at first the array read cycle (No. 6) shown in FIG. 88 is executed, as in the array reading operation in the transparent output mode shown in FIG. 93, and mode for reading data from the array is set. After the array address Aa has been latched by this array read cycle (cycle No. 6), array active cycle shown in FIG. 89 (cycle No. 7) is carried out for a predetermined number of times. After the array active cycle (cycle No. 7), an array active cycle in the latched output mode (cycle No. 7QL) shown in FIG. 90 is executed. When output enable signal G# which has been set at "H" falls to "L" in this cycle No. 7QL, data read by the previous access is output, and then data of the memory cell to which access is requested in the present array read cycle is output. The access time tKHAA at this time corresponds to the time required from the first rising edge of the external clock signal K to the output of memory cell data (valid) to which access is requested in the present array access cycle.

Figure 95:
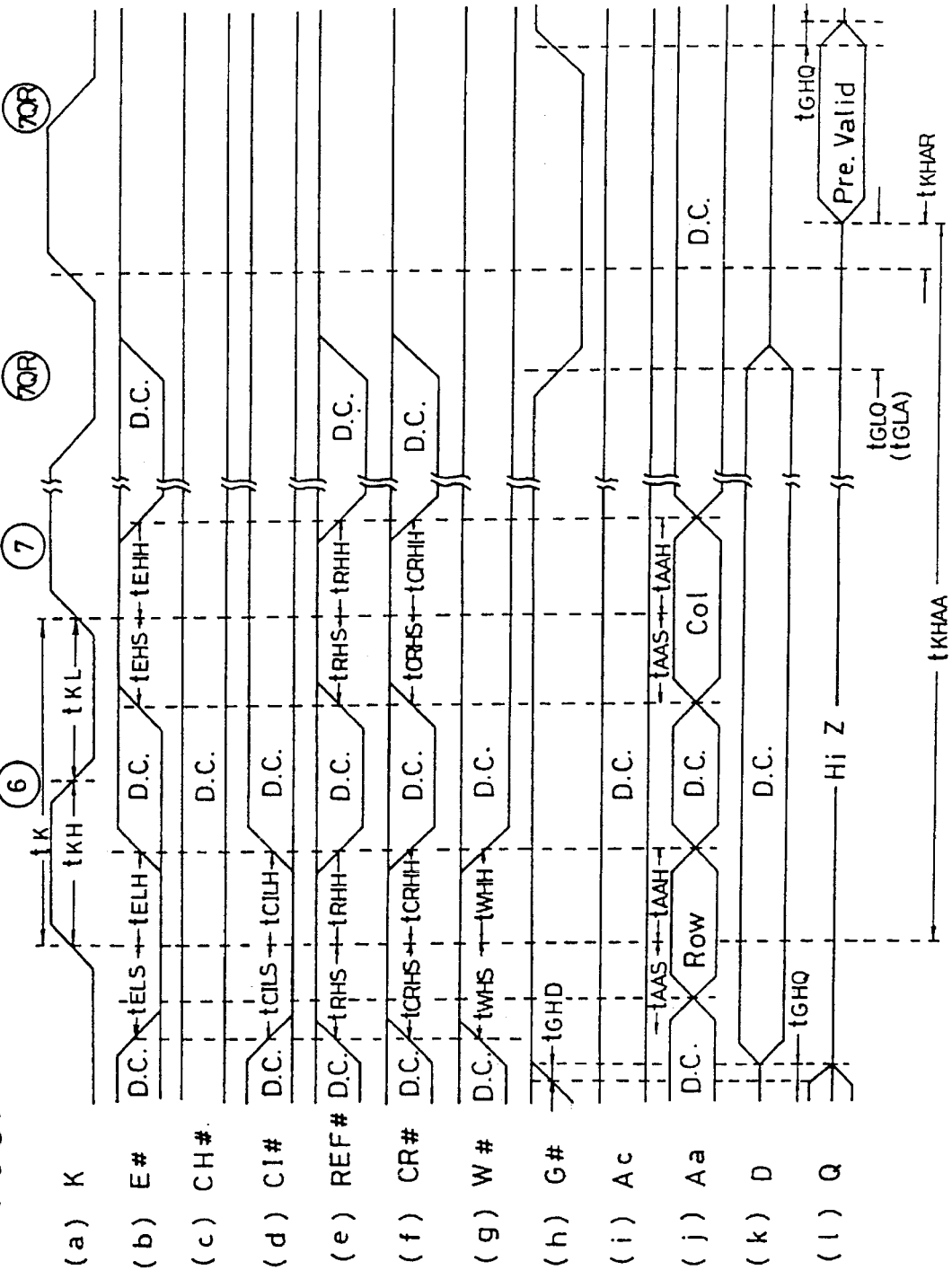

FIG. 95 shows cycles carried out when data are read from the array in registered output mode. Referring to FIG. 95, first the cycle No. 6 is executed and array read mode is set. At a rising edge of external clock signal K, the array address Aa is time divisionally latched as the row address and the column address. Thereafter, the array active cycle of cycle No. 7 is carried out for a predetermined number of times, and then the array active cycle of cycle No. 7QR is executed. In this cycle No. 7QR, after a time lapse of tQHA or tGLA which is later after the rise of the external clock signal K and after the fall of the output enable signal G# to "L", data read in the previous cycle is output as the output data Q. The access time tKHAA is the time from the first rising edge of the external clock signal K to the output of valid data in cycle No. 6.

The DRAM cells must be refreshed periodically. Setting of the refresh operation is done by an external refresh designating signal REF#. In the refreshing operation, a refresh address is generated from a refresh address counter (see counter circuit 293 of FIG. 32) in response to refresh designating signal REF# in the CDRAM, and DRAM cells are automatically refreshed in accordance with the refresh address. DRAMs having such auto-refreshing function have been known in the field of DRAMs. Timings of signals for refreshing will be described.

No. 8: Refresh cycle

Figure 96:
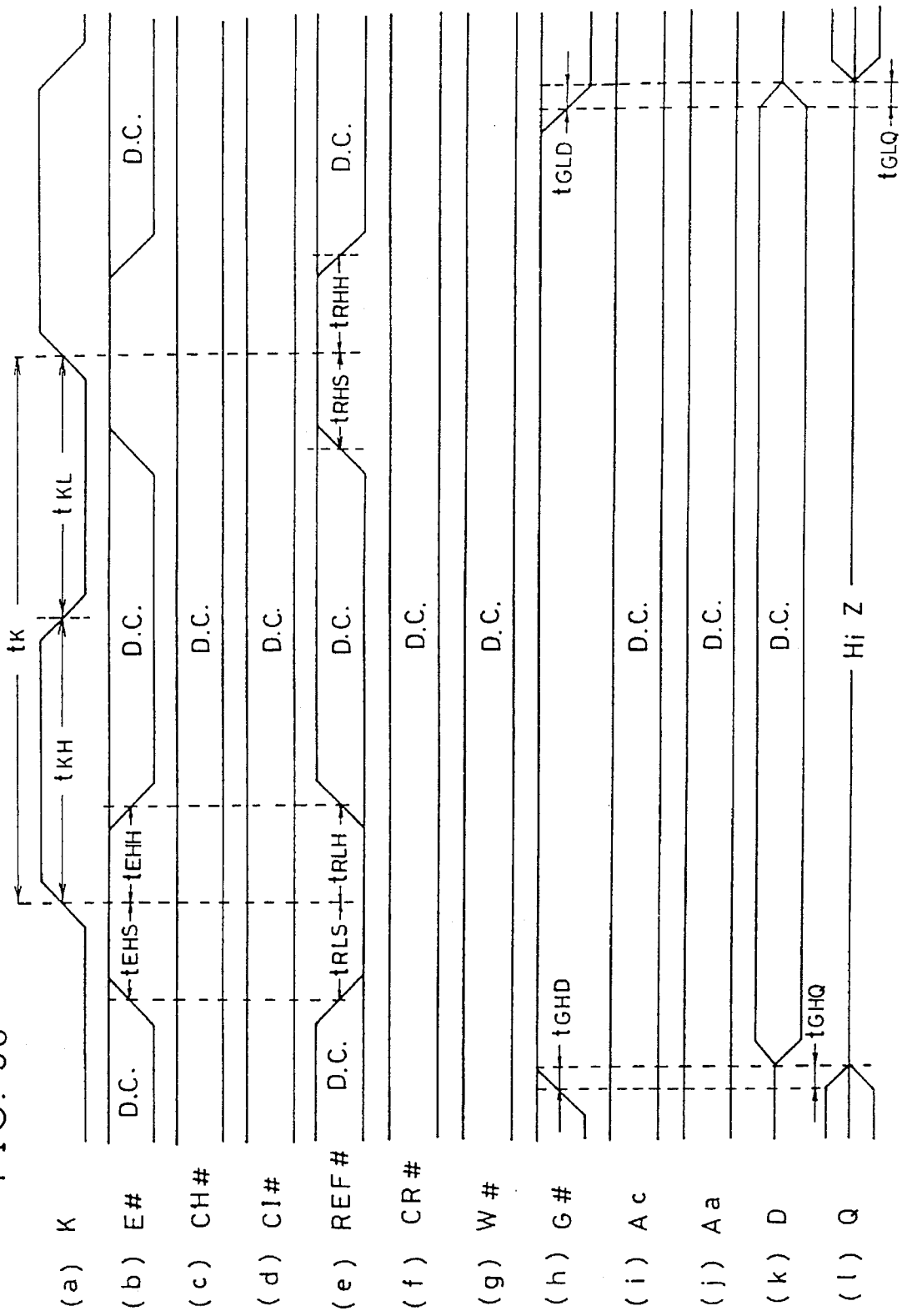

FIG. 96 shows signal timings of the refresh cycle. As shown in FIG. 86, refresh mode of the DRAM is set by setting chip select signal E# and refresh designating signal REF# to "H" and "L", respectively, at a rising edge of external clock signal K as shown in FIG. 96. When chip select signal E# is set to "H" and refresh designating signal REF# is set to "H" at a rising edge of the external clock signal K, refreshing of the DRAM is stopped. In the refresh cycle, other control signals CH#, CI#, CR# and W# may be at arbitrary states, and the output enable signal G# is set to "H". Therefore, the cache address Ac and array address Aa may be at arbitrary states. External input data D also may be set at an arbitrary state. External output data Q is set to a high impedance state.

Refreshing operation is effected only to the DRAM. Refreshing is not necessary in the SRAM. Therefore, cache (SRAM) can be accessed during the refreshing operation.

Timings where refreshing operation and access to the cache are simultaneously carried out will be described in the following.

No. 8W: Refresh cycle with cache hit writing

Figure 97:
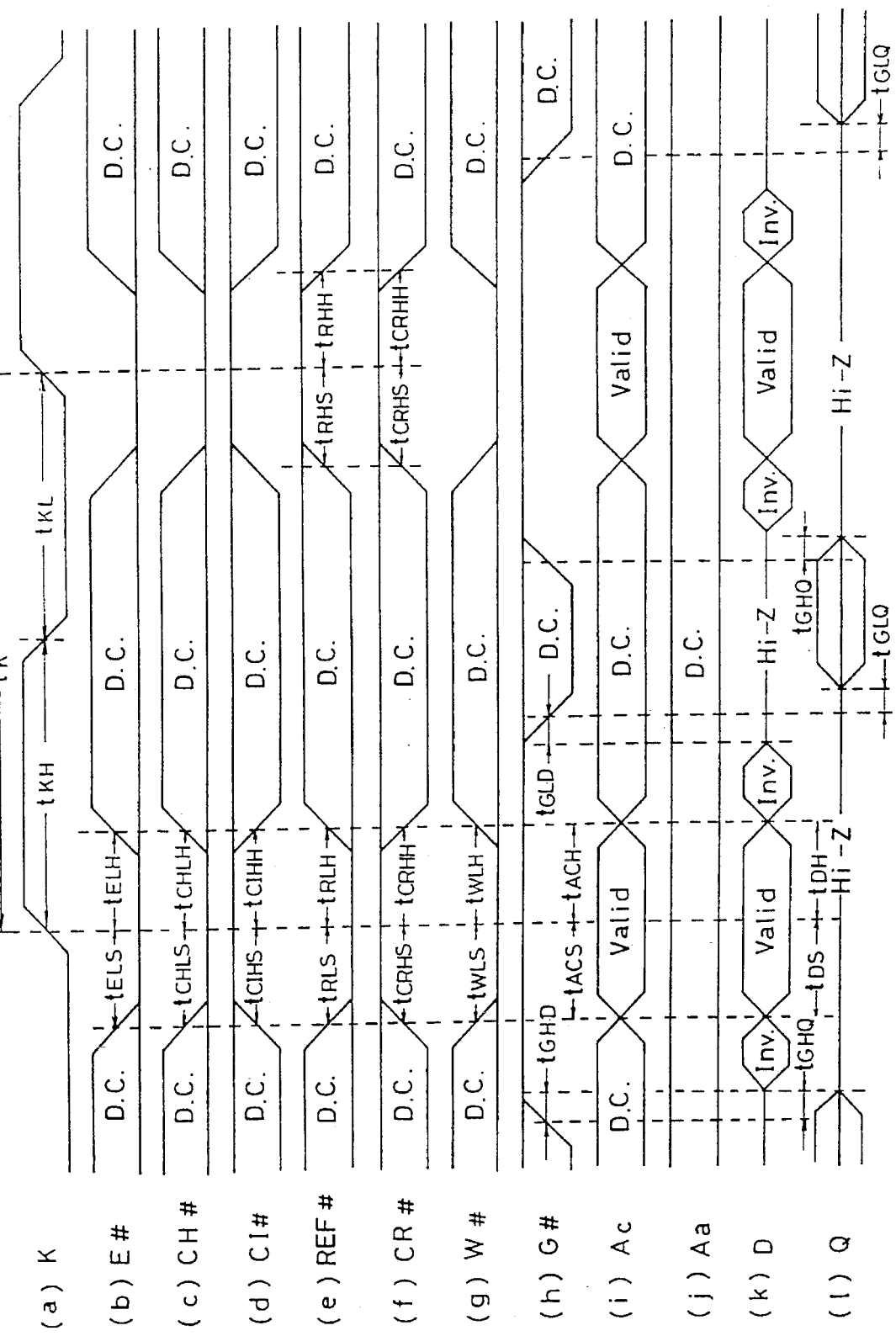

In cycle No. 8W, in parallel to refreshing of the DRAM, writing of data to a corresponding SRAM cell is carried out when a cache hit occurs. Setting of the refresh cycle with the cache hit writing is set by setting chip select signal E#, cache hit signal CH#, refresh designating signal REF# and write enable signal W# to "L" and by setting cache inhibition signal CI# and output enable signal G# to "H" at a rising edge of external clock signal K as shown in FIG. 97. Thus a cache hit write cycle is set and refresh cycle is set.

In the cache (SRAM), external write data D is taken and then written to a corresponding SRAM cell at a rising edge of external clock signal K, in response to active states of the cache hit designating signal CH# and write enable signal W#. In the DRAM, an internal refresh address counter is started by the refresh designating signal REF#, and refreshing operation is carried out in accordance with a refresh address from the counter.

When refresh designating signal REF# is set to "H" at a rising edge of external clock signal K, the cache hit write cycle (cycle No. 1) shown in FIG. 81 only is carried out, and refreshing operation of the DRAM is stopped.

No. 8RT: Refresh cycle with cache hit reading in transparent output mode

In cycle No. 8RT, cache hit reading is carried out in accordance with the transparent output mode, and DRAM is automatically refreshed. The cycle No. 8 is set by setting the chip select signal E#, cache hit signal CH# and refresh designating signal REF# to "L" at a rising edge of external clock signal K, and by setting cache inhibition signal CI#, command register signal CR# and write enable signal W# to "H" as shown in FIG. 98. In SRAM cache, cache address Ac at a rising edge of external clock signal K is taken and a corresponding SRAM cell is selected in response to the designation of cache hit reading. When output enable signal G# falls to "L", valid output data Q is output after a lapse of a predetermined time period.

In the DRAM, auto-refreshing is carried out in response to refresh designating signal REF#. When refresh designating signal REF# is set to "H" at a rising edge of external clock signal K in refresh cycle with cache hit reading, automatic refreshing carried out in response to refresh designating signal REF# is stopped. Therefore, in this case, cache hit read cycle in the transparent output mode which is the same as the cycle No. 2T is carried out.

No. 8RL: Refresh cycle with cache hit read in latch output mode

In cycle No. 8RL shown in FIG. 89, cache hit reading in latched output mode is carried out together with auto-refreshing of the DRAM. Timing conditions of various control signals are the same as those shown in FIGS. 87 and 88. In the latched output mode, when a cache hit occurs, output enable signal G# falls to "L", then data accessed in the previous cycle is output, and successively data accessed in the present cycle is output.

No. 8RR: Refresh cycle with cache hit read cycle in register output mode

In cycle No. 8RR shown in FIG. 100, data reading is carried out in accordance with the cache hit read cycle in the registered output mode, and the DRAM is automatically refreshed. Timing conditions of various control signals are the same as those shown in FIGS. 97 and 98, and hit reading and auto-refreshing are carried out. In this cycle No. 8RR, when output enable signal G# falls to "L", output data selected in the previous cycle is output. Thereafter, output enable signal G# is once raised to "H", and thereafter output enable signal G# is set to "L", in the next clock cycle, and then data of the SRAM cell selected in the present cycle is output.

The transparentoutput mode, latched output mode, registered output mode, masked write mode and D/Q separation mode of the CDRAM can be realized by setting commands for setting desired special function in the command register. Operation cycle for setting commands in the command register will be described in the following.

No. 9: Command register set cycle

FIG. 101 shows timings of various signals in command register set cycle (cycle No. 9). The command registers set cycle is realized by setting chip select signal E#, cache inhibition signal CI#, command register signal CR# and write enable signal W# to "L" at a rising edge of external clock signal K. At this time, any one of four registers WR0 to WR3 of the command register is selected as shown in FIG. 77. Command register WR0 is selected in setting the output mode, and the kind of the output mode is selected dependent on the combination of the input data D at that time. Therefore, at a rising edge of the external clock signal K, a command address Ar and an external write data D are regarded as valid and latched. When 2 bits At0 and Ar1 of the command address AR are both 0 ("L"), the command register WR0 is selected. When upper 2 bits D2 (DQ2) and D3 (DQ3) of 4 bits of external write data D are "0" ("L") and the least significant bit D0 (DQ0) is "0" of 4 bits of external write data D, the transparent output mode is set.

The latched output mode is selected by setting external write data D0 and D1 to "1" ("H") and "0", respectively and by setting remaining 2 bits of external write data D2 and D3 to "0" at a rising edge of external clock signal K. The registered output mode is selected by setting command address At0 and Ar1 to "0", setting external write data D0 and D1 (DQ0 and DQ1) both to "1" and by setting external write data D2 and D3 (DQ2 and DQ3) both "0" at a rising edge of external clock signal K.

In the structure of the command registers shown in FIG. 77, 8 registers are provided, enabling setting of 8 different special modes. The command register RR0 for setting the masked write mode, and the register RR1 for setting D/Q separation mode are selected by setting write enable signal W# to "H" at the timing shown in FIG. 91. Dependent on the value of the command address Ar at this time, a desired mode can be selected.

Figure 102A:
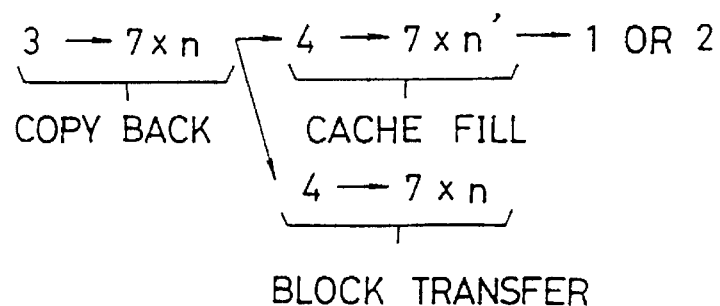
Figure 102B:
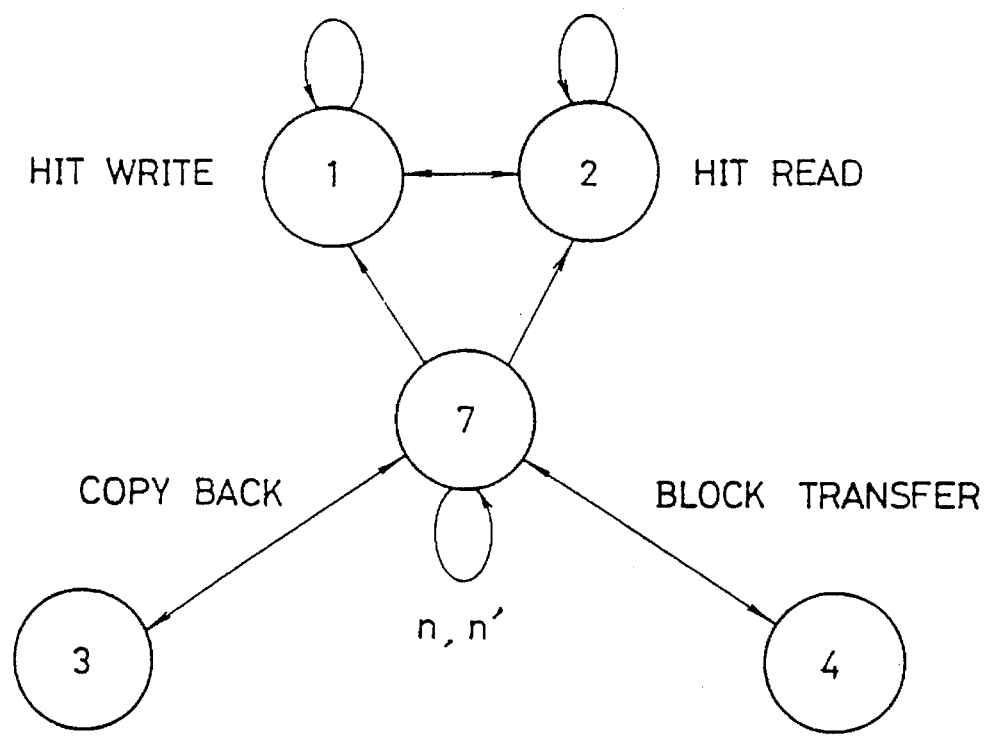

FIGS. 102A and 102B show state transition of the CDRAM at a time of a cache miss (miss hit). FIG. 102A shows a flow of state transition, and FIG. 102B shows state transition between respective cycles. In FIG. 102 the cycles are denoted by cycle numbers.

Referring to FIG. 102A, when a cache miss occurs, a copy back cycle (cycle No. 3) shown in FIG. 85 is carried out at first. Consequently, data transfer mode from the SRAM to DRAM is set. Thereafter, array access cycle (cycle No. 7) shown in FIG. 89 is repeated for n (n=(ta/tk)−1) times. The character ta represents cycle time of the DRAM, and tk represents cycle time of the external clock K. By repeating cycle No. 7 for n times, collective transfer of data blocks from SRAM to DRAM is completed. Thereafter, block transfer cycle (cycle No. 4) shown in FIG. 86 is carried out. Consequently, data transfer mode from DRAM to SRAM is set. By repeating cycle No. 7 for n times successive to the cycle No. 4, transfer of data blocks from DRAM to SRAM is carried out. Thereafter, the DRAM is ready for receiving next access. This state is referred to as a block transfer mode. From this time on, the CPU can access to SRAM or DRAM.

When array active cycle (cycle No. 7) is repeated for n' (n'=(ta/2·tK)−1) times successive to the cycle No. 4, restore operation to the memory cell and RS precharging are not yet completed in the DRAM, and therefore it cannot be accessed. However, in the SRAM, block data has been already transferred from the DRAM in this state, restore is not necessary, and data on the SRAM bit line pair has been established. Therefore, the CPU can access to the SRAM at this state. This state is referred to as a cache fill state. In the cache fill state, the CPU can access only to the SRAM. Either the cache hit write cycle (cycle No. 1) shown in FIG. 81 or cache hit read cycle (cycle No. 2) shown in FIGS. 82 to 84 is carried out after cache fill. The cache hit read cycle (cycle No. 2) may be carried out in transparent output mode, latched output mode or registered output mode. Hit writing can be successively carried out at every clock cycle, and hit read cycle can be successively carried out at every clock cycle. The operation may be switched from the hit read cycle to the hit write cycle. Data transfer may be carried out in accordance with the high speed transfer mode (fast copy back) in which "copy back" and "block transfer" are carried out parallel to each other.

Figures 103A, 103B:
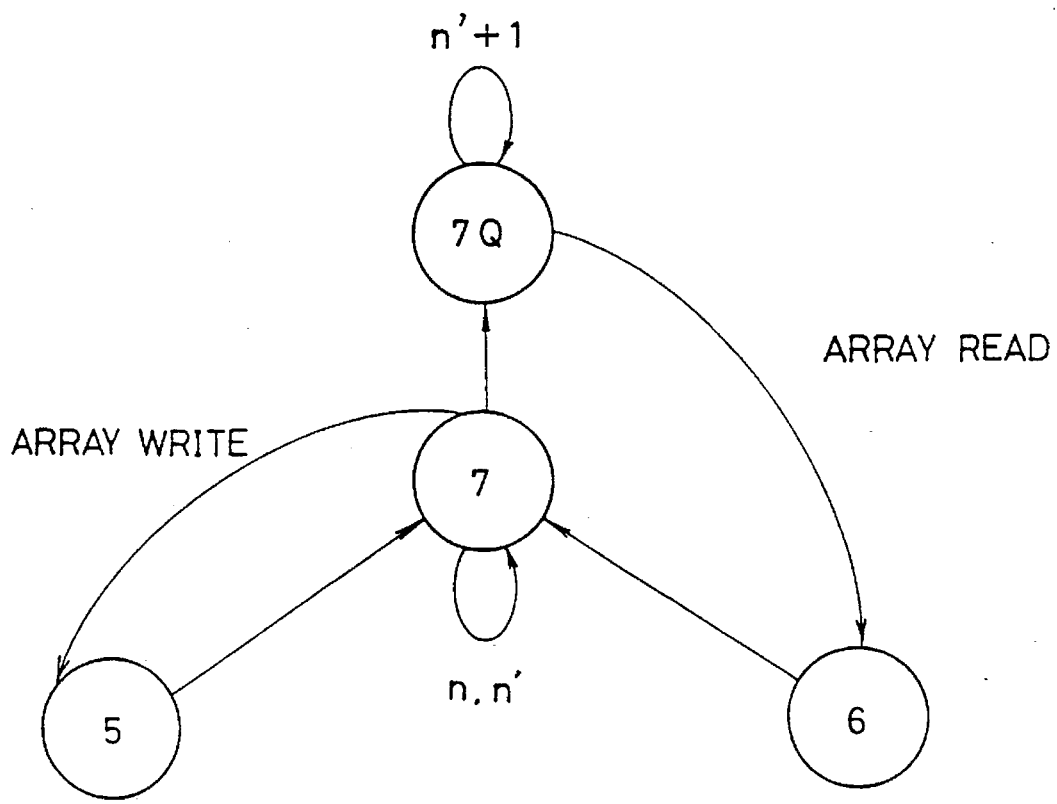

FIGS. 103A and 103B shows state transition at a time of array accessing. FIG. 103A (A) shows a flow of state transition in array access, and FIG. 103B (B) shows state transition between respective cycles. Array access includes array writing to write data to the array, and array read for reading data from the array. In array writing, array write cycle (cycle No. 5) shown in FIG. 83 is carried out. Successive to the cycle No. 5, the array active cycle of cycle No. 7 is repeated for n times to write data to the DRAM array.

In array reading, the array read cycle (cycle No. 6) shown in FIG. 88 is carried out, and access to the DRAM is enabled. After the array read cycle (cycle No. 6), the array active cycle shown in FIG. 89 (cycle No. 7) is repeated for n' times. At this state, data cannot be read from DRAM. Subsequent to the cycle No. 7, the array active cycle for data output (cycle No. 7Q) shown in FIGS. 90 to 92 is repeated for n'+1 times. The cycle No. 7Q may be the array active cycle for transparent output, array active cycle with latch output, or array active cycle with registered output.

By setting output enable signal G3 to "L" at the last cycle of the cycle No. 7Q, data can be read from the array. The cycle times of the array writing and array reading seem to be different from each other. However, n=n'+1, and therefore reading and writing of data from and to the array can be carried out in the same clock cycles. After the array writing operation or array reading operation, array writing or array reading can be successively carried out.

Figure 104A:
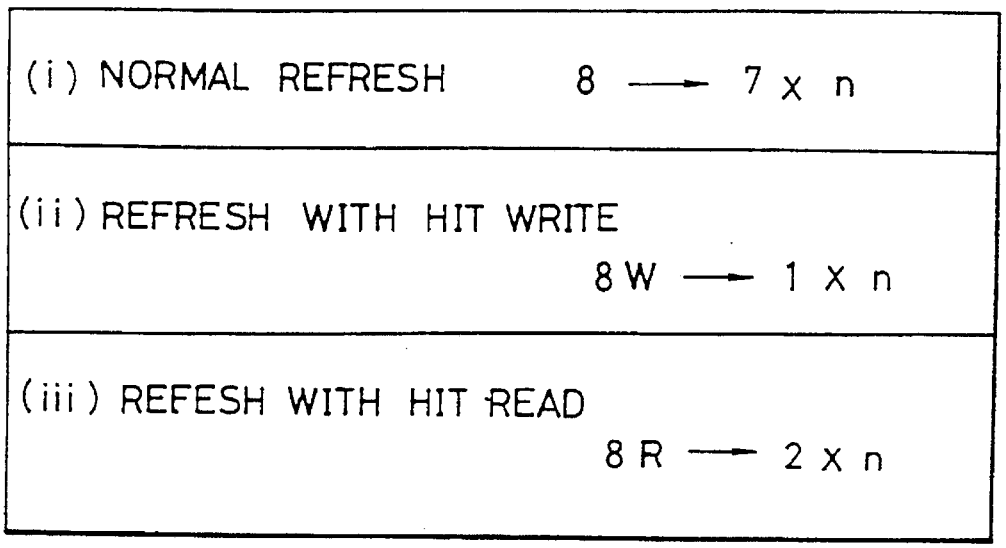
Figure 104B:
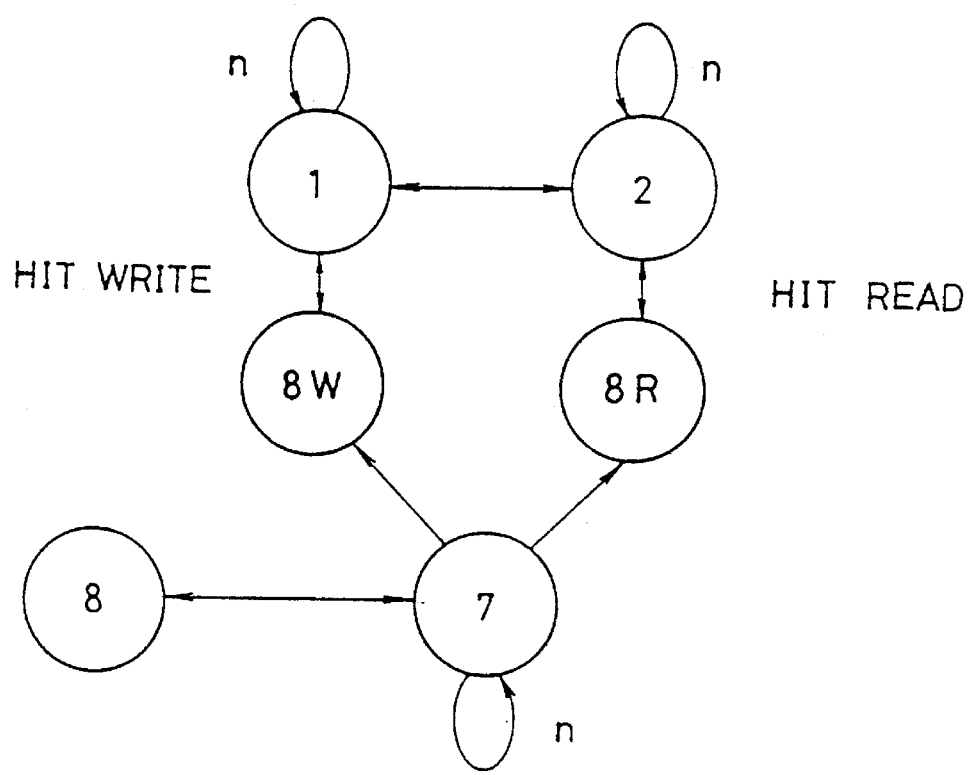

FIGS. 104A and 104B show the state transition at a time of refreshing. FIG. 104A is a flow of state transition of the refreshing operation, and FIG. 89B shows state transition between respective cycles at the time of refreshing.

In normal refreshing in which auto-refreshing of DRAM only is carried out and access to SRAM is not carried out, first the refresh cycle (cycle No. 8) shown in FIG. 96 is carried out. Thereafter, the array active cycle (cycle No. 7) shown in FIG. 84 is repeated for n times. Consequently, one auto-refreshing operation in accordance with the refresh address from the refresh counter contained in the CDRAM is completed.

In refreshing with hit writing, the refresh cycle with cache hit writing shown in FIG. 97 (cycle No. 8W) is carried out at first. Then, auto-refreshing of the DRAM is carried out for the n successive clock cycles. During this period, the cache hit write cycle shown in FIG. 81 can be executed by the CPU for n times.

In refresh cycle with hit reading, the refresh cycle with cache hit reading shown in FIGS. 98 to 100 (cycle No. 8R) is carried out. Consequently, auto-refreshing of the DRAM is started, and auto-refreshing is carried out for n clock cycles in the DRAM. CPU can execute hit reading during the n clock cycles. The output mode of the cycle No. 8R may be transparent output mode, latched output mode or registered output mode.

[Second Embodiment]

Basic constructions, arrangements and operations of CDRAM of the present invention have been described. Various modifications and additional functions can be considered, which will be described as a second embodiment in the following.

In the second embodiment, control signal CI# (cache access inhibiting signal) and a command set/burst enable signal CR#/BE# applied to the pin number 4 are defined as control signals CC1 and CC2. These signals have the same function as in the first embodiment described above, and only the names of the signals are changed.

[low power and high speed operations modes]

It is desirable to change the clock frequency according to the situation of accessing to CDRAM in terms of power consumption. For example, when only DRAM in CDRAM is successively accessed, no fast clock is needed as its operating speed is slow. So, a low clock is preferable in such situation in terms of low power consumption. If SRAM cache is successively accessed, a fast clock should be applied in terms of fast operationability. CDRAM should operate as fast as possible with least power consumption regardless of clock frequency. In order to implement such operating characteristics, DRAM address strobing timing is varied according to the clock frequency. More specifically, CDRAM is adapted to include two operation modes, i.e. low power consumption mode in which DRAM row address is latched at a leading edge of the clock K while DRAM column address is latched at the following trailing edge of the clock K, and high speed mode in which DRAM row address is latched at a leading edge of the clock K while DRAM column address is latched at another leading edge of the clock K. In the following, structure for implementing such changing of address strobe timing is described with reference to FIGS. 105 through 118.

FIG. 105 is a block diagram showing functionally the whole structure of the CDRAM in accordance with the second embodiment. In the CDRAM shown in FIG. 105, an address generating circuit 360 which takes external address signals Ac and Aa and generates internal addresses int-Ac and int-Aa in accordance with internal chip enable signal E, internal cache hit designating signal /CH and an internal clock signal int-K from clock buffer 254 is provided in place of address buffer 260 shown in FIG. 32. By adjusting timings of taking addresses Ac and Aa in address generating circuit 360, the CDRAM 5000 can be set to either one of low power consumption mode and high speed operation mode.

A row address signal and a column address signal are externally applied time divisionally to provide the DRAM internal address signal int-Aa applied to DRAM row decoder 102 and DRAM column decoder 103. By adjusting timings for taking these address signals, the speed of operation of DRAM can be adjusted. Address generating circuit 360 generates an internal row address signal and an internal column address signal while adjusting the timing for taking the external DRAM address signal Aa in accordance with an internal control signal K (int-K) and internal control signals E and /CH.

FIG. 106 is a diagram of signal waveforms showing the operation of circuitry related to the portion generating the internal address signal int-Aa for the DRAM of this address generating circuit 360. The operation of address generating circuit 360 will be described with reference to FIG. 106.

An operation mode in which high speed operation is carried out with low power consumption (hereinafter referred to as a low power consumption mode) is set by setting, at time T1, the internal control signals E and CH to "H" and "L", respectively, at a rising edge of the clock signal K. At this time, address generating circuit 360 takes external address signal Aa as an internal row address signal int-Aar in response to the rising edge of the clock signal K. Then, it takes external address signal Aa in response to a falling edge of the clock K and generates an internal column address signal int-Aac. The details of this operation is as follows.

At time T1, the external address signal Aa has been already applied to address generating circuit 360 at the rising edge of the external clock signal K. At this time, in accordance with the combination of the states of the signals E and CH, an internal row address strobe signal RAS for taking a row address signal is generated and set to an active state of "L". Since internal row address strobe signal /RAS is a signal of active "L", address generating circuit 360 latches external address signal Aa and thereafter continuously generates internal row address signal int.Aar and applies the same to DRAM row decoder 102 (time T2).

When internal row address strobe signal /RAS is at "L" at a falling edge of the external clock signal K at time T3, internal column address strobe signals CAL and /CAL are generated. In response, address generating circuit 360 takes and latches the external address signal Aa as an internal column address signal (time T4), and applies the same to DRAM column decoder 103.

The scheme shown in FIG. 106 which DRAM row address signal int-Aar and DRAM column address signal int.Aac are taken by a single pulse of clock signal K enables faster operation of the DRAM compared with the structure of a common clock synchronized type semiconductor memory device such as shown in FIG. 107 in which operation is effected only at the rising edge of the external clock signal.

Namely, as shown in FIG. 107, in the low power consumption mode, the row address signal and the column address signal for the DRAM are taken at time TA, at which the operation for the DRAM is started.

If all operations are determined at the same timing (rising edge) of the clock signal K as in the conventional clock synchronized type semiconductor memory device, the column address signal for the DRAM is taken at the rising edge of the next clock signal K (time TB), and from this point of taking the column address signal, the DRAM starts its operation. Therefore, even when power consumption is given priority than the speed of operation of the CDRAM and the period of the clock signal K is made longer or the clock signal K is generated intermittently in order to reduce power consumption of the CDRAM, the start point of operation of the DRAM can be made earlier by the time period (TB-TA) between TB and TA, compared with the structure of the conventional clock synchronized type semiconductor memory device. Namely, a clock synchronized type semiconductor memory device which can be operated at high speed even in the low power consumption mode can be provided.

As shown in FIG. 105, internal operations of CDRAM are all controlled by the external control signals. Internal row address strobe signal /RAS and internal column address strobe signals CAL and /CAL shown in FIG. 106 are control signals which simply determines the timing of taking DRAM addresses in address generating circuit 360.

Assume that the external clock signal K is generated intermittently in order to further reduce power consumption, while period of the external clock signal K is made longer so as to meet the demand of low power consumption. In this case also, by resetting the taking operation of address generating circuit 360 by utilizing internal row address strobe signal /RAS, a CDRAM which can minimize an influence of possible noise generated in such intermittent operation can be provided. Here, the intermittent operation mode corresponds to a mode in which period of the clock signal K is made longer temporarily, or a mode in which period of the external clock signal K is variable. A margin for noise pulses generated when the period of the external clock signal is long will be described.

FIG. 108 is a diagram for comparison between the conventional operation mode and the low power consumption mode. In the low power consumption mode, if a noise pulse NZ is generated in the external clock signal K, external address signal Aa is taken in the CDRAM at time TC, then external address signal Aa is taken as an internal column address signal at time TD, and the DRAM starts its operation from time TD. However, if the structure is adapted to reset address generating circuit 360 after the lapse of a prescribed time period, the operation of the DRAM terminates automatically at time TE, and malfunction caused by the noise pulse NZ can be prevented. More specifically, when external clock signal K rises at time TEa, the operation of the DRAM has been already completed and it is returned to the precharge state. Accordingly, operations in accordance with the combinations of the states of various control signals at the rising edge of the external clock signal K can be carried out, and therefore a CDRAM having sufficient margin for the malfunction of the noise pulse NZ can be provided.

When the row address signal and the column address signal are to be taken only at the rising edge of the external clock signal K as in the normal mode, and if the row address signal is erroneously taken in response to a rising edge of the noise pulse NZ at time TC, the CDRAM is kept in a waiting state for the input of the column address signal until the next rising point TEa of the external clock signal K. At this time, the CDRAM takes address signal Aa, at time TEa when the accurate external clock signal K rises, as a column address signal and starts its operation. Therefore, when an accurate external clock signal K is applied, an erroneous operation is effected. Namely, because of the longer period of the external clock signal K to reduce power consumption, margin for the noise is lost in the conventional operating mode.

As described above, by resetting the DRAM after the lapse of a predetermined time period (for example, time required till completion of the sensing operation in the DRAM array) from taking of the DRAM column address signal in address generating circuit 360, sufficient margin for the noise can be provided even if the external clock signal K is applied intermittently.

FIG. 109 shows an example of a specific structure of address generating circuit 360 shown in FIG. 105. Referring to FIG. 109, address generating circuit 360 includes a row address strobe signal generating circuit 2601 responsive to control signals E and CH and to external clock signal K for generating an internal row address strobe signal /RAS; a column address strobe signal generating circuit 2602 responsive to internal row address strobe signal /RAS from row address strobe signal generating circuit 2601 and to clock signal K for generating internal column address strobe signals CAL, /CAL; a row address latch 2603 responsive to internal row address strobe signal /RAS for taking external address signal Aa to generate an internal row address signal; a column address latch 2604 responsive to internal row address strobe signal /RAS and internal column address strobe signals CAL and /CAL for taking external address signal Aa to generate an internal column address signal; and a reset signal generating circuit 2605 responsive to internal row address strobe signal /RAS for generating a reset signal after a lapse of a predetermined time period (for example, period of active state of the DRAM) to apply the same to row address strobe signal generating circuit 2601. Here, external clock signal K and internal clock signal int-K are substantially the same signal, and in the following, internal clock signal is simply referred to as K.

The row address strobe signal generating circuit 2601 generates internal row address strobe signal /RAS when control signal E is at "H" and control signal CH is aL "L" at a rising edge of (internal) clock signal K. Column address strobe signal generating circuit 2602 generates internal column address strobe signals CAL, /CAL in response to a falling edge of clock signal K. Column address strobe signal generating circuit 2602 is reset when internal row address strobe signal /RAS rises to inactive "H".

Row address latch 2603 is set to a latch state when internal row address strobe signal /RAS attains "L" and outputs continuously the latched signal as internal row address signal regardless of the state of external address signal Aa.

Column address latch 2604 takes external address Aa in response to internal row address strobe signal /RAS, and outputs applied address signal continuously as internal column address signal in response to column address strobe signals CAL, /CAL. The address generating circuit shown in FIG. 109 is related to DRAM addresses. At a time of cache hit in which SRAM array is accessed, the row address signal and the column address signal are simultaneously applied to SRAM address generating circuit (not shown). Therefore, the row address signal and the column address signal for SRAM are taken at the same timing of the external clock signal. The operation of the address signal generating circuit shown in FIG. 109 is the same as that described with reference to the diagram of signal waveforms of FIG. 106, and therefore description thereof is not repeated. Specific structure of respective circuits in FIG. 109 will be described.

FIG. 110 shows a specific structure of row address strobe signal generating circuit 2601 shown in FIG. 109. Referring to FIG. 100, row address strobe signal generating circuit 2601 includes an AND circuit 2610 receiving the clock signal K, control signal E and control signal /CH (inverted signal of CH); and an OR circuit 2611 receiving at one input, the output from AND circuit 2610, and receiving at the other input, a Q output of a flipflop (FF) 2612. Flipflop 2612 includes a set input S receiving an output from OR circuit 2611, a reset input R receiving a reset signal RS from reset signal generating circuit 2605 shown in FIG. 109, a Q output and /Q output. Q output and /Q output provide signals complementary to each other.

Internal row address strobe signal /RAS is generated from /Q output from flipflop 2612. Generally, flipflop 2612 has a circuit structure including two NOR circuits cross coupled to each other. The flipflop 2612 is set when "H" signal is applied to set input S, and outputs a signal at "L" from /Q output. When a signal at "H" is applied to reset input R, it is reset and signal output from /Q attains "H". Operation of row address strobe signal generating circuit 2601 shown in FIG. 110 will be described with reference to the diagram of waveforms of FIG. 106.

When control signal E is at "H" and control signal C is at "L" when clock signal K rises to "H", then the output from AND circuit 2610 attains to "H". Consequently, the output from OR circuit 2611 rises to "H" and flipflop 2612 is set. Then, internal row address strobe signal /RAS provided as an output from /Q output of flipflop 2612 falls to "L". At this time, Q output of flipflop 2612 attains "H" and output from OR circuit 2611 attains "H". After a lapse of a predetermined time period from the generation of internal row address strobe signal /RAS, a reset signal is generated from reset signal generating circuit 2605 (see FIG. 109), flipflop 2612 is reset and row address strobe signal /RAS rises to "H". Therefore, the row address generating circuit 360 is ready to receive the next address.

When a reset signal of "H" is applied while "H" signal being applied to set input S of flipflop 2612 having NOR gates cross coupled to each other, Q output and /Q output may both attain "L". At this time, since Q output of flipflop 2612 is applied to one input of OR circuit 2611, the output of OR circuit 2611 attains "L". If reset signal RS has an appropriate pulse width, flipflop 2612 is kept at a stable reset state. In order to ensure operation of flipflop 2612 at this time, a one shot pulse signal may be generated when Q output of flipflop 2612 attains to "H" to apply the one shot pulse signal to OR circuit 2611 in place of Q output of flipflop 2612. Alternatively, a circuit generating a one shot pulse having an appropriate pulse width in response to an output from AND circuit 2610 may be provided to apply the pulse from this one shot pulse generating circuit to the set input of flipflop 2612.

FIG. 111 shows an example of a specific structure of column address strobe signal generating circuit 2602 shown in FIG. 109. Referring to FIG. 111, the column address strobe signal generating circuit 2602 includes an AND circuit 2621 receiving at its one input clock signal K; an inverter circuit 2622 receiving internal row address strobe signal /RAS; and a flipflop 2623 having a set input /S receiving an output from AND circuit 2621, a reset input /R receiving an output from inverter circuit 2622, a Q output and /Q output. /Q output of flipflop 2623 is applied to the other input of AND circuit 2621. Column address strobe signal /CAL is generated from /Q output of flipflop 2623, and column address strobe signal CAL is generated from the inverter circuit 2624 receiving /Q output of flipflop 2623.

Flipflop 2623 includes two NAND circuits cross coupled to each other, for example. It is set when a signal at "L" is applied to set input /S, and it is reset when a signal at "L" is applied to reset input /R. The operation will be described.

Assume that flipflop 2623 is reset. At this time, /Q output of flipflop 2623 is at "H", and output from AND circuit 2621 is at "H" in response to the rise of clock signal K. When clock signal K falls to "L", the output from AND circuit 2621 falls to "L", flipflop 2623 is set, column address strobe signal /CAL from /Q output thereof attains "L" and column address strobe signal CAL from inverter circuit 624 attains "H". Row address strobe signal /RAS attains to "L" in response to the rise of clock signal K, and output of inverter circuit 2622 attains "H".

After a lapse of a predetermined time period, internal row address strobe signal /RAS rises from "L" to "H", and the output from inverter circuit 2622 falls to "L". Consequently, flipflop 2623 is reset, column address strobe signal /CAL attains "H" and column address strobe signal CAL attains "L".

At this time, signals to set input /S and reset input /R of flipflop 2623 may be both "L". However, such state can be prevented by providing a structure for resetting /Q output of flipflop 2623. A circuit structure for setting Q output of flipflop 2623 as well may be provided.

Alternatively, a structure for generating a one shot pulse signal having a predetermined pulse width in response to a fall of clock signal K to provide the same to set input /S of flipflop 2623 may be used as a simple method. At this time, the generated one shot pulse signal falls from "H" to "L" upon generation.

FIG. 112 shows an example of a specific structure of row address latch 2603 shown in FIG. 109. Referring to FIG. 102, row address latch 2603 includes an inverter circuit 2631 receiving external address signal Aa; a clocked inverter 2632 receiving an output from inverter circuit 2631; an inverter circuit 2633 receiving an output from clocked inverter 2632; and a clocked inverter 2634 receiving an output from inverter circuit 2633.

Operation of clocked inverter 2632 is controlled by internal row address strobe signals RAS and /RAS. When internal row address strobe signal RAS is at "H" and internal row address strobe signal /RAS is at "L", clocked inverter 2632 is set to an output high impedance state, which is an inactive state. When internal row address strobe signal RAS is at "L" and internal row address strobe signal /RAS is at "H", clocked inverter 2632 is rendered active, and it inverts an output from inverter circuit 2631 and transmits the same to a node N10.

Clocked inverter 2634 is rendered active when internal row address strobe signal /RAS is at "L" and internal row address strobe signal RAS is at "H" and it functions as an inverter. When internal row address strobe signal RAS is at "L" and internal row address strobe signal /RAS is at "H", clocked inverter 2634 is set to an output high impedance state, which is an inactive state. Therefore, when clocked inverter 2634 is active, inverter circuit 2633 and clocked inverter 2634 constitute a latch circuit, and continuously outputs signal potential appearing on the node N10. Internal row address signal int-Ara is generated from node N10. The operation will be described in the following.

When internal row address strobe signal /RAS is at inactive "H", clocked inverter 2632 functions as an inverter. At this time, clocked inverter 2634 is at the output high impedance state. Therefore, at this time, external address signal Aa is transmitted to node N10. When clocked inverter 2632 is set to the output high impedance state, and clocked inverter 2634 is rendered active to function as an inverter. At this state, signal potential appearing at node N10 when the internal row address strobe signal /RAS has been "H" is latched by inverter circuit 2633 and clocked inverter 2634, and it is continuously output as internal row address signal int.Ara.

FIG. 113 shows an example of a specific structure of column address latch 2604 shown in FIG. 109. Referring to FIG. 103, column address latch 2604 includes an NOR circuit 2641 receiving at one input external address signal Aa and at the other input internal row address strobe signal /RAS; a clocked inverter 2642 receiving an output from NOR circuit 2641; an inverter circuit 2643 receiving an output from clocked inverter 2642; and a clocked inverter 2644 receiving an output from inverter 2643.

Clocked inverter 2642 is rendered active and serves as an inverter when internal column address strobe signal CAL is at "L" and internal column address strobe signal /CAL is at "H". When internal column address strobe signal CAL is at "H" and internal column address strobe signal /CAL is at "H", clocked inverter 2642 is rendered inactive and set to the output high impedance state. Clocked inverter 2644 is rendered active and serves as an inverter when internal column address strobe signal /CAL is at "L" and internal column address strobe signal CAL is at "H". When internal column address strobe signal CAL is at "L" and internal column address strobe signal /CAL is "H", clocked inverter 2644 is rendered inactive and set to the output high impedance state. When clocked inverter 2644 is active, inverter circuit 2643 and clocked inverter 2644 constitute a latch circuit, which latches a signal potential appearing at node N20. An internal column address signal int-Arc is generated from node N20. The operation will be described.

When internal row address strobe signal /RAS is at "H", an output from NOR circuit 2641 is at "L". Since internal column address strobe signals CAL and /CAL have not yet been generated at this time, clocked inverter 2642 serves as an inverter and transmits a signal at "H" to node N20.

When internal row address strobe signal /RAS falls to "L", NOR circuit 2641 functions as an inverter. At this time, NOR circuit 2641 outputs an inverted signal of external address signal Aa. After a predetermined time period from a fall of the internal row address strobe signal /RAS to "L", internal column address strobe signals CAL and /CAL are generated, clocked inverter 2642 is set to the output high impedance state, and clocked inverter 2644 is rendered active and functions as an inverter. Consequently, signal potential appearing at node N20 when internal column address strobe signals CAL and /CAL are generated is continuously output as internal column address signal int.Arc.

The structures shown in FIGS. 112 and 113 correspond to portions related to 1 bit of external address signal Aa. The circuit shown in FIGS. 112 and 113 are provided for each bit of each external address signal Aa.

Reset signal generating circuit 2605 shown in FIG. 109 may have any circuit structure provided that reset pulse RS is generated after a predetermined time period from detection of a fall of internal row address strobe signal /RAS to "L". The reset signal generating circuit can be readily realized by a circuit structure including a circuit for providing a delay in row address strobe signal /RAS and a circuit for generating a one shot pulse signal in response to the output from the delay circuit.

The reset signal generating circuit 2605 may have a structure that the reset signal is generated from DRAM array driving circuit 260 shown in FIG. 105. At this time, DRAM array driving circuit 260 generates a signal for activating circuitry of a portion related to row selecting operation of the DRAM array, and the reset pulse may be generated at a time point when the operation of the circuitry related to row selection is completed. For example, a structure generating reset pulse RS after a predetermined time period from the generation of a sense amplifier activating signal for sensing operation in DRAM array 101 may be employed.

A structure for setting CDRAM to operation modes dependent on intended use, that is, high speed operation mode or low power consumption mode, will be described. Command registers are used for setting such modes.

As shown in FIG. 114, operation mode of the CDRAM is set dependent on data values of data input pins DQ3 (D3) and DQ2 (D2) when a register WR0 is selected.

When DQ3 (D3) and DQ2 (D2) are both set to "0", a first high speed mode is designated. By setting DQ3 (D3) and DQ2 (D2) to "0" and "1", respectively, a low power consumption mode is designated. When DQ3 (D3) and DQ2 (D2) are set to "1" and "0", respectively, a second high speed operation mode is designated. The input terminal is represented as DQ (D) when register WR0 is set, since pin function differs dependent on whether DQ separation mode is designated by a register RR1 or masked write mode is selected by a register RR0. Operation modes realized by data AB applied to data DQ3 (D3) and DQ2 (D2) of register WR0 will be described.

FIG. 115 shows a high speed operation mode of the CDRAM. The first high speed operation mode is selected by setting upper 2 bits of data AB of register WR0 both to "0". In this state, a row address signal (ROW) is taken at first at a rising edge of the first clock signal K (#1) of the clock signal K, and then, a column address signal (COL) is taken at a rise of a third clock signal K (#3). The operation of the CDRAM is started from a falling edge of the third clock signal #3.

The second high speed operation mode is selected by setting the upper 2 bits of data AB of the command register WR0 to "1" and "0". In the second high speed operation mode, row address signal (ROW) is taken at a rising edge of the first clock signal K (#1), and column address signal (COL) is taken at a rising edge of the successively applied second clock signal K1 (#2).

Therefore, when the DRAM array is to be accessed at a cache miss of the CDRAM or the like, speed of operation can be set at an optimal value dependent on the intended use. Since time required for accessing the DRAM array can be set at an optimal value dependent on the object of processing, flexible system structure is enabled.

FIG. 116 is a diagram of signal waveforms showing an operation in which CDRAM operates in the low power consumption mode. The low power consumption mode is designated by setting upper 2 bits of AB of command register WR0 shown in FIG. 114 to "0" and "1", respectively. In the low power consumption mode, row address signal (ROW) is taken at a rising edge of clock signal K, and column address signal (COL) is taken at a falling edge of clock signal K. In this case, row and column address signals are taken responsive to a single pulse. Even if the clock signal K is generated intermittently or the period of the clock signal K is made longer temporarily and therefore the period of the clock is made longer, row and column address signals can be taken by a single clock signal. Since DRAM starts its operation immediately after the column address signal is taken, a CDRAM which operates at high speed with low power consumption can be provided.

FIG. 117 shows a circuit structure for setting a timing for taking external address signal Aa dependent on the operation mode. The circuit structure shown in FIG. 107 is used as column address strobe signal generating circuit 2602 shown in FIG. 109. More specifically, the column address strobe signal generating circuit shown in FIG. 117 is used instead of column address strobe signal generating circuit shown in FIG. 111. The above described respective circuits may be used for other circuit structures. Referring to FIG. 117, column address strobe signal generating circuit 2602' includes an AND circuit 2701 receiving, at its one input, clock signal K; and a flipflop 2702 receiving an output from AND circuit 2701 at its set input /S1 and internal column address strobe signal /RAS at its reset input /R1 through an inverter circuit 2709. An output /Q1 of flipflop 2702 is applied to the other input of AND circuit 2701. Flipflop 2702 is set or reset when a signal at "L" is applied to input /S1 or /R1.

Circuit 2602' further includes an OR circuit 2703 receiving at one input the clock signal K, an OR circuit 2710 receiving output /Q1 of flipflop 2702 and internal row address strobe signal /RAS; and a flipflop 2704 having a set input S2 receiving an output from OR circuit 2703 and a reset input R2 receiving an output from OR circuit 2710. An output Q2 of flipflop 2704 is applied to the other input of OR circuit 2703. Flipflop 2704 is set when an output from OR circuit 2703 rises to "H", and it is reset when an output from OR circuit 2710 rises to "H".

Circuit 2602' further includes an AND circuit 2705 receiving, at one input, clock signal K; an AND circuit 2711 receiving an output Q2 of flipflop 2704 and internal row address strobe signal RAS from inverter circuit 2709; and a flipflop 2706 receiving at a set input /S3 an output from AND circuit 2705 and at a reset input /R3 an output from AND circuit 2711. An output Q3 of flip flop 2706 is applied to the other input of AND circuit 2705. Flipflop 2706 is set in response to a fall of a signal applied to set input /S3, and it is reset in response to a fall of a signal applied to reset input /R3.

Circuit 2602' further includes an OR circuit 2707 receiving, at one input, clock signal K; an OR circuit 2712 receiving an output /Q3 of flipflop 2706 and internal row address strobe signal /RAS; and a flipflop 2708 receiving at a set input S4 an output from OR circuit 2707 and at a reset input R4 an output from OR circuit 2712. An output Q4 of flipflop 2708 is applied to the other input of OR circuit 2707. Flipflop 2708 is set in response to a rise of a signal applied to set input S4, and it is reset in response to a rise of a signal applied to reset input R4.

Column address strobe signal generating circuit 2602' further includes an AND circuit 2715 receiving an Q2 output from flipflop 2704 and data B (corresponding to DQ2 shown in FIG. 114) set in register WR0; an inverter circuit 2713 receiving an output /Q1 from flipflop 2702; an AND circuit 2714 receiving an output from inverter 2713 and data A (corresponding to data DQ3 shown in FIG. 104) set in register WR0; an OR circuit 2716 receiving an output from AND circuit 1714, an output from AND circuit 2715 and an output Q4 of flipflop 2708; and an inverter circuit 2717 receiving an output from OR circuit 2716. Column address strobe signal CAL is generated from OR circuit 2716, and column address strobe signal /CAL is generated from inverter circuit 2717. The operation will be described with reference to the diagram of signal waveforms of FIG. 118.

The operation when low power consumption mode is set will be described. At this time, data A is "0" ("L"), and data B is "1" ("H"). In this state, an output from AND circuit 2714 is "L". Flipflops 2702, 2704, 2706 and 2708 are at reset state. When external clock signal K rises for the first time, an output from AND circuit 2701 attains "H". At this time, in flipflop 2702, only a signal applied to set input /S1 rises from "L" to "H", and therefore it is kept at the reset state. In response to a rise of clock signal K, internal row address strobe signal RAS falls to "L". At this time, since flipflop 2702 is kept at the reset state, output /Q1 of flipflop 2702 is at "H", and therefore output from OR circuit 2710 is also at "H".

Even when output from OR circuit 2703 rises to "H" in response to a rise of clock signal K, flipflop 2704 is set by the output from OR circuit 2710, so that the output Q2 attains "H". At this time, the output from AND circuit 2711 is at "L", and the output from OR circuit 2712 is at "H" (the output /Q3 of flipflop 2703 is at "H"), so that flipflops 2706 and 2708 are also maintained at the same state as the reset state. Therefore, in this state, an output from AND circuit 2715 is at "L" and the output from OR circuit 2716 is also at "L".

When clock signal K falls to "L", the output from AND circuit 2701 falls to "L", flipflop 2702 is set, and output /Q1 of flipflop 2702 falls from "H" to "L". In response, the output from inverter circuit 2713 rises to "H". Since data B is at "H" potential level, the output from AND circuit 2715 rises to "H" in response to the fall of output /Q1 of flipflop 2702 to "L". Consequently, the output from OR circuit 2716 rises, internal column address strobe signal CAL attains "H" and internal column address strobe signal /CAL falls to "L". Consequently, low power consumption mode in which row address signal and column address signal are taken at the rising and falling edges of one pulse (#1) of clock signal K can be realized.

A second high speed operation mode in which a row address signal and a column address signal are taken at rising edges of respective clock signals will be described. At this time, data A is set to 1 ("H") and data B is set to 0 ("L"). At this time, the output from AND circuit 2715 is fixed at "L". The output from AND circuit 2714 attains "H" when output Q2 of flipflop 2704 rises to "H". Output Q2 of flipflop 2704 rises to "H" when flipflop 2704 is released from the reset state and the output from OR circuit 2703 rises to "H". More specifically, flipflop 2704 is set when the output of OR circuit 2703 attains "H" in response to a rise of clock signal K (#2) which is applied after flipflop 2702 is set and /Q1 output thereof attains "L". Therefore, in the second high speed operation mode, column address strobe signal CAL is set to "H" and internal column address strobe signal /CAL is set to "L" at a rising edge of the second clock signal K (#2). Thus the second high speed operation mode is realized.

A first high speed operation mode in which column address is taken at a rising edge of the third clock signal K (#3) will be described. In this case, data A and B are both set to "0". In this state, outputs from AND circuits 2714 and 2715 are both "L". Output Q2 of flipflop 2704 rises to "H" in response to the second rise (#2) of the clock signal K. Consequently, the output from AND circuit 2711 attains "H" and flipflop 2706 is released from the reset state. In response to the second fall (#2) of the clock signal K, the output from AND circuit 2705 falls to "L", flipflop 2706 is set, and output Q3 of flipflop 2706 falls to "L". Since output /Q3 of flipflop 2706 falls to "L", the output from OR circuit 2712 attains "L", and flipflop 2708 is released from the reset state. When the output from OR circuit 2707 rises to "H" at a third rise (#3) of the clock signal K, the flipflop 2708 is set, and the potential of output Q4 thereof rises to "H". Consequently, the output of OR circuit 2716 attains "H". Thus the first high speed operation in which row address signal is taken at the rise of the first clock signal K and column address signal is taken at a rise of the third clock signal K is realized.

In any of the above described operation cycle modes, when internal row address strobe signal /RAS rises to "H" after a lapse of a predetermined time period, flipflops 2702, 2704, 2706 and 2708 are all reset. Flipflops 2702, 2704, 2706 and 2708 have the same structure as flipflops 2612 and 2623 shown in FIGS. 110 and 111.

As described above, since the CDRAM operates in synchronization with external clock signal K, delay of cycle time derived from skews of addresses and the like can be prevented, and accurate control can be effected, compared with a method in which internal clock signals are generated by using an address transition detecting circuit.

In addition, by arbitrarily setting timings for taking the column address of the DRAM, a CDRAM which can flexibly corresponds to applications in which low power consumption is given priority and to applications in which high speed operation is given priority can be provided.

The structure for changing timings for taking the column address is not limited to apply the CDRAM and any semiconductor memory device of address multiplexing type which operates in synchronization with clock signals can be used to provide the same effect. A structure in which a row address signal and a column address signal are applied to separate pin terminals may be used.

[Specific Operation Cycles]

CDRAM with a low power and a high speed operation modes can provide various operation cycles similar to those shown in FIGS. 81 through 84B. The relationship between operation cycles and external control signals is summarized in a table of FIG. 119 and respective operating cycles for the low power consumption mode and the high speed operation mode are described with reference to FIGS. 120 through 161.

FIG. 119 is a table showing operation modes of the CDRAM in accordance with the second embodiment of the present invention and states of control signals for designating respective operation modes. The operation modes of the CDRAM are set by various combinations of external control signals, that is, a chip select signal E#, a cache hit signal CH#, a write enable signal W#, a refresh designating signal REF# and control signals CC1# and CC2#. Referring to FIG. 119, the character "H" represents a high level signal potential, and "L" represents a low level signal potential. As shown in FIG. 119, operation modes of the CDRAM include a cache mode TH for accessing the SRAM cache; a command register set mode TG for setting command data in command registers; a standby mode TS for setting the CDRAM to a standby state; a cache miss mode DM for carrying out operation at a cache miss (miss hit); a direct array access mode TD for directly accessing the DRAM array; a refresh mode TR for refreshing the DRAM array; and a counter check mode TC for checking a counter generating row addresses for refreshing the DRAM array. Combinations of signal states and timings for setting the respective operation modes will be described in detail later with reference to diagrams of signal waveforms. The operation at a cache miss will be briefly described.

At a time of cache miss, or a miss hit, data requested by the CPU is not stored in the SRAM cache. Therefore, the requested data must be transferred from the DRAM array to the SRAM cache. This transfer is done through bi-directional transfer gate circuit (DTB) 210 shown in FIG. 105. Data transfer operation will be described with reference to FIG. 120. Bi-directional transfer gate 210 includes a transfer gate DTB 2 for transferring data in DRAM array 101 to SRAM array 201, and a transfer gate DTB 1 for latching data from SRAM array 201 and for transferring the same to DRAM array 101 (see structure of data transfer gate shown in FIGS. 49 and 57).

Assume that data D2 is stored in a region D of SRAM array 201, and CPU requests data D1 in this region D. This is a cache miss. At this time, in accordance with the address output from the CPU, data D1 is selected from DRAM array 101 and it is transmitted to transfer gate DTB 2. In parallel, data D2 stored in SRAM array 201 is latched in transfer gate DTB 1. Then, data D1 which has been transferred to transfer gate DTB2 is transferred to a corresponding region D of SRAM array 201. Data D2 is latched in transfer gate DTB 1. After data D1 has been transferred to SRAM array 201, CPU can access SRAM array 201. DRAM array 101 is once set to a precharge state to receive data D2 from transfer gate DTD 1. Then an address indicating an address in which data D2 is to be stored is applied from, for example, a tag memory to DRAM array 101, and row selection operation is effected in accordance with this address (hereinafter referred to as a miss address). After the row selecting operation, data D2 stored in transfer gate DTB 1 is transferred to the corresponding region.

Since data transfer is done in two directions in parallel as described above, even at a cache miss, CPU can access SRAM array 201 for reading/writing desired data immediately after data transfer from DRAM array 101 to SRAM array 201, without waiting for the DRAM array 101 returning to the precharge state. Operations in respective operation modes (high speed mode, low power consumption mode) during data transfer will be described in detail with reference to FIG. 121, which is a diagram of signal waveforms.

First, by setting chip select signal E# to "L" and cache hit signal CH# to "H" at a rising edge of clock signal K, an initiate cycle TMMI for cache miss cycle TM is effected. In cache miss initiate cycle TMMI, an SRAM address Ac is taken as valid in the device at a rising edge of clock signal K, and a row address signal (R) out of DRAM address Aa is taken in the device. In low power consumption mode, a column address signal (C) of DRAM address Aa is taken successively at a falling edge of the clock K. In the second high speed operation mode, the column address signal (C) is taken at a rising edge of a third clock signal K.

Then array active cycle TMMA is started at a second rise of clock signal K. In array active cycle TMMA, memory cell selecting operation is done in the DRAM array in accordance with the CPU address, and selected memory cell data is transferred to the SRAM array. After the data transfer from the DRAM array to the SRAM array, memory cells is selected in the SRAM array in accordance with the SRAM address taken in advance, and selected data Q is output. At this time, the data which has been transferred from SRAM array to the transfer gate is kept latched in the transfer gate DTB 1. By this state, array active cycle TMMA is completed. It takes time tKHAA from the first rise of clock signal K to the output of data Q requested by the CPU, and it takes time tCAA from taking of the DRAM column address to the output of the requested data Q.

After the completion of the array active cycle TMMA, a precharge cycle TMMP for precharging the DRAM is effected. During this precharge period, SRAM cache can be independently accessed. Chip select signal E# and cache hit signal CH# are set to "H" or "L" dependent on whether the SRAM is accessed or not, and data is output dependent on the accessing state at this time. Meanwhile, internal precharging operation is effected in the DRAM array, and various signal lines are precharged to desired potentials. After the completion of precharging of the DRAM array, an array write cycle TMA for writing data which has been transferred from the SRAM array to the transfer gate DTB 1 to corresponding memory locations of the DRAM array is carried out.

Array write cycle TMA is started with an initiate cycle TMAI. This initiate cycle is started by setting chip select signal E# to "L" at a rising edge of clock signal K. Consequently, a miss address applied from a tag memory, for example, is applied to the DRAM, and in the DRAM array, the applied miss address is taken as the row address signal (R) and column address signal (C) dependent on the operation mode. After the row and column address signals are taken, an array write-array active cycle for actually writing the latched data to the DRAM array and the precharge cycle TMAA are carried out.

In array active-precharge cycle TMAA, a corresponding memory cell is selected from the DRAM array in accordance with the applied miss address, and data which has been latched in bi-directional transfer gate DTB1 is written to the selected memory cell and then DRAM array is subject to precharging. In parallel to the data writing cycle in the DRAM array, the CPU can independently access the SRAM array.

Cycle time of clock signal K is tK, and array cycle time of the DRAM (necessary for reading desired data by directly accessing the DRAM array) is represented as TA. The cycle time necessary for the miss read/write cycle TMM at a cache miss must be not shorter than array cycle time ta. Similarly, cycle time of the array write cycle TMA must be not shorter than array cycle time ta.

FIG. 122 is a diagram of signal waveforms showing a cache hit reading operation in the low power consumption mode. FIG. 122 shows the cache hit reading operation (LTHR) in the transparent output mode. The cache hit reading operation is effected by setting chip select signal E# to "L", cache hit signal CH# to "L", control signal CC1# to "L", refresh designating signal REF#, control signal CC2# and write enable signal W# to "H" at a rising edge of clock signal K. At this time, SRAM address (CPU address) Ac is taken at the rising edge of the clock signal K and the SRAM cache is accessed. By making output enable signal G# fall from "H" to "L", data Q1 corresponding to the taken SRAM address C1 is output after the lapse of time tKHA from the rising edge of the clock signal K.

In the hit read cycle THR at a cache hit, only the SRAM cache is accessed, and data is output in the same clock cycle of the clock signal K. Control signal CC1# is set to "L" only in the first hit read cycle, in order to execute a data transfer array write cycle in the DRAM array. A plurality of cycles are necessary as the DRAM array cycle time, and from this time on, array write cycle is effected in the DRAM, and therefore, control signal CC1# is kept at "H" in the subsequent hit read cycle. When output enable signal G# is at "L", an output from the data input/output circuit shown in FIG. 105 (see also FIG. 37) is transmitted to the data output pin. Therefore, in the second hit read cycle, data Q2 corresponding to the address C2 is output after the SRAM address C2 is taken and after the output of invalid data. When output enable signal G# is at "H", the output data pin D/Q is set to the high impedance state. In the following description, the CDRAM is in the masked write mode, and arrangement of a pin M# for receiving masked data and a DQ pin for commonly carrying out data input /output is shown as an example.

FIG. 123 is a diagram of signal waveforms showing the cache hit writing operation in low power consumption. The cache hit mode THW is effected by setting chip select signal E#, cache hit signal CH# and write enable signal W# to "L" and setting control signals CC1#, CC2# and refresh designating signal REF# to "H" at a rising edge of clock signal K. At this time, output enable signal G# is set to "H". In this state, SRAM address signal C1 is taken at a rising edge of the clock signal K, and data D1 which has been applied to data input/output pin DQ is taken. If it is in the masked write mode, the data which is to be written at this time can be masked by setting the signal potential applied to data pin M# to "H" or "L". Since access to the SRAM array only is done in the cache hit write mode THW in the cache hit writing operation, the cycle time of the hit write mode THW is the same as the cycle time tK of clock signal K.

FIG. 124 is a diagram of signal waveforms showing a cache miss reading operation in the low power consumption mode. The cache miss reading operation is started with a miss initiate cycle TMMI. This initiate cycle TMMI is started by setting chip select signal E# to "L" and other control signals CH#, CC1#, REF#, CC2#, W# and G# to "H" at a rising edge of clock signal K. In the initiate cycle TMMI, first an SRAM address Ac1 is taken for designating an address of the SRAM array, and, at the same time, the same address is taken as the DRAM array address signal Aa. At this time, 16 bits (16 bits×4) of data are simultaneously transferred for one memory cycle. Since the output data includes 4 bits, the necessary address bits except the lower address bits out of the address (CPU Add) applied from the CPU, are applied as the DRAM address signal Aa.

For the operation with low power consumption, the DRAM address signal Aa is taken as the row address (ROW) at a rising edge of clock signal K, and a column address signal COL is taken at the falling edge of this clock signal K. At this state, memory cell selecting operation is effected in the SRAM array and the DRAM array, and corresponding memory cell data are transferred from the DRAM to the SRAM array. Data selecting operation in the DRAM array is carried out by setting the array active cycle TMMA. The array active cycle TMMA is designated by setting all control signals to "H" at a rising edge of clock signal K.

By making the output enable signal G# fall to "L" in array active cycle TMMA, data Q1 selected in accordance with the address signal C1 in the SRAM array is output after a lapse of a predetermined time period. After the completion of the array active cycle in the DRAM array, the operation must be once changed to the precharge cycle for writing data which has been read from the SRAM array and latched in the bi-directional transfer gate circuit to the DRAM array. For setting the precharge cycle TMMP at a miss read, the same combination of signals as to designate standby or cache hit operation TK is used at a rising edge of clock signal K. When chip select signal E# is set to "L" while setting cache hit signal CH# to "L" at this time, data can be read from the SRAM array while the DRAM array is in the precharge cycle.

FIG. 125 is a diagram of signal waveforms showing a cache miss writing operation in the low power consumption mode. The cache miss writing operation is realized by setting the chip select signal E# and write enable signal W# to "L" at a rising edge of clock signal K. At this time, initiate cycle TMMI for cache miss writing operation is effected at first. The cache miss writing operation is the same as the cache miss reading operation shown in FIG. 124 except that the direction of data flow is different. After corresponding data are transferred from the DRAM array, or simultaneously with the data transfer, writing of data D1 to the corresponding memory cell in accordance with the address signal C1 for the SRAM array is carried out. The only difference between cache miss writing and cache miss reading is that the write enable signal W# is at "L" or not.

FIG. 126 is a diagram of signal waveforms showing an array writing operation. In the array writing operation, data which has been transferred from the SRAM array to the bi-directional transfer gate circuit to be latched therein is written to the corresponding memory cell of the DRAM array. The array writing operation cycle LTMA includes initiate cycle TMAI and array active cycle TMAA. The initiate cycle TMAI is set by setting chip select signal E# and control signal CC2# to "L" and control signal CH#, CC1# to "H" at a rising edge of clock signal K. In this initiate cycle TMAI of the array writing operation cycle LTMA in the low power consumption mode, an address signal (MissAdd) applied from an external device such as a tag memory is taken corresponding to the rising and falling edges of the clock signal K, and internal row address and column address signals are generated responsively. Successive to the initiate cycle TMAI, chip select signal E# and cache hit signal CH# are set to "L" and control signal CC1# is set to "H" at a rising edge of the clock signal K. Thus array active cycle TMMAA as well as cache hit operation are set. At this time, when write enable signal W# is set to "L", the SRAM address signal Ac is taken, and data is written to the SRAM cell corresponding to the taken address C2. At this time, masked data M# may be applied. In the array active cycle TMAA in the array writing operation, DRAM memory cell is selected in accordance with the taken address, and data which has been latched in the bi-directional transfer gate is written to the selected DRAM memory cell.

FIG. 127 is a diagram of signal waveforms showing array writing operation accompanied with cache hit reading operation. Array writing operation accompanied with cache hit reading in the low power consumption mode is shown, and in this cycle LTMAR, reading of data from the SRAM cache is carried out in parallel with data transfer from the bi-directional transfer gate to the DRAM array.

This operation cycle LTMAR is set by setting chip select signal E#, control signal CCI# and cache hit signal CH# to "L" and by setting control signal CC2# and write enable signal W# to "H" at a rising edge of clock signal K. Since refreshing is not carried out, the refresh designating signal REF# is at "H". By the setting of these signals, the initiate cycle TMAI of the array writing operation is effected together with the cache read cycle THR. More specifically, in this operation mode, the SRAM address signal Ac is taken at first at the rising edge of the clock signal K, and corresponding data Q1 is output.

The DRAM address signal Aa is taken as the row address signal and the column address signal at the rising edge and the falling edge of the clock signal K, respectively. An address signal (MissAdd) from an externally provided tag memory, for example, is applied as the DRAM address signal Aa for selecting a memory cell to which the data which has been latched in the bi-directional transfer gate is to be written. In this manner, data transfer operation to the DRAM array is carried out in parallel with the cache reading operation of the SRAM array.

The array write cycle is carried out by setting the array active and precharge cycle DMAA. The array active/pre-charging operation in the array writing operation accompanied with cache hit reading is set by setting chip select signal E# to "L", cache hit signal CH# to "L" and control signals CC1# and CC2# both to "H".

FIG. 128 is a diagram of signal waveforms showing an array write operation cycle LTMAW accompanied with cache hit writing in the low power consumption mode. The array write operation cycle LTMAW accompanied with cache hit writing is set by setting chip select signal E#, cache hit signal CH# and control signal CC1# to "L" and setting control signal CC2# and refresh designating signal REF# to "H" at a rising edge of clock signal K. By setting the signals to such states, the array write initiate cycle TMAI and hit writing cycle THW are set. In response, the SRAM address signal Ac for selecting the SRAM array is taken at the rising edge of clock signal K, and the DRAM address signal Aa is taken at a rising edge of clock signal K.

The DRAM address signal Aa is also taken at a falling edge of the clock signal K and an internal column address signal is generated. Since it is an array writing operation, the DRAM address signal Aa is not the address applied by the CPU for writing data which caused cache miss but the address MissAdd applied by an external device such as a tag memory. The array write operation cycle LTMAW accompanied with cache hit writing is the same as the array write operation cycle LTMAR accompanied with cache hit reading shown in FIG. 127 except that the state of the write enable signal W# is different. Namely, data is written to the SRAM array in accordance with the CPU address in parallel with transfer of data which has been latched in the bi-directional transfer gate to the DRAM array.

FIG. 129 is a diagram of signal waveforms showing a direct array read operation cycle LTDR in the low power consumption mode. In the direct array read operation cycle LTDR, the DRAM array can be directly accessed to read the corresponding memory cell data of the DRAM. The direct array read operation cycle LTDR is started by setting chip select signal E# and control signal CC1# to "L" and setting control signal CC2# to "H", cache hit signal C1#, write enable signal W# and refresh designating signal REF# to "H" at a rising edge of the clock signal K. By setting these signals to such states, an initiate cycle TDI of the direct read array cycle LTDR is set.

In the initiate cycle TDI, DRAM address signal Aa is taken as the row address signal (ROW) at a rising edge of clock signal K, and successively, 4 bits of address signals Aac 0 to Aac 3 applied to the SRAM address terminal and the DRAM address signal Aa are taken at a falling edge of the clock signal K. The SRAM address signal is also used in the direct array read operation from the following reason.

Generally, in array accessing, 16 bits of data are transferred simultaneously per 1 memory block. In case of a 4M bit DRAM, 16 bits×4 data are transferred. Therefore, a total of 16 bits of row address signals and column address signals only are applied generally. Therefore, in direct array read operation, SRAM address signals Aac 0 to Aac 3 are taken as lower address signals for further selecting 4 bits from 16×4 bits of memory cells. A structure for selecting 4 bits of data from the SRAM column decoder in accordance with the taken 4 bits of SRAM address signals Aac 0 to Aac 3 may be used. In that case, the data selected in the DRAM is transmitted and selected through a SRAM bit line. Other structure may be used.

Thereafter, the array active/precharge cycle TDA is executed in which the memory selecting operation and the data reading operation in the DRAM array are carried out. For setting the array active /precharge cycle TDA in the direct array read operation, all control signals are set to "H". The output timing of the output data Q1 is determined by output enable signal G#. Consequently, the direct array read operation cycle LTDR in which the DRAM array is directly accessed to read memory cell data therefrom is completed.

After the completion of the direct array read operation cycle LTDR, by setting chip select signal E# and cache hit signal CH# to "L" at a rising edge of clock signal K, memory cell reading operation in accordance with the SRAM address signal Ac is effected.

FIG. 130 is a diagram of signal waveforms showing a direct array write operation cycle LTDW in the low power consumption mode. In the direct array write operation cycle LTDW shown in FIG. 130, data is directly written to the DRAM array in accordance with an external address signal. The direct array write operation cycle LTDW is set by setting chip select signal E#, control signal CC1# and write enable signal W# to "L" and by setting cache hit signal CH#, refresh designating signal REF#, control signal CC2# and output enable signal G# to "H" at a rising edge of clock signal K. The direct array write operation cycle LTDW is the same as the direct array read operation cycle LTDR shown in FIG. 129 except that write enable signal W# is set to "L" at a rising edge of clock signal K. At this time, the data T1 applied at the rising edge of the clock signal K is written to the DRAM memory cell selected in accordance with the DRAM address signal Aa and 4 bits of SRAM address signals Aac 0 to Aac 3.

The direct array write operation cycle LTDW includes an initiate cycle TDI and the array active/precharge cycle TDA for actually activating the DRAM array. The array active/precharge cycle TDA is the same as the array active cycle TDA shown in FIG. 129. After the lapse of the DRAM access cycle time ta, the SRAM cache can be externally accessed.

FIG. 131 shows the refresh array operation. In the refresh array operation mode LTR, the DRAM array is refreshed under control of refresh control circuit 292 and counter 291 shown in FIG. 105. In this case, a refresh row address indicating a row to be refreshed is generated from counter 291 shown in FIG. 105. The refresh cycle is designated by setting refresh designating signal REF# to "L" at a rising edge of clock signal K.

Consequently, a refresh initiate cycle TRI is set, and from the next rise of the clock signal K, the array active cycle TRA for actually refreshing the DRAM array is executed. In the array active cycle TRA in the refresh array operation mode LTR, all control signals are set to "H". FIG. 131 shows an example in which cache hit reading operation is carried out after the completion of refreshing.

FIG. 137 is a diagram of signal waveforms showing the refresh array operation mode accompanied with cache hit reading in the low power consumption operation. The refresh array operation is carried out only for the DRAM array, and refreshing of the SRAM array is not necessary. Therefore, in parallel with the refresh array operation, the SRAM array can be accessed for reading data. In the refresh array operation mode LTRR accompanied with the cache hit reading is started by setting chip select signal E, cache hit signal CH# and refresh designating signal REF# to "L" and by setting control signals CC1#, CC2# and write enable signal W# to "H" at a rising edge of clock signal K.

By the refresh designating signal REF#, refreshing of the DRAM array is designated, and by chip select signal E# and cache hit signal C1#, the cache hit operation is designated. At this time, auto-refreshing operation is carried out in the DRAM array in accordance with an output from a built-in address counter. Successive to the refresh initiate cycle TRI, the DRAM array is refreshed in the array active cycle TRA in accordance with this refresh row address. In the SRAM array, data is read in accordance with an externally applied address signal Ac.

FIG. 133 is a diagram of signal waveforms showing a refresh operation mode with cache hit reading in low power consumption mode. The refresh operation mode LTRW accompanied with cache hit writing shown in FIG. 133 is the same as the refresh array operation accompanied with the cache hit reading shown in FIG. 132 except that write enable signal W# falls to "L". In this case, data is written in the SRAM array in accordance with the address signal Ac, and DRAM array is refreshed in accordance with the refresh address in the DRAM array.

FIG. 134 is a diagram of signal waveforms showing a counter check reading operation in the low power consumption mode. The counter check read operation mode LTCR is an operation mode for testing whether or not the address counter generating the refresh row address for refreshing the DRAM array functions properly. The counter check read operation mode LTCR is started by setting chip enable signal E#, control signal CC1# and refresh designating signal REF# to "L" and control signal CC1# and write enable signal W# to "H" at a rising edge of clock signal K. In the counter check read operation mode LTCR, lower 4 bits Aac 0 to Aac 3 of the SRAM address signal Ac are taken as the lower 4 bits of the column address signal of the DRAM array at a rising edge of clock signal K in initiate cycle TCI thereof.

Thereafter, DRAM address signal Aa is taken as a column address signal (upper column address bits) at a falling edge of the clock signal K. In case of a 4M bit DRAM array, 10 bits of column address signal are necessary for selecting 4 bits of memory cells. At that time, only 6 bits are applied as the column address in the DRAM as described above. Therefore, the remaining 4 bits are taken from the SRAM address signal pins. Then, by setting the respective control signals to "H" at a rising edge of the clock signal K, memory cell selecting operation is carried out in the DRAM array in accordance with the taken column addresses, and selected memory cell data are read. By comparing the read data with predetermined data or written data, it can be determined whether or not the refresh row address counter functions properly.

FIG. 135 is a diagram of signal waveforms showing the counter check writing operation in the low power consumption mode. To start the counter check write operation mode LTCW, chip select signal E#, control signal CC1#, refresh designating signal REF# and write enable signal W# are set to "L" and cache hit signal CH# and control signal CC2# are set to "H" at a rising edge of clock signal K. At this time, the states of control signals in this mode are the same as those in the counter check read operation mode LTCR shown in FIG. 134 except that the write enable signal W# is set to "L". After counter check writing operation is set in the initiate cycle TCI, an array active cycle CTA for actually accessing the DRAM array is executed. In the array active cycle, an address from the refresh row address counter is taken as the row address, external addresses Aac 4 to Aac 9 and Aac 0 to Aac 3 are taken as the column address signal to carry out row and column selecting operations, and externally applied data are written to the selected DRAM memory cells.

FIG. 136 is a diagram of signal waveforms showing a command register setting operation in the low power consumption mode. The command register setting operation mode LTG shown in FIG. 136 is an operation mode for writing desired data to the command register 270 shown in FIG. 105. By utilizing the command register setting operation mode LTG, the CDRAM can be set to the low power consumption mode, the first high speed operation mode, the second high speed operation mode, the masked write mode, DQ separation mode and the like. The command register setting cycle LTG is designated by setting chip select signal E#, control signals CC1# and CC2# and write enable signal W# to "L" (or "H"), and setting refresh designating signal REF# to "H" at a rising edge of clock signal K. By this setting of the operation mode, a command address signal Ar is taken and a corresponding command register is selected. If write enable signal W# is at "L" at this time, data is written to the register WR0 for designating write mode/output mode, for example. If write enable signal W# is at "H", any of the registers RR0 to RR3 included in the command register is selected in accordance with the command address bits At0 and Ar1. FIG. 136 shows writing of data to any of the command registers WR0 to WR3, as an example. The command register setting operation mode LTG has its set cycle T1 completed in 1 cycle of the clock signal K.

FIG. 137 shows an example of an operation sequence in the CDRAM in the low power consumption mode. In the operation sequence of FIG. 137, an operation at a cache miss is shown as an example. When a cache miss reading occurs, only the chip select signal E# is set to "L" at a rising edge of clock signal K. Consequently, the initiate cycle TMMI of cache miss reading is carried out, the SRAM address signal C1 and address signal Aa (CPU address) for the DRAM array are taken, and thereafter, the array active cycle TMMA for the time of miss read is effected. In the array active cycle and the time of a miss read, memory cell data selected in the DRAM array are transmitted to the memory cells of the SRAM array, and memory cell data corresponding to the SRAM address signal C1 applied at the cache miss is read as the output data Q1 at the last cycle of miss reading.

In the DRAM array, the remaining precharge cycle TMMP of the miss read operation cycle TMMR is carried out. In this precharge cycle, the SRAM array can be accessed by the CPU. In FIG. 137, hit read operation is set simultaneously with the setting of the precharge cycle, and data Q2 is read in accordance with address signal C2.

Successive to the precharge cycle, an array write cycle for writing in DRAM array data which has been transferred from the SRAM array to the bi-directional transfer gate and has been latched therein is effected. If a hit write cycle is being carried out in parallel, the array write cycle is set by setting chip select signal E#, cache hit signal CH#, control signal CC1# and write enable signal W# to "L" at a rising edge of clock signal K. Consequently, the DRAM enters the array access cycle TMAA, memory cell selecting operation is carried out in accordance with an address MissAdd from a tag memory, for example, and data is transferred from the bi-directional transfer gate to the selected DRAM memory cell.

In the SRAM array, data D3 is written to the memory cell selected in accordance with SRAM address signal C3. In the array write cycle in the DRAM array, hit read cycles are continuously carried out in parallel, and output data Q4, Q5 and Q6 corresponding to SRAM address signals C4, C5 and C6 are output. After the hit reading, generation of clock signal K is stopped to reduce power consumption. This state is shown as a standby state in FIG. 137.

FIG. 138 shows another example of the operation sequence in the low power consumption mode. FIG. 138 shows a cache miss writing operation and successive cache hit operation. When a cache miss writing occurs, an initiate cycle TMMI of the cache miss write cycle is effected. At this time, chip select signal E# and write enable signal W# are set to "L". Consequently, address signals for selecting memory cells in the SRAM array and the DRAM array are taken. Thereafter, the array active cycle is effected, and data are transferred from the DRAM array to the SRAM array.

After the completion of data transfer or in parallel with data transfer, data D1 which have caused cache miss writing is written to the corresponding location in the SRAM array. After the completion of the array active cycle, precharge cycle of the DRAM array is carried out. At this time, hit read operation THR is effected for the SRAM. After the precharging operation, an array write cycle for writing, to the DRAM array, data which has been transferred from the SRAM array to the bi-directional transfer gate is carried out.

In the initiate cycle TMAI in the array write cycle, cache hit cycle TH is also carried out simultaneously, and therefore control signal CC1# is set to "L". After the completion of the initiate cycle TMI in array writing, the array active and precharge cycle is carried out. In parallel with this array write cycle, hit writing operation, hit read operation and hit writing operation are carried out. If the CDRAM is not accessed after a lapse of a predetermined time period, the cycle of the clock signal K is made longer, or clock signal K is generated intermittently.

Figure 1:
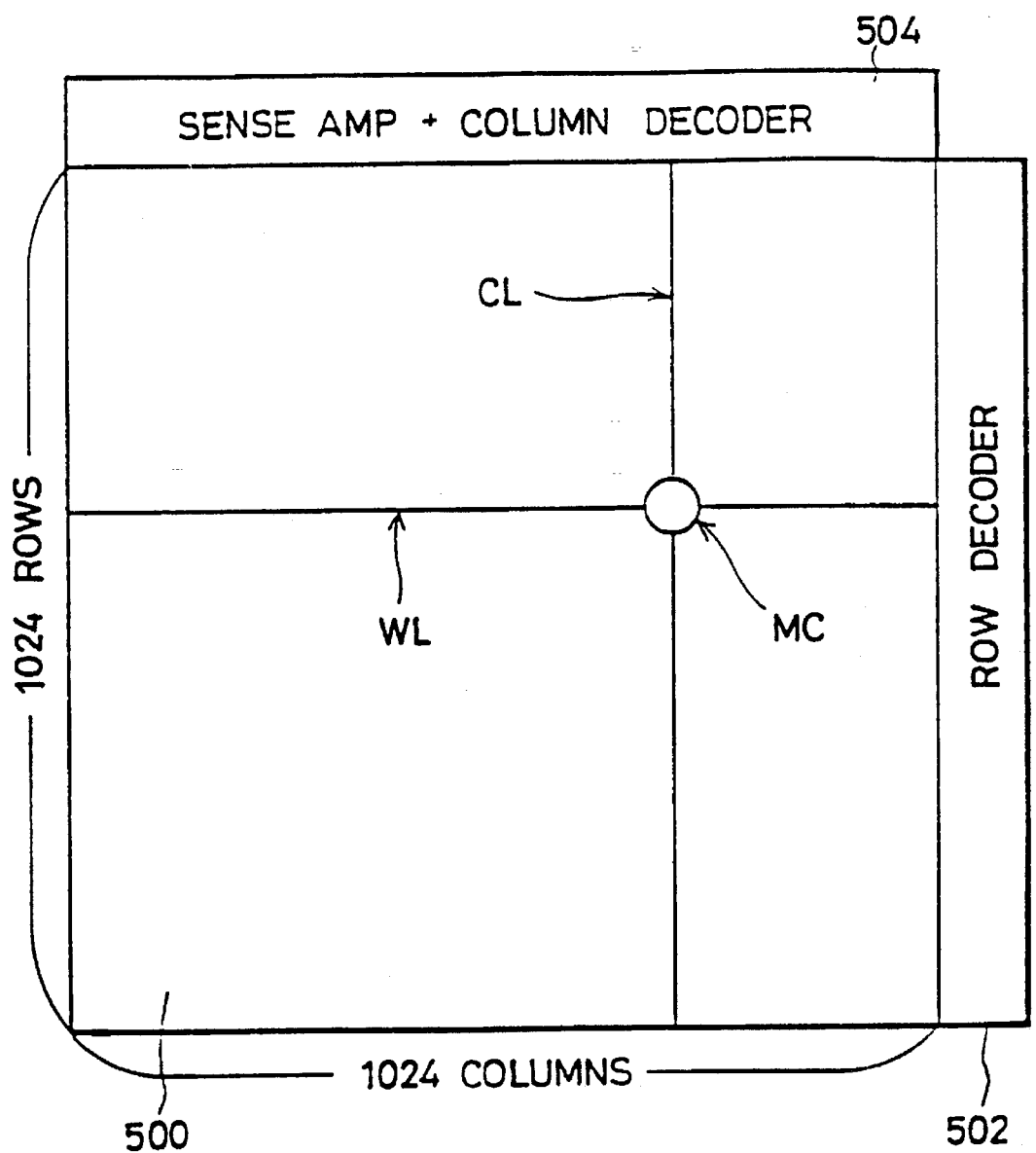
FIGS. 1 through 6 are related to a conventional memory device.
Figure 2:
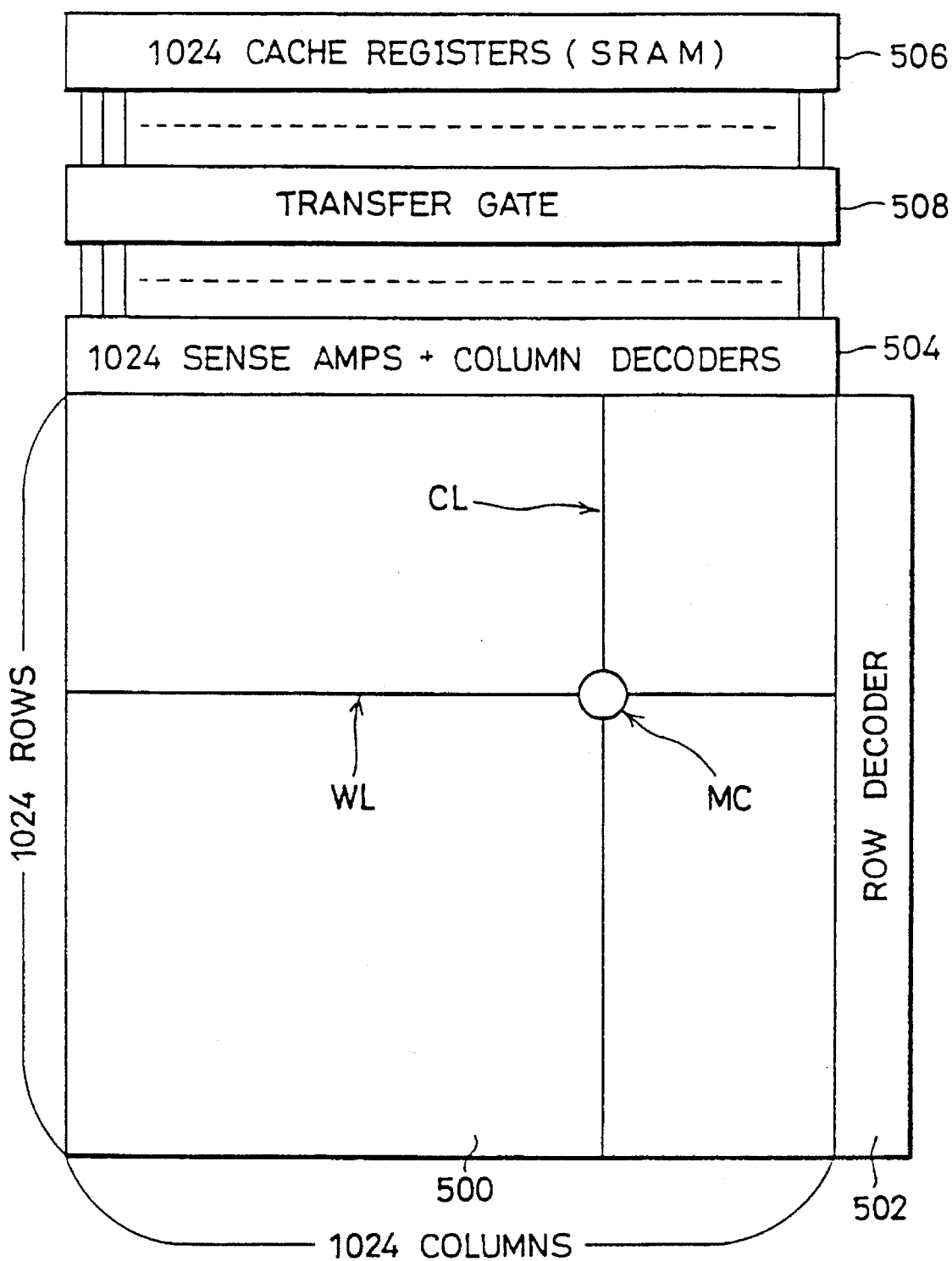
Figure 3:
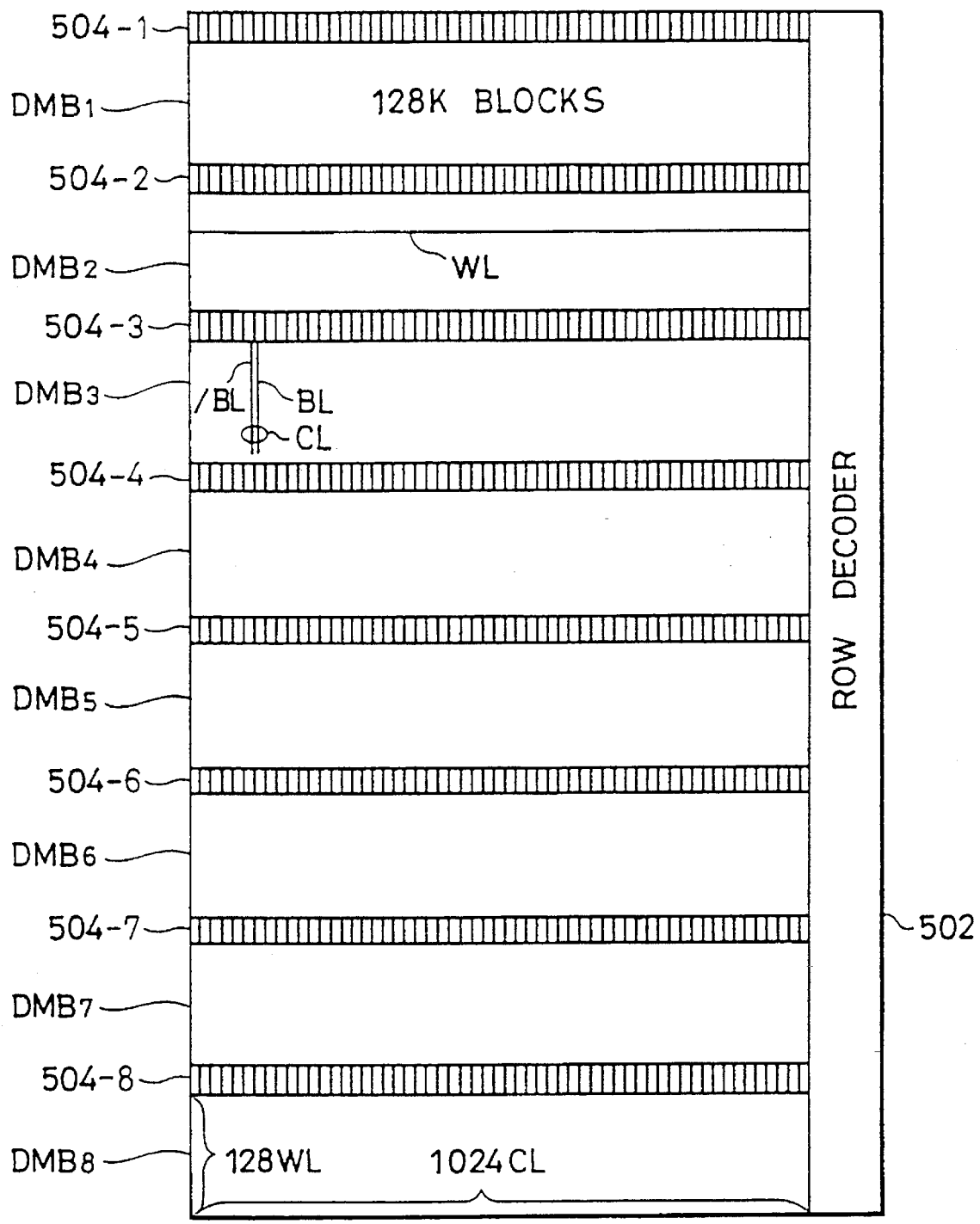
Figure 4:
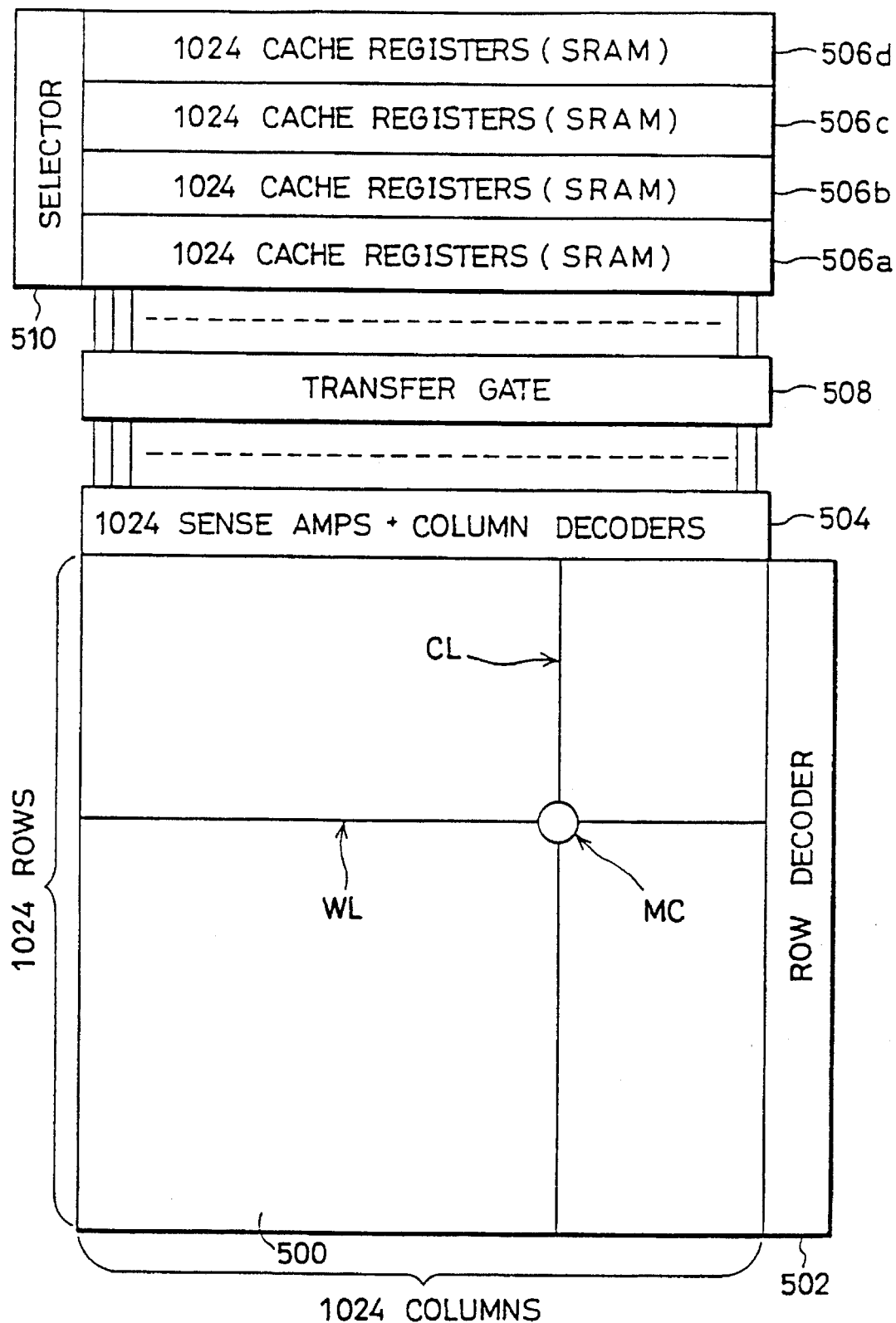
Figure 5:
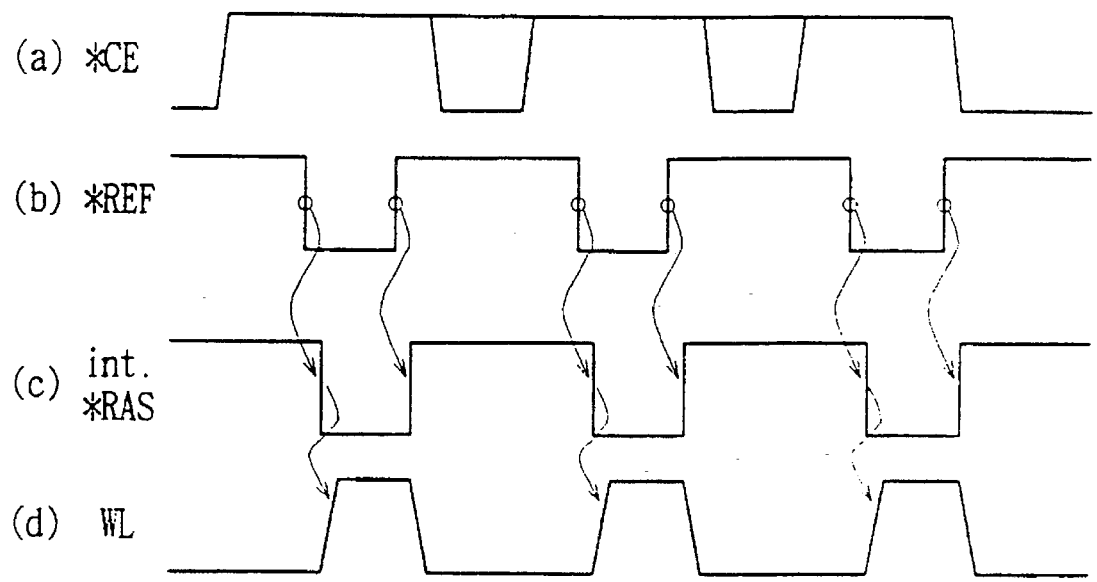
Figure 6:
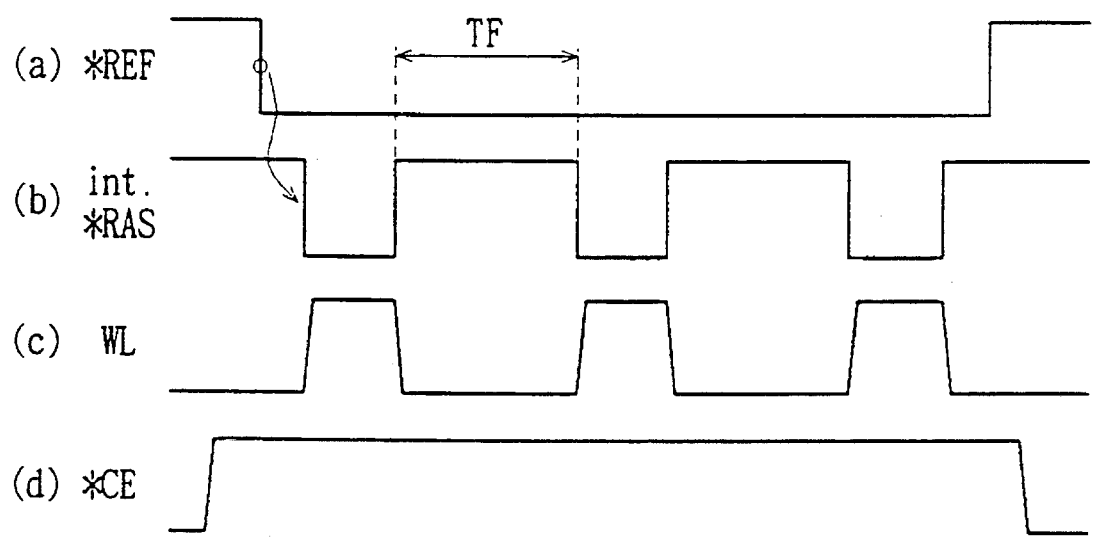

As shown in FIGS. 137 and 138, 2 cycles of clocks signal K are taken for the DRAM array write cycle. Meanwhile, only 1 clock is necessary for accessing the SRAM array.

Therefore, the CDRAM operates at a relatively low speed, and low power consumption is given priority to high speed operation.

FIG. 139 is a diagram of signal waveforms showing cache hit reading operation in the high speed operation mode. FIG. 139 shows data output in the transparent output mode for the cache hit read operation mode THR under the high speed operation mode. The cache hit reading operation mode THR in the high speed operation mode has signal waveforms the same as those in the cache hit reading operation mode LTHR in the low power consumption mode shown in FIG. 122, and therefore detailed description thereof is not repeated. FIG. 139 shows data input/output terminals in the DQ separation mode. More specifically, input data D and output data Q are input and output through separate pin terminals.

FIG. 140 shows a diagram of signal waveforms showing cache hit reading operation in which data is output in latched output mode. The cache hit read operation mode THRL shown in FIG. 140 is carried out in the high speed operation mode. The combinations of control signals for setting this operation mode are the same as those shown in FIG. 139. The cache hit read operation mode THR shown in FIG. 139 differs from cache hit read operation mode THRL in the latched output mode in that timings of output data are different. More specifically, in the latched output mode, data read in the last cycle is output in an invalid data period of the waveform of the output data Q shown in FIG. 139. Namely, the data read in the last cycle is continuously output until valid data is output in the next cycle. In the latched output mode, invalid data is not output, and therefore stable data processing operation is possible.

FIG. 141 is a diagram of signal waveforms showing a cache hit read operation mode in registered output mode in high speed operation mode. The cache hit read operation mode THRR in the registered output mode is realized by the same combination of signal states as that for the operation modes THR and THRL shown in FIGS. 139 and 140. Different from the transparent output mode (see FIG. 139) and latched output mode (see FIG. 140), memory cell data selected in the previous cycle is output in synchronization with clock signal K in the registered output mode. In the register output mode, data read in the last cycle is output in synchronization with the clock signal, and therefore it is suitable for pipe line application.

FIG. 142 is a diagram of signal waveforms showing cache hit writing operation in the high speed operation mode. The cache hit write operation mode THW shown in FIG. 142 is realized by the same combination of signal states as in the cache write operation LTHW in low power consumption mode shown in FIG. 123, and therefore, description thereof is not repeated.

FIG. 143 is a diagram of signal waveforms showing cache miss reading operation in the high speed operation mode. In the cache miss read operation mode TMMR in the high speed operation mode, the initiate cycle TMMI is completed in 1 clock cycle. However, in the high speed operation mode, the column address is taken at a rising edge of a third clock signal K. This is the difference from the cache miss read operation mode LTMMR in the low power consumption mode shown in FIG. 124.

FIG. 144 is a diagram of signal waveforms showing cache miss reading operation in latched output mode in the high speed operation mode. The cache miss read operation mode TMMRL shown in FIG. 144 is the same as the cache miss read operation mode TMMR shown in FIG. 144 except that data Q0 read in the last cycle is output in a period of the output data Q in which invalid data were otherwise to be output. Except this point, the operation is the same as FIG. 143.

FIG. 145 is a diagram of signal waveforms showing cache miss reading operation in the registered output mode in the high speed operation mode. The cache miss read operation mode TMMRR shown in FIG. 145 is the same as operation modes TMMR and TMMRL shown in FIGS. 143 and 144, except the timing of output of the output data Q. Namely, in the latched output mode, data read in the last cycle is kept continuously output in the period at which invalid data were otherwise to be output, and after a lapse of a prescribed time period from the fall of clock signal K, the signal read in the present cycle is output.

In the registered output mode, data is output in synchronization with clock signal K. If clock signal K rises in a short period of time from the fall of output enable signal G#, data read in the last cycle is output in response to the rise of clock signal K. Except this point, the operation is the same as those in FIGS. 143 and 144.

FIG. 146 is a diagram of signal waveforms showing cache miss writing operation in high speed operation mode. The cache miss write operation mode TMMW shown in FIG. 146 is the same as the cache miss write operation mode LTMMW shown in FIG. 125 except the timing for taking the DRAM address signal Aa as a column address signal. In this case also, the array active cycle TMMA is effected after the completion of the initiate cycle TMMI. After the completion of the array active cycle TMMA, the precharge cycle TMMP is carried out.

FIG. 147 is a diagram of signal waveforms showing array write operation in the high speed operation mode. The array write operation mode TMA shown in FIG. 147 is the same as the array write operation mode LTMA in the low power consumption mode shown in FIG. 126 except the timing for taking the column address signal (COL) of the DRAM address signal. In the array write operation mode TMA in the high speed operation mode, cache hit write operation is effected prior to column selection in the DRAM. The fact that array write operation is carried out means that data transfer to the SRAM has already been completed. Therefore, the SRAM cache can be accessed at this time.

FIG. 148 is a diagram of signal waveforms showing array write operation accompanied with cache hit reading in the high speed operation mode.

The combination of states of control signals in the array write operation mode TMAR accompanied with cache hit reading shown in FIG. 148 is the same as that in the array write operation mode LTMAR in the low power consumption mode shown in FIG. 126 except the timings for taking the column address signal for accessing the DRAM array.

FIG. 149 is a diagram of signal waveforms showing array write operation accompanied with cache hit reading in the latched output mode in the high speed operation mode. Signal states in the array write operation mode TMARL accompanied with cache hit reading in the latched output mode are the same as those in the array write operation mode TMAR accompanied with cache hit reading shown in FIG. 148 except the timing of appearance of the output data Q. Namely, in the latched output mode, in place of the output data Q shown in FIG. 148, data read in the last cycle are continuously output in the period in which invalid data were to be output. Except this point, the operations are the same.

FIG. 150 is a diagram of signal waveforms showing array write operation accompanied with cache hit reading in registered output in high speed operation mode. The array write operation mode TMARR accompanied with cache hit reading shown in FIG. 150 is the same as the array write operation modes TMAR and TMARL shown in FIGS. 148 and 149 except the output timing of data. In the registered output mode, data read in the last cycle is output in response to a rise of clock signal K.

FIG. 151 is a diagram of signal waveforms showing array write operation accompanied with cache hit writing in the high speed operation mode. The combination of the states of control signals in the array write operation mode TMAW accompanied with cache hit writing shown in FIG. 151 is the same as that of array write operation mode LTMAW shown in FIG. 128, except the timing of taking the column address signal as an address for accessing the DRAM array.

FIG. 152 is a diagram of signal waveforms showing direct array read operation in the high speed operation mode. The combination of states of control signals in the direct array read operation mode TDR shown in FIG. 152 is the same as that of the direct array read operation mode LTDR shown in FIG. 129 except the timing of taking the column address signal out of the-DRAM address signals. Therefore, the description thereof is not repeated.

FIG. 153 is a diagram of signal waveforms showing direct array write operation in the high speed operation mode. The combination of states of control signals in the direct array write operation mode TDW shown in FIG. 153 is the same as that of the direct array write operation mode LTDW in the low power consumption mode shown in FIG. 130 except the timing of taking a column address signal for accessing the DRAM array. Therefore, the description thereof is not repeated.

FIG. 154 is a diagram of signal waveforms showing refresh array operation in the high speed operation mode. The refresh array operation mode TR shown in FIG. 154 is completely the same as the refresh array operation mode LTR in the low power consumption mode shown in FIG. 131, and therefore the description thereof is not repeated.

FIG. 155 is a diagram of signal waveforms showing refresh operation accompanied with cache hit reading in the high speed mode. The refresh operation mode TRR accompanied with cache hit reading shown in FIG. 155 is completely the same as the refresh array operation mode LTRR accompanied with cache hit reading showing in FIG. 132. Therefore, the detailed description thereof is not repeated.

FIG. 156 is a diagram of signal waveforms showing refresh operation accompanied with cache writing in the high speed operation mode. The combination of states of control signals in the refresh operation mode TRW accompanied with cache writing shown in FIG. 156 is the same as that of refresh operation mode accompanied with cache hit writing shown in FIG. 133. Therefore, the description is not repeated.

FIG. 157 is a diagram of signal waveforms showing counter check operation in the high speed operation mode. The counter check operation mode TCR shown in FIG. 157 is the same as the counter check read operation mode LTCR in the low power consumption mode shown in FIG. 134 except the timings for taking column address signal bits Aac 4 to Aac 9. Therefore, description thereof is not repeated.

FIG. 158 is a diagram of signal waveforms showing counter check writing operation in the high speed operation mode. The counter check write operation mode TCW shown in FIG. 158 is the same as the counter check write operation mode LTCW shown in FIG. 135 except the timings for taking the column address signal bits Aac 4 to Aac 9, and the combination of the states of control signals is the same.

FIG. 159 is a diagram of signal waveforms showing command register setting operation in the high speed operation mode. The combination of the states of control signals in the command register setting operation mode TG shown in FIG. 159 is the same as that of the command register setting operation mode LTG shown in FIG. 136.

As described above, in the high speed operation mode, only the timings for taking column address signals for accessing the DRAM array are different when access to the DRAM array is necessary, and various operations can be readily realized by the same combinations of the control signals for the respective operation modes in the low power consumption mode.

FIG. 160 shows an example of an operation sequence of the CDRAM in the high speed operation mode. In the operation sequence shown in FIG. 160, access to the cache (SRAM) is effected in parallel with miss read operation, when a miss read occurs, as an example. At a time of miss read, the SRAM array and the DRAM array are both accessed as in the case of FIG. 137. At this time, different from the low power consumption mode shown in FIG. 137, the column address signal COL 1 for accessing the DRAM array is taken at a third rising edge of the clock signal. When data transfer from the DRAM array to the SRAM array is completed according to the miss read operation mode TMM, the precharge cycle starts in the DRAM array. Before the start of the precharging, reading of data Q1 in accordance with the address signal C1 is completed. Hit read operation is effected in parallel with the precharge cycle.

The hit read operation is shown carried out three times in the precharge cycle. In the high speed operation mode, the clock signal is applied three times in the precharge cycle, and signals C2, C3 and C4 are applied as the SRAM array address signals Ac in the respective clock cycles, so that output data Q2, Q3 and Q4 are output. After the completion of the precharging operation, the array write operation is carried out. In parallel with the array writing operation, hit write operation, hit read operation and hit read operation are shown carried out in the SRAM array.

Therefore, in the high speed operation mode shown in FIG. 160, the period of the clock signal K is short, and data can be read at high speed by accessing the SRAM array while the DRAM array is being accessed.

FIG. 161 shows another example of the operation sequence in the high speed operation mode. An operation at a time of miss writing is shown as an example. In the operation sequence shown in FIG. 161, the miss writing operation is effected instead of the miss reading operation shown in FIG. 160, and the operation sequence is similar. The hit read cycle, hit read cycle and hit write cycle are shown carried out during precharging after the completion of array access, and in the array access cycle after the completion of the precharging, the hit read cycle, the write cycle and hit read cycle are shown carried out again.

Each operation cycle includes a command register cycle and an array active precharge cycle, and each cycle is determined by the execution of the initiate cycle.

[Other Example of Refresh Structure]
(Auto refresh /Self refresh Architecture)

in the CDRAM described above, refreshing is externally designated by the signal REF#. In other words, CDRAM carries out auto-refreshing. There is another refreshing scheme called self-refreshing in which refresh timing is internally set. In general, an external device is not signaled of refreshing timing in the self-refreshing operation. In the following, a construction by which refresh timing can be known externally even in self-refreshing is described with reference to FIGS. 162 through 175. In the described construction, a pin terminal is selectively set to an input terminal pin for receiving a signal REF# or to an output pin terminal for supplying a signal BUSY# indicating refreshing operation. If the pin serves as the input terminals, auto-refreshing is carried out. If the pin serves as the output terminal, self-refreshing is carried out. Such a compatible auto-refreshing/self refreshing architecture can also apply to a DRAM.

FIG. 162 shows another example of the refresh method of the CDRAM in accordance with the present invention. Portions corresponding to the circuit structure shown in FIG. 32 are denoted by the same reference characters in FIG. 162. In the CDRAM structures shown in FIGS. 32 and 105, refreshing is carried out in accordance with an externally applied refresh designating signal REF#. Namely, only auto-refresh can be done in the CDRAM shown in FIGS. 32 and 105. A structure allowing self refreshing in the normal mode will be described.

Referring to FIG. 162, the CDRAM includes a clock generator 3100 taking external control signals CR#, CH#, EH# and W# in response to an internal clock int-K from clock buffer 254 for generating various control signals; a command register 270a for setting the refresh mode of the CDRAM to auto-refresh or self refresh; and an input/output switching circuit 3102 in response to a command signal CM from command register 270a for setting a pin terminal 3110 to an input terminal or an output terminal. The pin terminal 3110 corresponds to the pin terminal of pin number 44 shown in FIG. 31. Pin terminal 3110 receives external refresh designating signal REF# when it is set as an input terminal. If it is set as an output terminal, pin terminal 3110 outputs a signal BUSY# indicating that self refreshing is being carried out in the CDRAM.

The CDRAM further includes a timer 3101 which is activated in response to a command from command register 270a for outputting a refresh request at a predetermined time interval. Clock generator 3100 corresponds to the control clock buffer 250 and DRAM array driving circuit 260 shown in FIG. 32 or FIG. 105.

FIG. 163 shows a specific structure of clock generator 3100 shown in FIG. 162. Referring to FIG. 163, clock generator 3100 includes an CR buffer 3200 receiving an externally applied command register set signal CR# for generating an internal control signal int. *CR; a RAS signal generating circuit 3201 receiving externally applied control signals CH# and E# and clock signal K for generating an internal control signal int. *RAS; and a CAS signal generating circuit 3202 responsive to internal control signal int. *RAS from RAS signal generating circuit 3201 and to external clock signal K for generating an internal control signal int. *CAS.

Internal control signal int. *RAS from RAS signal generating circuit 3201 defines operation of the circuitry related to row selecting operation of the DRAM array. In response to internal control signal int. *RAS, row selecting operation and sensing operation are carried out in the DRAM array. Internal control signal int. *CAS from CAS signal generating circuit 3202 determines operation of the circuitry related to column selection in the DRAM. An example of the circuit related to the column selecting operation in the DRAM array is the DRAM column decoder.

RAS signal generating circuit 3201 contains a circuit for generating internal control signal int. *RAS in response to the refresh requesting signal *BUSY (internal signal) from timer 3101 and to a command signal CM from the command register 270a. In this case, external control signals E# and CH# are neglected. A circuit structure for generating internal control signal int. *RAS and neglecting external control signals, in response to the refresh request (signal *BUSY)

from timer 3101 is shown in, for example, "64K bit MOS dynamic RAM containing auto/self refresh function", Journal of Institute of Electronics and Communication Engineers, January 1983, volume J66-C, No. 1.

Internal control signal int. *RAS generated from RAS signal generating circuit 3201 and internal control signal int. *CAS generated from CAS signal generating circuit 3202 may be generated from row address strobe signal generating circuit 2601 and column address strobe signal generating circuit 2602 shown in FIG. 109 of the second embodiment.

Clock generator 3100 further includes a refresh detecting circuit 3203 in response to an externally applied refresh designating signal *REF (this represents internal signal) for detecting designation of refreshing; and a refresh control circuit 3204 responsive to a refresh request from refresh detecting circuit 3203 for controlling count value of the refresh address counter 293 and for generating a switching signal MUX for switching connection of multiplexer 258.

Refresh control circuit 3204 also carries out an operation similar to that executed in accordance with a refresh designation from refresh designating circuit 3203 in response to refresh requesting signal (*BUSY) applied from timer 3101, and controls operation of refresh address counter 293 and of multiplexer 258. Timer 3101 is activated in response to the command signal CM and generates the refresh request signal at predetermined time intervals.

In the structure of FIG. 163, instead of applying command signal CM and refresh requesting signal *BUSY to RAS signal generating circuit 3201, a control signal from refresh control circuit 3204 may be applied to RAS signal generating circuit 3201. In that case, RAS signal generating circuit 3201 neglects external control signals in response to the refresh designating signal from refresh control circuit, and generates internal control signal int. *RAS for a predetermined time period. After the completion of one refresh cycle, refresh control circuit 204 increments the count value of refresh address counter 293 by 1.

FIG. 164 shows an example of a specific structure of input/output switching circuit 3202 and command register 270a shown in FIG. 162. Referring to FIG. 164, command register 270a includes a command register RR2 formed of a 2 bit data register. Command register RR2 takes and stores data applied to data input pins DQ0 and DQ1, when it is selected. The command register RR2 is selected by setting control signals At0 and Ar1 to "1" and "0", respectively, and by setting external control signal w# to "H" in the command register setting mode (see FIGS. 101, 136 and 159), as shown in FIG. 77. A structure of the data input/output pin when masked write mode is selected and input and output of data are carried out through the same pin terminal is shown as an example.

Command register 270a further includes transfer gate transistors Tr 201 and Tr 202 for connecting the command register RR2 to data input pins DQ0 and DQ1. A register selecting circuit 3120 for selecting command register RR2 for setting a desired command includes a gate circuit G110 receiving register selecting signals At0 and Ar1, and a gate circuit G111 receiving internal control signals W, E, CH and int. *CR. Register selecting circuit 3120 corresponds to command register mode selector 279 shown in FIG. 37.

When command selecting signal Ar is at "L" and control signal Ar1 is at "H", gate circuit G110 outputs a signal at "H". The command register RR2 is activated when the output from gate circuit G110 attains "H", so as to latch the applied data.

When internal control signal int. *CR and internal chip select signal E are both at "L" and internal control signals W and CH are at "H", gate circuit G110 outputs a signal of "H". Therefore, in the command register mode, when gate circuit G111 is selected and output signal therefrom attains "H", command register RR2 is connected to data input/output terminals DQ0 and DQ1 and latches the applied data.

Instead of command register RR2, a command register formed of 1 bit flipflop (for example, RR1 and RR2), in which structure auto refresh/self refresh is set by setting of one flipflop in accordance with combination of the signals At0 and Ar1 in the command register setting mode.

Input/output switching circuit 3102 includes an NOR circuit G100 and an AND circuit G101 receiving 2 bits of command signals CM from command register RR2; a switching transistor Tr200 receiving at its gate an output from NOR circuit G100 and passing a signal applied to data input/output pin 3110; and a switching transistor Tr201 responsive to an output from AND circuit G101 for transmitting refresh requesting signal *BUSY from timer 3101 (see FIG. 162) to a terminal 3110.

A signal from switching transistor Tr200 is transmitted to an input buffer circuit for the refresh signal for latching a signal in response to external clock signal K. It is transmitted to transistor Tr201 after the output from timer 3101 is buffered. Switching transistors Tr200 and Tr201 may be an input buffer and an output buffer, respectively. When switching transistor Tr200 is replaced by an input buffer, the input buffer receives not only the output from gate circuit G100 but also a signal applied in response to a rise of the clock signal K.

In the structure of the input/output switching circuit 3102 shown in FIG. 164, NOR circuit G100 outputs a signal at "H" when 2 bits of data from command register RR2 are both at "L". AND circuit G101 outputs a signal at "H" when 2 bits of command signals CM are both "1". Therefore, when 2 bits of data DQ0 and DQ1 are both at "0", refresh mode of the semiconductor memory device is set to the auto refresh mode, and when 2 bits of data DQ0 and DQ1 are both "1", the semiconductor memory device is set to the self refresh mode.

Other logics may be used for the gate circuits G100 and G101 shown in the input/output switching circuit 3102. Combinations of values of the bits DQ0 and DQ1 of the command signal CM for designating auto refresh and self refresh may be varied.

A 1 bit command signal may be used as a signal bit for designating auto refresh/self refresh.

FIG. 165 is a diagram of signal waveforms showing the operation of the circuit shown in FIGS. 162 to 164. The operation will be described with reference to FIGS. 162 to 165.

Assume that data "0" (00) indicating auto refresh is set in accordance with the command register setting mode, in the command register RR2 of command register 270a. In this case, an output from gate circuit G100 attains "H" and an output from AND circuit G101 attains "L". Consequently, input/output switching circuit 3102 switches pin terminal 3110 as a signal input terminal. Pin terminal 3110 receives and passes an externally applied refresh designating signal REF#. In the auto refresh mode, an output from timer 3101 is neglected or timer 3101 is reset. In this state, a refresh address and an internal control signal int. *RAS are generated under control of refresh detecting circuit 3203 and refresh control circuit 3204 in accordance with externally applied refresh designating signal REF#, and the DRAM array is refreshed in accordance with the generated refresh address.

The command register setting mode is started at time Tx and when "1" (11) is set in register RR2 of command register 270a, an output from gate circuit G101 attains "H" and an output from gate circuit G100 attains "L". Consequently, input terminal 3110 is switched to data output terminal, by the function of the input/output switching circuit 3102. Refresh requesting signal *BUSY is transmitted from timer 3101 to pin terminal 3110, which is used as a signal representing that self refreshing is being carried out in the semiconductor memory device to the outside of the device.

Timer 3101 is activated in response to the setting of the self refresh mode in command register 270a, and applies a refresh request to refresh control circuit 3204. Refresh control circuit 3204 sets multiplexer 258 to a state in which output from refresh address counter 293 is selected, and controls generation of internal control signal int. *RAS from RAS signal generating circuit 3201 in response to the refresh request from timer 3101. When the refresh request is applied from refresh control circuit 3204, RAS signal generating circuit 3201 generates internal control signal int. *RAS at a predetermined timing.

In accordance with internal control signal int. *RAS, row selecting operation and sensing operation are carried out in the DRAM, and refreshing operation for the row designated by the refresh address from refresh address counter 293 is carried out. After a lapse of a predetermined time period, an output from timer 3101 rises to "H". Consequently, the refresh period is completed. Refresh control circuit 3204 increments address count value of refresh address counter 293 by 1, and stops generation of internal control signal int. *RAS from RAS signal generating circuit 3201.

The period in which the output from timer 3101 is maintained at "L" is set previously. The period in which the output of timer 3101 is kept at "L" is approximately the same as the memory cycle in a common DRAM. After the lapse of this period, timer 3101 resumes its operation, and after a lapse of a prescribed time period, generates a refresh request again and applies the same to refresh control circuit 3204. The DRAM array is refreshed under control of the refresh control circuit 3204 and RAS signal generating circuit 3201 in accordance with the refresh request.

The operation of timer 3101 is continued during designation of self refresh by command signal CM. The interval of refreshing of timer 3101 may be fixedly set in advance, or it may be programmed in accordance with the guaranteed time of data retainment of the semiconductor chip. As described above, the semiconductor memory device can be set to the auto refresh or self refresh mode in accordance with command signal CM set in the command register. When refresh designating signal REF# is at "H", the DRAM can be accessed. While refresh designating signal REF# is at "L", timer 3101 does not operate. Refresh operation is controlled externally. During the refreshing period, the DRAM array can not be externally accessed.

In self refreshing, refresh execution designating signal BUSY# is output from pin terminal 3110 during refreshing operation in the DRAM array. Therefore, by monitoring refresh execution designating signal BUSY# by an external device, the external device can determine as to whether the DRAM can be accessed, and self refreshing can be carried out in the normal mode.

The operation can be switched from self refresh to auto refresh by executing command register setting mode at a rise of clock signal K and by setting register RR2 of command register 270a to the auto refresh mode (see time Ty of FIG. 165). By so doing, the operation of the timer is inhibited, and auto refresh mode is set in the CDRAM.

By the above described structure, a CDRAM capable of executing auto refresh and self refresh in one chip can be provided. In addition, since execution timing of self refreshing can be known during the normal operation mode, self refresh can be utilized in the normal operation cycle.

[Modification of Self refresh/Auto refresh]

FIG. 166 shows a modification of the refresh circuit shown in FIG. 152. In the structure shown in FIG. 166, a BBU generating circuit 3210 is provided, and command signal CM from command register 270a is transmitted to BBU generating circuit 3210.

BBU generating circuit 3210 has a circuit structure for executing a battery backup mode. The BBU mode is described in, for example, "Battery Backup (BBU) Mode for Reducing Data Retaining Current in a Standard DRAM", Dosaka et al., Journal of Institute of Electronics, Information and Communication Engineers, 1990, No. 103, ED90-78, pp. 35 to 40, and in "38 ns 4M bit DRAM Having BBU Mode", Konishi et al., IEEE International Solid States Circuits Conference, 1990 Digest of Technical Papers, pp. 230 to 231 and p. 303. In the BBU mode, the number of arrays operating in the normal mode is reduced to ¼ in the battery backup mode of a standard DRAM so as to enable refreshing with low current to retain data.

Self refreshing is executed in the BBU mode. The BBU mode will be briefly described.

FIG. 167 is a diagram for illustrating the BBU mode. A DRAM array DRMA includes 32 small blocks MBA 1 to MBA 32. The DRAM array DRMA is further divided into memory block groups MAB 1 to MAB 4 by 8 small blocks. One small block is driven or activated in one group. This structure corresponds to the structure of FIG. 10. Array drivers MAD 1 to MAD 4 for driving the DRAM array are provided for the memory array block groups MAB 1 to MAB 4, respectively. A BBU control circuit BUC is provided for driving array drivers MAD 1 to MAD 4.

BBU control circuit BUC transmits a refresh requesting signal to one of array drivers MAD 1 to MAD 4 when a control signal REFS is applied. The refresh requesting signal REFR is successively transmitted to array drivers MAD 1 to MAD 4 from BBU control circuit BUC. Array drivers MAD 1 to MAD 4 drive one block in corresponding memory array groups MAB 1 to MAB 4, respectively. A row address signal (for example, RA8) applied from a path, not shown, determines which block is to be selected. In the normal mode, one block is selected from each of the memory array groups MAB 1 to MAB 4. Namely, four blocks (in the figure, memory blocks MBA 8, MBA 16, MBA 24 and MBA 32) are driven.

In the BBU mode, only one memory array group is driven and only one memory block is driven (in the shown example, memory array block MBA 32). Compared with the normal mode, the number of driven blocks is reduced to ¼, and thus current consumption in refreshing can be considerably reduced. The structure shown in FIG. 166 utilizes the BBU generating circuit (included in BBU control BUC).

FIG. 168 shows an example of a specific structure of the BBU control circuit BUC. Referring to FIG. 168, timer 3101 includes a ring oscillator 3121 oscillating at prescribed intervals, and a binary counter 3122 counting pulse signals from ring oscillator 3121 for generating a signal every prescribed period. Binary counter 3122 generates signals for determining refresh timing (for example, every 64 μs in self refreshing) and maximum counter value for example, 16 ms; specification value of the refresh cycle).

BBU control circuit BUC further includes a BBU signal generating circuit 3210 which start its operation in response to command signal CM and is activated in response to count up signal CUP 1 from binary counter 3122 for generating a battery backup mode designating signal BBU; and a REFS generating circuit 3123 responsive to the signal BBU from BBU signal generating circuit 3210 and to a refresh cycle defining circuit CPU 2 from binary counter 3122 for generating a refresh requesting signal REFS.

BBU signal generating circuit 3210 is activated in response to self refresh designation of command signal CM and waits for application of count up signal CUP 1 from binary counter 3122. BBU signal generating circuit 3210 is rendered inactive when command signal CM designates the normal mode or the auto refresh mode, and it resets refresh timer 3101.

Upon reception of count up signal CUP 1, BBU signal generating circuit 3210 generates the signal BBU. The signal BBU indicates that the CDRAM is switched to the battery backup mode. REFS generating circuit 3123 is activated in response to the signal BBU, and generates refresh requesting signal REFS every time refresh cycle defining signal CUP 2 is applied from binary counter 3122.

FIG. 169 shows a circuit structure for generating internal control signal int. *RAS. In the structure of FIG. 169, only the circuit structure for generating internal control signal int. *RAS out of RAS signal generating circuit 3201 and refresh control circuit 3204 shown in FIG. 163 is shown. RAS signal generating circuit 3201 includes a gate circuit (NOR circuit) G301 receiving the signals *RAS and BBU; an inverter circuit G302 receiving an output from gate circuit G301; and a gate circuit G303 receiving an output from inverter circuit G302 and refresh requesting signal RASS from refresh control circuit 3204. Gate circuit G301 generates a signal at "H" when signals applied to both input thereof are at "L". Gate circuit G303 generates a signal at "H" when one input thereof is at "L".

The signal *RAS denotes an array access designating signal which is determined by signals E and CH which are taken in the device at a rising edge of clock signal K in the CDRAM to which the present invention is applied. This signal may be generated from the row address strobe signal generating circuit shown in FIG. 109.

Refresh control circuit 3204 includes a delay circuit 3231 for providing a prescribed delay to internal control signal int. *RAS; and a RASS generating circuit 3232 responsive to refresh requesting signal REFS from REFS generating circuit 3123 and to an output signal *SC of delay circuit 3231 for generating refresh designating signal RASS. The Signal *SC from delay circuit 3231 represents completion of sensing, which is generated when sensing operation in the DRAM is completed and data of the memory cell to be refreshed is surely latched by the sense amplifier. RASS generating circuit 3232 renders active the internal control signal int. *RAS in response to refresh requesting signal REFS, and renders internal control signal int. *RAS in response to the generation of sense completion signal *SC.

The operation of the circuit shown in FIGS. 168 and 169 will be described with reference to FIG. 170 which is a diagram of signal waveforms.

The signal *RASS plays the role of *RAS in the BBU mode. When refresh requesting signal REFS is generated from REFS generating circuit 3123, signal *RASS from RASS generating circuit 3232 rises to "L" and is activated. In response, internal control signal output from gate circuit G303 rises to "H", and internal control signal int. *RAS output from inverter circuit G304 attains active "L".

Row selecting operation and sensing operation are carried out in the DRAM in accordance with internal control signal int. *RAS. After the completion of sensing operation, sense completion signal *SC from delay circuit 3231 falls to active "L".

In response to the fall of the sense completion signal *SC, RASS generating circuit 3232 raises output signal *RASS. In response, internal control signal int.RAS attains active "H", and thus refresh cycle in the DRAM is completed.

More specifically, in the BBU mode, a rise (transition to the active state) of refresh requesting signal REFS from REFS generating circuit 3123 is used as a trigger for carrying out a self-timed refreshing. By applying the signal BBU to gate circuit G301, array access is requested in the BBU mode, and even if *RAS is rendered active "L", the output from gate circuit G301 is kept at "L", whereby entrance to the array active cycle in the BBU mode is prevented. Although active level of the signal BBU is not shown, the signal BBU attains "H" when the BBU mode is designated.

FIG. 171 shows an example of a specific structure of RASS generating circuit 3232 shown in FIG. 169. RASS generating circuit 3232 is formed by a set-reset type flipflop. The flipflop receives refresh requesting signal REFS at its set input, and receives a sense completion signal *SC at its reset input /R. Signal *RASS is generated from /Q output thereof. Flipflop FFR is set in response to a rise of a signal applied to the set input S, and its /Q output becomes "0". It is reset in response to a fall of a signal applied to its reset input /R and its /Q output becomes "H".

[Application to Other Structures]

The above described structure shows an application to the CDRAM. However, this structure can be applied to a general dynamic type semiconductor memory device containing the DRAM array only. A common dynamic semiconductor memory device receives a row address strobe signal *RAS, a column address strobe signal *CAS and a write enable signal WE as external control signals. Switching between auto refresh and self refresh can be done in the dynamic semiconductor memory device receiving external control signals *RAS, *CAS and *WE.

FIG. 172 shows a circuit portion related to refresh mode setting circuit in a common dynamic semiconductor memory device. Referring to FIG. 172, the circuitry related to refreshing includes a command register 3502 receiving and latching an externally applied refresh mode designating signal *CR; an input/output switching circuit 3501 responsive to a command signal (refresh mode setting signal) CM set in command register 3502 for setting a terminal 3510 to an input terminal or an output terminal; and a clock generator 3503 receiving external control signals *RAS, *CAS, *WE and a refresh designating signal *REF when terminal 3510 is used as an input terminal, and receiving command signal CM from command register 3502 for generating various internal control signals of the semiconductor memory device and for controlling refreshing operation.

The dynamic semiconductor memory further includes a refresh address counter 3504 responsive to a control signal from clock generator 3503 for generating a refresh address; a row address buffer 3506 for passing one of externally applied addresses A0 to A9 and the outputs of refresh address counter 3504 for generating internal row address signals RA0 to RA9; and a column address buffer 3507 receiving externally applied address signals A0 to A9 for generating internal column address signals CA0 to CA9. Timings for taking respective address signals at the row address buffer 3506 and column address buffer 3507 are determined by an internal control signal from clock generator 3503. The timing for taking external row address signals A0 to A9 at the row address buffer 3506 is determined by external control signal *RAS, and timings for taking external address signals A0 to A9 of column address buffer 3507 is provided by external control signal *CAS.

Row address buffer 3506 includes not only a simple buffer circuit but also a multiplex circuit, though not explicitly shown. The multiplex circuit may receive external row addresses A0 to A9 and an output from refresh address counter 3504 to selectively transmit one of these to the buffer circuit. The multiplex circuit may receive row addresses A0 to A9 after the external addresses are converted to internal row addresses.

FIG. 173 shows an example of a specific structure of clock generator 3503 shown in FIG. 172. Referring to FIG. 173, clock generator 3503 includes a refresh detecting circuit 3510 receiving refresh designating signal *REF for determining whether or not there is a refresh designation; a RAS buffer 3511 receiving external control signal *RAS for generating internal control signal int. RAS; and a CAS buffer 3512 receiving external control signal *CAS for generating internal control signal int. CAS. When refresh detecting circuit 3510 detects a refresh designation, RAS buffer 3511 and CAS buffer 3512 are rendered inactive. When timer 3505 outputs a refresh request, buffers 3511 and 3512 are set to a signal input prohibited state under the control of refresh control circuit 3513 (the signal path in this case is not shown).

Clock generator 3503 further includes a pulse generating circuit 3514 responsive to refresh designation from refresh detecting circuit 3510 and refresh control circuit 3513 for generating an internal pulse signal having a prescribed width; and a gate circuit 3515 receiving internal control signal RAS from RAS buffer 3511 and pulse generating circuit 3514. Internal control signal int. RAS is generated from gate circuit 3515. The active period of the pulse generated by pulse generating circuit 3514 is the period necessary for the completion of refreshing in the DRAM. When a refresh request is generated from timer 3505, refresh control circuit 3513 generates a switching signal MUX to multiplexer (included in row address buffer 3506) so as to select the output from refresh address counter, and activates pulse generating circuit 3514 for generating a pulse signals at a prescribed timing.

Timer 3505 starts its operation in response to command signal CM from command register 3502 as in the above described embodiment, and generates pulse signals (refresh request signals) at prescribed intervals.

When auto-refreshing is designated by command signal CM, refresh control signal 3513 neglects the output from timer 3505, and carries out necessary control for refreshing in response to the output from refresh detecting circuit 3510. When command signal CM designates self refreshing, refresh control circuit 3513 carries out necessary control operations for refreshing of DRAM in accordance with the refresh request from timer 3505.

Returning to FIG. 172, the structure of the command register 3502 and input/output switching circuit 3501 is the same as that shown in FIG. 164. In this case, it is not necessary for the command register 3502 to latch refresh mode setting signal *CR in synchronization with the clock signal K, and it latches control signals applied at arbitrary timing. The refresh mode setting signal *CR applied externally may be a 1 bit signal or 2 bit signal.

By the above described structure, auto refreshing and self refreshing are both available in a common DRAM. By the function of input/output switching circuit 3501, one pin terminal 3510 can be switched to input terminal or output terminal. When pin terminal 3510 is set to an output terminal, it represents that self refresh is being carried out in the semiconductor memory device. In the self refresh mode, refresh requesting signal from timer 3505 is output as refresh execution designating signal *BUSY. Therefore, by monitoring the signal *BUSY, the timing of refreshing can be known by an external device.

By the structure of FIG. 172, a dynamic semiconductor memory device allowing self refreshing in the normal mode can be provided, in a common DRAM.

Further, a BBU generating circuit may be further connected as shown in FIG. 166 to the structure of the dynamic semiconductor memory device shown in FIG. 172.

In the structures shown in FIGS. 162, 166 and 172, the self refresh mode and the auto refresh mode can be selectively executed. When the output from command register 3502 has its level fixed by wire bonding, for example, pin terminal 3510 is fixedly used as an input terminal or an output terminal. Therefore, a semiconductor memory device (dynamic type semiconductor memory device or CDRAM) capable of auto refreshing operation only or a semiconductor memory device (dynamic type semiconductor memory device or a CDRAM) capable of self refreshing only can be optionally provided. Namely, semiconductor memory devices which can accommodate self refresh mode and auto refresh can be provided by one common of the semiconductor chip.

Especially by the structure realizing the auto refresh and the self refresh mode on the same semiconductor chip, the guaranteed time of data retainment of the chip can be measured by using the auto refresh mode in the refresh interval program necessary when the self refresh is set, and therefore self refresh cycle period can be set exactly.

When the auto refresh or the self refresh is to be fixed, it is not necessary to independently and separately provide an input/output switching circuit, and the pin terminal (for example, terminal 3510 in FIG. 172) may be set as an input terminal or the output terminal by interconnections. This structure is shown in FIGS. 174 and 175. In the structure of FIG. 174, refresh mode designating command CM set by refresh mode setting circuit 3550 is set to the supply voltage Vcc or ground potential Vss by wiring. In this structure, input/output switching circuit 3102 is fixedly set to an input circuit or an output circuit.

In the structure shown in FIG. 175, refresh mode setting circuit 3550 is set to the auto refresh mode or the self refresh mode by wiring, as in the structure of FIG. 174. Input/output switching circuit 3551 is set to a signal input circuit or a signal output circuit by wiring, as shown by the dotted lines.

In the above described structures also, signal BUSY# is externally output in the self refresh mode, and therefore self refresh can be carried out in the normal mode.

[Another Embodiment of Address Allottance]

In the CDRAM, the row address and the column address are applied as DRAM address Aa time division multiplexedly, as described previously. However, even if the period of the external clock K is made longer (including intermittent generation), it is preferred to operate the CDRAM at a speed as high as possible. A structure for operating the CDRAM at high speed will be described. The following structure which will be described with reference to FIGS. 177 to 185 is another embodiment of address allotting method shown in FIGS. 71 and 72.

FIG. 176 shows a further embodiment of the address allotting method. In the structure shown in FIG. 176, an internal address int. Ac from an address buffer 4001 is also applied to DRAM column decoder 103. Namely, a part of the DRAM column address and the SRAM address are shared.

Address buffer 255 shown in FIG. 32 or address generating circuit 360 shown in FIG. 105 may be used as address buffer 4001. In the structure shown in FIG. 176, by applying a row address as an address Aa externally and by applying a column address as an address Ac, the DRAM address can be provided in non multiplexed manner without increasing the number of external pin terminals. Therefore, timings for taking column address of the DRAM can be made faster than in the multiplexing method, and the speed of operation of the DRAM can be increased. The structure for utilizing the SRAM address and the DRAM address will be described in detail.

FIG. 177 shows more specifically the structure in which SRAM address and DRAM address are commonly used. Referring to FIG. 177, address buffer 4001 includes a buffer circuit 4010 receiving external column address signals Ac0 to Ac3 for the SRAM for generating an internal column address signal; a buffer circuit 4011 receiving external address signals Ac4 to Ac11 for generating internal address signals; and a buffer circuit 4012 receiving external address signals Aa0 to Aa9 for generating internal row address signals for the DRAM. The buffer circuits 4010, 4011 and 4012 latches external addresses and generates internal address signals in response to internal clock signal int. K or strobe signals /RAS, /CAL.

An internal address signal from buffer circuit 4010 is applied to SRAM column decoder 203. An internal address signal from buffer circuit 4011 is applied to a determining circuit 4020. An internal address signal from buffer circuit 4012 is applied to DRAM row decoder 102.

Determining circuit 4020 determines whether the address signal from buffer circuit 4011 is to be applied to SRAM row decoder 202 or DRAM column decoder 103, in accordance with chip select signal E and cache hit designating signal CH (these signals may be internal signals or external signals).

When the SRAM array is accessed, determining circuit 4020 applies the internal address signal from buffer circuit 4011 to SRAM row decoder 202. When the DRAM array is accessed, determining circuit 4020 applies the address signal from buffer circuit 4011 to DRAM column decoder 103.

In the structure shown in FIG. 177, out of columns selected by DRAM column decoder 103 in the DRAM array, 4 bits (in case of 4M CDRAM) are further selected, by an output from SRAM column decoder 203.

In the structure shown in FIG. 177, address signals Aa0 to Aa9 are used as array row address signals for designating a row of the DRAM array. Address signals Ac0 to Ac3 are used as cache column address signals for designating a column in the SRAM array and as array column address signals in direct access to the DRAM array. Address signals Ac4 to Ac9 are used as cache row address signals for designating a row in the SRAM array, and an array column address signals for designating columns in the DRAM array.

By the structure in which address signals Ac0 to Ac11 and Aa0 to Aa9 can be independently applied and buffer circuits 4010, 4011 and 4012 simultaneously take applied address signals and generate internal address signals, as in the structure of FIG. 177, the row address signals and column address signals for the DRAM array can be simultaneously taken, and therefore access time in the DRAM array can be significantly reduced.

FIG. 178 shows an example of a specific structure of determining circuit 4020 shown in FIG. 177. Referring to FIG. 178, determining circuit 4020 includes a gate circuit G400 receiving internal chip select signal E and internal cache hit designating signal CH (which is generated from control clock buffer 250 shown in FIG. 32 or 105); and switching transistors Tr400 and Tr401 which are selectively turned on in response to an output from gate circuit G400. Switching transistor Tr400 transmits address signals from buffer circuit 4011 (see FIG. 177) to SRAM row decoder 202. Switching transistor Tr401 transmits internal address signals Ac4 to Ac11 to DRAM column decoder 103.

Gate circuit G400 generates a signal at "H" when both inputs thereof are at "L". The signals E and CH are both at "L" at a time of cache hit, that is, the time of accessing to the SRAM array. In that case, switching transistor Tr400 turns on, and internal address signals Ac4 to Ac11 are transmitted as SRAM row address signals to SRAM row decoder 202.

When the DRAM array is accessed, signal CH# attains to "H", and hence output of gate circuit G400 attains "L". Switching transistor Tr401 turns on and internal address signals Ac4 to Ac11 are transmitted to DRAM column decoder 103.

In the structure of determining circuit shown in FIG. 178, address signals can not be simultaneously transmitted to the DRAM and the SRAM in the block transfer mode and in the copy back mode. A structure in which switching transistors Tr400 and Tr401 are both turned on when the block transfer mode and the copy back mode are designated may be additionally provided in this case. Such a structure can be easily implemented by referring to the combination of the control signals shown in FIG. 76 or 215.

In the structures shown in FIGS. 177 and 178, SRAM address signal lines Ac4 to Ac11 are branched into DRAM address signal lines and SRAM address signal lines. In this case, load capacitance associated with SRAM address signal lines connected to SRAM row decoder is increased. If the load capacitance associated with the SRAM address signal line is increased, signal delay occurs, an access time at a time of cache hit is increased. Therefore, load of the SRAM address line must be as small as possible. A structure for preventing increase of load capacitance associated with the SRAM address signal line is shown in FIG. 179.

Referring to FIG. 179, SRAM row decoder 202 includes a predecoder 4051 for pre-decoding internal address signals from address buffer 4010; and a SRAM row decoder 4052 for further decoding the pre-decoded signals from predecoder 4051 for selecting a word line in the SRAM array. The method of pre-decoding addresses described above is employed in common semiconductor memory devices in view of reduction in occupied area of the address signal lines and reduction of decoder circuit scale.

In such a structure as shown in FIG. 179, a pre-decoded signal from predecoder 4051 is transmitted to the DRAM column decoder as shown in (i) of FIG. 169. In this case (I), the length of SRAM address signal lines from address buffer 4010 can be made shorter, and delay in address signals can be reduced.

The SRAM word line selecting signal from SRAM row decoder 4052 may be applied to the DRAM column decoder (see case (II) of FIG. 179). When the SRAM word line selecting signal from SRAM row decoder 4052 is to be applied to the DRAM column decoder, the DRAM column decoder is simply comprised of a common buffer. In the case (II), since word line driving circuit are provided for respective SRAM word lines for driving the SRAM word lines, signal transmission delay is not generated on the SRAM word lines.

In the structure shown in FIG. 179, the influence of delay incidental to determining operation in determining circuit 4020 on the access time of SRAM array can be reduced. More specifically, determination as to whether DRAM array is accessed or SRAM array is accessed takes some time in the determining circuit 4020. In order to carry out cache hit operation at a high speed, the influence of time necessary for determining operation in determining circuit 4020 on the accessing to the SRAM array must be reduced.

Speed of operation in the DRAM array is not so high as in the SRAM. Therefore, the time for determination in the determining circuit 4020 does not affect the column selecting operation in the DRAM array. Therefore, by the structure shown in case (I) or (II) of FIG. 179 in which the SRAM address signal line and the DRAM column address signal lines are branched after the predecoder circuit 4051, any adverse influence to the access time for the SRAM array can be surely eliminated.

In the structure shown in FIG. 179, determining circuit shown in FIG. 178 may be provided at the branching point. Alternatively, signal lines successive to predecoder 4051 may be branched directly to SRAM signal lines and DRAM signal lines. In this case, address signals (pre-decoded signal or the SRAM word lines selecting signal) are directly transmitted to the DRAM column decoder. The operations of the DRAM row decoder, DRAM column decoder and the SRAM column decoder are controlled by determining circuit 4030 shown in FIG. 180. SRAM row decoder 202 is adapted to operate when the SRAM array is accessed and the DRAM array is accessed. In the SRAM row decoder 202, where address signal lines are branched at the output stage of predecoder 4051, the predecoder operates, and operation of SRAM row decoder 4052 is controlled by determining circuit 4030. Where signal lines are branched at the output stage of SRAM row decoder 4052, SRAM row decoder 4052 operates until determination by determining circuit 4030 is completed.

Even if the SRAM decoder is commonly used for selecting a column in the DRAM array and a column in the SRAM array, only the bit line pair in one of the arrays is connected to the internal data line, and therefore collision of data does not occur (see FIGS. 33, 49 and 57). A structure for controlling driving of the SRAM array and the DRAM array by the determining circuit is shown in FIG. 180.

Referring to FIG. 180, determining circuit 4030 receives internal control signals W, E, CH, CI and CR and controls operations of DRAM array driving circuit 260 and SRAM array driving circuit 264 in accordance with combinations of the control signals. Command register set signal CR is also applied to determining circuit 4030 because command register setting signal CR (CC2) is used when high speed copy back operation mode is set, as will be described later. By the structure of FIG. 180, row and column selecting operations in the DRAM array and the SRAM array can be carried out in parallel. Row and column selecting operations in the SRAM array and the DRAM array can be executed by taking addresses in parallel in the block transfer mode, the copy back mode and the like.

The operation in this method of commonly using addresses will be described.

FIG. 181 shows timings of operations at a cache miss. At a time of a cache miss, external control signal E# is set to "L" and cache hit designating signal CH# is set to "H" at a rising edge of clock K. Consequently, a cache miss is set. External address signals Aa and Ac applied at a rising edge of clock signal K are taken as a row address signal (R) and a column address signal (C) of the DRAM. Consequently, the initiate cycle TMMI is executed. Subsequent to the initiate cycle TMMI, array active cycle TMMA is carried out, and data selecting operation is carried out in the DRAM in accordance with the applied row address signal (R) and the column address signal (C). Block transfer or high speed copy back mode operation may be carried out in the array active cycle TMMA. By setting chip select signal E# to "L" at a rising edge of clock signal K in the last period of the array active cycle TMMA, data Q corresponding to the applied address signals R and C is output (When data reading operation is set).

In data writing, by setting chip select signal E# and write enable signal W# (not shown) to "L" in the initiate cycle TMMI, write data is written to the SRAM array as well as to the DRAM array.

When the array active cycle TMMA is completed, the precharge cycle TMMP is carried out and the DRAM array is set to the precharge state. In the precharge cycle TMMP, the SRAM array can be accessed. Internal address signal Ac is taken as the SRAM address signal at a rise of clock signal K and a corresponding memory cell in the SRAM array is accessed.

Thereafter, the array write cycle TMA is executed, and data is transferred from the SRAM array to the DRAM array (copy back; transfer of latched data to the DRAM array). The array write cycle TMA includes an initiate cycle TMI and an array active cycle TMMA. In the array active initiate cycle TMAI, chip select signal E# is set to "L" at a rising edge of clock signal K, and externally applied addresses Aa and Ac are taken as the row address signal (R) and column address signal (C). Thereafter, in the array write cycle TMA, corresponding data of the SRAM array latched in a latch circuit is transferred to the DRAM array. Data transfer from the latch to the DRAM array is carried out in the array active cycle TMMA.

In the array write cycle TMA, data transfer from the latch circuit (see FIGS. 49 and 57) to the DRAM array is carried out, and therefore the SRAM array can be accessed. The access to the SRAM array in the array active cycle TMMA is shown in FIG. 181 as the address signal Ac being valid (V). Consequent to the cache miss cycle TM, a cache hit cycle TH or a standby cycle TS is carried out.

Specific reading operation and writing operation will be described. FIG. 182 shows timings of operations at a miss read. FIG. 182 shows a clock period of 20 ns as an example. In case of a miss read, only the chip select signal E# is set to "H" at a rising edge of clock signal K. At this time, addresses (ROW 1 and COL 1) applied from a CPU (external operational processing unit) are taken as the row address signal and the column address signal for the DRAM array. In this miss read operation, the DRAM array is accessed in accordance with the row address signal ROW 1 and COL1. Data transfer from the DRAM array to the SRAM array may be carried out during this operation. In this case, the same addresses are applied to the SRAM array and the DRAM array. In miss operations accompanied with data transfer from the DRAM array to the SRAM array, the structure of determining circuit 4030 shown in FIG. 180 is employed. If the structure of determining circuit 4020 shown in FIG. 177 is used, address signal Ac may be taken in accordance with the rising of the second clock signal K to carry out row selecting operation of the SRAM array. After a lapse of a prescribed time period, output enable signal G# is made to "L". When the output enable signal G# falls to "L", data Q1 corresponding to the applied addresses ROW1 and COL1 is output.

Thereafter, precharge cycle of the DRAM array is carried out. In the precharge cycle, SRAM array can be accessed. Simultaneously with the start of the precharge cycle, hit read operation starts in FIG. 182. In the hit read operation, chip select signal E# and cache hit designating signal CH# are both set to "L" at a rising edge of clock signal K. Accordingly, address signal Ac is taken as a signal for selecting a row and a column in the SRAM array and the corresponding memory cell data Q2 is output in that clock cycle. Referring to FIG. 182, a hit read and a hit read are continuously executed. In respective hit read cycles, output data Q3 and Q4 are output in accordance with addresses C3 and C4.

After the completion of the precharge cycle of the DRAM array, the array write cycle is carried out. In this array write cycle, corresponding data in the SRAM array has been already latched at the time of miss read, and the latched data is transferred to the DRAM array. The array write cycle is set by setting chip select signal E# to "L", cache hit designating signal CH# to "H", control signal CC1# (corresponding to cache access inhibiting signal CI#) to "L" and write enable signal W# to "L" at a rising edge of clock signal K.

In the array write cycle, externally applied address signals (miss addresses) Ac and Aa are both taken as the column address signal and the row address signal for the DRAM. In this state, the SRAM array can not be accessed. In the setting cycle of the array write cycle, execution of hit write cycle is inhibited even if a hit write occurs. Therefore, cache hit designating signal CH# is set to "H".

Subsequent to the setting cycle of the array write cycle, a hit read cycle is carried out. In the hit read cycle, chip select signal E# and cache hit designating signal CH# are set to "L", and output enable signal G# is set to "L". In this state, the SRAM array is accessed in accordance with the address signal Ac, and corresponding data Q5 is output. In the example of FIG. 182, cache read is again carried out in the last cycle of the array write cycle, and cache data Q6 in accordance with address C6 is output.

In the array write setting cycle, the address Aa is represented as a miss address (Miss Add). It means that the address necessary for transferring data from the SRAM array to the DRAM array is an address from an externally provided tag memory. FIG. 183 shows operation timings at a miss write. The miss writing is set by setting chip select signal E# to "L" and write enable signal W# to "L" at a rising edge of clock signal K. At this time, external addresses Ac and Aa are taken as the column address COL 1 and row address ROW 1 of the DRAM array, and externally applied write data D1 is taken. In this miss writing, the DRAM and SRAM arrays are accessed, and data D1 is written to a corresponding memory cell of the SRAM array. Writing of data to the SRAM and DRAM arrays may be carried out in accordance with any of the data transfer methods described above.

When the miss write cycle is completed, the DRAM array enters the precharge cycle. In the precharge cycle, the SRAM can be accessed. In the example of FIG. 183, hit read, hit read and hit write operations are carried out. In respective operation cycles, the address Ac is taken as SRAM array addresses C2, C3 and C4, respectively, output data Q2 and Q3 are output, and write data D4 is written.

Thereafter, the array write cycle is executed. The array write cycle is similar to that shown in FIG. 182. In the setting cycle of the array write cycle, control signal CC1# (corresponding to the array access designating signal (cache access inhibiting signal) CI#) is set to "L" and access to the SRAM array is inhibited. Therefore, even if a hit read occurs in the array write setting cycle, this hit reading is not carried out.

Successive to the setting cycle for the array write cycle, a hit write cycle is carried out. The hit write cycle is set by setting chip select signal E# to "L" at a rising edge of clock signal K. Since hit reading is designated, write enable signal W# is set to "H" and output enable signal G# is set to "L" in this state. In this state also, the array write cycle is set, external address (Miss Add) is simultaneously applied as addresses Ac and Aa, and these addresses are taken as the column address Col 2 and row address Row 2 of the DRAM array.

A hit write cycle is executed successive to the array write setting cycle, the address Ac is taken as an address C5 for the SRAM, and data D5 applied at that time is written to the corresponding SRAM memory cell. A hit read cycle is executed in the last cycle of the array write cycle, address Ac is taken as a column address C6 of the SRAM array, and corresponding data Q6 is output.

FIGS. 184 and 185 show the manner of connection between a memory controller and the CDRAM in accordance with the method in which the addresses are commonly used.

FIG. 184 shows connection between an external control device and the CDRAM in accordance with direct mapping method. The manner of connection shown in FIG. 184 corresponds to the manner of connection shown in FIG. 79. In this manner of connection shown in FIG. 184, 8 bits of address signals A6 to A13 are applied to SRAM row decoder 202. 6 bits of address signals A6 to A11 of 8 bits of address signals A6 to A13 are applied to DRAM column decoder 103. Address signals A12 and A13 from the CPU and 8 bits of address signals A14 to A21 from a selector 672 are applied to row decoder 102 of DRAM 100. In this structure shown in FIG. 184, row address signals and column address signals of the DRAM are applied in non-multiplexed manner. Therefore, a multiplex circuit as shown in FIG. 79 is not externally provided. Chip select signal E# and cache hit designating signal CH# are applied to a clock control circuit 4400, and operations in accordance with accessing to the SRAM array and to the DRAM array are carried out. Clock control circuit 4400 includes control clock buffer 250, SRAM array driving circuit 264 and DRAM array driving circuit 260 shown in FIG. 32 or 105, and determining circuit 4030 shown in FIG. 180.

Referring to FIG. 184, address signals A6 to A11 are applied to column decoder 103 for the DRAM array from an output portion of SRAM row decoder 202. Signals may be output from predecoder portion as shown in FIG. 179, or, alternatively, SRAM word line selecting signals may be applied. FIG. 184 simply shows that part of the row address signals of the SRAM array and part of column address signals of the DRAM are functionally used commonly. FIG. 184 does not exactly reflect the actual manner of connection.

The structure of external control circuit 650 is the same as that shown in FIG. 79. Compared with FIG. 79, in the structure of FIG. 184, multiplex circuit 705 for multiplexing the row address signals and the column address signals for the DRAM is not necessary, the system size can be reduced, and DRAM column addresses can be easily taken.

FIG. 185 shows a manner of connection of addresses when the CDRAM has a cache structure of 4 way set associative method. The structure shown in FIG. 185 corresponds to the address connecting structure shown in FIG. 170. In the structure of FIG. 185, address signals A6 to A11 from the CPU and way addresses W0 and W1 from a controller 750 are applied to SRAM column decoder 202. Out of address signals applied to SRAM row decoder 202, address signals A6 to A11 are applied to DRAM column decoder 103. Other structures are the same as those shown in FIG. 80 except that multiplex circuit 700 for multiplexing a row address and a column address of the DRAM array is not provided. The corresponding portions are denoted by the same reference characters.

In this structure also, even if address signals are commonly used by the SRAM and DRAM, the cache structure can be easily changed.

As described above, by using some of the SRAM address bits as DRAM address bits, address non-multiplexing method of the DRAM address can be realized without increasing the number of pin terminals, and column addresses for the DRAM array can be easily taken.

[A Further Embodiment of Data Transfer Method]

In a CDRAM, it is preferred to access at high speed even at a cache miss. A structure for transferring and reading data at high speed even at a cache miss will be described with reference to FIGS. 186 through 193.

Briefly stating, DRAM array have data reading path and data writing path provided separately from each other.

FIG. 186 shows a structure which carries out high speed data transfer, high speed data reading even at a cache miss, and increases speed of operation of data transfer such as high speed copy back mode. FIG. 186 shows structures of portions related to one memory block.

In a DRAM, a data reading path and a data writing path are provided separately. Accordingly, a global IO line includes global read line pairs GOLa and GOLb for transmitting data read from the DRAM array, and global write line pair GILa and GILb for transmitting write data to the DRAM array. The global read line pair GOLa and the global write line pair GILa are arranged parallel to each other, and global read line pair GOLb and the global write line pair GILb are arranged parallel to each other. The global read line pair GOL (generally represents global read line pairs) and the global write line pair GIL (generically represents global write line pairs) correspond to the global IO line pair GIL shown in FIG. 8.

Local read line pair LOLa and LOLb are provided corresponding to the global read line pairs GOLa and GOLb. Local write line pairs LILa and LILb are provided corresponding to the global write line pairs GILa and GILb.

A read gate ROGa which turns on in response to a read block selecting signal φRBA is provided between the global read line pair GOLa and local read line pair LOLa. A read gate ROGb which turns on in response to a read block selecting signal φRBA is provided between global read line pair GOLb and local read line pair LOLb.

A write block selecting gate WIGa which turns on in response to a write block selecting signal φWBA is provided between global write line pair GILa and local write line pair LILb. A write block selecting gate WIGb which turns on in response to a write block selecting signal φWBA is provided between global write line pair GILb and local write line pair LILb.

A local transfer gate LTG for transmitting selected memory cell data to local read line pair LOL, and a write gate IG for connecting the selected memory cell to local write line pair LIL are provided for each bit line pair DBL.

A write column selecting line WCSL and a read column selecting line WCSL are provided for setting local transfer gate LTG and write gate IG to a selected state (conductive state). A write column selecting line WCSL and a read column selecting line RCSL constitute a pair and arranged in parallel. A write column selecting signal generated when data is to be written from DRAM column decoder is transmitted to write column selecting line WCSL. A read column selecting line generated when data is to be read from the DRAM array is transmitted to read column selecting line RCSL. The write column selecting line WCSL and read column selecting line RCSL are arranged to select two columns, respectively. This structure corresponds to the column selecting line CSL shown in FIG. 8 divided into a signal line for selecting a column for writing and a signal line for selecting a column for reading.

Local transfer gate LTG includes transistors LTR 3 and LTR 4 for differentially amplifying a signal on DRAM bit line pair DBL, and switching transistors LTR 1 and LTR 2 which turn on in response to a signal potential on read column selecting line RCSL for transmitting the signal amplified by the transistors LTR 3 and LTR 4 to local read line pair LOL. One terminal of each of the transistors LTR 3 and LTR 4 is connected to a fixed potential Vss, which is, for example, the ground potential. In this structure, local transfer gate LTG inverts the potential on DRAM bit line pair and transmits the same to local read line pair LOL. Transistors LTR 3 and LTR 4 are formed of MOS transistors (insulated gate type field effect transistors), with their gates connected to the DRAM bit line pair DBL. Therefore, local transfer gate LTG transmits the signal potential on the DRAM bit line pair DBL at high speed to local read line pair LOL without any adverse influence to the signal potential on the DRAM bit line pair DBL.

Write gate IG includes switching transistors IGR 1 and IGR 2 which turn on in response to the signal potential on write column selecting line WCSL for connecting the DRAM bit line pair to local write line pair LIL.

Other structures in the DRAM array are the same as those shown in FIG. 8.

Transfer gates BTGA and BTGB are provided corresponding to two pairs of global write line pair GIL and global read line pairs GOL. Transfer gate BTG (generically represents transfer gates BTGA and BTGB) is connected to global read line pairs GOL and global write line pairs GIL. Structures of transfer gates BTGA and BTGB will be described in detail later. Transfer control signals φTSL, φTLD and φTDS are applied to transfer gates BTGA and BTGB.

Control signal φTDS is generated when data is to be transferred from the DRAM array to the SRAM array. Control signal φTSL is generated when data is to be transferred from the SRAM array to the latch in the transfer gate BTG. Control signal φTLD is generated when the latched data is to be written to the DRAM array. Transfer gates BTGA and BTGB, detailed structure of which will be described later, include latching means for latching data read from the SRAM array. Data transfer operation between the DRAM array and the SRAM array when the circuit of FIG. 186 is used will be described.

FIG. 187 is a diagram of signal waveforms showing data transfer operation from the DRAM to the SRAM in the array structure shown in FIG. 186. The signal waveforms of data transfer operation shown in FIG. 187 correspond to the signal waveforms showing data transfer operation of FIG. 55.

At time t1, equalizing signal φEQ falls to "L" and precharging state in the DRAM array ends. Then a DRAM word line DWL is selected at t2, and potential at the selected word line rises.

At time ts1, row selecting operation is being carried out in the SRAM array, potential of the selected SRAM word line SWL rises to "H", and memory cell data connected to the selected word line is transmitted to SRAM bit line pair SBL. The signal potential on SRAM bit line pair SBL is transferred to the latching means included in the transfer gate in response to transfer designating signal φTSL and latched therein.

In the DRAM, signal potential on the selected word line DWL rises to "H" at time t2, and when signal potential on DRAM bit line pair DBL attains sufficient magnitude, sense amplifier activating signal φSAN attains "L" at time t3 and sense amplifier activating signal /φSAP rises to "H" at time t4. Consequently, signal potentials on DRAM bit line pair DBL are set to "H" and "L" corresponding to the read data, respectively.

Local transfer gate LTG directly receives signal potentials on the DRAM bit line pair DBL.

Before the rise of the sense amplifier activating signal /SAN at time t3, signal potential to read column selecting line RCSL rises to "H". Consequently, small change of the signal potential generated in DRAM bit line pair DBL is amplified at high speed at local transfer gate LTG and is transmitted to local read line pair LOL.

When signal potential on DRAM bit line pair DBL is transmitted to local read line pair LOL, read block selecting signal φRBA rises to "H" at time t7'. Consequently, local read line pair LOL is connected to global read line pair GOL, and the change in signal potential generated in the DRAM bit line pair DBL is transmitted through global read line pair GOL to transfer gate BTG.

Before the generation of change in signal potential of the global read line pair GOL at time t7', transfer control signal φTDS has been generated at time t3. The change in signal potential generated on global read line pair GOL is transmitted to a corresponding memory cell of the SRAM array at high speed through the transfer gate BTG.

Therefore, by the time the amplifying operation on DRAM bit line pair DBL by DRAM sense amplifier DSA is completed at time t5, data transfer to the SRAM array has already been completed.

By such a structure as described above in which a local transfer gate is provided and DRAM bit line pair DBL is connected to transfer gate BTG, data transfer can be carried out without waiting for completion of sense amplifying operation by DRAM sense amplifier DSA.

Arrows and signal waveforms shown by dotted lines in FIG. 187 show differences over data transfer operation shown in FIG. 55. As is apparent from the comparison of the signal waveforms, transfer gate BTG can be activated (control signal φTDS can be generated) before activation of DRAM sense amplifier DSA, and accordingly data can be transferred at high speed in the structure shown in FIG. 187.

The SRAM array can be accessed immediately after the data transfer from the DRAM array. Therefore, the SRAM array can be accessed at high speed even at a cache miss.

The data transfer operation from the SRAM array to the DRAM array will be described with reference to FIG. 188 showing operation timings thereof.

Data transfer from the SRAM array to the DRAM array is carried out through global write line pair GIL. In this case, global read line pair GOL and local read line pair LOL are not used.

At time t1, the precharge cycle of the DRAM array is completed. At time t2, a DRAM word line DWL is selected, and potential of the selected word line rises to "H". At t3 and t4, sense amplifier activating signals φSAN and /φSAP are rendered active, respectively, and signal potentials at DRAM bit line pair DBL attain to values corresponding to the data of the selected memory cell.

At time t5, a write column selecting line WCSL is selected and signal potential of the selected write column selecting line WCSL rises to "H". Consequently, a selected write gate IG turns on, and local write line pair LOL is connected to the selected DRAM bit line pair DBL.

At time t6, write block selecting signal φWBA rises to "H". Consequently, local write line pair LIL is connected to global write line pair GIL, and signal potential on global write line pair GIL attains to a value corresponding to the signal potential on local write line pair LIL.

At time t7, transfer control signal φTLD rises to "H", and data which has been latched in transfer gate BTG is transmitted to the selected DRAM bit line pair DBL through global write line pair GIL and local write line pair LIL.

FIG. 189 shows a structure of a portion carrying out data transfer from the DRAM array to the SRAM array, of the transfer gate BTG. Referring to FIG. 189, transfer gate BTGR includes transistors Tr500 and Tr501 for differentially amplifying signal potentials on global read lines GOL and *GOL; and switching transistors Tr503 and Tr502 responsive to transfer control signal φTGS for transferring signal potentials on global read lines GOL and *GOL to SRAM bit lines SBLa and *SBLa. Transistor Tr500 has its gate coupled to complementary global read line *GOL. Global read lines GOL and *GOL are coupled to local read lines LOL and *LOL, respectively. In the structure shown in FIG. 189, the read block selecting gate is omitted for simplification.

In local transfer gate LTG, when the potential on DRAM bit line DBL is at "H", transistor LTR 4 is rendered deeper on, and transistor LTR 3 is rendered shallower on. Thus a large current flows through transistor LTR 4. The signal potential on DRAM bit line DBL is inversely transmitted to global read line *GOL. The signal potential on DRAM bit line *DBL is inversely transmitted to local read line LOL. Transistors Tr500 and Tr501 receive the same potential at their gates, and they constitute a current mirror type current source to pass the same current flow to the transistors LTR4 and LTR3 through the global read lines *GOL and GOL. The current flowing through transistor Tr500 is discharged through transistors LTR 2 and LTR 4.

Since a current mirror circuit is formed, the same current as in transistor Tr500 flows in the transistor Tr501. However, since transistor LTR 3 is at shallow on state or off state, the signal potential of global read line GOL is charged to "H" at high speed. After the signal potentials of global read lines GOL and *GOL are sufficiently amplified to "H" and "L", transfer control signal φTDS rises to "H", and signal potentials on global read lines GOL and *GOL are transmitted to SRAM bit lines SBL and *SBL, respectively.

In the structure of transfer gate BTGR, transistors Tr500, Tr501, LTR 1, LTR 2, LTR 3 and LTR 4 constitute a current mirror type amplifying circuit. Even if the signal potential transmitted to DRAM bit lines DBL and *DBL is small, it can be amplified at high speed, and signal potentials on global read lines GOL and *GOL attain to (inverted) values corresponding to DRAM bit lines *DBL and DBL. By this structure, the potentials on the DRAM bit lines are amplified by the current mirror type amplifying circuit having DRAM bit lines *DBL and DBL as direct inputs and are transmitted to SRAM bit line pair SBLa, *SBLa. Thus data can be transferred at high speed from the DRAM array to the SRAM array.

FIG. 190 shows a structure of the transfer gate shown in FIG. 186 for transferring data from the SRAM array to the DRAM array. The structure of data transfer gate BTGW shown in FIG. 190 corresponds to a structure of data transfer circuit shown in FIG. 51 with amplifying circuit portion omitted.

Referring to FIG. 190, data transfer gate BTGW includes a transmission gate 5103 responsive to transfer control signal φTSL for inverting and transmitting data on SRAM bit lines SBLa and *SBLa; a latch circuit 5100 for latching data of SRAM bit lines SBLa and *SBLa which have been transmitted from transmission gate 5103; and transmission gates 5102a an 5102b responsive to transfer control signal φTLD for transmitting data latched in latch circuit 5100 to global write lines GIL and *GIL, respectively.

Transfer gate BTGW further includes a gate circuit 5101b responsive to an array write designating signal AWDE and a DRAM column decoder output (which is also a SRAM column decoder output) SAY for connecting internal write data line *DBW to global write line *GIL; and a gate circuit 5101a responsive to the array write designating signal AWDE and column decoder output SAY for connecting internal write data line DBW to global write line GIL. When the DRAM array is directly accessed, write data is transmitted through gate circuits 5101a and 5101b to the DRAM array.

Transfer gate BTGW further includes gate circuits 5104a and 5104b responsive to a write designating signal SWDE to the SRAM and to SRAM column decoder output (which is also a column selecting signal of the DRAM array) SAY for connecting external write data lines DBW and *DBW to SRAM bit lines SBLa and *SBLa. The structure of transfer gate BTGW shown in FIG. 190 is the same as that of the portion for transferring data from SRAM array to the DRAM array in the transfer gate shown in FIG. 57, and therefore detailed description thereof is not repeated.

FIG. 191 shows a circuit structure for driving write column selecting signal line WCSL and read column selecting signal line RCSL. Referring to FIG. 191, a signal driving circuit 5110 is provided with respect to a column selecting line CSL from DRAM column decoder 103. Signal line driving circuit 5110 includes a gate circuit 5111 receiving a column selecting signal CSL from DRAM column decoder 103 and an internal write enable signal *W, and a gate circuit 5112 receiving column selecting signal CSL, sense completion signal SC and internal write enable signal W. A signal for driving read column selecting line RCSL is output from gate circuit 5111. A signal for driving write column selecting line WCSL is output from gate circuit 5112.

Internal write enable signals *W and W may be taken inside in synchronization with clock K in response to an externally applied control signal W#. The internal write enable signal W may be generated at the same timing as the array write designating signal AWDE. Sense completion signal SC indicates completion of sensing operation of sense amplifier DSA in the DRAM array, which is generated by providing a prescribed delay to sense driving signal φSANE or φSAPE. In this manner, a structure in which read column selecting line RCSL is selected when data is to be written to the DRAM, and write column selecting line WCSL is selected when data is to be written from DRAM array can be provided.

FIG. 192 shows a structure for generating block selecting signals φRBA and φWBA. The circuit for generating read block selecting signal φRBA includes a delay circuit 5120 providing a prescribed time delay to read column selecting signal RCSL, and a gate circuit 5121 receiving an output from delay circuit 5120 and block selecting signal φBA (see FIG. 8). Read block selecting signal φRBA is output from gate circuit 5121.

The circuit for generating write block selecting signal φWBA includes a delay circuit 5130 for providing a prescribed delay to write column selecting signal WCSL, and a gate circuit 5131 receiving an output from delay circuit 5130 and block selecting signal φBA. Gate circuit 5131 generates write block selecting signal φWBA. Gate circuits 5121 and 5131 generate signals at "H" when both inputs thereof are at "H".

In the above described structure in which data writing path and reading path are separately provided in the DRAM array, data must be transferred from the DRAM array to the SRAM array as fast as possible. Therefore, it is preferred to drive block selecting signal φRBA and read column selecting line RCSL at a timing as fast as possible. The structure of FIGS. 176 and 177 in which address signals of the DRAM array and the SRAM array are commonly used is most effective for this structure. By this structure, the row address signal and the column address signal for the DRAM array can be applied in the non-multiplexed manner, read column selecting line RCSL can be generated immediately after the selection of the word line DWL in the DRAM array to render conductive the local transfer gate, and the DRAM bit line pair can be coupled at an earlier timing to the transfer gate BTG through local read line pair LOL and global read line pair GOL.

FIG. 193 shows a structure of a decoder circuit when the non-multiplexed address method structure is applied to the separated IO structure of the DRAM array. Referring to FIG. 193, SRAM column decoder 5141 receives applied address signals Ac0 to Ac3, decodes the same and generate a column selecting signal SAY. Column selecting signal SAY is used as a column selecting signal of the SRAM array as well as a column selecting signal of the DRAM array.

SRAM row decoder 5142 receives address signals Ac4 to Ac11 and generates a signal for driving SRAM word line SWL. DRAM column selecting circuit 5143 receives address signals Ac6 to Ac11 out of applied address signals Ac4 to Ac11 and generates a signal for driving write column selecting line WCSL and read column selecting line RCSL. DRAM row selecting circuit 5144 receives address signals Aa0 to Aa9 and generates a block selecting signal φBA and DRAM word line driving signal DWL. In the structure shown in FIG. 193, address signals Ac0 to Ac11 and Aa0 to Aa9 can be simultaneously applied, read column selecting line RCSL can be driven at high speed, and data can be transferred from the DRAM array to the SRAM array at higher speed more effectively.

In the structure shown in FIG. 186, local read line pair LOL and local write line pair LIL are arranged on both ends of the bit line pair DBL. However, the local read line pair LOL and local write line pair LIL may be arranged on one side (for example a side near the transfer gate BTG) of the bit line pair DBL, or they may be arranged at the center of the bit line pair DBL.

By the above described structure, by utilizing high speed copy back method even at a cache miss, precharging and copy back operation of the DRAM array can be executed on the back ground of a cache hit, and therefore, the performance of the CDRAM can be significantly improved, by reducing access time at a cache miss.

By the structure for separating data reading path and data writing path of the DRAM array combined with the structure for applying addresses in non-multiplexed manner and with high speed copy back mode, remarkable effect can be obtained.

[Modification of Separated IO Array Architecture CDRAM]

In this section, a modification of the array arrangement shown in FIG. 186 is described, with reference to FIGS. 194 through 196. The modified array arrangement can be considered as a combination of the clamping architecture shown in FIG. 61 and the separated IO DRAM array architecture shown in FIG. 186. Clamping circuit is provided for global write line pair GIL.

FIG. 194 shows a main portion of another CDRAM which is a modification of CDRAM of FIG. 186. In FIG. 194, the components corresponding to those of FIG. 186 have like reference numerals, and characters, and no detailed explanation thereon is developed for saving duplicate description.

Referring to FIG. 194, SRAM bit line pair SBL is provided with a clamping circuit CRS. The clamping circuit CRS has the same construction as that shown in FIG. 62 or FIG. 70. SRAM clamping circuit CRS has the clamping operation inhibited by an inversion /DTS of the data transfer control signal DTS instructing data transfer from DRAM array to SRAM array.

Global write line pair GIL (GILa, GILb) is provided with a clamping circuit CRDW for clamping the potentials of the global write lines. DRAM clamping circuit CRDW has the clamping operation inhibited by an inversion /DTA of the data transfer control signal DTA instructing data transfer to DRAM array. DRAM clamping circuit CRDW may be provided for the local write line pair LIL, (LILa, LILb), and may be provided for both the global write line pair GIL and the local write line pair LIL.

Bidirectional transfer gate BIG carries out data transfer between SRAM array and DRAM array in response to the data transfer control signals DTA, DTS and DTL. The transfer gate BTG has its same construction as that shown in FIGS. 189 and 190. The signal DTA corresponds to the signal φTLD and allows data transfer from the latch circuit to DRAM array. The signal DTS corresponds to the signal φTDS and allows data transfer from DRAM array to SRAM array. The signal DTL corresponds to the signal φTSL and allows data transfer from SRAM array to the latch circuit.

Now, data transfer operation of the modified, separated IO configuration CDRAM will be described briefly with reference to FIGS. 189, 190 and 194. The operation of the bi-directional transfer gate is the same as that of the gate shown in FIGS. 189 and 190.

With the real out gate of FIG. 189, the signal potentials on a selected DRAM bit line pair DBL can be transferred to SRAM array at a high speed without adverse effect on the selected DRAM bit line DBL when a minute potential difference is produced in the DRAM bit line pair DBL. Consequently, data can be transferred from DRAM array to SRAM array at a high speed.

In this operation, if SRAM clamping circuit CRS is in an operating state for carrying out the clamping operation, the clamping current flows through the transistor Tr502 or Tr503 into the local transfer gate i5 LTG, in which the current is discharged through the transistor LTR3 or LTR4 (see FIG. 189). In order to prevent the current flow supplied from the clamping circuit CRS from flowing into the local read out gate LTG, the clamping operation of SRAM clamping circuit CRS is inhibited during the period when the transfer control signal DTS is active, to provide a reduced current consumption during data transfer to SRAM array.

Meanwhile, in data transfer to DRAM array, the clamping current from DRAM clamping circuit CRDW flows through the gate circuit 1812 and the discharging transistors in the inverter circuit of the latch circuit 1811 to the ground. Thus, in this data transfer operation, DRAM clamping circuit CRDW has the clamping operation inhibited in response to the signal DTA.

FIGS. 195 and 196 are operating waveform diagrams showing data transfer operations from DRAM to SRAM and from SRAM to DRAM, respectively. The operations shown in FIGS. 195 and 196 are the same as those shown in FIGS. 187 and 188 except the precharge level of global read line pair GOL, local read line pair GIL, global write line pair GIL, local write line pair LIL and SRAM bit line pair SBL. For precharging the global read line pair GIL and local read line pair LIL at "H", there may be additionally provided clamping transistors for clamping the potentials of these signal lines. For example, clamping transistors may be provided in parallel with the transistors Tr500 and Tr501 in the reading bi-directional transfer gate BTGR. In the following, only the operations related to inhibition of the clamping are described with reference to FIGS. 195 and 196.

In FIG. 195, the transfer control signal DTS is generated at the time t3 prior to the time t7' at which the signal potential change is caused on the global read line pair GOL. The signal change on the global read line pair GOL is transferred to a selected SRAM memory cell at a high speed. If SRAM clamping circuit CRS is operating, the clamping transistors SQ70 and SQ80 in the clamping circuit CRS supply a current flow charging the global read line pair and flowing into the local transfer gate LTG, before the global read line pair GOL has the signal potentials changed according to read out DRAM cell data. SRAM bit line clamping circuit CRS is inhibited from clamping SRAM bit lines in response to the transfer control signal DTS. Thus, SRAM bit line pair is charged and discharged by the current mirror circuit (transistors Tr500 and Tr501) in the bi-directional transfer gate BTG, to have the potential levels corresponding to data read out from the selected DRAM cell.

As described above, inhibition of the clamping of SRAM clamping circuit CRS in response to the data transfer control signal DTS implements fast and reliable data transfer with less current consumption without adverse effect on the amplifying operation of local transfer gate LTG.

Now, in FIG. 196, local write line pair LIL and global read line pair GOL are shown precharged or pulled up to "H" of Vcc-Vth by DRAM clamping circuit CRDW. Data transfer operation from SRAM to DRAM or from the latch circuit to DRAM will be described. In this description, only the operations to the clamping are described because of the similarity of the operation to that of FIG. 188.

At the time t5, a write column selection line WCSL is selected, and the potential thereof rises to "H". Responsively, a write gate IG turns on to connect the local write line pair LIL to the selected DRAM bit line pair DBL. The write gate IG has a relatively large resistance. Thus, DRAM bit line pair has the potentials of full swing to "H" of Vcc and "L" of Vss, while the local write line pair LIL has "L" level potential raised from Vss due to the clamping of DRAM clamping circuit CRDW.

At the time t6, the write block selection signal φWBA rises to "H". Consequently, the local write line pair LIL is connected with the global write line pair GIL to have the potentials corresponding to the signal potential levels of the local write line pair LIL. If the gate WIG has a sufficiently larger resistance than the gate IG has, the global write line pair GIL has "L" level potential higher than "L" level potential of the local write line pair LIL (in the case where a clamping circuit is provided only for the global write line pair).

At the time t7, the transfer control signal DTA rises to "H", and data latched in the bi-directional transfer gate BTG is transferred to the selected DRAM bit line pair DBL through the global write line pair GIL and local write line pair LIL.

The clamping circuit CRDW for the write line pair GIL (and LIL as necessary) has the clamping operation inhibited. Consequently, the path of current flow from the clamping circuit CRDW into the discharging transistor in the inverter circuit of the bi-directional transfer gate is cut off to reduce the current consumption in this data transfer operation. The local write line pair LIL and the global write line pair GIL have the potential levels of "H" and "L" corresponding to the signal potentials latched in the latch circuit 1811.

As described above, the clamping circuit provided at data receiving side bus has the clamping operation inhibited or deactivated, and therefore no penetrating current flows into a discharging transistor in the bi-directional transfer gate BTG to significantly reduce the current consumption even in the separated IO DRAM array type CDRAM.

The global write line pair GIL and the local write line pair LIL may be precharged to an intermediate potential of Vcc/2 by a clamping circuit.

The controlled clamping operation can be applied to a semiconductor memory device other than CDRAM of the invention as far as the semiconductor memory device includes SRAM array, DRAM array and a data transfer gate for data transfer between DRAM array and SRAM array.

[Other Function: Burst Mode]

Connection with external operational processing unit (CPU) having burst mode function will be described with reference to FIGS. 197 through 201.

In the burst mode, a first address is set in an address counter, and subsequent address are generated sequentially from the counter during the burst mode operation or by a predetermined number of times.

As described previously, burst mode is an operation mode in which a data block are transferred at one time from the CPU. Control of the burst mode function is supported by a circuit portion of the additional function control circuit 299 shown in FIG. 32.

FIG. 197 shows a circuit portion for realizing burst mode operation. Referring to FIG. 197, burst mode control system includes a BE buffer circuit 6001 taking an externally applied burst enable signal BE# in response to internal clock signal int. K for generating an internal burst enable signal /BE; a one shot pulse generating circuit 6002 responsive to the first internal burst enable signal /BE from BE buffer circuit 6001 for generating a one shot pulse signal φBE having a prescribed pulse width; and a gate circuit 6003 responsive to the one shot pulse signal φBE having a prescribed pulse width; and a gate circuit 6003 responsive to one shot pulse signal φBE for gating the internal clock int. K. When one shot pulse signal φBE is generated, gate circuit 6003 inhibits passage of internal clock int. K. One shot pulse generating circuit 6002 does not respond to the second and the following /BE signals. When burst transfer operation is completed, the circuit 6003 is reset. This resetting is realized by providing a timer and by prohibiting generation of pulses while the timer is operating.

Burst enable control circuitry further includes an address counter 6004 for counting internal clock signals int. K applied from gate circuit 6003 with the initial value thereof set at internal address signal int. Ac applied from an address buffer (see FIG. 32); and a multiplexer circuit 6007 for selectively passing either the count value of address counter 6004 or internal address signal int. Ac. An output from multiplexer circuit 6007 is transmitted to the SRAM row decoder and the column decoder. Address counter 6004 and multiplexer circuit 6007 are different from the address counter for generating refresh addresses for the refreshing operation and the multiplexer circuit for switching the refresh address and the DRAM address.

The burst enable control circuitry further includes a burst data number storing circuit 6006 for storing the number of data to be transferred in the burst mode and a down counter 6005 for counting down the internal clock signals int. K with the initial count value being the burst data number stored in burst data number storing circuit 6006. Down counter 6005 starts its counting operation when internal burst enable signal /BE is generated from BE buffer 6001. Down counter 6005 switches connection path of multiplexer circuit 6007 in accordance with the count value at that time.

Down counter 6005 is reset when internal burst enable signal /BE is inactive at a rising edge of internal clock signal int. K. When internal burst enable signal /BE is active (at "L" level) at a rising edge of internal clock signal int. K, it carries out counting operation. Down counter 6005 controls connection path of multiplexer circuit 6007 such that an output from address counter 6004 is selected during counting operation. Down counter 6005 is reset when the number of burst data stored in the burst data number storing circuit 6006 is counted and switches connection path of multiplexer circuit 6007 such that internal address signal int. Ac from the address buffer is selected. The operation of the structure shown in FIG. 197 will be described with reference to FIG. 198 which is a diagram of signal waveforms.

In normal accessing to SRAM array, chip select signal E# is set to "L" and burst enable signal BE# is set to "H" at a rising edge of external clock signal K.

In this state, internal burst enable signal /BE is also at "H", and pulse signal is not generated from one shot pulse generating circuit 6002. Down counter circuit 6005 is also kept at the reset state. In this state, multiplexer circuit 6007 selects internal address signal int. Ac (cache address) applied from the address buffer and transmits the same to the SRAM row decoder and the column decoder. A part of the address signal may be applied to the DRAM column decoder.

Consequently, the SRAM array is accessed in accordance with the address Ac1 for the SRAM applied at the rising edge of external clock signal K, and data Q1 corresponding to this address Ac1 is output.

When chip select signal E#, cache hit designating signal CH# and burst enable signal BE# are set to "L" at a rising edge of external clock signal K, the burst mode is effected. In this state, a one shot pulse signal φBE is generated in response to a rise of internal burst enable signal /BE from one shot pulse generating circuit 6002. In response to one shot pulse signal φBE, address counter 6004 takes internal address signal int. Ac (Ac2) applied from the address buffer as a count initial value, and applies the initial value to multiplexer circuit 6007. When the one shot pulse signal φBE is generated, gate circuit 6003 inhibits transmission of internal clock signal int. K. Therefore, in this clock cycle, the address signal Ac applied at a rising edge of clock signal K is applied from address counter 6004 to multiplexer circuit 6007.

Down counter 6005 is activated in response to an active state ("L") of internal burst enable signal /BE, and carries out counting-down operation starting at the value stored in burst data number storing circuit 6006. During the counting operation, down counter 6005 generates a signal indicating that the operation is in the burst mode to multiplexer circuit 6007. Multiplexer circuit 6007 selects an output from address counter 6004 in response to the burst mode designating signal from down counter 6005, and applies the output to the SRAM row decoder and the SRAM column decoder. The SRAM array is accessed in accordance with this address Ac2, and corresponding data Q2 is output.

Thereafter, when chip select signal E#, cache hit signal CH# and burst enable signal BE# are set to "L" at a rising edge of external clock signal K, externally applied address signal Ac is neglected, and access to the SRAM array is carried out in accordance with address counter 6004. Namely, internal clock signal int. K is applied to address counter 6004 through gate circuit 6003. Address counter 6004 carries out counting operation in accordance with the internal clock signal (count up or count down), and applies the count value to multiplexer circuit 6007.

Multiplexer circuit 6007 selects the count value of address counter 6004 in accordance with a control signal from down counter 6005 and applies the count to the SRAM row decoder and the SRAM column decoder. Therefore, in the burst mode, access in accordance with the count value from address counter 6004 is effected, and corresponding data Q3, . . . are output every clock cycle. The burst mode operation ends when burst mode enable signal BE# is set to "H" at a rising edge of external clock signal K, or when counting down operation of down counter 6005 is completed.

The burst data number information stored in the burst data number storing circuit 6006 may be fixedly programmed in advance, or it may be stored in a command register or the like at each burst transfer mode.

In the structure shown in FIG. 197, gate circuit 6003 inhibits transmission of internal clock signal int. K in accordance with one shot pulse signal φBE. Alternatively, a structure in which address counter 6004 sets internal address int. Ac as a count initial value when internal clock signal int. K and one shot pulse signal φBE are applied may be used, without using gate circuit 6003.

FIG. 199 shows one example of a specific structure of the address counter circuit. Referring to FIG. 199, address counter 6004 includes n cascade connected in array counter circuits BCC 1 to BCC n. Binary counter circuits BCC 1 to BCC n are asynchronous type counter circuits and internal clock signal int. K is applied only to the least significant binary counter circuit BCC 1. Each binary counter circuit effects binary counting operation, and output carrier signals CK0 to CKn−1 when count value reaches "1". The carry outputs CK0 to CKn−1 are applied to clock inputs of binary counter circuits BCC 2 to BCC n of the succeeding stages, respectively. Complementary count values A0, *A0 to An and *An−1 are generated from binary counter circuits BCC 1 to BCC n. Address counter 6004 further includes an up/down switching circuit 6010 for determining whether count up operation or count down operation is to be executed. Up/down switching circuit 6010 selectively passes either the outputs A0 to An or complementary outputs *A0 to An−1 from counter circuits BCC 1 to BCC n in response to an up/down setting signal φUD. When count up operation is set, up/down switching circuit 6010 selects counter outputs A0 to An. If count down operation is set, up/down switching circuit 6010 selects complementary outputs *A0 to *An−1. Up/down setting signal φUD may be a control signal set in a command register, or it may be a control signal for setting one of the counting operation fixedly by wiring or the like.

The structure of the counter circuit is not limited to that of FIG. 199. Any counter circuit having a function for setting an initial value may be used.

FIG. 200 shows an example of a specific structure of burst data number storing circuit 6006. In the structure shown in FIG. 200, a command register is used as burst data number storing circuit 6006. Burst data number storing circuit 6006 includes a switching transistor Tr600 responsive to a control signal φCR for transmitting data DQ applied to data input/output pin terminal; and inverter circuits V600, V601 and V602 for latching data applied through switching transistor Tr600. Inverter circuits V600 and V601 constitute a latch circuit.

Control signal φCR is a control signal generated in the command register setting mode. Combination of control signals (command register designating signals At, Av1 and W#) is determined dependent on the command register used for storing the burst data number.

In the structure shown in FIG. 200, the burst data number information is shown to be applied through data input/output terminal DQ. However, it may be applied through a data input terminal D.

The burst data number information may be stored in a register used for that purpose only, not in a command register.

[Application of Burst Mode Function to Other Memory Devices]

FIG. 201 shows a structure of another semiconductor memory having burst mode function. Referring to FIG. 201, the semiconductor memory device 6700 includes a memory array 6701 including memory cells arranged in rows and columns, a row decoder 6702 for selecting a row of memory array 6701, and a column decoder 6703 for selecting a column of memory array 6701.

Semiconductor memory device 6700 further includes an address buffer circuit 6704 receiving an externally applied address ADD for generating an internal address; an address count circuit 6705 using an output from address buffer circuit 6704 as a count initial value for counting the clock signals from a clock control circuit 6706; and a multiplexer circuit 6707 responsive to a control signal BE from clock control circuit 6706 for passing either an output from address count circuit 6705 or an output from address buffer circuit 6704. Row and column address signals are applied from multiplexer circuit 6707 to row decoder 6702 and column decoder 6703, respectively. Address count circuit 6705 includes the structure of address counter 6004, down counter 6005 and burst data number storing circuit 6006 shown in FIG. 197.

Clock control circuit 6706 receives externally applied chip select signal /CS, write enable signal /W, output enable signal /OE and burst mode requesting signal BE and generates respective internal control signals.

The semiconductor memory device 6700 is supposed to be a static type semiconductor memory device or a non-multiplexed address type memory device. However, a dynamic type semiconductor memory device having high speed operation mode such as static column mode or page mode may be used. The structures of address count circuit 6705 and multiplexer circuit 6707 are the same as those described above, and therefore the structures thereof are not shown.

As described above, by providing address count circuit 6705 for generating addresses in the burst mode, it becomes not necessary to externally connect an address generating circuit for the burst mode to the memory device, and therefore system size can be reduced. In addition, wires for connecting the burst mode address counter provided externally to the semiconductor memory device become unnecessary, signal delay in the signal lines for connection and current consumption associated with charging/discharging of the connecting wires can be reduced. In addition, since the address circuit for the burst mode is provided in the semiconductor memory device, connection to the CPU having burst mode function can be readily realized.

In the structure shown in FIG. 197, an internal address from the address buffer is pre-set as the initial count value in the address counter 6004. However, the initial count value of address counter 6004 may be set in the command register.

The semiconductor memory device shown in FIG. 201 may be replaced by other semiconductor memory device containing a cache.

[Other Function: Sleep Mode]

An operation mode for reducing current consumption in standby state, that is, a sleep mode will be described with reference to FIGS. 202 through 214.

In sleep mode operation, internal clock K is inhibited from being generated. If no internal clock K is generated, self refreshing is responsively carried out. The function of the sleep mode is realized by the additional function control circuit 299 shown in FIG. 32.

As described previously and repeatedly, the CDRAM of the present invention takes address signals, external control signals and write data in synchronization with the external clock signal K. Therefore, even in the standby mode, current is consumed in the buffer receiving these external signals.

FIG. 202 shows a structure of a portion related to 1 bit of the address buffer (252 in; FIG. 32: FIG. 105, 360). Referring to FIG. 202, address buffer 7001 includes a clocked inverter 7011 responsive to internal clock signal int. K for inverting and passing applied data; and inverters 7013 and 7014 for latching an output from clocked inverter 7011. Clocked inverter 7011 receives internal clock signal int. K through inverter 7012 at its positive control input, and receives internal clock signal int. K at its complementary control input.

Clocked inverter 7014 receives chip select signal E through inverter 7015 at its positive control input, and receives chip select signal E at its complementary control input.

Inverter 7013 and clocked inverter 7014 are connected in anti-parallel (or cross coupled) to form a latch circuit.

In the structure shown in FIG. 202, clocked inverter 7011 is set to an output high impedance state in response to a rise of internal clock signal int. K. Clocked inverter 7014 functions as an inverter in response to a fall of chip select signal E. In this state, in response to the fall of chip select signal E, a latch circuit is provided by inverter 7013 and clocked inverter 7014. Internal address signal int. A is generated from inverter 7013.

More specifically, at a rising edge of external clock signal K, external address A which has been applied at that time is latched by the latch circuit formed of inverter 7013 and clocked inverter 7014, and internal address int. A is generated.

As shown in FIG. 202, even if the chip select signal E is at "H" and the chip is in the non-selected state, internal clock signal int. K is continuously applied. Therefore, in the standby state, clocked inverter 7011 operates and consumes current.

FIG. 203 shows a structure of a clock buffer circuit included in the control clock buffer. FIG. 203 shows a buffer related to chip select signal E# as an example. Referring to FIG. 203, buffer circuit 7021 includes a p channel MOS transistor Tr700 receiving internal clock signal int. K at its gate; a p channel MOS transistor Tr701 receiving external chip select signal E# at its gate; an n channel MOS transistor Tr702 receiving external chip select signal E# at its gate; and an n channel MOS transistor Tr703 receiving an inverted signal /int. K of internal clock signal at its gate. Transistor Tr700 to Tr703 are connected in series between supply potential Vcc and the other supply potential (ground potential) Vss. In the structure shown in FIG. 203, the buffer circuit 7021 is set to the output high impedance state at a rising edge of external clock signal int. K, and its output portion is set to a floating state at the signal potential which has been applied thereto. An inverter circuit or a latch circuit may be provided in the next stage of the buffer circuit having the above described structure.

As shown in FIG. 203, also in the control clock buffer, information is transmitted to the output portion thereof in response to internal clock signal int. K, and consequently, current is consumed even in the standby mode. In view of the foregoing, a structure for reducing current consumption in the standby state will be described in the following.

FIG. 204 is a diagram of signal waveforms showing the sleep mode operation. The sleep mode is set not synchronized with the external clock signal K. The sleep mode is set by command register setting signal CR#. More specifically, when control signal CR# falls to "L", generation of internal clock signal int. K is stopped. Consequently, operations of respective buffer circuits are stopped in the standby state, for example. A circuit structure for realizing the sleep mode will be described.

FIG. 205 is a block diagram functionally showing the circuit structure for realizing the sleep mode. Referring to FIG. 205, a sleep mode control system includes a sleep control circuit 7052 responsive to control signal CR# for generating a sleep mode control signal SLEEP; and an internal clock generating circuit 7051 responsive to sleep mode control signal SLEEP from sleep control circuit 7052 for controlling generation/stoppage of internal clock signal int. K. Internal clock generating circuit 7051 corresponds to clock buffer 254 shown in FIGS. 32 and 105. Sleep control circuit 7052 may be included in additional function control circuit 299 shown in FIG. 32, or a command register may be used.

FIG. 206 shows an example of a specific structure of internal clock generating circuit 7051 shown in FIG. 205. Referring to FIG. 206, internal clock generating circuit 7051 includes an inverter circuit 7061 receiving sleep mode control signal SLEEP; an NAND circuit 7062 receiving external clock signal K and an output from inverter circuit 7061; and an inverter circuit 7063 receiving an output from NAND circuit 7062. Sleep mode control signal SLEEP is set to "H" when sleep mode is set. The NAND circuit 7062 functions as an inverter when the output from inverter circuit 7061 is at "H". When the output from inverter circuit 7061 is at "L" level, the output of NAND circuit 7062 is fixed to the "H" level.

Therefore, in the structure shown in FIG. 206, generation and stoppage of internal clock signal K can be controlled by sleep mode control signal SLEEP.

FIG. 207 shows an example of a specific structure of sleep control circuit 7052 generating the sleep mode control signal.

Referring to FIG. 207, sleep control circuit 7052 includes a gate circuit (NOR circuit) 7501 receiving external command register setting signal CR# and an output from inverter circuit 7507; an inverter circuit 7502A receiving an output from gate circuit 7501; an inverter circuit 7502B receiving an output from inverter circuit 7502A; and a gate circuit (NAND circuit) 7503 receiving an output from inverter circuit 7502B and an output from gate circuit (NAND circuit) 7506.

Sleep control circuit 7052 further includes an inverter circuit 7504 receiving external command register setting signal CR#; a gate circuit (NAND circuit) 7505 receiving an output from inverter circuit 7504 and external control signals Ar0, Ar1 and W#; a gate circuit 7506 receiving both outputs from NAND circuits 7503 and 7505; an inverter circuit 7507 receiving an output from gate circuit 7506; and an inverter circuit 7508 receiving an output from inverter circuit 7507. Sleep mode control signal SLEEP is generated from inverter circuit 7508.

A CR# buffer 7600 is further shown in FIG. 207. CR# buffer 7600 is included in the control clock buffer (see reference numeral 250 in FIG. 33). CR# buffer 7600 takes the external command register setting signal CR# in response to internal clock signal int. K and generates internal control signal CR.

The operation of sleep control signal 7052 shown in FIG. 207 will be described with reference to FIG. 208 which is a diagram of signal waveforms.

Signals CR#, Ar0, Ar1 and W# shown in FIG. 207 are all external control signals. Therefore, sleep control circuit 7052 operates asynchronously with a clock signal K.

When external command register setting signal CR# is at "H", an output from gate circuit 7501 is "L". Therefore, an output from inverter circuit 7502B is at "L".

Meanwhile, an output from inverter circuit 7504 is "L". Therefore, an output from gate circuit 7505 attains "H" regardless of the states of control signals Ar0, Ar1 and W#. Gate circuit 7506 receives signals at "H" at both inputs thereof. Consequently, an output from gate circuit 7506 attains "L", and sleep mode control signal SLEEP attains "L".

When sleep mode is to be set, external command register setting signal CR# is set to "L". Control signals At0, Ar1 and W# are also set to "H". In this state, gate circuit 7505 receives signals at "H" at its all inputs, and therefore it outputs a signal at "L". Since a signal at "L" is applied to one input of gate circuit 7506, it outputs a signal at "H", and hence sleep mode control signal SLEEP rises to "H".

When sleep mode control signal SLEEP attains "H", an output from inverter circuit 7507 attains "L". Consequently, both inputs of gate circuit 7501 are at "L", providing an output of "H". Consequently, both inputs of gate circuit 7503 attain "H" level, providing an output of In this state, a signal at "L" is applied from gate circuit 7503 to one input of gate circuit 7506, and therefore an output from gate circuit 7506 attains to "H" regardless of the states of external control signals Ar0, Ar1 and W#.

When external command register setting signal CR# rises to "H" at this state, sleep mode control signal SLEEP falls to "L", and thus sleep mode is canceled.

When generation of internal clock signal int. K is stopped by the sleep mode, external refresh designating signal REF# can not be taken at a rising edge of internal clock signal int. K. Therefore, auto-refreshing operation can not be executed. Therefore, in the sleep mode period, self refresh must be carried out instead of auto refresh. A circuit structure for carrying self refreshing in the sleep mode is shown in FIG. 209.

Referring to FIG. 209, in order to switch auto/self refresh modes dependent on execution of the sleep mode, a self refresh switching circuit 7401 is provided. Self refresh switching circuit 7401 monitors generation of internal clock signal int. K and when generation of internal clock int. K is stopped, it generates a self refresh switching signal Self.

A refresh timer 7402 is activated in response to self refresh switching signal Self, and generates a refresh requesting signal /REFREQ at a prescribed interval and applies the same to clock generator 7403. Clock generator 7403 receives external clock signal K, external refresh designating signal REF# and refresh requesting signal REFREQ from refresh timer 7402, determines as to whether refreshing is to be executed, and generates various control signals necessary for executing refreshing. A structure shown in FIG. 163 may be used for the clock generator 7403. Functions carried out by clock generator 7403 are the same as those shown in FIG. 163. Function of switching input and output is not shown.

Self refresh switching circuit 7401 carries out counting operation in response to a rise of internal clock signal int. K, and when internal clock signal int. K is not applied in a prescribed period (for example 1 clock cycle), its generates self refresh switching signal Self. Self refresh switching circuit 7401 is reset in response to a rise of internal clock signal int. K, and sets self refresh switching signal Self to auto refresh designating state. Refresh timer 7402 is the same as that shown in FIG. 162 which generates refresh requesting signal /REFREQ at a prescribed interval in response to self refresh switching signal Self.

Clock generator 7403 takes external refresh designating signal REF# at a rising edge of external clock signal K, and when either refresh designating signal REF# or refresh requesting signal /REFREQ is at active state, carries out necessary operations for refreshing. Internal control signals /RAS and /CAS generated from clock generator 7403 are control signals for controlling decoding operation and the like for the DRAM array.

Refresh address counter 7407 corresponds to refresh address counter shown in FIG. 32 and the like.

In correspondence with the structure shown in FIG. 32, clock generator 7403 includes auto-refresh mode detecting circuit 291 and refresh control circuit 292.

FIG. 210 shows a structure of a circuit generating refresh signal REF. The structure shown in FIG. 210 is included in clock generator 7403 shown in FIG. 209. Referring to FIG. 210, the circuit for generating refresh signal REF includes a REF buffer 7440 responsive to internal clock signal int. K for latching external refresh designating signal REF#; and a gate circuit 7450 receiving an output from REF buffer 7440 and refresh requesting signal /REFREQ from refresh timer 7402. Gate circuit 7450 outputs a signal at "H" when one input thereof attains to "L". When refresh signal REF attains "H", refreshing is carried out.

FIG. 211 is a diagram of signal waveforms showing the operation of the circuit shown in FIG. 209. Switching operation between auto refresh/self refresh in the sleep mode will be described with reference to FIGS. 209 to 211.

At time t1, the sleep mode is set and generation of internal clock signal int. K is stopped. Self refresh switching circuit 7401 starts counting operation from time t1, and after a prescribed time period, generates self refresh switching signal Self at time t2 and applies the same to refresh timer 7402. Refresh timer 7402 generates refresh requesting signal /REFREQ in response to self refresh switching signal Self and applies the same to clock generator 7403.

Clock generator 7403 generates refresh signal REF in response to refresh requesting signal /REFREQ and generates internal control signal /RAS. At this time, generation of internal control signal /CAS is stopped. In response to internal control signal /RAS, row selecting operation and sensing operation are carried out in the DRAM array and self refreshing is effected.

Refresh timer 7402 generates refresh requesting signal /REFREQ every prescribed period. In response, internal control signal /RAS rises to "L" to effect refreshing. Refresh address of refresh address counter 7407 is incremented or decremented every refresh cycle.

When sleep mode is canceled at time t3, self refresh switching circuit 7401 is reset and generation of self refresh switching signal Self is stopped. Consequently, counting operation of refresh timer 7402 is reset and prohibited.

In the structure shown in FIG. 209, self refresh switching circuit 7401 monitors internal clock signal int. K and generates self refresh switching signal Self. Self refresh switching circuit 7401 may include a structure for monitoring sleep mode control signal SLEEP. A structure in which refresh timer 7402 is activated in response to sleep mode control signal SLEEP may be used.

Further, refresh control system shown in FIG. 209 may be commonly used with auto refresh/self refresh switching circuit shown in FIG. 162.

FIG. 212 shows another example of circuit structure for generating sleep mode control signal SLEEP. In the structure shown in FIG. 212, sleep mode is set by external chip select signal E# and array access designating signal CI# (corresponding to CC1#). Referring to FIG. 212, sleep mode control circuit 7052 includes an inverter circuit 7601 receiving internal chip select signal CE#; a gate circuit 7602 receiving an output from inverter circuit 7601 and an output from gate circuit 7604; an inverter circuit 7603 receiving external array access designating signal CI#; a gate circuit 7604 receiving an output from gate circuit 7602 and an output from inverter circuit 7603; and an inverter circuit 7605 receiving an output from gate circuit 7604.

FIG. 212 also shows an E buffer 7650 and CI buffer 7651 included in the control clock buffer. E buffer 7650 and CI buffer 7651 take external signals E# and CI# at a rising edge of internal clock signal int. K, respectively and generate internal control signals E and CI.

FIG. 213 is a diagram of signal waveforms showing the operation of the circuit shown in FIG. 212. Sleep mode setting operation will be described with reference to FIGS. 199 and 200.

In the circuit structure shown in FIG. 199, sleep mode is set by a combination of external control signals E# and CI#. When chip select signal E# is at "H" and cache access inhibiting signal CI# is at "L", the sleep mode is set. In this state, an output from gate circuit 7602 attains "H" and an output from inverter circuit 7603 attains "H". Since both inputs of gate circuit 7604 are at "H" level, the circuit 7604 outputs a signal at "L". Consequently, sleep mode control signal SLEEP from inverter circuit 7605 rises to "H".

When cache access inhibiting signal CI# rises to "H", an output from gate circuit 7604 rises to "H" and sleep mode control signal SLEEP falls to "L". In the structure shown in FIG. 212, length of the sleep mode period is determined by cache access inhibiting signal CI#.

Chip select signal E# and cache access inhibiting signal CI# are used as control signals when the DRAM array is to be directly accessed (namely, when chip select signal E# is at "L" and cache access inhibiting signal CI# is at "L" at a rising edge of clock signal K in FIG. 213, the DRAM array is directly accessed).

Therefore, in order to prevent setting of sleep mode when direct access cycle to the array is set, a setup time Tsetup and hold time Thold is set for chip select signal E# and cache access inhibiting signal CI#, as shown in FIG. 214. Namely, referring to FIG. 214, a setup time Tsetup from the fall of chip select signal E# to "L" until transition of cache access signal CI# to "L", and a hold time Thold from the time when access inhibition signal CI# attains "H" until the time when the chip select signal E# attains "H" are designated. When the array is accessed, cache access inhibition signal CI# changes to "L" after chip select signal E# has changed to "L". Consequently, a state in which cache access signal CI# falls to "L" when chip select signal E# is "H" in direct access to the array can be prevented, and therefore erroneous setting of the sleep mode can be prevented. In addition, the signal CI rises to "H" by at least the hold time T hold before the signal E# rises to "H" in an array access setting cycle. Thus, erroneous setting of the sleep mode is also prevented in this case.

[Summary of Internal Operation Cycle]

FIG. 215 is a table showing combinations of states of control signals for setting operation modes of the CDRAM. The operation modes of the CDRAM shown in FIG. 215 correspond to those shown in FIG. 51 but modified corresponding to 3 additional functions. In the structure shown in FIG. 215, burst mode operation, high speed copy back operation and data transfer using latches between DRAM and SRAM array are added.

The additional functions shown in FIG. 215 will be described briefly. The burst mode is set by setting control signals E#, CH# and CC2# (CR#) to "L" and control signal CC1# (CI#) to "H". The state of write enable signal W# determines whether data writing or data reading is to be carried out. If write enable signal W# is at "H", a hit read burst operation is carried out. If write enable signal W# is at "L", a hit write burst operation is carried out.

Cache hit operation as well as data transfer operation to the DRAM array are carried out when control signals E#, CH# and CC1# (CI#) are set to "L" and control signal CC2# (CR#) is set to "H". Namely, in this state, data writing/reading is carried out between the cache (SRAM) and the CPU, and data which has been latched by latching means included in the transfer gate are transferred to the DRAM array. The state of write enable signal W# determines whether hit read operation or hit write operation is to be carried out.

In the state of a cache miss, data is transferred from the cache to the latching means included in the transfer gate and data is transferred from the DRAM array to the SRAM array (cache), and data writing/reading with the CPU is done through the cache (SRAM). This state is set by setting chip select signal E# to "L". The write enable signal W# determines whether the operation is a miss read or miss write.

The array write operation in which data transfer from the latch (included in the data transfer gate) to the DRAM array when high speed copy back mode operation is to be carried out, is set by setting control signals E# and CC2# (CR#) to "L" and control signals CH# and CC1# (CI#) to "H". In this state, data is transferred from the latch to the DRAM array in the high speed copy back mode. By setting control signals E#, CC2# and W# to "L" and control signals CH# and CC1# (CI#) to "H", data is transferred from the cache (SRAM array) to the DRAM array. Consequently, the DRAM array is initialized.

When control signals E# and CC1# (CI#) are set to "L" and control signals CH# and CC2# (CR#) to "H", the array can be directly accessed. Whether writing or reading of data is to be carried out is determined by write enable signal W#.

[Structure for Providing Optimal CDRAM]

A combination of functions effective in practice is a combination of: a structure allowing independent address designation of the DRAM and the SRAM; a structure for generating internal voltages by using continuously input clock signals; a structure of a data transfer path including two separated paths, that is, internal data transfer path and a data writing path; a structure for carrying out automatic refresh of the DRAM array while the SRAM array is being accessed; a structure for writing data to the DRAM array simultaneously with writing of data to the SRAM array at cache miss writing; a structure allowing selection of high speed operation mode and low power consumption mode; a structure facilitating connection to the CPU having burst mode function; a structure having the sleep mode for reducing standby current; and a structure for carrying out self refreshing even in the normal mode.

The structure for generating internal voltages by the clock K is a structure in which a charge pump is operated by the clock K to generate a desired internal voltage such as substrate bias voltage.

(2) A structure of the most effective CDRAM comprises the following functions: a structure allowing independent selection of a DRAM cell and a SRAM cell; a structure for generating internal voltages in accordance with external clock signals; a structure of data transfer path having two routes of internal transfer path and data writing path; high speed copy back mode function; a structure for carrying out automatic refreshing of the DRAM array while the SRAM array is being accessed; a structure for writing write data to the SRAM array at a cache miss writing; a structure in which SRAM addresses and DRAM column addresses are commonly used; a structure for switching methods of address generation dependent on the burst mode operation; sleep mode function; a structure for carrying out self refreshing even in the normal mode; and a structure for separating data writing path from the data reading path in the DRAM array.

[Effects of the Invention]

According to the first aspect of the present invention, switching between self refresh mode and auto refresh mode is done by refresh mode setting means. In the auto refreshing mode, one terminal is used as a refresh designating input terminal, and in the self refresh mode, it is used as a self refresh execution designating output terminal. Therefore, even in the self refresh mode, refresh timing can be known outside the semiconductor memory device, and therefore self refresh mode can be utilized even in the normal mode.

According to the second aspect of the present invention, input terminals for designating rows and columns of the first and second memory arrays are separately provided for inputting row addresses and column addresses. Consequently, the row address signals and column address signals can be applied in a non-multiplexed manner to the first and second memory arrays. A part of the address signals for the first memory array and a part of address signals for the second memory array are applied to the same input terminal. Therefore, a structure in which addresses are applied to the first and second memory arrays in address non-multiplexed manner can be realized without increasing the number of input terminals.

According to a third aspect of the present invention, the first and second address signals are simultaneously taken in synchronization with external clock signals and internal address signals are generated. Therefore, a clock synchronized type semiconductor memory device can be operated at high speed.

According to a fourth aspect of the present invention, data transfer means is activated at an earlier timing than the activation timing of sense amplifiers of the DRAM array, and data can be transferred at high speed from the DRAM array to the SRAM array. Therefore, a CDRAM which can access at high speed even at a cache miss can be provided.

According to a fifth aspect of the present invention, a current mirror type amplifier constitutes data transfer means and also potential amplifier of the DRAM bit line, and therefore data transfer means can be activated without waiting for activation of the latch type sense amplifier of the DRAM. Consequently, data can be transferred at high speed from the DRAM array to the SRAM array.

According to a sixth aspect of the present invention, a counter starts its operation in response to a burst mode designation from an external operational processing unit, and outputs from the counter are used as address signals in the burst mode. Therefore, a semiconductor memory device which can be readily connected to an external operational processing unit having burst mode function can be provided.

According to the seventh aspect of the present invention, the counter executes counting operation in synchronization with external clock signals, and the counter outputs are used as addresses in the burst mode. Except the burst mode, externally applied address signals are used. Therefore, a clock synchronized type semiconductor memory device which can be readily connected to an external operational processing unit having burst mode function can be realized.

According to an eighth aspect of the present invention, generation of internal clock signals is stopped when the clock synchronized type semiconductor memory device is in the standby state. Consequently, operation of a circuit for taking signals in synchronization with internal clock signals, such as a control signal input buffer, can be stopped in the standby state, and accordingly current consumption in the standby state of the semiconductor memory device can be reduced.

According to a ninth aspect of the present invention, since self refresh mode is executed when generation of internal clock signals in the invention in accordance with the eighth aspect, and therefore data in the DRAM array can be surely retained even in the standby state.

According to a tenth aspect of the present invention, a row address signal and a column address signal are taken at the first and the second timings of the clock signal in a clock synchronized type semiconductor memory device, and therefore even if the clock signal has a long period or the clock signals are generated intermittently, a semiconductor memory device which can operate at high speed can be provided.

According to an eleventh aspect of the present invention, setting means for previously setting timings for taking addresses of the semiconductor memory device in accordance with an address timing designating signal is provided, and external addresses are taken in accordance with the address signal taking timings set in the setting means. Therefore, a semiconductor memory device which can flexibly correspond to applications in which high speed operation is given priority and applications in which low power consumption are given priority can be provided.

According to the twelfth aspect, SRAM array has a multiplicate word line architecture, and therefore SRAM array can be easily laid out in a desired physical dimensions to provide high density and high integration CDRAM.

According to the thirteenth and fourteenth aspects, the clamping circuit at a data receiving side has the clamping operation in data transfer between SRAM and DRAM, so that high speed data transfer with less current consumption can be implemented.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device including a plurality of memory cells, comprising:

address input means for receiving an address signal;

address generating means responsive to a burst mode designation for continuously generating address signals at prescribed timings;

address selecting means receiving an output from said address input means and an output from said address generating means and responsive to said burst mode designation for selectively passing the output of said address generating means; and memory cell selecting means for selecting a corresponding memory cell out of said plurality of memory cells in accordance with an output from said address selecting means.

2. A semiconductor memory device exchanging data with an external processing unit, said semiconductor memory device including a memory cell array which is accessed at high speed and taking an externally applied control signal in synchronization with an external clock signal, comprising:

address input means for receiving an address applied from said external processing unit;

address generating means responsive to a burst mode designation from said external processing unit for generating an address in synchronization with said external clock signal;

address selecting means for selectively passing either an output from said address input means or an output from said address generating means, and including means for selectively passing an output from said address generating means in response to said burst mode designation; and memory cell selecting means for selecting a corresponding memory cell from said memory cell array in accordance with an output from said address selecting means.

* * * * *